US007782650B2

(12) United States Patent
Bertin et al.

(10) Patent No.: US 7,782,650 B2
(45) Date of Patent: *Aug. 24, 2010

(54) NONVOLATILE NANOTUBE DIODES AND NONVOLATILE NANOTUBE BLOCKS AND SYSTEMS USING SAME AND METHODS OF MAKING SAME

(75) Inventors: Claude L. Bertin, Venice, FL (US); Thomas Rueckes, Rockport, MA (US); X. M. Henry Huang, Cupertino, CA (US); Ramesh Sivarajan, Shrewsbury, MA (US); Eliodor G. Ghenciu, King of Prussia, PA (US); Steven L. Konsek, Lund (SE); Mitchell Meinhold, Medford, MA (US); Jonathan W. Ward, Fairfax, VA (US); Darren K. Brock, Woburn, MA (US)

(73) Assignee: Nantero, Inc., Woburn, MA (US)

(*) Notice: Subject to any disclaimer, the term of this patent is extended or adjusted under 35 U.S.C. 154(b) by 145 days.

This patent is subject to a terminal disclaimer.

(21) Appl. No.: 11/835,845

(22) Filed: Aug. 8, 2007

(65) Prior Publication Data
US 2008/0212361 A1 Sep. 4, 2008

Related U.S. Application Data

(63) Continuation-in-part of application No. 11/280,786, filed on Nov. 15, 2005, and a continuation-in-part of application No. 11/280,599, filed on Nov. 15, 2005, now Pat. No. 7,394,687, and a continuation-in-part of application No. 11/274,967, filed on Nov. 15, 2005, now Pat. No. 7,479,654.

(60) Provisional application No. 60/679,029, filed on May 9, 2005, provisional application No. 60/692,891, filed on Jun. 22, 2005, provisional application No. 60/692,765, filed on Jun. 22, 2005, provisional application No. 60/692,918, filed on Jun. 22, 2005, provisional application No. 60/836,343, filed on Aug. 8, 2006, provisional application No. 60/836,437, filed on Aug. 8, 2006, provisional application No. 60/840,586, filed on Aug. 28, 2006, provisional application No. 60/855,109, filed on Oct. 27, 2006, provisional application No. 60/918,388, filed on Mar. 16, 2007.

(51) Int. Cl.
*G11C 11/00* (2006.01)

(52) U.S. Cl. ............... 365/148; 365/151; 365/164; 365/243; 977/943

(58) Field of Classification Search ............... 365/151, 365/164, 243, 148; 977/943
See application file for complete search history.

(56) References Cited

U.S. PATENT DOCUMENTS 4,646,266 A 2/1987 Ovshinsky et al.

(Continued)

FOREIGN PATENT DOCUMENTS

GB 2364933 2/2002

(Continued)

OTHER PUBLICATIONS

Niu, Chunming et al., "High Power Electrochemical Capacitors Based on Carbon Nanotube Electrodes," Appl. Phys. Lett. 70(11), Mar. 17, 1997, pp. 1480-1482.

(Continued)

*Primary Examiner*—Dang T Nguyen
*Assistant Examiner*—Alexander Sofocleous
(74) *Attorney, Agent, or Firm*—Wilmer Cutler Pickering Hale and Dorr LLP

(57) ABSTRACT

Under one aspect, a memory array includes word lines; bit lines; memory cells; and a memory operation circuit. Each memory cell responds to electrical stimulus on a word line and on a bit line and includes: a two-terminal non-volatile nanotube switching device having first and second terminals, a semiconductor diode element, and a nanotube fabric article capable of multiple resistance states. The semiconductor diode and nanotube article are between and in electrical communication with the first and second terminals, which are coupled to the word line bit line respectively. The operation circuit selects cells by activating bit and/or word lines, detects a resistance state of the nanotube fabric article of a selected memory cell, and adjusts electrical stimulus applied to the cell to controllably induce a selected resistance state in the nanotube fabric article. The selected resistance state corresponds to an informational state of the memory cell.

32 Claims, 217 Drawing Sheets

U.S. PATENT DOCUMENTS

| | | | |
|---|---|---|---|
| 4,743,569 A | 5/1988 | Plumton et al. |
| 4,979,149 A | 12/1990 | Popovic et al. |
| 5,311,039 A | 5/1994 | Kimura et al. |
| 5,818,749 A | 10/1998 | Harshfield |
| 6,057,637 A | 5/2000 | Zettl et al. |
| 6,128,214 A | 10/2000 | Kuekes et al. |
| 6,256,767 B1 | 7/2001 | Kuekes et al. |
| 6,277,318 B1 | 8/2001 | Bower et al. |
| 6,314,019 B1 | 11/2001 | Kuekes et al. |
| 6,342,276 B1 | 1/2002 | You et al. |
| 6,409,567 B1 | 6/2002 | Amey, Jr. et al. |
| 6,422,450 B1 | 7/2002 | Zhou et al. |
| 6,423,583 B1 | 7/2002 | Avouris et al. |
| 6,445,006 B1 | 9/2002 | Brandes et al. |
| 6,495,116 B1 | 12/2002 | Herman |
| 6,495,258 B1 | 12/2002 | Chen et al. |
| 6,515,339 B2 | 2/2003 | Shin et al. |
| 6,528,020 B1 | 3/2003 | Dai et al. |
| 6,548,841 B2 | 4/2003 | Frazier et al. |
| 6,630,772 B1 | 10/2003 | Bower et al. |
| 6,643,165 B2 | 11/2003 | Segal et al. |
| 6,645,628 B2 | 11/2003 | Shiffler, Jr. et al. |
| 6,706,402 B2 | 3/2004 | Ruekes et al. |
| 6,707,098 B2 | 3/2004 | Hofmann et al. |
| 6,759,693 B2 | 7/2004 | Vogeli et al. |
| 6,795,338 B2 * | 9/2004 | Parkinson et al. ............ 365/163 |
| 6,803,840 B2 | 10/2004 | Hunt et al. |
| 6,808,746 B1 | 10/2004 | Dai et al. |
| 6,809,465 B2 | 10/2004 | Jin |
| 6,833,558 B2 | 12/2004 | Lee et al. |
| 6,858,197 B1 | 2/2005 | Delzeit |
| 6,863,942 B2 | 3/2005 | Ren et al. |
| 6,888,773 B2 | 5/2005 | Morimoto et al. |
| 6,890,780 B2 | 5/2005 | Lee |
| 6,894,359 B2 | 5/2005 | Bradley et al. |
| 6,899,945 B2 | 5/2005 | Smalley et al. |
| 6,905,892 B2 | 6/2005 | Esmark et al. |
| 6,918,284 B2 | 7/2005 | Snow et al. |
| 6,919,592 B2 | 7/2005 | Segal et al. |
| 6,919,740 B2 | 7/2005 | Snider |
| 6,921,575 B2 | 7/2005 | Horiuchi et al. |
| 6,924,538 B2 | 8/2005 | Jaiprakash et al. |
| 6,944,054 B2 | 9/2005 | Rueckes et al. |
| 6,946,410 B2 | 9/2005 | French et al. |
| 6,955,937 B1 | 10/2005 | Burke et al. |
| 6,969,651 B1 | 11/2005 | Lu et al. |
| 6,990,009 B2 | 1/2006 | Bertin et al. |
| 7,015,500 B2 | 3/2006 | Choi et al. |
| 7,057,402 B2 | 6/2006 | Cole et al. |
| 7,115,901 B2 | 10/2006 | Bertin et al. |
| 7,115,960 B2 | 10/2006 | Bertin et al. |
| 7,161,403 B2 | 1/2007 | Bertin et al. |
| 7,479,654 B2 * | 1/2009 | Bertin et al. ................ 257/40 |
| 7,566,478 B2 * | 7/2009 | Ward et al. ............... 427/249.1 |
| 2001/0004979 A1 | 6/2001 | Han et al. |
| 2001/0023986 A1 | 9/2001 | Mancevski |
| 2002/0160111 A1 | 10/2002 | Sun et al. |
| 2002/0175390 A1 | 11/2002 | Goldstein et al. |
| 2003/0004058 A1 | 1/2003 | Li et al. |
| 2003/0122111 A1 | 7/2003 | Glatkowski |
| 2003/0177450 A1 | 9/2003 | Nugent |
| 2003/0200521 A1 | 10/2003 | DeHon et al. |
| 2004/0005723 A1 | 1/2004 | Empedocles et al. |
| 2004/0007528 A1 | 1/2004 | Bakajin et al. |
| 2004/0023253 A1 | 2/2004 | Kunwar et al. |
| 2004/0031975 A1 | 2/2004 | Kern et al. |
| 2004/0041154 A1 | 3/2004 | Watanabe et al. |
| 2004/0043527 A1 | 3/2004 | Bradley et al. |
| 2004/0071949 A1 | 4/2004 | Glatkowski et al. |
| 2004/0099438 A1 | 5/2004 | Arthur et al. |
| 2004/0104129 A1 | 6/2004 | Gu et al. |
| 2004/0132070 A1 | 7/2004 | Star et al. |
| 2004/0175856 A1 | 9/2004 | Jaiprakash et al. |
| 2004/0181630 A1 | 9/2004 | Jaiprakash et al. |
| 2004/0253167 A1 | 12/2004 | Silva et al. |
| 2004/0265550 A1 | 12/2004 | Glatkowski et al. |
| 2004/0266106 A1 | 12/2004 | Lee |
| 2005/0053525 A1 | 3/2005 | Segal et al. |
| 2005/0056866 A1 | 3/2005 | Bertin et al. |
| 2005/0056877 A1 | 3/2005 | Rueckes et al. |
| 2005/0095938 A1 | 5/2005 | Rosenberger et al. |
| 2005/0212014 A1 | 9/2005 | Horibe et al. |
| 2006/0034116 A1 * | 2/2006 | Lam et al. ................... 365/151 |
| 2006/0183278 A1 | 8/2006 | Bertin et al. |
| 2006/0237537 A1 | 10/2006 | Empedocles et al. |
| 2006/0250843 A1 | 11/2006 | Bertin et al. |
| 2006/0250856 A1 | 11/2006 | Bertin et al. |
| 2006/0258122 A1 | 11/2006 | Whitefield et al. |
| 2006/0264053 A1 | 11/2006 | Yates |
| 2006/0281256 A1 | 12/2006 | Carter et al. |
| 2006/0281287 A1 | 12/2006 | Yates et al. |
| 2006/0292716 A1 | 12/2006 | Gu et al. |
| 2007/0004191 A1 | 1/2007 | Gu et al. |
| 2008/0012047 A1 | 1/2008 | Bertin et al. |
| 2008/0142850 A1 | 6/2008 | Bertin et al. |
| 2008/0157126 A1 | 7/2008 | Bertin et al. |
| 2008/0159042 A1 | 7/2008 | Bertin et al. |

FOREIGN PATENT DOCUMENTS

| | | |
|---|---|---|
| JP | 2000-203821 | 7/2000 |
| JP | 2001-035362 A2 | 2/2001 |
| JP | 2004-090208 A2 | 3/2004 |
| WO | WO-98/39250 A1 | 9/1998 |
| WO | WO-99/65821 A1 | 12/1999 |
| WO | WO-00/48195 | 8/2000 |
| WO | WO-01/03208 A1 | 1/2001 |
| WO | WO-02/45113 A2 | 6/2002 |
| WO | WO-02/48701 A2 | 6/2002 |
| WO | WO-03/016901 A1 | 2/2003 |
| WO | WO-03/034142 A1 | 4/2003 |
| WO | WO-03/085675 A2 | 10/2003 |
| WO | WO-2004/084229 A1 | 9/2004 |
| WO | WO-2005/089165 A2 | 9/2005 |

OTHER PUBLICATIONS

Ago et al., "Workfunction of Purified and Oxidised Carbon Nanotubes," Synthetic Metals, vol. 103, pp. 2494-2495 (1999).

Ajayan, P. M. et al., "Applications of Carbon Nanotubes", Carbon Nanotubes, vol. 80, pp. 391-425, 2001.

Avouris, P., et al., "Carbon Nanotube Electronics," Chemical Physics, 2002, vol. 284, pp. 429-445.

Bachtold, A., et al, "Logic Circuits Based on Carbon Nanotubes," Physica (2003) pp. 42-46.

Banerjee et al., "Functionalization of Carbon Nanotubes with a Metal-Containing Molecular Complex," Nano Letters, vol. 2, No. 1, pp. 49-53 (2002).

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Bonard, J. M. et al., "Monodisperse Multiwall Carbon Nanotubes Obtained with Ferritin as Catalyst", Nano Letters, vol. 2, No. 6, pp. 665-667, 2002.

Cassell, A. M. et al., "Large Scale CVD Synthesis of Single-Walled Carbon Nanotubes", J. Phys. Chem. B, pp. 6484-6492, 1999.

Chen, B. et al., "Heterogeneous Single-Walled Carbon Nanotbue Catalyst Discovery and Optimization", Chem. Mater., vol. 14, pp. 1891-1896, 2002.

Chen, J., et al, "Self-aligned Carbon Nanotube Transistors with Charge Transfer Doping," Applied Physics Letters (2005) 86:123108-1-3.

Chen, J., et al, "Self-aligned Carbon Nanotube Transistors with Novel Chemicsl Doping," IEDM (2004) 04:695-698.

Cheng, H M., "Large-scale and low-cost synthesis of single-walled carbon nanotubes by the catalytic pyrolysis of hydrocarbons", Applied Physics Letters, vol. 72, No. 25, pp. 3282-3284, Jun. 22, 1998.

Chiang, et al., Purification and Characterization of Single-Wall Carbon Nanotubes (SWNTs) Obtained from the Gas-Phase Decomposition of CO (HiPco Process), J. Phys. Chem. B, vol. 105, pp. 8297-8301, 2001.

Collins, P. G. et al., "Engineering Carbon Nanotubes and Nanotube Circuits Using Electrical Breakdown", *Science*, vol. 292, pp. 706-709, Apr. 27, 2001.

Dai, H. et al., "Controlled Chemical Routes to Nanotube Artchitectures, Physics, and Devices", J. Phys. Chem. B, vol. 103, pp. 1126-11255, 1999.

Delzeit et al., "Multilayered metal catalysts for controlling the density of single-walled carbon nanotubes growth," Chemical Physics letters, vol. 348, pp. 368-374, Nov. 16, 2001.

Derycke, V., et al., "Carbon Nanotube Inter- and Intramolecular Logic Gates," *Nano Letters*, Sep. 2001, vol. 1, No. 9, pp. 453-456.

Desai et al., "Freestanding Carbon Nanotube Specific Fabrication", *Proc. of 2005, 5th IEEE Conf., Nanotech*, Nagoya, Japan, pp. 1-4, Jul. 2005.

Duan, X. et al., "Nonvolatile Memory and Programmable Logic from Molecule-Gated Nanowires", *Nano Letters*, vol. 0, No. 0, pp. A-D, 2002.

Franklin, N. R. et al., "An Enhanced CVD Approach to Extensive Nanotube Networks with Directionality", Advanced Materials, 5 pages, 2000.

Haddon et al., "Purification and Separation of Carbon Nanotubes," *MRS Bulletin*, pp. 252-259, Apr. 2004.

Hafner, J. H. et al., "Catalytic growth of single-wall carbon nanotubes from metal particles", Chemical Physics Letters, vol. 296, pp. 195-202, Oct. 30, 1998.

Heinze, S. et al., "Carbon Nanotubes as Schottky Barrier Transistsors", *Physical Review Letters*, vol. 89, No. 10, pp. 16801-1-106801-4, 2002.

Homma, Y. et al., "Single Walled Carbon Nanotube Growth on Silicon Substrates Using Nanoparticle Catalysts", Jpn. J. Appl. Phys., vol, 41, Pt. 2, No. 1A/B, pp. L89-91, 2002.

Hone, J., "Phonons and Thermal Properties of Carbon Nanotubes", *Carbon Nanotubes, Topics Appl. Phys.*, vol. 80, pp. 273-286, 2001.

Huang, Y., et al, "Logic Gates and Computation from Assembled Nanowire Building Blocks," Science (2001) 294(9):1313-1317.

International Search Authority, International Search Report for PCT/US2005/045316 mailed Sep. 6, 2006, 2 pages.

International Search Report and Written Opinion for International Patent Application PCT/US05/18467, mailed Oct. 1, 2007.

International Search Report, International Searching Authority, for International Application PCT/US05/18539, mailed Sep. 18, 2006, 4 pages.

Javey, A., et al., "Carbon Nanotube Transistor Arrays for Multistage Complementary Logic and Ring Oscillators," *Nano Letters*, 2002, vol. 2, No. 9, pp. 929-932.

Jeong et al., "A new purification method of single-wall carbon nanotubes using H2S and O2 mixture gas," Chemical Physics Letters, vol. 344, pp. 18-22, Aug. 17, 2001.

Johnson, R. Colin, "IBM fellow unrolls blueprint for nano", *EETimes*, Mar. 6, 2006, 3 pages, http://www.eetimes.com/showArticle.jhtml?articleID=181500304.

Joselevich, E., "Vectorial Growth of Metallic and Semiconducting Single-Wall Carbon Nanotubes", Nano Letters, vol. 0, No. 0, A-E, 2002.

Kinaret, J. M. et al., "A Carbon-nanotube-based nanorelay," *Applied Physics Letters*, Feb. 24, 2003, vol. 82, No. 8, pp. 1287-1289.

Kong, J. et al., "Chemical vapor deposition of methane for single-walled carbon nanotubes", Chemical Physics Letters, pp. 567-574, Aug. 14, 1998.

Kong, J. et al., "Nanotube Molecular Wires as Chemical Sensors," Science, 2000, vol. 287 pp. 622-625.

Kong, J. et al., "Quantum Interference and Ballistic Transmission in Nanotube Electron Waveguides", *The American Physical Society*, vol. 87, No. 10, pp. 106801-1-106801-4, Sep. 3, 2001.

Li, J. et al., "Carbon Nanotube Nanoelectrode Array for Ultrasensitive DNA Detection", Nano Letters, vol. 3, No. 5, pp. 597-602, 2003.

Li, Y. et al., "Growth of Single-Walled Carbon Nanotubes from Discrete Catalytic Nanoparticles of Various Sizes", J. Phys. Chem. B, vol. 105, pp. 11424-11431, 2001.

Li, Y. et al., "Preparation of Monodispersed Fe-Mo Nanoparticles as the Catalyst for CVD Synthesis of Carbon Nanotubes", Chem. Mater., vol. 13. pp. 1008-1014, 2001.

Lin, Y., et al, "Novel Carbon Nanotube FET Design with Tunable Polarity," IEDM (2004) 4:687-690.

Luyken, R. J. et al., "Concepts for hybrid CMOS-molecular non-volatile memories", Nanotechnology, vol. 14, pp. 273-276, 2003.

Martel, R., et al, "Carbon Nanotube Field-Effect Transistors and Logic Circuits," *DAC 2002*, Jun. 10-12, 2002, vol. 7.4, pp. 94-98.

Nerushev, O. A., et al., "Carbon nanotube films obtained by thermal chemical vapour deposition", J. Mater. Chem., vol. 11, pp. 1122-1132, 2001.

Onoa et al., "Bulk Production of singly dispersed carbon nanotubes with prescribed lengths", *Nanotechnology*, vol. 16, pp. 2799-2803, 2005.

Parikh, K. et al., "Flexible vapour sensors using single walled carbon nanotubes", Sensors and Actuators B, vol. 113, pp. 55-63, 2006.

Peigney, M. et al., "A Study of the Formation of Single- and Double- Walled Carbon Nanotubes by a CVD Method", J. Phys. Chem. B., vol. 105, pp. 9699-9710, 2001.

Qi, P. et al., "Toward Large Arrays of Multiplex Functionalization Carbon Nanotube Sensors for Highly Sensitive and Selective Molecular Detection," *Nano Lett*. 2003, vol. 3(3), pp. 347-351.

Radosavljevic, M. et al., "Nonvolatile Molecular Memory Elements Based on Ambipolar Nanotube Field Effect Transistors", *Nano Letters*, vol. 2, No. 7, pp. 761-764, 2002.

Rueckes, et al., "Carbon nanotube-based nonvolatile random access memory for molecular computing", *Science*, vol. 289, pp. 94-97, Jul. 7, 2000.

Shelimov et al., "Purification of single-wall carbon nanotubes by ultrasonically assisted filtration," Chemical Physics Letters, vol. 282, pp. 429-434, Jan. 23, 1998.

Sotiropoulou, S. et al., "Carbon nanotube array-based biosensor", Anal. Bioanal. Chem, vol. 375, pp. 103-105, 2003.

Valentini, L. et al., "Sensors for Sub-ppm NO$_2$ Gas Detection Based on Carbon Nanotube Thin Films," *Applied Physics Letters*, 2003, vol. 82(6), pp. 961-963.

Wind, S. J. et al., "Fabrication and Electrical Characterization of Top Gate Single-Wall Carbon Nanotube Field-Effect Transistors", 14 pages.

Wind, S., et al, "Vertical Scaling of Carbon Nanotube Field-Effect Transistors Using Top Gate Electrodes," Applied Physics Letters (2002), 80(20):3817-3819.

Zhang et al., "Formation of metal nanowires on suspened signel-walled carbon nanotubes", *Appl. Phys. Lett.*, vol. 77, p. 3015, Nov. 2000.

Zhang, Y. et al., "Metal coating on suspended carbon Nanotubes and its implication to metal-tube interaction", Chemical Physics Letters, vol. 331, pp. 35-41, 2000.

Zhang, Z. et al.,"Select Pathways to Carbon Nanotube Film Growth", Advanced Materials, 4 pages, Jun. 19, 2001.

Zhao, Y. P. et al., Frequency-dependent electrical transport in carbon nanotubes, Physical Review B., vol. 64, pp. 201402-1 to 201402-4, 2001.

Javey, A., et al, "Carbon Nanotube Field-Effect Transistors with Integrated Ohmic Contacts and High-κ Gate Dielectrics," Nano Letters (2004) 4(3): 447-450.

Javey, A., et al, "High-κ Dielectrics for Advanced Carbon-Nanotube Transistors and Logic Gates," Nature Materials (2002) 1:241-246.

Supplementary European Search Report and Opinion for corresponding European Patent Application No. EP 07840788 mailed Oct. 28, 2009.

Derycke, V., "Controlling Doping and Carrier Injection in Carbon NanotubeTransistors", Applied Physics Letters, 2002. 80 (15) 2773-2775.

Kahn, M.G.C. et al., "Solubilization of Oxidized Single-Walled Carbon Nanotubes in Organic and Aqueous Solvents through Organic Derivatization," Nano Letters 2002, vol. 2, No. 11, pp. 1215-1218.

Langer, L. et al., "Electrical Resistance of a Carbon Nanotube Bundle," J. Mater. Res. vol. 9, No. 4, Apr. 1994, 6 pages.

Pradhan, B. et al., "Electrical Bistability and Memory Phenomenon in Carbon Nanotube-Conjugated Polymer Matrixes," J. Phys. Chem. B., 2006, 110, 8274-8277.

Cui, J.B. et al., "Carbon nanotube memory devices of high charge storage stability," Applied Physics Letters, vol. 81, No. 17, Oct. 21, 2002, pp. 3260-3262.

Fuhrer, M.S. et al., "High-Mobility Nanotube Transistor Memory," Nano Letters, 2002, vol. 2, No. 7, pp. 755-759.

Star, A. et al., "Nanoelectronic Carbon Dioxide Sensors," Adv. Mater. 2004, 16, No. 22, Nov. 18, pp. 2049-2052.

Star, A. et al., "Nanotube Optoelectronic Memory Devices," Nano Letters, 2004, vol. 4, No. 9, pp. 1587-1591.

Novak, J.P. et al., "Nerve agent detection using networks of single-walled carbon nanotubes," Applied Physics Letters, vol. 83, No. 19, Nov. 10, 2003, pp. 4026-4028.

Zhou, Y. et al., "p-Channel, n-Channel Thin Film Transistors and p-n Diodes Based on Single Wall Carbon Nanotube Networks," Nano Letters, 2004, vol. 4, No. 10, pp. 2031-2035.

Snow, E.S. et al., "Random networks of carbon nanotubes as an electronic material," Applied Physics Letters, vol. 82, No. 13, Mar. 31, 2003, pp. 2145-2147.

\* cited by examiner

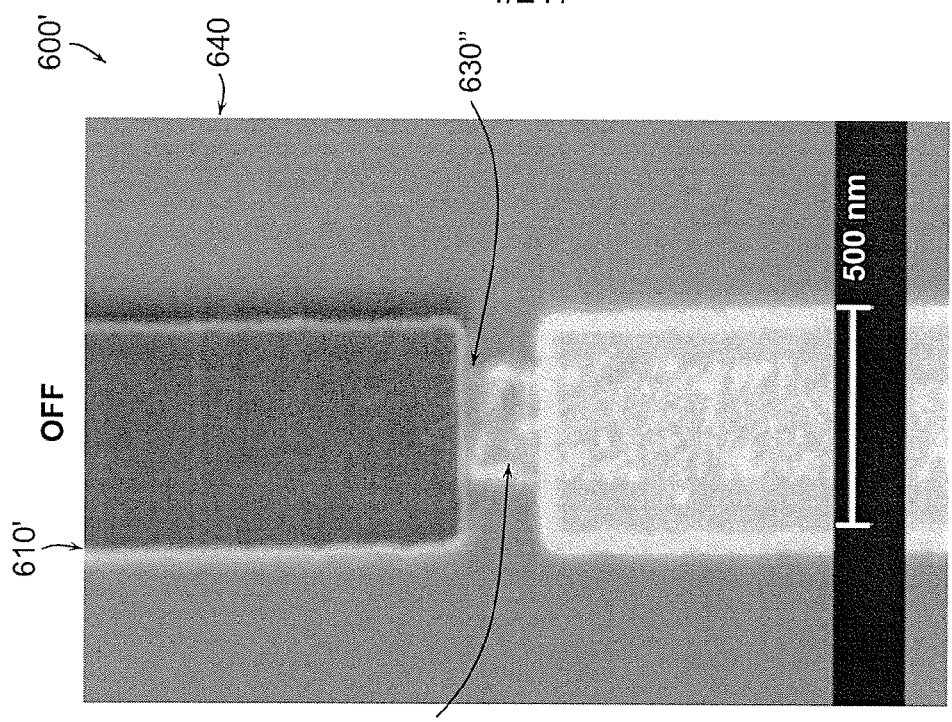
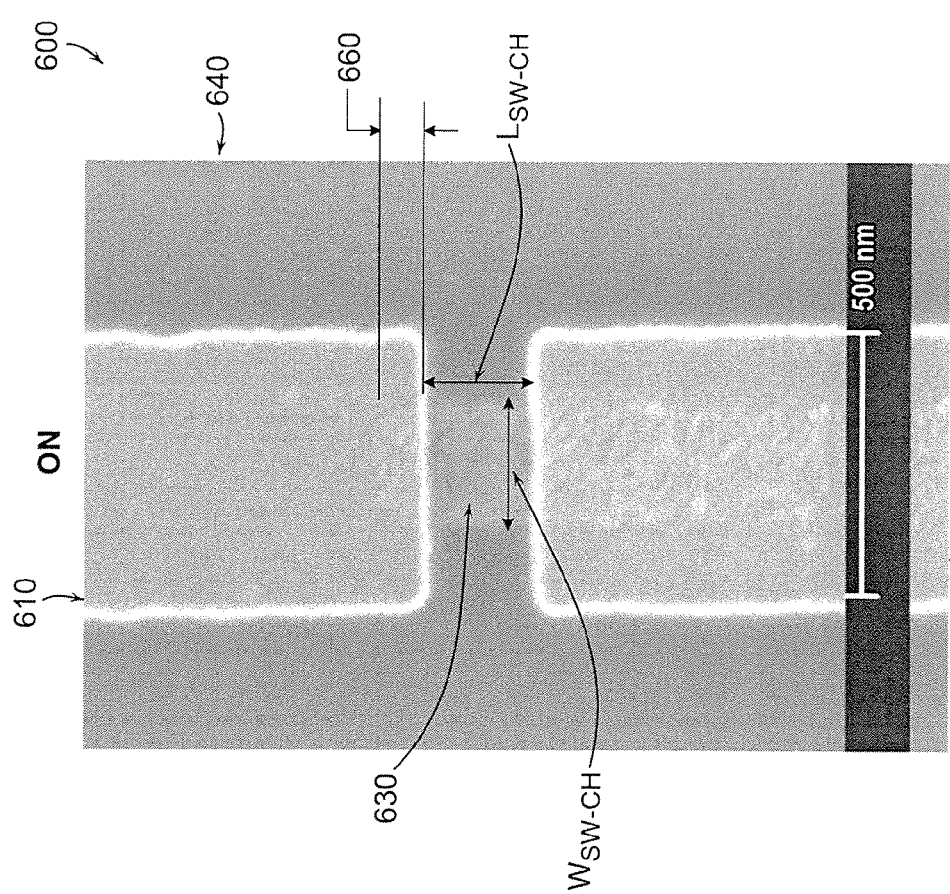
Figure 6B
Figure 6A

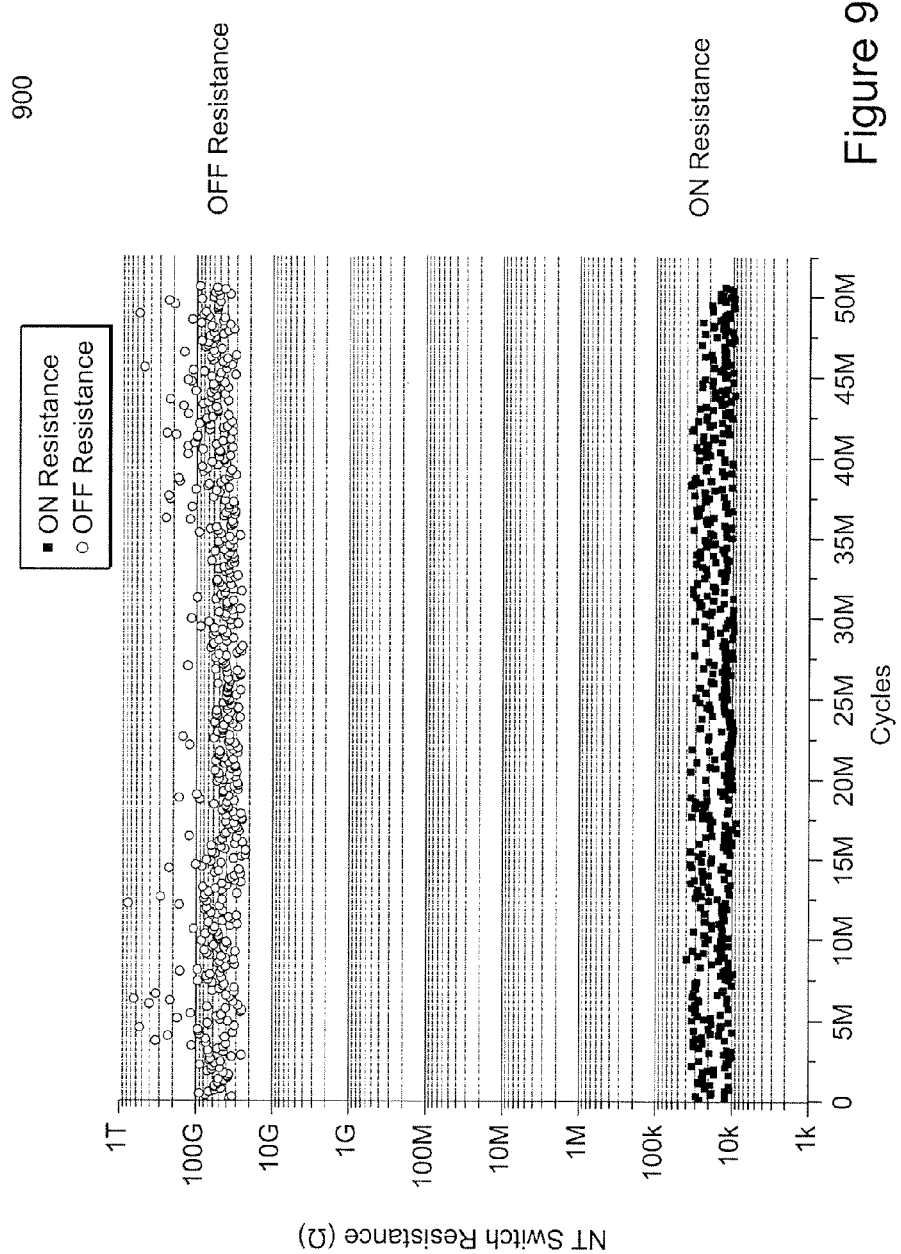

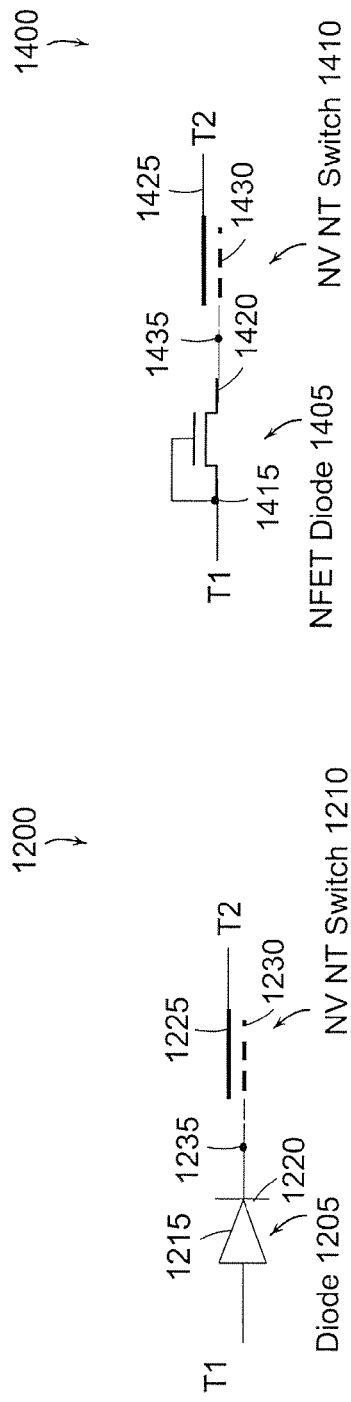
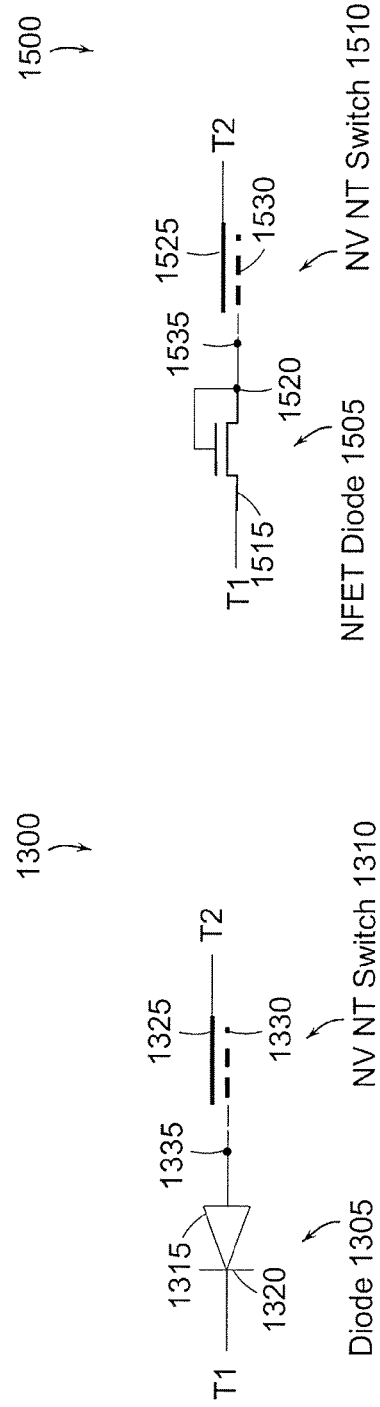

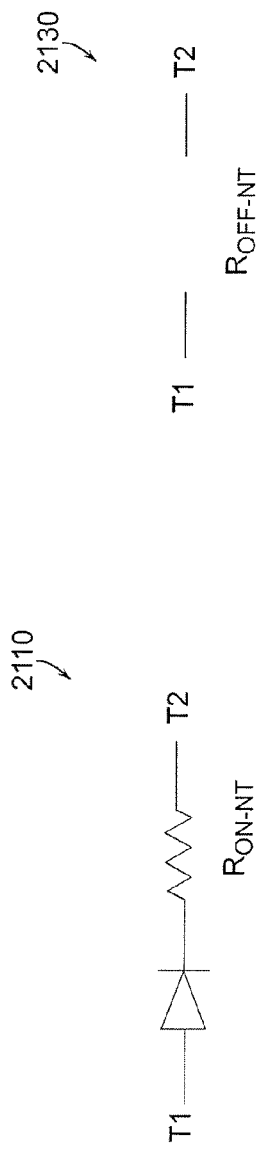
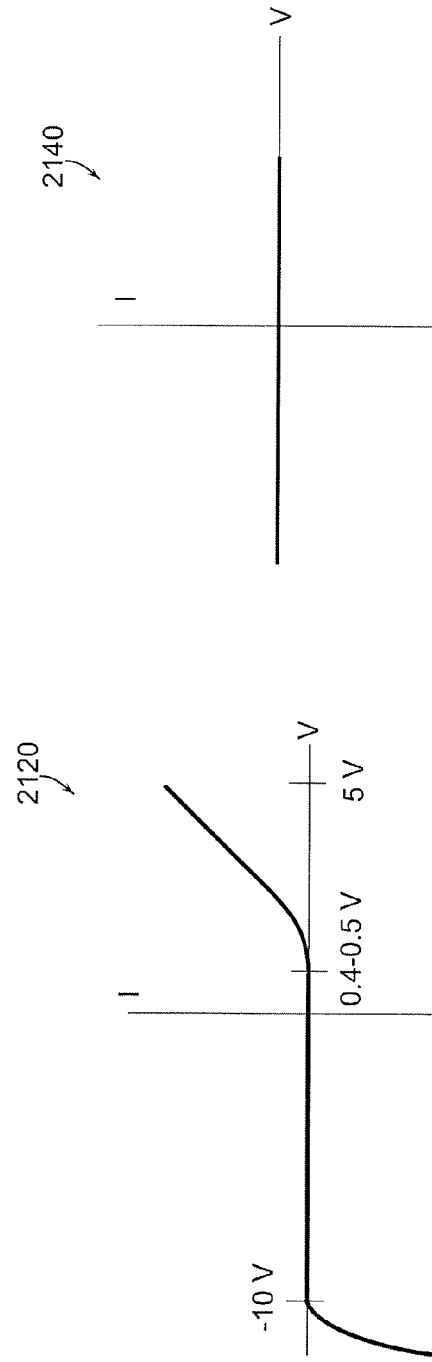
Figure 21B
Figure 21C
Figure 21D
Figure 21E

CIRCUIT OPERATION WAVEFORMS FOR NANOTUBE DIODE (NV NT DIODE)
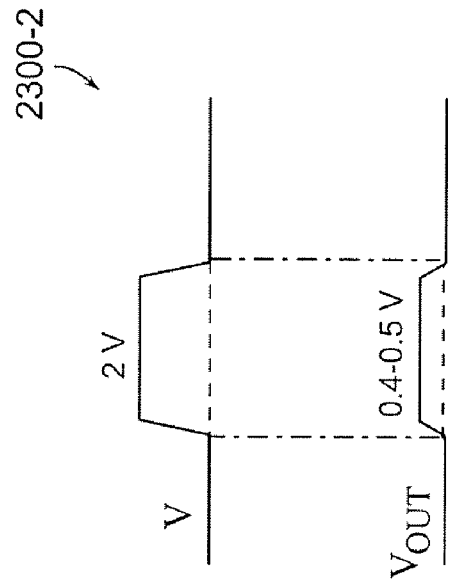
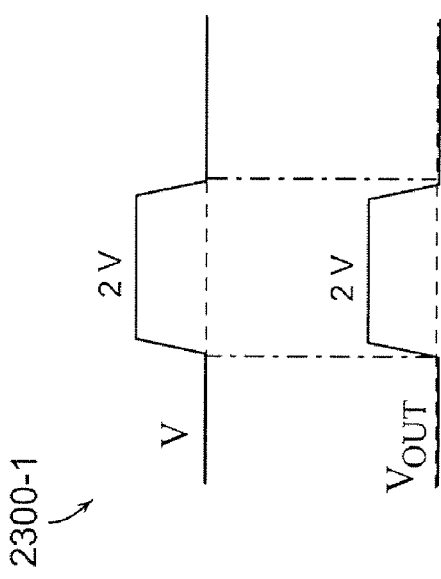
Figure 23B

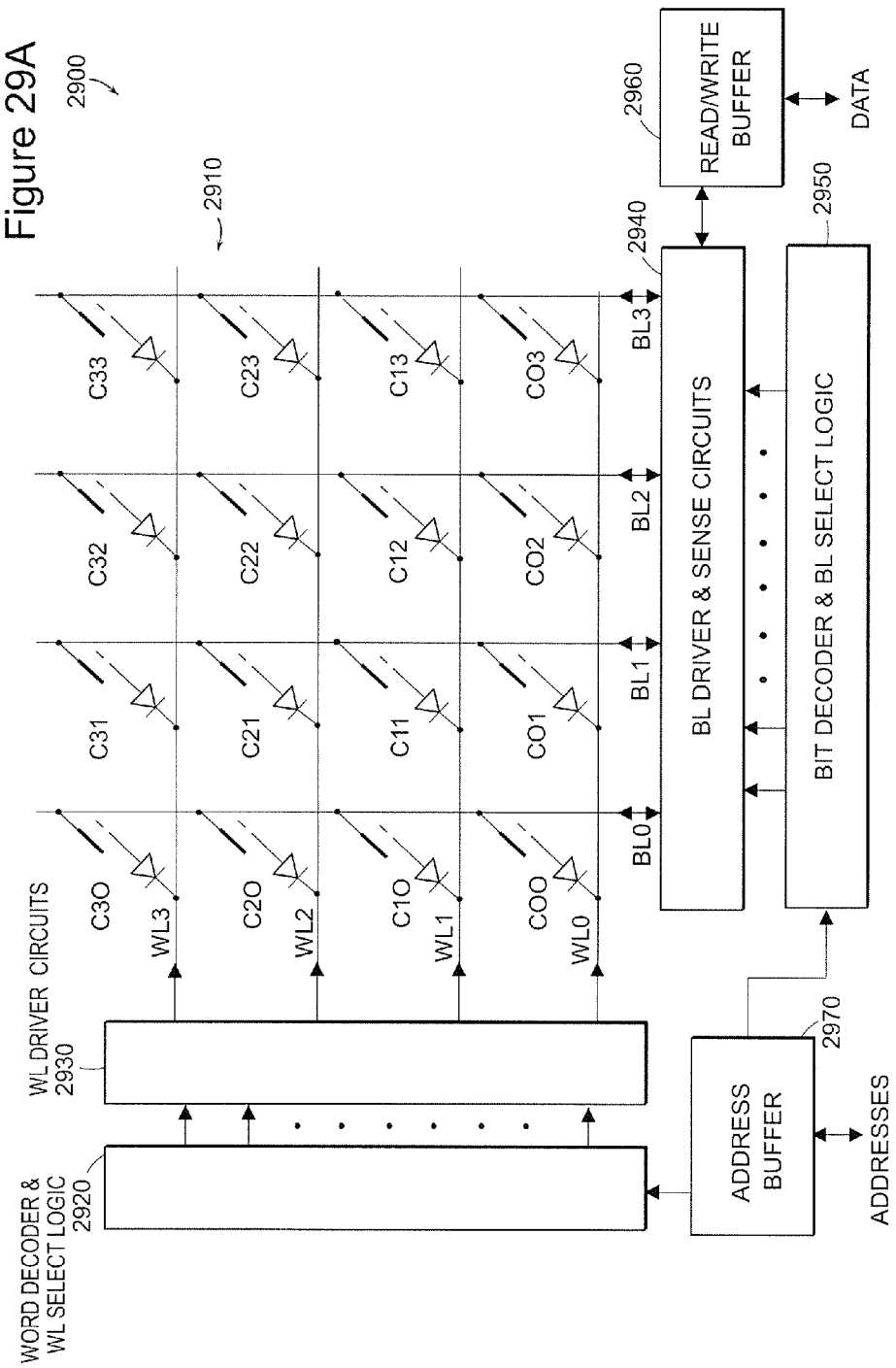

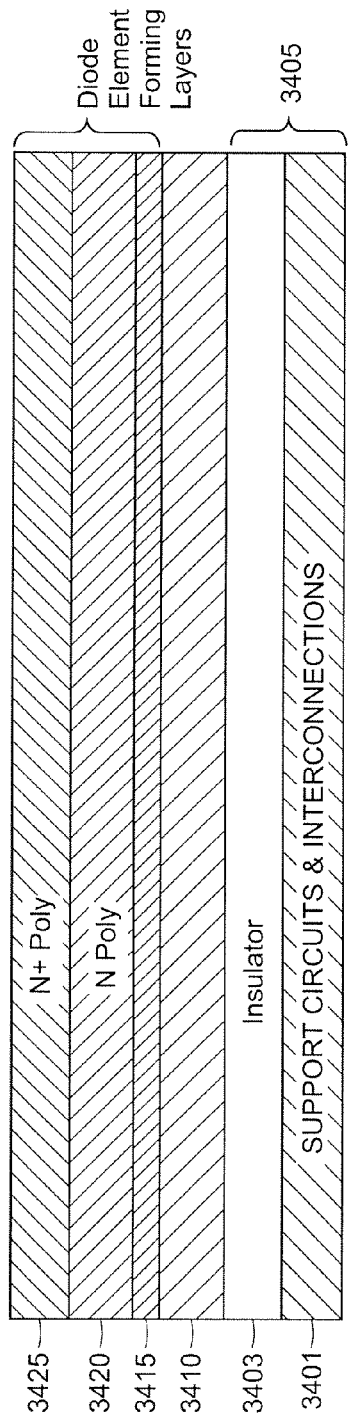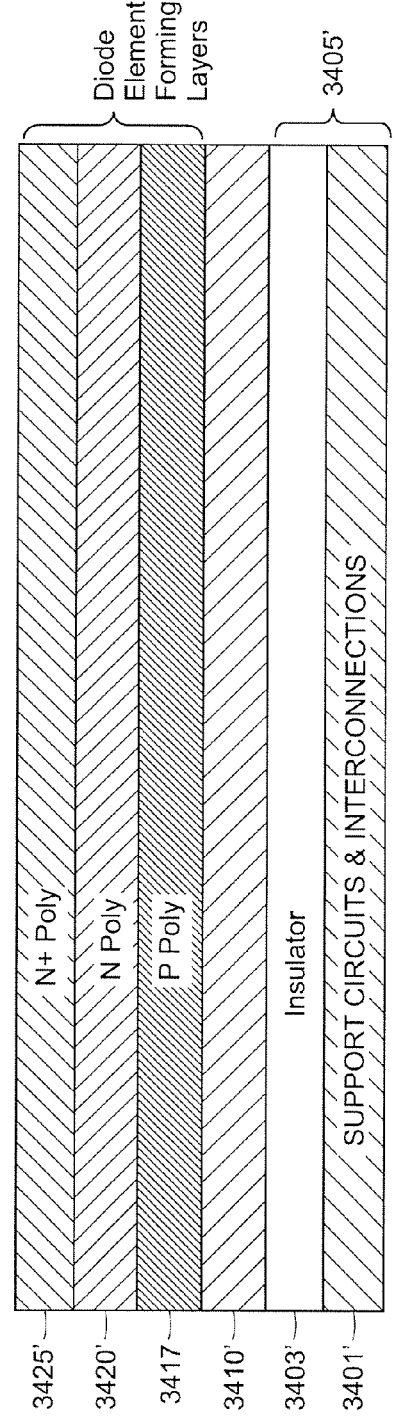
Figure 34A  Figure 34A'

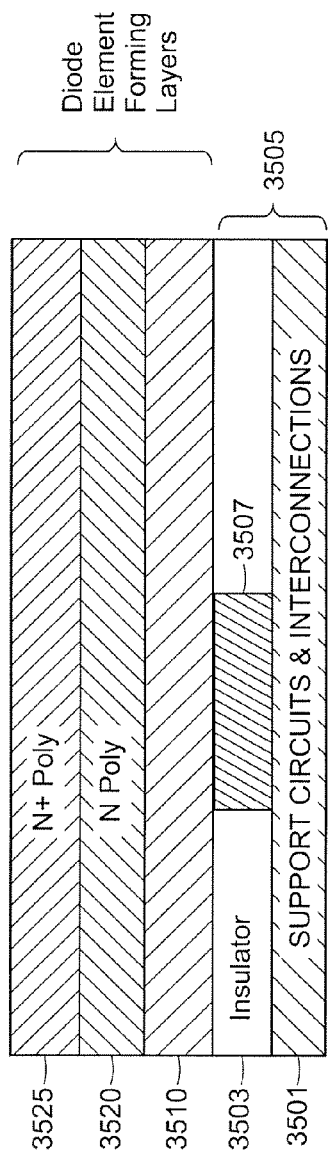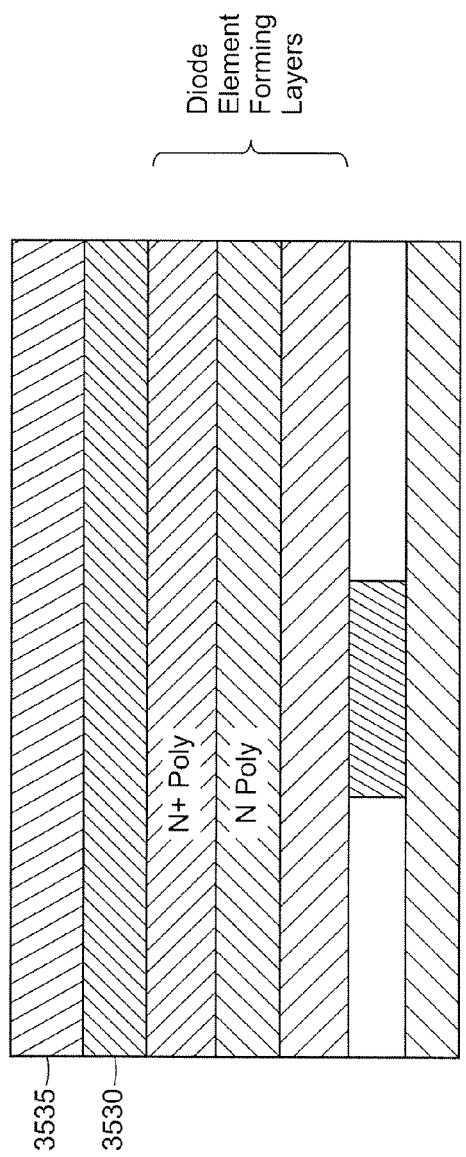
Figure 35A
Figure 35B

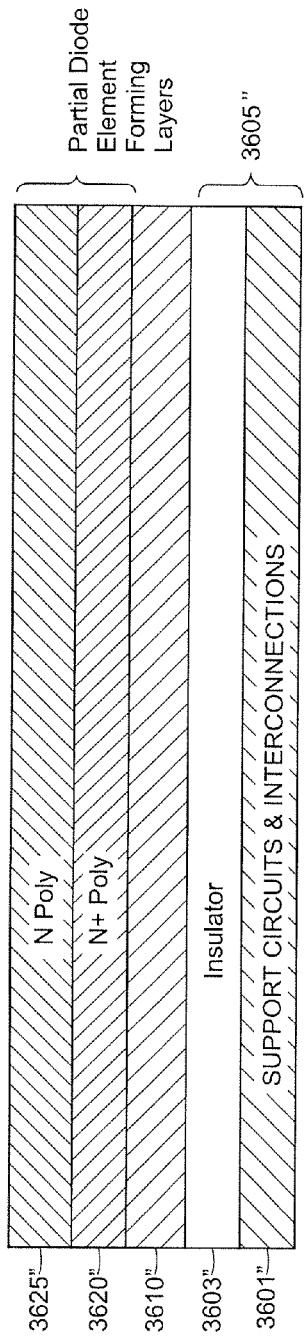
Figure 36A"
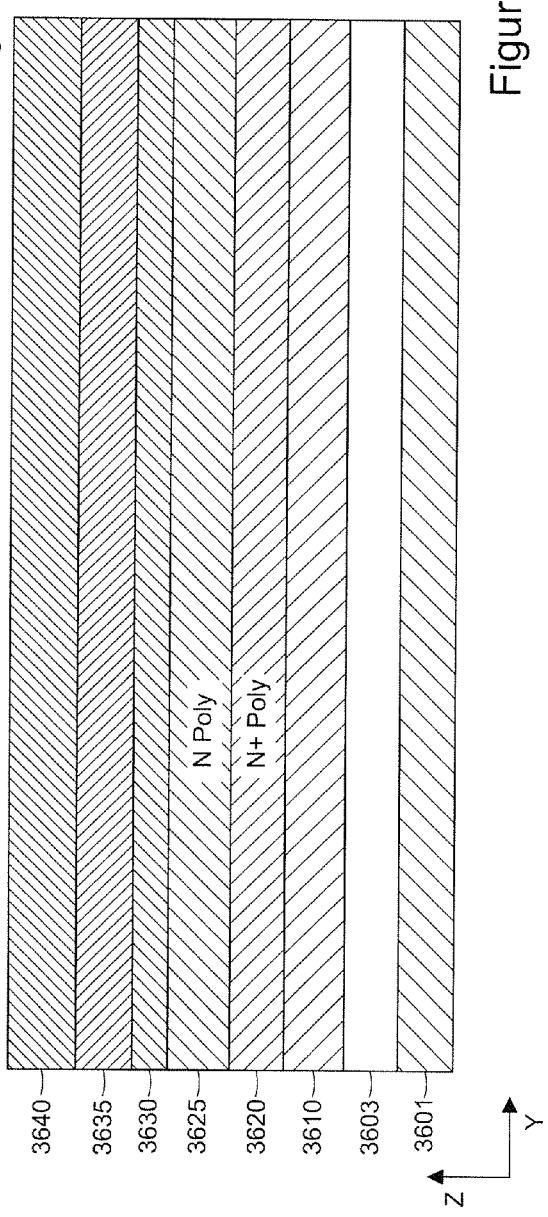
Figure 36B

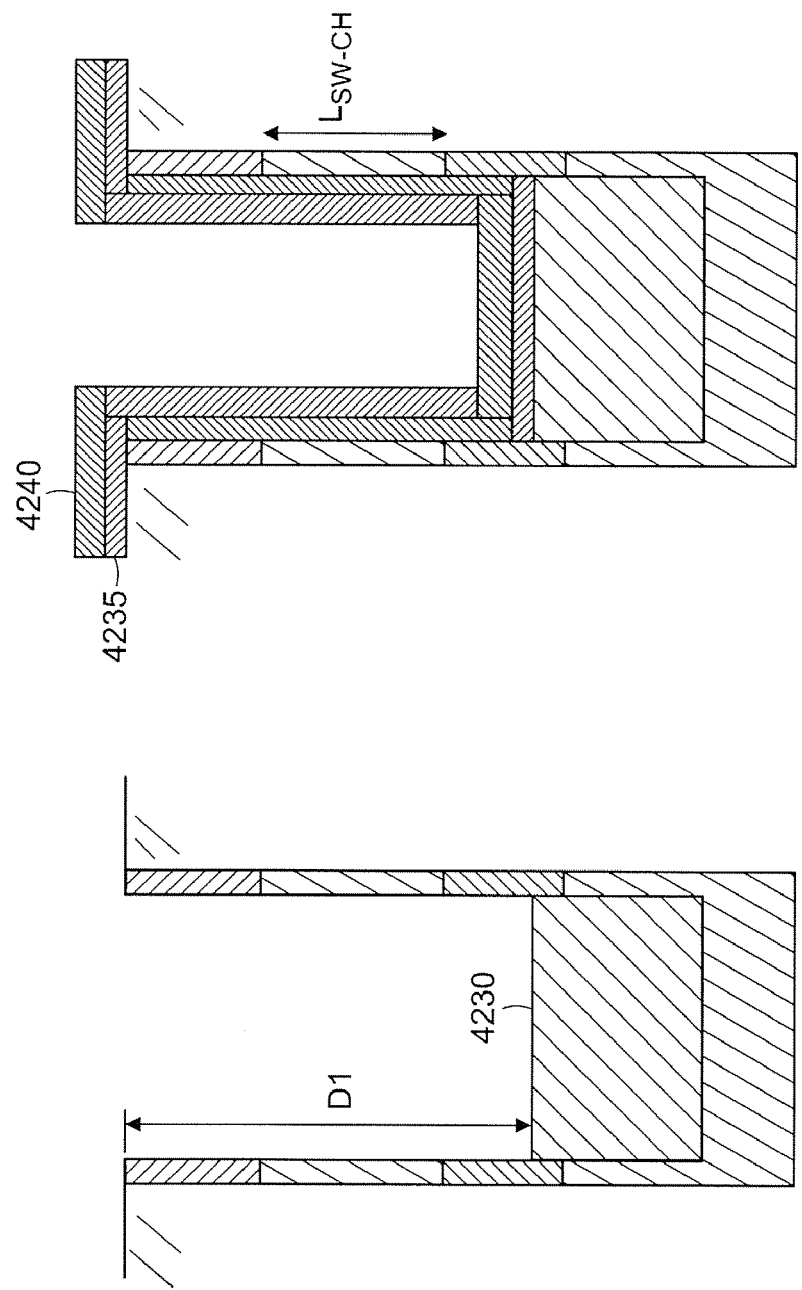

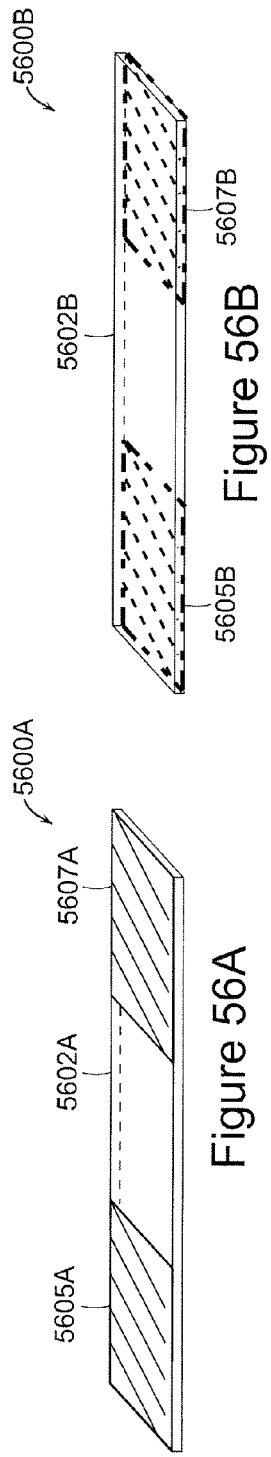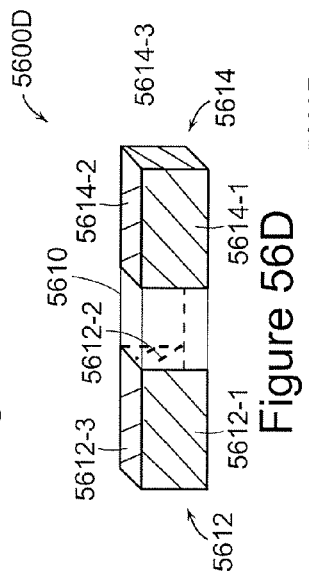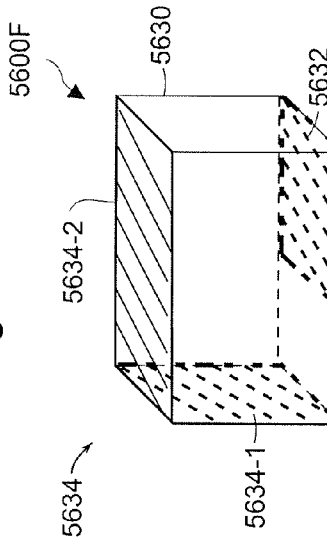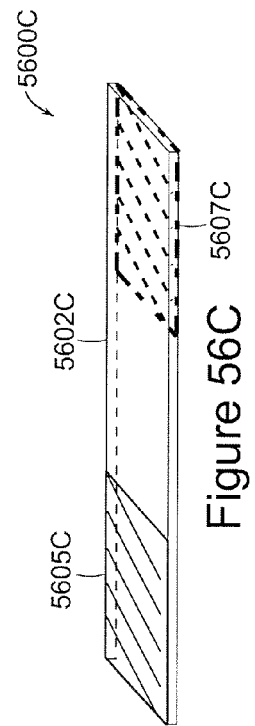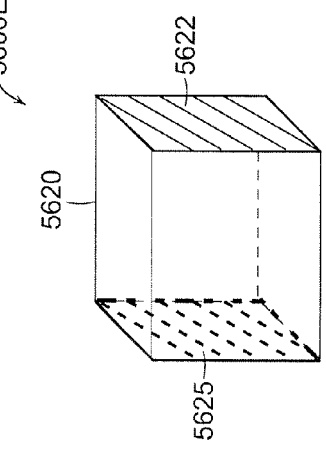

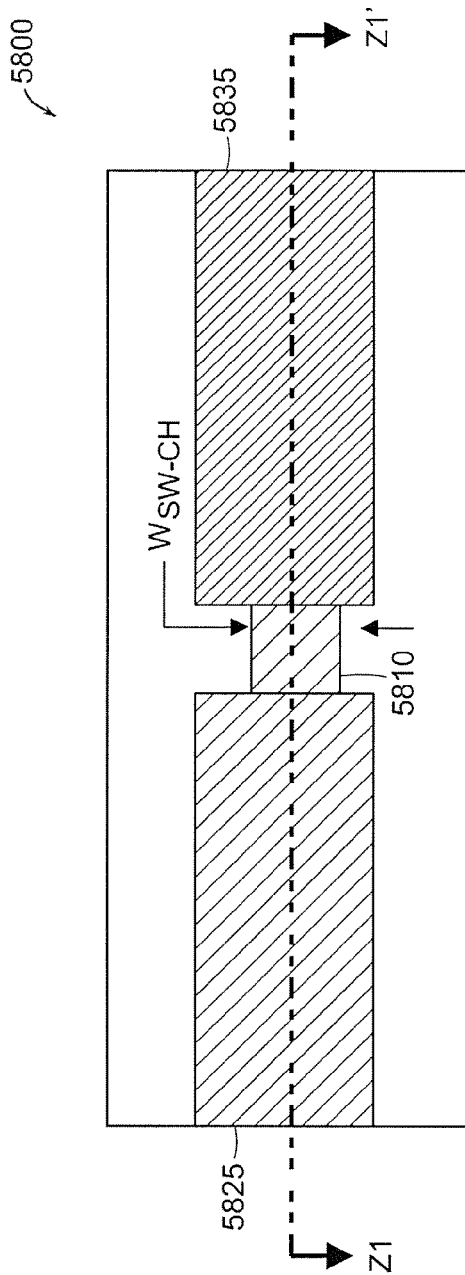
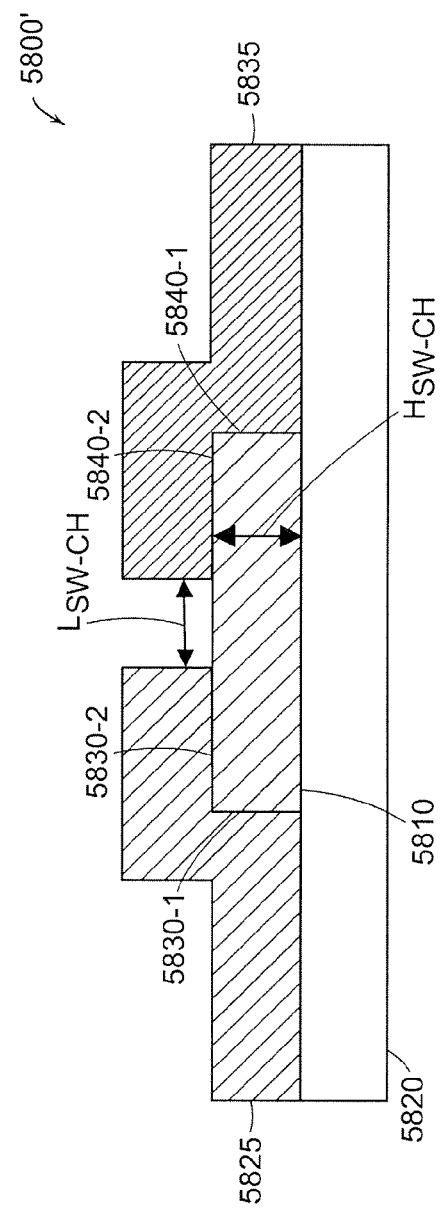
Figure 58A
Figure 58B

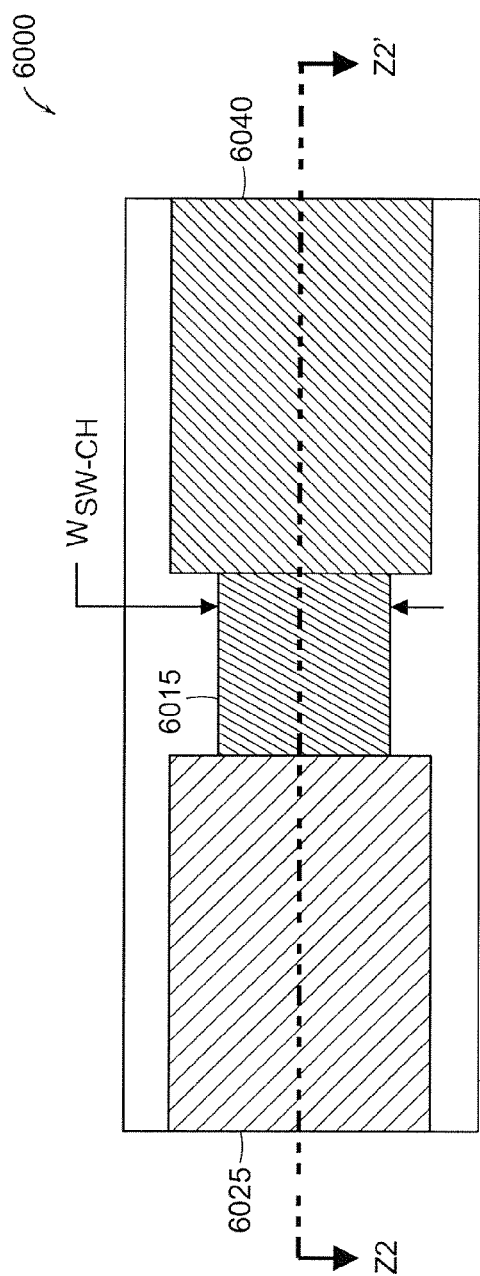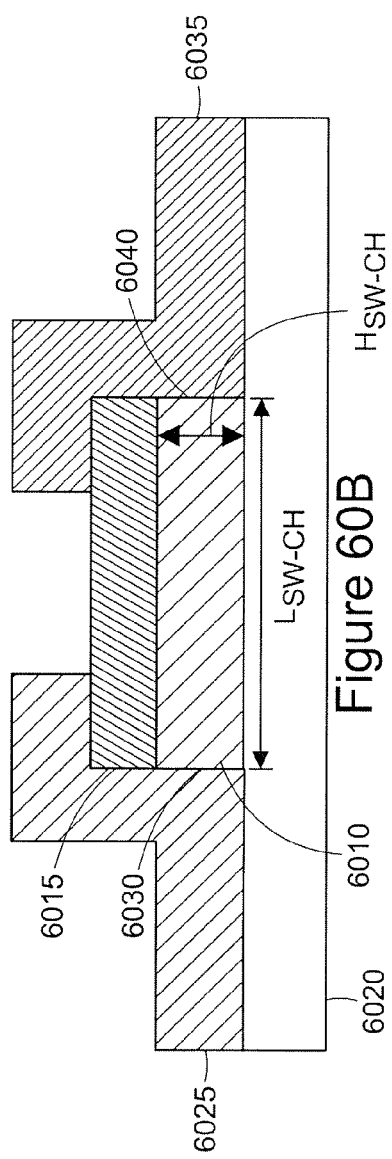

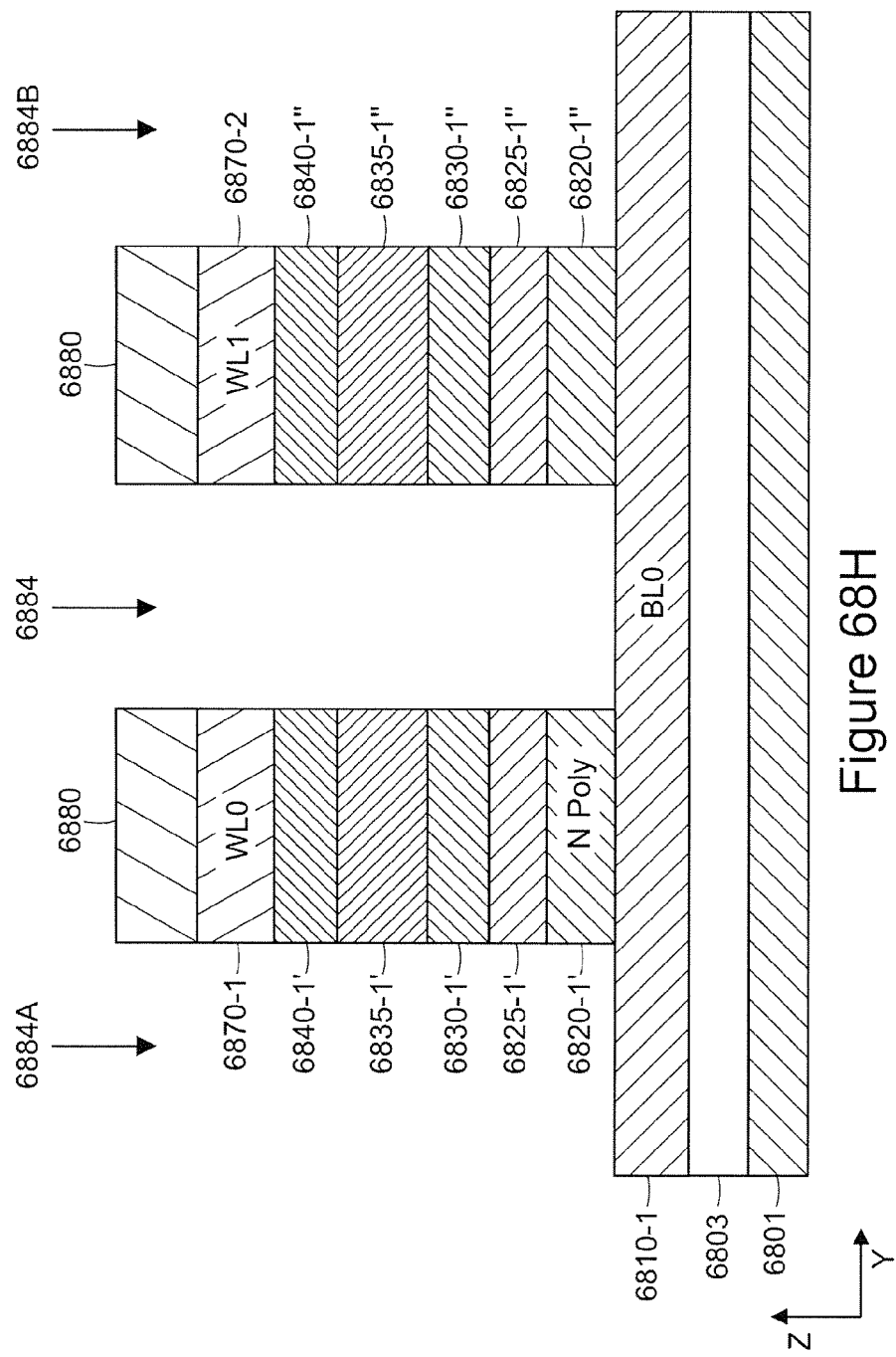

US 7,782,650 B2

NONVOLATILE NANOTUBE DIODES AND NONVOLATILE NANOTUBE BLOCKS AND SYSTEMS USING SAME AND METHODS OF MAKING SAME

CROSS REFERENCE TO RELATED APPLICATIONS

This application claims the benefit under 35 U.S.C. §119 (e) of the following applications, the entire contents of which are incorporated herein by reference:

U.S. Provisional Patent Application No. 60/855,109, entitled "Nonvolatile Nanotube Blocks," filed on Oct. 27, 2006;

U.S. Provisional Patent Application No. 60/840,586, entitled "Nonvolatile Nanotube Diode," filed on Aug. 28, 2006;

U.S. Provisional Patent Application No. 60/836,437, entitled "Nonvolatile Nanotube Diode," filed on Aug. 8, 2006;

U.S. Provisional Patent Application No. 60/836,343, entitled "Scalable Nonvolatile Nanotube Switches as Electronic Fuse Replacement Elements," filed on Aug. 8, 2006; and U.S. Provisional Patent Application No. 60/918,388, entitled "Memory Elements and Cross Point Switches and Arrays of Same Using Nonvolatile Nanotube Blocks," filed on Mar. 16, 2007.

This application is a continuation-in-part of and claims priority under 35 U.S.C. §120 to the following applications, the entire contents of which are incorporated by reference:

U.S. patent application Ser. No. 11/280,786, entitled "Two-Terminal Nanotube Devices And Systems And Methods Of Making Same," filed Nov. 15, 2005;

U.S. patent application Ser. No. 11/274,967, entitled "Memory Arrays Using Nanotube Articles With Reprogrammable Resistance," filed Nov. 15, 2005; and U.S. patent application Ser. No. 11/280,599, entitled "Non-Volatile Shadow Latch Using A Nanotube Switch," filed Nov. 15, 2005.

This application is related to the following applications filed concurrently herewith, the entire contents of which are incorporated by reference:

U.S. patent application Ser. No. 11,835,612, filed Aug. 8, 2007, entitled "Nonvolatile Resistive Memories Having Scalable Two-Terminal Nanotube Switches;"

U.S. patent application Ser. No. 11/835,583, filed Aug. 8, 2007, entitled "Latch Circuits and Operation Circuits Having Scalable Nonvolatile Nanotube Switches as Electronic Fuse Replacement Elements;"

U.S. patent application Ser. No. 11/835,613, filed Aug. 8, 2007, entitled "Memory Elements and Cross Point Switches and Arrays of Same Using Nonvolatile Nanotube Blocks;"

U.S. patent application Ser. No. 11/835,651, filed Aug. 8, 2007, entitled "Nonvolatile Nanotube Diodes and Nonvolatile Nanotube Blocks and Systems Using Same and Methods of Making Same;"

U.S. patent application Ser. No. 11/835,759, filed Aug. 8, 2007, entitled "Nonvolatile Nanotube Diodes and Nonvolatile Nanotube Blocks and Systems Using Same and Methods of Making Same;"

U.S. patent application Ser. No. 11/835,852, filed Aug. 8, 2007, entitled "Nonvolatile Nanotube Diodes and Nonvolatile Nanotube Blocks and Systems Using Same and Methods of Making Same;"

U.S. patent application Ser. No. 11/835,856, filed Aug. 8, 2007, entitled "Nonvolatile Nanotube Diodes and Nonvolatile Nanotube Blocks and Systems Using Same and Methods of Making Same;" and U.S. patent application Ser. No. 11/835,865, filed Aug. 8, 2007, entitled "Nonvolatile Nanotube Diodes and Nonvolatile Nanotube Blocks and Systems Using Same and Methods of Making Same."

TECHNICAL FIELD

The present invention relates to nonvolatile switching devices having nanotube components and methods of forming such devices.

DISCUSSION OF RELATED ART

There is an ever-increasing demand for ever-denser memories that enable larger memory functions, both stand alone and embedded, ranging from 100's of kbits to memories in excess of 1 Gbit. These required larger memories at increasingly higher densities, sold in increasing volumes, and at lower cost per bit, are challenging the semiconductor industry to rapidly improve geometries and process features. For example, such demands drive photolithography technology to smaller line and spacing dimensions with corresponding improved alignment between layers, improved process features/structures such as smaller transistors and storage elements, but also including increased chip size required to accommodate larger memory function, or combined memory and logic function. Sensitivity to smaller defect size increases due to the smaller geometries, while overall defect densities must be significantly reduced.

When transitioning to a new denser technology node, lithography and corresponding process changes typically result in insulator and conductor dimensional reduction of 0.7X in the X and Y directions, or an area reduction of 2X for logic circuits and memory support circuits. Process features unique to the memory cell are typically added, resulting in an additional typical 0.7X area reduction beyond the area reduction resulting from photolithographic improvements, such that the memory cell achieves a cell area reduction of approximately 2.8X. In DRAMs, for example, a process feature change such as a buried trench or stacked storage capacitor is introduced with corresponding optimized cell contact means between one capacitor plate and the source of a cell select FET formed in the semiconductor substrate. The tradeoffs described with respect to DRAM memories are similar to those for other memory types such as EPROM, EEPROM, and Flash.

Memory efficiency is determined by comparing the bit storage area and the corresponding overhead of the support circuit area. Support circuit area is minimized with respect to array storage area. For 2-D memories, that is memories in which a cell select transistor is formed in a semiconductor substrate, for a transition to a denser new technology node (technology generation) the bit area may be reduced by more than the support circuit area as illustrated further above with respect to a memory example where the bit area is reduced by 2.8X while the support circuit area is reduced by 2X. In order to preserve memory efficiency, memory architecture may be changed such that larger sub-arrays are fabricated, that is sub-arrays with more bits per word line and more bits per bit line. In order continue to improve memory performance while containing power dissipation, new memory architectures use global and local (segmented) word line and global and local (segmented) bit line architectures to accommodate larger sub-arrays with more bits per word and bit lines as described for example in U.S. Pat. No. 5,546,349, the entire contents of which are incorporated herein by reference.

In addition to the growth in memory sub-array size, chip area may grow as well. For example, if the memory function at a new technology node is to have 4X more bits, then if the bit area reduction is 2.8X, chip area growth will be at least 1.4-1.5X.

Continuing with the memory example described further above, if the chip area of a memory at the present technology node is 60% bit area array and 40% support circuit area, then if chip architecture is not changed, and if bit area efficiency for a new technology node is improved by 2.8X while support circuit layout is improved by 2X, then bit area and support circuit areas will both be approximately 50% of chip area. Architecture changes and circuit design and layout improvements to increase the number of bits per word and bit lines, such as global and local segmented word and bit lines described in U.S. Pat. No. 5,546,349, may be used to achieve 60% bit area and 40% support circuits for a new 4X larger memory function chip design at a new technology node. However, the chip area will be 1.4X to 1.5X larger for the 4X the memory function. So for example, if the present chip area is 100 mm$^2$, then the new chip area for a 4× larger memory will be 140 to 150 mm$^2$; if the present chip area is 70 mm$^2$, then the new chip area for a 4X larger memory function will be at least 100 mm$^2$.

From a fabrication (manufacturing) point of view, transition to high volume production of a new 4X larger memory function at a new technology node does not occur until the cost per bit of the new memory function is competitive with that of the present generation. Typically, at least two and sometimes three new chips are designed with incremental reductions in photolithographic linear dimensions (shrinks) of 10 to 15% each, reducing chip area of the 4X memory function to 100 mm$^2$ or less to increase the number of chips per wafer and reduce the cost per bit of memory to levels competitive with the present generation memory.

Crafts et al., U.S. Pat. No. 5,536,968, the entire contents of which are incorporated herein by reference, discloses a OTP field-programmable memory having a cell formed by a diode in series with a nonvolatile OTP element, in this patent a polysilicon fuse element. Each cell includes an as-formed polysilicon fuse of typically 100s of Ohms and a series select diode. The memory array is a 2-D memory array with a long folded narrow polyfuse element. If selected, milli-Amperes of current blow a selected polysilicon fuse which becomes nonconducting. The storage cell is large because of large polysilicon fuse dimensions, so the OTP memory described in U.S. Pat. No. 5,536,968 does not address the memory scaling problems describe further above.

Roesner, U.S. Pat. No. 4,442,507, the entire contents of which are incorporated herein by reference, discloses a one-time-programmable (OTP) field-programmable memory using a 3-dimensional (3-D) memory cell and corresponding process, design, and architecture to replace the 2-dimensional (2-D) memory approach of increasing chip area while reducing individual component size (transistors) and interconnections for each new generation of memory. U.S. Pat. No. 4,442,507 illustrates an EPROM (one-time-programmable) memory having a 3-D EPROM array in which cell select devices, storage devices, and interconnect means are not fabricated in or on a semiconductor substrate, but are instead formed on an insulating layer above support circuits formed in and on a semiconductor substrate with interconnections between support circuits and the 3-D EPROM memory array. Such a 3-D memory approach significantly reduces lithographic and process requirements associated with denser larger memory function.

3-D EPROM prior art array 100 illustrated in FIG. 1 is a representation of a prior art corresponding structure in U.S. Pat. No. 4,442,507. The memory cell includes a vertically-oriented Schottky diode in series with an antifuse formed above the Schottky diode using lightly doped polysilicon. Support circuits and interconnections 110 are formed in and on supporting semiconductor substrate 105, silicon for example. Interconnections through insulator 115 (not shown in FIG. 1) are used to connect support circuits to array lines such as conductor 120 and conductor 170. Memory cells are fabricated on the surface of insulator 115, include Schottky diode 142, antifuse 155, and interconnected by combined conductor 120 and N+ polysilicon conductor 122, and metal conductor 170 and conductive barrier layer 160. Note that although the surface of insulator 115 is illustrated as if planar, in fact it is non-planar as illustrated in more detail in U.S. Pat. No. 4,442,507 because VLSI planarization techniques were not available at the time of the invention.

N+ polysilicon patterned layer semiconductor 122 is used as one Schottky diode 142 contact and as an array interconnect line. N+ polysilicon semiconductor 122 may be silicon or germanium, for example, and is typically doped to 10$^{20}$ dopant atoms/cm$^3$ with a resistance of 0.04 Ohms/square. While semiconductor 122 may be used as an array line, a lower resistance array line may be formed by depositing N+ polysilicon semiconductor 122 on a molybdenum silicide conductor 120 between the N+ semiconductor layer and the surface of insulator 115. A second N– polycrystalline silicon or germanium semiconductor patterned layer (semiconductor) 125, in contact with semiconductor 122, is typically doped in the range of 10$^{14}$ to 10$^{17}$ dopant atoms/cm$^3$, with a resistance of 15 Ohms/square and forms the cathode terminal of Schottky diode 142 which is used as a cell selection device. Dopants may be arsenic, phosphorous, and antimony for example. Polysilicon conductors 122 and 125 are typically 400 nm thick and 2 um in width.

The anode of Schottky diode device 142 is formed by patterned conductor 140 using a noble metal such as platinum of thickness 25 nm deposited on N– polycrystalline silicon conductor 125, and heated to 600 degrees C. to form a compound (e.g. platinum silicide) with the underlying polycrystalline material. The silicide of noble metal 140 and the underlying N– polysilicon semiconductor 125 forms junction 145 of Schottky diode 142. Schottky diode 142 measurements resulted in a turn-on voltage of approximately 0.4 volts and a reverse breakdown voltage of approximately 10 volts.

The nonvolatile state of the memory cell is stored in antifuse 155 as a resistive state. The resistive state of antifuse 155 is alterable (programmable) once (OTP) after the fabrication process is complete. Preferably, the material 150 used to form antifuse 155 is a single element N– semiconductor such as silicon or germanium, typically having a doping of less than 10$^{17}$ atoms/cm$^3$, where arsenic and phosphorous are suitable N-type dopants as described further in U.S. Pat. No. 4,442,507. After patterning to form antifuse 155, a conductive barrier layer 160 of TiW 100 nm thick is deposited in contact with antifuse 155 and insulator 130. Then, an 800 nm aluminum layer is deposited and patterned to form conductor 170. Both conductor 170 and conductive barrier layer 160 are patterned. Conductive barrier layer 160 is used to prevent aluminum from migrating into the N– polysilicon material 150.

The resistance of the antifuse is typically 10$^7$ ohms as formed. Initially, all antifuses in all cells have a resistance value of approximately $10^7$ ohms as-fabricated. If a cell is selected and programmed such that an antifuse threshold voltage of approximately 10 volts is reached, then the antifuse resistance changes to $10^2$ ohms, with programming current limited to approximately 50 uA, and with programming time in the microsecond range. An antifuse may be programmed only once, and the nonvolatile new lower resistance state stored in a memory cell of the 3-D EPROM memory with the array region above underlying support circuits 110 in and on semiconductor substrate 105.

While U.S. Pat. No. 4,442,507 introduces the concept of 3-D EPROM memory arrays having all cell components and interconnections decoupled from a semiconductor substrate, and above support circuits, the approach is limited to OTP memories.

Prior art FIG. 2 illustrates a fabricated CMOS structure 200 and 200' including devices with a planar local interconnect metal layer and four (metal 1-metal 4) additional more-global planar stacked levels of conductors, and stacked contacts and filled via holes (contact studs) as illustrated the prior art reference Ryan, J. G. et al., "The evolution of interconnection technology at IBM", Journal of Research and Development, Vol. 39, No. 4, July 1995, pp. 371-381, the entire contents of which are incorporated herein by reference. Metal 5 is non-planar and is used to provide off-chip connections. Local interconnects and wiring layers metal 1, metal 2, metal 3, metal 4, and metal 5 may use Al(Cu), W, Mo, Ti, Cu for example. Tight metal pitches require planarization for both metals and oxides and near-vertical, zero overlap via studs typically formed using tungsten (W) as illustrated in FIG. 2. Extensive use of chemical-mechanical polishing (CMP) planarizing technology allows formation of structures 200 and 200'. CMP technology is also illustrated in U.S. Pat. No. 4,944,836, the entire contents of which are incorporated herein by reference, issued Jul. 31, 1990. CMP technology also was chosen for its ability to remove prior level defects.

U.S. Pat. No. 5,670,803, the entire contents of which are incorporated herein by reference, to co-inventor Bertin, discloses a 3-D SRAM array structure with simultaneously defined sidewall dimensions. This structure includes vertical sidewalls simultaneously defined by trenches cutting through multiple layers of doped silicon and insulated regions in order avoid (minimize) multiple alignment steps. These trenches cut through multiple semiconductor and oxide layers and stop on the top surface of a supporting insulator ($SiO_2$) layer between the 3-D SRAM array structure and an underlying semiconductor substrate. U.S. Pat. No. 5,670,803 also teaches in-trench vertical local cell interconnect wiring within a trench region to form a vertically wired 3-D SRAM cell. U.S. Pat. No. 5,670,803 also teaches through-trench vertical interconnect wiring through a trench region to the top surface of a 3-D SRAM storage cell that has been locally wired within a trench cell.

SUMMARY

The present invention provides nonvolatile nanotube diodes and nonvolatile nanotube blocks and systems using same and methods of making same.

Under one aspect, a non-volatile nanotube diode device includes first and second terminals; a semiconductor element including a cathode and an anode, and capable of forming a conductive pathway between the cathode and anode in response to electrical stimulus applied to the first conductive terminal; and a nanotube switching element including a nanotube fabric article in electrical communication with the semiconductive element, the nanotube fabric article disposed between and capable of forming a conductive pathway between the semiconductor element and the second terminal, wherein electrical stimuli on the first and second terminals causes a plurality of logic states.

One or more embodiments include one or more of the following features. In a first logic state of the plurality of logic states a conductive pathway between the first and second terminals is substantially disabled and in a second logic state of the plurality of logic states a conductive pathway between the first and second terminals is enabled. In the first logic state the nanotube article has a relatively high resistance and in the second logic state the nanotube article has a relatively low resistance. The nanotube fabric article includes a non-woven network of unaligned nanotubes. In the second logic state the non-woven network of unaligned nanotubes includes at least one electrically conductive pathway between the semiconductor element and the second terminal. The nanotube fabric article is a multilayered fabric. Above a threshold voltage between the first and second terminals, the semiconductor element is capable of flowing current from the anode to the cathode and below the threshold voltage between the first and second terminals the semiconductor element is not capable of flowing current from the anode to the cathode. In the first logic state, the conductive pathway between the anode and the second terminal is disabled. In the second logic state, the conductive pathway between the anode and the second terminal is enabled. A conductive contact interposed between and providing an electrical communication pathway between the nanotube fabric article and the semiconductor element. The first terminal is in electrical communication with the anode and the cathode is in electrical communication with the conductive contact of the nanotube switching element. In the second logic state, the device is capable of carrying electrical current substantially flowing from the first terminal to the second terminal. The first terminal is in electrical communication with the cathode and the anode is in electrical communication with the conductive contact of the nanotube switching element. When in the second logic state, the device is capable of carrying electrical current substantially flowing from the second terminal to the first terminal. The anode includes a conductive material and the cathode includes an n-type semiconductor material. The anode includes a p-type semiconductor material and the cathode includes a n-type semiconductor material.

Under another aspect, a two-terminal non-volatile state device includes: first and second terminals; a semiconductor field effect element having a source, a drain, a gate in electrical communication with one of the source and the drain, and a channel disposed between the source and the drain, the gate capable of controllably forming an electrically conductive pathway in the channel between the source and the drain; a nanotube switching element having a nanotube fabric article and a conductive contact, the nanotube fabric article disposed between and capable of forming an electrically conductive pathway between the conductive contact and the second terminal; wherein the first terminal is in electrical communication with one of the source and the drain, the other of the source and drain is in electrical communication with the conductive contact; and wherein a first set of electrical stimuli on the first and second conductive terminals causes a first logic state and a second set of electrical stimuli on the first and second conductive terminals causes a second logic state.

One or more embodiments include one or more of the following features. The first logic state corresponds to a relatively non-conductive pathway between the first and second terminals and the second logic state corresponds to a conductive pathway between the first and second terminals. The first set of electrical stimuli causes a relatively high resistance state in the nanotube fabric article and the second set of electrical stimuli causes a relatively low resistance state in the nanotube fabric article. The nanotube fabric article includes a non-woven network of unaligned nanotubes. The nanotube fabric article includes a multilayered fabric. In response to the second set of electrical stimuli, the non-woven network of unaligned nanotubes provides at least one electrically conductive pathway between the conductive contact and the semiconductor field-effect element. In response to the second set of electrical stimuli, a conductive pathway between the source and the drain is formed in the conductive channel. The semiconductor field effect element includes a PFET. The semiconductor field effect element includes a NFET. The source of the semiconductor field-effect element is in electrical communication with the first terminal and the drain is in electrical communication with the conductive contact of the nanotube switching element. The drain of the semiconductor field-effect element is in electrical communication with the first terminal and the source of the is in electrical communication with the conductive contact of the nanotube switching element.

Under another aspect, a voltage selection circuit includes: an input voltage source; an output voltage terminal and a reference voltage terminal; a resistive element; and a non-volatile nanotube diode device including: first and second terminals; a semiconductor element in electrical communication with the first terminal; a nanotube switching element disposed between and capable of conducting electrical stimulus between the semiconductor element and the second terminal; wherein the nonvolatile nanotube diode device is capable of conducting electrical stimulus between the first and second terminals, wherein the resistive element is disposed between the input voltage source and the output voltage terminal, the nonvolatile nanotube diode device is disposed between and in electrical communication with the output voltage terminal and the reference voltage terminal, and wherein the voltage selection circuit is capable of providing a first output voltage level when, in response to electrical stimulus at the input voltage source and the reference voltage terminal, the nonvolatile nanotube diode substantially prevents the conduction of electrical stimulus between the first and second terminals and wherein the voltage selection circuit is capable of providing a second output voltage level when, in response to electrical stimulus at the input voltage source and the reference voltage terminal, the nonvolatile nanotube diode conducts electrical stimulus between the first and second terminals.

One or more embodiments include one or more of the following features. The semiconductor element includes an anode and a cathode, the anode in electrical communication with the first terminal and the cathode in communication with the nanotube switching element. The semiconductor element includes a field effect element having a source region in communication with the first terminal, a drain region in electrical communication with the nanotube switching element, a gate region in electrical communication with one of the source region and the drain region, and a channel region capable of controllably forming and unforming an electrically conductive pathway between the source and the drain in response to electrical stimulus on the gate region. The first output voltage level is substantially equivalent to the input voltage source. The second output voltage level is substantially equivalent to the reference voltage terminal. The nanotube switching element includes a nanotube fabric article capable of a high resistance state and a low resistance state. The high resistance state of the nanotube fabric article is substantially higher than the resistance of the resistive element and wherein the low resistance state of the nanotube fabric article is substantially lower than the resistance of the resistive element. The first output voltage level is determined, in part, by the relative resistance of the resistive element and the high resistance state of the nanotube fabric article, and wherein the second output voltage level is determined, in part, by the relative resistance of the resistive element and the low resistance state of the nanotube fabric article.

Under another aspect, a nonvolatile nanotube diode includes a substrate; a semiconductor element disposed over the substrate, the semiconductor element having an anode and a cathode and capable of forming an electrically conductive pathway between the anode and the cathode; a nanotube switching element disposed over the semiconductor element, the nanotube switching element including a conductive contact and a nanotube fabric element capable of a plurality of resistance states; and a conductive terminal disposed in spaced relation to the conductive contact, wherein the nanotube fabric element is interposed between and in electrical communication with the conductive contact and the conductive contact is in electrical communication with the cathode, and wherein in response to electrical stimuli applied to the anode and the conductive terminal, the nonvolatile nanotube diode is capable of forming an electrically conductive pathway between the anode and the conductive terminal.

One or more embodiments include one or more of the following features. The anode includes a conductor material and the cathode includes a semiconductor material. The anode material includes at least one of Al, Ag, Au, Ca, Co, Cr, Cu, Fe, Ir, Mg, Mo Na, Ni, Os, Pb, Pd, Pt, Rb, Ru, Ti, W, Zn, $CoSi_2$, $MoSi_2$, $Pd_2Si$, PtSi, $RbSi_2$, $TiSi_2$, $WSi_2$ and $ZrSi_2$. The semiconductor element includes a Schottky barrier diode. A second conductive terminal interposed between the substrate and the anode, the second conductive terminal in electrical communication with the anode, wherein in response to electrical stimuli at said second conductive terminal and the conductive terminal, the nonvolatile nanotube diode is capable of forming an electrically conductive pathway between said second conductive terminal and the conductive terminal. The anode includes a semiconductor material of a first type and the cathode region includes a semiconductor material of a second type. The semiconductor material of the first type is positively doped, the semiconductor material of the second type is negatively doped, and the semiconductor element forms a PN junction. The nanotube fabric element is substantially vertically disposed. The nanotube fabric element is substantially horizontally disposed. The nanotube fabric element includes a nonwoven multilayered fabric. The nanotube fabric element has a thickness between approximately 20 nm and approximately 200 nm. The conductive contact is disposed substantially coplanar to a lower surface of the nanotube fabric element and the conductive terminal is disposed substantially coplanar to an upper surface of the nanotube fabric element. The semiconductor element is a field effect transistor.

Under another aspect, a nonvolatile nanotube diode includes a substrate; a conductive terminal disposed over the substrate; a semiconductor element disposed over the conductive terminal, the semiconductor element having a cathode and an anode and capable of forming an electrically conductive pathway between the cathode and the anode; and a nanotube switching element disposed over the semiconductor element, the nanotube switching element including a conductive contact and nanotube fabric element capable of a plurality of resistance states, wherein the nanotube fabric element is interposed between and in electrical communication with anode and the conductive contact and cathode is in electrical communication with the conductive terminal, and wherein in response to electrical stimuli applied to the anode and the conductive terminal, the nonvolatile nanotube diode is capable of forming an electrically conductive pathway between the conductive terminal and the conductive contact.

One or more embodiments include one or more of the following features. The anode includes a conductor material and the cathode includes a semiconductor material. The anode material includes at least one of Al, Ag, Au, Ca, Co, Cr, Cu, Fe, Ir, Mg, Mo Na, Ni, Os, Pb, Pd, Pt, Rb, Ru, Ti, W, Zn, $CoSi_2$, $MoSi_2$, $Pd_2Si$, PtSi, $RbSi_2$, $TiSi_2$, $WSi_2$ and $ZrSi_2$. The semiconductor element includes a Schottky barrier diode. A second conductive terminal interposed between and providing an electrically conductive path between the anode and the patterned region of nonwoven nanotube fabric. The anode includes a semiconductor material of a first type and the cathode region includes a semiconductor material of a second type. The semiconductor material of the first type is positively doped, the semiconductor material of the second type is negatively doped, and the semiconductor element forms a PN junction. The nanotube fabric element is substantially vertically disposed. The nanotube fabric element is substantially horizontally disposed. The nanotube fabric element includes a layer of nonwoven nanotubes having a thickness between approximately 0.5 and approximately 20 nanometers. The nanotube fabric element includes a nonwoven multilayered fabric. The conductive contact is disposed substantially coplanar to a lower surface of the nanotube fabric element and the conductive terminal is disposed substantially coplanar to an upper surface of the nanotube fabric element. The semiconductor element includes a field effect transistor.

Under another aspect, a memory array includes a plurality of word lines; a plurality of bit lines; a plurality of memory cells, each memory cell responsive to electrical stimulus on a word line and on a bit line, each memory cell including: a two-terminal non-volatile nanotube switching device including a first and a second terminal, a semiconductor diode element, and a nanotube fabric article, the semiconductor diode and a nanotube article disposed between and in electrical communication with the first and second terminals, wherein the nanotube fabric article is capable of a plurality of resistance states, and wherein the first terminal is coupled to the one word line and the second terminal is coupled to the one bit line, the electrical stimulus applied to the first and second terminals capable of changing the resistance state of the nanotube fabric article; and a memory operation circuit operably coupled to each bit line of the plurality of bit lines and each word line of the plurality of word lines, said operation circuit capable of selecting each of the cells by activating at least one of the bit line and the word line coupled to that cell to apply a selected electrical stimulus to each of the corresponding first and second terminals, and said operation circuit further capable of detecting a resistance state of the nanotube fabric article of a selected memory cell and adjusting the electrical stimulus applied to each of the corresponding first and second terminals in response to the resistance state to controllably induce a selected resistance state in the nanotube fabric article, wherein the selected resistance state of the nanotube fabric article of each memory cell corresponds to an informational state of said memory cell.

One or more embodiments include one or more of the following features. Each memory cell nonvolatily stores the corresponding information state in response to electrical stimulus applied to each of the corresponding first and second terminals. The semiconductor diode element includes a cathode and an anode, the anode in electrical communication with the second terminal and the cathode in electrical communication with the nanotube switching element. The cathode includes a first semiconductor material and the anode includes a second semiconductor material. The semiconductor diode element includes a cathode and an anode, the cathode in electrical communication with the first terminal and the anode in electrical communication with the nanotube switching element. The cathode includes a first semiconductor material and the anode includes a second semiconductor material. The cathode includes a semiconductor material and the anode includes a conductive material and forms a conductive contact to the nanotube fabric article. A conductive contact interposed between the semiconductor diode element and the nanotube fabric article. The nanotube fabric article includes a network of unaligned nanotubes capable of providing at least one electrically conductive pathway between the first conductive contact and one of the first and second terminals. The nanotube fabric article includes a multilayered nanotube fabric. The multilayered nanotube article has a thickness that defines a spacing between the conductive contact and one of the first and second conductive terminals. The plurality of memory cells includes multiple pairs of stacked memory cells, wherein a first memory cell in each pair of stacked memory cells is disposed above and in electrical communication with a first bit line and the word line is disposed above and in electrical communication with the first memory cell; and wherein a second memory cell in each pair of stacked memory cells is disposed above and in electrical communication with the word line and a second bit line is disposed above and in electrical communication with the second memory cell. The resistance state of the nanotube article in the first memory cell is substantially unaffected by the resistance state of the nanotube article in the second memory cell and the resistance state of the nanotube article in the second memory cell is substantially unaffected by the resistance state of the nanotube article in the first memory cell. The resistance state of the nanotube article in the first memory cell is substantially unaffected by said operation circuit selecting the second memory cell and the resistance state of the nanotube article in the second memory cell is substantially unaffected by the resistance state by said operation circuit selecting the first memory cell. The resistance state of the nanotube article in the first memory cell is substantially unaffected by said operation circuit detecting a resistance state of the nanotube fabric article of the second memory cell and the resistance state of the nanotube article in the second memory cell is substantially unaffected by the resistance state by said operation circuit detecting a resistance state of the nanotube fabric article of the first memory cell. The resistance state of the nanotube article in the first memory cell is substantially unaffected by said operation circuit adjusting the electrical stimulus applied to each of the corresponding first and second terminals of the second memory cell and the resistance state of the nanotube article in the second memory cell is substantially unaffected by the resistance state by said operation circuit adjusting the electrical stimulus applied to each of the corresponding first and second terminals of the first memory cell. An insulating region and a plurality of conductive interconnects wherein the insulating region is disposed over the memory operation circuit, the plurality of memory cells are disposed over the insulating region, and the plurality of conductive interconnects operably couple the memory operation circuit to the plurality of bit lines and plurality of word lines. Adjusting the electrical stimulus includes incrementally changing the voltage applied to each of the corresponding first and second terminals. Incrementally changing the voltage includes applying voltage pulses. Amplitudes of subsequent voltage pulses are incrementally increased by approximately 200 mV. Adjusting the electrical stimulus includes changing the current supplied to at least one of the corresponding first and second terminals. Substantially removing electrical stimulus from the corresponding bit line and word line after controllably inducing the selected resistance state in the nanotube fabric article to substantially preserve the selected resistance state of the nanotube fabric article. Detecting the resistance state of the nanotube fabric article further includes detecting a variation over time of electrical stimulus on a corresponding bit line. Detecting the resistance state of the nanotube fabric article further includes detecting a current flow though a corresponding bit line. In each two terminal nonvolatile nanotube switching device, current is capable of flowing from the second terminal to the first terminal and substantially prevented from flowing from the first terminal to the second terminal. Current is capable of flowing from the second terminal to the first terminal when a threshold voltage is reached by applying electrical stimulus to each of the corresponding first and second terminals. The selected resistance state of the nanotube fabric article of each memory cell includes one of a relatively high resistance state corresponding to a first informational state of said memory cell and a relatively low resistance state corresponding to a second informational state of said memory cell. A third information state of each memory cell corresponds to a state in which current is capable of flowing from the second terminal to the first terminal and wherein a fourth information state of each memory cell corresponds to a state in which current is substantially prevented from flowing from the first terminal to the second terminal. The two-terminal non-volatile nanotube switching device is operable independently of the voltage polarity between the first and second terminals. The two-terminal non-volatile nanotube switching device is operable independently of the direction of current flow between the first and second terminals. The plurality of memory cells includes multiple pairs of stacked memory cells, wherein a first memory cell in each pair of stacked memory cells is disposed above and in electrical communication with a first bit line and the word line is disposed above and in electrical communication with the first memory cell; wherein an insulator material is disposed over the first memory cell; wherein a second memory cell in each pair of stacked memory cells is disposed above and in electrical communication with a second word line, the second word line disposed over the insulator material and wherein a second bit line is disposed above and in electrical communication with the second memory cell. The plurality of memory cells includes multiple pairs of stacked memory cells, wherein a first memory cell in each pair of stacked memory cells is disposed above and in electrical communication with a first bit line and the word line is disposed above and in electrical communication with the first memory cell; wherein an insulator material is disposed over the first memory cell; wherein a second memory cell in each pair of stacked memory cells is disposed above and in electrical communication with a second bit line, the second bit line disposed over the insulator material and wherein a second word line is disposed above and in electrical communication with the second memory cell.

Under another aspect, a method of making a nanotube switch includes: providing a substrate having a first conductive terminal; depositing a multilayer nanotube fabric over the first conductive terminal; and depositing a second conductive terminal over the multilayer nanotube fabric, the nanotube fabric having a thickness, density, and composition selected to prevent direct physical and electrical contact between the first and second conductive terminals.

One or more embodiments include one or more of the following features. Lithographically patterning the first and second conductive terminals and the multilayer nanotube fabric so as to each have substantially the same lateral dimensions. The first and second conductive terminals and the multilayer nanotube fabric each have a substantially circular lateral shape. The first and second conductive terminals and the multilayer nanotube fabric each have a substantially rectangular lateral shape. The first and second conductive terminals and the multilayer nanotube fabric each have lateral dimensions of between about 200 nm×200 nm and about 22 nm×22 nm. The first and second conductive terminals and the multilayer nanotube fabric each have a lateral dimension of between about 22 nm and about 10 nm. The first and second conductive terminals and the multilayer nanotube fabric each have a lateral dimension of less than 10 nm. The multilayer nanotube fabric has a thickness between about 10 nm and about 200 nm. The multilayer nanotube fabric has a thickness between about 10 nm and about 50 nm. The substrate includes a diode under the first conductive terminal, the diode being addressable by control circuitry. Lithographically patterning the first and second conductive terminals, the multilayer nanotube fabric, and the diode so as to each have substantially the same lateral dimensions. Providing a second diode over the second conductive terminal, depositing a third conductive terminal over the second diode, depositing a second multilayer nanotube fabric over the third conductive terminal, and depositing a fourth conductive terminal over the second multilayer nanotube fabric. Lithographically patterning the multilayer nanotube fabrics, the diodes, and the conductive terminals so as to each have substantially the same lateral dimensions. The diode includes a layer of N+ polysilicon, a layer of N polysilicon, and a layer of conductor. The diode includes a layer of N+ polysilicon, a layer of N polysilicon, and a layer of P polysilicon. Providing a diode over the second conductive terminal, the diode being addressable by control circuitry. Annealing the diode at a temperature exceeding 700° C. Lithographically patterning the first and second conductive terminals, the multilayer nanotube fabric, and the diode so as to each have substantially the same lateral dimensions. The substrate includes a semiconductor field effect transistor, at least a portion of which is under the first conductive terminal, the semiconductor field effect transistor being addressable by control circuitry. Depositing the multilayer nanotube fabric includes spraying nanotubes dispersed in a solvent onto the first conductive terminal. Depositing the multilayer nanotube fabric includes spin coating nanotubes dispersed in a solvent onto the first conductive terminal. Depositing the multilayer nanotube fabric includes depositing a mixture of nanotubes and a matrix material dispersed in a solvent onto the first conductive terminal. Removing the matrix material after depositing the second conductive terminal. The matrix material includes polypropylene carbonate. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$. Depositing a porous dielectric material on the multilayer nanotube fabric. The porous dielectric material includes one of a spin-on glass and a spin-on low-K dielectric. Depositing a nonporous dielectric material on the multilayer nanotube fabric. The nonporous dielectric material includes a high-K dielectric. The nonporous dielectric material includes hafnium oxide. Providing a word line in electrical communication with the second conductive terminal.

Under another aspect, a method of making a nanotube diode includes: providing a substrate having a first conductive terminal; depositing a multilayer nanotube fabric over the first conductive terminal; depositing a second conductive terminal over the multilayer nanotube fabric, the nanotube fabric having a thickness, density, and composition selected to prevent direct physical and electrical contact between the first and second conductive terminals; and providing a diode in electrical contact with one of the first and second conductive terminals.

One or more embodiments include one or more of the following features. Providing the diode after depositing the multilayer nanotube fabric. Annealing the diode at a temperature exceeding 700° C. Positioning the diode over and in electrical contact with the second conductive terminal. Positioning the diode under and in electrical contact with the first conductive terminal. Lithographically patterning the first and second conductive terminals, the multilayer nanotube fabric, and the diode so as to each have substantially the same lateral dimensions. The first and second conductive terminals, the multilayer nanotube fabric, and the diode each have a substantially circular lateral shape. The first and second conductive terminals, the multilayer nanotube fabric, and the diode each have a substantially rectangular lateral shape. The first and second conductive terminals and the multilayer nanotube fabric each have lateral dimensions of between about 200 nm×200 nm and about 22 nm×22 nm.

Under another aspect, a non-volatile nanotube switch includes a first conductive terminal; a nanotube block including a multilayer nanotube fabric, at least a portion of the nanotube block being positioned over and in contact with at least a portion of the first conductive terminal; a second conductive terminal, at least a portion of the second conductive terminal being positioned over and in contact with at least a portion of the nanotube block, wherein the nanotube block is constructed and arranged to prevent direct physical and electrical contact between the first and second conductive terminals; and control circuitry in electrical communication with and capable of applying electrical stimulus to the first and second conductive terminals, wherein the nanotube block is capable of switching between a plurality of electronic states in response to a corresponding plurality of electrical stimuli applied by the control circuitry to the first and second conductive terminals, and wherein, for each different electronic state of the plurality of electronic states, the nanotube block provides an electrical pathway of corresponding different resistance between the first and second conductive terminals.

One or more embodiments include one or more of the following features. Substantially the entire nanotube block is positioned over substantially the entire first conductive terminal, and wherein substantially the entire second conductive terminal is positioned over substantially the entire nanotube block. The first and second conductive terminals and the nanotube block each have a substantially circular lateral shape. The first and second conductive terminals and the nanotube block each have a substantially rectangular lateral shape. The first and second conductive terminals and the nanotube block each have a lateral dimension between about 200 nm and about 22 nm. The first and second conductive terminals and the nanotube block each have a lateral dimension between about 22 nm and about 10 nm. The first and second conductive terminals and the nanotube block each have lateral dimension of less than about 10 nm. The nanotube block has a thickness between about 10 nm and about 200 nm. The nanotube block has a thickness between about 10 nm and about 50 nm. The control circuitry includes a diode in direct physical contact with the first conductive terminal. The first conductive terminal is positioned over the diode. The diode is positioned over the second conductive terminal. The diode, the nanotube block, and the first and second conductive terminals have substantially the same lateral dimensions. The diode includes a layer of N+ polysilicon, a layer of N polysilicon, and a layer of conductor. The diode includes a layer of N+ polysilicon, a layer of N polysilicon, and a layer of P polysilicon. The control circuitry includes a semiconductor field effect transistor in contact with the first conductive terminal. The first and second conductive terminals each include a conductive material independently selected from the group consisting of Ru, Ti, Cr, Al, Al(Cu), Au, Pd, Pt, Ni, Ta, W, Cu, Mo, Ag, In, Ir, Pb, Sn, TiAu, TiCu, TiPd, PbIn, TiW, RuN, RuO, TiN, TaN, $CoSi_x$, and $TiSi_x$. The nanotube block further includes a porous dielectric material. The porous dielectric material includes one of a spin-on glass and a spin-on low-K dielectric. The nanotube block further includes a nonporous dielectric material. The nonporous dielectric material includes hafnium oxide.

Under another aspect, a high-density memory array includes: a plurality of word lines and a plurality of bit lines; a plurality of memory cells, each memory cell including: a first conductive terminal; a nanotube block over the first conductive terminal, the nanotube block including a multilayer nanotube fabric; a second conductive terminal over the nanotube block and in electrical communication with a word line of the plurality of word lines; and a diode in electrical communication with a bit line of the plurality of bit lines and one of the first and second conductive terminals, wherein the nanotube block has a thickness that defines a spacing between the first and second conductive terminals, and wherein a logical state of each memory cell is selectable by activation only of the bit line and the word line connected to that memory cell. The diode is positioned under the first conductive terminal. The diode is positioned over the second conductive terminal. The diode, the first and second conductive terminals, and the nanotube block all have substantially the same lateral dimensions. The diode, the first and second conductive terminals, and the nanotube block each have a substantially circular lateral shape. The diode, the first and second conductive terminals, and the nanotube block each have a substantially rectangular lateral shape. The diode, the first and second conductive terminals, and the nanotube block each have a lateral dimension between about 200 nm and about 22 nm. The memory cells are spaced from each other by between about 200 nm and about 22 nm. The first and second conductive terminals, and the nanotube block each have a lateral dimension between about 22 nm and about 10 nm. The memory cells of the array are spaced from each other by between about 220 nm and about 10 nm. Some memory cells of the array are laterally spaced relative to each other, and other memory cells of the array are stacked on top of each other. Some of the memory cells of the array that are stacked on top of each other share a bit line. Some of the memory cells of the array that are laterally spaced relative to each other share a word line. The plurality of word lines are substantially perpendicular to the plurality of bit lines. The thickness of the nanotube block is between about 10 nm and about 200 nm. The thickness of the nanotube block is between about 10 nm and about 50 nm.

Under another aspect, a high-density memory array includes: a plurality of word lines and a plurality of bit lines; a plurality of memory cells, each memory cell including: a first conductive terminal; a nanotube block over the first conductive terminal, the nanotube block including a multilayer nanotube fabric; a second conductive terminal over the nanotube block and in electrical communication with a bit line of the plurality of bit lines; and a diode in electrical communication with a word line of the plurality of word lines, wherein the nanotube block has a thickness that defines a spacing between the first and second conductive terminals, wherein a logical state of each memory cell is selectable by activation only of the bit line and the word line connected to that memory cell. The diode is positioned under the first conductive terminal. The diode is positioned over the second conductive terminal. The diode, the first and second conductive terminals, and the nanotube block all have substantially the same lateral dimensions. The diode, the first and second conductive terminals, and the nanotube block each have a substantially circular lateral shape. The diode, the first and second conductive terminals, and the nanotube block each have a substantially rectangular lateral shape. The diode, the first and second conductive terminals, and the nanotube block each have a lateral dimension between about 200 nm and about 22 nm. The memory cells are spaced from each other by between about 200 nm and about 22 nm. The diode, the first and second conductive terminals, and the nanotube block each have a lateral dimension between about 22 nm and about 10 nm. The memory cells of the array are spaced from each other by between about 220 nm and about 10 nm. Some memory cells of the array are laterally spaced relative to each other, and other memory cells of the array are stacked on top of each other. Some of the memory cells of the array that are stacked on top of each other share a bit line. Some of the memory cell of the array that are laterally spaced relative to each other share a word line. The plurality of word lines are substantially perpendicular to the plurality of bit lines. The thickness of the nanotube block is between about 10 nm and about 200 nm. The thickness of the nanotube block is between about 10 nm and about 50 nm.

Under another aspect, a high-density memory array includes: a plurality of word lines and a plurality of bit lines; a plurality of memory cell pairs, each memory cell pair including: a first memory cell including a first conductive terminal, a first nanotube element over the first conductive terminal, a second conductive terminal over the nanotube element, and a first diode in electrical communication with one of the first and second conductive terminals and with a first bit line of the plurality of bit lines; and a second memory cell including a third conductive terminal, a second nanotube element over the first conductive terminal, a fourth conductive terminal over the nanotube element, and a second diode in electrical communication with one of the third and fourth conductive terminals and with a second bit line of the plurality of bit lines, wherein the second memory cell is positioned over the first memory cell, and wherein the first and second memory cell share a word line of the plurality of word lines; wherein each memory cell pair of the plurality of memory cells is capable of switching between at least four different resistance states corresponding to four different logic states in response to electrical stimuli at the first and second bit lines and the shared word line.

Under another aspect, a high-density memory array includes: a plurality of word lines and a plurality of bit lines; a plurality of memory cell pairs, each memory cell pair including: a first memory cell including a first conductive terminal, a first nanotube element over the first conductive terminal, a second conductive terminal over the nanotube element, and a first diode in electrical communication with one of the first and second conductive terminals and with a first word line of the plurality of word lines; and a second memory cell including a third conductive terminal, a second nanotube element over the first conductive terminal, a fourth conductive terminal over the nanotube element, and a second diode in electrical communication with one of the third and fourth conductive terminals and with a second word line of the plurality of word lines, wherein the second memory cell is positioned over the first memory cell, and wherein the first and second memory cell share a bit line of the plurality of bit lines; wherein each memory cell pair of the plurality of memory cells is capable of switching between at least four different resistance states corresponding to four different logic states in response to electrical stimuli at the first and second word lines and the shared bit line.

Under another aspect, a nanotube diode includes: a cathode formed of a semiconductor material; and an anode formed of nanotubes, wherein the cathode and the anode are in fixed and direct physical contact; and wherein the cathode and anode are constructed and arranged such that sufficient electrical stimulus applied to the cathode and the anode creates a conductive pathway between the cathode and the anode.

One or more embodiments include one or more of the following features. The anode includes a non-woven nanotube fabric having a plurality of unaligned nanotubes. The non-woven nanotube fabric includes a layer of nanotubes having a thickness between approximately 0.5 and approximately 20 nanometers. The non-woven nanotube fabric includes a block of nanotubes. The nanotubes include metallic nanotubes and semiconducting nanotubes. The cathode includes an n-type semiconductor material. A Schottky barrier is formed between the n-type semiconductor material and the metallic nanotubes. A PN junction is formed between the n-type semiconductor material and the semiconducting nanotubes. A PN junction is formed between the n-type semiconductor material and the semiconducting nanotubes. The Schottky barrier and the PN junction provide electrically parallel communication pathways between the cathode and the anode. Further in electrical communication with a nonvolatile memory cell, the nanotube diode capable of controlling electrical stimulus to the nonvolatile memory cell. Further in electrical communication with a nonvolatile nanotube switch, the nanotube diode capable of controlling electrical stimulus to the nonvolatile nanotube switch. Further in electrical communication with an electrical network of switching elements, the nanotube diode capable of controlling electrical stimulus to the electrical network of switching elements. Further in communication with a storage element, the nanotube diode capable of selecting the storage element in response to electrical stimulus. The storage element is nonvolatile. Further in communication with an integrated circuit, the nanotube diode operable as a rectifier for the integrated circuit.

Under another aspect, a nanotube diode includes: a conductive terminal; a semiconductor element disposed over and in electrical communication with the conductive terminal, wherein the semiconductor element forms a cathode; and a nanotube switching element disposed over and in fixed electrical communication with the semiconductor element, wherein the nanotube switching element forms an anode, wherein the nanotube switching element includes a conductive contact and nanotube fabric element capable of a plurality of resistance states, and wherein the cathode and the anode are constructed and arranged such that in response to sufficient electrical stimuli applied to the conductive contact and the conductive terminal, the nonvolatile nanotube diode is capable of forming an electrically conductive pathway between the conductive terminal and the conductive contact.

One or more embodiments include one or more of the following features. The nanotube fabric element includes a patterned region of nanotubes and the semiconductor element includes an n-type semiconductor material. The patterned region of nanotubes includes metallic nanotubes and semiconducting nanotubes. A Schottky barrier is formed between the n-type semiconductor material and the metallic nanotubes including the patterned region of nanotubes. A PN junction is formed between the n-type semiconductor material and the semiconducting nanotubes including the patterned region of nanotubes. The Schottky barrier and the PN junction provide electrically parallel communication pathways between the conducting terminal and the nanotube fabric element. Further in electrical communication with a nonvolatile memory cell, the nanotube diode capable of controlling electrical stimulus to the nonvolatile memory cell. Further in electrical communication with a nonvolatile nanotube switch, the nanotube diode capable of controlling electrical stimulus to the nonvolatile nanotube switch. Further in electrical communication with an electrical network of switching elements, the nanotube diode capable of controlling electrical stimulus to the electrical network of switching elements. Further in communication with a storage element, the nanotube diode capable of selecting the storage element in response to electrical stimulus. The storage element is nonvolatile. Further in communication with an integrated circuit, the nanotube diode operable as a rectifier for the integrated circuit.

BRIEF DESCRIPTION OF THE DRAWINGS

In the Drawing:

FIGS. 6A-6B illustrate an SEM views of embodiments of nonvolatile nanotube switches similar to the embodiment of a nonvolatile nanotube switch illustrated in FIG. 3 in an ON conducting state and in an OFF non-conducting state.

FIGS. 9A-9B illustrate ON and OFF resistance values for exemplary nanotube channel element channel lengths of 250 nm and 22 nm.

FIG. 12 illustrates a schematic diagram of an embodiment of a two terminal nonvolatile nanotube diode formed by a diode and a nonvolatile nanotube switch in series, with a cathode-to-nanotube electrical connection.

FIG. 13 illustrates a schematic diagram of an embodiment of a two terminal nonvolatile nanotube diode formed by a diode and a nonvolatile nanotube switch in series, with an anode-to-nanotube electrical connection.

FIGS. 14 and 15 illustrate schematic diagrams of embodiments of two terminal nonvolatile nanotube diodes formed by NFET-diodes and a nonvolatile nanotube switches in series.

FIGS. 21A-21E illustrate a circuit and device electrical characteristics of nonvolatile nanotube diodes similar to the nonvolatile nanotube diode illustrated in FIG. 12, according to some embodiments.

FIG. 23B illustrates circuit operating waveforms of the circuit shown in FIG. 23A, according to some embodiments.

FIG. 29A schematically illustrates an embodiment of a memory schematic that uses nonvolatile nanotube diodes illustrated in FIG. 13 as nonvolatile memory cells.

FIGS. 42A-42H illustrate methods of fabricating nonvolatile nanotube switches having nanotube elements outside cell boundary regions and within and on vertical sidewalls of trench structures, according to some embodiments.

FIGS. 56A-56F illustrate perspective drawings of embodiments of nonvolatile nanotube switches including switch contact locations at opposite ends of the nanotube element, and embodiments of nonvolatile nanotube block-based switches with contacts located at top, bottom, and end locations.

FIGS. 58A-58D illustrate a cross section drawing and an SEM view of an embodiment of a nonvolatile nanotube block-based switch with top, side, and end contacts.

FIGS. 60A-60C illustrate a cross sectional drawing and an SEM image of an embodiment of a nonvolatile nanotube block-based switch with end-only contacts.

FIGS. 68A-68I illustrate methods of fabrication of cathode-on-nanotube memory cross sectional structures with nonvolatile nanotube diodes that include nonvolatile nanotube block-based switches within vertical cell boundaries such as those illustrated in FIGS. 67 and 40, according to some embodiments.

DETAILED DESCRIPTION

Figure 1:
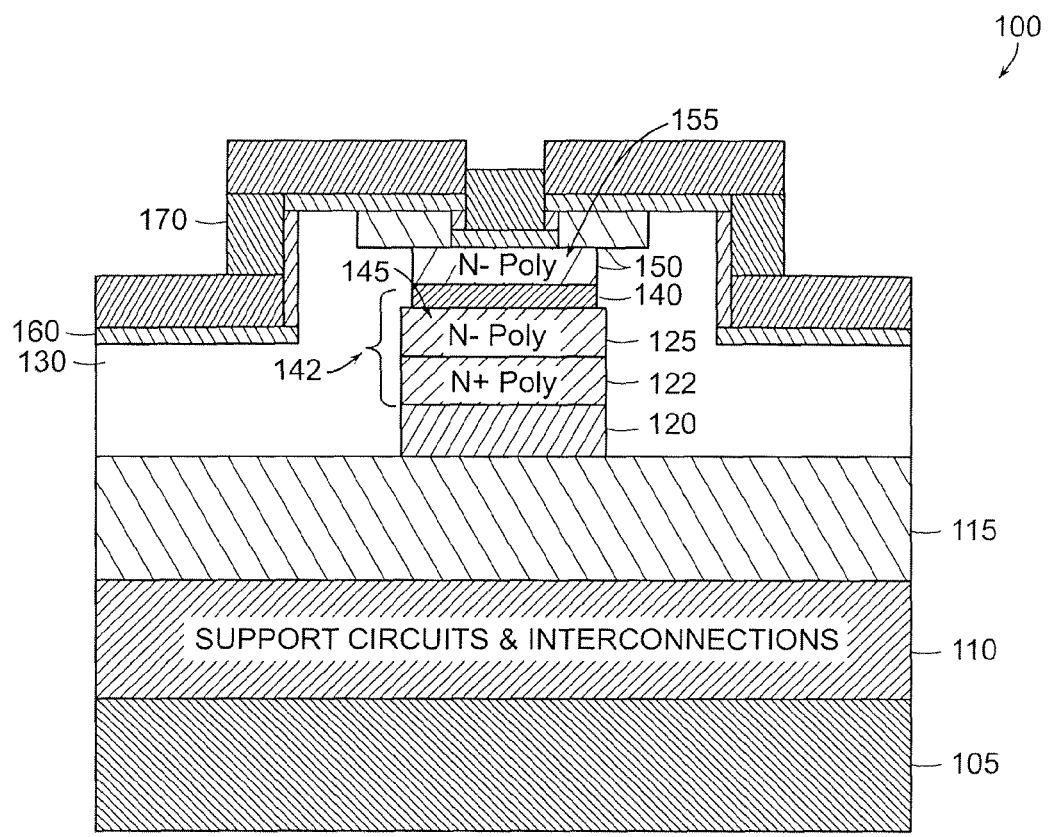
FIG. 1 illustrates a prior art adaptation of a 3D-EPROM cell in which the array is on an insulating layer above memory support circuits formed in and on an underlying semiconductor substrate.
Figures 2A, 2B:
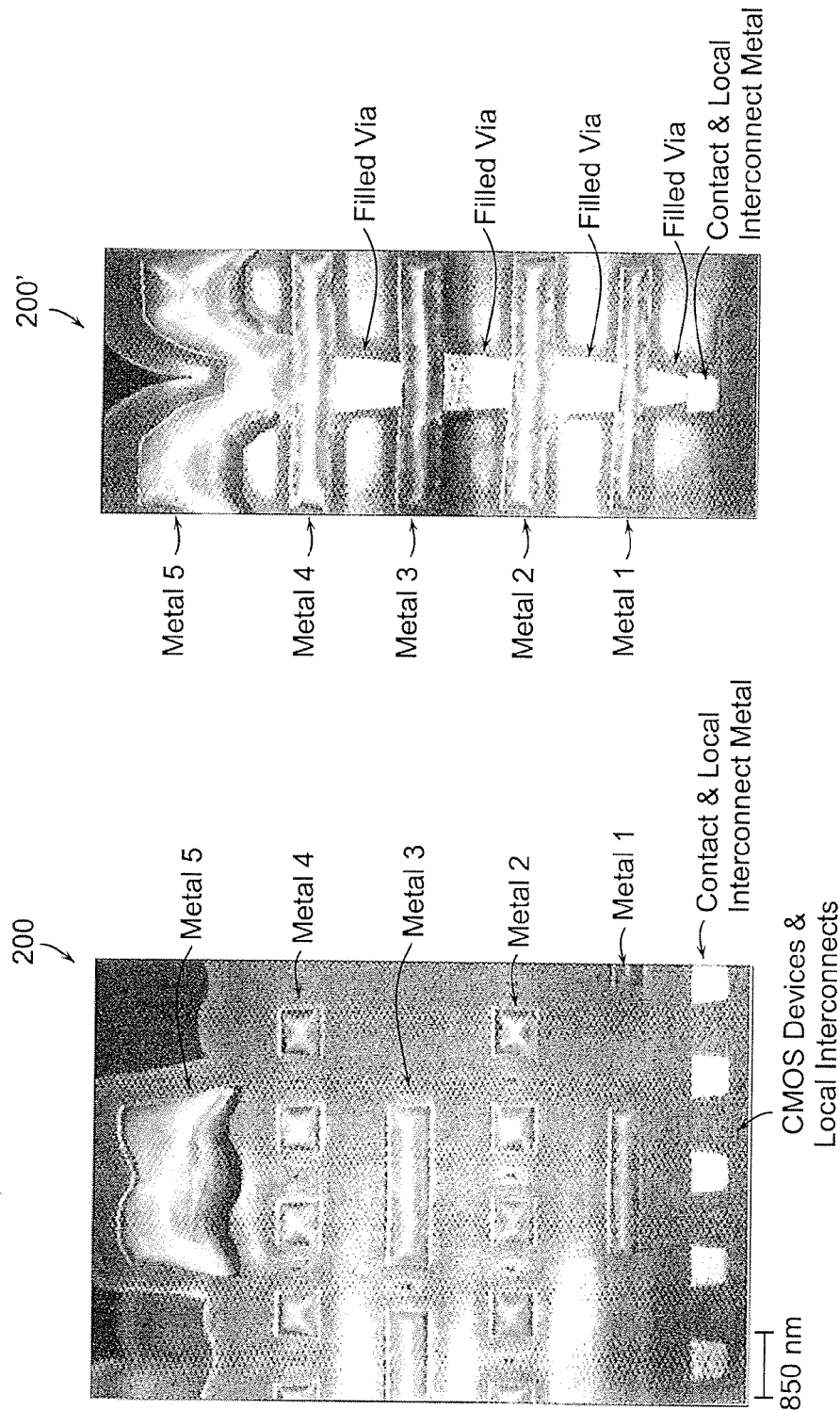
FIG. 2 illustrates prior art CMOS structure with planarized wiring and stacked vertical vias.

Embodiments of the present invention provide nonvolatile diodes and nonvolatile nanotube blocks and systems using same and methods of making same.

Some embodiments of the present invention provide 3-D cell structures that enable dense nonvolatile memory arrays that include nanotube switches and diodes, can write logic 1 and 0 states for multiple cycles, and are integrated on a single semiconductor (or other) substrate. It should be noted that such nonvolatile memory arrays may also be configured as NAND and NOR arrays in PLA, FPGA, and PLD configurations for performing stand-alone and embedded logic functions as well.

Some embodiments of the present invention provide diode devices having nonvolatile behavior as a result of diodes combined with nonvolatile nanotube components, and methods of forming such devices.

Some embodiments of the present invention also provide nanotube-based nonvolatile random access memories that include nonvolatile nanotube diode device cells having a relatively high density, and methods of forming such memory devices.

Some embodiments of the invention provide nonvolatile devices that combine nonvolatile nanotube switches (NV NT Switches), such as those described in U.S. patent application Ser. No. 11/280,786, with diodes in a nonvolatile nanotube diode (NV NT Diode) device. Suitable diodes include Schottky, PN, PIN, PDB (planar-doped-barrier), Esaki, LED (light emitting), laser and other diodes and FET diodes. Combinations of NV NT switches with PDB and Esaki diodes may be used in fast switching applications, while combinations of NV NT switches and LED and Laser diodes may be used in light (photon) sources for communications and display applications, as well as photon-based logic and memory applications. Nonvolatile nanotube diodes (NV NT Diodes) formed using various diode and NV NT Switch combinations, such as cathode-to-nanotube and anode-to-nanotube interconnections, are described. NV NT Diode operation is also described. Devices fabricated using NV NT Diodes are also described.

While in some embodiments, NV NT diodes are formed by combining NV NT switches and various diodes formed using silicon and metallurgies typical of CMOS processes, a wide variety of semiconductor materials and conductors may be used to form a variety of diodes in combination with a wide variety of conductors. Examples of semiconductor materials are Si, Ge, SiC, GaP, GaAs, GaSb, InP, InAs, InSb, ZnS, ZnSe, CdS, CdSe, CdTe for example. Schottky diodes may be formed by combining various semiconductor material with compatible conductors such as Al, Ag, Au, Au/Ti, Bi, Ca, Co, $CoSi_2$, Cr, Cu, Fe, In, Ir, Mg, Mo, $MoSi_2$, Na, Ni, $NiSi_2$, Os, Pb, Pd, $Pd_2Si$, Pt, PtSi, Rh, RhSi, Ru, Sb, Sn, Ti, $TiSi_2$, W, $WSi_2$, Zn, $ZrSi_2$, and others for example. LED and laser diodes may be formed using such semiconductor material as GaInAsPt, GaAsSb, InAsP, InGaAs, and many other combinations of materials that determine light emission wavelength.

Alternatively, FET diodes may be formed by combining a NV NT Switch and a three terminal FET with gate electrically connected to one of the two diffusion terminals to form a two terminal FET diode device. When combining a NV NT Switch and an FET diode, a nonvolatile nanotube diode may also be referred to as a nonvolatile nanotube FET-diode, abbreviated as NV NT FET-Diode, to highlight this difference with respect to Schottky, PN, PIN, and other diodes. However, differences between combinations of NV NT Switches and FET diodes and Schottky, PN, PIN and other diodes may not be highlighted and all may be referred to a NV NT Diode.

Embodiments of 2-D nonvolatile memories, both stand-alone and embedded in logic (processors for example), that use nonvolatile nanotube diodes (NV NT Diodes) as storage elements, are also described. These NV NT Diodes may be formed in and/or on a semiconductor substrate with memory support circuits and logic function and integrated on a single substrate such as a semiconductor chip or wafer to form 2-D memory and 2-D memory and logic functions.

Embodiments of 3-D architectures of nonvolatile memories, both stand-alone and embedded in logic, that use NV NT Diodes as 3-D cells for 3-D memory arrays that can write logic 1 and 0 states for multiple cycles, are also described. It should be noted that some embodiments of 3-D memories using arrays of NV NT diode cells are described with respect to memory arrays that are not fabricated in or on a semiconductor substrate, but are instead formed on an insulating layer above support circuits formed in and on a semiconductor substrate with interconnections between support circuits and the 3-D memory array.

NV NT Diode arrays can also be formed on a planar insulating surface, above support circuits with array interconnections through and on the insulating layer, in which the NV NT Diode arrays are formed using methods of fabrication in which array features are self-aligned in both X and Y directions such that array features are not increased in size to accommodate alignment requirements.

It should also be noted that presently available planarization techniques (chemical-mechanical planarization (CMP), for example) combined with Silicon-on-Insulator (SOI) technology and thin film transistor (TFT) technology enable 3-D memory arrays using NV NT Diodes as 3-D cells to be fabricated in planar dense stacked structures above a single substrate in which the substrate is not a semiconductor substrate. Combined planarization techniques and display-application-driven enhanced TFT technology enable non-semiconductor substrates such as glass, ceramic, or organic substrate as alternatives to using semiconductor substrates.

Methods of fabrication of various 3-D memories are described.

Although NV NT Diode-based nonvolatile memories are described, it should be noted that such nonvolatile memory arrays may also be configured as NAND and NOR arrays in PLA, FPGA, and PLD functions for performing stand-alone and embedded logic as well.

Two Terminal Nonvolatile Nanotube Diode Devices

Some embodiments provide a nonvolatile nanotube diode device that acts like a diode in its ability to direct electronic communication in a forward biased direction, and prevent communication in a reverse direction, if the nanotube diode is in a conductive (ON) mode (or state). However, if a nonvolatile nanotube diode device is in a nonconductive (OFF) mode (or state), then direct communication is prevented in either forward or reverse direction. The nonvolatile nanotube diode device conductive (ON) mode or nonconductive (OFF) mode is nonvolatile and is maintained without power supplied to the device. The mode of the nonvolatile nanotube diode device may be changed from ON to OFF or from OFF to ON by applying suitable voltage and current levels using a stimulus circuit.

Some embodiments of the nonvolatile device are formed by combining nonvolatile nanotube switches (NV NT Switches) described in U.S. patent application Ser. No. 11/280,786, U.S. patent application Ser. No. 11/835,612, entitled "Nonvolatile Resistive Memories Having Scalable Two-Terminal Nanotube Switches," filed on Aug. 8, 2007, and/or U.S. patent application Ser. No. 11/835,613, entitled "Memory Elements and Cross Point Switches and Arrays of Same Using Nonvolatile Nanotube Blocks," filed on Aug. 8, 2007, and diodes such as Schottky, PN, PIN, and other diodes and FET diodes to form a nonvolatile nanotube diode (NV NT Diode) device. In some embodiments, nonvolatile nanotube diodes (NV NT Diodes) are two terminal devices having one terminal in contact with one terminal of a nonvolatile nanotube switch and another terminal in contact with the anode or cathode of a diode. In some embodiments, a shared internal contact connects a second terminal of a nonvolatile nanotube switch with the cathode or anode of a diode to form the nonvolatile nanotube diode device.

Some embodiments of NV NT diodes are scalable to large nonvolatile array structures. Some embodiments use processes that are compatible with CMOS circuit manufacture. It should be noted that based on the principle of duality in semiconductor devices, P and N regions in the examples illustrated may be interchanged with corresponding changes in the polarity of applied voltages.

Nonvolatile Nanotube Diode Devices Having the Cathode of the Diode Connected to One Terminal of the Nonvolatile Nanotube Switch; and Other Nonvolatile Nanotube Diode Devices Having the Anode of the Diode Connected to One Terminal of the Nonvolatile Nanotube Switch Nonvolatile nanotube switches (NV NT Switches) are described in detail in U.S. patent application Ser. No. 11/280, 786, and are summarized briefly below. NV NT Switches include a patterned nanotube element and two terminals in contact with the patterned nanotube (nanofabric) element. Methods of forming nanotube fabrics and elements, and characteristics thereof, are described in greater detail in the incorporated patent references. Nonvolatile nanotube switch operation does not depend on voltage polarity, positive or negative voltages may be used. A first terminal may be at a higher or lower voltage with respect to a second terminal. There is no preferential current flow direction. Current may flow from a first to a second terminal or from a second to a first terminal.

Figure 3:
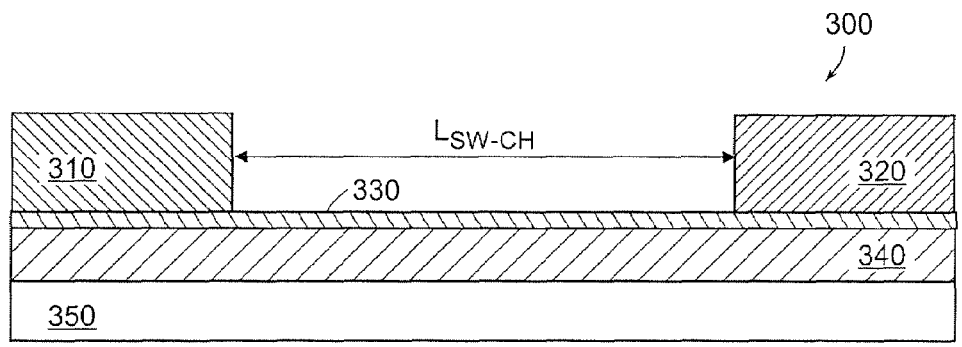
FIG. 3 illustrates an embodiment of a nonvolatile nanotube switch in an essentially horizontal orientation in which two terminals are deposited, each one at opposite ends of a patterned nanotube channel element.

FIG. 3 illustrates an embodiment of a NV NT Switch 300 including a patterned nanotube element 330 on insulator 340 which is supported by substrate 350. Terminals (conductive elements) 310 and 320 are deposited directly onto patterned nanotube element 330 and at least partially overlap opposite ends of patterned nanotube element 330. The nonvolatile nanotube switch channel length $L_{SW-CH}$ is the separation between 310 and 320. $L_{SW-CH}$ is important to the operation of nonvolatile nanotube switch 300 as described further below. Substrate 350 may be an insulator such as ceramic or glass, a semiconductor, or an organic rigid or flexible substrate. Substrate 350 may be also be organic, and may be flexible or stiff. Insulator 340 may be $SiO_2$, SiN, $Al_2O_3$, or another insulator material. Terminals (contacts) 310 and 320 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Figure 4:
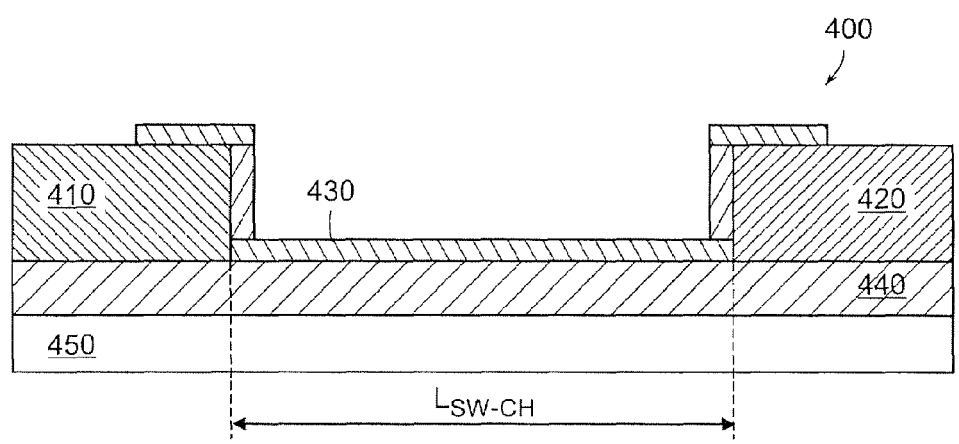
FIG. 4 illustrates an embodiment of a nonvolatile nanotube switch in an essentially horizontal orientation in which a conformal nanotube channel element is deposited on predefined terminal regions.

FIG. 4 illustrates an embodiment of a NV NT Switch 400 including patterned nanotube element 430 on insulator 440 which is supported by substrate 450. Patterned nanotube element 430 is a nonplanar conformal nanofabric that also partially overlaps and contacts terminals (conductive elements) 410 and 420 on top and side surfaces. Terminals (contacts) 410 and 420 are deposited and patterned directly onto substrate 450 prior to patterned nanotube element 430 formation. Patterned nanotube element 330 is formed using a conformal nanofabric that at least partially overlaps terminals 410 and 420. The nonvolatile nanotube switch channel length $L_{SW-CH}$ is the separation between terminal 410 and 420. $L_{SW-CH}$ is important to the operation of nonvolatile nanotube switch 400 as described further below. Substrate 450 may be an insulator such as ceramic or glass, a semiconductor, or an organic rigid or flexible substrate. Substrate 450 may be also be organic, and may be flexible or stiff. Insulator 440 may be $SiO_2$, SiN, $Al_2O_3$, or another insulator material. Terminals 410 and 420 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Figure 5:
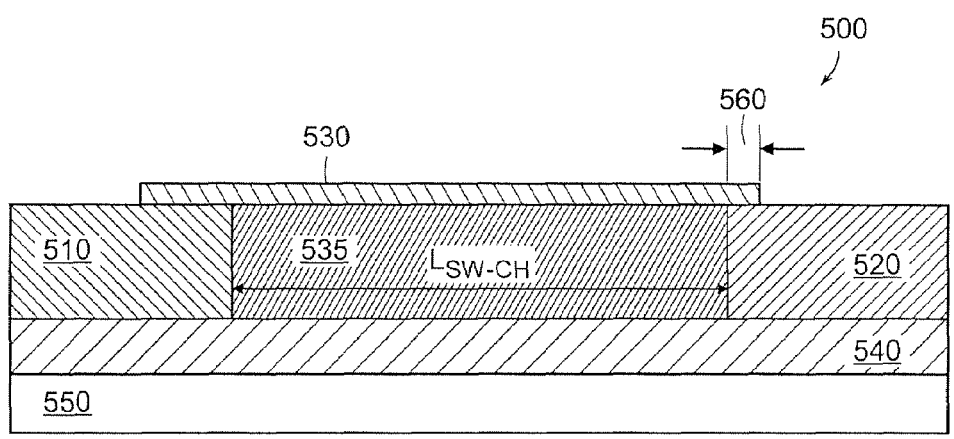
FIG. 5 illustrates an embodiment of a nonvolatile nanotube switch in which a nanotube channel element is deposited in an essentially horizontal orientation on predefined terminal regions that includes a coplanar insulator region between the terminals.

FIG. 5 illustrates an embodiment of a NV NT Switch 500 including patterned nanotube element 530 on insulator 535, which is on insulator 540, which is supported by substrate 550. Patterned nanotube element 530 is a nanofabric on a planar surface that also partially overlaps and contacts terminals (conductive elements) 510 and 520. Terminals (contacts) 510 and 520 are deposited and patterned directly onto substrate 550 prior to patterned nanotube element 530 formation. Patterned nanotube element 530 to terminal 520 overlap distance 560 does not significantly change nonvolatile nanotube switch 500 operation. The nonvolatile nanotube switch channel length $L_{SW-CH}$ is the separation between terminal 510 and 520. $L_{SW-CH}$ is important to the operation of nonvolatile nanotube switch 500 as described further below. Substrate 550 may be an insulator such as ceramic or glass, a semiconductor, or an organic rigid or flexible substrate. Substrate 550 may be also be organic, and may be flexible or stiff. Insulators 535 and 540 may be $SiO_2$, SiN, $Al_2O_3$, or another insulator material. Terminals 510 and 520 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

In some embodiments, NV NT Switch 500 may be modified (not shown) to include a gap region in insulator 535 between a portion of nanotube element 530 and insulator 540 as described further in U.S. patent application Ser. No. 11/835,612, filed on Aug. 8, 2007, entitled "Nonvolatile Resistive Memories Having Scalable Two-Terminal Nanotube Switches," and/or U.S. patent application Ser. No. 11/835,613, entitled "Memory Elements and Cross Point Switches and Arrays of Same Using Nonvolatile Nanotube Blocks," filed on Aug. 8, 2007. Without wishing to be bound by theory, it is believed that in the suspended region a reduced amount of heat is lost to the surrounding substrate, so smaller values of voltage and current may be required to heat the nanotubes to a temperature sufficient for switching to occur. Other mechanisms are possible.

FIG. 6A illustrates a SEM image of an embodiment of a nonvolatile nanotube switch 600 prior to passivation and corresponding to nonvolatile nanotube switch 300 shown in cross sectional drawing 300 in FIG. 3. Nonvolatile nanotube switch 600 includes patterned nanotube (nanofabric) element 630, terminals (contacts) 610 and 620, and insulator 640. Exemplary nonvolatile nanotube switches 600 have been fabricated with terminal-to-terminal channel lengths ($L_{SW-CH}$) in the range of 250 nm to 22 nm thereby reducing nonvolatile nanotube switch size and lowering erase (write 0) voltages at shorter channel lengths, as illustrated further below. Programming (write 1) voltages typically remain lower than erase (write 0) voltages. Erase voltage measurements on nonvolatile nanotube switches of varying channel width (data not shown) indicate no significant dependence of erase voltage on device channel width as the channel width $W_{SW-CH}$ is varied from 500 to 150 nm. Erase voltage measurements on nonvolatile nanotube switches of varying nanofabric-to-contact terminal overlap lengths (data not shown) indicate no significant dependence of erase voltage on overlap lengths, such as overlap length 660 in FIG. 6A, as overlap lengths are varied from approximately 800 to 20 nm.

FIGS. 6A and 6B were obtained using SEM voltage contrast imaging of NV NT Switch 600 including patterned nanotube element 630 connected to terminals 610 and 620. With respect to FIG. 6A, NV NT Switch 600 is in an ON state such that voltage applied to terminal 620 is transmitted to terminal 610 by patterned nanotube element 630 in an electrically continuous ON state. FIG. 6B illustrates NV NT Switch 600', which corresponds to NV NT Switch 600 in the OFF state. In the OFF state, patterned nanotube element 630 is electrically discontinuous within itself and/or separates from one of the terminals 610, 620. SEM voltage contrast imaging of NV NT Switch 600' in FIG. 6B illustrates patterned nanotube element 630 in which patterned nanotube element region 630' appears to be electrically connected to terminal 620 (light region) and patterned nanotube element region 630" appears to be electrically connected to terminal 610' (dark region), but where patterned nanotube element regions 630' and 630" appear not to be electrically connected to each other, i.e., the patterned nanotube element 630 "breaks." Terminal 610' is dark since voltage applied to terminal 620 does not reach terminal 610' because of the apparent electrical discontinuity between patterned nanotube element regions 630' and 630". Note that terminal 610' is the same as terminal 610, except that it is not electrically connected to terminal 620 in NV NT Switch 600'.

Figure 7A:
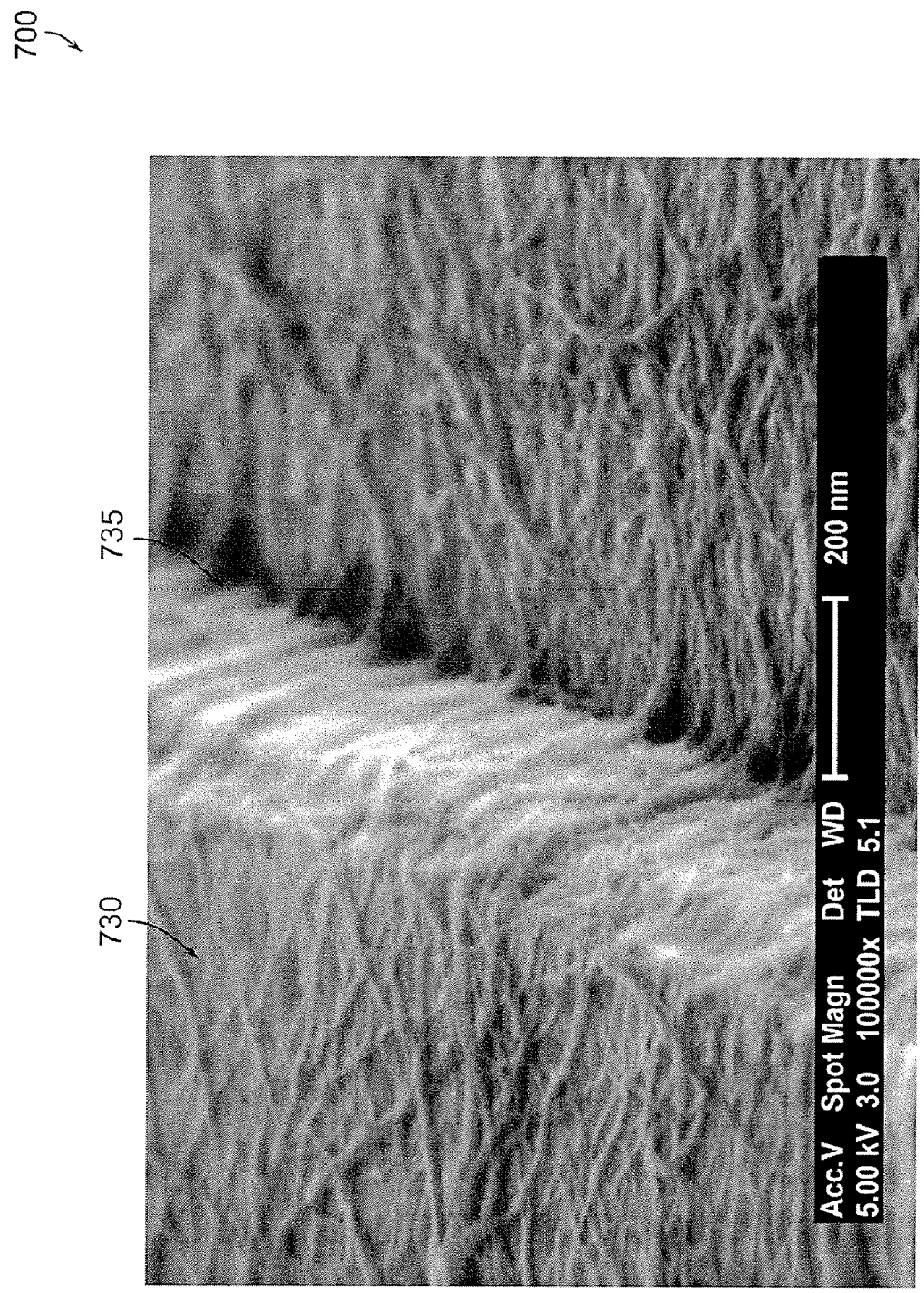
FIG. 7A illustrates an embodiment of a conformal nanofabric layer having an essentially vertical orientation over a stepped region.

Nonvolatile nanotube switch embodiment 600 illustrated in FIGS. 6A-6B is fabricated on a horizontal surface. In general, patterned nanotube elements can be fabricated using conformal patterned nanofabrics that may be oriented at various angles, without limitations, as described in greater detail in the incorporated patent references. FIG. 7A is an SEM image of exemplary structure 700 with nanofabric 730 conforming to an underlying step after deposition, with a vertical orientation 735 region. These conformal properties of nanofabrics may be used to fabricate vertically oriented nonvolatile nanotube switches with enhanced dimensional control and requiring less area (e.g. can be fabricated at greater density) as illustrated further below.

Figure 7B:
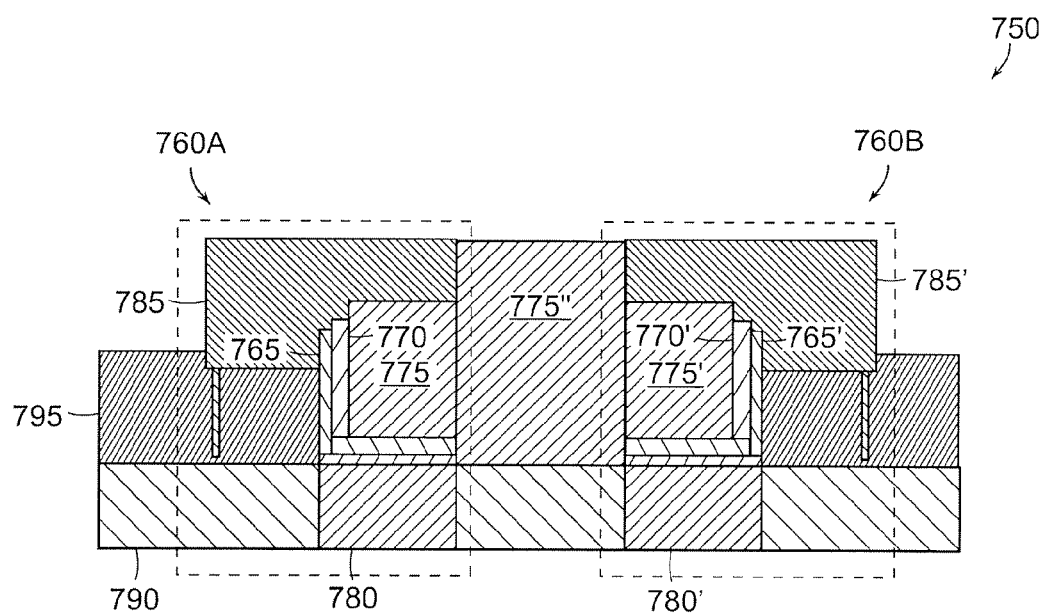
FIG. 7B is an embodiment of a representation of a 3-D memory cell cross section with a vertically-oriented nonvolatile nanotube switch storage element.

FIG. 7B is a representation of an embodiment of 3-D memory cell cross section 750 storage elements described in greater detail in U.S. patent application Ser. No. 11/280,786. 3D memory cell storage regions 760A and 760B are mirror image storage devices using nonvolatile nanotube switches with vertically-oriented nanotube elements 765 and 765'. Protective insulator materials 770 and 770', and 775, 775', and 775" are used to enhance the performance and reliability of nanotube elements 765 and 765', respectively. Memory cell storage regions 760A and 760B include lower contacts 780 and 780', respectively, and upper contacts 785 and 785', respectively. Upper contacts 785 and 785' include sidewall and top surface contact regions. Contacts 780 and 780' are embedded in insulator 790. Insulator 795 on the top surface of insulator 790 includes sidewall regions used to define the location of nanotube channel elements 765 and 765'.

Figure 8:
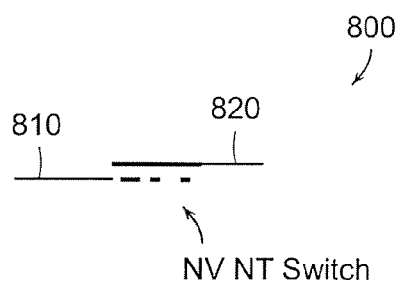
FIG. 8 illustrates a schematic representation of an embodiment of a nonvolatile nanotube switch.

FIG. 8 illustrates a nonvolatile nanotube switch 800 schematic representation of nonvolatile nanotube switches 300, 400, 500 and other nonvolatile nanotube switches (not shown) having that may include suspended regions and also may include horizontal, vertical, or other orientation, according to some embodiments. Two terminals (contacts) 810 and 820 are illustrated, and correspond, for example to terminals (contacts) 310 and 320 of NV NT Switch 300; 410 and 420 of NV NT Switch 400; and 510 and 520 of NV NT Switch 500 for example.

Laboratory testing results of individual fabricated nonvolatile nanotube switches, represented schematically by nonvolatile nanotube switch 800 illustrated in FIG. 8, are illustrated by graph 900 in FIG. 9A. Nonvolatile nanotube switch 800 switching results for more than 50 million ON/OFF cycles illustrated by graph 900 shows that the conducting state resistance (ON Resistance) is in the range of 10 kOhms to 50 kOhms, while the nonconducting state resistance (OFF Resistance) exceeds 10 GOhm, for greater than five orders of magnitude separation of resistance values between conducting and nonconducting states. Nonvolatile nanotube switch 800 has a patterned nanotube element with a channel length ($L_{SW-CH}$) of 250 nm. At channel lengths of 250 nm, nonvolatile nanotube switches have typical erase voltages of 8 volts and typical program voltages of 5 volts as described further below and in U.S. patent application Ser. No. 11/280,786 and U.S. patent application Ser. No. 11/835,612, entitled "Nonvolatile Resistive Memories Having Scalable Two-Terminal Nanotube Switches," filed on Aug. 8, 2007.

Figure 9B:
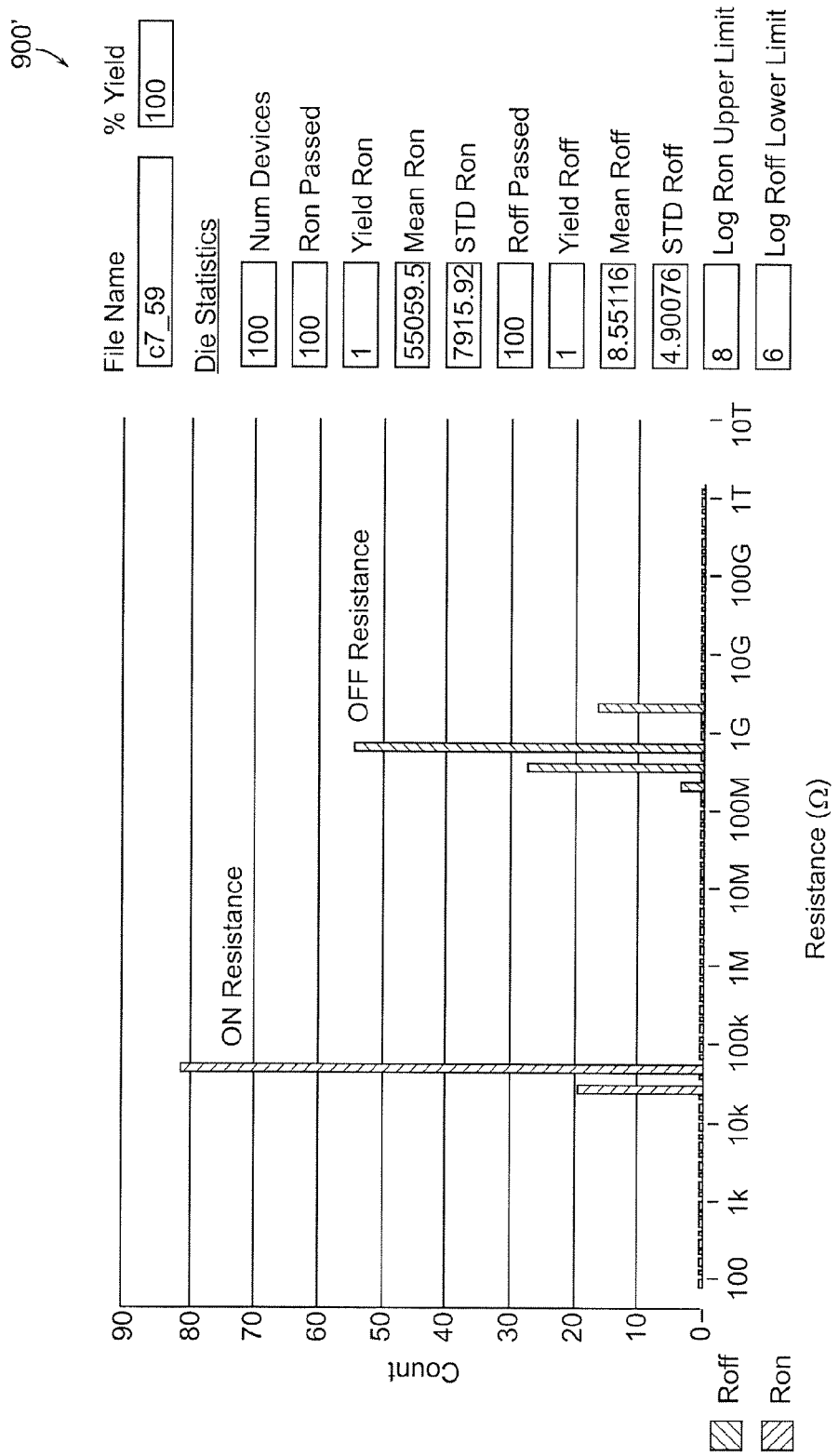

FIG. 9B illustrates cycling data 900' on fabricated devices having channel length of approximately 22 nm and channel width of approximately 22 nm. Devices with channel lengths of approximately 20 nm typically have erase voltages in the 4 to 5 volt range. The particular devices characterized in FIG. 9B have an erase voltage of 5 Volts, a programming voltage of 4 Volts, and was subjected to 100 erase/program cycles. The ON resistance is well under 100 kOhms, and the OFF resistance is well above 100 MOhms.

Figure 10:
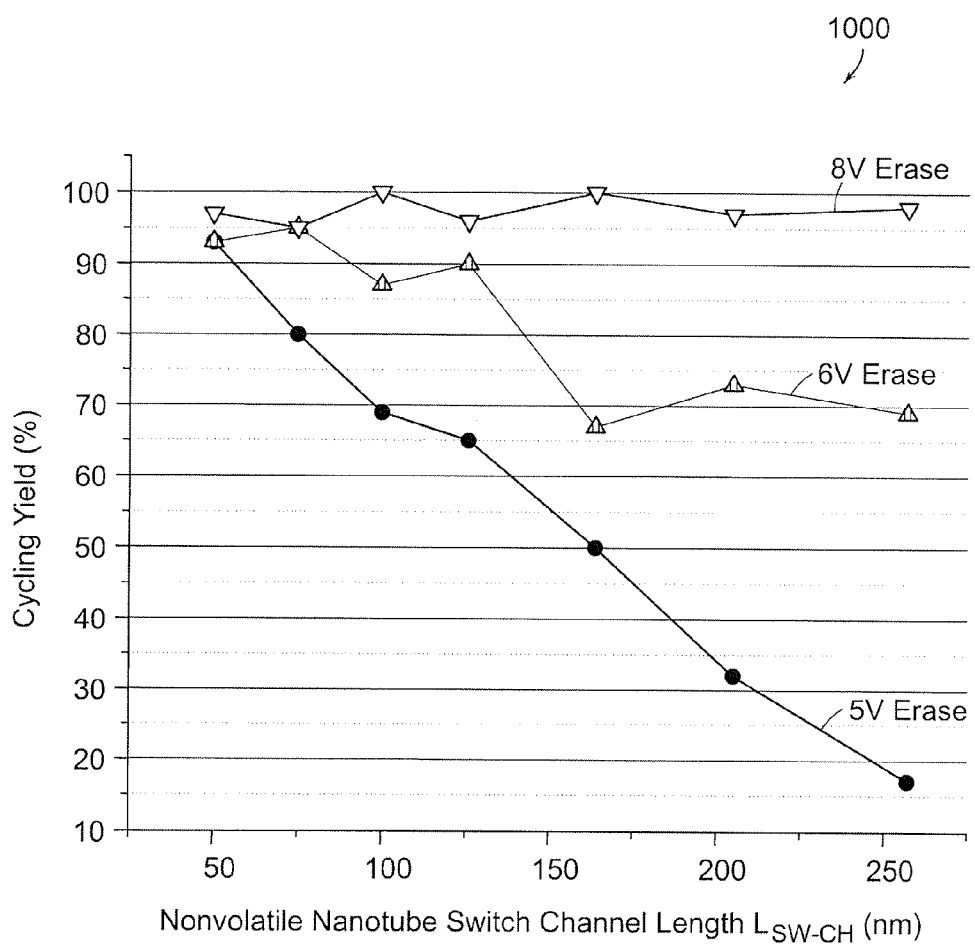
FIG. 10 illustrates nonvolatile nanotube switch erase voltage as a function of nonvolatile nanotube channel length for a plurality of exemplary nanotube switches.

FIG. 10 curves 1000 illustrate the voltage scaling effect of channel length $L_{SW-CH}$ reduction on erase voltage for a plurality of fabricated nonvolatile nanotube switches as $L_{SW-CH}$ is reduced from over 250 nm to 50 nm. $L_{SW-CH}$ refers to switch channel length as described with respect to FIGS. 3, 4, and 5. The effectiveness of channel length reduction is illustrated in terms of erase voltage as a function of channel length reduction and erase/program cycling yield, where each data point represents 22 devices and the number of ON/OFF erase/program cycles is five. Erase voltage is a strong function of channel length and is reduced (scaled) from 8 volts to 5 volts as the nonvolatile nanotube switch channel length is reduced from 250 to 50 nm as illustrated by curves 1000 shown in FIG. 10. Corresponding programming voltages (not shown) are less than erase voltages, typically in the range of 3 to 5 volts, for example. Erase voltage measurements on nonvolatile nanotube switches of varying channel width (data not shown) indicate no significant dependence of erase voltage on device channel width as the channel width is varied from 500 to 150 nm. Erase voltage measurements on nonvolatile nanotube switches of varying nanofabric-to-contact terminal overlap lengths (data not shown) indicate no significant dependence of erase voltage on overlap lengths, such as overlap length 660 in FIG. 6A, as overlap lengths are varied from approximately 800 to 20 nm.

Figure 11A:
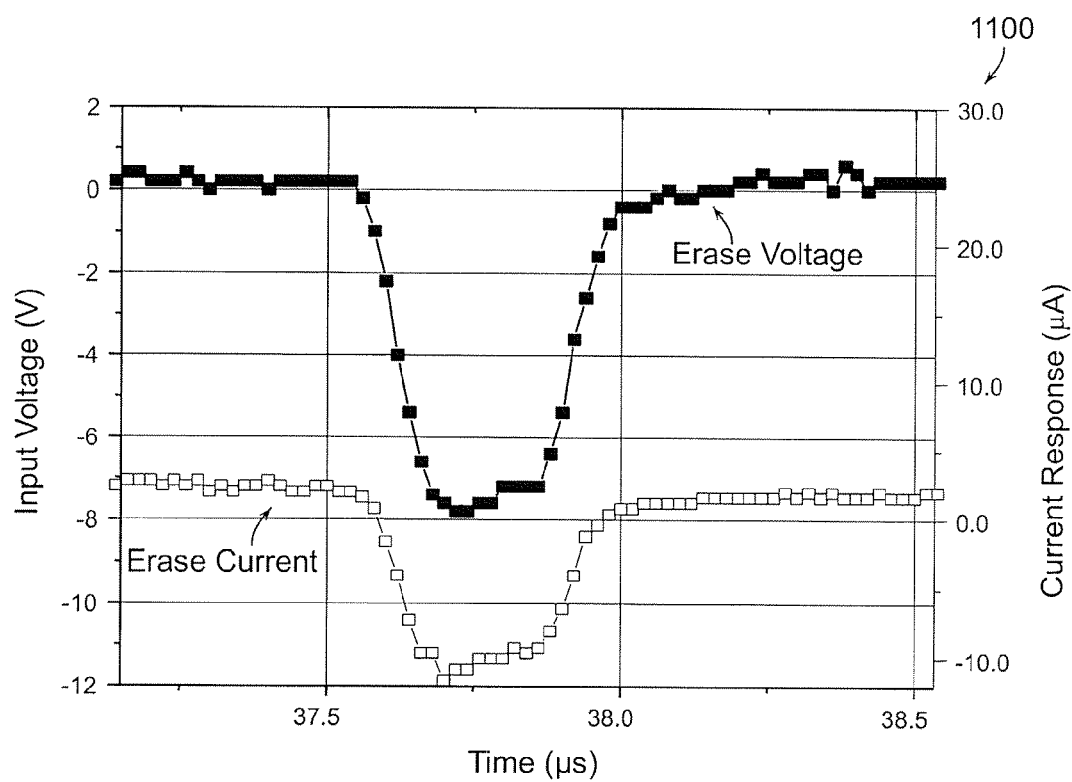
FIGS. 11A-11B illustrate nonvolatile nanotube switch voltage and current operational waveforms for erase, program, and read operating modes for an exemplary nanotube switch.

FIG. 11A shows exemplary erase waveforms 1100 of erase voltage and corresponding erase current as a function of time for a fabricated nonvolatile nanotube switch having a channel length of 250 nm with an erase voltage of 8 Volts and a corresponding erase current of 15 micro-Amperes. Note that a negative voltage was applied to the nonvolatile nanotube switch under test. Nonvolatile nanotube switches will work with positive or negative applied voltages and current flow in either direction. Erase currents are typically in the range of 1 to 50 uA, depending on the number of activated SWNTs in the patterned nanotube element in the channel region. Erase currents as the switch transitions from an ON state to an OFF state are typically not limited by a stimulus circuit.

Figure 11B:
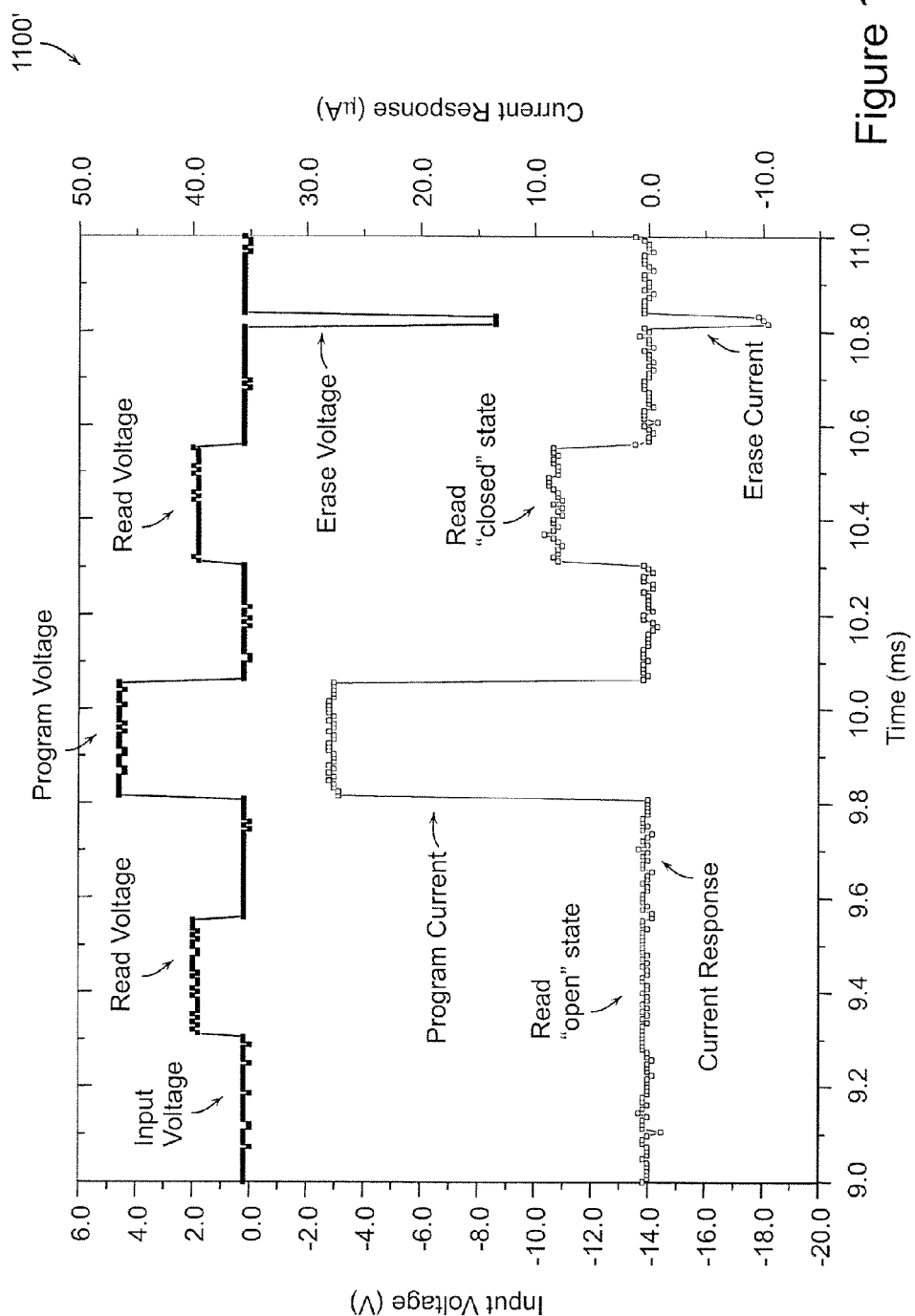

FIG. 11B shows exemplary waveforms 1100' of a full nonvolatile nanotube switch cycle including read, erase, and program operations. Erase waveforms show erase voltage and corresponding erase current as a function of time for a fabricated nonvolatile nanotube switch having a channel length of 250 nm, with an erase voltage of 8 Volts and a corresponding erase current of 10 micro-Amperes. Programming waveforms show program voltage and corresponding program current as a function of time for a nonvolatile nanotube switch having a channel length of 250 nm, with a program voltage of 5 Volts and a corresponding program current of 25 microAmperes. Programming currents as the switch transitions from an OFF state to an ON state are typically limited by the stimulus circuit to improve programming characteristics. Examples of programming current limitation using stimulus circuits are described in U.S. patent application Ser. No. 11/835,612, entitled "Nonvolatile Resistive Memories Having Scalable Two-Terminal Nanotube Switches," filed on Aug. 8, 2007. The erase waveforms illustrated in FIG. 11A and the read, erase, and program waveform in FIG. 11B are described in more detail in U.S. patent application Ser. No. 11/280,786.

Nonvolatile nanotube switches may be fabricated to exhibit a wide range of ON Resistance values depending on switch channel length, and the number of individual nanotubes in the patterned nanotube (channel) element. Nonvolatile nanotube switches may exhibit ON Resistances in the 1 kOhm to 10 MOhm range, while OFF Resistance is typically 100 MOhm or 1 GOhm or greater Nonvolatile nanotube diode devices are a series combination of a two terminal semiconductor diodes and two terminal nonvolatile nanotube switches similar to nonvolatile nanotube switches described further above with respect to FIGS. 3 to 11. Various diode types are described in the reference N G, K. K., "Complete Guide to Semiconductor Devices" Second Edition, John Wiley and Sons, 2002, the entire contents of which are incorporated herein by reference; Schottky diodes (Schottky-barrier diodes) are described in pp. 31-41; junction (PN) diodes are described in pp. 11-23; PIN diodes are described in pp. 24-41; light emitting diodes (LEDs) pp. 396-407. FET-diodes are described in the reference Baker, R. J. et al. "CMOS Circuit Design, Layout, and Simulation", IEEE Press, 1998, pp. 168-169, the entire contents of which are incorporated herein by reference.

NV NT Diode embodiments described further below typically use Schottky diodes, PN diodes and FET-diodes. However, other diode types such as PIN diodes may be combined with nonvolatile nanotube switches to form nonvolatile nanotube PIN-diodes that may enable or disable RF switching, attenuation and modulation, signal limiting, phase shifting, power rectification, and photodetection for example. Also, nonvolatile LED diodes may be combined with nonvolatile switches to form nonvolatile nanotube LED-diodes that enable or disable LED diodes and provide light output patterns stored as nonvolatile states in a nonvolatile nanotube LED-diode.

Schottky diodes typically have low forward-voltage drops, which is an advantage, and good high frequency characteristics. These characteristic plus ease of fabrication make Schottky diodes useful in a wide range of applications. A critical step in the fabrication is to prepare a clean surface for intimate contact of the metal to the semiconductor surface. Metal-on-silicon or metal silicides-on-silicon may also be used. Schottky diodes 142 illustrated in FIG. 1 and described further above and in the reference U.S. Pat. No. 4,442,507 used platinum to form a platinum silicide-on-silicon Schottky diode having a forward ON-voltage of approximately 0.4 volts and a reverse breakdown voltage of approximately 10 volts. Nonvolatile nanotube diodes described further below may be fabricated with nonvolatile nanotube switches and Schottky, PN, P-I-N, LED and other diodes such as FET-diodes in series depending on application requirements.

FIG. 12 illustrates an embodiment of a nonvolatile nanotube diode 1200 device formed by combining diode 1205 and nonvolatile nanotube switch 1210 in series. Terminal T1 is connected to anode 1215 of diode 1205 and terminal T2 is connected to contact 1225 of nonvolatile nanotube switch 1210. Cathode 1220 of diode 1205 is connected to contact 1230 of nonvolatile nanotube switch 1210 by contact 1235. The operation of nonvolatile nanotube diode 1200 will be explained further below.

FIG. 13 illustrates an embodiment of a nonvolatile nanotube diode 1300 device formed by combining diode 1305 and nonvolatile nanotube switch 1310 in series. Terminal Ti is connected to cathode 1320 of diode 1305 and terminal T2 is connected to contact 1325 of nonvolatile nanotube switch 1310. Anode 1315 of diode 1305 is connected to contact 1330 of nonvolatile nanotube switch 1310 by contact 1335.

FIG. 14 illustrates an embodiment of a nonvolatile nanotube diode 1400 device formed by combining NFET diode 1405 and nonvolatile nanotube switch 1410 in series. Terminal T1 is connected to contact 1415 of NFET diode 1405 and terminal T2 is connected to contact 1425 of nonvolatile nanotube switch 1410. Contact 1415 is wired to both gate and a first diffusion region of an NFET to form a first NFET diode 1405 terminal. A second diffusion region 1420 forms a second terminal of NFET diode 1405. Second diffusion region 1420 of NFET diode 1405 is connected to contact 1430 of nonvolatile nanotube switch 1410 by contact 1435.

FIG. 15 illustrates an embodiment of a nonvolatile nanotube diode 1500 device formed by combining NFET diode 1505 and nonvolatile nanotube switch 1510 in series. Terminal T1 is connected to a first NFET diffusion terminal 1515 of NFET diode 1505 and terminal T2 is connected to contact 1525 of nonvolatile nanotube switch 1510. Contact 1520 is wired to both gate and a second diffusion region of an NFET to form a second NFET diode 1505 terminal. Contact 1520 of NFET diode 1505 is connected to contact 1530 of nonvolatile nanotube switch 1510 by contact 1535. The operation of nonvolatile nanotube diode 1200 will be explained further below.

Figure 16:
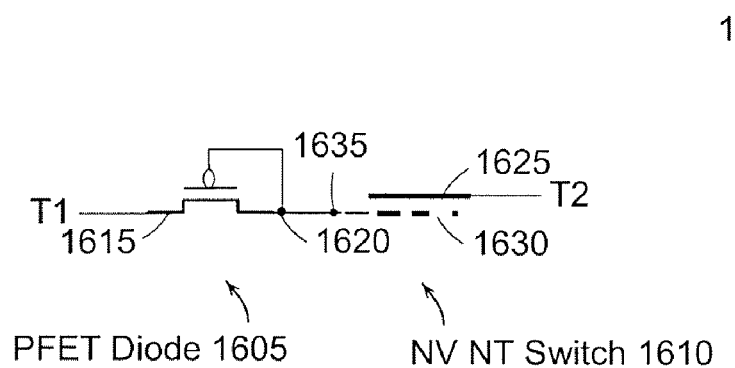
FIGS. 16 and 17 illustrate schematic diagrams of embodiments of two terminal nonvolatile nanotube diodes formed by PFET-diodes and a nonvolatile nanotube switches in series.

FIG. 16 illustrates an embodiment of a nonvolatile nanotube diode 1600 device formed by combining PFET diode 1605 and nonvolatile nanotube switch 1610 in series. Terminal T1 is connected to a first PFET diffusion terminal 1615 of PFET diode 1605 and terminal T2 is connected to contact 1625 of nonvolatile nanotube switch 1610. Contact 1620 is wired to both gate and a second diffusion region of a PFET to form a second PFET diode 1605 terminal. Contact 1620 of PFET diode 1605 is connected to contact 1630 of nonvolatile nanotube switch 1610 by contact 1635.

Figure 17:
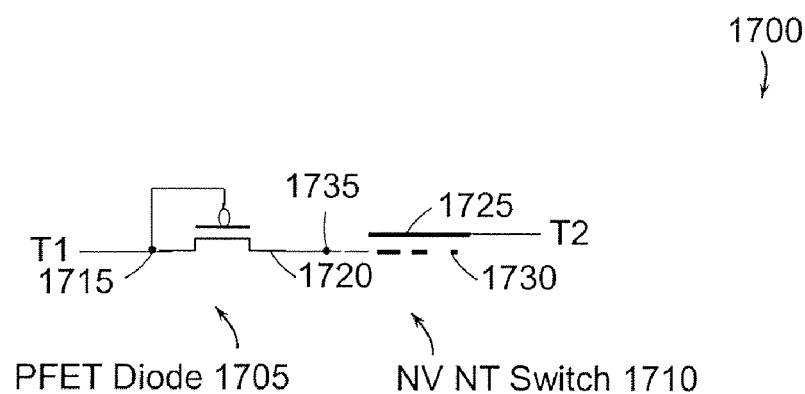

FIG. 17 illustrates an embodiment of a nonvolatile nanotube diode 1700 device formed by combining PFET diode 1705 and nonvolatile nanotube switch 1710 in series. Terminal T1 is connected to contact 1715 of PFET diode 1705 and terminal T2 is connected to contact 1725 of nonvolatile nanotube switch 1710. Contact 1715 is wired to both gate and a first diffusion region of a PFET to form a first PFET diode 1705 terminal. A second diffusion region 1720 forms a second terminal of PFET diode 1705. Second diffusion region 1720 of PFET diode 1705 is connected to contact 1730 of nonvolatile nanotube switch 1710 by contact 1735.

Operation of Nonvolatile Nanotube Diode Devices

Figure 18:
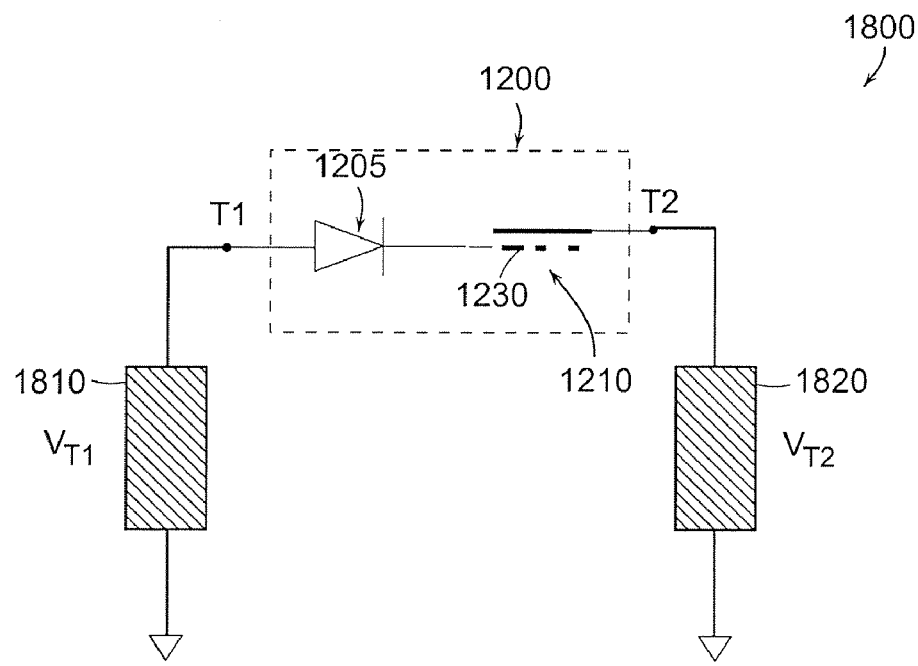
FIG. 18 illustrates an embodiment having the nonvolatile nanotube diode of FIG. 12 and two stimulus sources.

FIG. 18 illustrates an embodiment of a circuit 1800 in which stimulus circuit 1810 applies voltage $V_{T1}$ between terminal T1 of NV NT Diode 1200 and a reference terminal, ground for example, and stimulus circuit 1820 applies voltage $V_{T2}$ between terminal T2 of NV NT Diode 1200 and a reference terminal, ground for example. NV NT Diode 1200 is formed by diode 1205 and nonvolatile nanotube switch 1210 in series as described further above with respect to FIG. 12.

Figure 19:
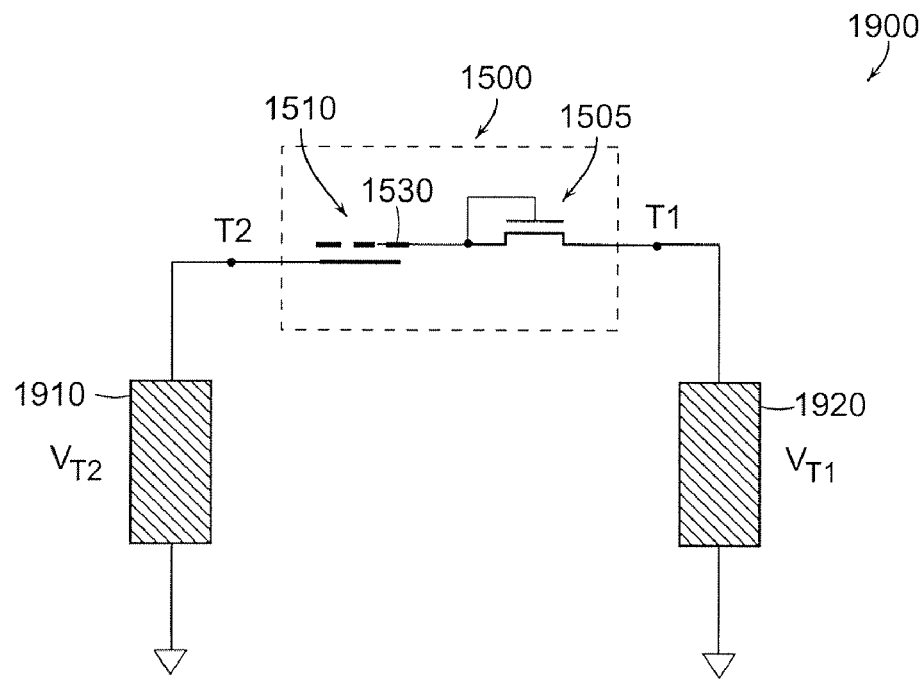
FIG. 19 illustrates an embodiment having the nonvolatile nanotube diode of FIG. 15 and two stimulus sources.

FIG. 19 illustrates an embodiment of a circuit 1900 in which stimulus circuit 1910 applies voltage $V_{T2}$ between terminal T2 of NV NT Diode 1500 (or NV NT FET-Diode 1500) and a reference terminal, ground for example, and stimulus circuit 1920 applies voltage $V_{T1}$ between terminal T1 of NV NT Diode 1500 and a reference terminal, ground for example. NV NT Diode 1500 is formed by FET diode 1505 and nonvolatile nanotube switch 1510 in series as described further above with respect to FIG. 15.

Figure 20A:
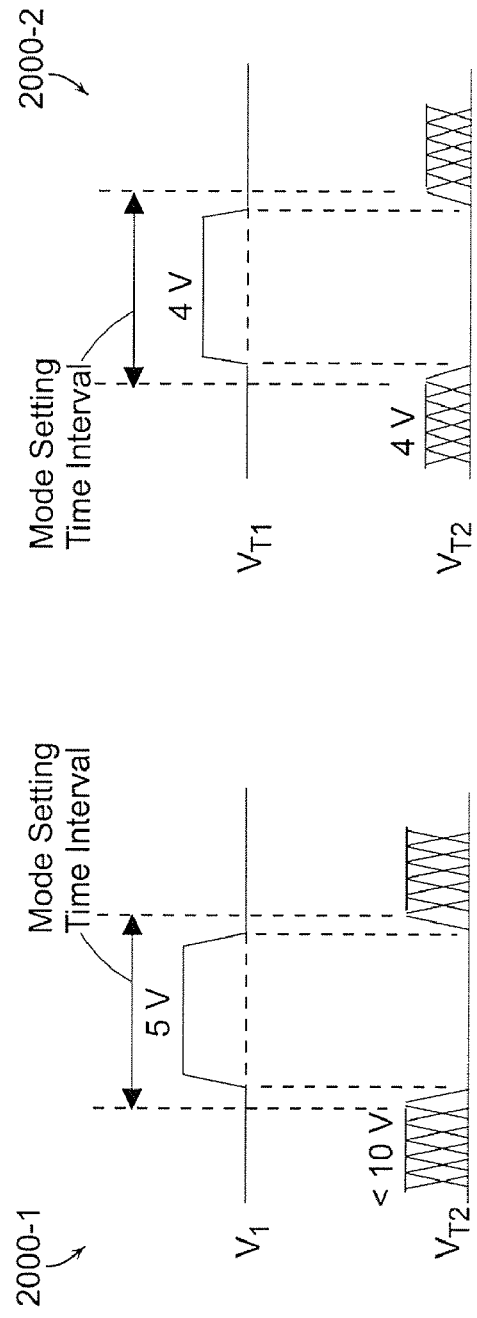
FIGS. 20A-20B illustrates mode setting waveforms for changing the nonvolatile state of nonvolatile nanotube diodes, according to some embodiments.

In an exemplary write 0 (erase) operation, referring to circuit 1800 in FIG. 18, nonvolatile nanotube diode 1200 transitions from an ON to an OFF state during a mode setting time interval when write 0 operation waveforms 2000-1 are applied as illustrated in FIG. 20A. Write 0 operation 2000-1 waveforms illustrate voltage $V_{T1}$ at a low voltage, zero volts for example, prior to initiating write 0 operation 2000-1. Voltage $V_{T2}$ may be at any voltage between zero volts and approximately 10 volts, where 10 volts is the approximate reverse bias breakdown voltage of NV NT Diode 1200. The reverse bias breakdown voltage of NV NT Diode 1200 is determined by the reverse breakdown voltage of diode 1205, which is assumed to be approximately 10 volts based on the reverse breakdown voltage of Schottky diode 142 illustrated in FIG. 1 and described in U.S. Pat. No. 4,442,507. Write 0 operation 2000-1 is not initiated by $V_{T2}$ because diode 1205 in a reverse biased mode has a high impedance which reduces voltage across and limits current flow through NV NT Switch 1210 such that write 0 operation 2000-1 voltage conditions of 4-5 volts across the terminals of NV NT Switch 1210 are not met and transition from an ON resistance state to an OFF resistance state does not take place. NV NT Switch 1210 ON resistance prior to the onset of an write 0 operation is typically in the range of 10 kOhm to 100 kOhm as illustrated in FIGS. 9A and 9B.

An exemplary write 0 operation 2000-1 during a mode setting time interval such as illustrated in FIG. 20A begins with a transition of voltage $V_{T2}$ to a low voltage such as ground. Next, voltage $V_{T1}$ transitions to an applied write 0 voltage of 5 volts. The applied write 0 voltage rise time may be relatively short such as less than 1 ns for example, or may be relatively long, in excess of 100 us for example. Stimulus circuit 1810 applies voltage $V_{T1}$ to terminal T1, and a voltage $V_{T1}$ minus the forward voltage of diode 1205 is applied to terminal 1230 of nonvolatile nanotube switch 1210. If the forward voltage bias drop of diode 1205 is assumer to be approximately 0.5 volts (similar to a forward voltage of approximately 0.4 volts for Schottky diodes used in U.S. Pat. No. 4,442,507), and since terminal T2 is held at ground, then a voltage of approximately 4.5 volts appears across NV NT Switch 1210. NV NT Switch 1210 transitions from an ON state to an OFF state if the erase threshold voltage of NV NT Switch 1210 is 4.5 volts (or less), for example. During write 0 operation 2000-1 current limiting is not required. Typical write 0 currents are less than 1 uA to 50 uA.

In an exemplary write 1 (program) operation, referring to circuit 1800 in FIG. 18, nonvolatile nanotube diode 1200 transitions from an OFF to an ON state during a mode setting time interval when write 1 operation waveforms 2000-2 are applied as illustrated in FIG. 20A. Write 1 operation 2000-2 waveforms illustrate voltage $V_{T1}$ at a low voltage; zero volts for example, prior to initiating write 0 operation 2000-2. NV NT Switch 1210 OFF resistance may be in the range of greater than 100 MOhm to greater than 10 GOhm as illustrated in FIGS. 9A and 9B. Hence, diode 1205 reverse biased resistance may be less than the NV NT Switch 1210 OFF resistance, and most of the applied write 1 voltage may appear across NV NT Switch 1210 terminals 1230 and T2 illustrated in FIG. 18. If voltage $V_{T2}$ transitions above the write 1 threshold voltage of NV NT Switch 1210, then an unwanted write 1 cycle may begin. As NV NT Switch 1210 resistance drops, back biased diode 1205 resistance become dominant and may prevent completion of a write 1 operation. However, in order to prevent a partial write 1 operation, $V_{T2}$ is limited to 4 volts for example.

An exemplary write 1 operation 2000-2 during a mode setting time interval such as illustrated in FIG. 20A begins with a transition of voltage $V_{T2}$ to a low voltage such as ground. Next, voltage $V_{T1}$ transitions to an applied write 1 voltage of 4 volts. The applied write 1 voltage rise time may be relatively short such as less than 1 ns for example, or may be relatively long, in excess of 100 us for example. Stimulus circuit 1810 applies voltage $V_{T1}$ to terminal T1, and a voltage $V_{T1}$ minus the forward voltage of diode 1205 is applied to terminal 1230 of NV NT Switch 1210. If the forward voltage bias drop of diode 1205 is similar to a forward voltage of approximately 0.4-0.5 volts such as Schottky diodes used in U.S. Pat. No. 4,442,507, and since terminal T2 is held at ground, then a voltage of approximately 3.5 volts appears across NV NT Switch 1210. NV NT Switch 1210 transitions from an OFF state to an ON state if the write 1 threshold voltage of NV NT Switch 1210 is 3.5 volts (or less), for example. During write 1 operation 2000-2 current limiting can be applied. Examples of stimulus circuits that include current limiting means are described in U.S. patent application Ser. No. 11/835,612, entitled "Nonvolatile Resistive Memories Having Scalable Two-Terminal Nanotube Switches," filed on Aug. 8, 2007. Write 1 currents are typically limited to less than 1 uA to 50 uA.

Figure 20B:
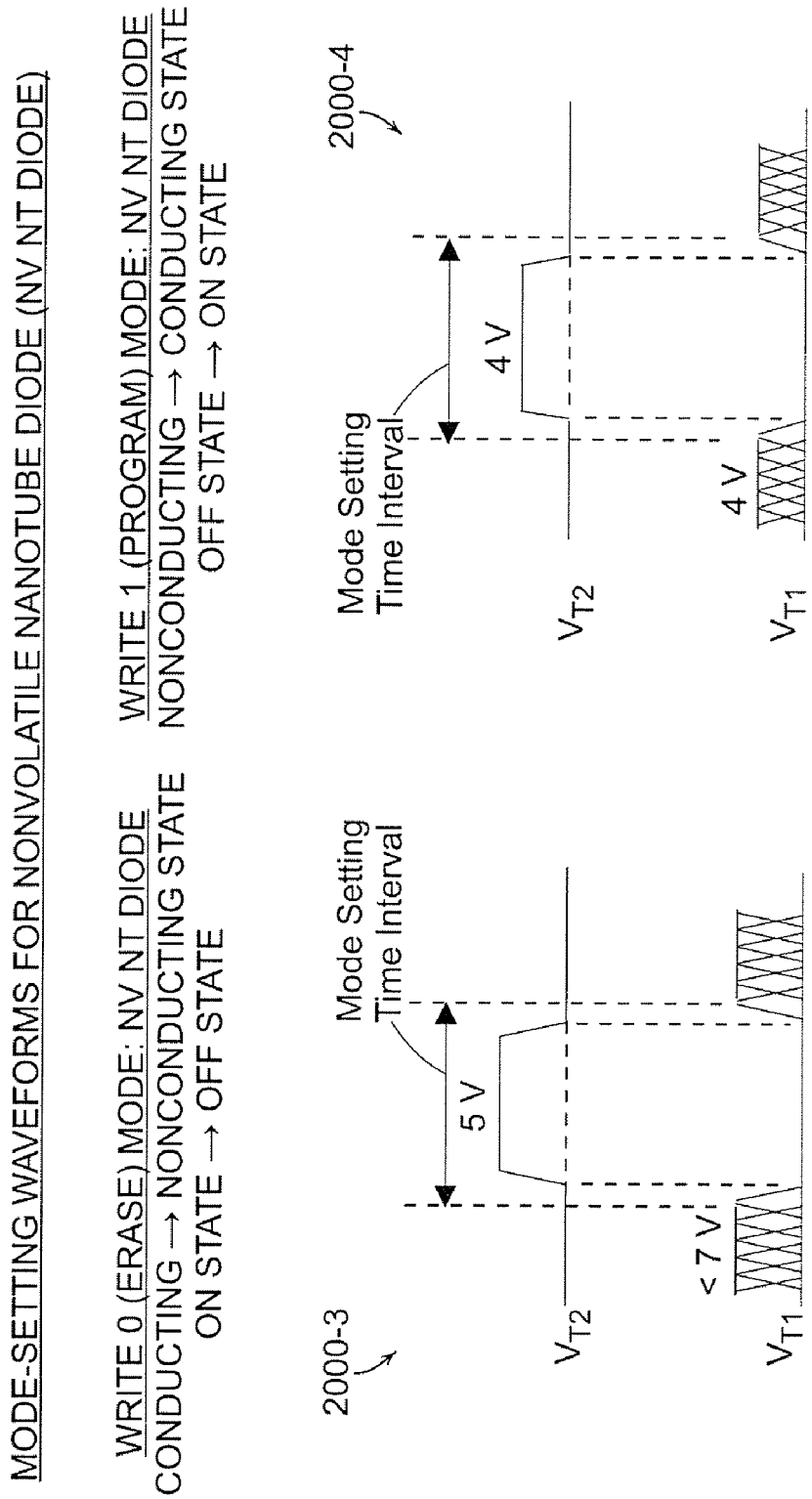

In an exemplary write 0 operation, referring to circuit 1900 in FIG. 19, nonvolatile nanotube diode 1500 (or NV NT FET-Diode 1500) transitions from an ON to an OFF state during a mode setting time interval when write 0 operation waveforms 2000-3 are applied as illustrated in FIG. 20B. Write 0 operation 2000-3 waveforms illustrate voltage $V_{T2}$ at a low voltage, zero volts for example, prior to initiating write 0 operation 2000-3. Voltage $V_{T1}$ may be at any voltage between zero volts and 7 volts, where 7 volts is the reverse bias breakdown voltage of NV NT Diode 1500. The reverse bias breakdown voltage of NV NT Diode 1500 is determined by the reverse breakdown voltage of FET diode 1505, which in this example is assumed to be 7 volts for an FET diode fabricated using a 0.18 um CMOS process. Write 0 operation 2000-3 is not initiated by $V_{T1}$ because FET diode 1505 in a reverse biased mode has a high impedance which reduces voltage across and limits current flow through NV NT Switch 1510 such that write 0 operation 2000-3 voltage conditions of 4-5 volts across the terminals of NV NT Switch 1510 are not met and transition from an ON resistance state to an OFF resistance state does not take place. NV NT Switch 15100N resistance prior to the onset of an write 0 operation is typically in the range of 10 kOhm to 100 kOhm as illustrated in FIGS. 9A and 9B.

An exemplary write 0 operation 2000-3 during a mode setting time interval such as illustrated in FIG. 20B begins with a transition of voltage $V_{T1}$ to a low voltage such as ground. Next, voltage $V_{T2}$ transitions to an applied write 0 voltage of 5 volts. The applied write 0 voltage rise time may be relatively short such as 1 ns for example, or may be relatively long, in excess of 100 us for example. Stimulus circuit 1910 applies voltage $V_{T2}$ to terminal T2, and a voltage $V_{T2}$ minus the forward voltage of FET diode 1505 is applied to terminal 1530 of nonvolatile nanotube switch 1510. One terminal of FET diode 1505 in circuit 1900 is connected to the lowest voltage in the circuit, ground in this example. Assuming the semiconductor substrate is also connected to ground, the FET diode 1505 threshold voltage is not increased by voltages applied to FET diode 1505 relative to a corresponding semiconductor substrate. Using semiconductor fabrication methods to control device characteristics such as oxide thickness and channel ion implantation dosage, FET diode 1505 turn-on voltage may be adjusted to be less than 0.5 volts. If the forward bias voltage drop of FET diode 1505 is less than 0.5 volts, then a voltage greater than 4.5 volts appears across NV NT Switch 1510. NV NT Switch 1510 transitions from an ON state to an OFF state if the write 0 threshold voltage of NV NT Switch 1510 is 4.5 volts (or less), for example. During write 0 operation 2000-3 current limiting is not required. Typical write 0 currents are less than 1 uA to 50 uA.

In an exemplary write 1 operation, referring to circuit 1900 in FIG. 19, nonvolatile nanotube diode 1500 (NV NT FET-Diode 1500) transitions from an OFF to an ON state during a mode setting time interval when write 1 operation waveforms 2000-4 are applied as illustrated in FIG. 20AB. Write 1 operation 2000-4 waveforms illustrate voltage $V_{T2}$ at a low voltage; zero volts for example, prior to initiating write 1 operation 2000-4. NV NT Switch 1510 OFF resistance may be in the range of greater than 100 MOhm to greater than 10 GOhm as illustrated in FIGS. 9A and 9B. Hence, FET diode 1505 reverse biased resistance may be less than the NV NT Switch 1510 OFF resistance, and most of the applied write 1 voltage may appear across NV NT Switch 1510 terminals 1530 and T2 illustrated in FIG. 19. If voltage $V_{T1}$ transitions above the write 1 threshold voltage of NV NT Switch 1510, then an unwanted write 1 cycle may begin. As NV NT Switch 1510 resistance drops, back biased FET diode 1505 resistance becomes dominant and may prevent completion of a write 1 operation. However, in order to prevent a partial write 1 operation, $V_{T1}$ is limited to 4 volts for example.

An exemplary write 1 operation 2000-4 during a mode setting time interval such as illustrated in FIG. 20B begins with a transition of voltage $V_{T1}$ to a low voltage such as ground. Next, voltage $V_{T2}$ transitions to an applied write 1 voltage of 4 volts. The applied write 1 voltage rise time may be relatively short such as less than 1 ns for example, or may be relatively long, in excess of 100 us for example. Stimulus circuit 1910 applies voltage $V_{T2}$ to terminal T2, and a voltage $V_{T2}$ minus the forward voltage of FET diode 1505 is applied to terminal 1530 of NV NT Switch 1510. One terminal of FET diode 1505 in circuit 1900 is connected to the lowest voltage in the circuit, ground in this example. Assuming the semiconductor substrate is also connected to ground, the FET diode 1505 threshold voltage is not increased by voltages applied to FET diode 1505 relative to a corresponding semiconductor substrate. Using semiconductor fabrication methods to control device characteristics such as oxide thickness and channel ion implantation dosage, FET diode 1505 turn-on voltage may be adjusted to be less than 0.5 volts. If the forward bias voltage drop of FET diode 1505 is less than 0.5 volts, then a voltage greater than 4.5 volts appears across NV NT Switch 1510. NV NT Switch 1510 transitions from an OFF state to an ON state if the write 1 threshold voltage of NV NT Switch 1510 is 3.5 volts (or less), for example. During write 1 operation 2000-4 current limiting can be applied. Examples of stimulus circuits that include current limiting means are described in U.S. patent application Ser. No. 11/835,612, entitled "Nonvolatile Resistive Memories Having Scalable Two-Terminal Nanotube Switches," filed on Aug. 8, 2007. Write 1 currents are typically limited to less than 1 uA to 50 uA.

One alternative to using a stimulus circuit with current limiting is to design FET diode 1505 to limit current. That is, NV NT Diode 1500 has a built-in current limit determined by the design of sub-component FET Diode 1505. FET diode examples are shown in the reference Baker, R. et al., "CMOS Circuit Design, Layout, and Simulation", IEEE Press, 1998, pp. 165-171.

Figure 21A:
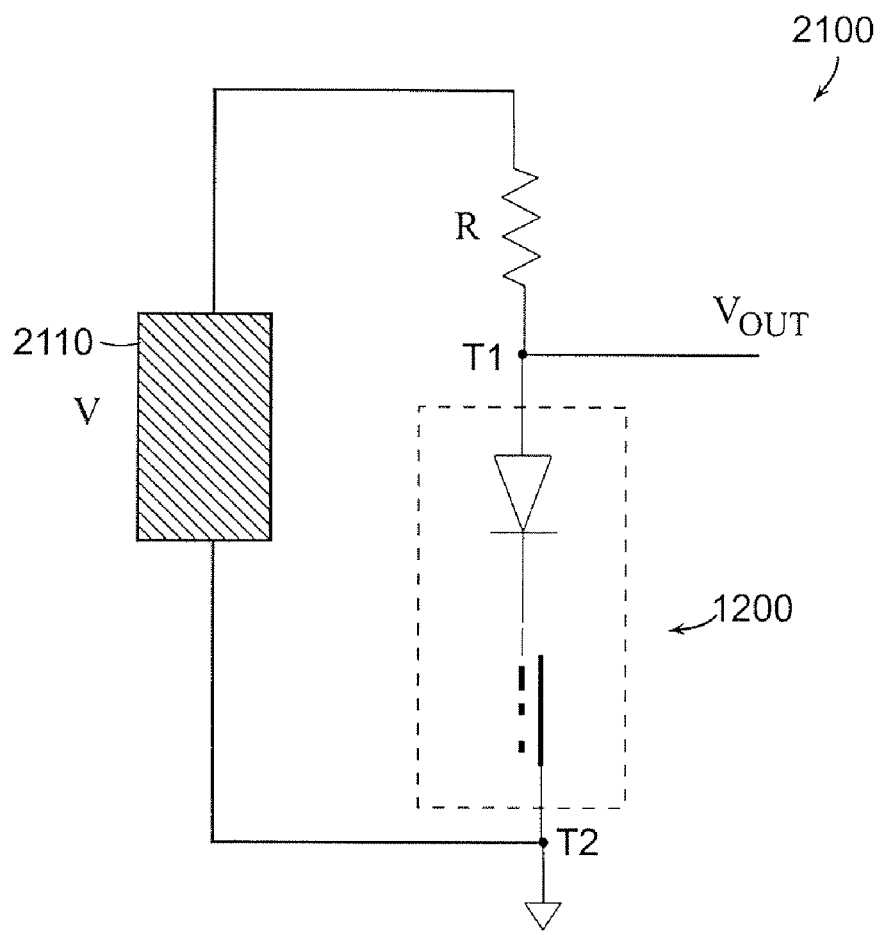

FIG. 21A illustrates an embodiment of a circuit 2100 in which stimulus circuit 2110 applies voltage V to one terminal of resistor R. The other terminal of resistor R is connected to terminal T1 of NV NT Diode 1200. Terminal T2 of NV NT Diode 1200 is connected to a common reference voltage, ground for example. NV NT Diode 1200 is formed by a diode in series with a NV NT Switch as described further above with respect to FIG. 12. The output of circuit 2100 is terminal T1 voltage $V_{OUT}$.

FIG. 21B illustrates equivalent circuit embodiment 2110 for NV NT diode 1200 in an ON state. Equivalent circuit 2110 corresponds to NV NT Switch 600 in the ON state as illustrated in FIG. 6A. FIG. 21C illustrates I-V electrical characteristics 2120 of nonvolatile nanotube diode 1200 in the ON state. The NV NT diode 1200 turn-on voltage is approximately 0.4 to 0.5 volts, for example. After turn-on, the slope of the I-V curve corresponds to the ON resistance of NV NT switch 1210, where $R_{ON-NT}$ is typically in the range of 10 k Ohms to 100 kOhms as illustrated in FIGS. 9A-9B.

FIG. 21D illustrates equivalent circuit embodiment 2130 of NV NT diode 1200 in an OFF state. The equivalent circuit corresponds to NV NT Switch 600' in the OFF state as illustrated in FIG. 6B. FIG. 21E illustrates the I-V electrical characteristics 2140 of nonvolatile nanotube diode 1200 in the OFF state. I-V characteristic 2140 corresponds to $R_{OFF-NT}$ of greater than 100 MOhm for some NV NT switches, and greater than 10 GOhms for other NV NT switches illustrated in FIGS. 9A-9B.

Figure 22:
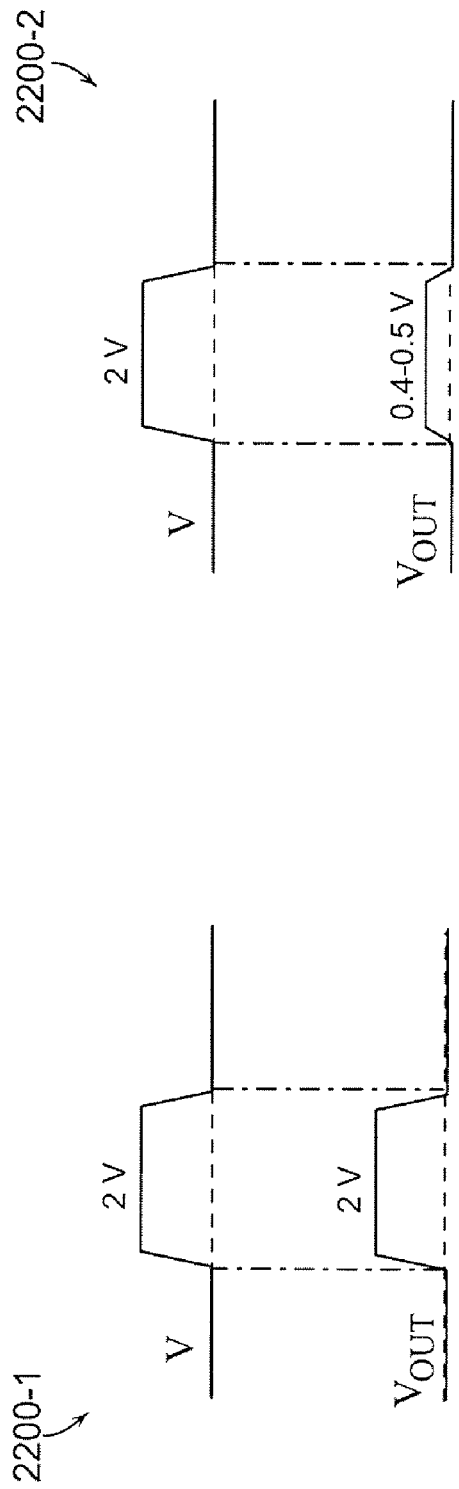
FIG. 22 illustrates circuit operating waveforms of the circuit shown in FIG. 21A, according to some embodiments.

In an exemplary read operation, referring to circuit 2100 in FIG. 21A, output voltage $V_{OUT}$ will be a high voltage if NV NT Diode 1200 is in a high OFF resistance state; and output voltage $V_{OUT}$ will be low if NV NT Diode 1200 is in a low ON resistance state as illustrated in FIG. 22. In this example, R is assumed to be much larger than the ON resistance of NV NT Diode 1200 and much smaller than the OFF resistance of NV NT Diode 1200. Since the ON resistance of NV NT Diode 1200 may be in the range of 10 kOhm to 100 kOhm and the OFF resistance of NV NT Diode 1200 may be greater than 100 MOhm to 10 GOhms and higher as described further above, then R may be chosen as 1 MOhm, for example.

In an exemplary read operation in which NV NT Diode 1200 is in an OFF state, the OFF resistance of NV NT Diode 1200 is much greater than resistance R and when applying read voltage waveforms 2200-1 illustrated in FIG. 22 to circuit 2100 results in a $V_{OUT}$ transition from zero to 2 volts when input V transitions from 0 to 2 volts. This is because resistance R of 1 M Ohm is much smaller than NV NT Diode 1200 resistance of 100 MOhms to 10 GOhms or more.

In an exemplary read operation in which NV NT Diode 1200 is in an ON state, the ON resistance of NV NT Diode 1200 is much less than resistance R and when applying read voltage waveforms 2200-2 illustrated in FIG. 22 to circuit 2100 results in a $V_{OUT}$ transition from zero to 0.4-0.5 volts when input V transitions from 0 to 2 volts. This is because resistance R of 1 M Ohm is larger than the ON resistance of NV NT Diode 1200. The low voltage value of $V_{OUT}$ is 0.4-0.5 volts because that is the forward voltage of NV NT Diode 1200. As explained further above, the forward voltage occurs because diode 1205 is a sub-component of NV NT Diode 1200 as explained further above with respect to FIGS. 12 and 21A-21E.

Figure 23A:
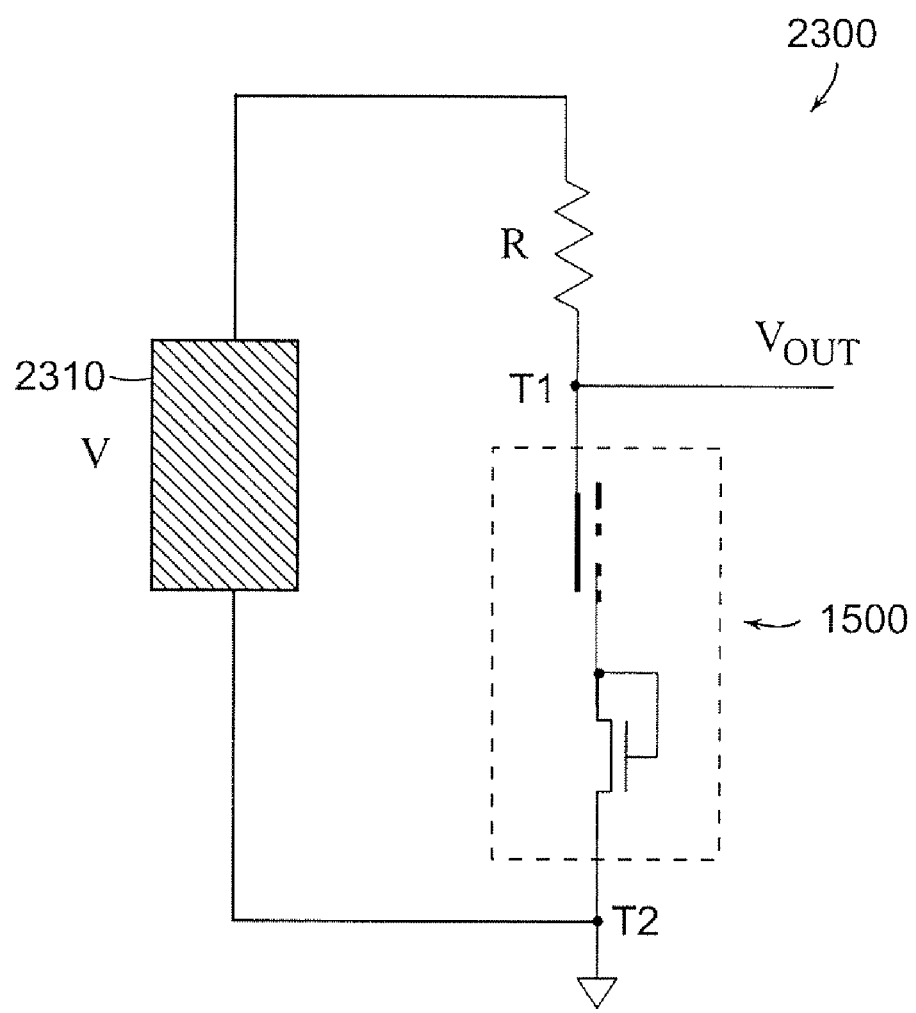
FIG. 23A illustrates an embodiment of a circuit using nonvolatile nanotube diodes similar to the nonvolatile nanotube diode illustrated in FIG. 15.

FIG. 23A illustrates an embodiment of a circuit 2300 in which stimulus circuit 2310 applies voltage V to one terminal of resistor R. The other terminal of resistor R is connected to terminal T1 of NV NT Diode 1500. Terminal T2 of NV NT Diode 1500 is connected to a common reference voltage, ground for example. NV NT Diode 1500 is formed by an FET diode in series with a NV NT Switch as described further above with respect to FIG. 15. The output of circuit 2300 is terminal T1 voltage $V_{OUT}$.

In a read operation, referring to circuit 2300 in FIG. 23A, output voltage $V_{OUT}$ will be a high voltage if NV NT Diode 1500 (NV NT FET-Diode 1500) is in a high OFF resistance state; and output voltage $V_{OUT}$ will be low if NV NT Diode 1500 is in a low ON resistance state as illustrated in FIG. 23B. In this example, R is assumed to be much larger than the ON resistance of NV NT Diode 1500 and much smaller than the OFF resistance of NV NT Diode 1500. Since the ON resistance of NV NT Diode 1500 may be in the range of 10 kOhm to 100 kOhm and the OFF resistance of NV NT Diode 1500 may be greater than 100 MOhm to 10 GOhms and higher as described further above, then R may be chosen as 1 MOhm, for example.

In an exemplary read operation in which NV NT Diode 1500 is in an OFF state, the OFF resistance of NV NT Diode 1500 is much greater than resistance R and when applying read voltage waveforms 2300-1 illustrated in FIG. 23B to circuit 2300 results in a $V_{OUT}$ transition from zero to 2 volts when input V transitions from 0 to 2 volts. This is because resistance R of 1 M Ohm is much smaller than NV NT Diode 1500 resistance of 100 MOhms to 10 GOhms or more.

In an exemplary read operation in which NV NT Diode 1500 is in an ON state, the ON resistance of NV NT Diode 1500 is much less than resistance R and when applying read voltage waveforms 2300-2 illustrated in FIG. 23B to circuit 2300 results in a $V_{OUT}$ transition from zero to 0.5 volts when input V transitions from 0 to 2 volts. This is because resistance R of 1 M Ohm is larger than the ON resistance of NV NT Diode 1500. The low voltage value of $V_{OUT}$ is 0.5 volt because that is the forward voltage of NV NT Diode 1500. As explained further above, the forward voltage occurs because FET diode 1505 is a sub-component of NV NT Diode 1500.

Figure 24:
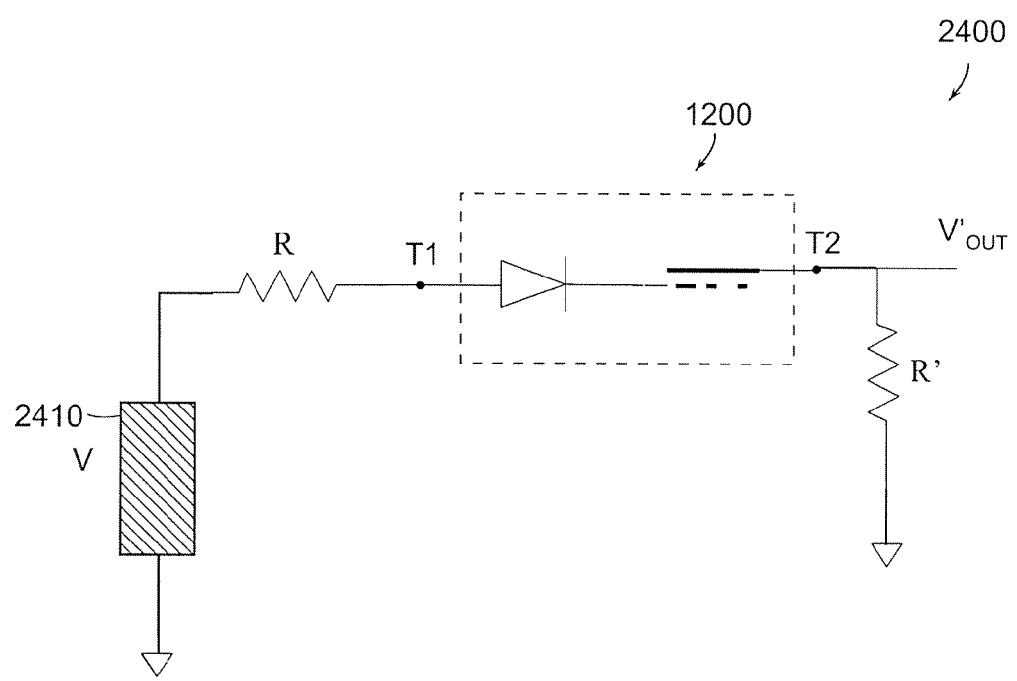
FIG. 24 illustrates an embodiment of a transfer circuit using a nonvolatile nanotube diode corresponding to the nonvolatile nanotube diode of FIG. 12.

FIG. 24 illustrates an embodiment of a circuit 2400 in which NV NT Diode 1200 includes a nonvolatile two terminal transfer device. Stimulus circuit 2410 applies voltage V to one terminal of resistor R. The other terminal of resistor R is connected to terminal T1 of NV NT Diode 1200. Terminal T2 of NV NT Diode 1200 is connected to one terminal of second resistor R'; the other terminal of resistor R' is connected to a common reference voltage, ground for example. NV NT Diode 1200 is formed by a diode in series with a NV NT switch as described further above with respect to FIG. 12. An equivalent circuit and I-V characteristics for NV NT diode 1200 is illustrated in FIGS. 21A-21E. The output of circuit 2400 is terminal T2 voltage $V'_{OUT}$.

Figure 25:
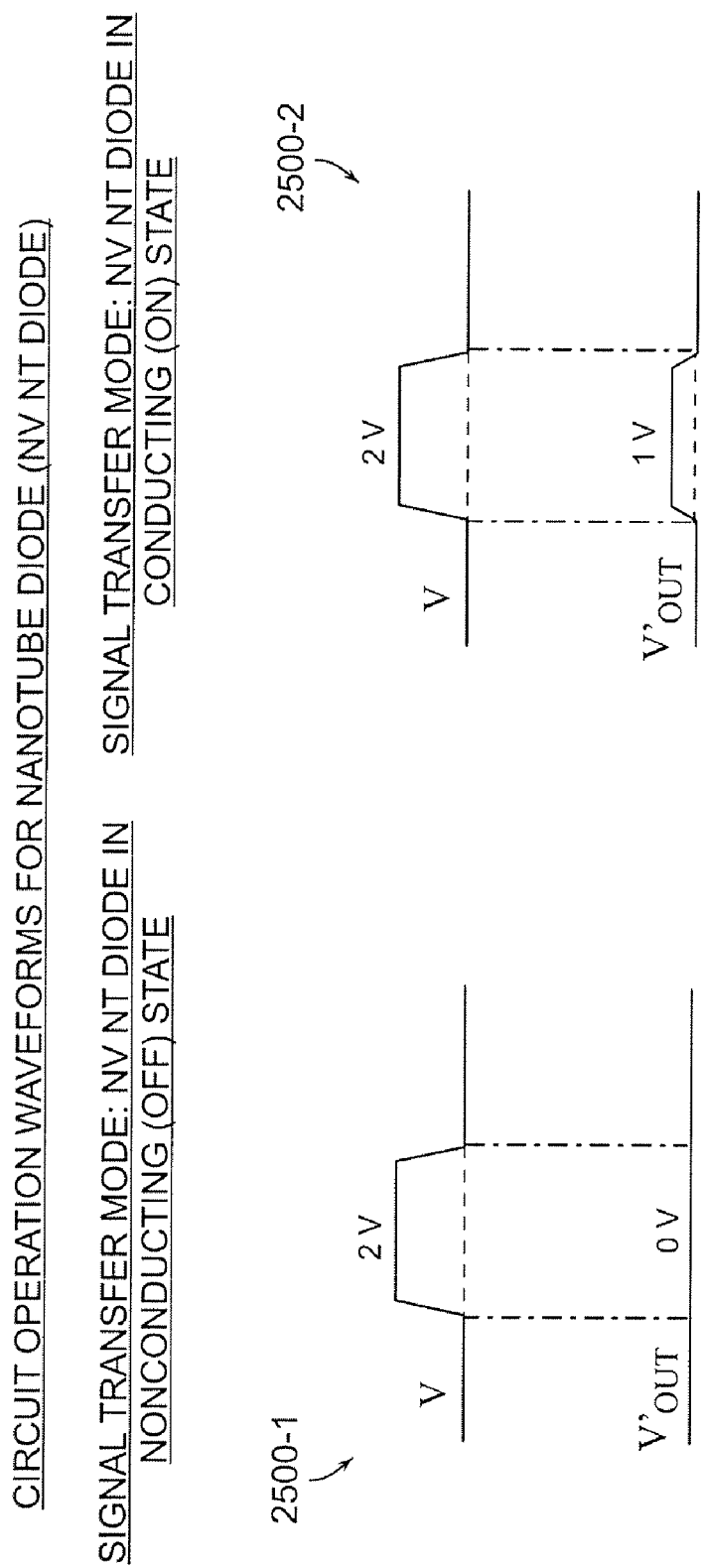
FIG. 25 illustrates the circuit operating waveforms of the circuit shown in FIG. 24, according to some embodiments.

In an exemplary signal transfer operation, referring to circuit 2400 in FIG. 24, output voltage $V_{OUT}$ will be a low voltage if NV NT Diode 1200 is in a high OFF resistance state; and output voltage $V_{OUT}$ will be high if NV NT Diode 1200 is in a low ON resistance state as illustrated in FIG. 25. In this example, R is assumed to be much larger than the ON resistance of NV NT Diode 1200 and much smaller than the OFF resistance of NV NT Diode 1200. Since the ON resistance of NV NT Diode 1200 may be in the range of 10 kOhm to 100 kOhm and the OFF resistance of NV NT Diode 1200 may be greater than 100 MOhm to 10 GOhms and higher as described further above, then R may be chosen as 1 MOhm, for example. In this example, resistor R' is assumed to be equal to resistor R.

In an exemplary signal transfer operation in which NV NT Diode 1200 is in an OFF state, the OFF resistance of NV NT Diode 1200 is much greater than resistance R and applying signal transfer voltage waveforms 2500-1 illustrated in FIG. 25 to circuit 2400 results in a $V_{OUT}$ remaining at approximately zero volts when input V transitions from 0 to 2 volts. This is because resistance R of 1 M Ohm is much smaller than NV NT Diode 1200 resistance of 100 MOhms to 10 GOhms or more and voltage V appears across NV NT Diode 1200; resistor R' is also 1 M Ohm.

In an exemplary signal transfer operation in which NV NT Diode 1200 is in an ON state, the ON resistance of NV NT Diode 1200 is much less than resistance R and applying read voltage waveforms 2300-2 illustrated in FIG. 25 to circuit 2400 results in voltage V dividing between two equal resistance values R and R' of 1 M Ohm. $V'_{OUT}$ transition from zero to approximately 1 volt when input V transitions from 0 to 2 volts. This is because resistance R of 1 M Ohm is larger than the ON resistance of NV NT Diode 1200, and with resistance R' also equal to 1 MOhm, signal transfer circuit 2400 with NV NT Diode 1200 in the ON state behaves as a 2:1 voltage divider.

Nonvolatile Memories using Nonvolatile Nanotube Diode (NV NT Diode) Devices as Cells A bit-selectable nonvolatile nanotube-based memory array described further below includes a plurality of memory cells, each cell receiving a bit line and a word line. Each memory cell includes a selection diode with anode and cathode terminals (nodes). Each cell further includes a two terminal nonvolatile nanotube switch device, the state of which manifests the logical state of the cell. The combined diode and nonvolatile nanotube switch is referred to as a nonvolatile nanotube diode (NV NT Diode) as described further above. Each memory cell is formed using one nonvolatile nanotube diode. The state of the nonvolatile nanotube switch-portion of the nonvolatile nanotube diode may be changed (cycled) between an ON resistance state and an OFF resistance state separated by at least one order of magnitude, but typically separated by two to five orders of magnitude. There is no practical limit to the number of times nonvolatile nanotube switches may be cycled between ON and OFF states.

Each memory cell may be formed using a nonvolatile nanotube diode with an internal cathode-to-nonvolatile nanotube switch connection, or a nonvolatile nanotube diode with an internal anode-to-nonvolatile nanotube switch connection, with a horizontal orientation, or with a vertical (three dimensional) orientation to maximize density. In order to further maximize density, memory arrays are integrated above support circuits and interconnections that are integrated in and on an underlying semiconductor substrate.

Nonvolatile Memories using NV NT Diode Devices with Cathode-to-NT Switch Connection In some embodiments, a nonvolatile nanotube diode (NV NT diode) is a two terminal nonvolatile device formed by two series devices, a diode (e.g., a two terminal Schottky or PN diode) in series with a two terminal nonvolatile nanotube switch (NV NT switch). Each of the two said series devices has one shared series electrical connection. A cathode-to-nanotube NV NT diode has the cathode terminal electrically connected to one of said two nonvolatile nanotube switch terminals. Said NV NT diode two terminal nonvolatile device has one available terminal connected to the anode of the Schottky or PN diode and the second available terminal connected to the free terminal of the NV NT switch. A schematic of an embodiment of a cathode-to-NT nonvolatile nanotube diode is illustrated in FIG. 12. PIN diodes, FET diodes, and other diode types may also be used.

In some embodiments, dense 3D memories may be formed using one NV NT diode per cell. Embodiments of memories using NV NT diodes with cathode-to-NT connections are illustrated schematically and memory operation is described further below. 3-D cell structures are illustrated including fabrication methods. Cells with NV NT diodes formed with NV NT switches with both vertical and horizontal orientations are illustrated further below.

Nonvolatile Systems and Circuits, with Same

Figure 26A:
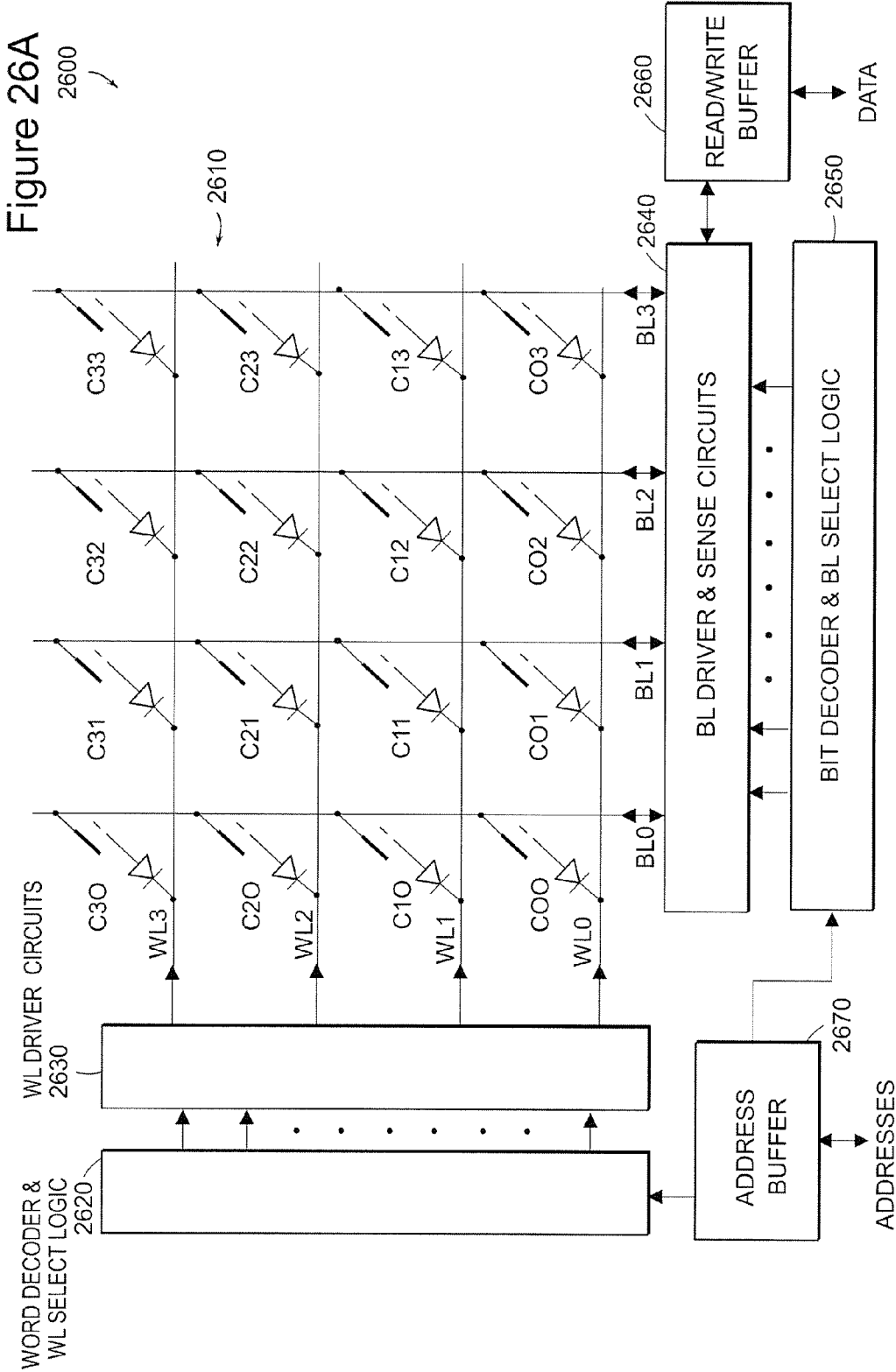
FIG. 26A schematically illustrates an embodiment of a memory schematic that uses nonvolatile nanotube diodes illustrated in FIG. 12 as nonvolatile memory cells.

One embodiment of a nonvolatile memory 2600 is illustrated in FIG. 26A. Memory 2600 includes memory array 2610 having cells C00 through C33 formed using nonvolatile nanotube diodes similar to nonvolatile nanotube diode 1200 (NV NT Diode 1200) having a diode-cathode-to-nonvolatile nanotube switch terminal connection such as that illustrated in FIG. 12. A diode similar to diode 1205 of NV NT Diode 1200 is used as a cell select device and a nonvolatile storage switch similar to NV NT Switch 1210 of NV NT Diode 1200 is used to store a nonvolatile ON (low resistance) state or a nonvolatile OFF (high resistance) state. ON and OFF states represent nonvolatile logic "1" or "0" states, respectively. Note that logic "1" and logic "0" state assignments with respect to low and high resistance states are arbitrary and may be reversed, for example.

Nonvolatile memory 2600 illustrated in FIG. 26A includes memory array 2610 having a matrix of NV NT Diode cells C00 through C33 similar to NV NT Diode 1200 as explained further above. Nonvolatile cell C00, as other cells in the array, includes one NV NT Diode referred to as NV NT Diode C00 which is similar to NV NT Diode 1200 illustrated further above. The anode of NV NT Diode C00 is connected to bit line BL0, and the other terminal of NV NT Diode C00, a NV NT Switch terminal, is connected to word line WL0.

In the illustrated embodiment, memory array 2610 is a 4-word line by 4-bit line 16 bit memory array that includes word lines WL0, WL1, WL2, and WL3 and bit lines BL0, BL1, BL2, and BL3. Word line driver circuits 2630 connected to word lines WL0 through WL3 and selected by word decoder and WL select logic 2620 provide stimulus during write 0, write 1, and read operations. BL driver and sense circuits 2640 provide data multiplexers (MUXs), BL drivers and sense amplifier/latches and are connected to bit lines BL0 through BL3 and selected by bit decoder and BL select logic 2650 provide stimulus during write 0, write 1, and read operation; that is receive data from memory array 2610 and transmit data to memory array 2610. Data in memory array 2610 is stored in a nonvolatile state such that power (voltage) supply to memory 2600 may be removed without loss of data. BL driver and sense circuits 2640 are also connected to read/write buffer 2660. Read/write buffer 2660 transmits data from memory array 2610 to read/write buffer 2660 which in turn transmits this data off-chip. Read/write buffer 2660 also accepts data from off-chip and transmits this data to BL driver and sense circuits 2640 that in turn transmit data to array 2610 for nonvolatile storage. Address buffer 2670 provides address location information.

For an exemplary write 0 operation along word line WL0, simultaneously erasing cells C00, C01, C02, and C03, data stored in cells C00-C03 may optionally be read prior to erase and data stored in corresponding sense amplifier/latches. Write 0 operations along word line WL0 proceeds with bit lines BL0, BL1, BL2, and B3 transitioning from zero to 5 volts, with bit line drivers controlled by corresponding BL drivers in BL driver and sense circuits 2640. Next, WL driver circuits 2630 drive word line WL0 from 5 volts to zero volts thus forward biasing NV NT Diodes C00, C01, C02, and C03 that form cells C00, C01, C02, and C03, respectively. A write 0 voltage of approximately 4.5 volts (erase voltage 5 volts minus NV NT diode turn on voltage of less than 0.5 volts as illustrated in FIG. 21) results in a transition from an ON state to an OFF state for NV NT Diodes in an ON state; NV NT Diodes in an OFF state remain in an OFF state. Thus after a write 0 operation along word line WL0, NV NT Diodes C00-C03 are all in an OFF state. Unselected word lines WL1, WL2, and WL3 all remain unselected and at 5 volts, and nonvolatile data stored in corresponding cells remains unchanged.

Note that while FIG. 26A illustrates a 4×4 memory array 2610, the array can be made arbitrarily large(e.g., to form an ~8 kB array), and the associated electronics modified appropriately.

Figure 26B:
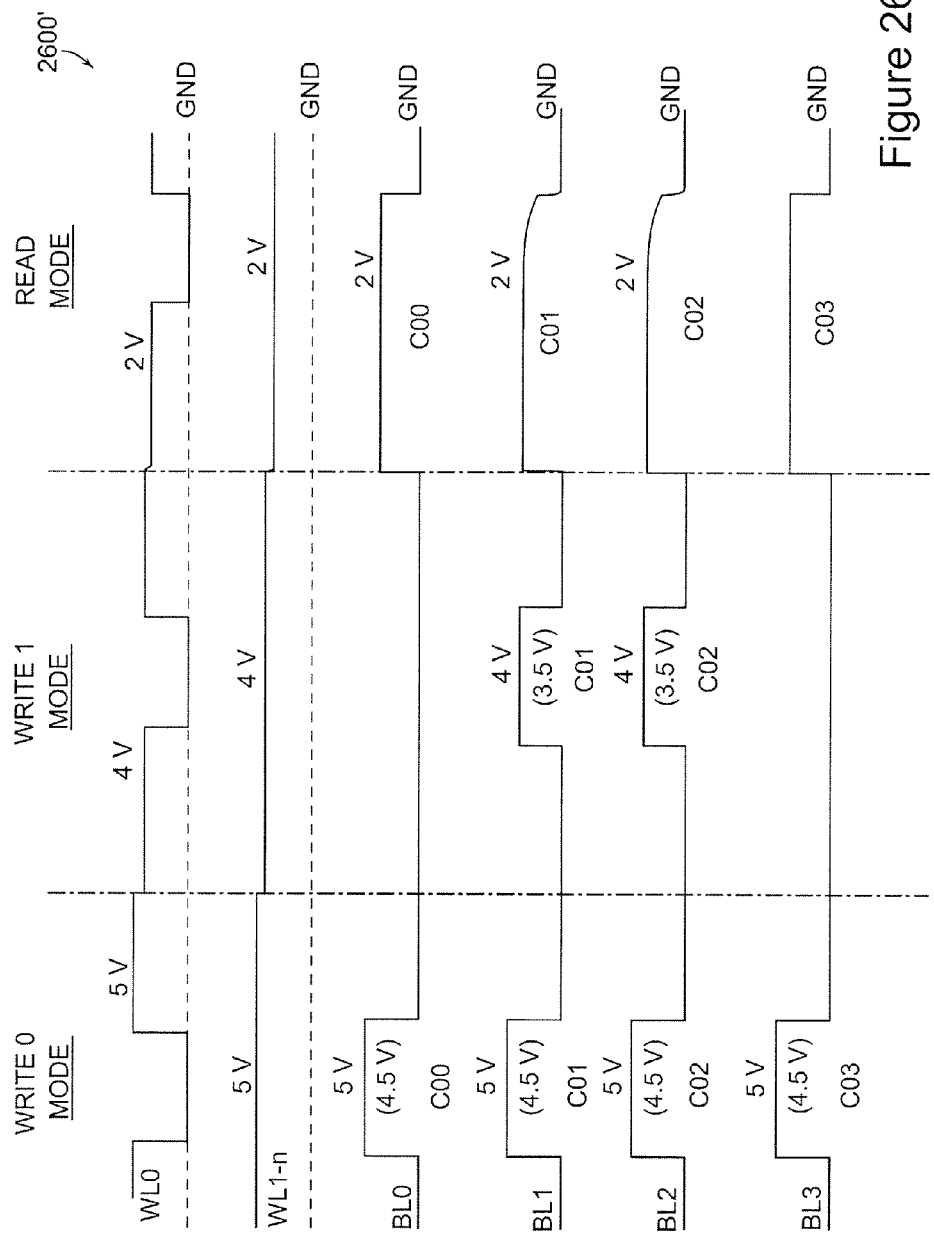
FIG. 26B illustrates operational waveforms for the memory illustrated in FIG. 26A, according to some embodiments.

The exemplary write 0 and write 1 operations illustrated in FIG. 26B are described with respect to write 0 (erase) voltages of 4.5 volts and write 1 (write) voltages of 3.5 volts applied across the two terminals of NV NT switches. However, with further reduction in NV NT switch channel length (below 20 nm), and/or improved nanotube element SWNT and/or MWNT materials, and/or improved device structures such NV NT switches that include suspended regions as described further above, write 0 and write 1 voltages may be reduced to the 1 to 3 volt range, or other ranges, for example.

In this example, an exemplary write operation is preceded by a write 0 operation as described further above. In other words, NV NT Diodes C00-C03 of respective corresponding cells C00-C03 begin the write operation in the OFF state. For an exemplary write 0 operation to cell C00 for example, in which a logic 0 state is to be stored, NV NT Diode C00 is to remain in the logic 0 high resistance state. Therefore, bit line BL0 is held at zero volts by corresponding BL driver and sense circuits 2640. Next, word line WL0 transitions from 4 volts to zero volts, with stimulus from WL drivers 2630. NV NT Diode C00 remains back biased during the write 0 operation and cell C00 remains in an OFF (high resistance) logic 0 state.

If NV NT Diode C00 is to transition from an OFF (high resistance state) to an ON (low resistance state) in a write 1 operation representing a logic 1, then bit line BL0 transitions from zero volts to 4 volts, with stimulus provided by corresponding BL drivers in BL driver and sense circuits 2640. Next, word line WL0 transitions from 4 volts to zero volts. A write 1 voltage of approximately 4 volts results in a voltage of 3.5 volts across the terminals of a corresponding NV NT switch sub-component of NV NT diode C00 (4 volts minus NV NT diode turn on voltage of less than 0.5 volts as illustrated in FIG. 21) results in a transition from an OFF state to an ON state for NV NT Diode C00.

For an exemplary read operation, from cells C00-C03 for example, the bit line drivers in BL driver and sense circuits 2640 precharge bit lines BL0-BL3 to a high voltage such as a read voltage of 2 volts, for example. The read bit line voltage is selected to be less than both write 0 and write 1 voltages to ensure that stored logic states (bits) are not disturbed (changed) during a read operation. Word line driver circuits 2630 drives word line WL0 from 2 volts to zero volts. If NV NT Diode C00 in cell C00 is in an OFF state (storing a logic 0) then bit lines BL0 is not discharged and remains at 2 volts. A corresponding sense amplifier/latch in BL driver and sense circuits 2640 stores a logic 0. However, if NV NT Diode C00 in cell C00 is in an ON state, then bit line BL0 is discharged. A corresponding sense amplifier/latch in BL driver and sense circuits 2640 detects the reduced voltage and latches a logic 1.

FIG. 26B illustrates examples of operational waveforms 2600' that may be applied to an embodiment of memory 2600 illustrated in FIG. 26A during write 0, write 1, and read operations (or modes). A pre-write 0 read operation may optionally be performed before a write 0 operation in order to record cell states along a selected word line, such as word line WL0, in corresponding latches. Cells C00, C01, C02, and C03 receive write 0 pulses (nearly) simultaneously. At the beginning of a write 0 operation, bit lines BL0, BL1, BL2, and BL3 transition from zero to 5 volts as illustrated by waveforms 2600' in FIG. 26B. Next, word line WL0 transitions from 5 volts to zero volts thereby forward-biasing NV NT Diodes C00-C03. Approximately 4.5 volts appears across the respective NV NT Switches in each of the NV NT Diodes because of a less than 0.5 volt forward-bias voltage drop. If the write 0 voltage of corresponding NV NT Switch is 4.5 volts (or less), then NV NT Diodes transition from an ON (low resistance) state to an OFF (high resistance) state; NV NT Diodes in an OFF state remain in an OFF state. Thus after a write 0 operation along word line WL0, NV NT Diodes C00-C03 are all in an OFF state. Unselected word lines WL1, WL2, and WL3 all remain unselected and at 5 volts.

In this example, a write operation is preceded by a write 0 operation as described further above with respect to FIG. 26A. In other words, for cells along word line WL0, NV NT Diodes C00-C03 are in an OFF state at the beginning of the write operation. For exemplary write operations illustrated by waveforms 2600', NV NT Diodes C00 and C03 are to remain in the OFF state for a write 0 operation, and NV NT Diodes C01 and C02 are to transition from an OFF state to an ON state in a write 1 operation.

Therefore, at the beginning of the write cycle, bit lines BL0 and BL3 remain at zero volts. Next, word line WL0 transitions from 4 volts to zero volts. NV NT Diodes C00 and C03 remain back biased during the write 0 operation, and therefore NV NT Diodes remain in the OFF state storing a logic 0 state.

Continuing the exemplary write cycle, cells C01 and C02 transition from an OFF to an ON state. Bit lines BL1 and BL2 transition from zero to 4 volts. Next, word line WL0 transitions from 4 volts to zero volts. NV NT Diodes C01 and C02 are forward biased during the write 1 operation and approximately 3.5 volts appear across NV NT Switches corresponding to NV NT Diodes C01 and C02. NV NT Diodes C01 and C02 transition from an OFF to an ON state storing a logic 1 state.

For an exemplary read operation as illustrated by waveforms 2600' in FIG. 26B, bit lines BL0, BL1, BL2, and BL3 are precharged to 2 volts, for example, and allowed to float. Then word line WL0 transitions from 2 volts to zero volts. Word lines WL1, WL2, and WL3 remain at 2 volts. For cells C00 and C03, bit line BL0 and BL3 voltage remains unchanged because NV NT Diodes C00 and C03 are in an OFF or high resistance state and bit line BL0 and BL3 capacitance cannot discharge to ground (zero volts). However, for cells C01 and C02, bit lines BL1 and BL2 discharge toward zero volts because NV NT Diodes C01 and C02 are in an ON or low resistance state and bit line capacitance for BL1 and BL2 can discharge toward ground (zero volts). For BL1 and BL2, corresponding sense amplifier/latches typically detect bit line voltage reduction in the 100 mV to 200 mV range, although this value may vary depending upon the particular characteristics (design) of the sense/latch circuit. Corresponding sense amplifier/latches in BL driver and sense circuits 2640 determine that BL1 and BL2 read voltages have changed and latch a logic 1 state corresponding to the ON state of NV NT Diodes C01 and C02 that form cells C01 and C02. Corresponding sense amplifier/latches in BL driver and sense circuits 2640 determine that BL0 and BL3 have not changed and latch a logic 0 state corresponding to the OFF state of NV NT Diodes C00 and C03 forming cells C00 and C03.

An Overview of 3-Dimensional Cell Structure Methods of Fabrication of Nonvolatile Memory Cells Using NV NT Devices Nonvolatile nanotube diodes 1200 and 1300 (NV NT Diodes 1200, 1300), and nonvolatile nanotube diodes formed with FET diodes, referred to as NV NT Diodes 1400, 1500, 1600, and 1700 or also as NV NT FET-Diodes 1400, 1500, 1600, and 1700, may be used as cells and interconnected into arrays to form nonvolatile nanotube random access memory systems. Such arrays may also be used to fabricate nonvolatile array-based logic such as PLAs, FPGAs, PLDs and other such logic devices.

Figure 27A:
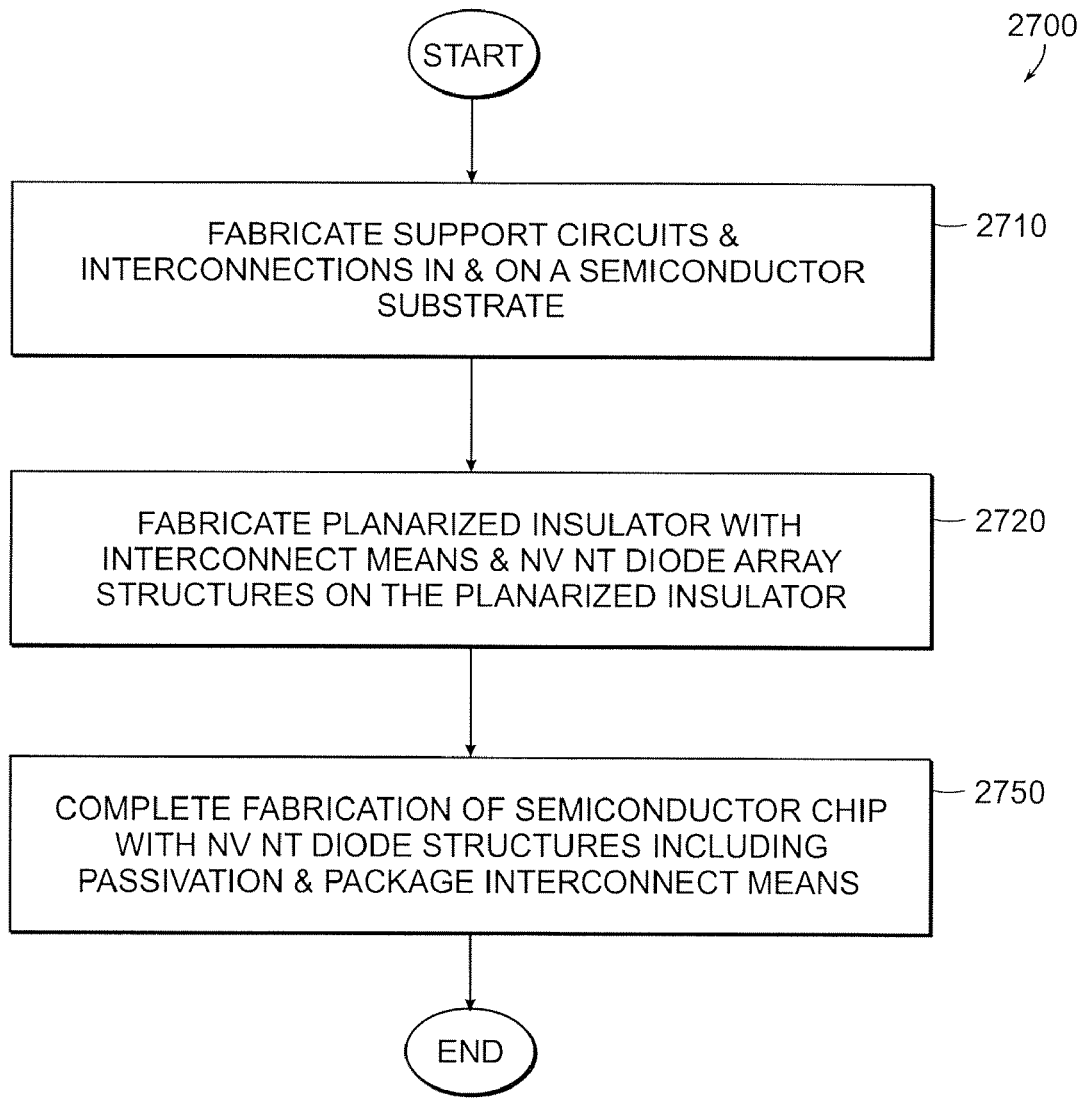
FIGS. 27A-27B illustrate methods of fabrication of memory cells using nonvolatile nanotube diodes similar to those illustrated schematically in FIG. 12, according to some embodiments.

FIG. 27A illustrates an overview of a method 2700 of fabricating some embodiments of the invention. While method 2700 is described further below with respect to nonvolatile nanotube diodes 1200 and 1300, method 2700 is sufficient to cover the fabrication of many of the nonvolatile nanotube diodes described further above. These methods 2700 may also be used to form logic embodiments based on NV NT diodes arranged as logic arrays such as NAND and NOR arrays with logic support circuits (instead of memory support circuits) as used in PLAs, FPGAs, and PLDs, for example.

In general, methods 2710 fabricate support circuits and interconnections in and on a semiconductor substrate. This includes NFET and PFET devices having drain, source, and gate that are interconnected to form memory support circuits such as, for example, circuits 2620, 2630, 2640, 2650, 2660, and 2670 illustrated in FIG. 26A. Such structures and circuits may be formed using known techniques that are not described in this application. Methods 2710 can be used to form a base layer using known methods of fabrication in and on which nonvolatile nanotube diode control devices and circuits are fabricated.

Methods 2720 fabricate an intermediate structure including a planarized insulator with interconnect means and nonvolatile nanotube array structures on the planarized insulator surface. Interconnect means include vertically-oriented filled contacts, or studs, for interconnecting memory support circuits in and on a semiconductor substrate below the planarized insulator with nonvolatile nanotube diode arrays above and on the planarized insulator surface.

Word lines and bit lines can be used in 3D array structures as described further below to interconnect 3-D cells and form 3-D memories, and can be approximately orthogonal in an X-Y plane approximately parallel to underlying memory support circuits. Word line direction has been arbitrarily assigned as along the X axis and bit line direction has arbitrarily assigned as along the Y axis in figures illustrating 3D array structures and 3D array structure methods of fabrication as described further below. The Z axis, approximately orthogonal to the X-Y plane, indicates the vertical direction of 3D cell orientation, in "vertical cell" embodiments such as those described in greater detail below.

Methods 2750 use industry standard fabrication techniques to complete fabrication of the semiconductor chip by adding additional wiring layers as needed, and passivating the chip and adding package interconnect means.

Figure 28A:
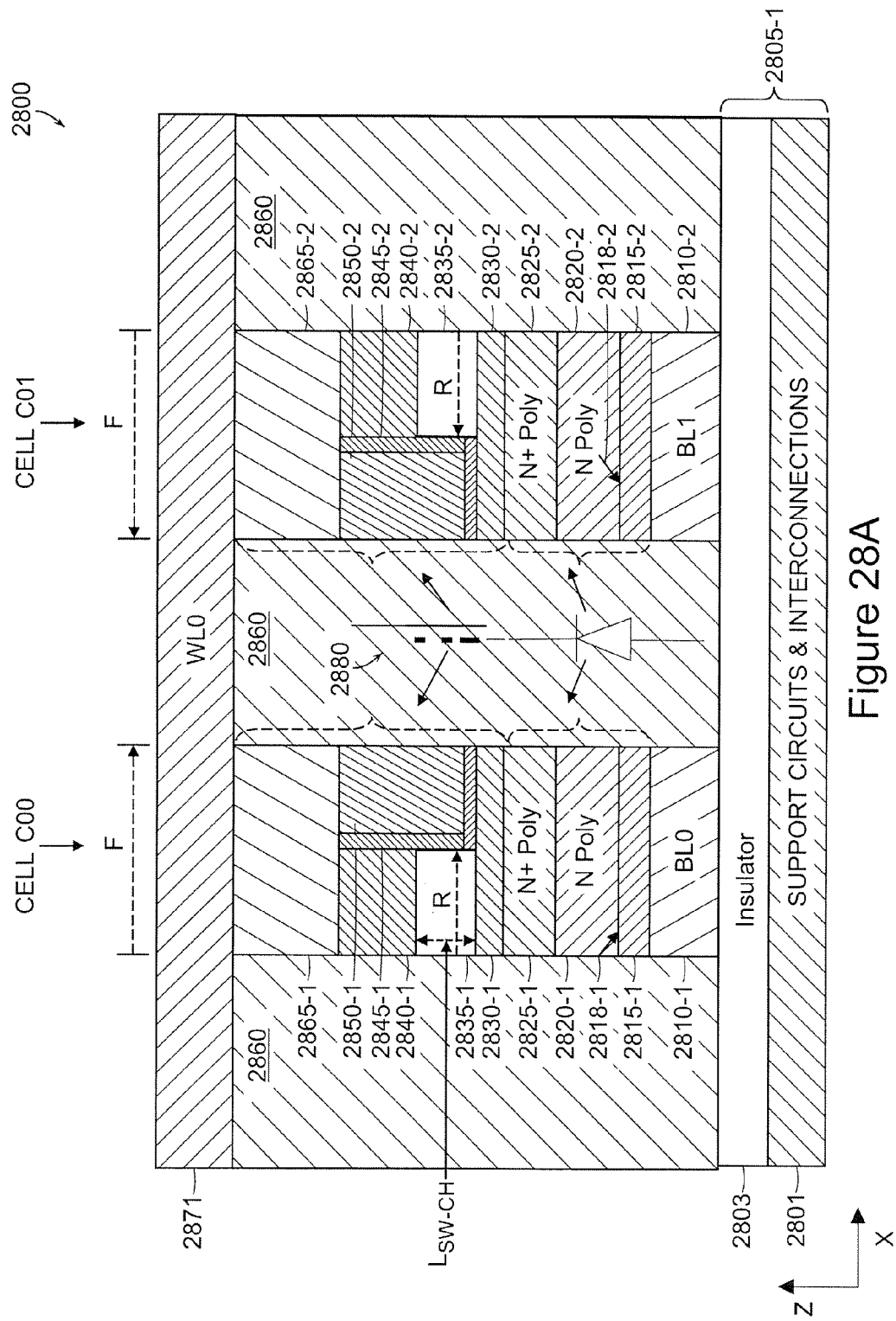
FIG. 28A illustrates a three dimensional cross section of an embodiment of a dense 3D cell structure formed with a cathode-to-nanotube nonvolatile nanotube diode with a Schottky diode in series with a vertically oriented nonvolatile nanotube switch within vertical cell boundaries.

3-Dimensional Cell Structure of Nonvolatile Cells Using NV NT Devices Having Vertically Oriented Diodes and Vertically Oriented NT Switches with Cathode-to-NT Switch Connection Once support circuits and interconnections in and on the semiconductor substrate are defined, methods can then be used to fabricate a nonvolatile nanotube diode array such as that illustrated in cross section 2800 above the support circuit and interconnect region as illustrated in FIG. 28A. FIG. 28A illustrates a cross section including cells C00 and C01 in one of several possible embodiments.

Methods 2710 described further above can be used to define support circuits and interconnections 2801.

Figure 27B:
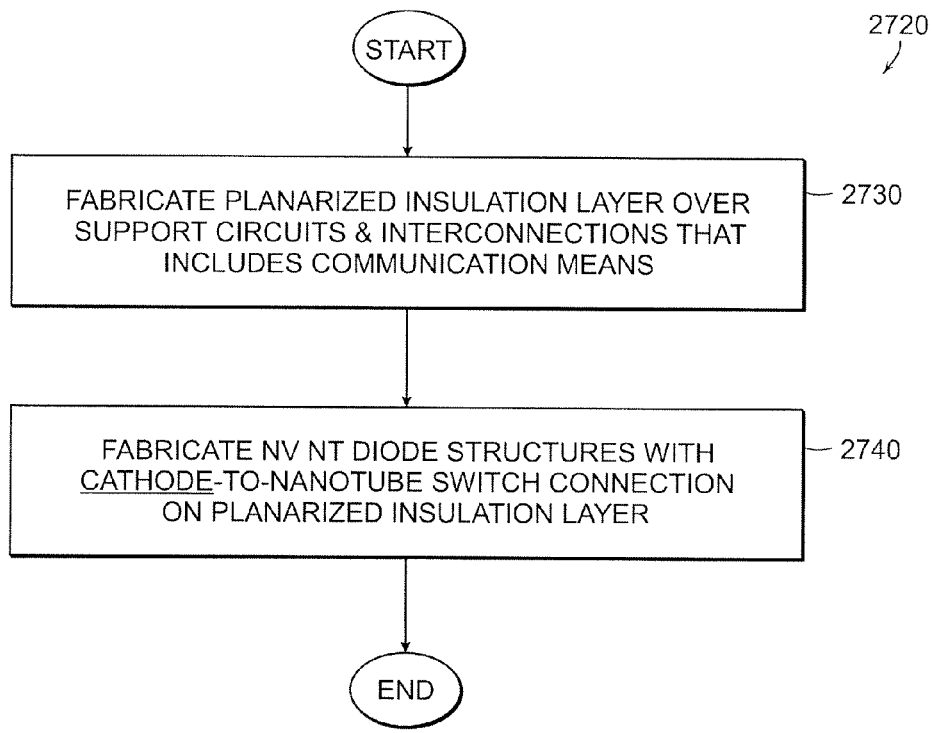

Next, methods 2730 illustrated in FIG. 27B deposit and planarize insulator 2803. Interconnect means through planar insulator 2803 (not shown in cross section 2800 but shown further below with respect to cross section 2800" in FIG. 28C) may be used to connect metal array lines in 3-D arrays to corresponding support circuits and interconnections 2801. By way of example, bit line drivers in BL driver and sense circuits 2640 may be connected to bit line BL0 in array 2610 of memory 2600 illustrated in FIG. 26A. At this point in the fabrication process, methods 2740 may be used to form a memory array on the surface of insulator 2803, interconnected with memory array support structure 2805-1 illustrated in FIG. 28A.

Methods 2740 illustrated in FIG. 27B deposit and planarize metal, polysilicon, insulator, and nanotube elements to form nonvolatile nanotube diodes which, in this example, include multiple vertically oriented diode and vertically oriented nonvolatile nanotube switch series pairs. Individual cell outer dimensions are formed in a single etch step, each cell having a single NV NT Diode defined by a single trench etch step after layers, except the WL0 layer, have been deposited and planarized, in order to eliminate accumulation of individual layer alignment tolerances that would substantially increase cell area. Individual cell dimensions in the X direction are 1F (1 minimum feature) as illustrated in FIG. 28A, and also 1F in the Y direction (not shown) which is orthogonal to the X direction, with a periodicity in X and Y directions of 2F. Hence, each cell occupies an area of approximately $4F^2$. The vertically-oriented (Z direction) NV NT switch element (nanotube element) placement at R in the X direction is parallel to the trench-defined outer dimensions with R approximately equal to F/2 in this example, where NV NT switch (nanotube element) separation distance is controlled by self-aligned means described further below with respect to FIGS. 34A-34FF. Vertically-oriented NV NT switch element (nanotube element) placement in the Y direction is typically not critical and typically does not require self-alignment means.

Figure 28B:
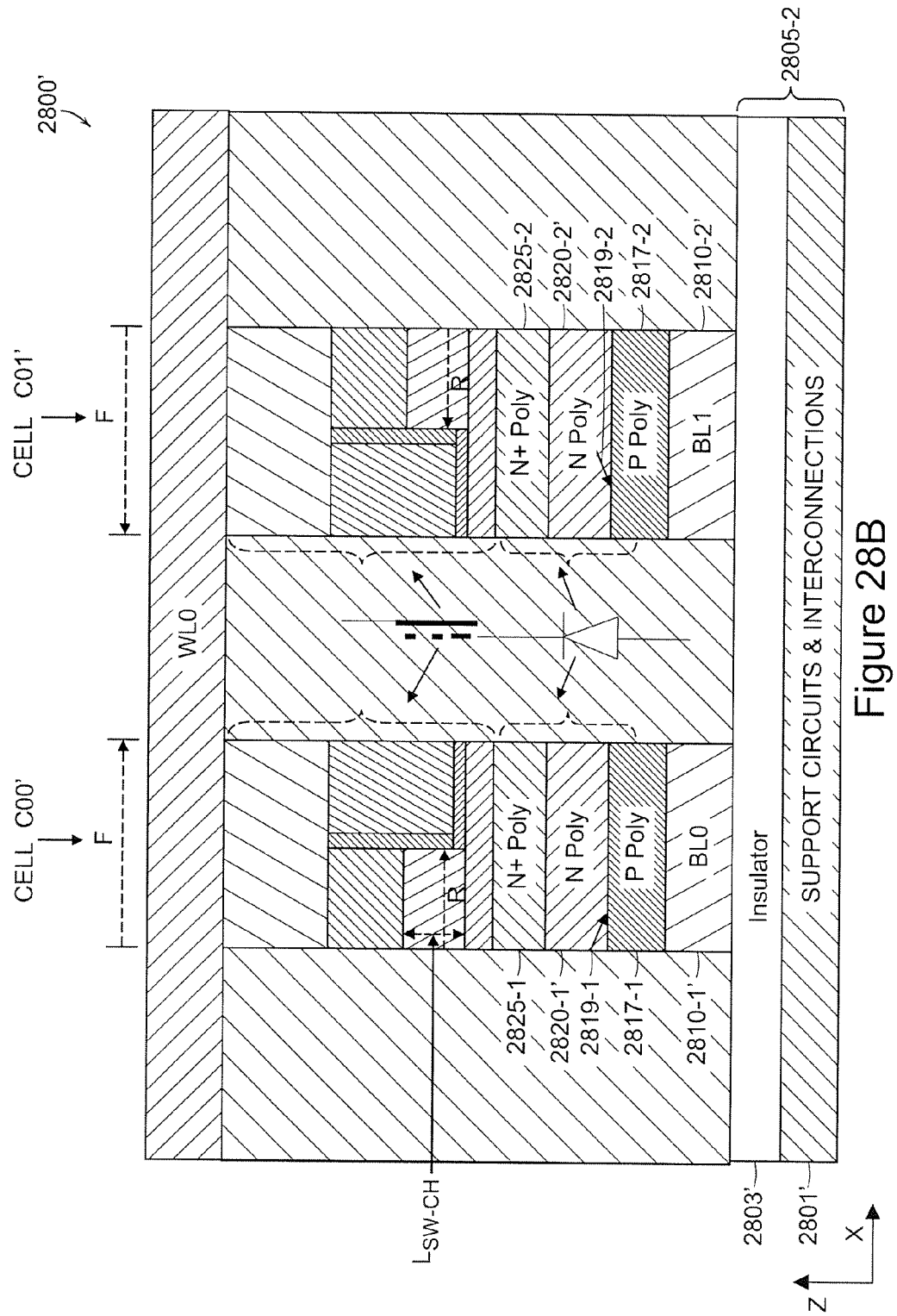
FIG. 28B illustrates a three dimensional cross section of an embodiment of a dense 3D cell structure formed with a cathode-to-nanotube nonvolatile nanotube diode with a PN diode in series with a vertically oriented nonvolatile nanotube switch within vertical cell boundaries.

Vertically oriented nanotube element placement R at approximately F/2 assumes nanotube film thickness that is much less than cell dimension F. For a 45 nm technology node, for example, a nanotube element in the thickness range of 0.5 nm to 10 nm, for example. Nanotube elements may be formed using a single nanotube layer, or may be formed using multiple layers. Such nanotube element layers may be deposited e.g., using spin-on coating techniques or spray-on coating techniques, as described in greater detail in the incorporated patent references. FIGS. 28A and 28B 3-D memory array structure embodiments and corresponding exemplary methods of fabrication illustrated with respect to FIGS. 34A-34FF show 3D array structures assuming vertically oriented nanotube elements placed at R, with R approximately equal to F/2. Such elements include a bottom contact, a sidewall contact, electrically separated by a vertically oriented nanotube element channel length $L_{SW-CH}$ as illustrated further below with respect to FIGS. 28A, 28B embodiments and corresponding FIG. 34A-34FF exemplary methods of fabrication.

In one possible variation, vertically oriented nanotube elements thickness may be too thick for placement at F/2 for cells with dimension F. For example, for a cell dimension F of 35 nm, for example, and a nanotube film thickness of 10-20 nm, placement of vertically oriented nanotube elements may be at F/3 for example, to accommodate both the nanotube element and a protective insulator as illustrated further below with respect to FIG. 39. Vertically oriented nanotube element with lower, sidewall, and upper contacts may still be used.

In another possible variation, a nanotube element thickness may be equal to the overall cell dimension F. For example, for a cell dimension F of 35 nm, a nanotube film thickness of 35 nm may be used. Or, for example, for a cell dimension F of 22 nm, a nanotube film thickness of 22 nm may be used. In this case the nanotube element contact structure may be modified such that the sidewall contact is eliminated and replaced by lower and upper contacts only as illustrated further below in FIG. 40. The thickness of the nanotube element need not be related in any particular way to the lateral cell dimension F.

In addition to the simultaneous definition of overall cell dimensions without multiple alignment steps, minimized memory cell size (area) also requires the self-aligned placement of device elements within said memory cell boundaries using sub-minimum dimensions, in this example, cell boundaries defined by isolation trenches. Cross sections 2800 and 2800' in FIGS. 28A and 28B, respectively, illustrate exemplary nonvolatile nanotube switches similar to cross section 750 illustrated in FIG. 7B, except that the nanotube channel element position R is self-aligned to isolation trenches that determine overall cell dimensions. Also, lower level, sidewall, and upper level contacts are all self-aligned and fit within isolation trench boundaries. Self-aligned placement of device elements within defined boundaries may be achieved by adapting sidewall spacer methods such as those disclosed in U.S. Pat. No. 4,256,514, the entire contents of which are incorporated herein by reference.

In some embodiments, methods fill trenches with an insulator and then planarize the surface. Then, methods deposit and pattern word lines on the planarized surface.

The fabrication of vertically-oriented 3D cells proceeds as follows, in some embodiments. Referring to FIG. 28A, methods deposit a bit line wiring layer on the surface of insulator 2803 having a thickness of 50 to 500 nm, for example, as described further below with respect to FIGS. 34A-34FF. Methods etch the bit line wiring layer and define individual bit lines such as bit line 2810-1 (BL0) and 2810-2 (BL1). Bit lines such as BL0 and BL1 are used as array wiring conductors and may also be used as anode terminals of Schottky diodes. Alternatively, more optimum Schottky diode junctions 2818-1 and 2818-2 may be formed using metal or silicide contacts 2815-1 and 2815-2 in contact with N polysilicon regions 2820-1 and 2820-2, while also forming ohmic contacts with bit lines 2810-1 and 2810-2 as described further below with respect to FIGS. 34A-34FF. N polysilicon regions 2820-1 and 2820-2 may be doped with arsenic or phosphorus in the range of $10^{14}$ to $10^{17}$ dopant atoms/cm$^3$ for example, and may have a thickness range of 20 nm to 400 nm, for example. Contacts 2815-1 and 2815-2 may be in the thickness range of 10 nm to 500 nm, for example.

In some embodiments, the electrical characteristics of Schottky (and PN) diodes may be improved (low leakage, for example) by controlling the material properties of polysilicon, for example polysilicon deposited and patterned to form polysilicon regions 2820-1 and 2820-2. Polysilicon regions may have relatively large or relatively small grain boundary size that are determined by methods used in the semiconductor regions. SOI deposition methods used in the semiconductor industry may be used that result in polysilicon regions that are single crystalline (no longer polysilicon), or nearly single crystalline, for further electrical property enhancement such as low diode leakage currents.

Examples of contact and conductors materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

In some cases conductors such as Al, Au, W, Cu, Mo, Ti, and others may be used as both contact and conductors materials as well as anodes for Schottky Diodes, in which case separate optional Schottky anodes contacts such as 2815-1 and 2815-2 are not required and may be omitted. However, in other cases, optimizing anode material for lower forward voltage drop and lower diode leakage is advantageous. Schottky diode anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by N G, K. K. "Complete Guide to Semiconductor Devices", Second Edition, John Wiley & Sons, 2002m pp. 31-41, the entire contents of which are incorporated herein by reference.

Next, having completed Schottky diode select devices, methods form N+ polysilicon regions 2825-1 and 2825-2 to contact N polysilicon regions 2820-1 and 2820-2, respectively, and also to form contact regions for ohmic contacts to contacts 2830-1 and 2830-2. N+ polysilicon is typically doped with arsenic or phosphorous to $10^{20}$ dopant atoms/$cm^3$, for example, and has a thickness of 20 to 400 nm, for example.

Next, methods form a nonvolatile nanotube switch in each cell having one terminal common with cathode contacts 2830-1 and 2830-2 for example. In order to enhance the density of cells C00 and C01, the nanotube elements illustrated in FIG. 28A may be at least partially vertically oriented as illustrated in FIG. 7. Vertically oriented nanotube switches are described in greater detail in the incorporated patent references. Vertically oriented sidewalls including insulating and contact regions are formed prior to forming vertically oriented nanotube elements 2845-1 and 2845-2. Vertically oriented sidewalls are formed using self aligned methods at position R approximately equal to F/2. However, similar self aligned methods of fabrication may be used to place the vertically oriented sidewalls at any location, such as F/3, F/4, or any other desired location.

Methods of forming nanotube elements 2845-1 and 2845-2 can include first forming insulators 2835-1 and 2835-2 and sidewall contacts 2840-1 and 2840-2, in contact with corresponding insulators 2835-1 and 2835-2, by directionally etching an opening through both metal and insulator regions to form vertical sidewalls. The thickness of insulators 2835-1 and 2835-2 determine the nanotube element channel length as illustrated in FIG. 28A. Insulator 2835-1 and 2835-2 may range from less than 5 nm to greater than 250 nm. Vertical sidewalls of insulators 2835-1 and 2835-2 and sidewall contacts 2840-1 and 2840-2 are self aligned with respect to trench sidewalls that are etched later in the process using methods of fabrication described further below with respect to FIGS. 34A-34FF.

Next, methods form conformal nanotube elements 2845-1 and 2845-2 as described in greater detail in the incorporated patent references.

Then, methods form protective conformal insulator 2850-1 and 2850-2 on the surface of conformal nanotube elements 2845-1 and 2845-2, respectively.

Next, methods form an opening having an X dimension of approximately F and methods fill that opening with a conductor material forming upper level contacts 2865-1 and 2865-2 in contact with sidewall contacts 2840-1 and 2840-2, respectively. Methods to form upper level contacts 2865-1 and 2865-2 may be similar to methods disclosed in U.S. Pat. No. 4,944,836 and described further below with respect to FIGS. 34A-34FF.

Contacts 2865-1 and 2865-2 provide a conductive path between sidewall contacts 2840-1 and 2840-2, respectively, and word line 2871 (WL0) to be formed after completing the formation of cells C00 and C01.

Next, prior to the formation of word line 2871 (WL0), cell C00 and cell C01 dimensions can be defined by a trench etch through all layers in cell structure 2800, down to the top surface of insulator 2803.

Next, methods fill trench regions with an insulator 2860 and planarize the structure just prior to word line 2871 (WL0) deposition.

Then, methods deposit and pattern word line 2871 (WL0).

Nonvolatile nanotube diode 2880 schematic superimposed on cross section 2800 in FIG. 28A is an equivalent circuit that corresponds to nonvolatile nanotube diode 1200 in FIG. 12, one in each of cells C00 and C01. Cells C00 and C01 illustrated in cross section 2800 in FIG. 28A correspond to corresponding cells C00 and C01 shown schematically in memory array 2610 in FIG. 26A, and bit lines BL0 and BL1 and word line WL0 correspond to array lines illustrated schematically in memory array 2610.

Cross sectional view 2800' illustrated in FIG. 28B shows embodiments of memory array cells C00' and C01' that are similar to memory array cells C00 and C01 illustrated in FIG. 28A, except that NV NT Diodes C00' and NV NT Diodes C01' formed in corresponding cells C00' and C01' include a PN diodes having PN diode junctions 2819-1 and 2819-2 instead of a Schottky diodes having a Schottky diode junctions 2818-1 and 2818-2.

P polysilicon regions 2817-1 and 2817-2 form a diode-anode and N polysilicon regions 2820-1' and 2820-2' form a diode cathode that together (combined) form PN diodes with PN diode junctions 2819-1 and 2819-2. P polysilicon regions 2817-1 and 2817-2 also form ohmic or near-ohmic contacts with bit lines 2810-1' (BL0) and 2810-2' (BL1), respectively. N polysilicon regions 2820-1' and 2820-2' also form ohmic contact regions with N+ polysilicon regions 2825-1 and 2825-2. Other structures of cells C00' and C01' are similar to those illustrated and described with respect to cells C00 and C01, respectively.

Memory array support structure 2805-2 illustrated in FIG. 28B includes support circuits and interconnections 2801' and planarized insulator 2803' which are similar to memory support structure 2801 illustrated in FIG. 28A except for adjustments that may be required to accommodate memory cells having PN diode select means instead of Schottky diode select means.

Figure 28C:
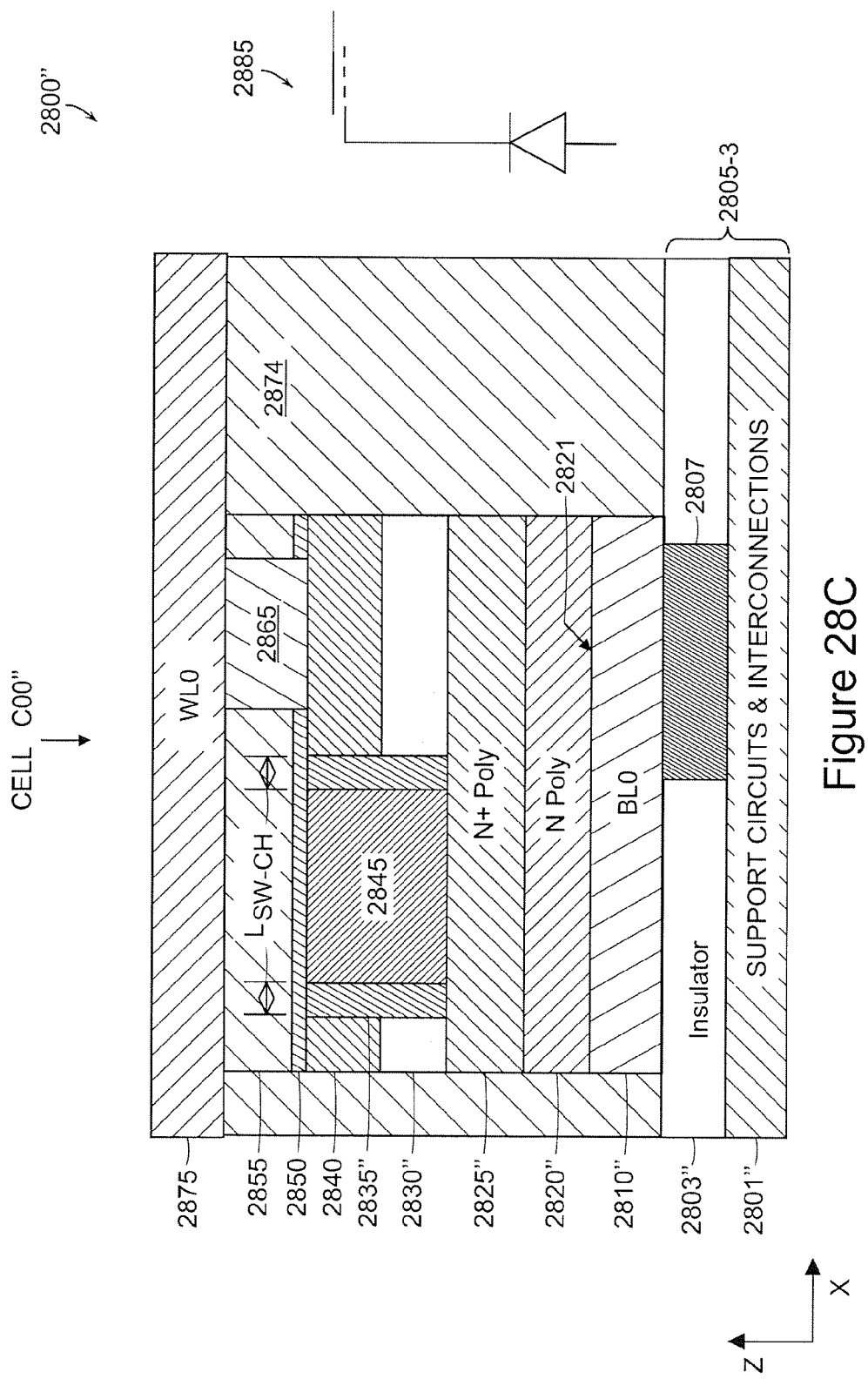
FIG. 28C illustrates a three dimensional cross section of an embodiment of a dense 3D cell structure formed with a cathode-to-nanotube nonvolatile nanotube diode with a Schottky diode in series with a horizontally oriented nonvolatile nanotube switch within vertical cell boundaries.

3-Dimensional Cell Structure of Nonvolatile Cells Using NV NT Devices Having Vertically Oriented Diodes and Horizontally Oriented NT Switches with Cathode-to-NT Switch Connection Methods 2720 illustrated in FIG. 27B can be used to deposit and planarize metal, polysilicon, insulator, and nanotube elements to form nonvolatile nanotube diodes with multiple vertically oriented diode and horizontally oriented nonvolatile nanotube switch series pairs as illustrated by cross section 2800" in FIG. 28C.

Cell C00" in the embodiment of FIG. 28C is formed on memory array support structure 2805-3, which includes support circuits and interconnections 2801" and planarized insulator 2803". Support circuits and interconnections 2801" is similar to support circuits and interconnections 2801 and planarized insulator 2803" is similar to planarized insulator 2803 in FIG. 28A, except for adjustments needed to accommodate differences in cell C00" with respect to cell C00. Also, cross section 2800" includes filled-via contact (stud) 2807 that interconnects bit line 2810" (BL0) with support circuits and interconnections 2801" circuits as illustrated in cross section 2800" of FIG. 28C. For example, filled via contact (stud) 2807 may connect bit line BL0 illustrated schematically in FIG. 26A with BL driver and sense circuits 2640.

Individual outer cell dimensions can be formed in a single etch step, each cell having a single NV NT Diode defined by a single trench etch step after layers, except the WL0 layer, have been deposited and planarized, in order to eliminate accumulation of individual layer alignment tolerances that may substantially increase cell area. Individual cell dimensions in the X direction are 2-3 F (1F is minimum feature) as illustrated in FIG. 28C because horizontal nonvolatile nanotube switch orientation typically require more area than nonvolatile nanotube switches having a vertical orientation such as those illustrated in FIGS. 28A and 28B. Minimum Y direction (orthogonal to the X direction, not shown), dimensions of 1F in the Y direction are possible. Using cell periodicity in the X direction of 3-4F and periodicity in the Y direction of 2F, in some embodiments each cell occupies an area in the range of 6-8F$^2$ or larger. After trench fill with an insulator followed by planarization, word lines such as word line 2875 are deposited and patterned.

Cross section 2800" illustrated in FIG. 28C shows an embodiment of a memory array cell C00" that is similar to the memory array cell embodiment C00 illustrated in FIG. 28A, except that NV NT diode C00" forming cell C00" includes a horizontally oriented nonvolatile nanotube switch instead of the vertically oriented nonvolatile nanotube switch illustrated in cross section 2800 in FIG. 28A.

In FIG. 28C, cross section 2800" cell C00" select Schottky diode includes Schottky diode junction 2821 corresponding to Schottky diode junction 2818-1 in cross section 2800 of FIG. 28A. Schottky diode junction 2821 is formed by bit line 2810" (BL0) forming the anode and N polysilicon 2820" forming the cathode. An optional additional metal contact such as metal contact 2815-1 is not shown in cross section 2800" but may be added. N+ polysilicon region 2825" is added for contact to N polysilicon region 2820" and corresponds to N+ polysilicon region 2825-1 in FIG. 28A.

Methods can be used fabricate a nonvolatile nanotube switch having a horizontal (instead of a vertical) orientation and having one side of the nonvolatile nanotube switch in electrical (not physical) contact with N+ polysilicon region 2825" and the other side of the nonvolatile nanotube switch in electrical (not physical) contact with word line 2875.

First, methods deposit insulator 2830" and contact 2835". Then methods form an opening through both contact 2835" and insulator 2830" to expose the surface of N+ polysilicon region 2825".

Next, methods deposit a conformal insulating layer on the top, sidewall, and bottom of the underlying opening. Then, methods directional etch the conformal insulating layer thereby forming sidewall spacer 2840, whose thickness determines the channel length $L_{SW-CH}$ of the nonvolatile nanotube switch in cell C00". Cross section 2800" shows two $L_{SW-CH}$ regions. These two $L_{SW-CH}$ regions are electrically in parallel (not shown by cross section 2800"). Exemplary methods of fabrication are described further below with respect to FIGS. 35A-S.

Next, methods fill the opening with contact metal, followed by planarization, to form contact 2845, which forms an Ohmic contact to N+ polysilicon region 2825" and is isolated from contact 2835" regions by sidewall spacer 2840.

Next, methods deposit nanotube element 2850 on and in physical and electrical contact with contact 2845, spacers 2840, and sidewall contact 2835". The separation between contact 2845 and contact 2835", which is formed by the thickness of sidewall spacer 2840, determines the nonvolatile nanotube switch channel length $L_{SW-CH}$. Nanotube element 2850 may optionally be patterned as illustrated in FIG. 28C, or may be patterned as part of a later trench etch that determines final cell C00" dimensions. Exemplary methods of fabrication are described further below with respect to FIGS. 35A-35S.

Next, methods deposit insulator 2855.

Next, methods etch insulator 2855 forming an opening. Then, methods etch (remove) the exposed portion of nanotube element 2850, e.g., as described in greater detail in the incorporated patent references.

Next, the opening is filled with contact metal 2865. Methods form contact metal 2865 by metal deposition followed by planarization. Contact 2865 physically and electrically contacts both contact 2835" and nanotube element 2850.

Next, methods etch a trench through all layers, stopping on the surface of insulator 2803", thereby defining the dimensions of cell C00"

Next, methods deposit and planarize an insulating layer forming insulator 2874.

Then, methods deposit and pattern word line 2875 (WL0) completing cell C00". Exemplary methods of fabrication are described further below with respect to FIGS. 35A-35S.

Nonvolatile nanotube diode embodiment 2885 in FIG. 28C is an equivalent circuit that corresponds to nonvolatile nanotube diode 1200 in FIG. 12 in cell C00". Cell C00" corresponds to corresponding cell C00 shown schematically in the embodiment of the memory array 2610 illustrated in FIG. 26A, and bit line BL0 and word line WL0 correspond to array lines illustrated schematically in memory array 2610.

Nonvolatile Memories Using NV NT Diode Devices with Anode-to-NT Switch Connection In some embodiments, a nonvolatile nanotube diode (NV NT diode) is a two terminal nonvolatile device formed by two series devices, a diode (e.g., a two terminal Schottky or PN diode) in series with a two terminal nonvolatile nanotube switch (NV NT switch). Each of the two said series devices has one shared series electrical connection. An anode-to-nanotube NV NT diode has the anode terminal electrically connected to one of said two nonvolatile nanotube switch terminals. Said NV NT diode two terminal nonvolatile device has one available terminal connected to the cathode of the Schottky or PN diode and the second available terminal connected to the free terminal of the NV NT switch. A schematic of an anode-to-NT nonvolatile nanotube diode is illustrated in FIG. 13. PIN diodes, FET diodes, and other diode types may also be used.

In some embodiments, dense 3D memories may be formed using one NV NT diode per cell. Embodiments of memories using NV NT diodes with anode-to-NT connections are illustrated schematically and memory operation is described further below. Exemplary 3-D cell structures are illustrated including fabrication methods. Exemplary cells with NV NT diodes formed with NV NT switches with vertically orientated switches are illustrated further below.

Nonvolatile Systems and Circuits, with Same

One embodiment of a nonvolatile memory 2900 is illustrated in FIG. 29A. Memory 2900 includes memory array 2910 having cells C00 through C33 formed using nonvolatile nanotube diodes similar to nonvolatile nanotube diode 1300 (NV NT Diode 1300) formed using diode-anode-to-nonvolatile nanotube switch terminal connection such as that illustrated in FIG. 13. A diode similar to diode 1305 of NV NT Diode 1300 is used as a cell select device and a nonvolatile storage switch similar to NV NT Switch 1310 of NV NT Diode 1300 is used to store a nonvolatile ON (low resistance) state or a nonvolatile OFF (high resistance) state. ON and OFF states represent nonvolatile logic "1" or "0" states, respectively. Note that logic "1" and logic "0" state assignments with respect to low and high resistance states are arbitrary and may be reversed, for example.

Nonvolatile memory 2900 illustrated in FIG. 29A includes memory array 2910 having a matrix of NV NT Diode cells C00 through C33 similar to NV NT Diode 1300 as explained further above. Nonvolatile cell C00, as other cells in the array, includes one NV NT Diode referred to as NV NT Diode C00 which is similar to NV NT Diode 1300 illustrated further above. The cathode of NV NT Diode C00 is connected to word line WL0, and the other terminal of NV NT Diode C00, a NV NT Switch terminal, is connected to bit line BL0.

In the illustrated embodiment, memory array 2910 is a 4-word line by 4-bit line 16 bit memory array that includes word lines WL0, WL1, WL2, and WL3 and bit lines BL0, BL1, BL2, and BL3. Word line driver circuits 2930 connected to word lines WL0 through WL3 and selected by word decoder and WL select logic 2920 provide stimulus during write 0, write 1, and read operations. BL driver and sense circuits 2940 that provide data MUXs, BL drivers and sense amplifier/latches are connected to bit lines BL0 through BL3 and selected by bit decoder and BL select logic 2950 provide stimulus during write 0, write 1, and read operation; that is receive data from memory array 2910 and transmit data to memory array 2910. Data in memory array 2910 is stored in a nonvolatile state such that power (voltage) supply to memory 2900 may be removed without loss of data. BL driver and sense circuits 2940 are also connected to read/write buffer 2960. Read/write buffer 2960 transmits data from memory array 2910 to read/write buffer 2960 which in turn transmits this data off-chip. Read/write buffer 2960 also accepts data from off-chip and transmits this data to BL driver and sense circuits 2940 that in turn transmit data to array 2910 for nonvolatile storage. Address buffer 2970 provides address location information.

Note that while FIG. 29A illustrates a 4×4 memory array 2910, the array can be made arbitrarily large(e.g., to form an ~8 kB array), and the associated electronics modified appropriately.

For an exemplary write 0 operation along word line WL0, simultaneously erasing cells C00, C01, C02, and C03, data stored in cells C00-C03 may optionally be read prior to erase and data stored in corresponding sense amplifier/latches. Write 0 operation along word line WL0 proceeds with bit lines BL0, BL1, BL2, and B3 transitioning from zero to 5 volts, with bit line drivers controlled by corresponding BL drivers in BL driver and sense circuits 2940. Next, WL driver circuits 2930 drive word line WL0 from 5 volts to zero volts thus forward biasing NV NT Diodes C00, C01, C02, and C03 that form cells C00, C01, C02, and C03, respectively. A write 0 voltage of approximately 4.5 volts (write 0 voltage 5 volts minus NV NT diode turn on voltage of less than 0.5 volts) results in a transition from an ON state to an OFF state for NV NT Diodes in an ON state; NV NT Diodes in an OFF state remain in an OFF state. Thus after a write 0 operation along word line WL0, NV NT Diodes C00-C03 are all in an OFF state. Unselected word lines WL1, WL2, and WL3 all remain unselected and at 5 volts, and nonvolatile data stored in corresponding cells remains unchanged.

In this example, a write operation is preceded by a write 0 operation as described further above. In other words, NV NT Diodes C00-C03 of respective corresponding cells C00-C03 begin the write operation in the OFF state. For an exemplary write 0 operation to cell C00 for example, in which a logic 0 state is to be stored, NV NT Diode C00 is to remain in the logic 0 high resistance state. Therefore, bit line BL0 is held at zero volts by corresponding BL driver and sense circuits 2940. Next, word line WL0 transitions from 4 volts to zero volts, with stimulus from WL drivers 2930. NV NT Diode C00 remains back biased during the write 0 operation and cell C00 remains in an OFF (high resistance) logic 0 state.

If NV NT Diode C00 is to transition from an OFF (high resistance state) to an ON (low resistance state) in a write 1 operation representing a logic 1, then bit line BL0 transitions from zero volts to 4 volts, with stimulus provided by corresponding BL drivers in BL driver and sense circuits 2940. Next, word line WL0 transitions from 4 volts to zero volts. A write 1 voltage of approximately 4 volts results in a voltage of 3.5 volts across the terminals of a corresponding NV NT switch sub-component of NV NT diode C00 (4 volts minus NV NT diode turn on voltage of less than 0.5 volts) results in a transition from an OFF state to an ON state for NV NT Diode C00.

For an exemplary read operation, from cells C00-C03 for example, the bit line drivers in BL driver and sense circuits 2940 precharge bit lines BL0-BL3 to a high voltage such as a read voltage of 2 volts, for example. The read bit line voltage is selected to be less than both write 0 and write 1 voltages to ensure that stored logic states (bits) are not disturbed (changed) during a read operation. Word line driver circuits 2930 drives word line WL0 from 2 volts to zero volts. If NV NT Diode C00 in cell C00 is in an OFF state (storing a logic 0), then bit lines BL0 is not discharged and remains at 2 volts. A corresponding sense amplifier/latch in BL driver and sense circuits 2940 stores a logic 0. However, if NV NT Diode C00 in cell C00 is in an ON state, then bit line BL0 is discharged. A corresponding sense amplifier/latch in BL driver and sense circuits 2940 detects the reduced voltage and latches a logic 1.

Figure 29B:
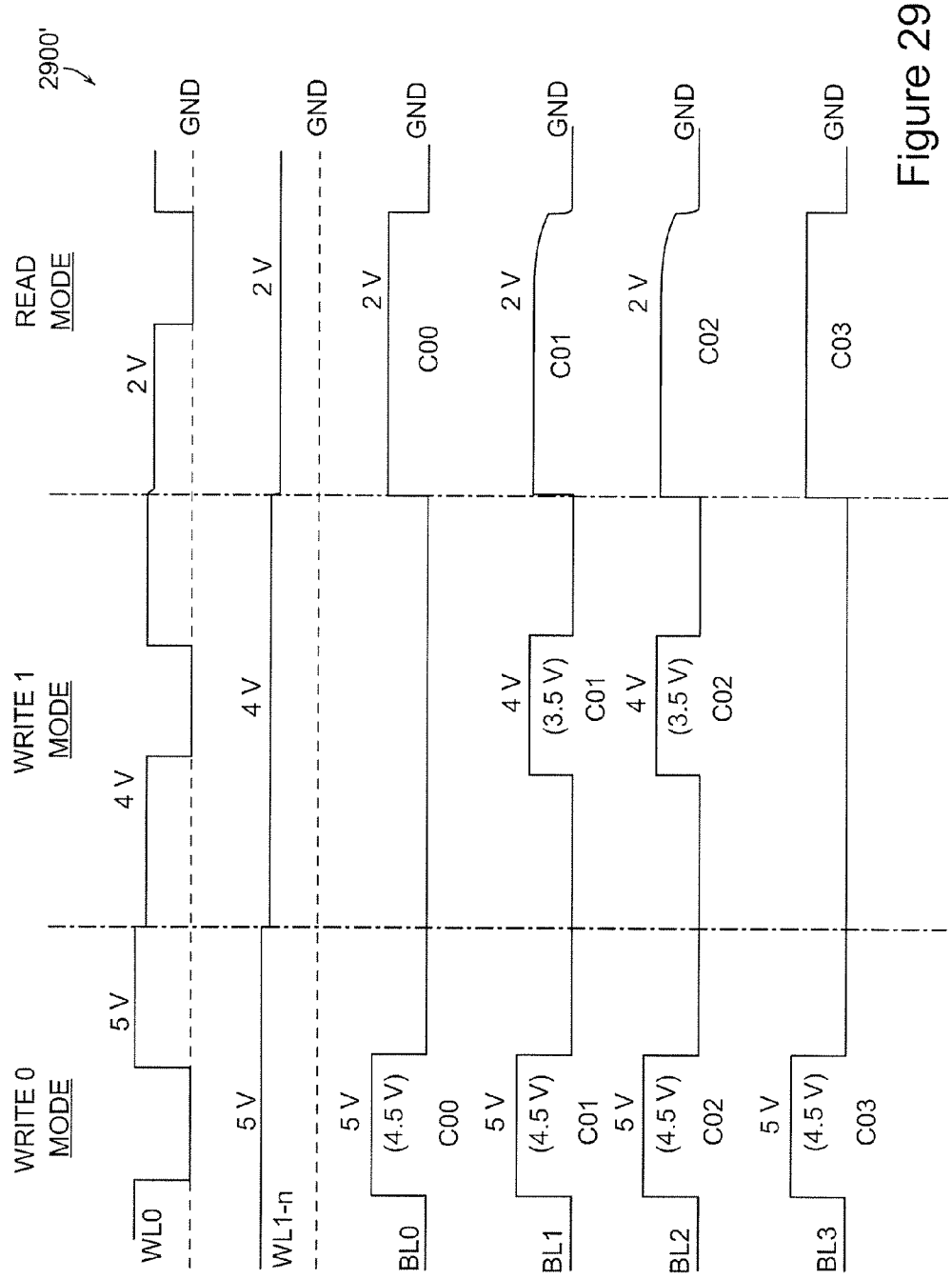
FIG. 29B illustrates operational waveforms for the memory illustrated in FIG. 29A, according to some embodiments.

FIG. 29B illustrates examples of operational waveforms 2900' that may be applied to the embodiment of memory 2900 illustrated in FIG. 29A during write 0, write 1, and read operations (or modes). A pre-write 0 read operation may optionally be performed before a write 0 operation in order to record cell states along a selected word line, such as word line WL0, in corresponding latches. Cells C00, C01, C02, and C03 receive write 0 pulses (nearly) simultaneously. At the beginning of an write 0 operation, bit lines BL0, BL1, BL2, and BL3 transition from zero to 5 volts as illustrated by waveforms 2900' in FIG. 29B. Next, word line WL0 transitions from 5 volts to zero volts thereby forward-biasing NV NT Diodes C00-C03. Approximately 4.5 volts appears across the respective NV NT Switches in each of the NV NT Diodes because of a less than 0.5 volt forward-bias voltage drop. If the write 0 voltage of corresponding NV NT Switch is 4.5 volts (or less), then NV NT Diodes transition from an ON (low resistance) state to an OFF (high resistance) state; NV NT Diodes in an OFF state remain in an OFF state. Thus after a write 0 operation along word line WL0, NV NT Diodes C00-C03 are all in an OFF state. Unselected word lines WL1, WL2, and WL3 all remain unselected and at 5 volts.

In this example, a write operation is preceded by a write 0 operation as described further above with respect to FIG. 29A. In other words, for cells along word line WL0, NV NT Diodes C00-C03 are in an OFF state at the beginning of the write operation. For exemplary write operations illustrated by waveforms 2900', NV NT Diodes C00 and C03 are to remain in the OFF state for a write 0 operation, and NV NT Diodes C01 and C02 are to transition from an OFF state to an ON state in a write 1 operation.

Therefore, at the beginning of the write (program) cycle, bit lines BL0 and BL3 remain at zero volts. Next, word line WL0 transitions from 4 volts to zero volts. NV NT Diodes C00 and C03 remain back biased during the write 0 operation, and therefore NV NT Diodes remain in the OFF state storing a logic 0 state.

Continuing the exemplary write cycle, cells C01 and C02 transition from an OFF to an ON state. Bit lines BL1 and BL2 transition from zero to 4 volts. Next, word line WL0 transitions from 4 volts to zero volts. NV NT Diodes C01 and C02 are forward biased during the write 1 operation and approximately 3.5 volts appear across NV NT Switches corresponding to NV NT Diodes C01 and C02. NV NT Diodes C01 and C02 transition from an OFF to an ON state storing a logic 1 state.

For an exemplary read operation as illustrated by waveforms 2900' in FIG. 29B, bit lines BL0, BL1, BL2, and BL3 are precharged to 2 volts, for example, and allowed to float. Then word line WL0 transitions from 2 volts to zero volts. Word lines WL1, WL2, and WL3 remain at 2 volts. For cells C00 and C03, bit line BL0 and BL3 voltage remains unchanged because NV NT Diodes C00 and C03 are in an OFF or high resistance state and bit line BL0 and BL3 capacitance cannot discharge to ground (zero volts). However, for cells C01 and C02, bit lines BL1 and BL2 discharge toward zero volts because NV NT Diodes C01 and C02 are in an ON or low resistance state and bit line capacitance for BL1 and BL2 can discharge toward ground (zero volts). For BL1 and BL2, corresponding sense amplifier/latches typically detect bit line voltage reduction in the 100 mV to 200 mV range, although this value may vary depending upon the particular characteristics (design) of the sense/latch circuit. Corresponding sense amplifier/latches in BL driver and sense circuits 2940 determine that BL1 and BL2 read voltages have changed and latch a logic 1 state corresponding to the ON state of NV NT Diodes C01 and C02 that form cells C01 and C02. Corresponding sense amplifier/latches in BL driver and sense circuits 2940 determine that BL0 and BL3 have not changed and latch a logic 0 state corresponding to the OFF state of NV NT Diodes C00 and C03 forming cells C00 and C03.

Figure 30A:
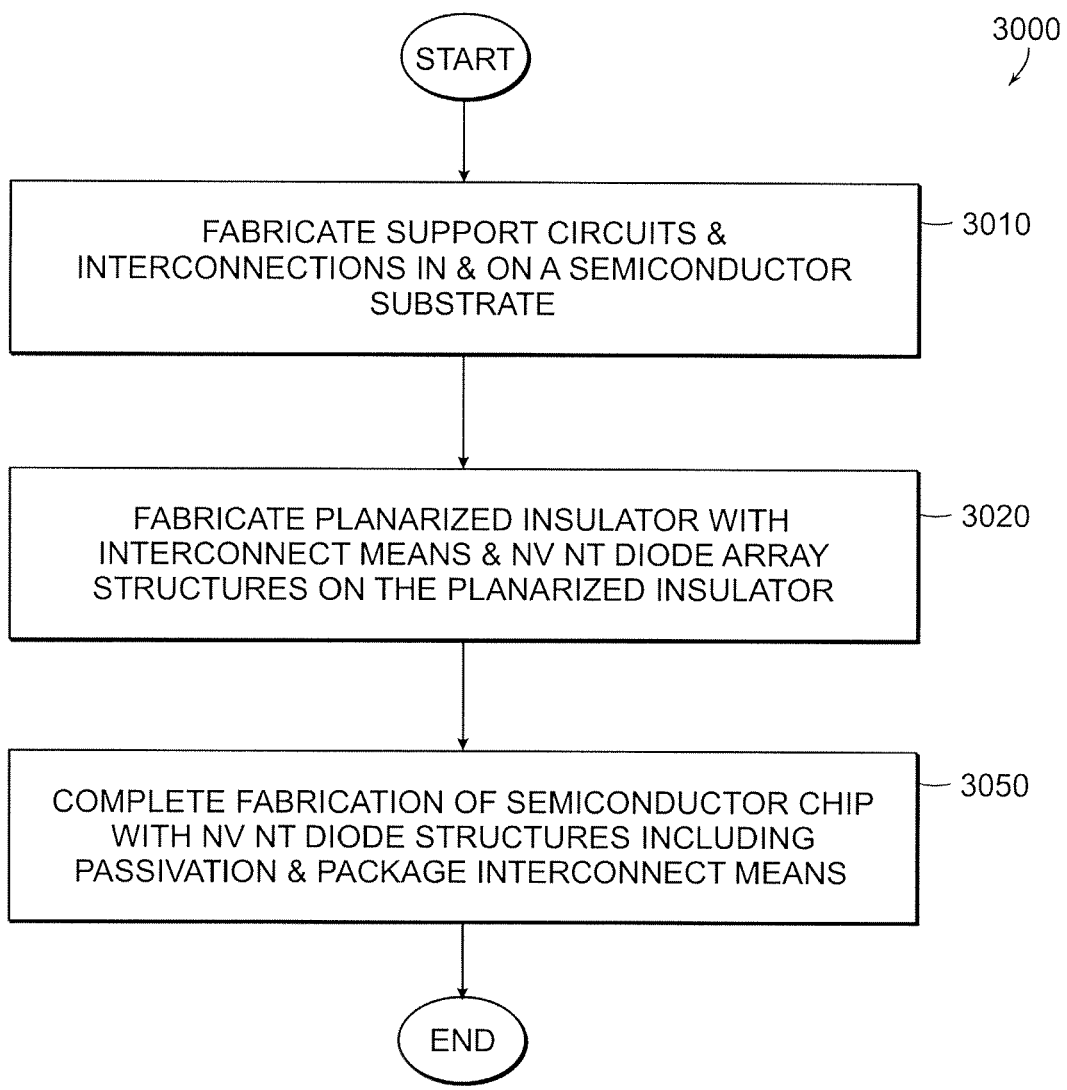
FIGS. 30A-30B illustrate methods of fabrication of memory cells using nonvolatile nanotube diodes similar to those illustrated schematically in FIG. 13, according to some embodiments.

3-Dimensional Cell Structure of Nonvolatile Cells Using NV NT Devices Having Vertically Oriented Diodes and Vertically Oriented NT Switches with Anode-to-NT Switch Connection FIG. 30A illustrates an exemplary method 3000 of fabricating embodiments of NV NT diodes having vertically oriented NT switches. While method 3000 is described further below with respect to nonvolatile nanotube diodes 1300 such as illustrated in FIG. 13, method 3000 is sufficient to cover the fabrication of many of the nonvolatile nanotube diode embodiments described further above. Note also that although methods 3000 are described below in terms of memory embodiments, methods 3000 may also be used to form logic embodiments based on NV NT diodes arranged as logic arrays such as NAND and NOR arrays with logic support circuits as used in PLAs, FPGAs, and PLDs, for example.

In general, methods 3010 fabricate support circuits and interconnections in and/or on a semiconductor substrate. This includes NFET and PFET devices having drain, source, and gate that are interconnected to form memory support circuits such as, for example, circuits 2920, 2930, 2940, 2950, 2960, and 2970 illustrated in FIG. 29A. Such structures and circuits may be formed using known techniques that are not described in this application. Methods 3010 can be used to form a base layer using known methods of fabrication in and on which nonvolatile nanotube diode control devices and circuits are fabricated.

Methods 3020 fabricate an intermediate structure including a planarized insulator with interconnect means and nonvolatile nanotube array structures on the planarized insulator surface. Interconnect means include vertically-oriented filled contacts, or studs, for interconnecting memory support circuits in and on a semiconductor substrate below the planarized insulator with nonvolatile nanotube diode arrays above and on the planarized insulator surface.

Word lines and bit lines can be used in 3D array structures as described further below to interconnect 3-D cells and form 3-D memories, and can be approximately orthogonal in an X-Y plane approximately parallel to underlying memory support circuits. Word line direction has been arbitrarily assigned as along the X axis and bit line direction has arbitrarily assigned as along the Y axis in figures illustrating exemplary 3D array structures and 3D array structure methods of fabrication as described further below. The Z axis, approximately orthogonal to the X-Y plane, indicates the direction of 3D cell orientation.

Methods 3050 use industry standard fabrication techniques to complete fabrication of the semiconductor chip by adding additional wiring layers as needed, and passivating the chip and adding package interconnect means.

Figure 31A:
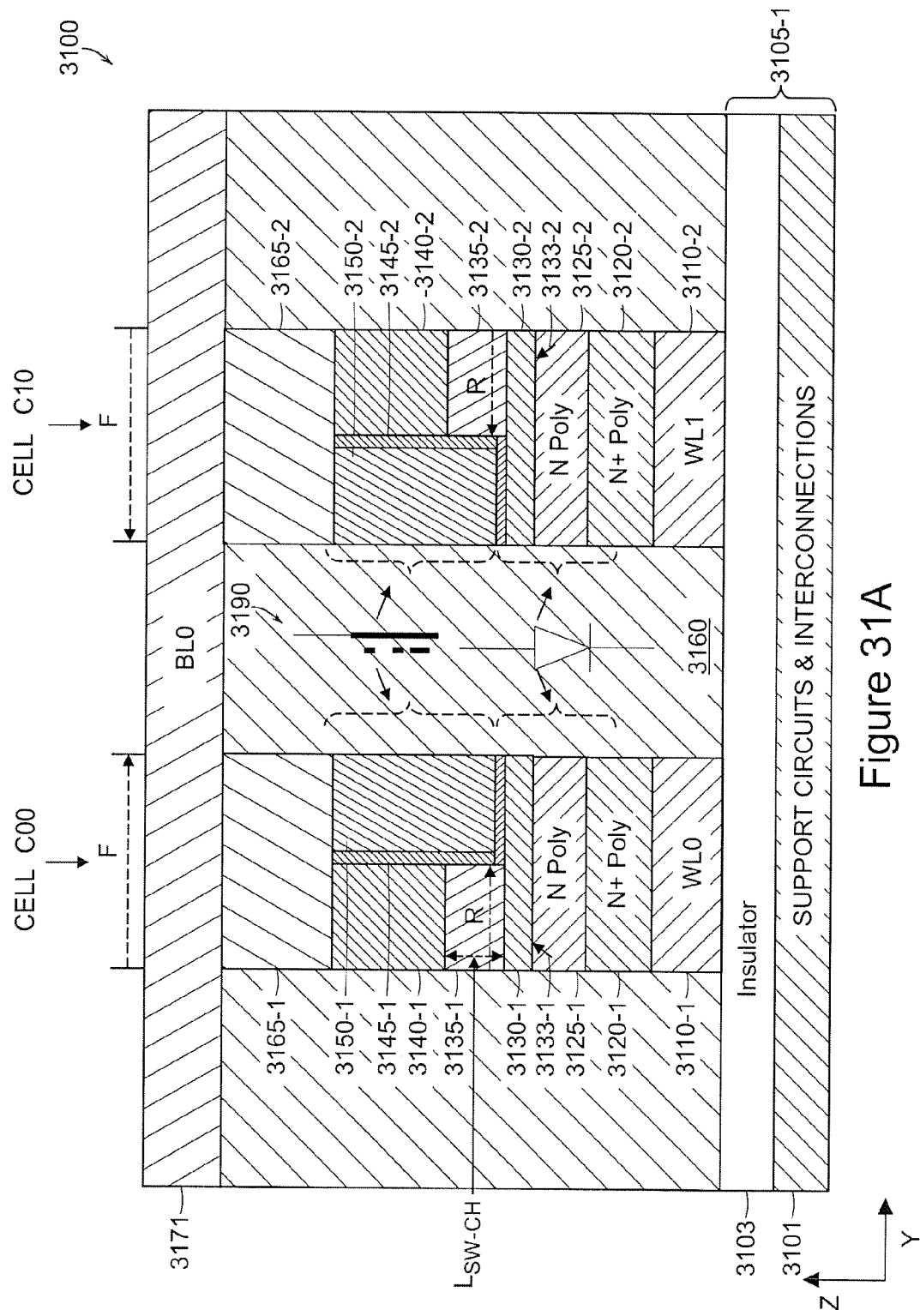
FIG. 31A illustrates a three dimensional cross section of an embodiment of a dense 3D cell structure formed with an anode-to-nanotube nonvolatile nanotube diode with a Schottky diode in series with a vertically oriented nonvolatile nanotube switch within vertical cell boundaries.

Once support circuits and interconnections in and on the semiconductor substrate are defined, methods then fabricate nonvolatile nanotube diode array such as that illustrated in cross section 3100 above the support circuit and interconnect region as illustrated in FIG. 31A. FIG. 31A illustrates a cross section including cells C00 and C10 in one of several possible embodiments.

Methods 3010 described further above are used to define support circuits and interconnections 3101.

Figure 30B:
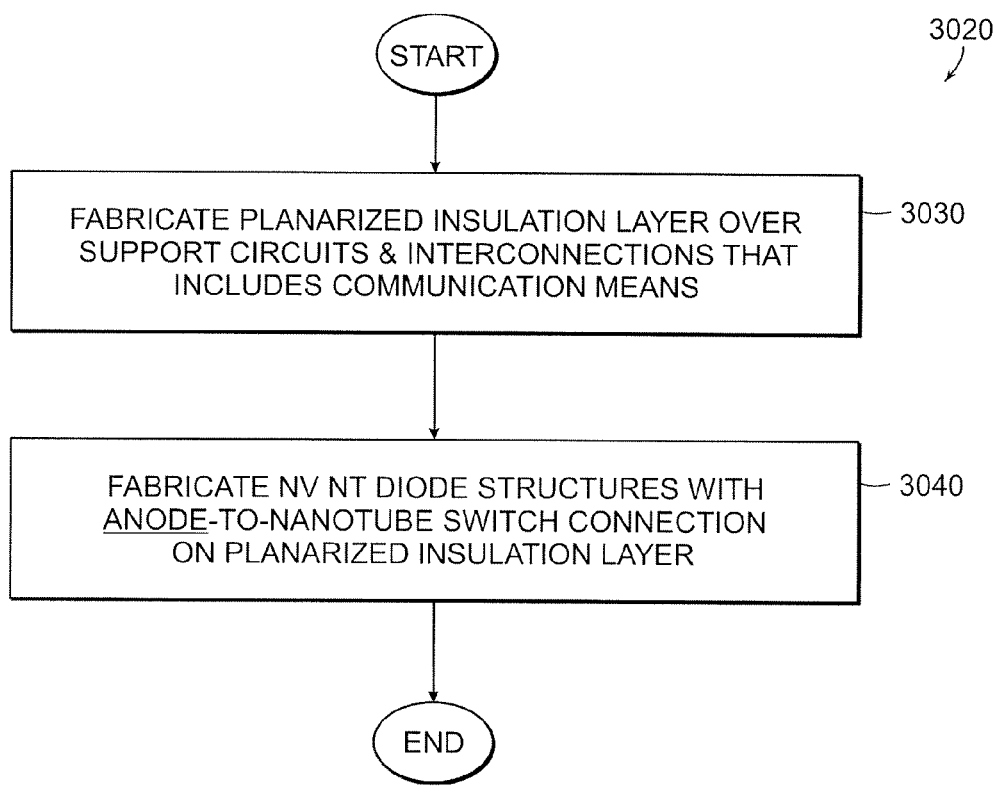

Next, methods 3030 illustrated in FIG. 30B deposit and planarize insulator 3103. Interconnect means through planar insulator 3103 (not shown in cross section 3100 but shown further above with respect to cross section 2800" in FIG. 28C) may be used to connect wiring metal lines in arrays to corresponding support circuits and interconnections 3101. By way of example, word line drivers in WL drivers 2930 may be connected to word line WL0 in array 2910 of memory 2900 illustrated in FIG. 29A. At this point in the fabrication process, methods may be used to form a memory array on the surface of insulator 3103, interconnected with of memory array support structure 3105-1 illustrated in FIG. 31A.

Methods 3040 illustrated in FIG. 30B deposit and planarize metal, polysilicon, insulator, and nanotube elements to form nonvolatile nanotube diodes which, in this example, include multiple vertically oriented diode and vertically oriented nonvolatile nanotube switch series pairs. Fabrication methods are described in more detail further below with respect to FIG. 36A-36FF. Individual cell outer dimensions can be formed in a single etch step, each cell having a single NV NT Diode defined by a single trench etch step after layers, except the BL0 layer, have been deposited and planarized, in order to eliminate accumulation of individual layer alignment tolerances that may substantially increase cell area. Individual cell dimensions in the Y direction are 1F (1 minimum feature) as illustrated in FIG. 31A, and also 1F in the X direction (not shown) which is orthogonal to the Y direction, with a periodicity in X and Y direction of 2F. Hence, each cell occupies an area of at least approximately 4F². Nonvolatile nanotube diodes that form each cell are oriented in the Z (vertical) direction.

In addition to the simultaneous definition of overall cell dimensions without multiple alignment steps, in some embodiments reduced memory cell size (area) also requires the self-aligned placement of device elements within said memory cell boundaries.

Methods fill trenches with an insulator and then methods planarize the surface. Methods deposit and pattern bit lines on the planarized surface.

The fabrication of some embodiments of vertically-oriented 3D cells proceeds as follows. Methods deposit a word line wiring layer on the surface of insulator 3103 having a thickness of 50 to 500 nm, for example, as described further below with respect to FIGS. 36A-36FF. Methods etch the word line wiring layer and define individual word lines such as word lines 3110-1 (WL0) and 3110-2 (WL1). Word lines such as 3110-1 and 3110-2 are used as array wiring conductors and may also be used as individual cell contacts to N+ polysilicon regions 3120-1 and 3120-2. N+ polysilicon regions 3120-1 and 3120-2 contact cathodes formed by N polysilicon regions 3125-1 and 3125-2. Schottky diode junctions 3133-1 and 3133-2 may be formed using metal or silicide 3130-1 and 3130-2 regions in contact with N Polysilicon regions 3125-1 and 3125-2. N Polysilicon regions 3125-1 and 3125-2 may be doped with arsenic or phosphorus in the range of $10^{14}$ to $10^{17}$ dopant atoms/cm³ for example, and may have a thickness range of 20 nm to 400 nm, for example. N+ polysilicon is typically doped with arsenic or phosphorous to $10^{20}$ dopant atoms/cm³, for example, and has a thickness of 20 to 400 nm, for example.

Examples of contact and conductors materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

In some cases conductors such as Al, Au, W, Cu, Mo, Ti, and others may be used as anodes 3130-1 and 3130-2 for Schottky Diodes. However, in other cases, optimizing anode 3130-1 and 3130-2 material for lower forward voltage drop and lower diode leakage is advantageous. Schottky diode anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by N G, K. K. "Complete Guide to Semiconductor Devices", Second Edition, John Wiley & Sons, 2002m pp. 31-41, the entire contents of which are incorporated herein by reference.

At this point in the exemplary process Schottky diode select devices have been formed. Next, one nonvolatile nanotube switch is formed in each cell having one terminal common with anode metal 3130-1 and 3130-2 for example. In order to enhance the density of cells C00 and C10, the nanotube element in the corresponding nonvolatile nanotube switch is vertically oriented as illustrated in FIG. 31A with corresponding nanoswitch 700 illustrated in FIG. 7. Vertically oriented nanotube switches are described in greater detail in the incorporated patent references. Vertically oriented sidewalls including insulating and contact regions are formed prior to forming vertically oriented nanotube elements 3145-1 and 3145-2. Vertically oriented sidewalls are formed at R using self aligned methods, where R is approximately equal to F/2 in this example, however, similar self aligned methods of fabrication may be used to place the vertically oriented sidewalls at any location, such as F/3, F/4, or any other desired location.

Methods of forming nanotube elements 3145-1 and 3145-2 include first forming insulators 3135-1 and 3135-2 and contacts 3140-1 and 3140-2, in contact with corresponding insulators 3135-1 and 3135-2, by directionally etching an opening through both metal and insulator regions to form vertical sidewalls. Vertical sidewalls of insulators 3135-1 and 3135-2 and sidewall contacts 3140-1 and 3140-2 are self aligned with respect to trench sidewalls that are etched later in the process using methods of fabrication described further below with respect to FIGS. 36A-36FF. The thickness of insulators 3135-1 and 3135-2 determine the channel length $L_{SW-CH}$ as illustrated in FIG. 31A. Insulators 3135-1 and 3135-2 may range from less than 5 nm to greater than 250 nm, for example.

Next, methods form conformal nanotube elements 3145-1 and 3145-2 as described in greater detail in the incorporated patent references.

Then, methods form protective conformal insulator 3150-1 and 3150-2 on the surface of conformal nanotube elements 3145-1 and 3145-2, respectively.

Next, methods fill the opening with an insulating material and methods planarize the surface exposing the top surface of sidewall contacts 3140-1 and 3140-2.

Then, methods form contacts 3165-1 and 3165-2. Contacts 3165-1 and contacts 3165-2 provide a conductive path between sidewall contacts 3140-1 and 3140-2, respectively, and bit line 3171 (BL0) to be formed after completing the formation of cells C00 and C10. Contacts 3165-1 and 3165-2 correspond to the dimensions of a sacrificial layer used as a trench-etch masking layer of minimum dimension F prior to contacts 3165-1 and 3165-2 formation, as described further below with respect to FIG. 36A-36FF, that is self aligned to NV NT switch elements 3145-1 and 3145.

Then, methods etch trench regions, fill trenches with an insulator, and then planarize the surface to form insulator 3160 prior to contacts 3165-1 and 3165-2 formation described further below with respect to FIG. 36A-36FF.

Then, methods deposit and pattern bit line 3171 (BL0).

Nonvolatile nanotube diode 3190 schematic superimposed on cross section 3100 in FIG. 31A is an equivalent circuit that corresponds to nonvolatile nanotube diode 1300 in FIG. 13, one in each of cell C00 and C10. Cells C00 and C10 illustrated in cross section 3100 in FIG. 31A correspond to corresponding cells C00 and C10 shown schematically in memory array 2910 in FIG. 29A, and word lines WL0 and WL1 and bit line BL0 correspond to array lines illustrated schematically in memory array 2910.

Figure 31B:
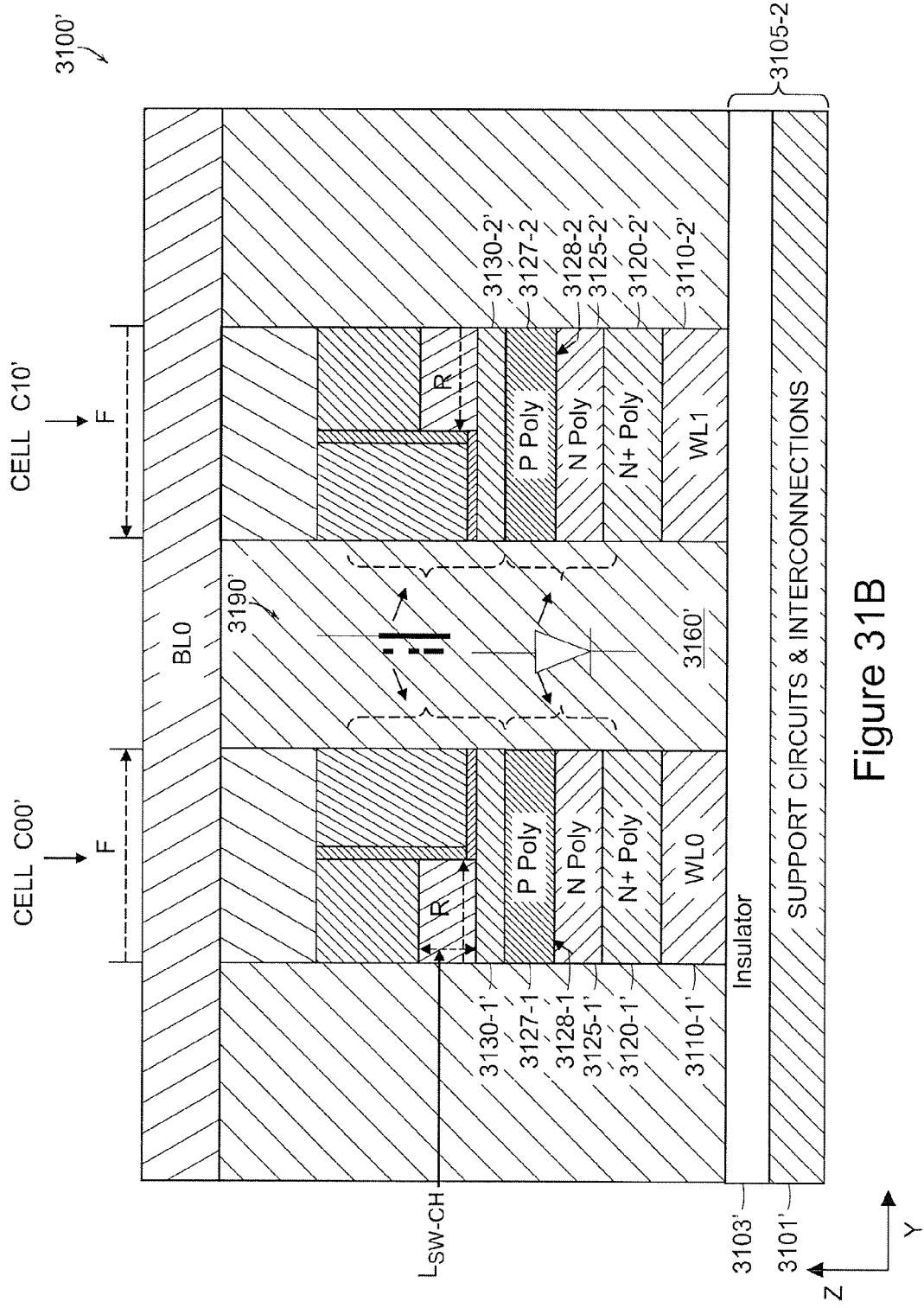
FIG. 31B illustrates a three dimensional cross section of an embodiment of a dense 3D cell structure formed with an anode-to-nanotube nonvolatile nanotube diode with a PN diode in series with a vertically oriented nonvolatile nanotube switch within vertical cell boundaries.

Cross section 3100' illustrated in FIG. 31B shows embodiments of memory array cells C00' and C10' that are similar to embodiments of memory array cells C00 and C10 illustrated in FIG. 31A, except that NV NT Diodes C00' and NV NT Diodes C10' formed in corresponding cells C00' and C10' include a PN diodes having PN diode junctions 3128-1 and 3128-2 instead of a Schottky diodes having a Schottky diode junctions 3133-1 and 3133-2.

P polysilicon regions 3127-1 and 3127-2 form an anode and N polysilicon regions 3125-1' and 3125-2' form a cathode that together form PN diodes with PN diode junctions 3128-1 and 3128-2. P polysilicon regions 3127-1 and 3127-2 also form ohmic or near-ohmic contacts with contact 3130-1' and 3130-2'. N polysilicon regions 3125-1' and 3125-2' also form ohmic contact regions with corresponding N+ polysilicon regions. Other structures of cells C00' and C10' are similar to those illustrated and described with respect to cells C00 and C10, respectively.

Memory array support structure 3105 of the embodiment illustrated in FIG. 31B includes support circuits and interconnections 3101' and planarized insulator 3103' which are similar to memory support structure 3101 illustrated in FIG. 31A except for adjustments that may be required to accommodate memory cells having PN diode select means instead of Schottky diode select means.

Nonvolatile nanotube diode 3190' is an equivalent circuit that corresponds to nonvolatile nanotube diode 1300 in FIG. 13, one in each of cell C00' and C10'. Cells C00' and C10' correspond to corresponding cells C00 and C10 shown schematically in memory array 2910 in FIG. 29A, and word lines WL0 and WL1 and bit line BL0 correspond to array lines illustrated schematically in memory array 2910.

Figure 31C:
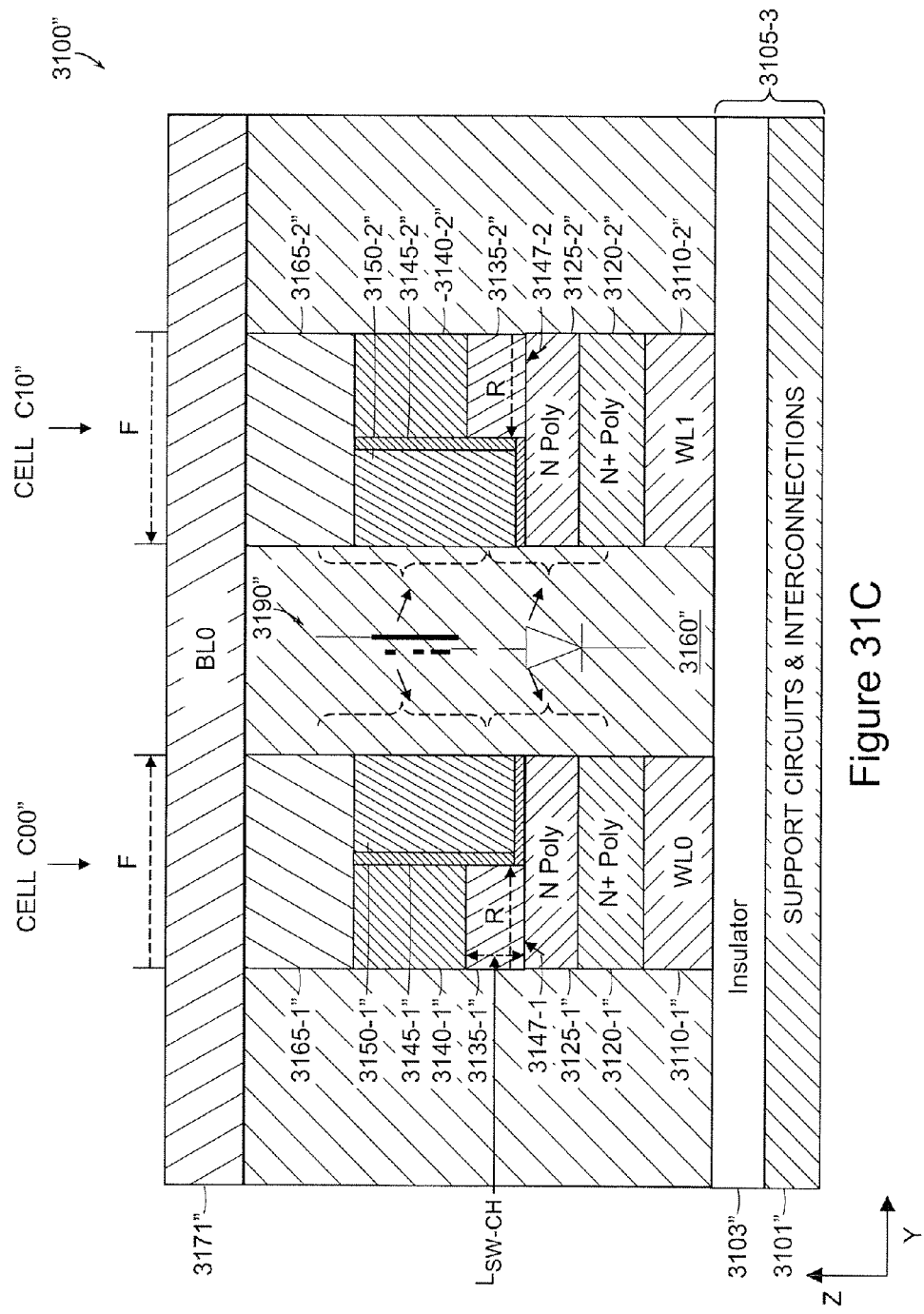
FIG. 31C illustrates a three dimensional cross section of an embodiment of a dense 3D cell structure formed with an anode-to-nanotube nonvolatile nanotube diode with a Schottky diode and PN diode in parallel and with both Schottky and PN parallel diodes in series with a vertically oriented nonvolatile nanotube switch within vertical cell boundaries.

Cross section 3100" illustrated in FIG. 31C shows embodiments of memory array cells C00" and C10" that are similar to the embodiments of memory array cells C00 and C10 illustrated in FIG. 31A, except that NV NT Diodes C00" and NV NT Diodes C10" formed in corresponding cells C00" and C101" include diode junctions 3147-1 and 3147-2 including both PN diode and Schottky diode junctions in parallel.

P-type semiconductor nanotube elements, a subset of NT elements 3145-1" and 3145-2", in physical and electrical contact with N polysilicon regions 3125-1" and 3125-2" form a PN diode-anode and N polysilicon regions 3125-1" and 3125-2" form a cathode that together form PN diodes having PN diodes as part of combined PN and Schottky diode junctions 3147-1 and 3147-2. Metallic type nanotube elements, also a subset of NT elements 3145-1" and 3145-2", in physical and electrical contact with N polysilicon regions 3125-1" and 3125-2", form a Schottky diode-anode and N polysilicon regions 3125-1" and 3125-2" form a cathode for Schottky diodes having Schottky diode junctions as part of combined PN and Schottky diode junctions 3147-1 and 3147-2. Therefore, combined PN and Schottky diode junctions 3147-1 and 3147-2 are composed of PN-type diodes and Schottky-type diodes in parallel and are formed by nanotube elements 3145-1" and 3145-2" in contact with N polysilicon regions 3125-1" and 3125-2", respectively.

N polysilicon regions 3125-1" and 3125-2" also form ohmic contact regions with corresponding N+ polysilicon regions 3120-1" and 3120-2", respectively. Nanotube element 3145-1" and 3145-2" are also in physical and electrical contact with sidewall contacts 3140-1" and 3140-2". Sidewall contacts 3140-1" and 3140-2" are in contact with upper level contacts 3165-1" and 3165-2", respectively, which are in contact with bit line bit line 3171" (BL0). Formation of upper level contacts is briefly described further above with respect to FIG. 31A and in more detail further below with respect to FIGS. 36A-36FF. Other structures of cells C00" and C10" are similar to those illustrated and described with respect to cells C00 and C10, respectively.

Memory array support structure 3105-3 illustrated in the embodiment of FIG. 31C includes support circuits and interconnections 3101" and planarized insulator 3103" which are similar to memory support structure 3101 and planarized insulator 3103 illustrated in FIG. 31A except for adjustments that may be required to accommodate memory cells having PN diode select means and Schottky diode select means in parallel.

Nonvolatile nanotube diode 3190" is an equivalent circuit that corresponds to nonvolatile nanotube diode 1300 in FIG. 13, one in each of cell C00" and C10". Cells C00" and C10" illustrated in cross section 3100" in the embodiment of FIG. 31C correspond to corresponding cells C00 and C10 shown schematically in memory array 2910 in the embodiment of FIG. 29A, and word lines WL0 and WL1 and bit line BL0 correspond to array lines illustrated schematically in memory array 2910.

Figure 32:
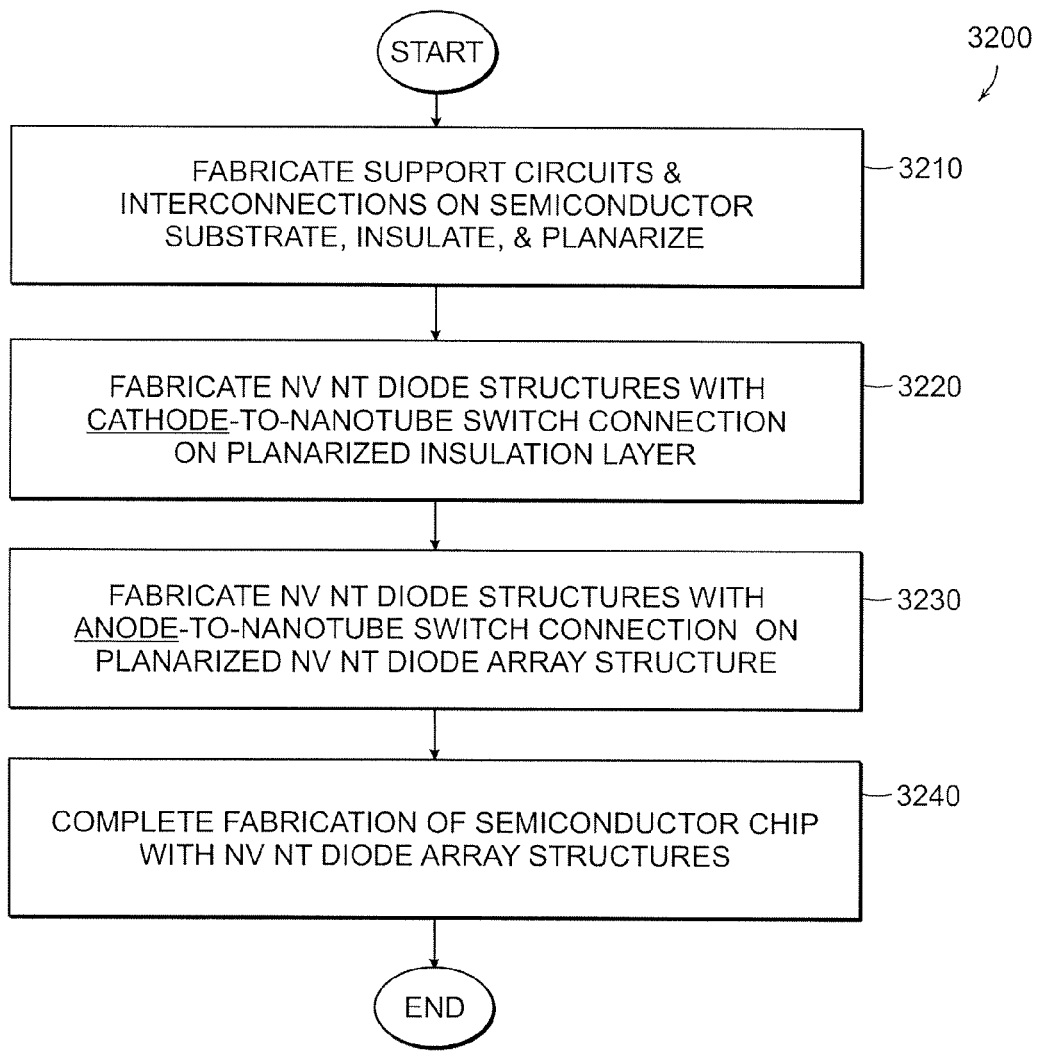
FIG. 32 illustrates methods of fabrication of stacked 3D memory arrays using both cathode-to-nanotube and anode-to-nanotube nonvolatile nanotube diodes similar to those illustrated schematically in FIGS. 12 and 13, according to some embodiments.

Nonvolatile Memories Using NV NT Diode Device Stacks with Both Anode-to-NT Switch Connections and Cathode-to-NT Switch Connections FIG. 32 illustrates an exemplary method 3200 of fabricating embodiments having two memory arrays stacked one above the other and on an insulating layer above support circuits formed below the insulating layer and stacked arrays, and with communications means through the insulating layer. While method 3200 is described further below with respect to nonvolatile nanotube diodes 1200 and 1300, method 3200 is sufficient to cover the fabrication of many of the embodiments of nonvolatile nanotube diodes described further above. Note also that although methods 3200 are described in terms of 3D memory embodiments, methods 3200 may also be used to form 3D logic embodiments based on NV NT diodes arranged as logic arrays such as NAND and NOR arrays with logic support circuits (instead of memory support circuits) as used in PLAs, FPGAs, and PLDs, for example.

Figure 33A:
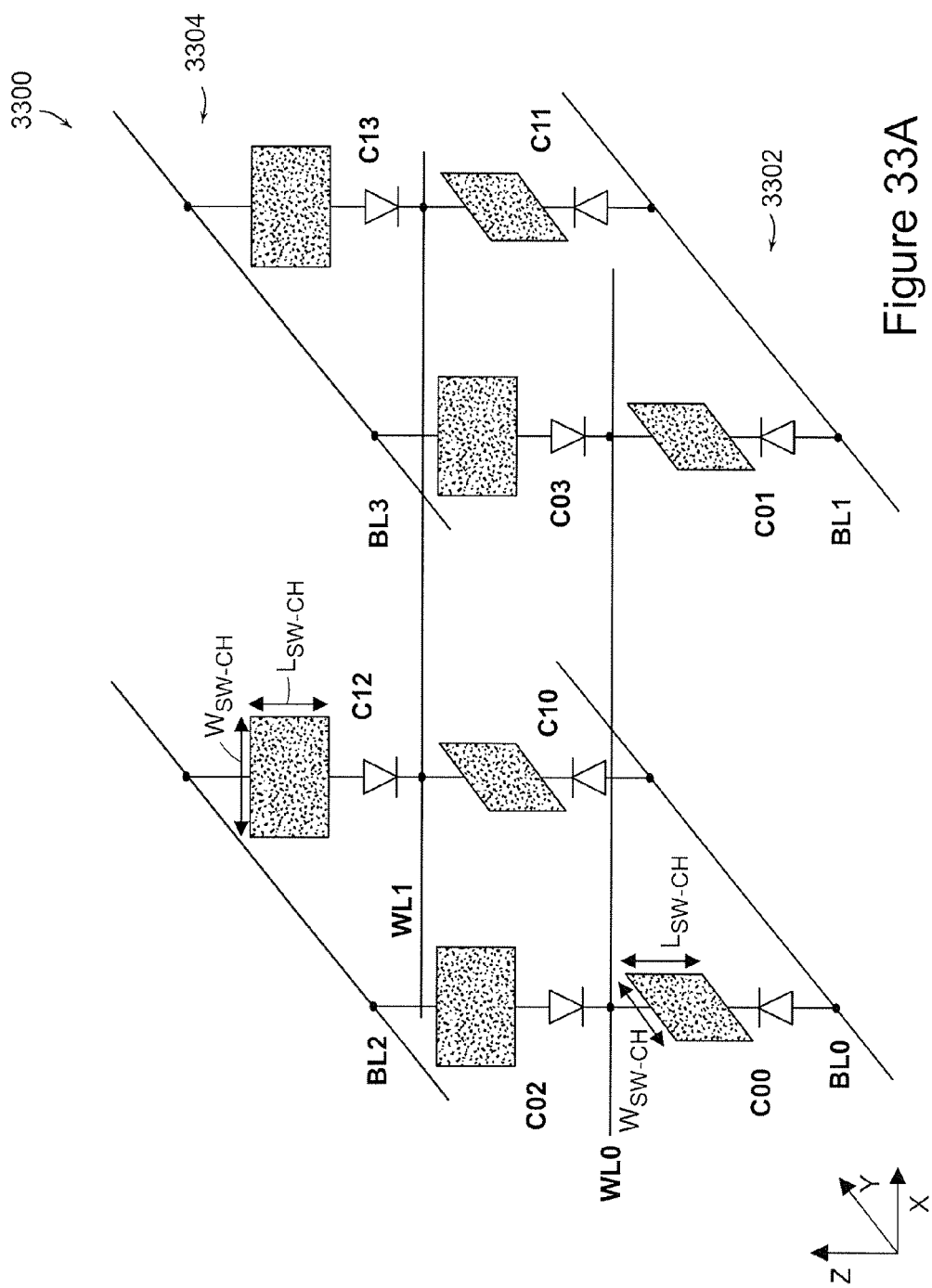
FIG. 33A illustrates a perspective view of an embodiment of two stacked 3D memory arrays using both cathode-to-nanotube and anode-to-nanotube 3D arrays.

FIG. 33A illustrates a 3D perspective drawing 3300 that includes an embodiment having a two-high stack of three dimensional arrays, a lower array 3302 and an upper array 3304. Lower array 3302 includes nonvolatile nanotube diode cells C00, C01, C10, and C11. Upper array 3304 includes nonvolatile nanotube diode cells C02, C12, C03, and C13. Word lines WL0 and WL1 are oriented along the X direction and bit lines BL0, BL1, BL2, and BL3 are oriented along the Y direction and are approximately orthogonal to word lines WL1 and WL2. Nanotube element channel length $L_{SW-CH}$ and channel width $W_{SW-CH}$ are shown in 3D perspective drawing 3300. Cross sections of embodiments that can be used as cells C00, C01, C02 and C03 are illustrated further below in FIG. 33B and FIG. 33C; and embodiments that can be used as cells C00, C02, C12, and C10 are illustrated further below in FIG. 33B'.

In general, methods 3210 fabricate support circuits and interconnections in and/or on a semiconductor substrate. This includes NFET and PFET devices having drain, source, and gate that can be interconnected to form memory (or logic) support (or select) circuits. Such structures and circuits may be formed using known techniques that are not described in this application. Methods 3210 are used to form a support circuits and interconnections 3301 layer as part of cross section 3305 illustrated in FIG. 33B and cross section 3305' illustrated in FIG. 33B' using known methods of fabrication in and on which nonvolatile nanotube diode control and circuits are fabricated. Support circuits and interconnections 3301 are similar to support circuits and interconnections 2801 and 3101 described further above, for example, but are modified to accommodate two stacked memory arrays. Note that while two-high stacked memory arrays are illustrated in FIGS. 33A-33D, more than two-high 3D array stacks may be formed (fabricated), including but not limited to 4-high and 8 high stacks for example.

Figure 33B:
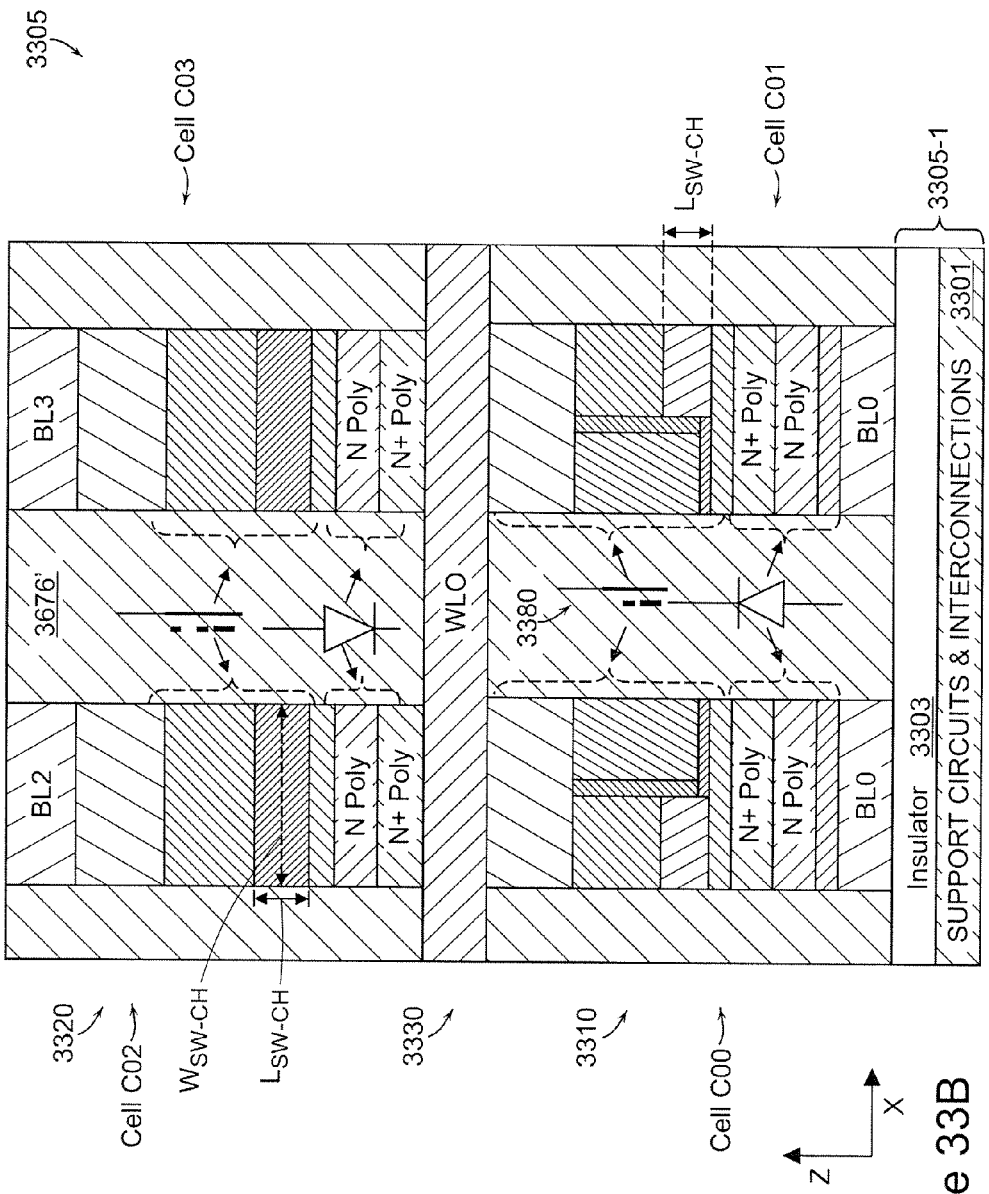
FIGS. 33B & 33B' illustrate cross sectional views of two embodiments of stacked 3D memory array structures with a shared word line.
Figure 33B:
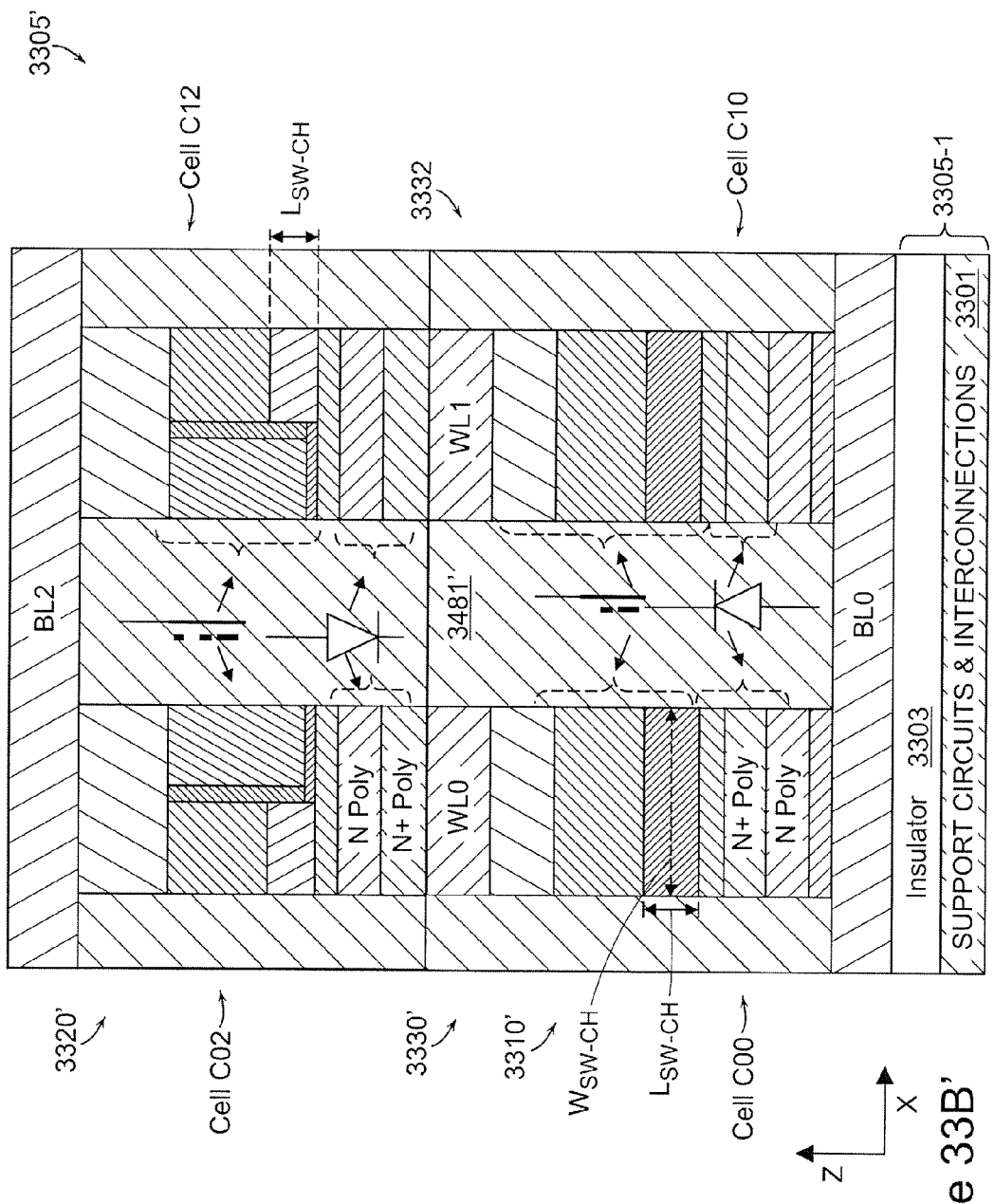

Next, methods 3210 are also used to fabricate an intermediate structure including a planarized insulator with interconnect means and nonvolatile nanotube array structures on the planarized insulator surface such as insulator 3303 illustrated in cross section 3305 in FIG. 33B and corresponding cross section 3305' in FIG. 33B'. Interconnect means include vertically-oriented filled contacts, or studs, for interconnecting memory support circuits in and on a semiconductor substrate below the planarized insulator with nonvolatile nanotube diode arrays above and on the planarized insulator surface. Planarized insulator 3303 is formed using methods similar to methods 2730 illustrated in FIG. 27B in which methods deposit and planarize insulator 3303. Interconnect means through planar insulator 3303 (not shown in cross section 3300) similar to contact 2807 illustrated in FIG. 28C may be used to connect array lines in first memory array 3310 and second memory array 3320 to corresponding support circuits and interconnections 3301 as described further below. Support circuits and interconnections 3301 and insulator 3303 form memory array support structure 3305-1.

Next, methods 3220, similar to methods 2740, are used to fabricate a first memory array 3310 using diode cathode-to-nanotube switches based on a nonvolatile nanotube diode array similar to a nonvolatile nanotube diode array cross section 2800 illustrated in FIG. 28A and corresponding methods of fabrication described further below with respect to FIGS. 34A-34FF.

Next, methods 3230 similar to methods 3040 illustrated in FIG. 30B, fabricate a second memory array 3320 on the planar surface of first memory array 3310, but using diode anode-to-nanotube switches based on a nonvolatile nanotube diode array similar to a nonvolatile nanotube diode array cross section 3100 illustrated in FIG. 31A and corresponding methods of fabrication described further below with respect to FIGS. 36A-36FF.

FIG. 33B illustrates cross section 3305 including first memory array 3310 and second memory array 3320, with both arrays sharing word line 3330 in common, according to some embodiments. Word lines such as 3330 can be defined (etched) during trench etch that defines memory array (cells) when forming array 3320. Cross section 3305 illustrates combined first memory array 3310 and second memory array 3320 in the word line, or X direction, with shared word line 3330 (WL0), four bit lines BL0, BL1, BL2, and BL3, and corresponding cells C00, C01, C02, and C03. The array periodicity in the X direction is 2F, where F is a minimum dimension for a technology node (generation).

FIG. 33B' illustrates cross section 3305' including first memory array 3310' and second memory array 3320' with both arrays sharing word lines 3330' and 3332 in common, according to some embodiments. Word line 3330' is a cross sectional view of word line 3330. Word lines such as 3330' and 3332 can be defined (etched) during a trench etch that defines memory array (cells) when forming array 3320'. Cross section 3305' illustrates combined first memory array 3310' and second memory array 3320' in the bit line, or Y direction, with shared word lines 3330' (WL0) and 3332 (WL1), two bit lines BL0 and BL2, and corresponding cells C00, C10, C02, and C12. The array periodicity in the Y direction is 2F, where F is a minimum dimension for a technology node (generation).

The memory array cell area of 1 bit for array 3310 can be down to $4F^2$ because of the 2F periodicity in the X and Y directions. The memory array cell area of 1 bit for array 3320 can be down to $4F^2$ because of the 2F periodicity in the X and Y directions. Because memory arrays 3320 and 3310 are stacked, the memory array cell area per bit can be down to $2F^2$. If four memory arrays (not shown) are stacked, then the memory array cell area per bit can be down to $1F^2$.

Referring again to FIG. 32, methods 3240 using industry standard fabrication techniques complete fabrication of the semiconductor chip by adding additional wiring layers as needed, and passivating the chip and adding package interconnect means.

Figure 33C:
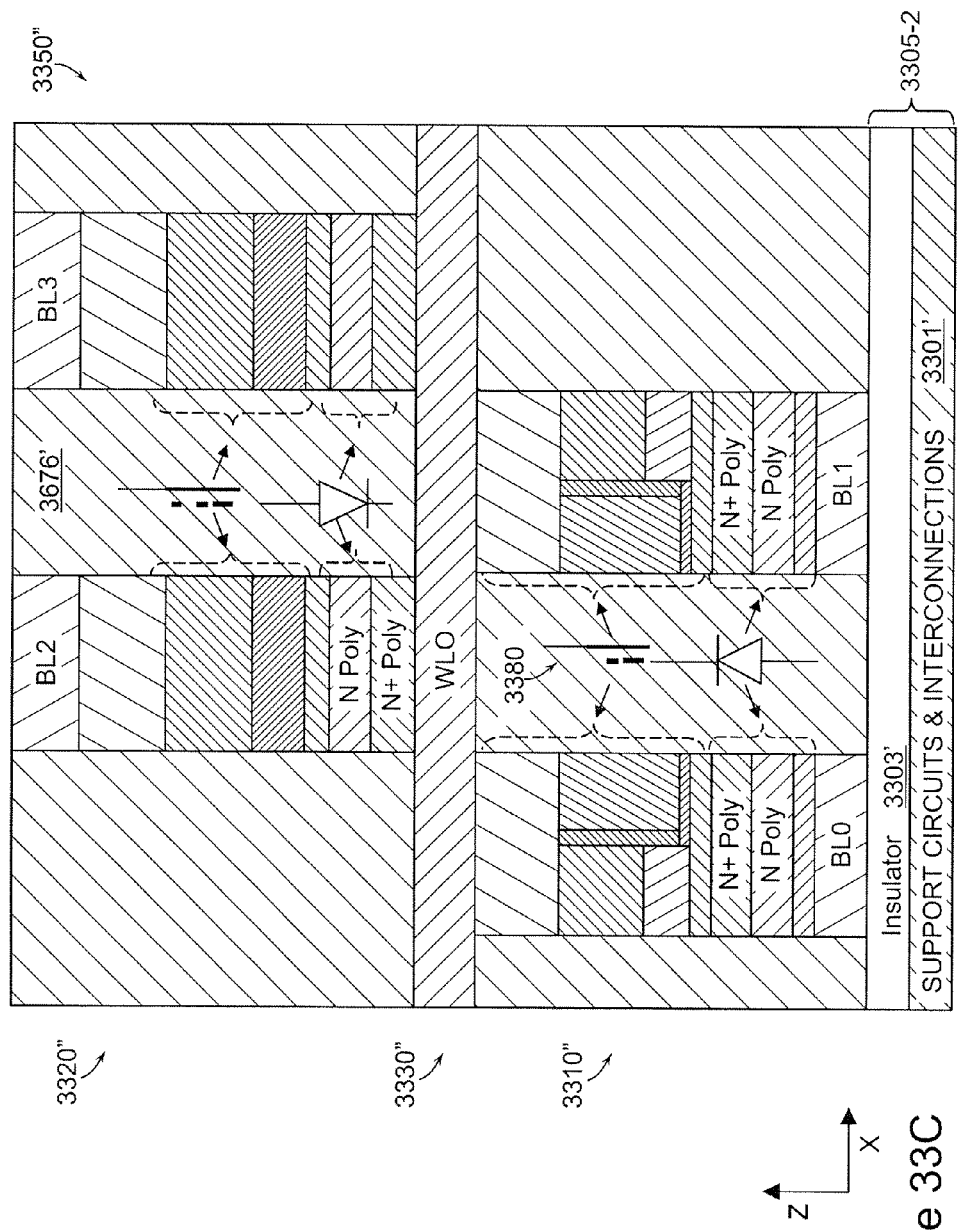
FIG. 33C illustrates a cross sectional view of an embodiment of a stacked 3D memory array structure which is a variation of the structure illustrated in FIG. 33B.

Cross section 3305 illustrated in FIG. 33B shows stacking of first memory array 3310 and second memory array 3320 with bit locations aligned in the vertical (Z) direction, according to some embodiments, however there may be interconnection and/or fabrication advantages to offsetting stacked memory arrays. FIG. 33C illustrates an embodiment having a cross section 3350" similar to cross section 3305 illustrated in FIG. 33B in which second memory array 3320" is translated by one cell location (a half-periodicity) relative to cells in first memory array 3310" and sharing word line 3330". Support circuits and interconnections 3301' and insulator 3303' form memory array support structure 3305-2 which is similar to memory array support structure 3305-1 illustrated in FIG. 33B.

In operation, the four stacked cells illustrated in FIG. 33B correspond to cell C00 and C01 cathode-to-nanotube cells illustrated schematically in memory array 2610 forming memory array 3310, and C02 and C03 anode-to-nanotube cells illustrated schematically in memory array 2910 forming memory array 3320. All four cells share common word line WL0 in memory array cross section 3300. Cells C00, C01, C02, and C03 are also shown in 3D perspective drawing 3300 illustrated in FIG. 33A. Memory array 3305 is approximately 2× denser on a per bit basis than memory arrays such as illustrated by cathode-to-NT cross section 2800 illustrated in FIG. 28A or anode-to-NT cross section 3100 illustrated in FIG. 31A for example. Additional word lines and bit lines (not shown) may be added to form a large memory array in the megabit and gigabit range. Word line WL0 and bit lines BL0, BL1, BL2, and BL3 operation is described further below in terms of waveforms 3375 illustrated in FIG. 33D with word line WL0 selected.

For an exemplary write 0 operation along word line WL0, simultaneously erasing cells C00, C01, C02, and C03, data stored in cells C00-C03 may optionally be read prior to erase and data stored in corresponding sense amplifier/latches. Write 0 operation along word line WL0 proceeds with bit lines BL0, BL1, BL2, and B3 transitioning from zero to 5 volts, with bit line voltages controlled by corresponding BL drivers. Next, WL driver circuits drive word line WL0 from 5 volts to zero volts thus forward biasing NV NT Diodes C00, C01, C02, and C03 that form cells C00, C01, C02, and C03, respectively. A write 0 voltage of approximately 4.5 volts (erase voltage 5 volts minus NV NT diode turn on voltage of less than 0.5 volts as illustrated in FIGS. 21A-21E) results in a transition from an ON state to an OFF state for NV NT Diodes in an ON state; NV NT Diodes in an OFF state remain in an OFF state. Thus after a write 0 operation along word line WL0, NV NT Diodes C00-C03 are all in an OFF state. Unselected word lines WL1, WL2, and WL3 (not shown in FIG. 33B) remain unselected and at 5 volts, and nonvolatile data stored in corresponding cells remains unchanged.

In this example, a write operation is preceded by a write 0 operation as described further above. In other words, NV NT Diodes C00-C03 of respective corresponding cells C00-C03 begin the write operation in the OFF state. For an exemplary write 0 operation to cells C00 and C03 for example, in which a logic 0 state is to be stored, NV NT Diodes C00 and C03 are to remain in the logic 0 high resistance state. Therefore, bit lines BL0 and BL3 are held at zero volts by corresponding BL driver and sense circuits. Next, word line WL0 transitions from 4 volts to zero volts, with stimulus from corresponding WL drivers. NV NT Diodes C00 and C03 remain back biased during the write 0 operation and cells C00 and C03 remain in an OFF (high resistance) logic 0 state.

If NV NT Diodes C01 and C02 are to transition from an OFF (high resistance state) to an ON (low resistance state) in a write 1 operation representing a logic 1, then bit lines BL1 and BL2 transition from zero volts to 4 volts, with stimulus provided by corresponding BL drivers. Next, word line WL0 transitions from 4 volts to zero volts. A write 1 voltage of approximately 4 volts results in a voltage of 3.5 volts across the terminals of corresponding NV NT switch sub-components of NV NT diode C01 and C02 (4 volts minus NV NT diode turn on voltage of less than 0.5 volts as illustrated in FIG. 21) and result in a transition from an OFF state to an ON state for NV NT Diodes C01 and C02.

For an exemplary read operation, from cells C00-C03 for example, corresponding bit line drivers in corresponding BL driver and sense circuits precharge bit lines BL0-BL3 to a high voltage such as a read voltage of 2 volts, for example. The read bit line voltage is selected to be less than both write 0 and write 1 voltages to ensure that stored logic states (bits) are not disturbed (changed) during a read operation. Word line drivers drive word line WL0 from 2 volts to zero volts. NV NT Diodes C00 and C03 in corresponding cells C01 and C03 are in an OFF state (storing a logic 0) and bit lines BL0 and BL3 are not discharged and remains at 2 volts. Corresponding sense amplifier/latches store corresponding logic 0 states. However, since NV NT Diode C01 and C02 in corresponding cells C01 and C02 are in an ON state, then bit lines BL1 and BL2 are discharged. Corresponding sense amplifier/latches detect a reduced voltage and latches store corresponding logic 1 states.

Note that the memory array illustrated in cross section 3350" of FIG. 33C can be operated similarly to memory array illustrated in cross section 3305 described further above with respect to FIG. 33B.

Methods of Fabricating Nonvolatile Memories Using Nonvolatile Nanotube Diode (NV NT Diode) Devices as Cells Exemplary methods of fabricating embodiments of 3-dimensional cell structures of nonvolatile cells using NV NT devices having vertically oriented diodes and vertically oriented NV NT switches with cathode-to-NT switch connections such as illustrated by cross section 2800 illustrated in FIG. 28A and cross section 2800' illustrated in FIG. 28B are described further below with respect to FIGS. 34A-34FF.

Exemplary methods of fabricating embodiments of 3-dimensional cell structure of nonvolatile cells using NV NT Devices having vertically oriented diodes and horizontally oriented NV NT switches with cathode-to-NT switch connections such as illustrated by cross section 2800" illustrated in FIG. 28C are described further below with respect to FIGS. 35A-35S.

Exemplary methods of fabricating 3-dimensional cell structure embodiments of nonvolatile cells using NV NT devices having vertically oriented diodes and vertically oriented NV NT switches with anode-to-NT switch connections such as illustrated by cross section 3100 illustrated in FIG. 31A, cross section 3100' illustrated 31B, and cross section 3100" illustrated in FIG. 31C are described further below with respect to FIGS. 36A-FF.

Figure 34B:
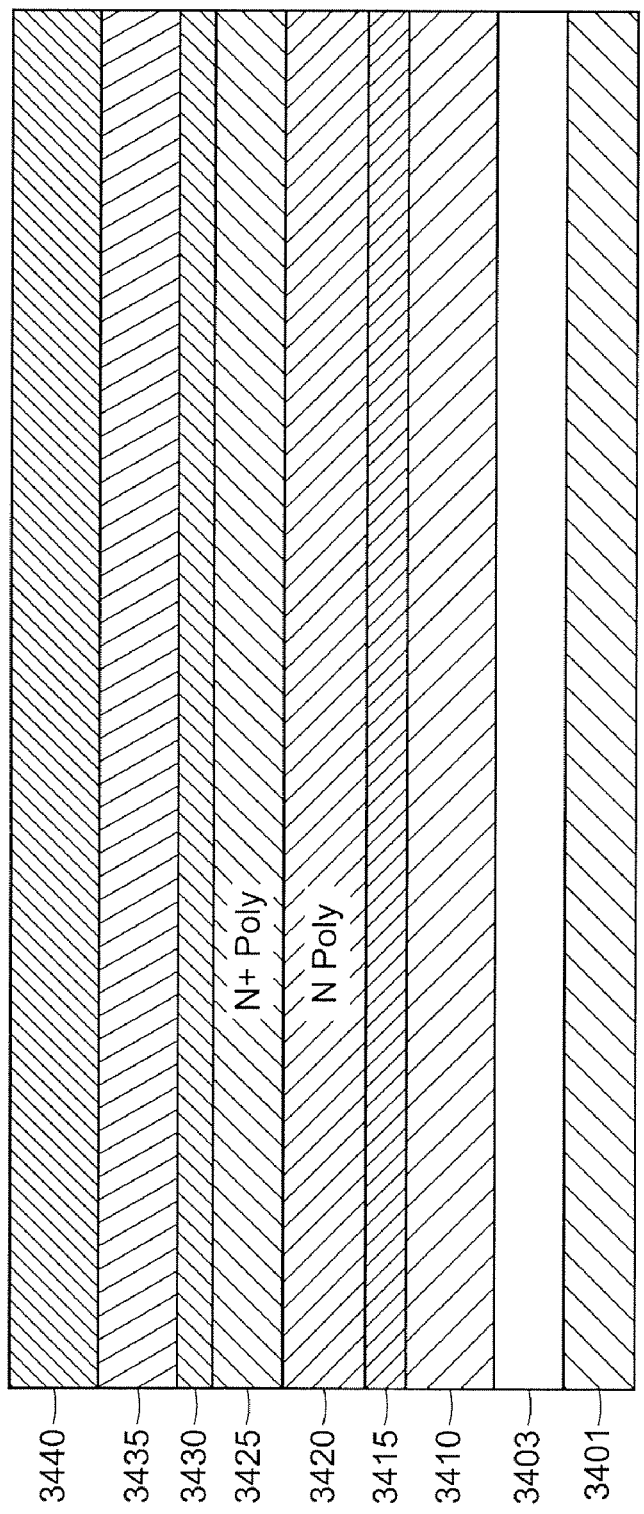
FIGS. 34A-34FF illustrate methods of fabrication for cathode-on-nanotube memory cross sectional structures with vertically oriented nonvolatile nanotube switches within vertical cell boundaries illustrated in FIGS. 28A and 28B, according to some embodiments.
Figure 34C:
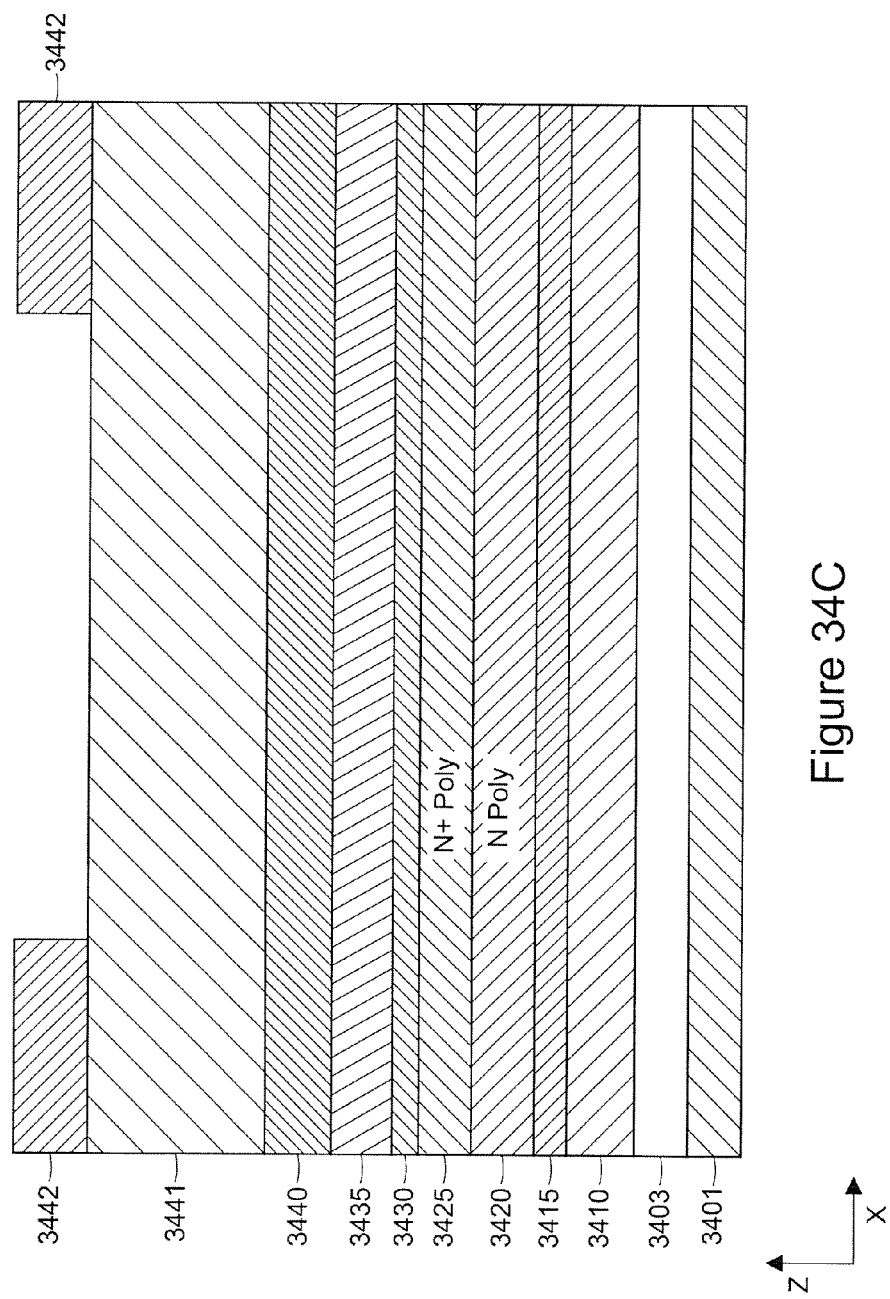
Figure 34D:
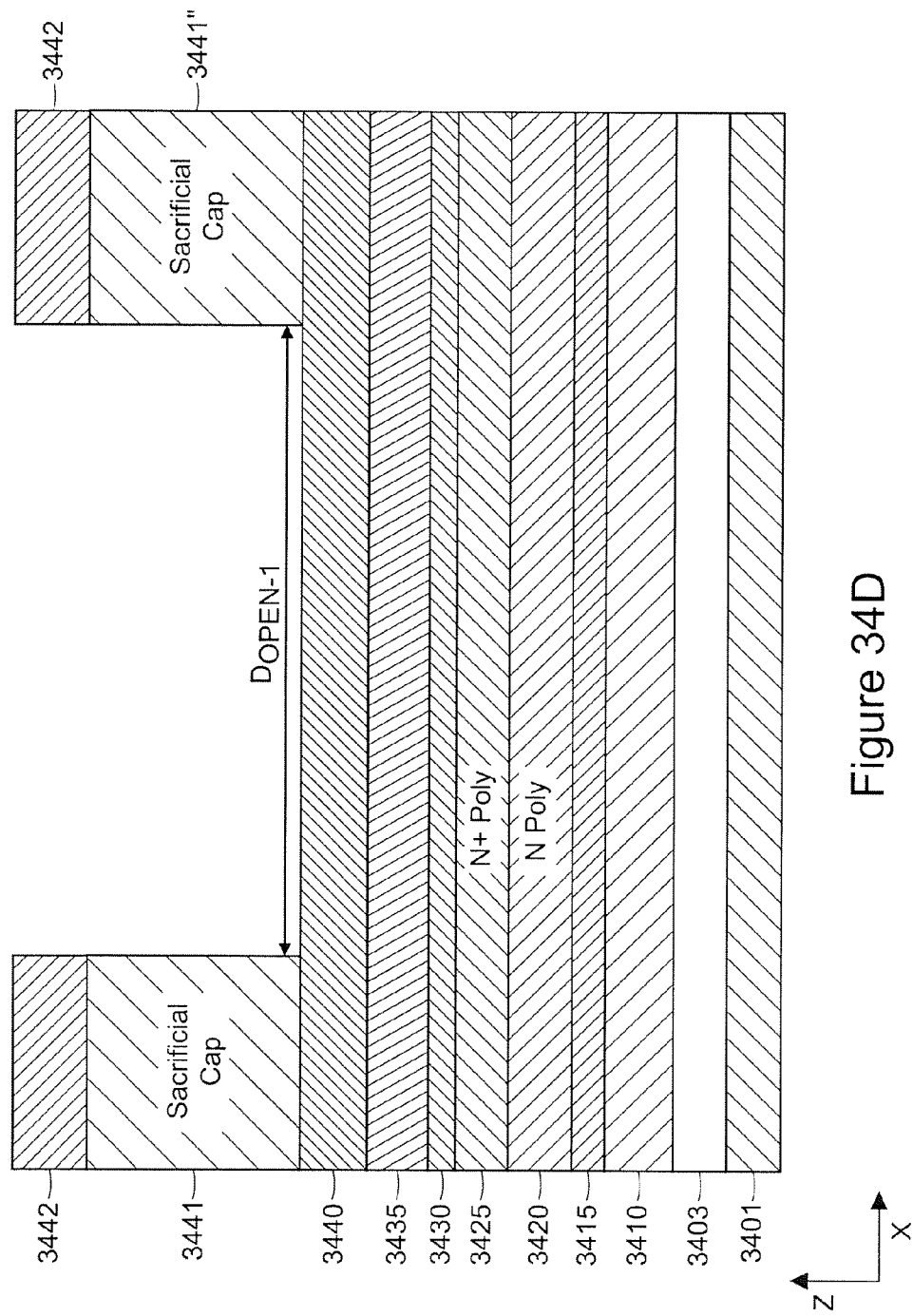
Figure 34E:
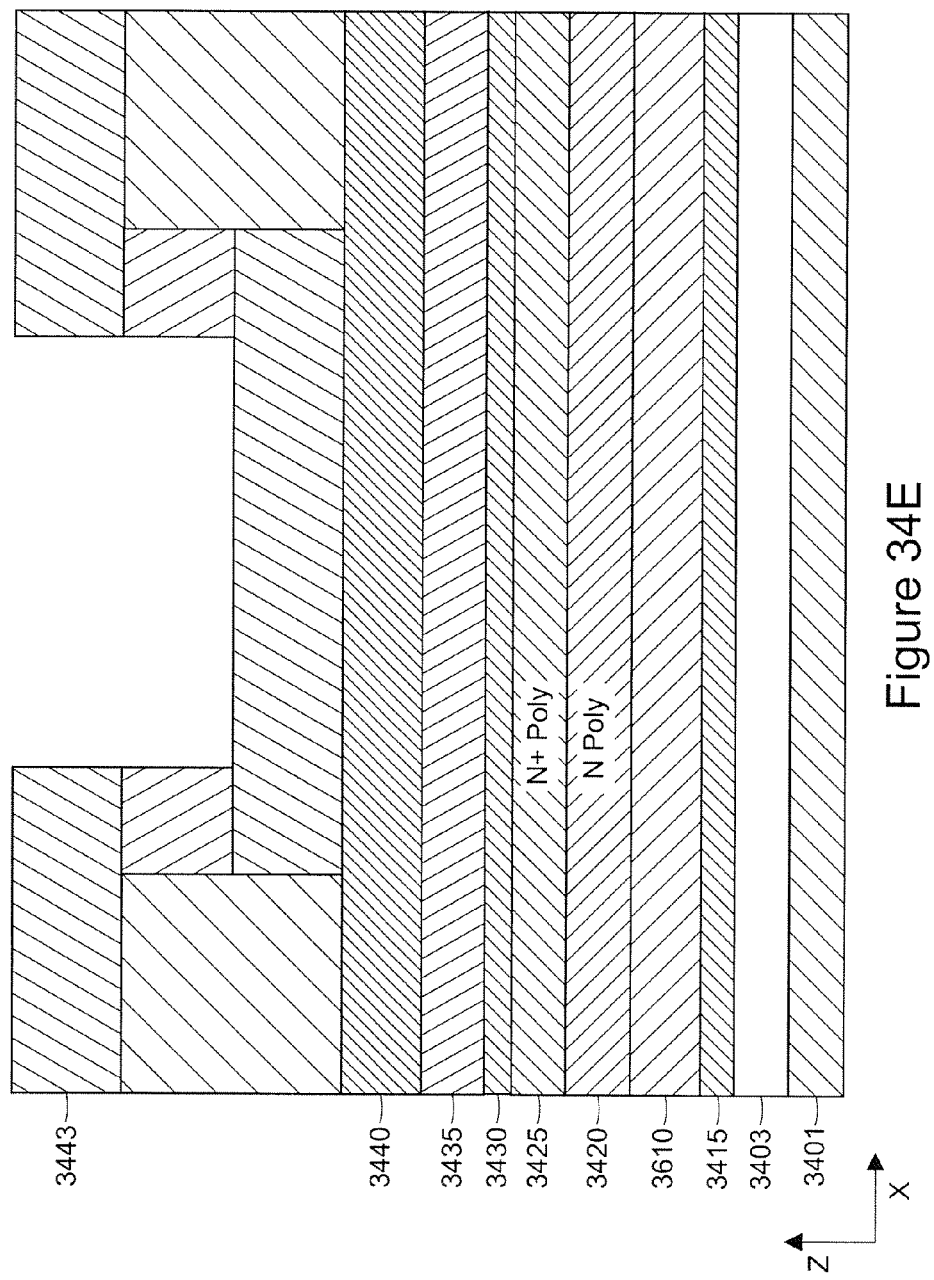
Figure 34F:
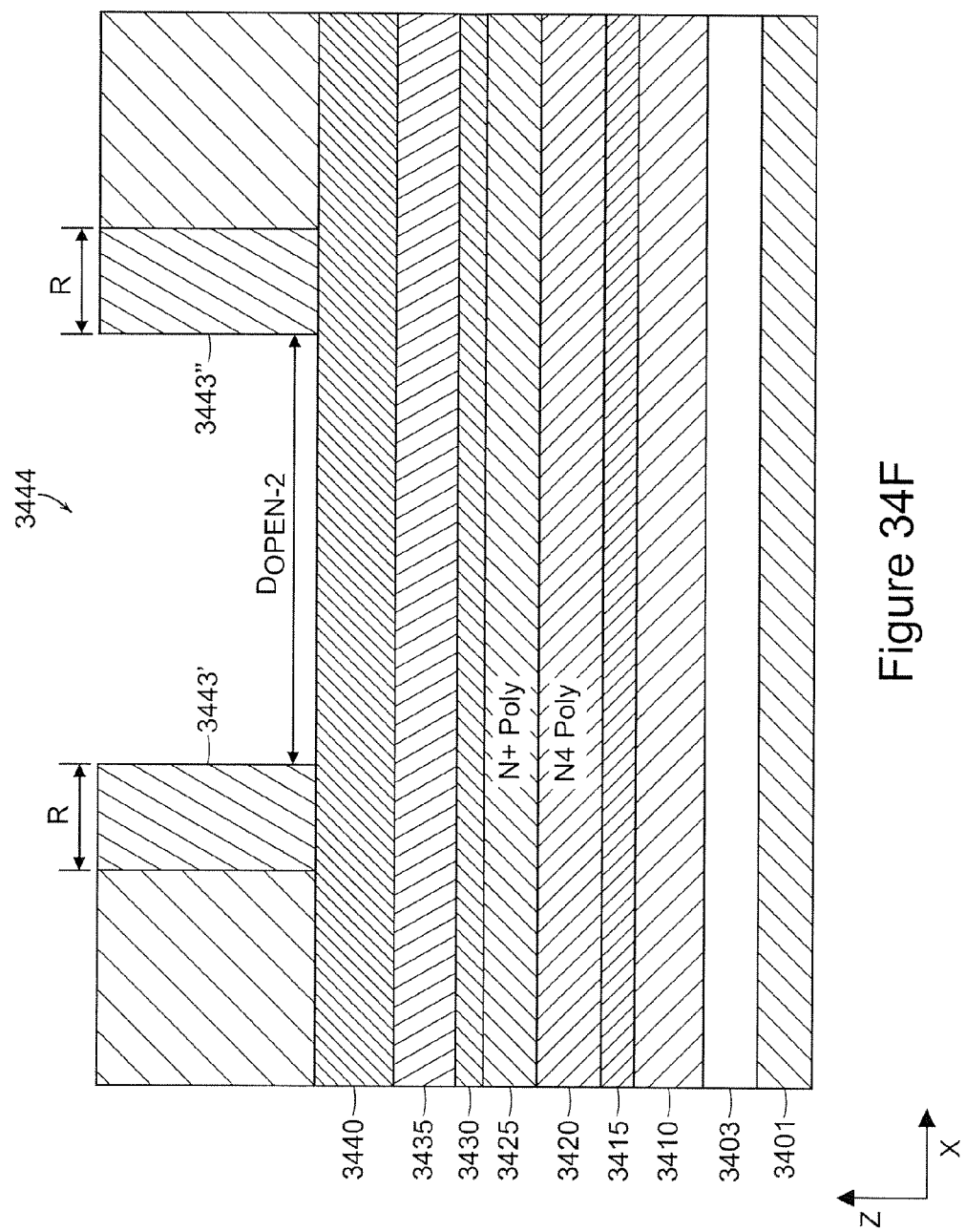
Figure 34G:
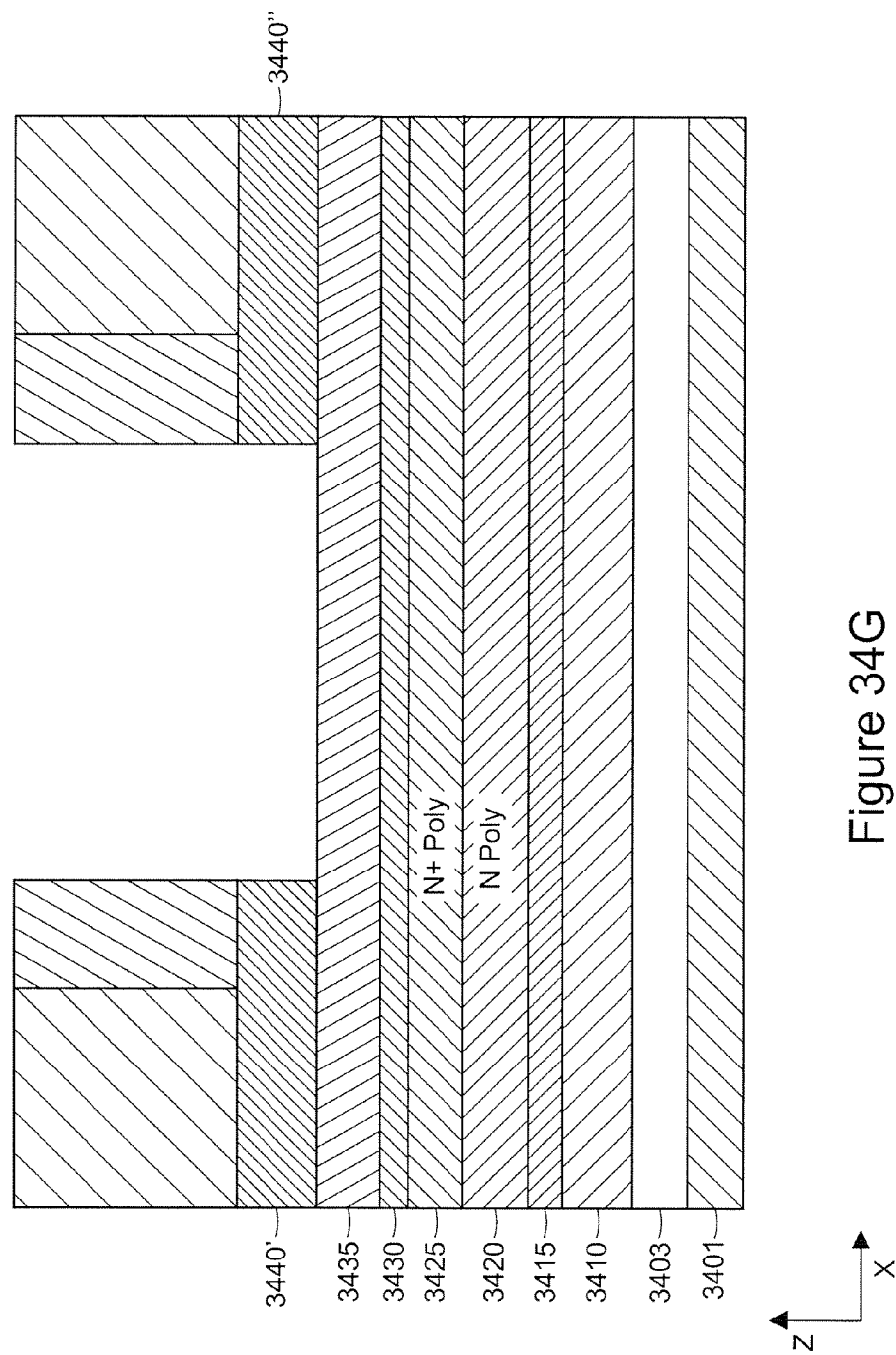
Figure 34H:
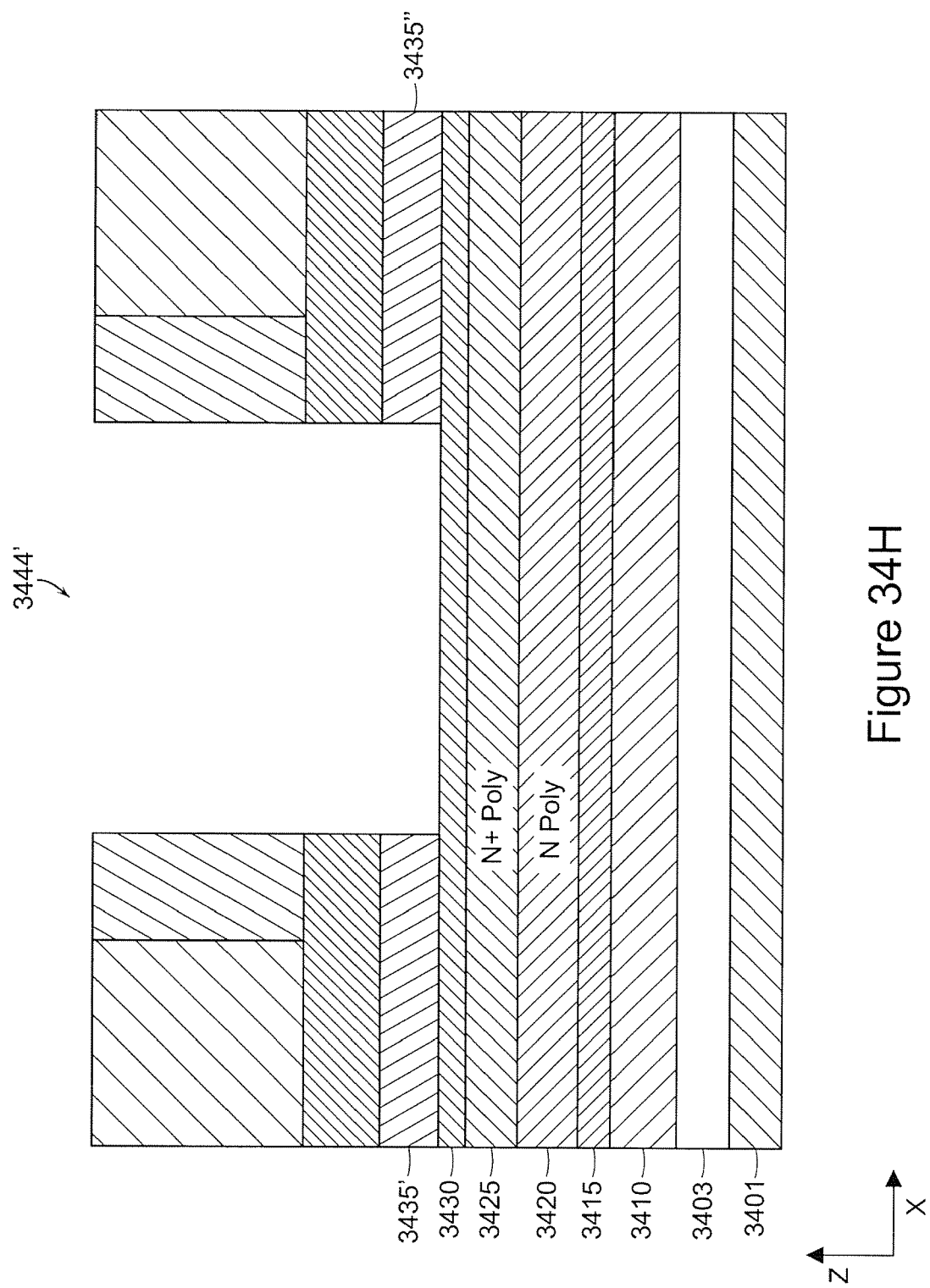
Figure 34I:
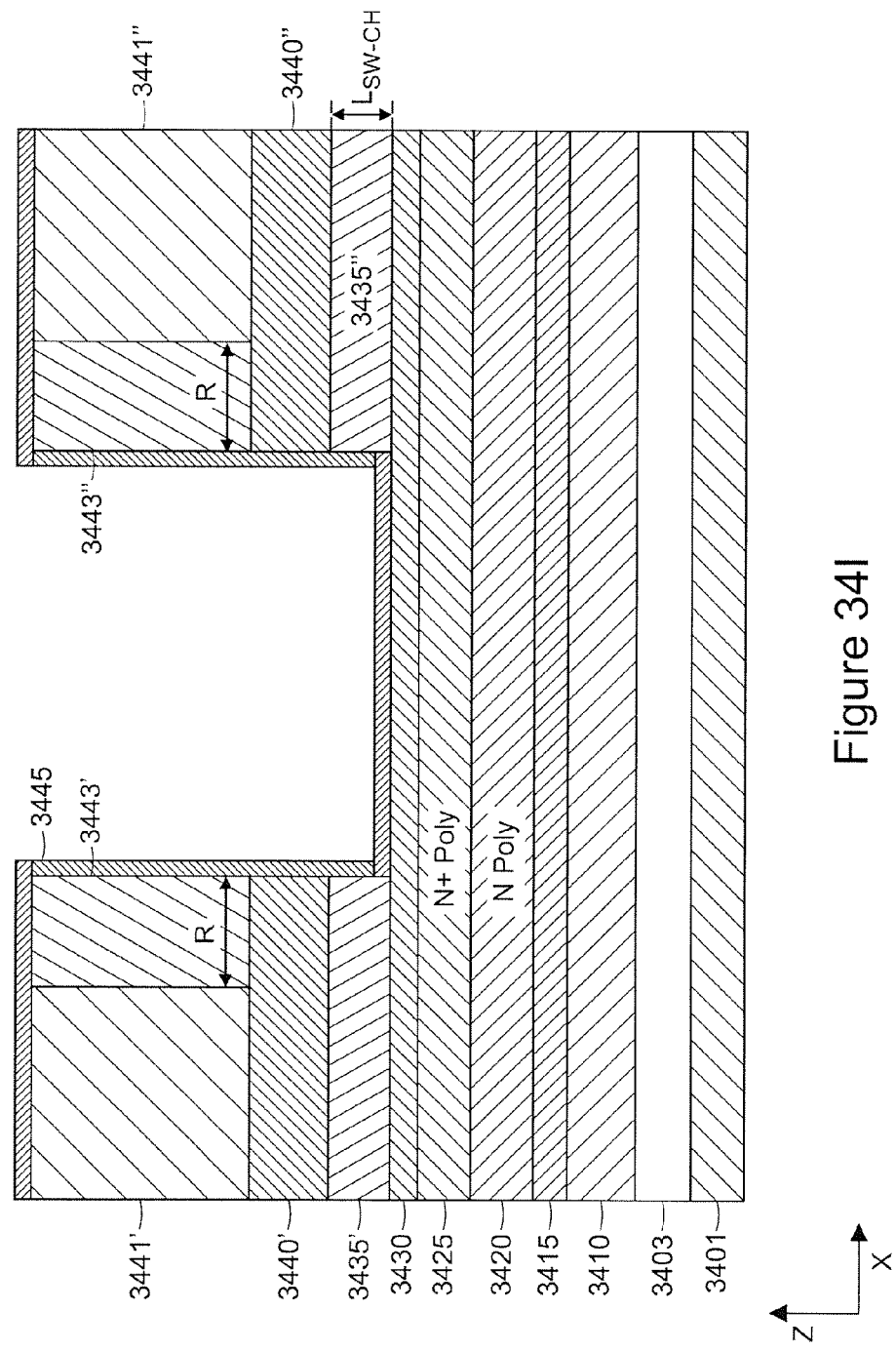
Figure 34J:
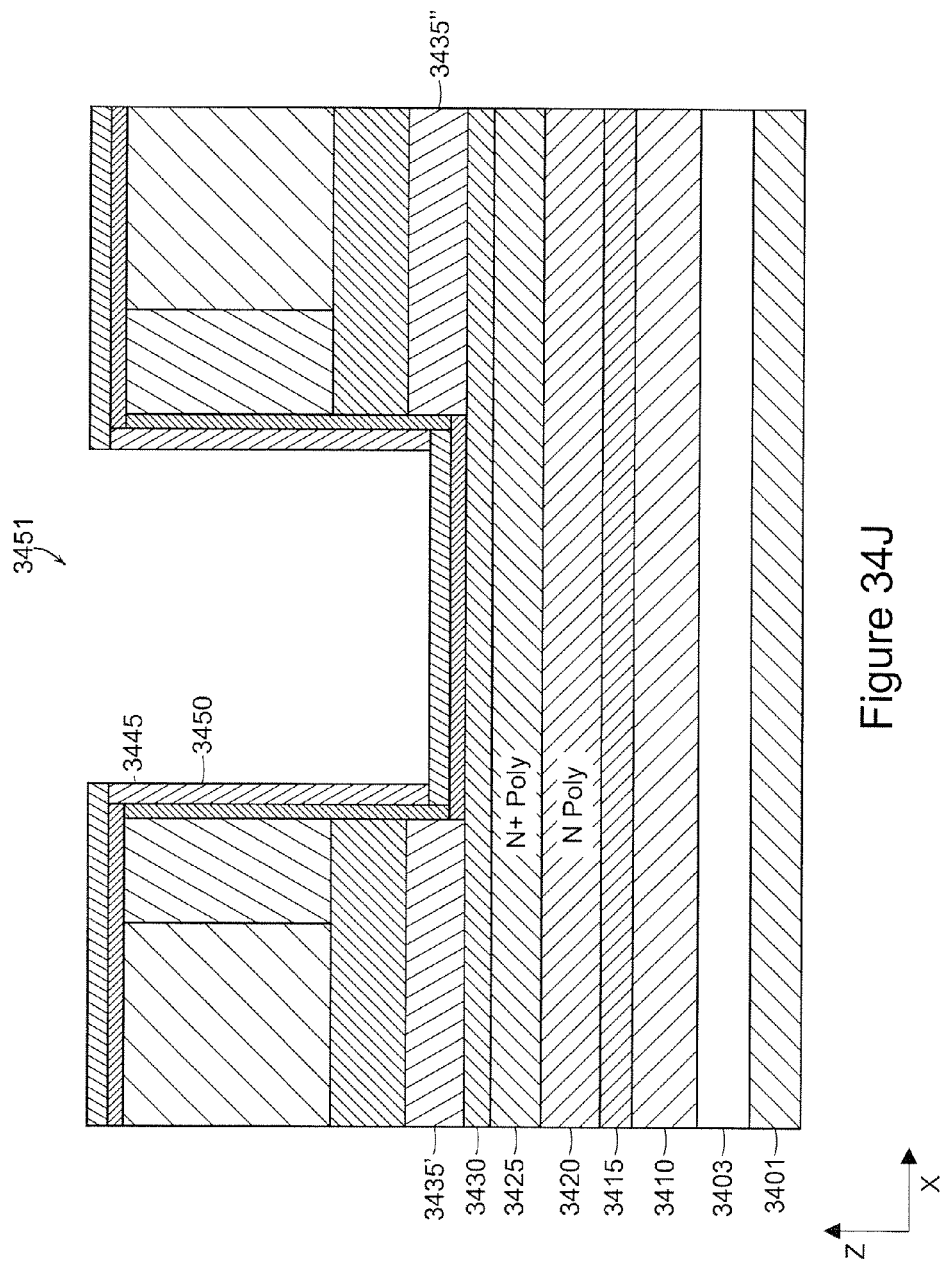
Figure 34K:
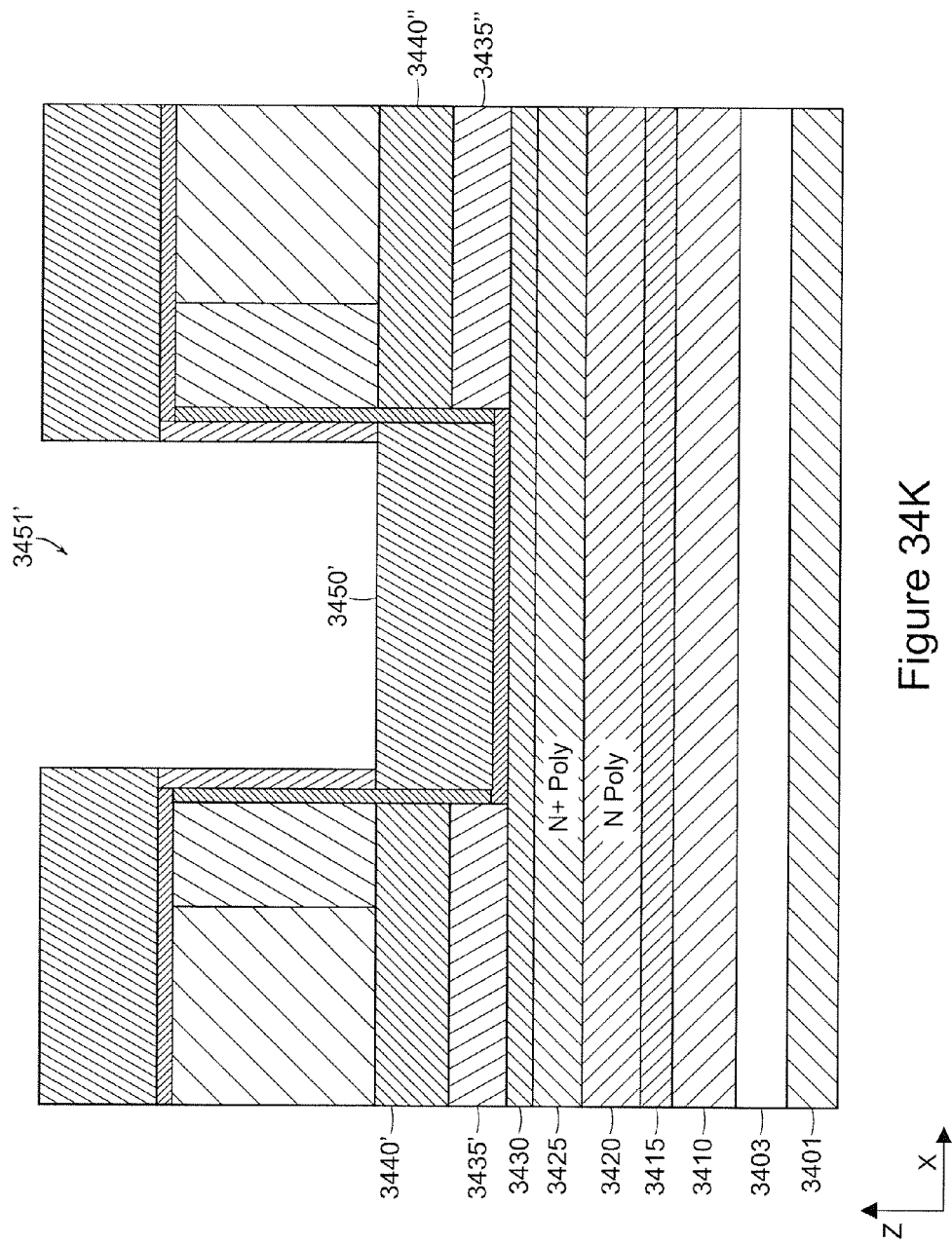
Figure 34L:
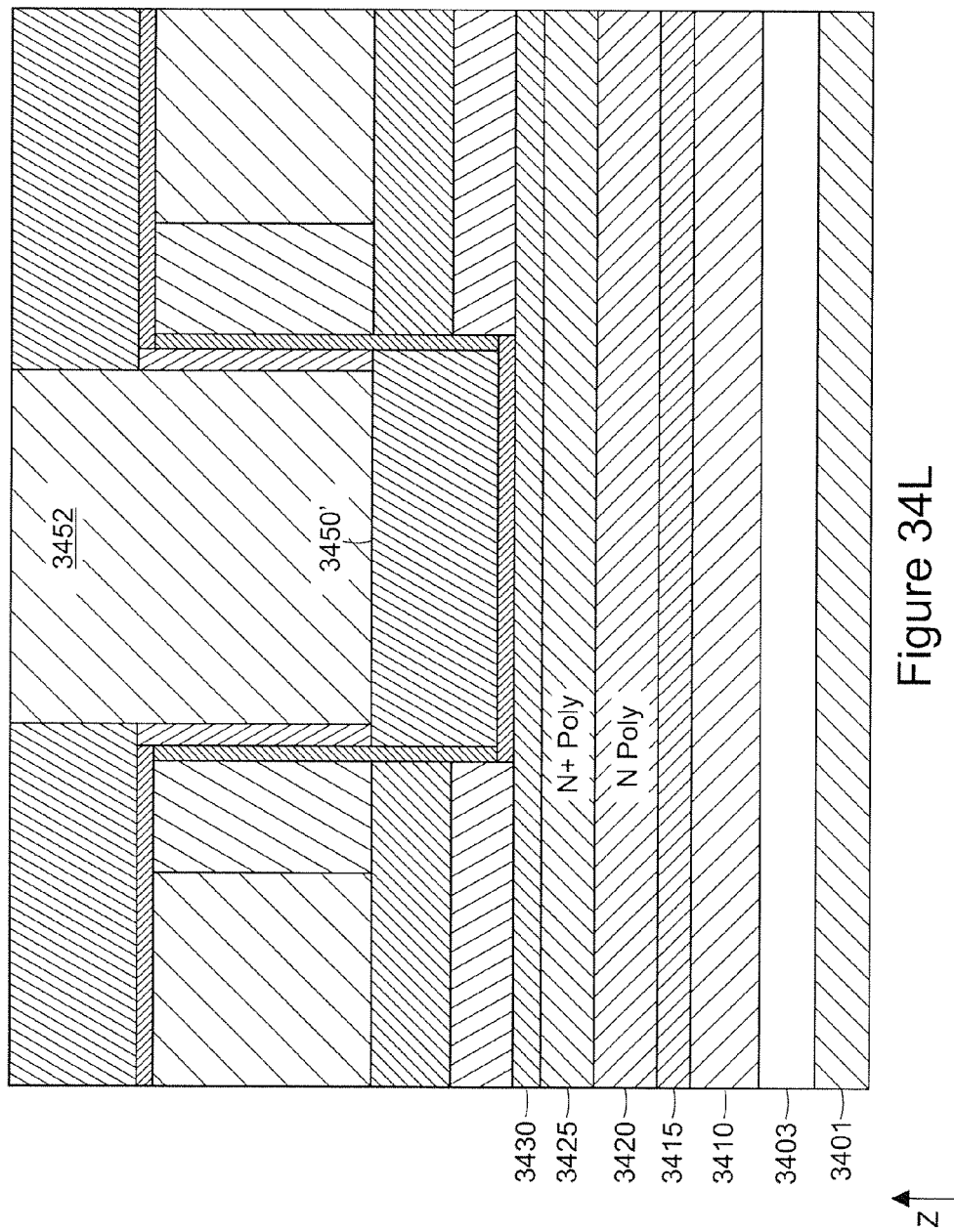
Figure 34M:
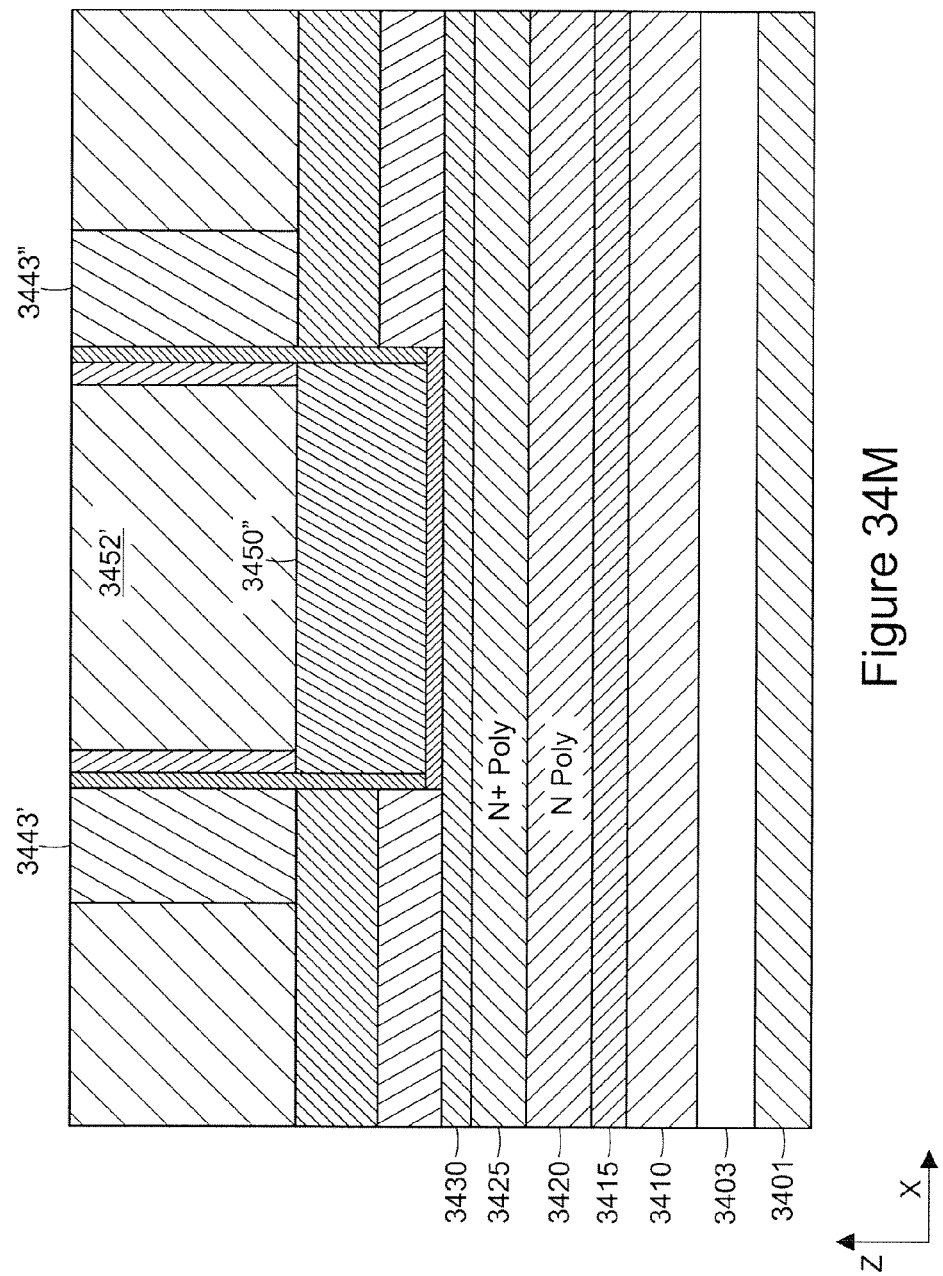
Figure 34N:
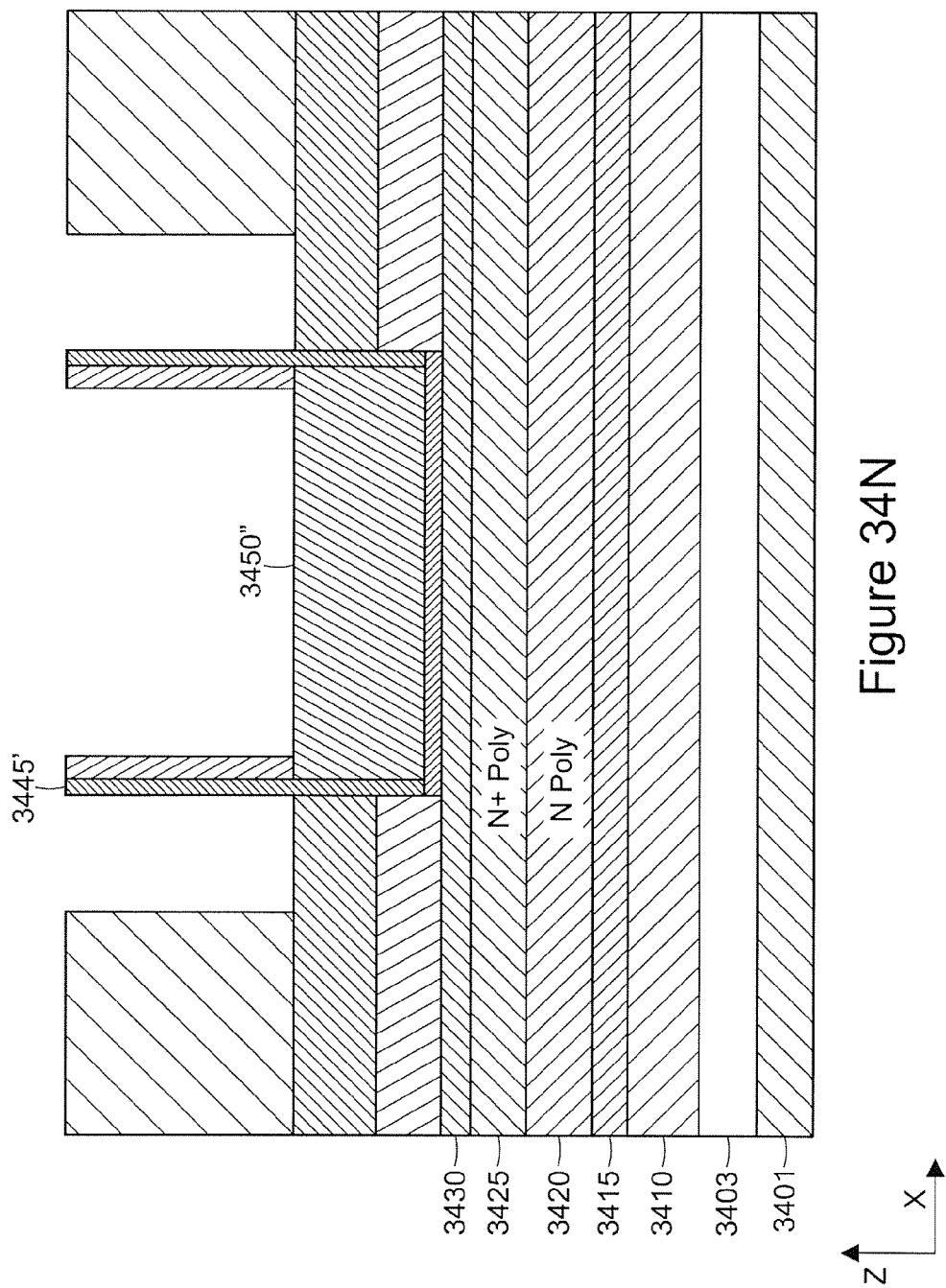
Figure 34O:
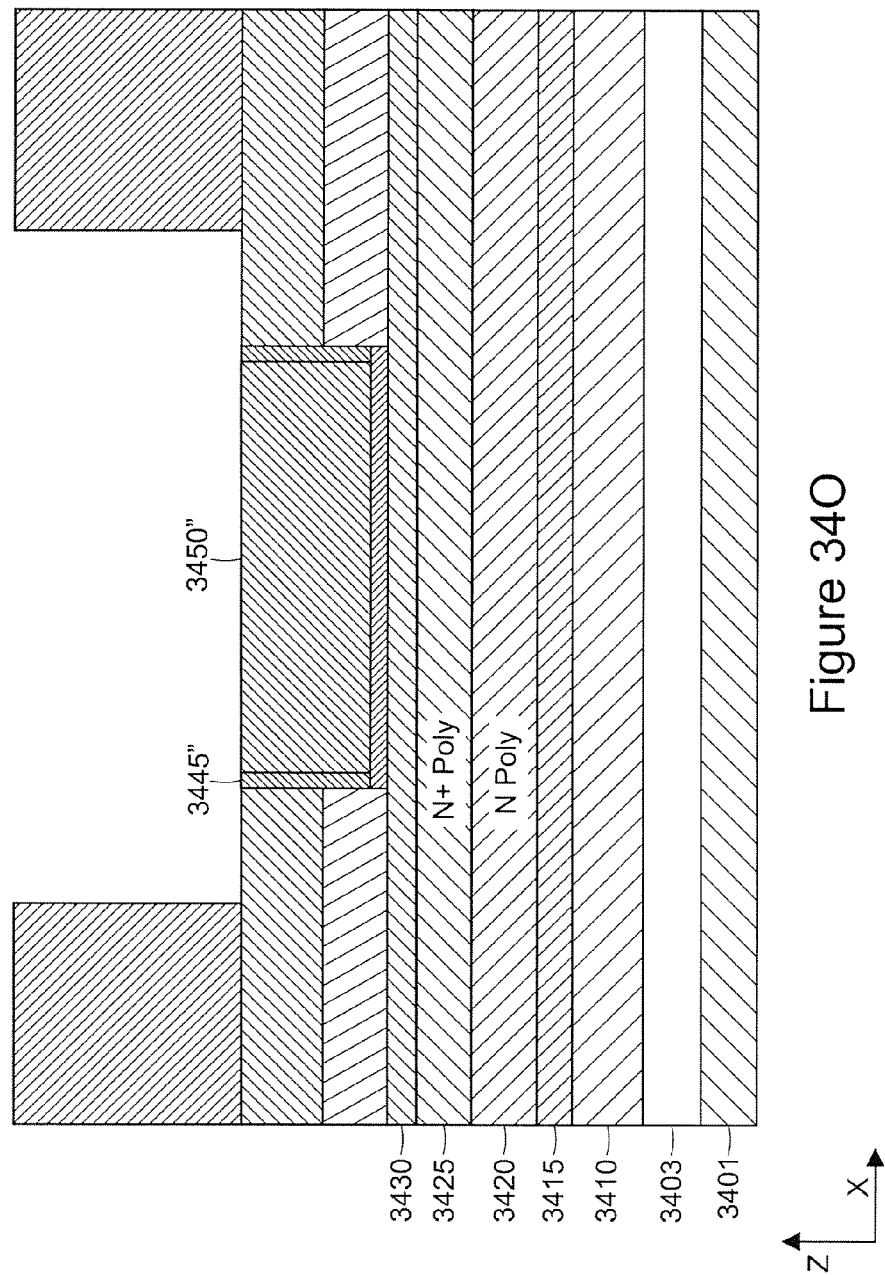
Figure 34P:
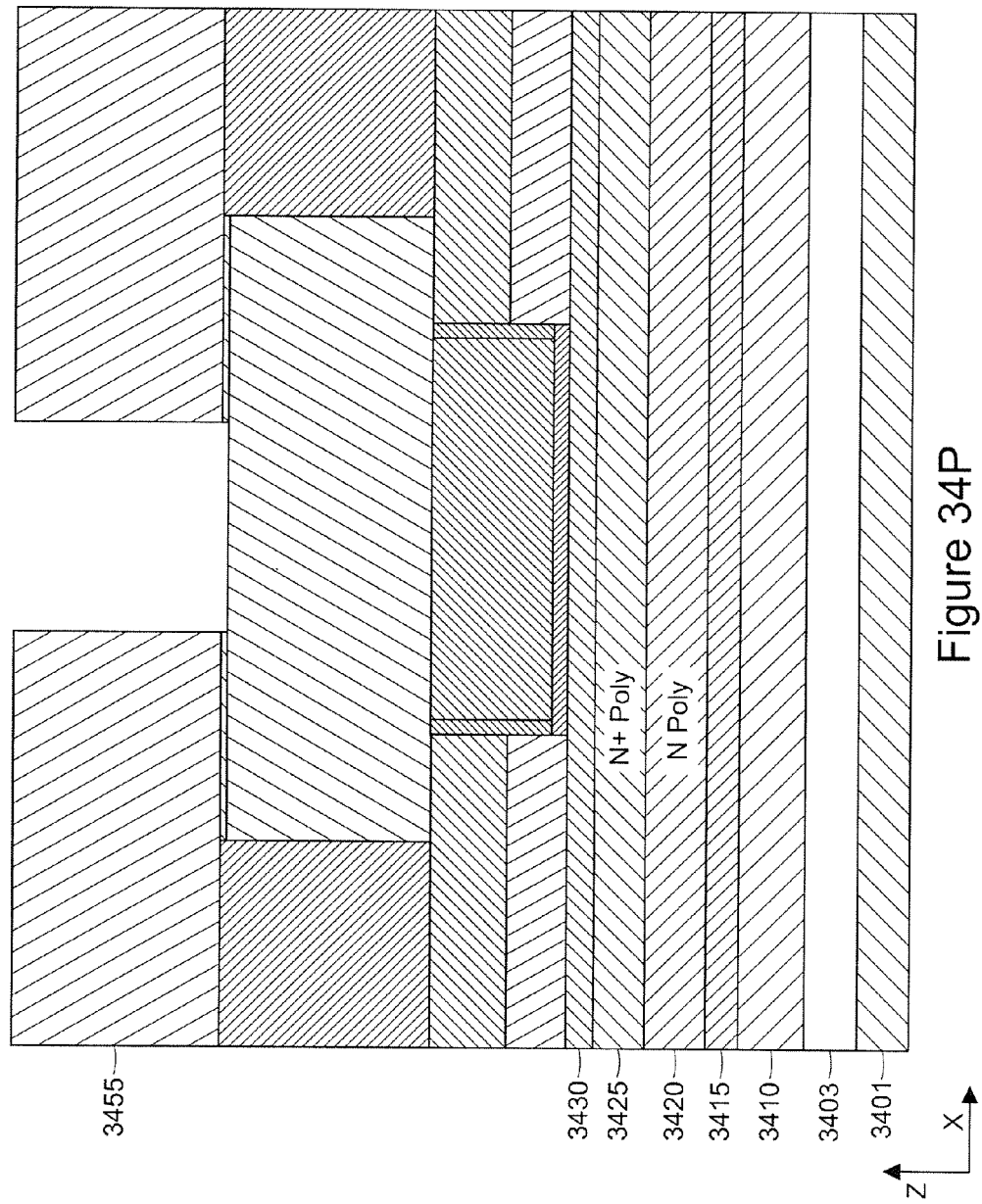
Figure 34Q:
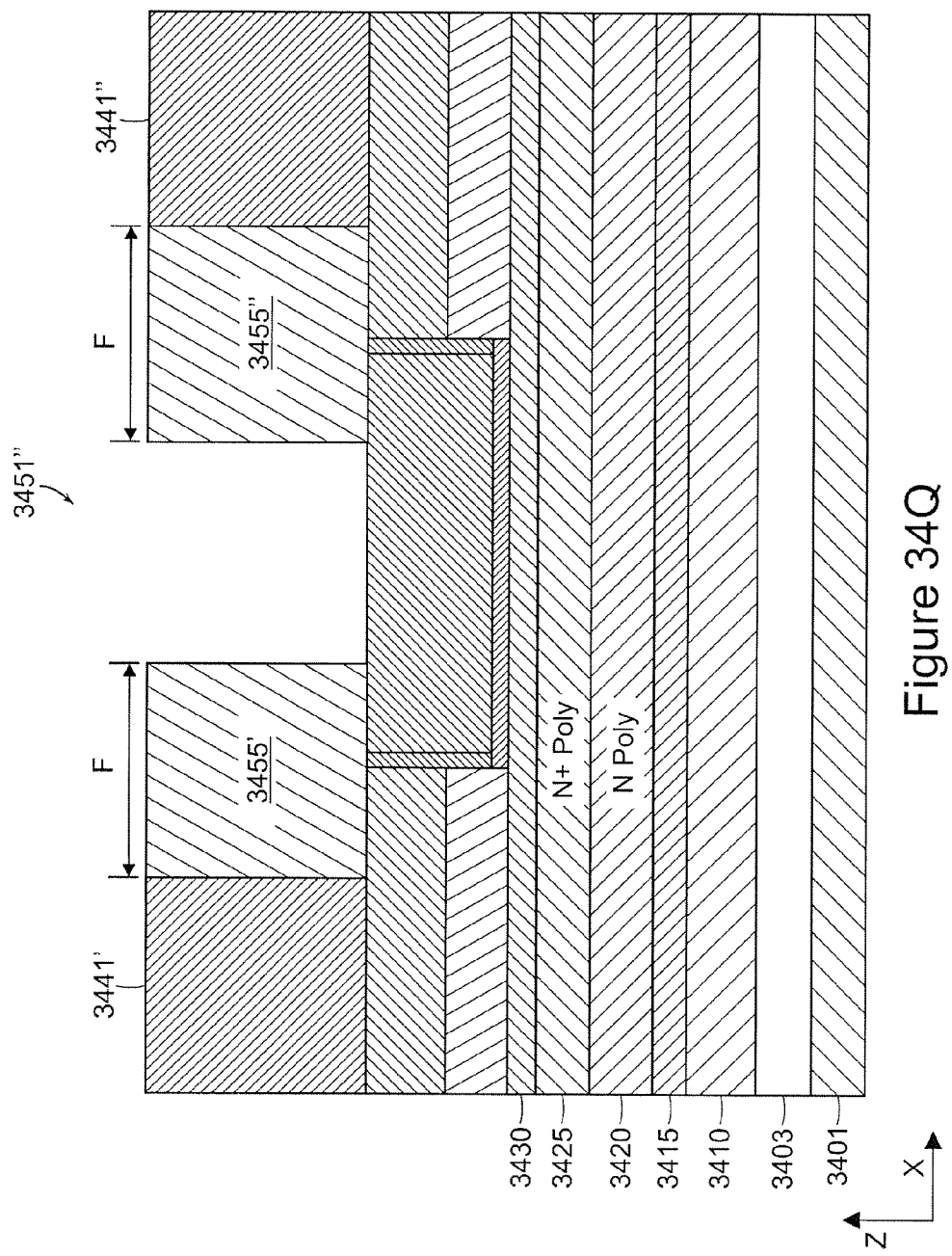
Figure 34R:
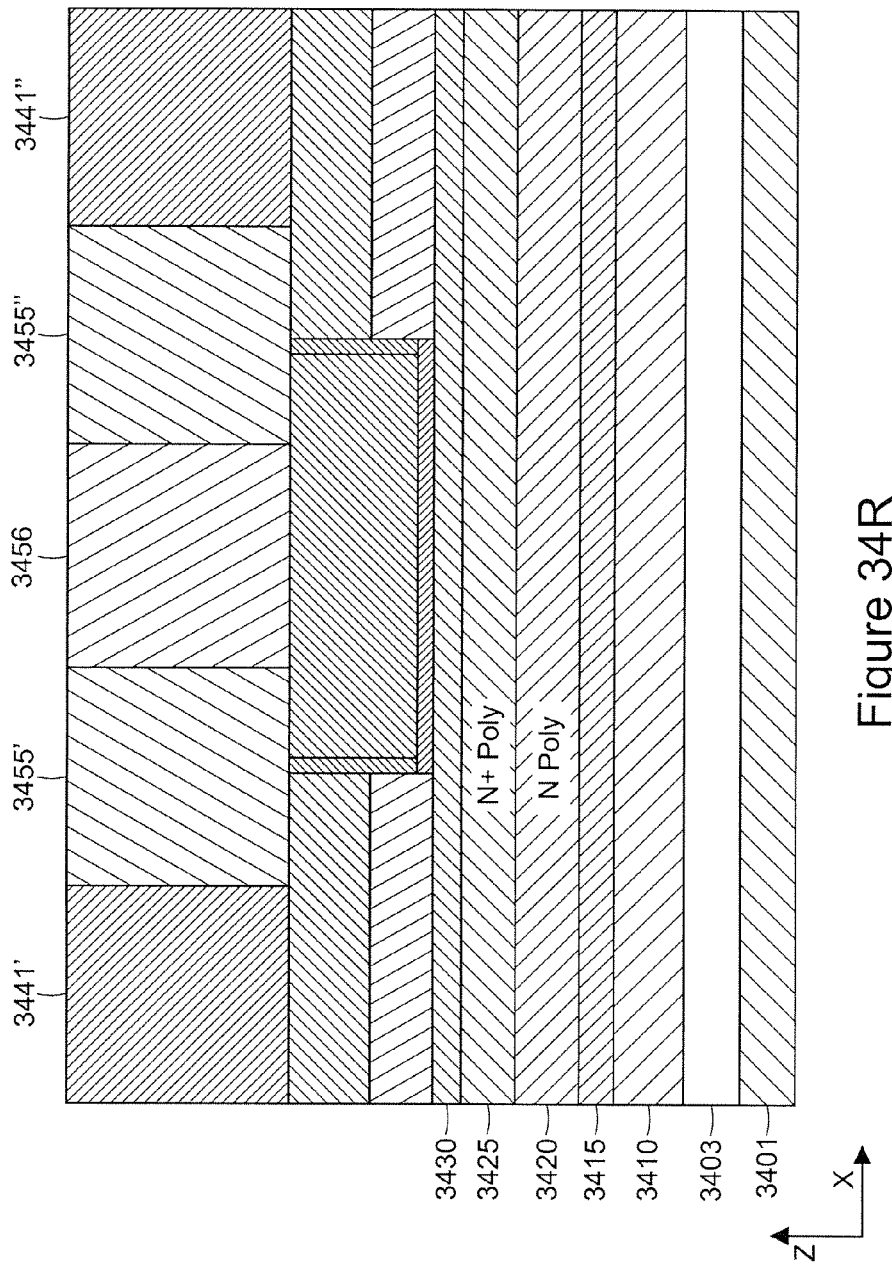
Figure 34S:
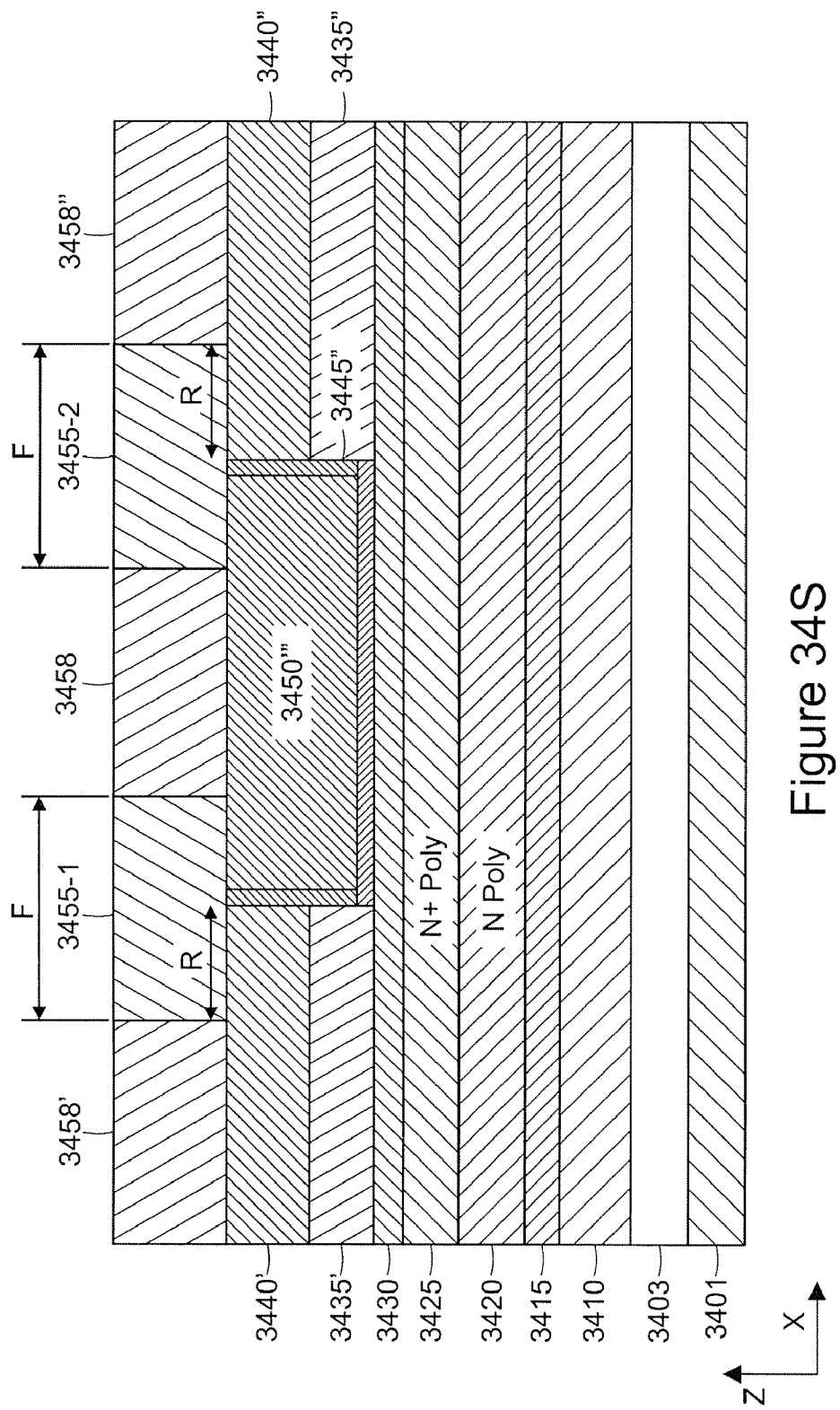
Figure 34T:
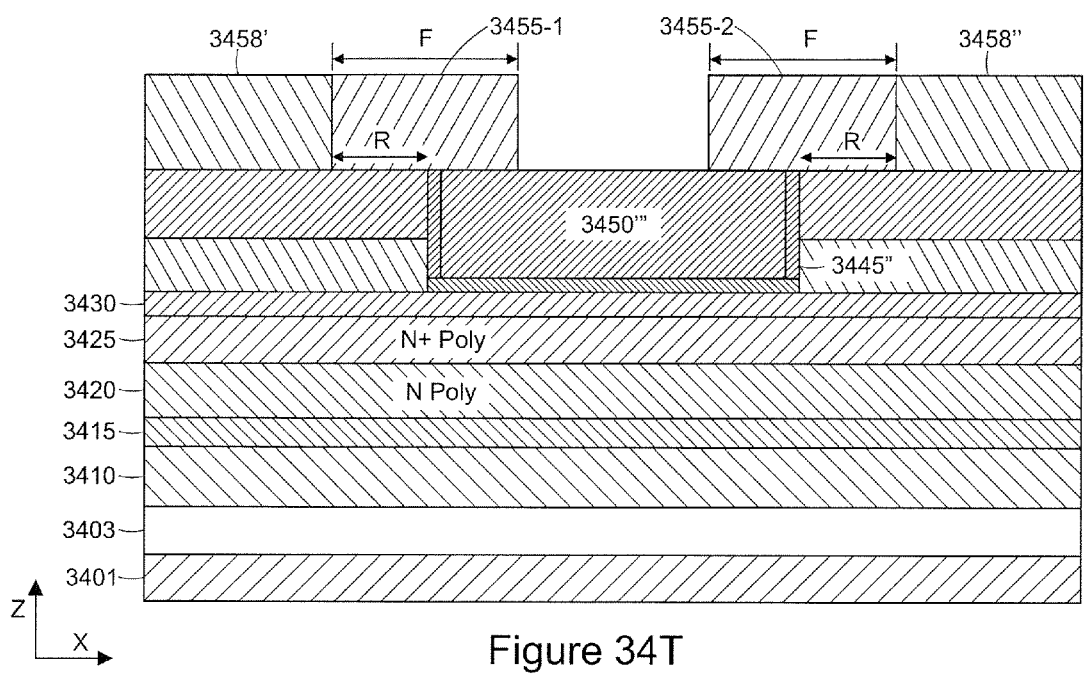
Figure 34U:
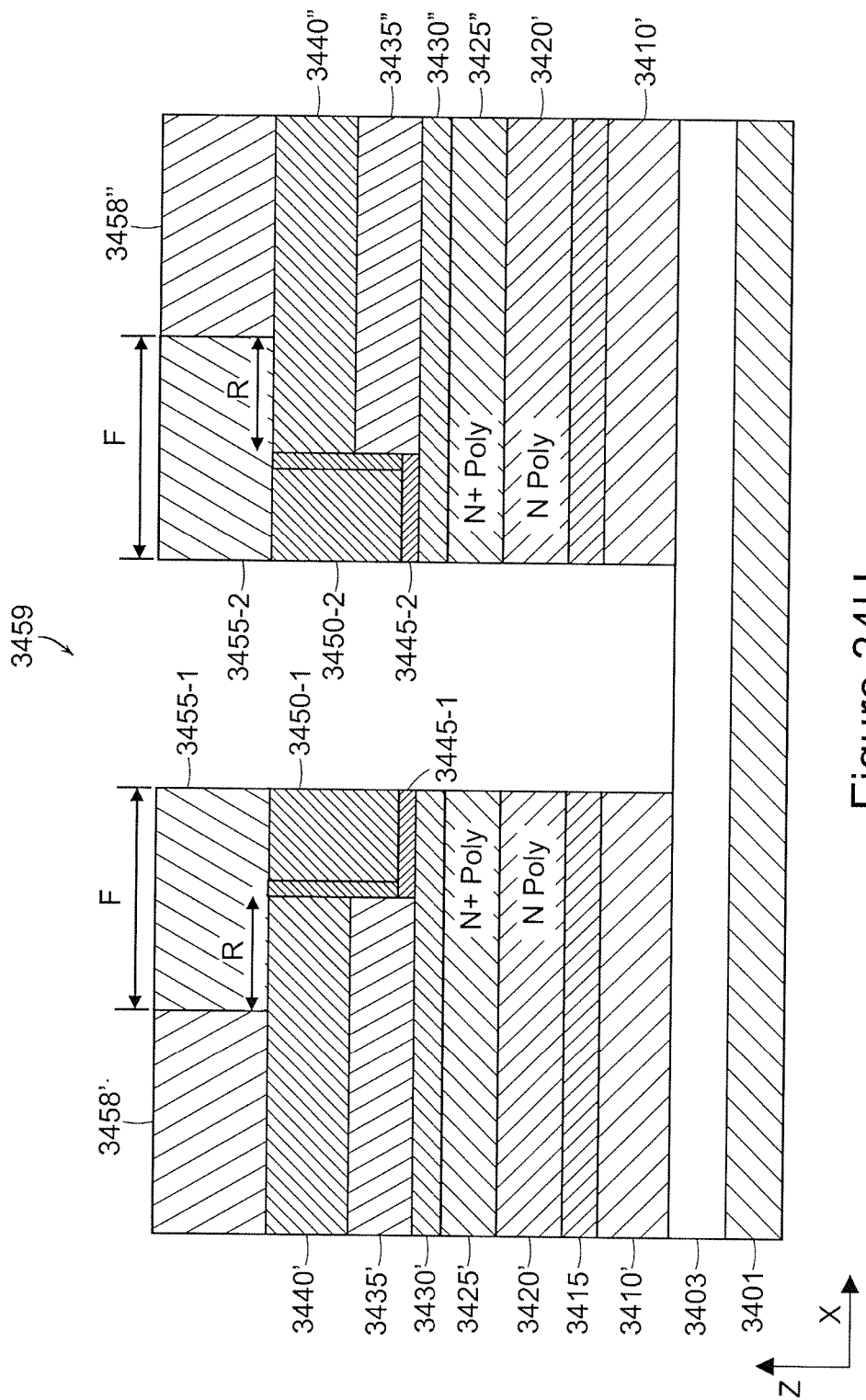
Figure 34V:
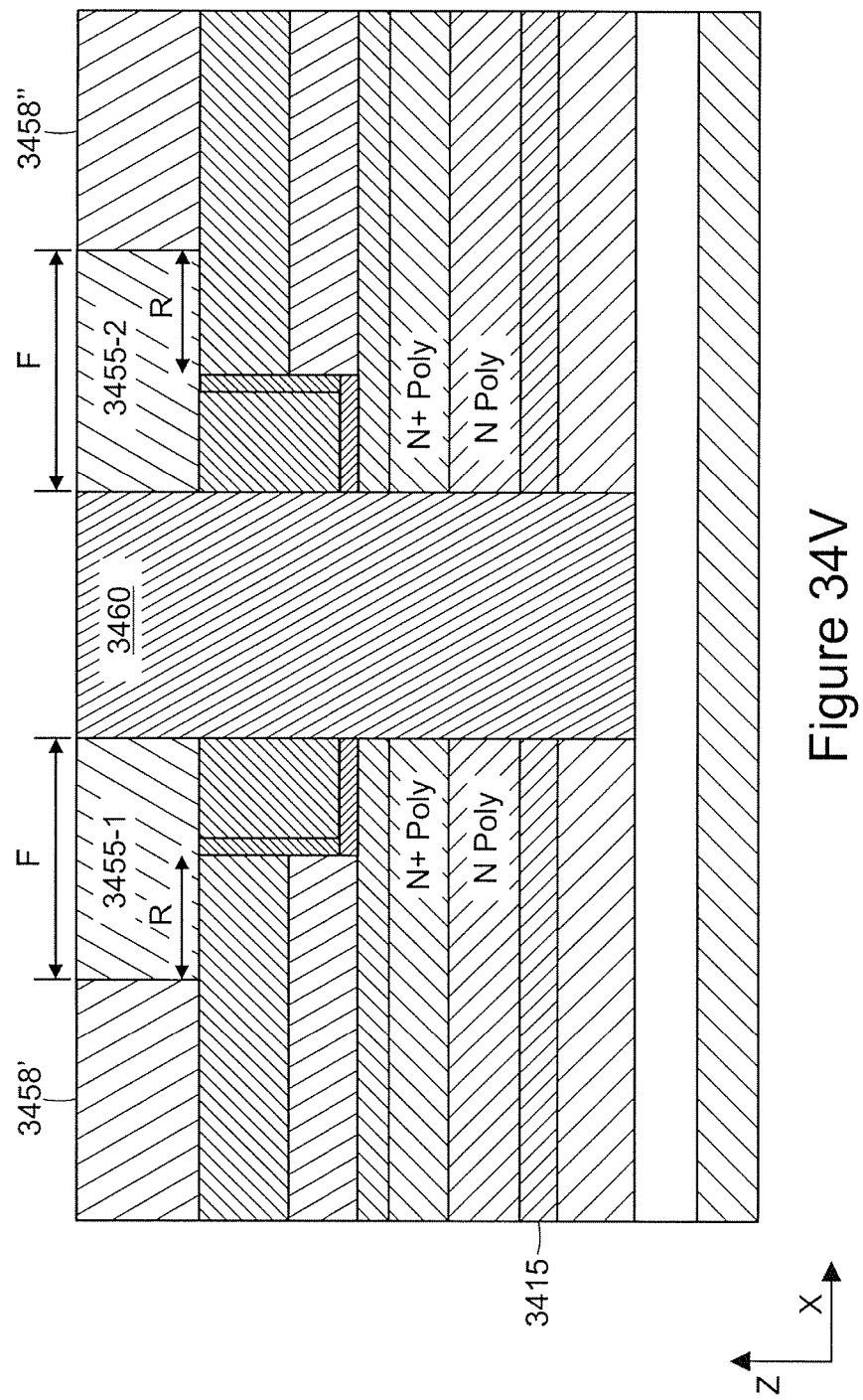
Figure 34W:
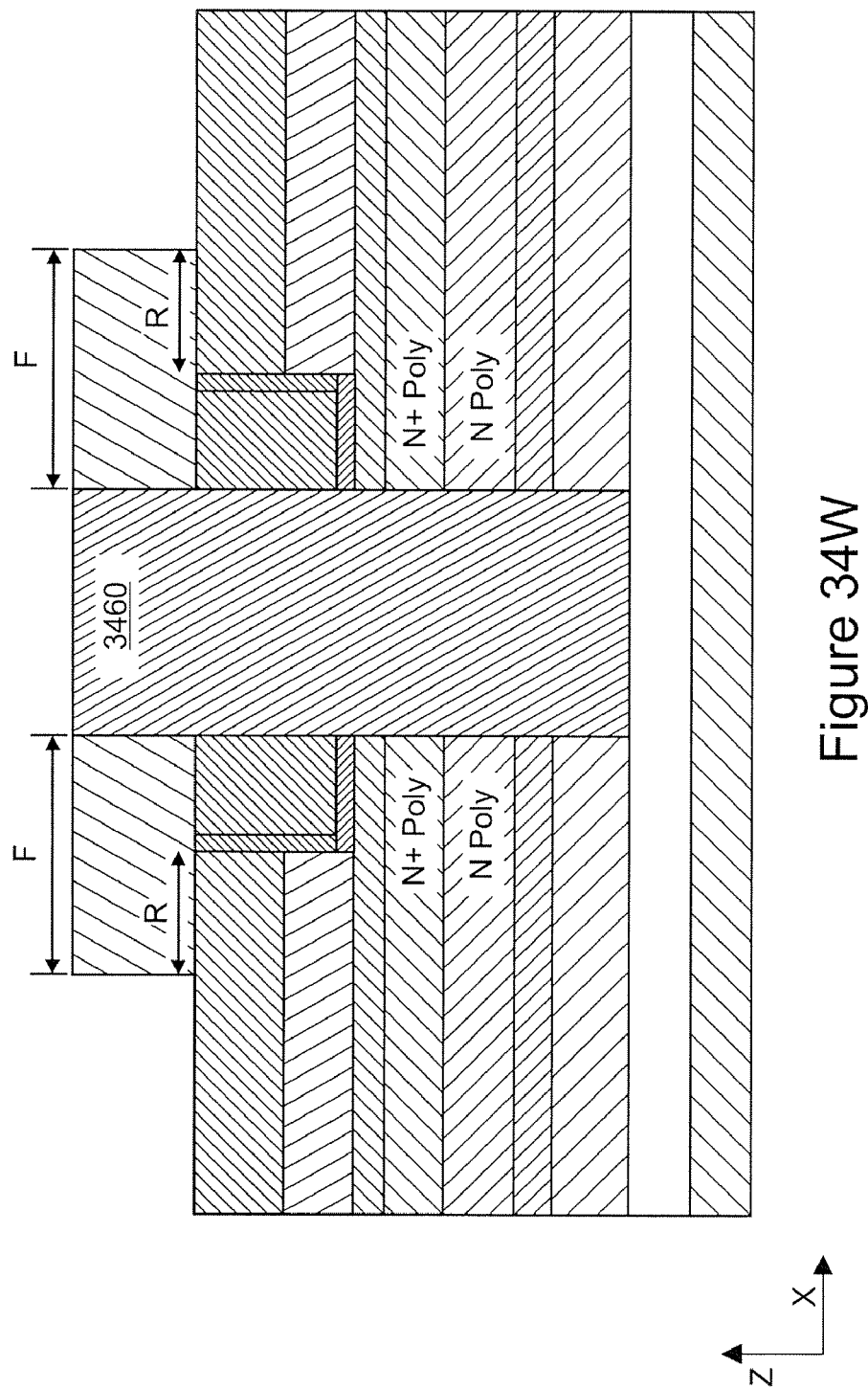
Figure 34X:
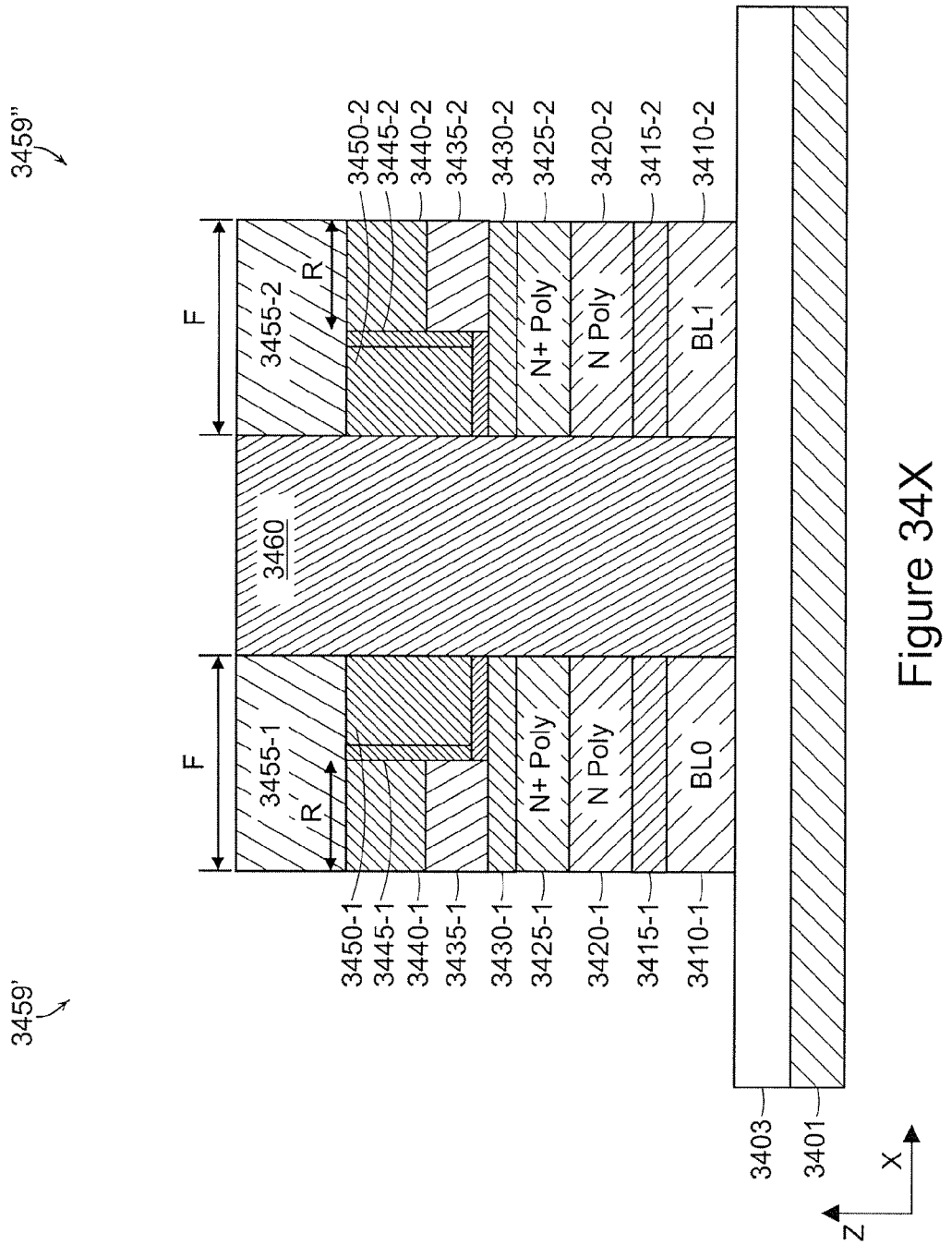
Figure 34Y:
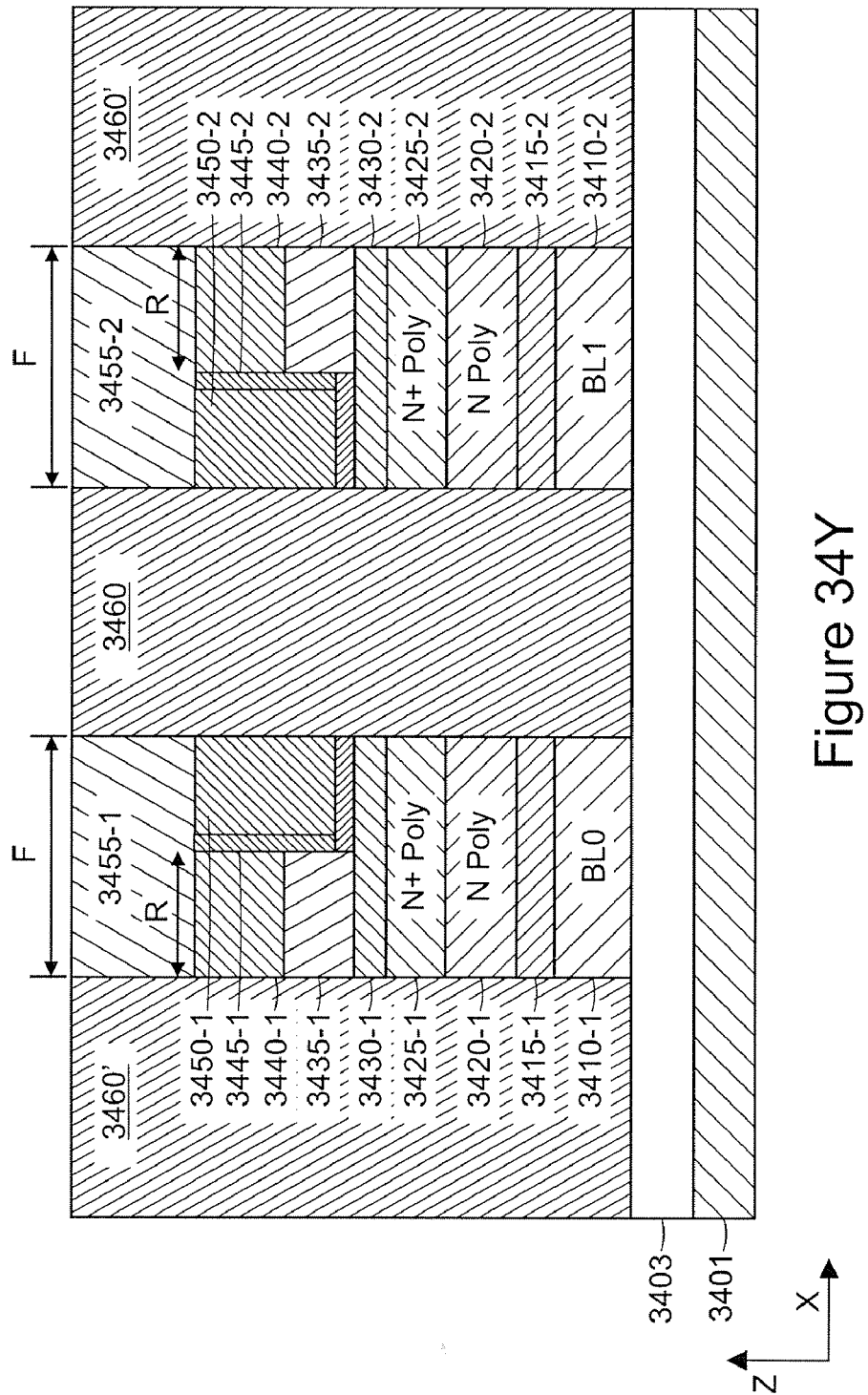
Figure 34Z:
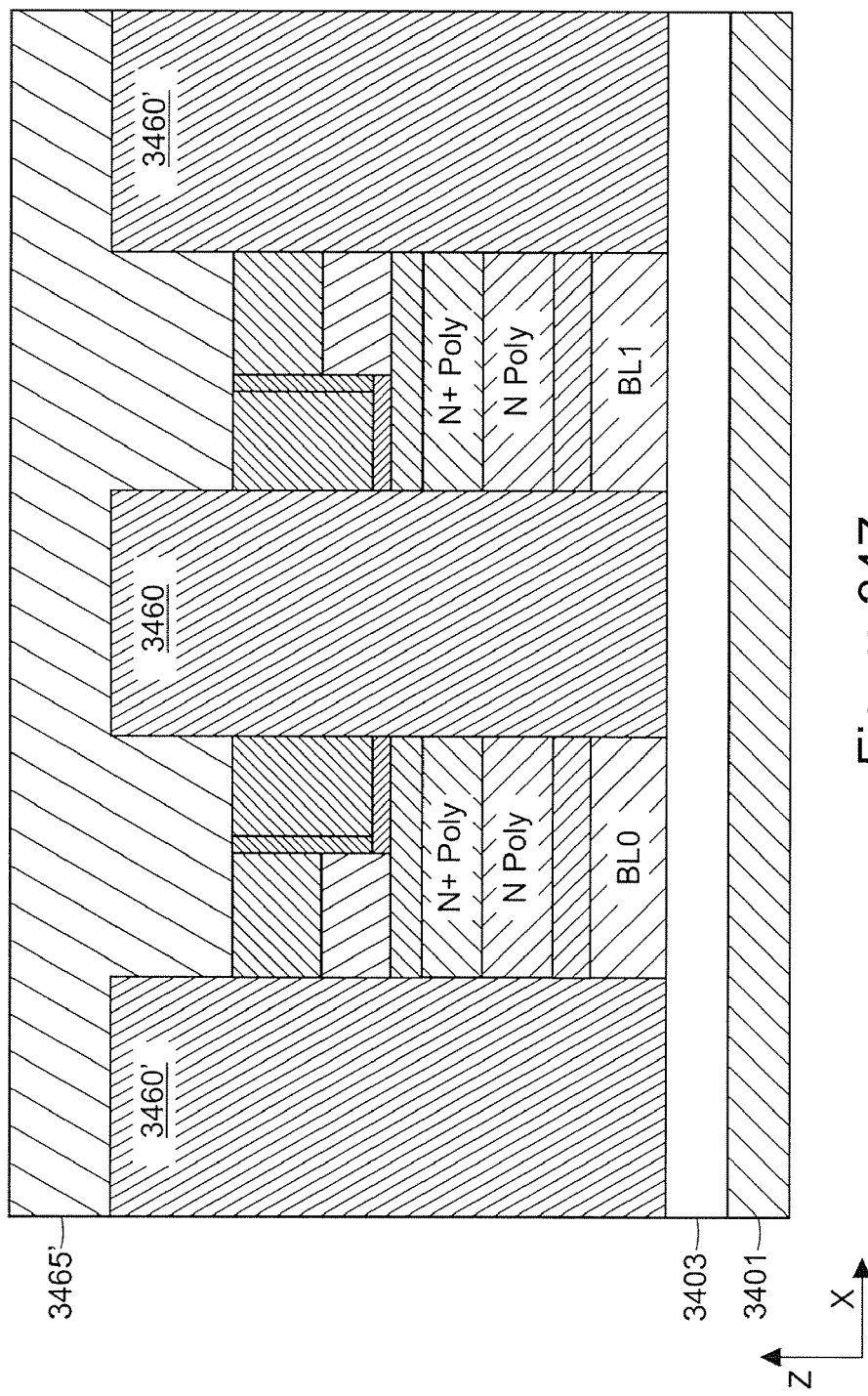
Figure 34A:
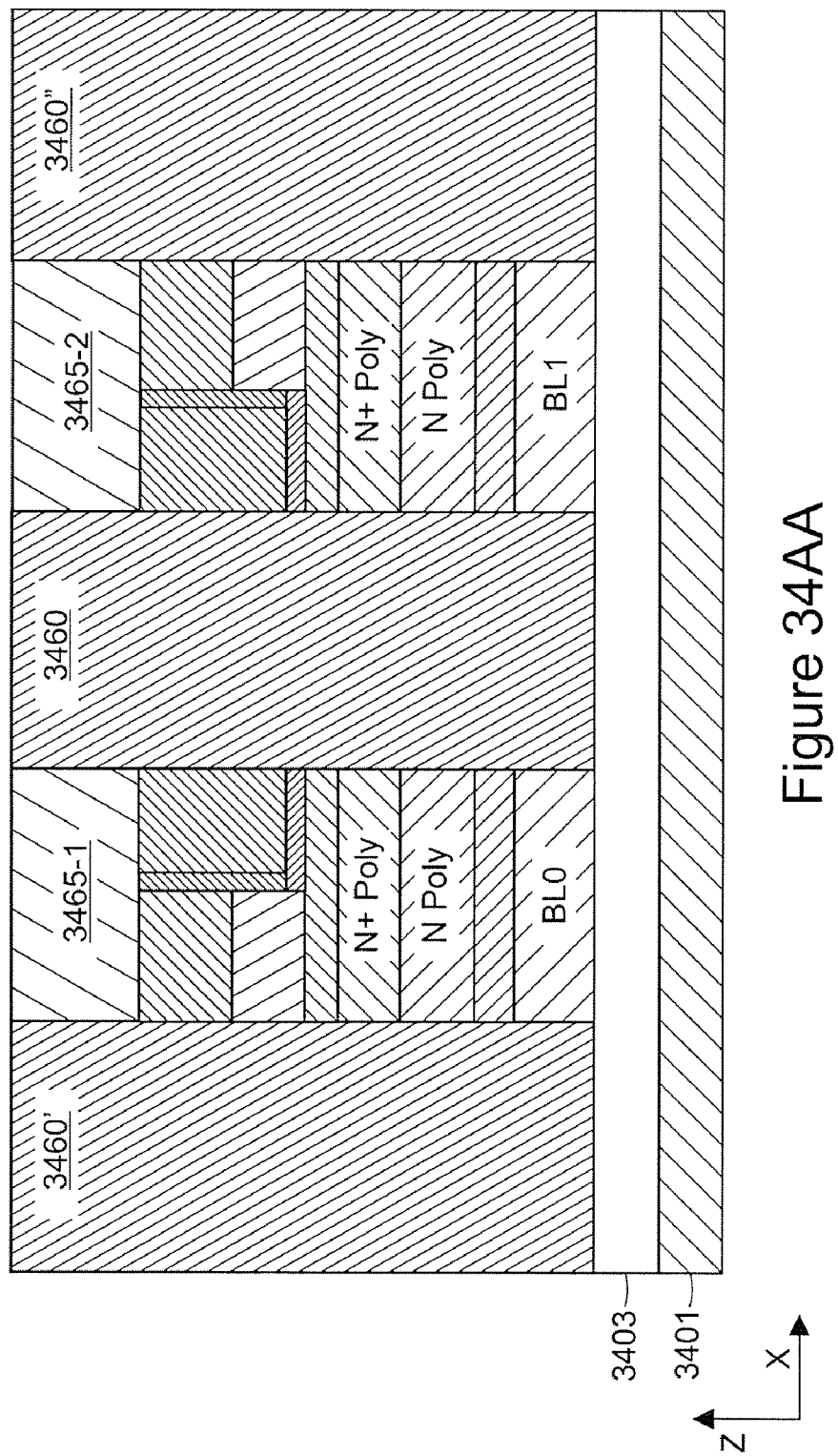
Figure 34B:
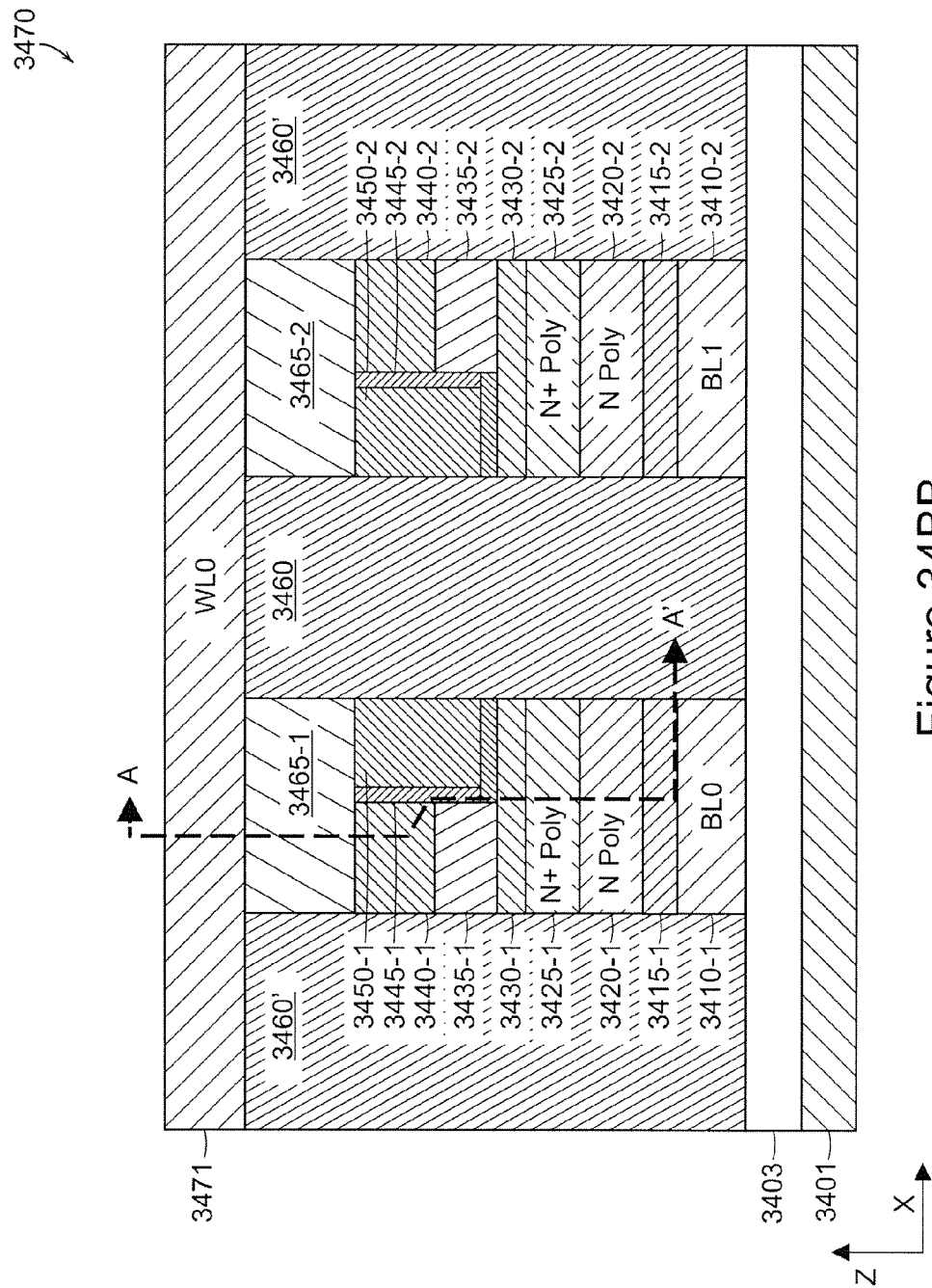
Figure 34C:
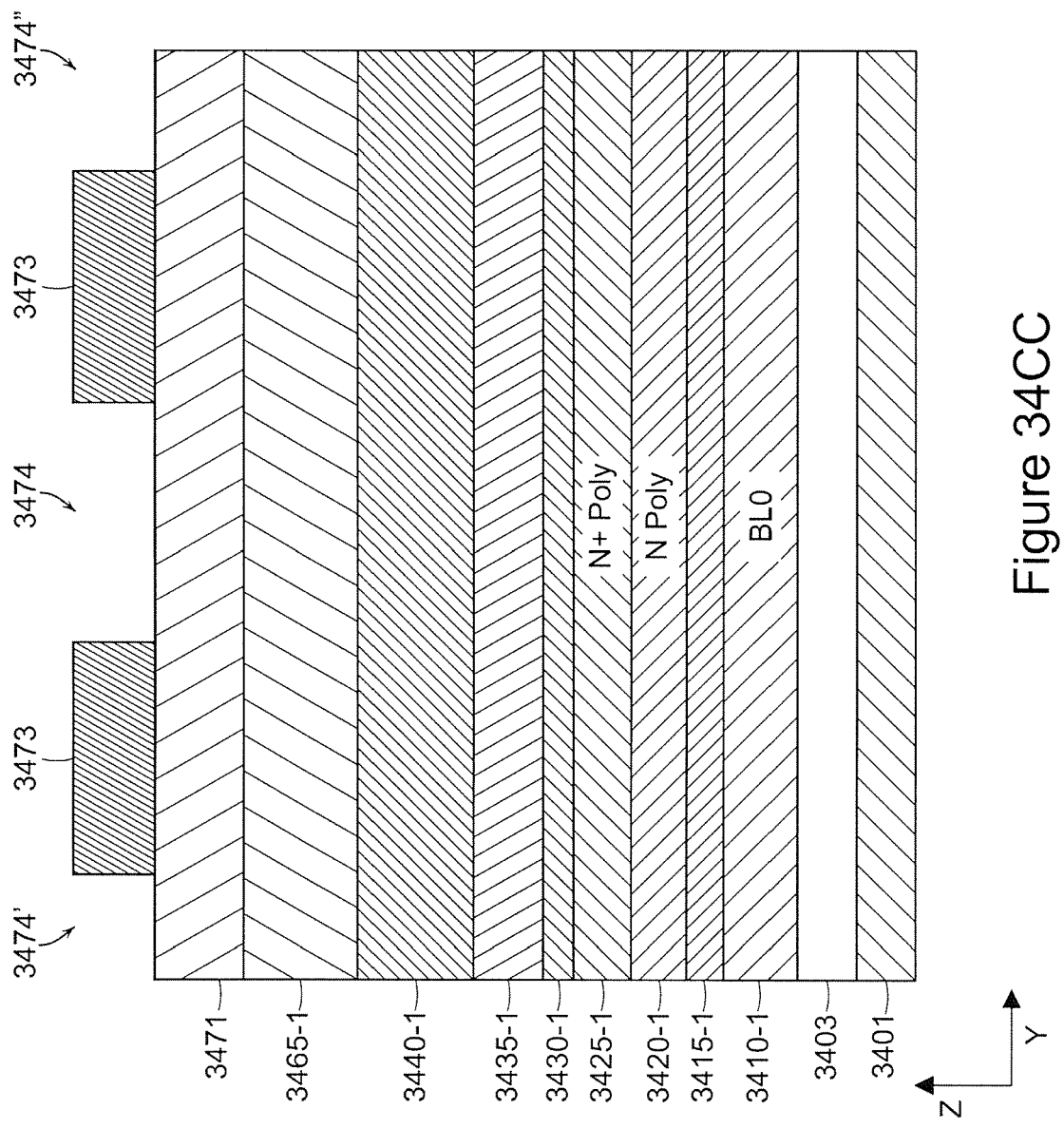
Figure 34D:
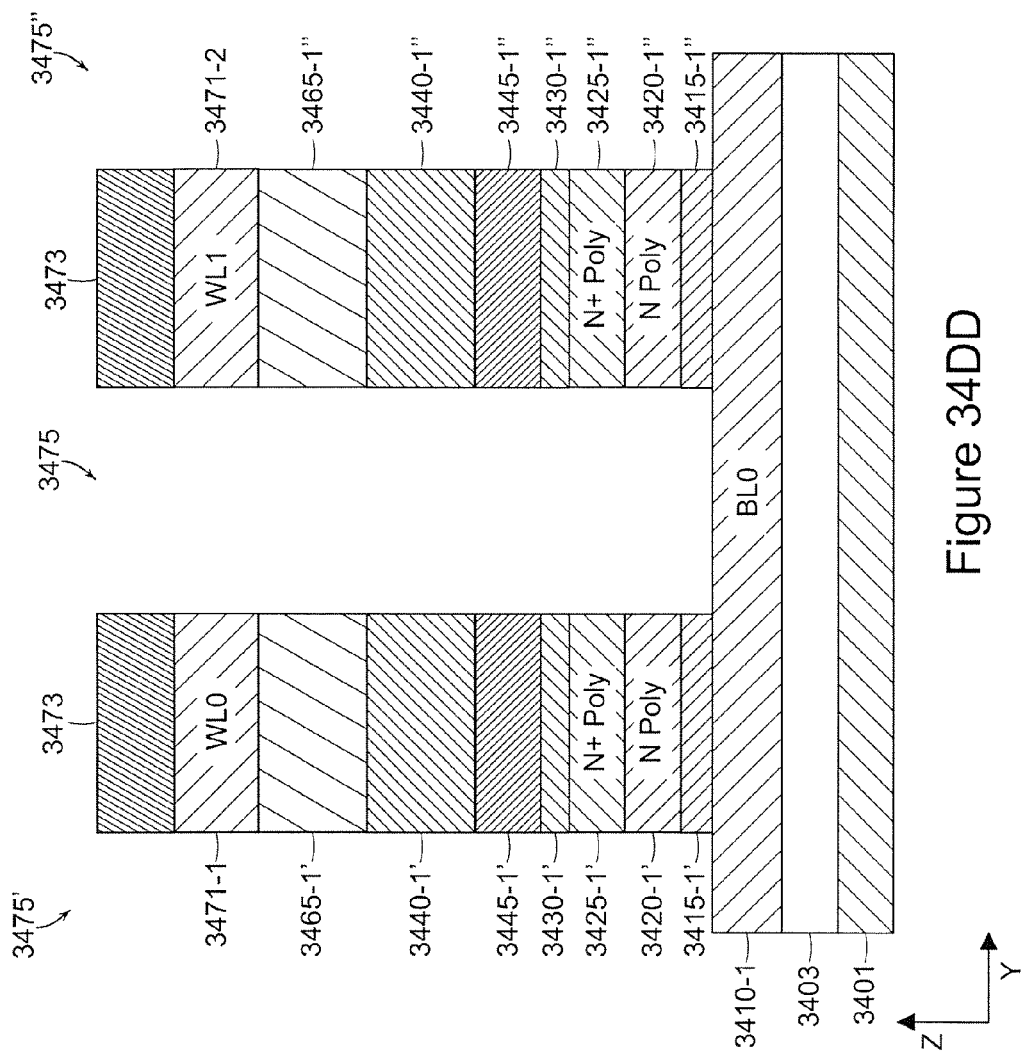
Figure 34E:
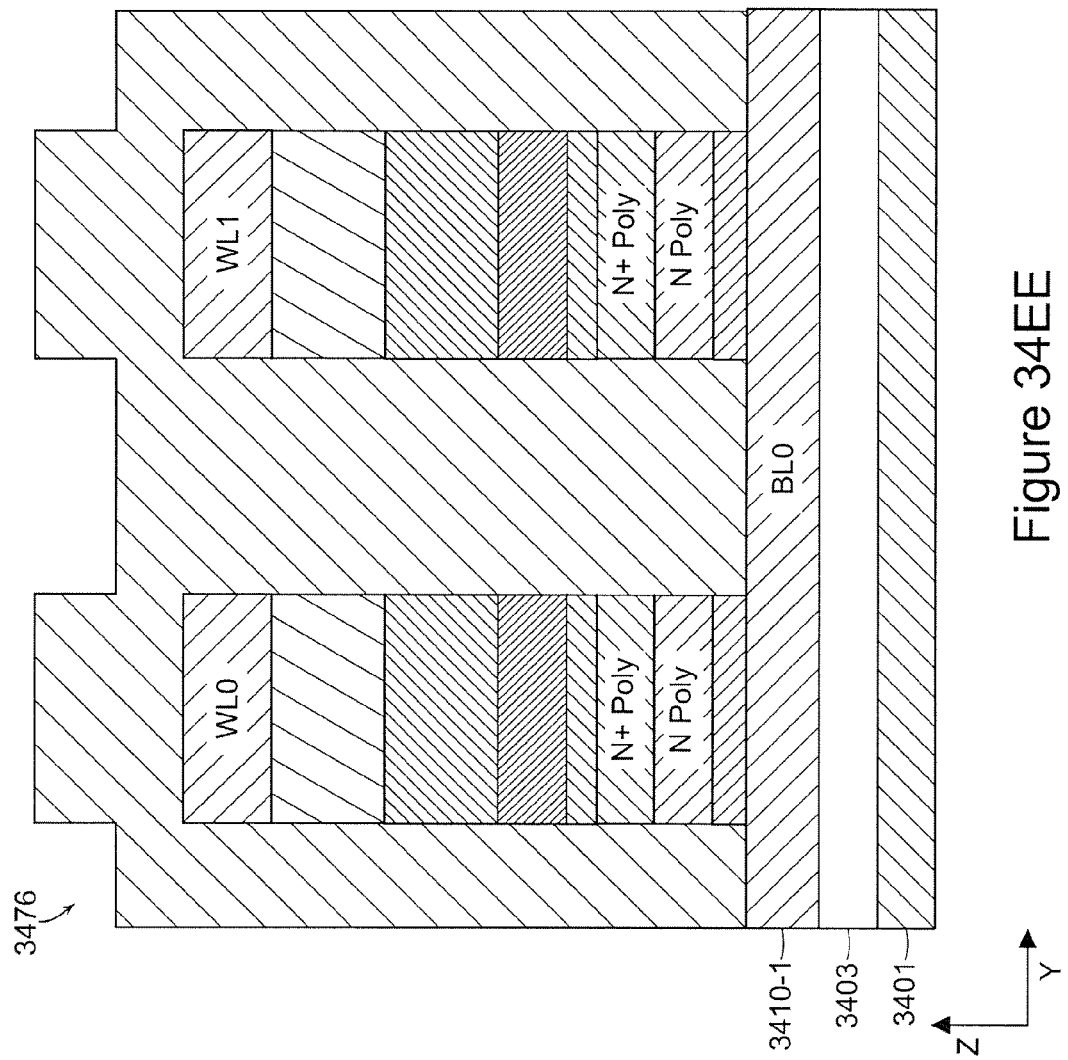
Figure 34F:
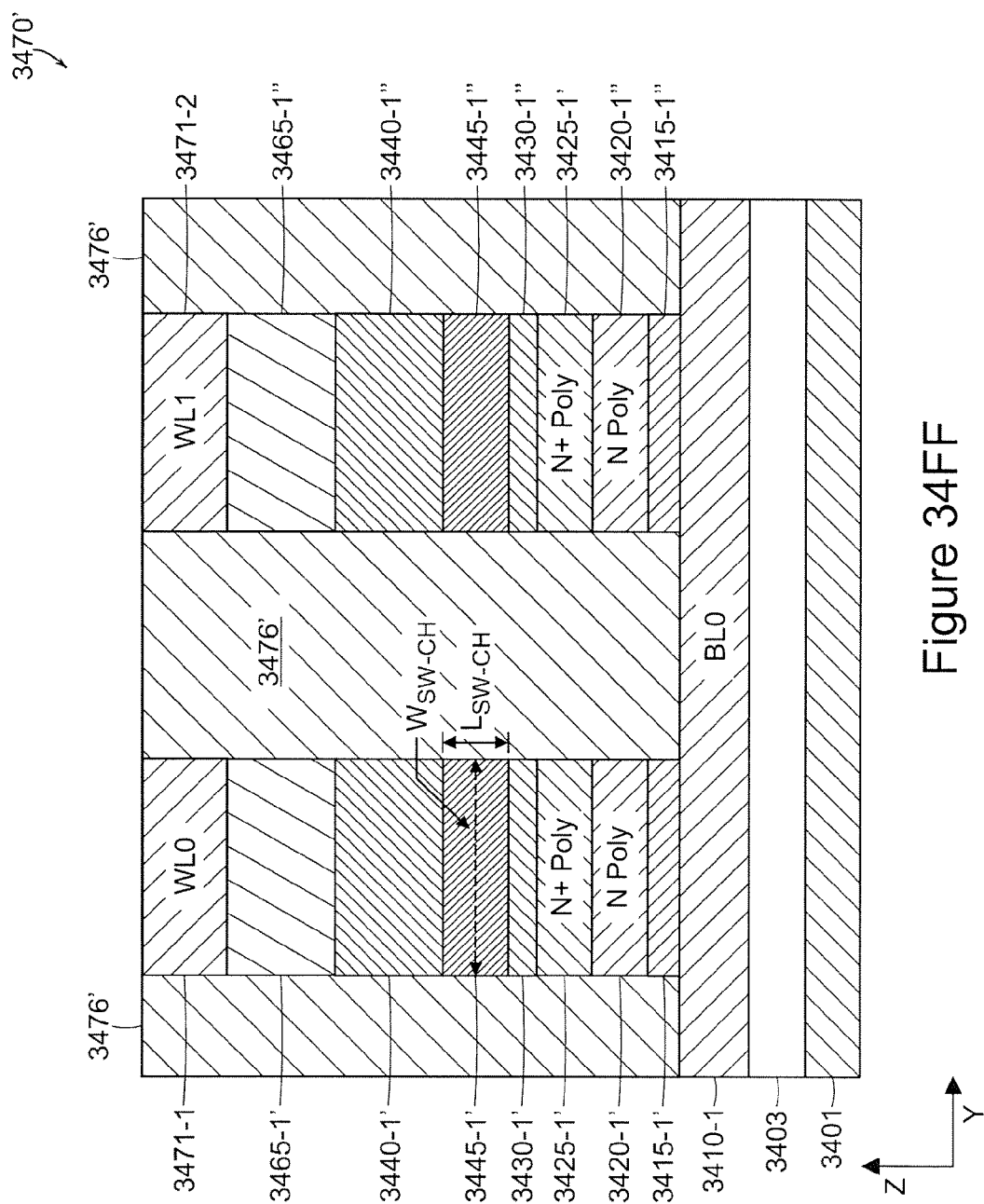

Exemplary methods of fabrication of embodiments of stacked arrays based on 3-dimensional cell structures of nonvolatile cells using NV NT Devices having vertically oriented diodes and vertically oriented NV NT switches using both cathode-to-NT Switch and anode-to-NT switch connected cell types, such as those shown in cross section 3300 illustrated in FIG. 33A, cross section 3300' illustrated in FIG. 33A', and cross section 3300' illustrated in FIG. 33B, are a combination of methods of fabrication described further below with respect to FIGS. 34A-FF and 36A-FF.

Methods of Fabricating Nonvolatile Memories Using NV NT Diode Devices with Cathode-to-NT Switch Connection Methods 2700 illustrated in FIGS. 27A and 27B may be used to fabricate embodiments of memories using NV NT diode devices with cathode-to-NT switch connections for vertically oriented NV NT switches such as those shown in cross section 2800 illustrated in FIG. 28A and cross section 2800' illustrated in FIG. 28B as described further below with respect to FIGS. 34A-34FF. Structures such as cross section 2800 and 2800' may be used to fabricate, e.g., memory 2600 illustrated schematically in FIG. 26A.

Methods of fabricating cross sections 2800 and 2800' typically require critical alignments in X direction process steps. There are no critical alignments in the Y direction because in this example distance between trenches determines the width of the nanotube element. However, the width of the nanotube element may be formed to be less than the trench-to-trench spacing by using methods similar to those described further below with respect to the X direction. In the X direction, critical alignment requirements are eliminated by using methods that form self-aligned internal cell vertical sidewalls that define vertical nanotube channel element location, vertical channel element length ($L_{SW\_CH}$), and form nanotube channel element contacts with respect to trench sidewalls that are etched later in the process to define outer cell dimensions using methods of fabrication described further below with respect to FIGS. 34A-34FF. In this example, NV NT diode cell structures occupy a minimum dimension F in the X and Y directions, where F is a minimum photolithographic dimension. In this example, the internal cell vertical sidewall is positioned (by self alignment techniques) at approximately R distance from trench sidewalls that are separated by distance F and that define outer cell dimensions as illustrated further below with respect to FIGS. 34A-34FF. FIGS. 34A-34FF is illustrated with a spacing R of approximately F/2. However, methods using self alignment techniques described further below with respect to FIGS. 34A-34FF may position a vertical sidewall at any location R within the cell region of width F using R values of F/4, F/3, F/2, 3F/4, etc for example.

Methods 2700 illustrated in FIGS. 27A and 27B may also be used to fabricate embodiments memories using NV NT diode devices with cathode-to-NT switch connections for horizontally oriented NV NT switches such as those shown in cross section 2800" illustrated in FIG. 28C as described further below with respect to FIGS. 35A-35S. Structures such as cross section 2800" also may be used to fabricate memory, e.g., memory 2600 illustrated schematically in FIG. 26A.

Methods of Fabricating 3-Dimensional Cell Structure of Nonvolatile Cells Using NV NT Devices Having Vertically Oriented Diodes and Vertically Oriented NT Switches with Cathode-to-NT Switch Connection Methods 2710 illustrated in FIG. 27A can be used to define support circuits and interconnects similar to those described with respect to memory 2600 illustrated in FIG. 26A as described further above. Methods 2710 apply known semiconductor industry techniques design and fabrication techniques to fabricated support circuits and interconnections 3401 in and/or on a semiconductor substrate as illustrated in FIG. 34A. Support circuits and interconnections 3401 include FET devices in a semiconductor substrate and interconnections such as vias and wiring above a semiconductor substrate.

Next, methods 2730 illustrated in FIG. 27B deposit and planarize insulator 3403 on the surface of support circuits and interconnections 3401 layer. Interconnect means through planar insulator 3403, not shown in FIG. 34A, are shown further below with respect to FIGS. 35A-35S. The combination of support circuits and interconnections 3401 and planarized insulator 3403 is referred to as memory support structure 3405 as illustrated in FIG. 34A.

Next, methods deposit a conductor layer 3410 on the planarized surface of insulator 3403 as illustrated in FIG. 34A, typically 50 to 500 nm thick, using known industry methods. Examples of conductors layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. In some cases materials such as those used in conductor layer 3410 may also be used as anodes for Schottky diodes, in which case a separate layer such as contact layer 3415 used to form anodes of Schottky diodes is not required and may be omitted from methods of fabrication.

Next, methods deposit a an optional conductive Schottky anode contact layer 3415 having a thickness range of 10 to 500 nm, for example, on the surface of conductor layer 3410. Anode contact layer 3415 may use similar materials to those used in forming conductor layer 3410 (or contact layer 3415 may be omitted entirely and conductor layer 3410 may be used to form a Schottky anode), or anode contact layer 3415 material may be chosen to optimize anode material for enhanced Schottky diode properties such lower forward voltage drop and/or lower diode leakage. Anode contact layer 3415 may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used.

Next, methods deposit an N polysilicon layer 3420 of thickness 10 nm to 500 nm on the surface of anode contact layer 3415. N polysilicon layer 3420 may be doped with arsenic or phosphorus in the range of $10^{14}$ to $10^{17}$ dopant atoms/cm$^3$, for example. N polysilicon layer 3420 may be used to form cathodes of Schottky diodes. In addition to doping levels, the polysilicon crystalline size (or grain structure) of N Polysilicon layer 3420 may also be controlled by known industry methods of deposition. Also, known industry SOI methods of deposition may be used that result in polysilicon regions that are single crystalline (no longer polysilicon), or nearly single crystalline.

Next, having completed memory support structure 3405, then deposited conductor layer 3410 which may be used as an array wiring layer, and then completed the deposition of Schottky diode forming layers 3415 and 3420, methods deposit N+ polysilicon layer 3425 on the surface of N polysilicon layer 3420 as illustrated in FIG. 34A in order to form an ohmic contact layer. N+ polysilicon layer 3425 is typically doped with arsenic or phosphorous to $10^{20}$ dopant atoms/cm$^3$, for example, and has a thickness of 20 to 400 nm, for example.

At this point in the process, remaining methods may be used to fabricate NV NT diode using Schottky diode-based cathode-to-NT switch structures such as those illustrated in FIG. 28A. However, as described further above with respect to FIG. 28B for example, NV NT diodes may be formed using PN diodes instead of Schottky diodes. Therefore, alternatively, a PN diode alternative fabrication method is illustrated in FIG. 34A'.

Methods 2700 described further above, and with respect to FIG. 34A, may also be used to describe the fabrication of FIG. 34A'. Support circuits and interconnections 3401' illustrated in FIG. 34A' correspond to support circuits and interconnections 3401 illustrated in FIG. 34A, except for possible small changes that may be introduced in individual circuits to accommodate differences in diode characteristics such as turn-on voltage, for example, between Schottky diodes and PN diodes.

Next, methods deposit planarized insulator 3403' on the surface of support circuits and interconnections 3401' as illustrated in FIG. 34A'. Planarized insulator 3403' corresponds to planarized insulator 3403 except for possible small changes that may be introduced in insulator 3403' to accommodate differences in diode characteristics. Memory support structure 3405' is therefore similar to support structures 3405 except for small changes that may be introduced in support circuits and interconnections 3401' and planarized insulator 3403' as described further above with respect to FIG. 34A'.

Next, methods deposit conductor layer 3410' in contact with the surface of planarized insulator 3403' as illustrated in FIG. 34A' which is similar in thickness and materials to conductor layer 3410 described further above with respect to FIG. 34A.

Next, methods deposit a P polysilicon layer 3417 of thickness 10 nm to 500 nm on the surface of conductor layer 3410' as illustrated in FIG. 34A'. P polysilicon layer 3417 may be doped with boron in the range of $10^{14}$ to $10^{17}$ dopant atoms/cm$^3$, for example. P polysilicon layer 3417 may be used to form anodes of PN diodes. In addition to doping levels, the polysilicon crystalline size of P Polysilicon layer 3417 may also be controlled by known industry methods of deposition. Also, known industry SOI methods of deposition may be used that result in polysilicon regions that are single crystalline (no longer polysilicon), or nearly single crystalline.

Next, methods deposit an N polysilicon layer 3420' of thickness 10 nm to 500 nm on the surface of P polysilicon layer 3417 that may be used to form cathodes of PN diodes. N polysilicon layer 3420' may be doped with arsenic or phosphorus in the range of $10^{14}$ to $10^{17}$ dopant atoms/cm$^3$, for example. In addition to doping levels, the polysilicon crystalline size (grain structure) of N Polysilicon layer 3420' may also be controlled by known industry methods of deposition. Also, known industry SOI methods of deposition may be used that result in polysilicon regions that are single crystalline (no longer polysilicon), or nearly single crystalline.

Next, having completed memory support structure 3405', then deposited conductor layer 3410' which may be used as an array wiring layer, and then completed the deposition PN diode forming layers 3417 and 3420', N+ polysilicon layer 3425' is deposited on N polysilicon layer 3420' in order to form an ohmic contact layer as illustrated in FIG. 34A'. N+ polysilicon layer 3425' is typically doped with arsenic or phosphorous to $10^{20}$ dopant atoms/cm$^3$, for example, and has a thickness of 20 to 400 nm, for example.

Descriptions of methods of fabrication continue with respect to Schottky-diode based structures described with respect to FIG. 34A to form NV NT diode cell structures corresponding to cross section 2800 illustrated in FIG. 28A. However, these methods of fabrication may also be applied to the PN diode-based structures described with respect to FIG. 34A' to form NV NT diode cell structures corresponding to cross section 2800' illustrated in FIG. 28B.

At this point in the fabrication process, methods deposit contact layer 3430 on the surface of N+ polysilicon layer 3425 as illustrated in FIG. 34B. Contact layer 3430 may be 10 to 500 nm in thickness, for example. Contact layer 3430 may be formed using Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, for example.

Next, methods deposit an insulator layer 3435 on contact layer 3430 as illustrated in FIG. 34B. The thickness of insulator layer 3435 may be well controlled and in some embodiments can be used to determine the channel length of vertically oriented nonvolatile nanotube switches as illustrated further below with respect to FIG. 34I. The thickness of insulator layer 3435 may vary in thickness from less than 5 nm to greater than 250 nm, for example. Insulator 3435 may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. U.S. patent application Ser. No. 11/280,786 includes some examples of various dielectric materials.

Next, methods deposit contact layer 3440 on insulator layer 3435 as illustrated in FIG. 34B. Contact layer 3440 may be in the range of 10 to 500 nm thick, for example, and may be formed using various conductor materials similar to materials described with respect to contact 3430 described further above.

Next methods deposit sacrificial layer 3441 on contact layer 3440 as illustrated in FIG. 34C. Sacrificial layer 3441 may be in the range of 10 to 500 nm thick, for example, and be formed using conductor, semiconductor, or insulator materials such as materials described further above with respect to contact layer 3430, semiconductor layers 3420 and 3425, and insulator layer 3435.

Next, methods deposit and pattern a masking layer such as masking layer 3442 deposited on the top surface of sacrificial layer 3441 as illustrated in FIG. 34C using known industry methods. The mask opening may be aligned to alignment marks in planar insulating layer 3403 for example; the alignment is not critical.

Then, methods directionally etch sacrificial layer 3441 to form an opening of dimension $D_{OPEN-1}$ in the X direction through sacrificial layer 3441 stopping at the surface of contact layer 3440 using known industry methods as illustrated in FIG. 34D. Two memory cells that include vertical nanotube channel elements self aligned and positioned with respect to vertical edges of sacrificial regions 3441' and 3441" are formed as illustrated further below. The dimension $D_{OPEN-1}$ in the X direction is approximately 3F, where F is a minimum photolithographic dimension. For a 65 nm technology node, $D_{OPEN-1}$ is 195 nm, which is a non-minimum and therefore non-critical dimension at any technology node. At this point in the process, sidewall spacer techniques are used to position vertical sidewalls at a distance R from the inner surfaces of sacrificial regions 3441' and 3441" as described further below.

Next, methods deposit a conformal sacrificial layer 3443 as illustrated in FIG. 34E. In some embodiments, the thickness of conformal sacrificial layer 3443 is selected as R, which in this example is selected as approximately F/2. In this example, since R is approximately F/2, and since F is approximately 65 nm, then the thickness of conformal sacrificial layer 3443 is approximately 32.5 nm. Conformal sacrificial layer 3443 may be formed using conductor, semiconductor, or insulator materials similar to those materials used to form sacrificial layer 3441 described further above.

Next, methods directionally etch conformal sacrificial layer 3443 using reactive ion etch (RIE) for example, using known industry methods, forming opening 3444 of dimension $D_{OPEN-2}$ and sacrificial regions 3443' and 3443", both having vertical sidewall of sacrificial regions 3441' and 3441", respectively, by a distance R in the X direction as illustrated in FIG. 34F. Distance R is approximately equal to F/2, or approximately 32.5 nm in this example. Dimension $D_{OPEN-2}$ of opening 3444 is approximately 2F, or approximately 130 nm for a 65 nm technology node, a non-critical dimension.

Next, methods directionally etch an opening through contact layer 3440 to the top surface of insulator layer 3435. Directional etching using RIE, for example, forms an opening of size $D_{OPEN-2}$ of approximately 2F (130 nm in this example) in contact layer 3440, and forms sidewall contact regions 3440' and 3440" as illustrated in FIG. 34G.

Next, methods directionally etch an opening through insulator layer 3435 to the top surface of contact layer 3430. Directional etching using RIE, for example, forms an opening 3444' of size $D_{OPEN-2}$ of approximately 2F (130 nm in this example) in insulator layer 3435, and forms insulator regions 3435' and 3435" as illustrated in FIG. 34H.

Next, methods deposit conformal nanotube element 3445 with vertical (Z) orientation on the sidewalls of opening 3444' as illustrated in FIG. 34I. The size of opening 3444' is approximately the same as the size of opening 3444. Conformal nanotube element 3445 may be 0.5 to 20 nm thick, for example, and may be fabricated as a single layer or as multiple layers using deposition methods such as spin-on and spray-on methods. Nanotube element methods of fabrication are described in greater detail in the incorporated patent references.

Since nanotube element 3445 is in contact with contact layer 3430 and the sidewalls of sidewall contact regions 3440' and 3440", separated by the thickness of insulator region 3435' and 3435", respectively, two nonvolatile nanotube switch channel regions are partially formed (channel width is not yet defined) having channel length $L_{SW-CH}$ in the Z direction corresponding to the thickness of insulator regions 3435' and 3435" in the range of 5 nm to 250 nm as illustrated in FIG. 34I. The vertical (Z-axis) portion of nanotube element 3445 is separated from the inner vertical sidewalls of sacrificial regions 3441' and 3441" by a self-aligned distance R. These partially formed vertical nonvolatile nanotube switches are similar to vertically oriented nonvolatile nanotube elements 765 and 765' of memory storage regions 760A and 760B, respectively, illustrated in FIG. 7B. Conformal nanotube element 3445 is also in contact with sacrificial regions 3443' and 3443" and sacrificial regions 3441' and 3441" as illustrated in FIG. 34I.

Next methods deposit conformal insulator layer 3450 on nanotube element 3445 as an insulating and protective layer and reduces opening 3444' to opening 3451 as illustrated in FIG. 34J. Opening 3451 is similar to opening 3444', except for the addition of conformal insulator 3450 and conformal nanotube element 3445. Conformal insulator 3450 may be 5 to 200 nm thick, for example, and may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Insulator 3450 is deposited to a thickness sufficient to ensure protection of nanotube element 3445 from high density plasma (HDP) deposition.

At this point in the process, it is desirable to partially fill opening 3451 by increasing the thickness of the bottom portion of insulator 3450 in the vertical (Z direction) on horizontal surfaces with little or no thickness increase on the sidewalls (vertical surfaces) of insulator 3450, forming insulator 3450'. Exemplary industry methods of using HDP deposition to fill openings with a dielectric layer are disclosed in U.S. Pat. No. 4,916,087, the entire contents of which are incorporated herein by reference, for example. However, U.S. Pat.

No. 4,916,087 fills openings by depositing dielectric material on horizontal and vertical surfaces. Other methods of directional HDP insulator deposition may be used instead, e.g., by directionally depositing a dielectric material such that more than 90% of the insulator material is deposited on horizontal surfaces and less than 10% of the insulator material is deposited on vertical surfaces with good thickness control. A short isotropic etch may be used to remove insulator material deposited on vertical surfaces. The thickness of the additional dielectric material is not critical. The additional dielectric material may be the same as that of conformal insulator 3450 or may be a different dielectric material. Dielectric material selection with respect to nanotube elements is described in greater detail in U.S. patent application Ser. No. 11/280,786.

Next, methods directionally deposit an insulator material in opening 3451 using known industry methods such as selective HDP insulator deposition and increase insulator thickness primarily on horizontal surfaces as illustrated by insulator 3450' in opening 3451' and on top surfaces in FIG. 34K.

Next, methods deposit and planarize an insulator 3452 such as TEOS filling opening 3451' as illustrated in FIG. 34L.

Next, methods planarize the structure illustrated in FIG. 34L in order to remove the top portion of insulator 3450' and the top portion of underlying nanotube element 3445 as illustrated in FIG. 34M. The top of sacrificial regions 3441', 3441", 3443', and 3443" may be used as CMP etch stop reference layers. Insulator 3450" is the same as insulator 3450' except that the top horizontal layer has been removed. Nanotube element 3445' is the same as nanotube element 3445 except that the top horizontal layer has been removed. Insulator 3452' is the same as insulator 3452 except that insulator thickness has been reduced.

Next, methods etch (remove) sacrificial regions 3443' and 3443" and insulator 3452'. Exposed vertical sidewalls of nanotube element 3445' and conformal insulator 3450" remain as illustrated in FIG. 34N.

Next, methods etch (remove) the exposed portion of nanotube element 3445' forming nanotube element 3445" as illustrated in FIG. 34O. Methods of etching nanotube fabrics and elements are described in greater detail in the incorporated patent references.

Then, methods such as isotropic etch remove exposed portions of insulator 3450' to form insulator 3450'''.

At this point in the process, sidewall spacer methods are applied as illustrated further below to form self aligned sacrificial regions to be replaced further along in the fabrication process as illustrated further below by a conductor material to form the upper portion of nanotube element contacts and also to define self aligned trench regions to be used to define self-aligned cell dimensions along the X direction as also illustrated further below. Using sidewall spacer methods to form self aligned structures without requiring masking and alignment results in minimum cell areas.

In this example, with respect to FIGS. 34P and 34Q, a self aligned sacrificial region of X dimension F is formed using methods similar to those used in FIGS. 34E and 34F. Next, methods deposit a conformal sacrificial layer 3455 as illustrated in FIG. 34P. The thickness of conformal sacrificial layer 3455 is selected as F. In this example, since F is approximately 65 nm, then the thickness of conformal sacrificial layer 3455 is approximately 65 nm. Conformal sacrificial layer 3455 may be formed using conductor, semiconductor, or insulator materials similar to those materials used to form sacrificial layers 3441 and 3443 described further above.

Next, methods directionally etch conformal sacrificial layer 3455 using reactive ion etch (RIE) for example, using known industry methods, forming opening 3451" of dimension approximately F, which in this example is approximately 65 nm as illustrated in FIG. 34Q. The inner sidewalls of opening 3451" are defined by sacrificial regions 3455' and 3455" and are self-aligned to the inner walls of sacrificial regions 3441' and 3441" and separated by a distance of approximately F. These inner walls will be used as illustrated further below to form one side of an upper portion of a nanotube contact region and define one side of a cell in the X direction.

Next, methods deposit and planarize a sacrificial layer to form sacrificial region 3456 coplanar with sacrificial regions 3455', 3455", 3441', and 3441" as illustrated in FIG. 34R.

Next, methods apply CMP etching to reduce the thickness of sacrificial region 3456 to form sacrificial region 3458; the thickness of sacrificial regions 3455' and 3455" to form sacrificial regions 3455-1 and 3455-2, respectively; and the thickness of sacrificial regions 3441' and 3441" to form sacrificial regions 3458' and 3458", respectively as illustrated in FIG. 34S. Coplanar sacrificial regions 3458, 3458', 3458", 3455-1, and 3455-2 have thickness values in the range of 10 nm 200 nm, for example.

At this point in the process, sacrificial regions 3455-1 and 3455-2 may be used as masking layers for directional etching of trenches using methods that define outer cell dimensions along the X direction for 3D cells using one NV NT diode with cathode-to-nanotube connection. U.S. Pat. No. 5,670,803 to co-inventor Bertin discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may cut through multiple conductor, semiconductor, and oxide layers and stop on the top surface of a supporting insulator ($SiO_2$) layer between the 3D array structure and an underlying semiconductor substrate. Trench 3459 is formed first and then filled with an insulator and planarized. Then, trenches 3459', and 3459" are formed simultaneously and then filled and planarized as illustrated further below. Other corresponding trenches (not shown) are also etched when forming the memory array structure. Exemplary method steps that may be used to form trench regions 3459, 3459', and 3459" and then fill the trenches to form insulating trench regions are described further below.

Sacrificial regions 3458' and 3458" that define the location of trench regions 3459' and 3459" that are formed as described further below may be blocked with a sacrificial noncritical masking layer (not shown), while methods form trench 3469 using known directional selective etch methods such as reactive ion etch (RIE). Trench 3459 forms a first of two opposite vertical sidewalls in the X direction defining one side of NV NT diode cells. Alternatively, sacrificial region 3458 that defines the location of trench region 3459 that is formed further below may be etched selective to sacrificial regions 3458' and 3458" without requiring a noncritical masking layer.

First, methods directionally selectively etch (remove) exposed regions (portions) of sacrificial region 3458 using known industry methods as illustrated in FIG. 34T.

Next, methods selectively etch exposed regions (portions) of conformal insulator 3450''' using known industry methods and form conformal insulators 3450-1 and 3450-2 as illustrated in FIG. 34U.

Next, methods selectively etch exposed regions of nanotube element 3445" and form nanotube elements 3445-1 and

3445-2 as illustrated in FIG. 34U. Nanotube element methods of etching are described in greater detail in the incorporated patent references.

Next, methods selectively etch exposed regions of contact layer 3430 using known industry methods.

Next, methods selectively etch exposed regions of N+ polysilicon layer 3425 using known industry methods.

Next, methods selectively etch exposed regions of N polysilicon layer 3420 using known industry methods.

Next, methods selectively etch exposed regions of contact layer 3415 using known industry methods.

Then, methods etch exposed regions of conductor layer 3410 using known industry methods, forming trench 3459. Directional etching stops at the surface of planar insulator 3403.

Next, methods fill and planarize trench 3459 with an insulator such as TEOS for example forming insulator 3460 using known industry methods as illustrated in FIG. 34V.

Next, methods form a noncritical mask region (not shown) over insulator 3460.

Next, sacrificial regions 3458' and 3458" are selectively etched (removed) as illustrated in FIG. 34W. With sacrificial regions 3458' and 3458" removed and with insulator 3460 protected by a mask layer (not shown), methods form trenches 3469' and 3469" using known directional selective etch techniques such as RIE. Trenches 3459' and 3459" form a second vertical (Z) sidewall in the X direction of NV NT diode cells.

First, methods directionally selectively etch (remove) exposed portions of contact 3440' and 3440" using known industry methods and expose a portion of the top surface of semiconductor layers 3435' and 3435" and define contact 3440-1 and 3440-2 regions as illustrated in FIG. 34X.

Next, methods selectively etch exposed portions of insulator regions 3435' and 3435" using known industry methods and form insulator regions 3435-1 and 3435-2.

Next, methods selectively etch exposed portions of contact regions 3430' and 3430" using known industry methods and form contact regions 3430-1 and 3430-2.

Next, methods selectively etch exposed portions of N+ polysilicon layer 3425' and 3425" using known industry methods and form N+ polysilicon regions 3425-1 and 3425-2.

Next, methods selectively etch exposed portions of N polysilicon layer 3420' and 3420" using known industry methods and form N polysilicon regions 3420-1 and 3420-2 as illustrated in FIG. 34X.

Next, methods selectively etch exposed regions of contact layer 3415' and 3415" using known industry methods and form contact regions 3415-1 and 3415-2.

Then, methods selectively etch exposed portions of conductor layer 3410' and 3410" using known industry methods and form bit lines 3410-1 (BL0) and 3410-2 (BL1). Directional etching stops at the surface of planar insulator 3403 as illustrated in FIG. 34X.

Next, methods deposit and planarize an insulator such as TEOS and fill trench openings 3459' and 3459" with insulators 3460' and 3460", respectively, as illustrated in FIG. 34Y.

Next, methods etch (remove) sacrificial regions 3455-1 and 3455-2.

Next, methods deposit and planarize conductor 3465' to form upper layer contacts 3465-1 and 3465-2 as illustrated in FIGS. 34Z and 34AA.

Next, methods deposit and planarize conductive layer 3471 using known industry methods to form cross section 3470 as illustrated in FIG. 34BB. Cross section 3470 corresponds to cross section 2800 illustrated in FIG. 28A. The methods described further above form a cross section (not shown) corresponding to cross section 2800' illustrated in FIG. 28B if process fabrication begins with FIG. 34A' instead of FIG. 34A.

At this point in the process, cross section 3470 illustrated in FIG. 34BB has been fabricated, and includes NV NT diode cell dimensions of 1F (where F is a minimum feature size) defined in the X direction as well as corresponding array bit lines. Next, cell dimensions used to define dimensions in the Y direction are formed by directional trench etch processes similar to those described further above with respect to cross section 3470 illustrated in FIG. 34BB. Trenches used to define dimensions in the Y direction are approximately orthogonal to trenches used to define dimensions in the X direction. In this example, cell characteristics in the Y direction do not require self alignment techniques described further above with respect to X direction dimensions. Cross sections of structures in the Y direction are illustrated with respect to cross section A-A' illustrated in FIG. 34BB.

Next, methods deposit and pattern a masking layer such as masking layer 3473 on the surface of word line layer 3471 as illustrated in FIG. 34CC. Masking layer 3473 may be noncritically aligned to alignment marks in planar insulator 3403. Openings 3474, 3474', and 3474" in mask layer 3473 determine the location of trench directional etch regions, in this case trenches are approximately orthogonal to bit lines such as bit line 3410-1 (BL0).

Next, methods form trenches 3475, 3475', and 3475" corresponding to openings 3474, 3474', and 3474", respectively, in masking layer 3473. Trenches 3475, 3475', and 3475" form two sides of vertical sidewalls in the Y direction defining two opposing sides of NV NT diode cells as illustrated in FIG. 34DD.

Then, methods directionally selectively etch (remove) exposed portions of word line layer 3471 illustrated in FIG. 34DD using known industry methods to form word lines 3471-1 (WL0) and 3471-2 (WL1) illustrated in FIG. 34DD.

Next, methods selectively etch exposed portions of contact region 3465-1 illustrated in FIG. 34CC using known industry methods to form contacts 3465-1' and 3465-1" as illustrated in FIG. 34DD.

Next, methods selectively etch exposed portions of contact region 3440-1, nanotube element 3455-1, and conformal insulator 3450-1 illustrated in FIG. 34BB using known industry methods to form contacts 3440-1' and 3440-1", conformal insulator regions (not shown in FIG. 34DD cross section A-A'), and nanotube elements 3445-1' and 3445-1" as illustrated in FIG. 34DD.

Next, methods selectively etch exposed regions of insulators 3435-1, nanotube element 3455-1, and conformal insulator 3450-1 illustrated in FIG. 34BB using known industry methods to form insulator regions and conformal insulator regions (not shown in FIG. 34DD cross section A-A') and nanotube elements 3445-1' and 3445-1" illustrated in FIG. 34DD.

Next, methods selectively etch exposed portions of contact regions 3430-1 and 3430-2 illustrated in FIGS. 34BB and 34CC using known industry methods and form contacts 3430-1' and 3430-1" illustrated in FIG. 34DD (cross section A-A').

Next, methods selectively etch exposed portions of N+ polysilicon regions 3425-1 and 3425-2 illustrated in FIG. 34BB using known industry methods and form N+ polysilicon regions 3425-1' and 3425-1" illustrated in FIG. 34DD (cross section A-A').

Next, methods selectively etch exposed portions of N polysilicon regions 3420-1 and 3420-2 illustrated in FIG. 34BB using known industry methods and form N polysilicon regions 3420-1' and 3420-1" illustrated in FIG. 34DD (cross section A-A').

Then, methods selectively etch exposed portions of contact regions 3415-1 and 3415-2 illustrated in FIG. 34BB using known industry methods and form insulators 3415-1' and 3415-1" illustrated in FIG. 34DD (cross section A-A'). Directional etching stops at the surface of bit line 3410-1.

Next, methods deposit insulator 3476 using known industry methods as illustrated in FIG. 34EE. Insulator 3476 may be TEOS, for example.

Then, methods planarize insulator 3476 to form insulator 3476' using known industry methods and form cross section 3470' illustrated in FIG. 34FF. Cross section 3470' illustrated in FIG. 34FF and cross section 3470 illustrated in FIG. 34BB are two cross sectional representations of the same passivated NV NT diode vertically oriented cell. Cross section 3470 illustrated in FIG. 34BB corresponds to cross section 2800 illustrated in FIG. 28A.

At this point in the process, cross sections 3470 and 3470' illustrated in FIGS. 34BB and 34FF, respectively, have been fabricated, nonvolatile nanotube element vertically-oriented channel length $L_{SW\text{-}CH}$ and horizontally-oriented channel width $W_{SW\text{-}CH}$ are defined, including overall NV NT diode cell dimensions of 1F in the X direction and 1F in the Y direction, as well as corresponding bit and word array lines. Cross section 3470 is a cross section of two adjacent vertically oriented cathode-to-nanotube type nonvolatile nanotube diode-based cells in the X direction and cross section 3470' is a cross section of two adjacent vertically oriented cathode-to-nanotube type nonvolatile nanotube diode-based cells in the cells in the Y direction. Cross sections 3470 and 3470' include corresponding word line and bit line array lines. The nonvolatile nanotube diodes form the steering and storage elements in each cell illustrated in cross sections 3470 and 3470' each occupy a 1F by 1F area. The spacing between adjacent cells is 1F so the cell periodicity can be as low as 2F in both the X and Y directions. Therefore one bit can occupy an area of as low as $4F^2$. At the 65 nm technology node, for example, the cell area is less than 0.02 um$^2$.

Methods of Fabricating 3-Dimensional Cell Structure of Nonvolatile Cells Using NV NT Devices Having Vertically Oriented Diodes and Horizontally Oriented NT Switches with Cathode-to-NT Switch Connection Methods 2710 illustrated in FIG. 27A can be used to define support circuits and interconnects similar to those described with respect to memory 2600 illustrated in FIG. 26A as described further above. Exemplary methods 2710 apply known semiconductor industry design and fabrication techniques to fabricated support circuits and interconnections 3501 in and on a semiconductor substrate as illustrated in FIG. 35A. Support circuits and interconnections 3501 can include, for example, FET devices in a semiconductor substrate and interconnections such as vias and wiring above a semiconductor substrate.

Next, methods 2730 illustrated in FIG. 27B deposit and planarize insulator 3503 on the surface of support circuits and interconnections 3501 layer.

Next, methods form interconnect contact 3507 through planar insulator 3503 as illustrated in FIG. 35A. Contact 3507 through planar insulator 3503 is in contact with support circuits and interconnections 3501. The combination of support circuits and interconnections 3501 and planarized insulator 3503 is referred to as memory support structure 3505 as illustrated in FIG. 35A.

Next, methods deposit a conductor layer 3510 on the planarized surface of insulator 3503 as illustrated in FIG. 35A, typically 50 to 500 nm thick, using known industry methods. Contact 3507 through planar insulator 3503 connects conductor layer 3510 with support circuits and interconnections 3501. Examples of conductor layer 3510 and contact 3507 materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, CoSi$_x$ and TiSi$_x$. Materials such as those used in conductor layer 3410 may be used to form array lines and also to form anodes for Schottky diodes.

Next, methods deposit an N polysilicon layer 3520 of thickness 10 nm to 500 nm on the surface of conductor 3510. N polysilicon layer 3520 may be doped with arsenic or phosphorus in the range of $10^{14}$ to $10^{17}$ dopant atoms/cm$^3$, for example. N polysilicon layer 3520 may be used to form cathodes of Schottky diodes. In addition to doping levels, the polysilicon crystalline size (or grain structure) of N Polysilicon layer 3420 may also be controlled by known industry methods of deposition. Also, known industry SOI methods of deposition may be used that result in polysilicon regions that are single crystalline (no longer polysilicon), or nearly single crystalline.

Next, methods deposit N+ polysilicon layer 3525 on the surface of N polysilicon layer 3520 as illustrated in FIG. 35A in order to form an ohmic contact layer. N+ polysilicon layer 3525 is typically doped with arsenic or phosphorous to $10^{20}$ dopant atoms/cm$^3$, for example, and has a thickness of 20 to 400 nm, for example.

Next, methods deposit an insulator layer 3530 on N+ layer 3525 as illustrated in FIG. 35B. The thickness of insulator layer 3530 may vary in thickness from 10 nm to greater than 400 nm, for example. Insulator 3530 may be formed from any known insulator material in the CMOS industry, or packaging industry, for example such as SiO$_2$, SiN, Al$_2$O$_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an Al$_2$O$_3$ layer, for example. U.S. patent application Ser. No. 11/280,786 gives some examples of various dielectric materials.

At this point in the fabrication process, methods deposit contact layer 3535 on the surface of insulator layer 3530 as illustrated in FIG. 35B. Contact layer 3535 may be 10 to 500 nm in thickness, for example. Contact layer 3535 may be formed using Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, CoSi$_x$ and TiSi$_x$, for example.

Figure 35C:
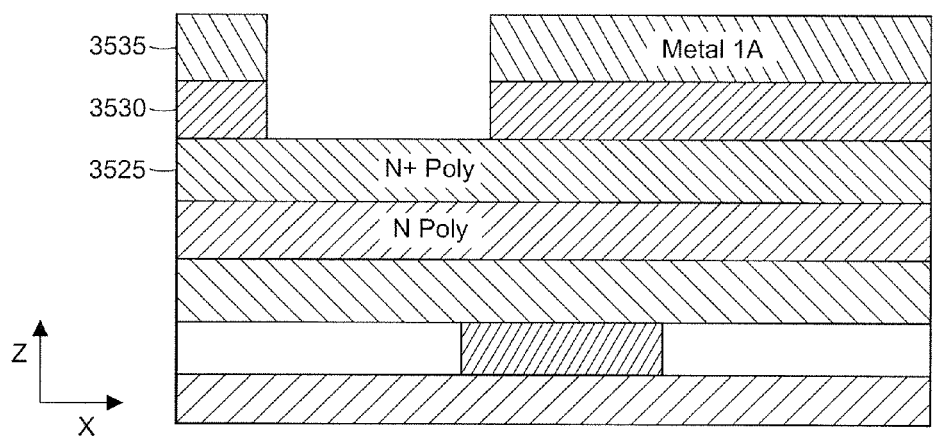
FIGS. 35A-35S illustrate methods of fabrication for cathode-on-nanotube memory cross sectional structures with horizontally oriented nonvolatile nanotube switches within vertical cell boundaries illustrated in FIG. 28C, according to some embodiments.
Figure 35D:
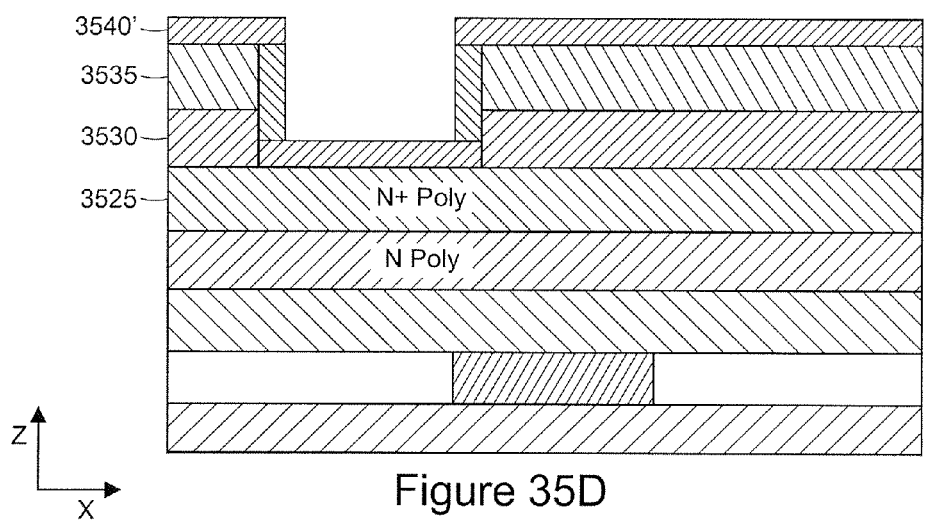

Next, methods directionally etch opening 3537 through contact layer 3535 and insulator layer 3530 to the top surface of N+ polysilicon layer 3525 as illustrated in FIG. 35C. Directional etching may use RIE, for example Next methods deposit conformal insulator layer 3540' in contact with surface regions of contact 3535 and N+ polysilicon layer 3525 and on exposed sidewall surface regions of contact 3535 and insulator 3530 as illustrated in FIG. 35D. Conformal insulator 3540' may be 5 to 250 nm thick, for example, and may be formed from any known insulator material in the CMOS industry, or packaging industry, for example such as SiO$_2$, SiN, Al$_2$O$_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an Al$_2$O$_3$ layer, for example. Insulator 3540' is deposited to a thickness that forms nanotube element channel length regions as described further below with respect to 351 and insulates a contact described further below with respect to FIG. 35G from contact with contact 3535.

Figure 35E:
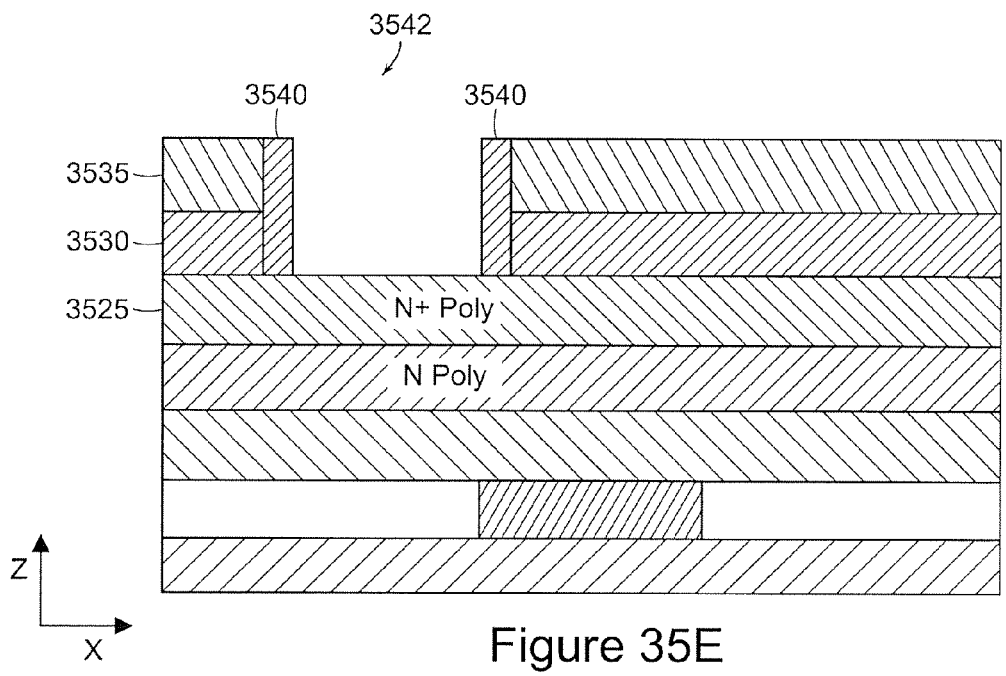

Next, methods directionally etch insulator 3540' using known industry methods such as RIE and form sidewall spacer regions 3540 illustrated in FIG. 35E that define nanotube element channel length as described further below with respect to FIG. 35I.

Figure 35F:
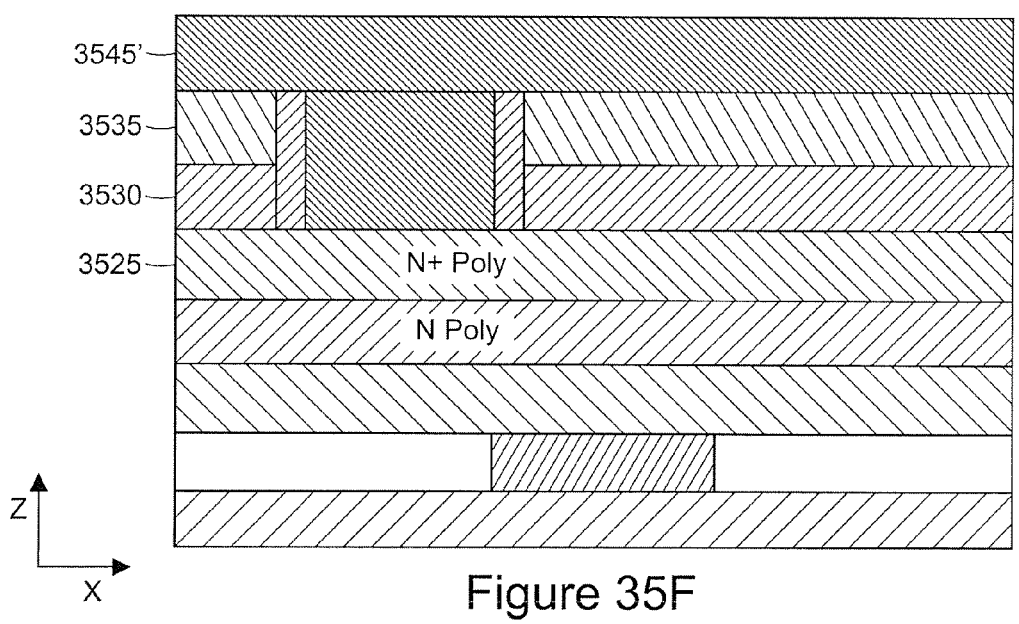
Figure 35G:
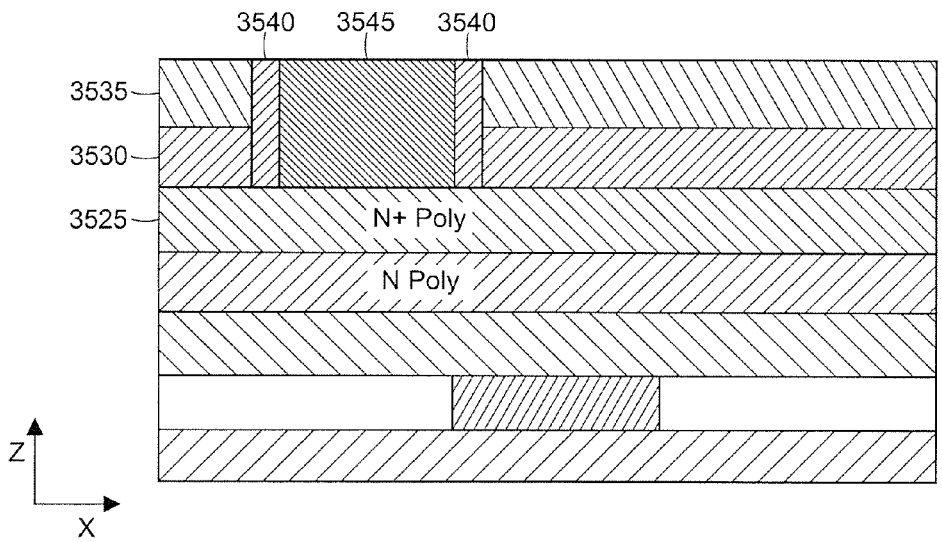

Next, methods deposit and planarize conductor 3545' to form contact 3545 as illustrated in FIGS. 35F and 35G.

Figure 35H:
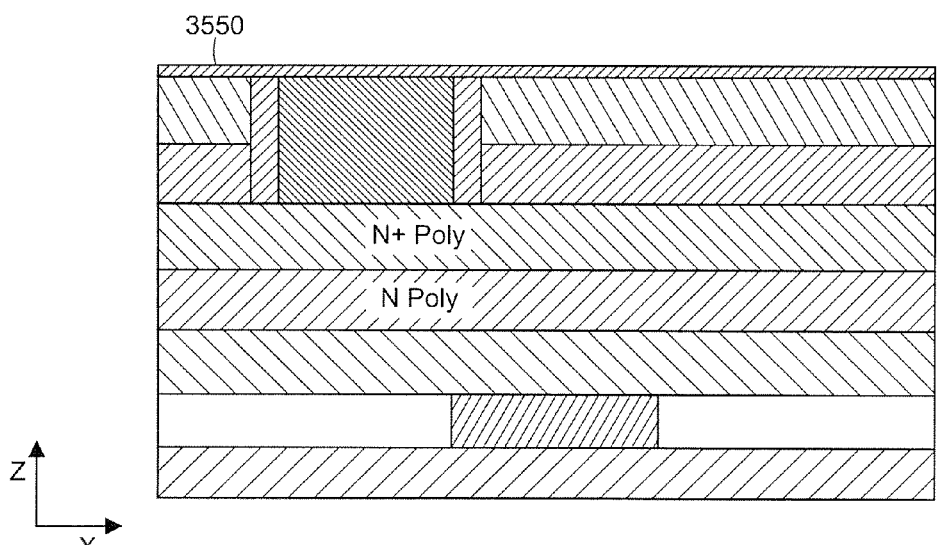

Next, methods deposit conformal nanotube element 3550 on a coplanar surface formed by contact 3535, sidewalls 3540, and contact 3545 as illustrated in FIG. 35H. Conformal nanotube element 3550 may be 0.5 to 20 nm thick, for example, and may be fabricated as a single layer or as multiple layers using deposition methods such as spin-on and spray-on methods. Nanotube element methods of fabrication are described in the incorporated patent references.

Figure 35I:
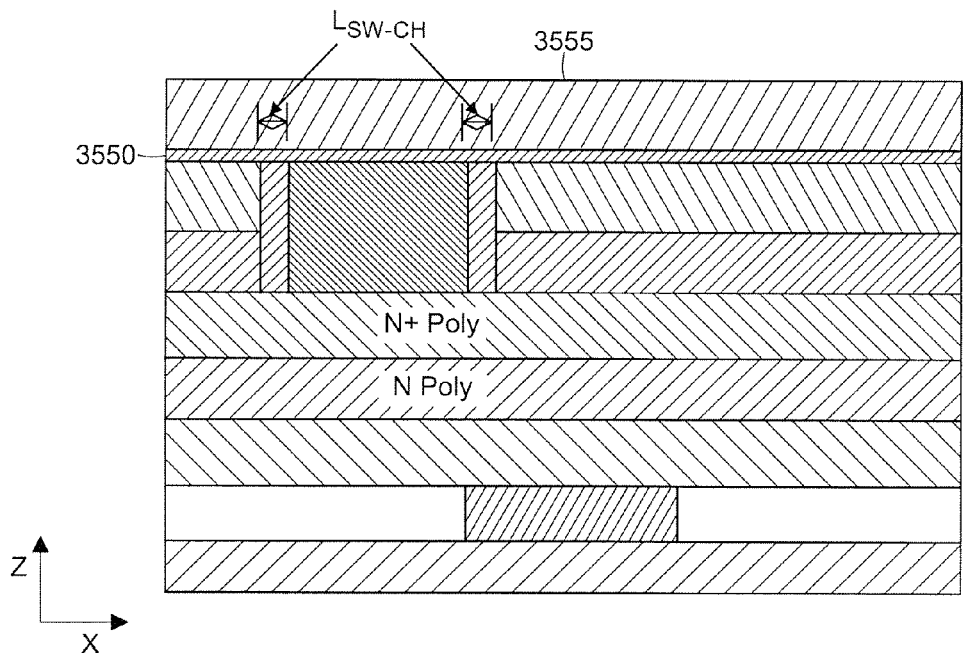

Next, methods deposit insulator layer 3555 on nanotube element 3550 as an insulating and protective layer as illustrated in FIG. 35I. The channel length $L_{SW-CH}$ of nanotube element 3550 is defined by the surface dimension of sidewall spacers 3540. Insulator layer 3555 may be 5 to 200 nm thick, for example, and may be formed from any appropriate known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Dielectric material selection with respect to nanotube elements is described in U.S. patent application Ser. No. 11/280, 786.

Figure 35J:
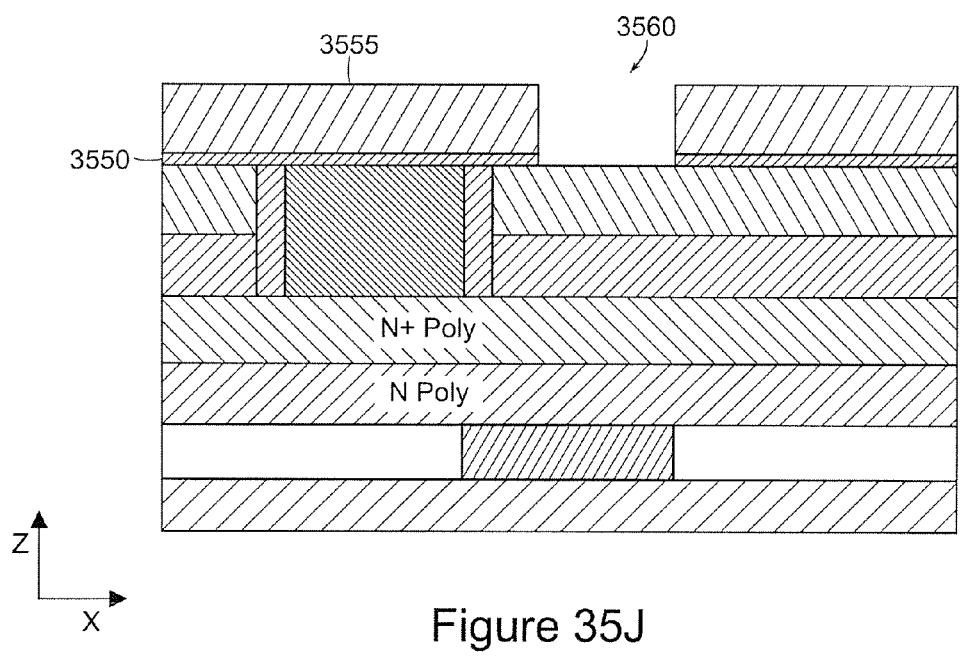

Next, methods pattern and etch opening 3560 as illustrated in FIG. 35J to the top of contact 3535. Methods etch a portion of opening 3560 using known industry methods. Methods then etch the exposed region of nanotube element 3550 using ashing, for example, or other means described in the incorporated patent references.

Figure 35K:
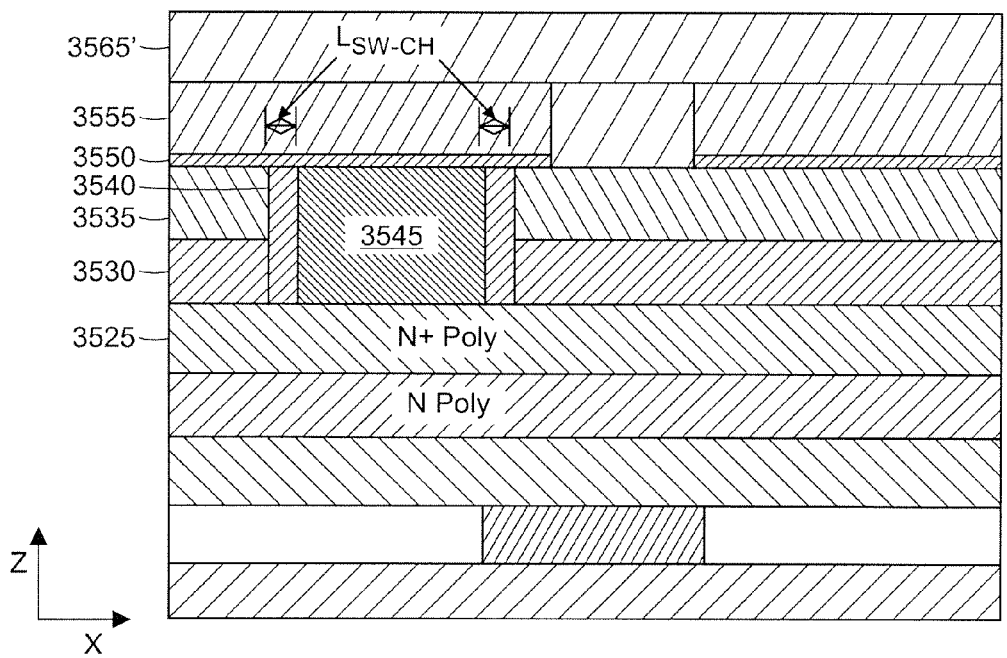
Figure 35L:
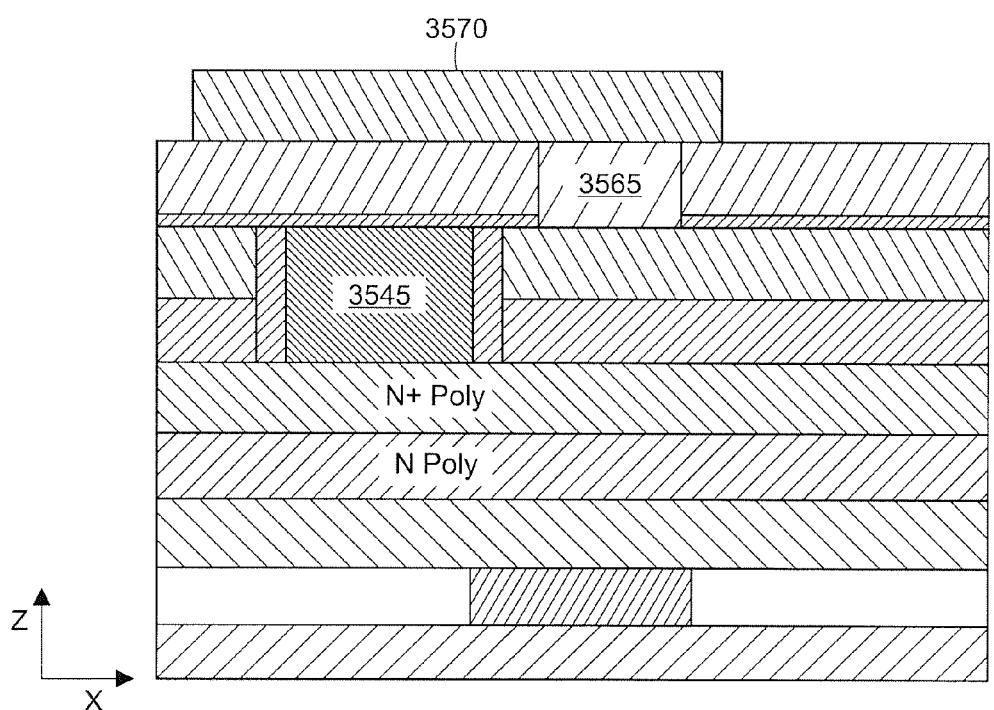

Next, methods deposit and planarize conductor 3565' to form contact 3565 as illustrated in FIGS. 35K and 35L.

Next, masking layer 3570 is patterned in the X direction as illustrated in FIG. 35L and defines the openings for directional selective trench etching to form trench regions 3572 and 3572' described further below with respect to FIG. 35M.

Next, methods selectively etch exposed portions of insulator 3555 using known industry methods and form insulator region 3555'.

Figure 35M:
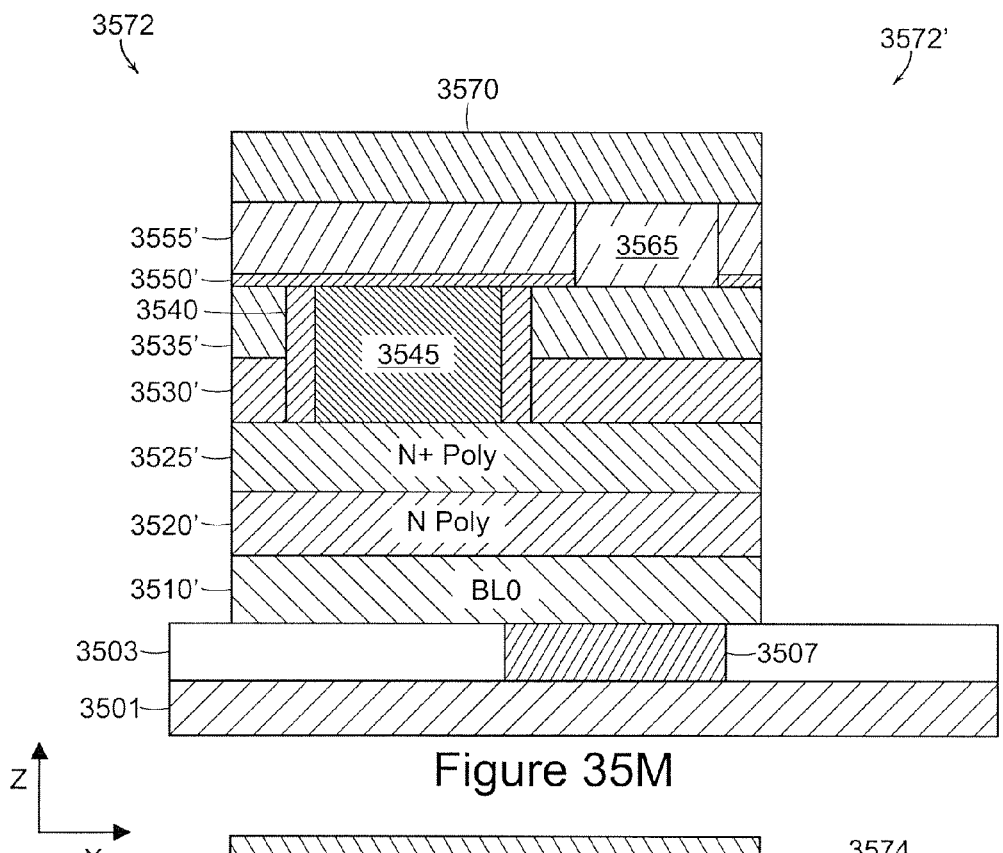

Next, methods selectively etch exposed regions of nanotube element 3550 and form nanotube element 3550' as illustrated in FIG. 35M. Nanotube element methods of etching are described in greater detail in the incorporated patent references.

Next, methods selectively etch exposed portions of contact 3535 using know industry methods and form contact region 3535'.

Next, methods selectively etch exposed portions of insulator 3530 and form insulator region 3530'.

Next, methods selectively etch exposed portions of N+ polysilicon layer 3525 using known industry methods and form N+ polysilicon region 3525'.

Next, methods selectively etch exposed portions of N polysilicon layer 3520 using known industry methods and form N polysilicon region 3520' as illustrated in FIG. 35M.

Then, methods selectively etch exposed portions of conductor layer 3510 using known industry methods and forms bit line 3510' (BL0). Directional etching stops at the surface of planar insulator 3503 as illustrated in FIG. 35M.

Figure 35N:
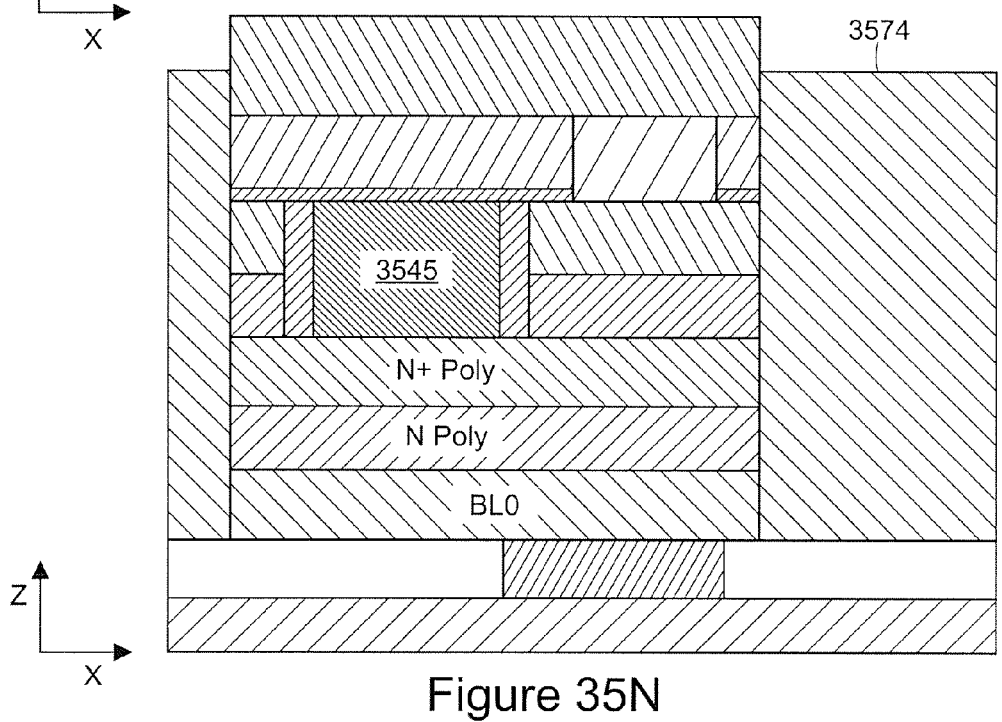
Figure 35O:
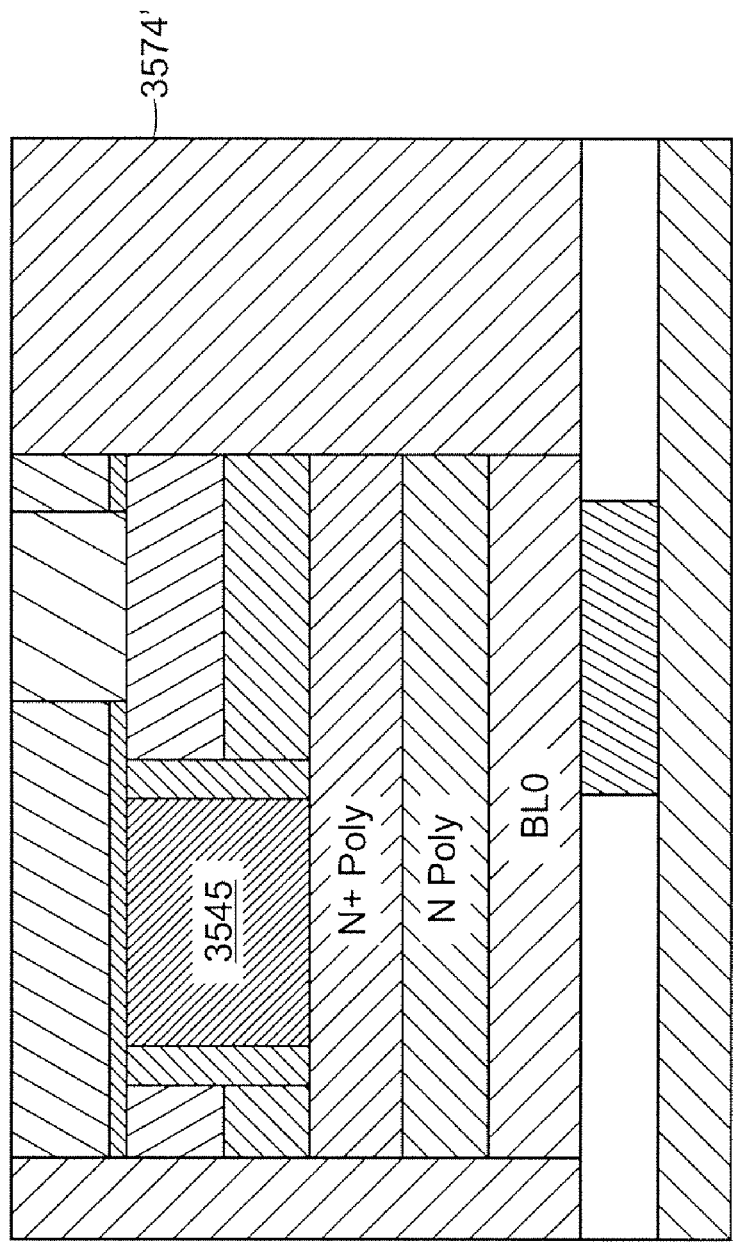

Next, methods deposit an insulator 3574 such as TEOS, for example, to fill trench openings 3572 and 3572' and then methods planarize insulator 3574 to form insulator 3574' as illustrated in FIGS. 35N and 35O.

Figure 35P:
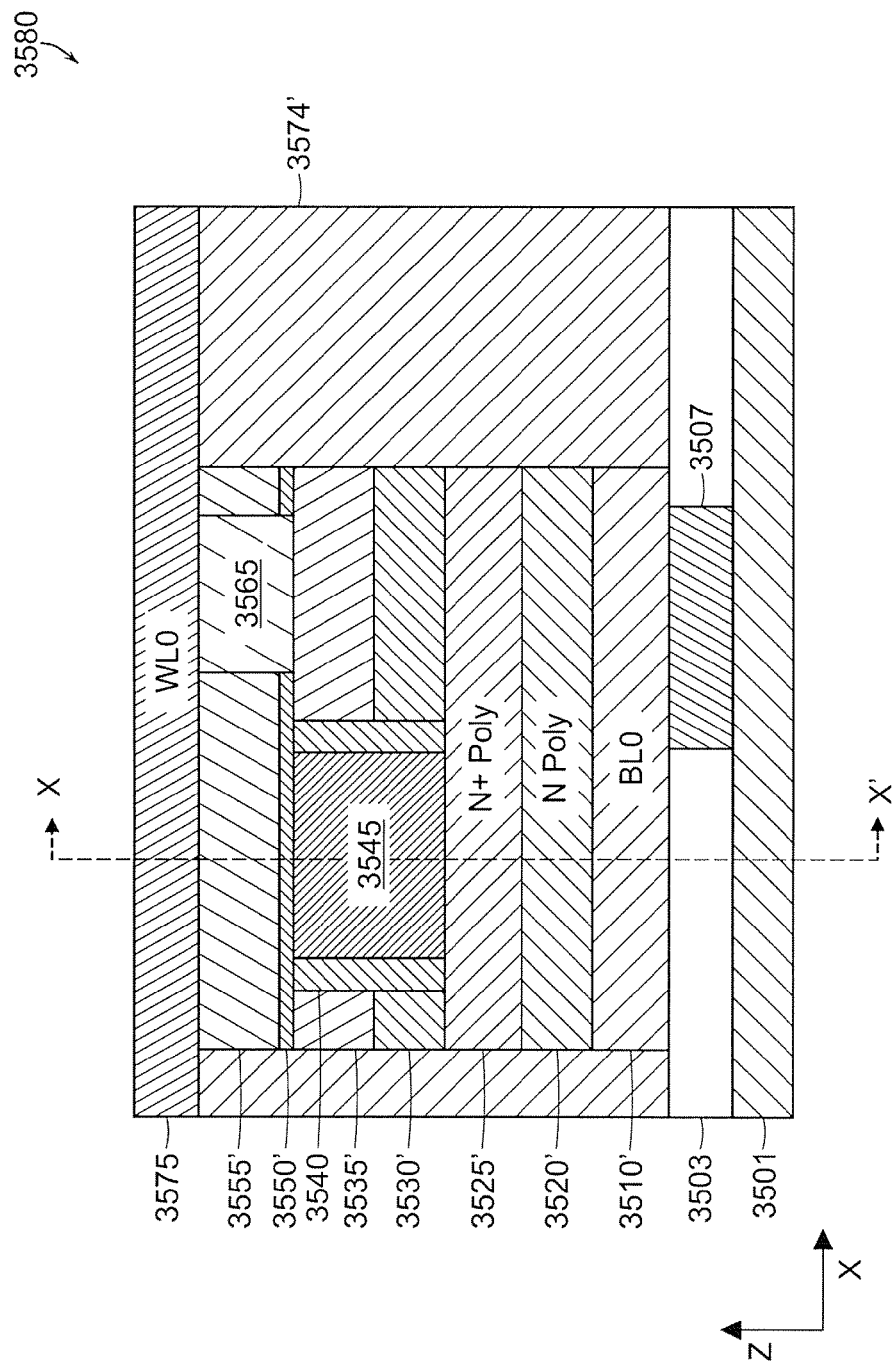

Next, methods deposit and planarize conductive layer 3575 corresponding to array word line WL0 using known industry methods to form cross section 3580 as illustrated in FIG. 35P. Cross section 3580 corresponds to cross section 2800" illustrated in FIG. 28C. Word line WL0 orientation is along the X direction, and bit line BL0 orientation is along the Y axis as shown further below.

At this point in the process, cross section 3580 illustrated in FIG. 35P has been fabricated, and includes NV NT diode cell dimensions of 2-3F (where F is a minimum feature size) defined in the X direction as well as corresponding array bit lines. Next, cell dimensions used to define dimensions in the Y direction are formed by directional trench etch processes similar to those described further above with respect to cross section 3580 illustrated in FIG. 35P. Trenches used to define dimensions in the Y direction are approximately orthogonal to trenches used to define dimensions in the X direction. Cross sections of structures in the Y direction are illustrated with respect to cross section X-X' illustrated in FIG. 35P.

Figure 35Q:
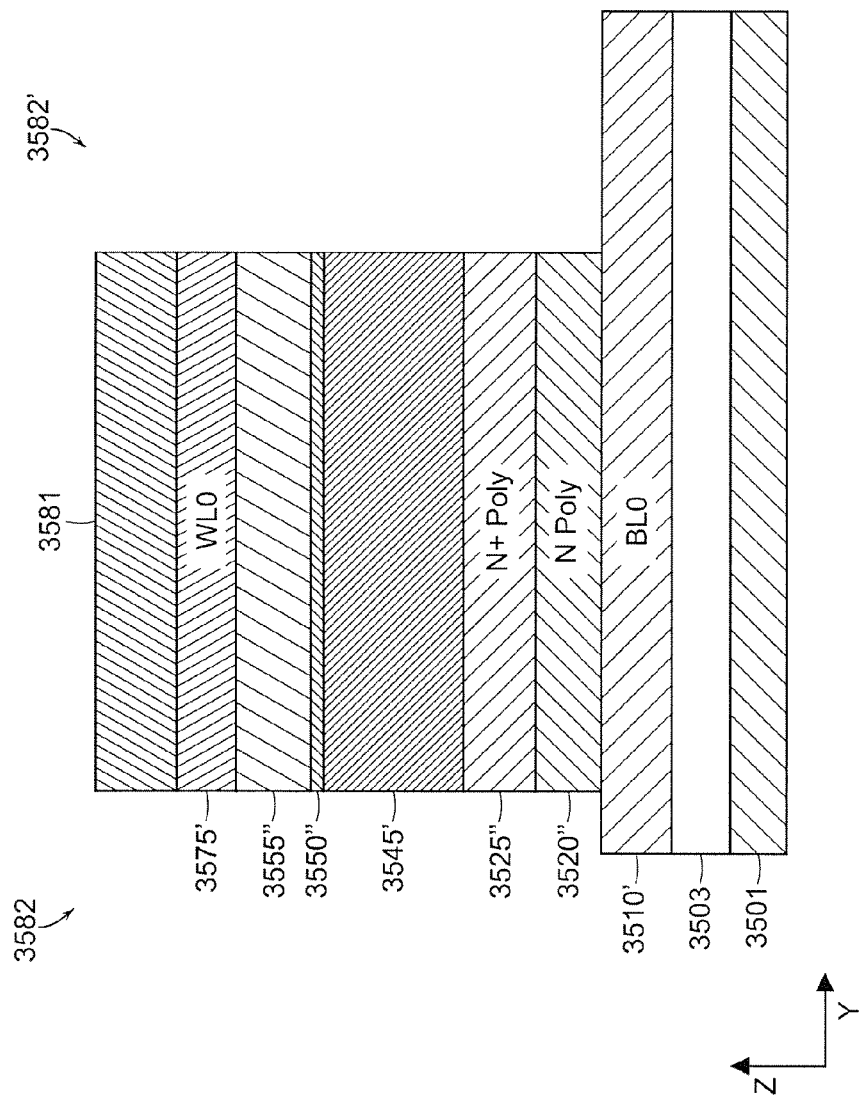

Next, methods deposit and pattern a masking layer such as masking layer 3581 on the surface of word line layer 3575' as illustrated in FIG. 35Q. Masking layer 3581 may be non-critically aligned to alignment marks in planar insulator 3503. Openings in mask layer 3581 determine the location of trench directional etch regions, in this case trenches are approximately orthogonal to bit lines such as bit line 3510' (BL0).

Next, methods form trenches 3582 and 3582' corresponding to openings in masking layer 3581. Trenches 3582 and 3582' form two sides of vertical sidewalls in the Y direction defining two opposing sides of NV NT diode cells as illustrated in FIG. 35Q.

Next, methods directionally selectively etch (remove) exposed portions of word line layer 3575 illustrated in FIG. 35P using known industry methods to form word line 3575' (WL0) illustrated in FIG. 35Q (cross section X-X').

Next, methods selectively etch exposed portions of insulator 3555' as illustrated in FIG. 35Q (cross section X-X') and also selectively etch exposed portions of contact 3565 (not shown in FIG. 35Q) using known industry methods to form insulator region 3555" as illustrated in FIG. 35Q and also to form a modified contact 3565 not shown in FIG. 35Q (cross section X-X'), Next, methods selectively etch (remove) exposed portions of nanotube element 3550' forming nanotube element 3550" as illustrated in FIG. 35Q. Nanotube element methods of etching are described in greater detail in the incorporated patent references.

Next, methods selectively etch exposed portions of contact 3545 forming contact 3545' as illustrated in FIG. 35Q (cross section X-X'); methods also selectively etch exposed portions of sidewall spacers 3540 to form modified sidewall spacers 3440 not illustrated in FIG. 35Q; and methods also selectively etch exposed portions of contact 3535 to form modified contacts 3535 not illustrated in FIG. 35Q.

Next, methods selectively etch exposed portions of insulator 3530' to form a modified insulator 3530' not illustrated in FIG. 35Q (cross section X-X').

Next, methods selectively etch exposed portions of N+ polysilicon regions 3525' illustrated using known industry methods and form N+ polysilicon region 3525" illustrated in FIG. 35Q (cross section X-X').

Next, methods selectively etch exposed portions of N polysilicon regions 3520' illustrated using known industry methods and form N+ polysilicon region 3520" illustrated in FIG. 35Q (cross section X-X'). Directional selective etch stops at the surface of bit line 3510' (BL0).

Figure 35R:
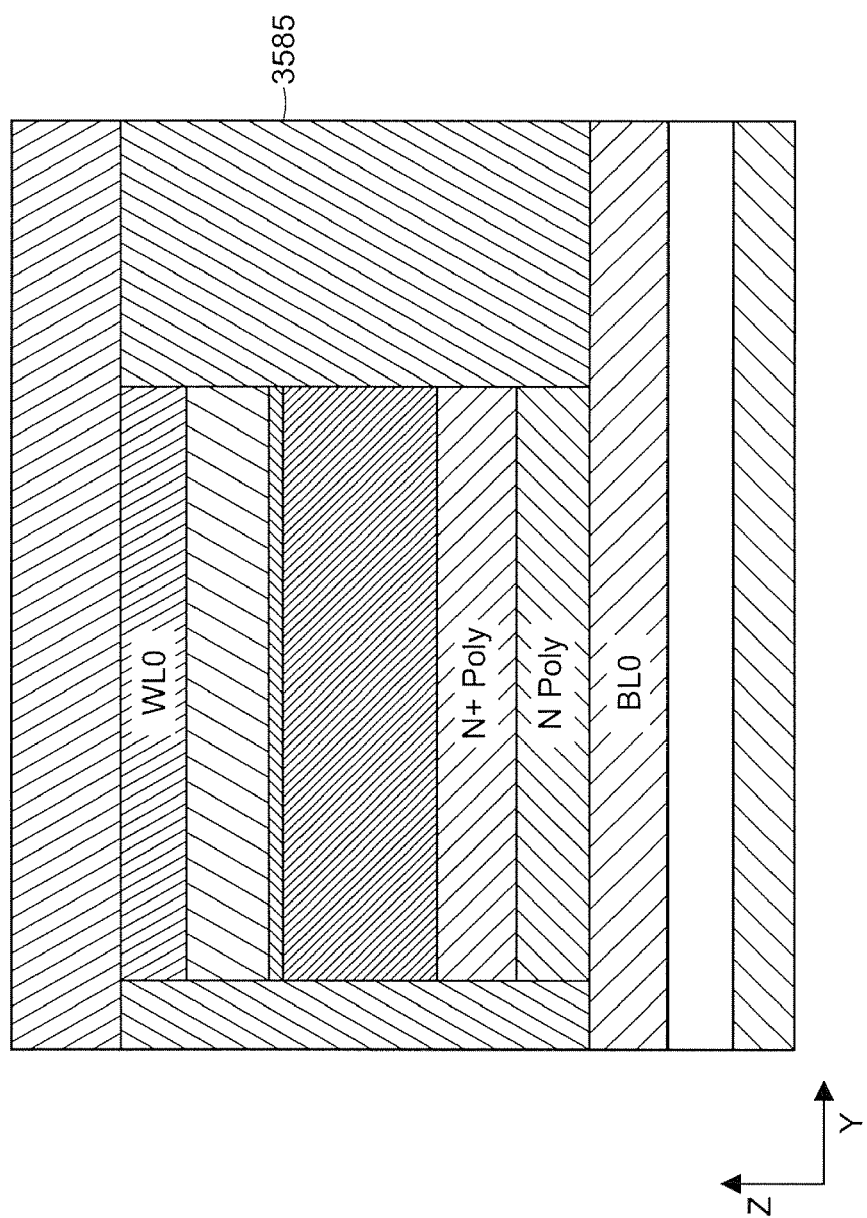

Next, methods deposit insulator 3585 using known industry methods as illustrated in FIG. 35R. Insulator 3585 may be TEOS, for example.

Figure 35S:
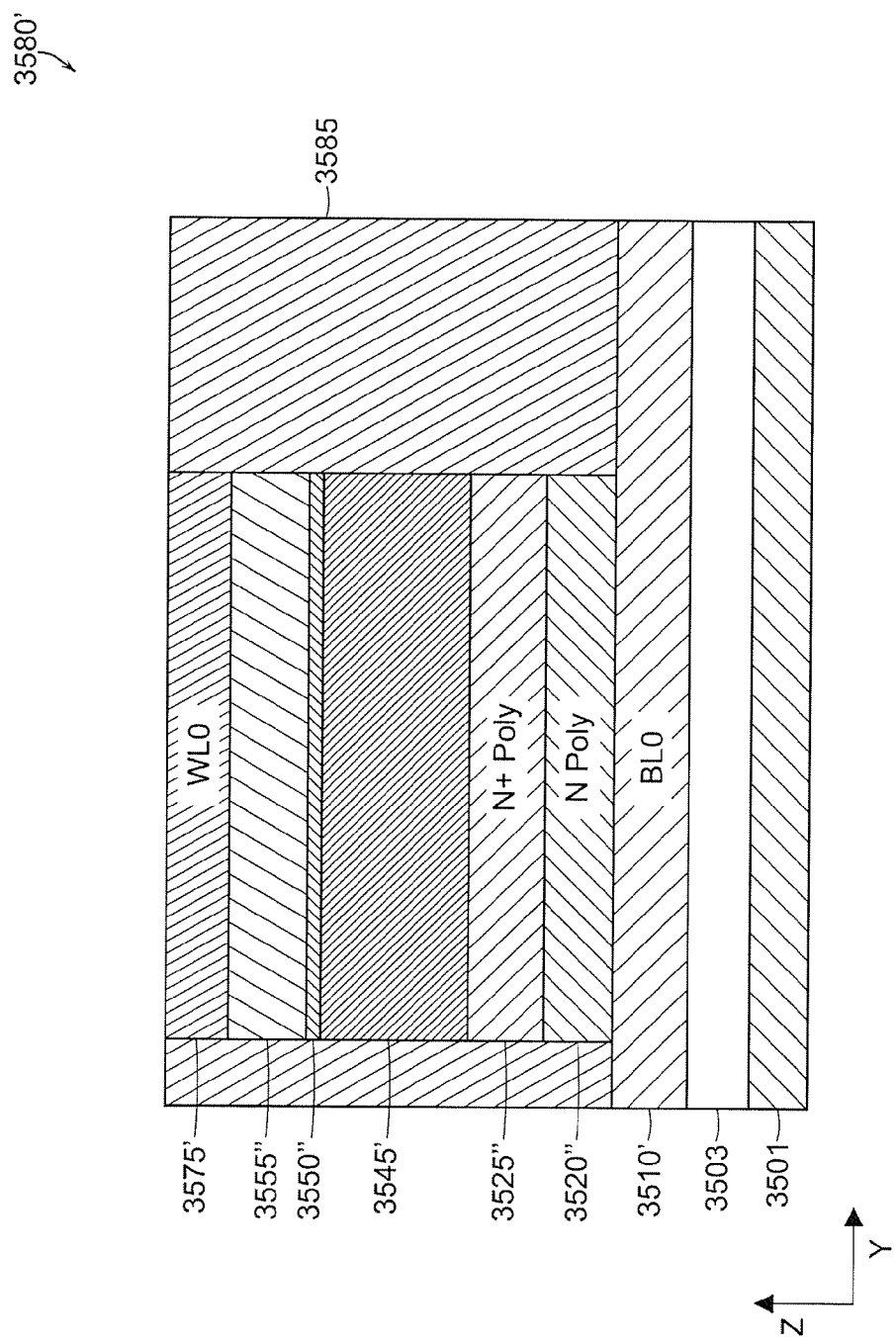

Then, methods planarize insulator 3585 to form insulator 3585' using known industry methods and form cross section 3580' illustrated in FIG. 35S. Cross section 3580' illustrated in FIG. 35S and cross section 3580 illustrated in FIG. 35P are two cross sectional representations of the same embodiment of a passivated NV NT diode with a vertically oriented diode and a horizontally nonvolatile nanotube switch. Cross section 3480 illustrated in FIG. 35P corresponds to cross section 2800" illustrated in FIG. 28C. Methods of Fabricatina Nonvolatile Memories using NV NT Diode Devices with Anode-to-NT Switch Connection Exemplary methods 3000 illustrated in FIGS. 30A and 30B may be used to fabricate embodiments of memories using NV NT diode devices with anode-to-NT switch connections for vertically oriented NV NT switches such as those shown in cross section 3100 illustrated in FIG. 31A, cross section 3100' illustrated in FIG. 31B, and cross section 3100" illustrated in FIG. 31C as described further below with respect to FIG. 36. Structures such as cross section 3000, 3000', and 3000" may be used to fabricate memory 2900 illustrated schematically in FIG. 29A.

Exemplary methods of fabricating cross sections 3000, 3000', and 3000" can be performed using critical alignments in Y direction process steps. There are no critical alignments in the X direction because in this example distance between trenches determines the width of the nanotube element. However, the width of the nanotube element may be formed to be less than the trench-to-trench spacing by using methods similar to those described further below with respect to the Y direction. In the Y direction, critical alignment requirements can be eliminated by using methods that form self-aligned internal cell vertical sidewalls that define vertical nanotube channel element location, vertical channel element length ($L_{SW\_CH}$), and form nanotube channel element contacts with respect to trench sidewalls that are etched later in the process to define outer cell dimensions using methods of fabrication described further below with respect to FIG. 36. In this example, NV NT diode cell structures occupy a minimum dimension F in the X and Y directions, where F is a minimum photolithographic dimension. In this example, the internal cell vertical sidewall is positioned (by self alignment techniques) at approximately R distance from trench sidewalls that are separated by distance F and that define outer cell dimensions as illustrated further below with respect to FIGS. 36A-36FF. FIGS. 36A-36FF are illustrated with a spacing R of approximately F/2. However, methods using self alignment techniques, such as those described further below with respect to FIG. 36A-36FF, may position a vertical sidewall at any location R within the cell region of width F using R values of F/4, F/3, F/2, 3F/4, etc for example. In some embodiments, R is not related in any particular way to F.

Methods of Fabricating 3-Dimensional Cell Structure of Nonvolatile Cells Using NV NT Devices Having Vertically Oriented Diodes and Vertically Oriented NT Switches with Anode-to-NT Switch Connection Exemplary methods 3010 illustrated in FIG. 30A can be used to define support circuits and interconnects similar to those described with respect to memory 2900 illustrated in FIG. 29A as described further above. Methods 3010 apply known semiconductor industry techniques design and fabrication techniques to fabricated support circuits and interconnections 3601 in and on a semiconductor substrate as illustrated in FIG. 36A. Support circuits and interconnections 3601 include FET devices in a semiconductor substrate and interconnections such as vias and wiring above a semiconductor substrate.

Next, methods 3030 illustrated in FIG. 30B deposit and planarize insulator 3603 on the surface of support circuits and interconnections 3601 layer. Interconnect means through planar insulator 3603, not shown in FIG. 36A, are shown further above with respect to FIGS. 35A-35S. The combination of support circuits and interconnections 3601 and planarized insulator 3603 is referred to as memory support structure 3605 as illustrated in FIG. 34A.

Figure 36A:
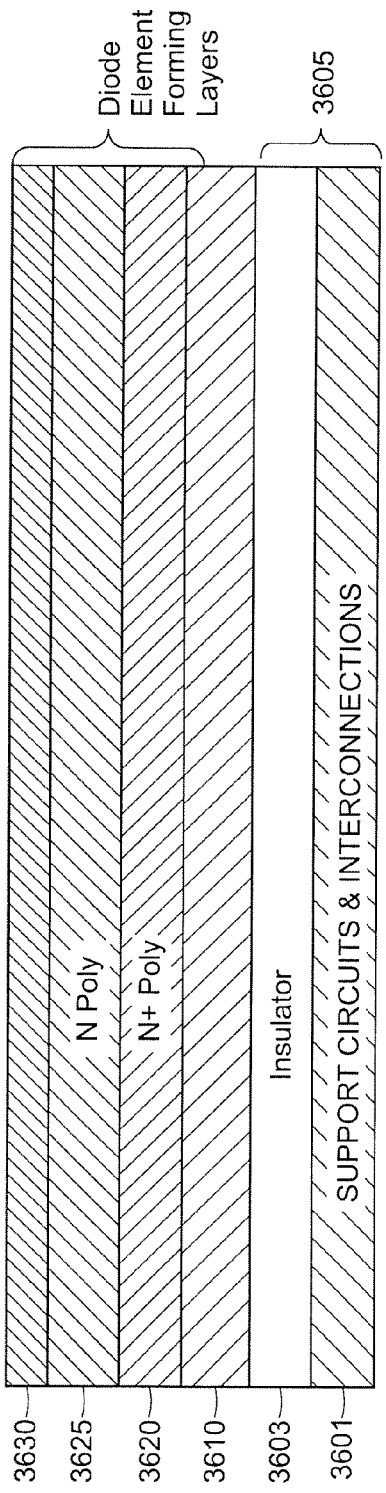
FIGS. 36A-36FF illustrate methods of fabrication for anode-on-nanotube memory cross sectional structures with vertically oriented nonvolatile nanotube switches within vertical cell boundaries illustrated in FIGS. 32A, 32B and 32C, according to some embodiments.
Figure 36A:
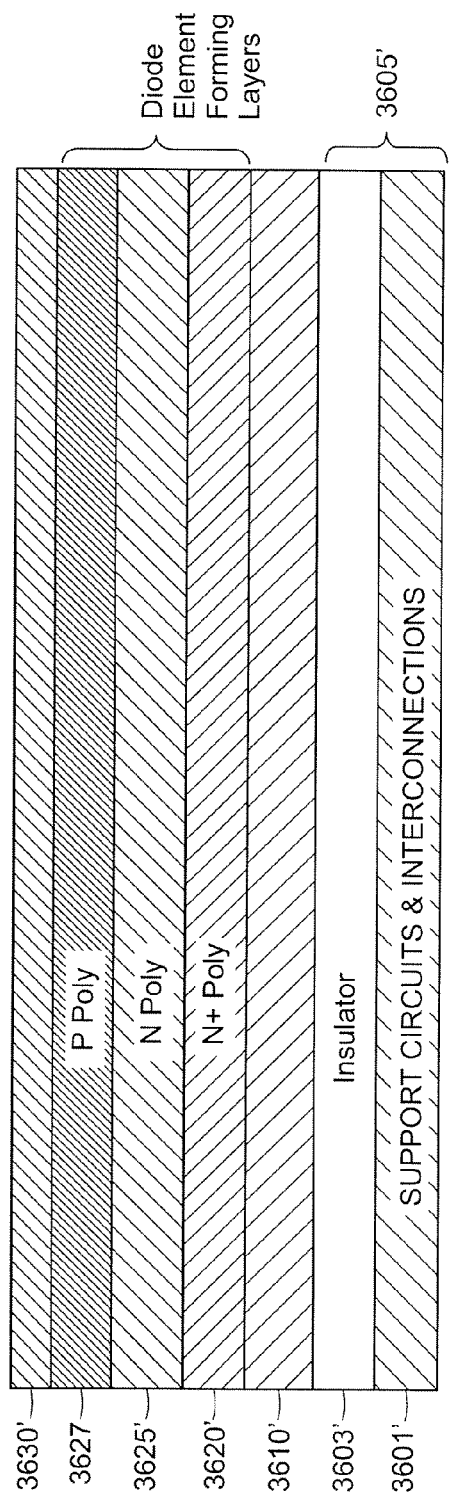

Next, methods deposit a conductor layer 3610 on the planarized surface of insulator 3603 as illustrated in FIG. 36A, typically 50 to 500 nm thick, using known industry methods. Examples of conductors layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Next, methods deposit N+ polysilicon layer 3620 on the surface of conductor layer 3610 as illustrated in FIG. 36A in order to form an ohmic contact layer. N+ polysilicon layer 3620 is typically doped with arsenic or phosphorous to $10^{20}$ dopant atoms/cm$^3$, for example, and has a thickness of 20 to 400 nm, for example.

Next, methods deposit an N polysilicon layer 3625 of thickness 10 nm to 500 nm on the surface of N+ polysilicon layer 3620. N polysilicon layer 3625 may be doped with arsenic or phosphorus in the range of $10^{14}$ to $10^{17}$ dopant atoms/cm$^3$, for example. N polysilicon layer 3625 may be used to form cathodes of Schottky diodes. In addition to doping levels, the polysilicon crystalline size (or grain structure) of N polysilicon layer 3625 may also be controlled by known industry methods of deposition. Also, known industry SOI methods of deposition may be used that result in polysilicon regions that are single crystalline (no longer polysilicon), or nearly single crystalline.

Next, methods deposit contact layer 3630 on the surface of N polysilicon layer 3625 forming a Schottky diode anode layer. Contact layer 3630 may also be used to form lower level contacts for nanotube elements as illustrated further below with respect to FIG. 36I. Contact layer 3630 may have a thickness range of 10 to 500 nm, for example. Contact layer 3630 may use similar materials to those used in forming conductor layer 3610; or contact layer 3630 material may be chosen to optimize anode material for enhanced Schottky diode properties such lower forward voltage drop and/or lower diode leakage. Anode contact layer 3630 may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used; or contact layer 3630 may be formed in layers to include conductive material for forming optimized Schottky diode characteristics on a lower layer and conductive materials to optimize ohmic contact to nanotube elements on an upper layer.

At this point in the process, remaining methods may be used to fabricate NV NT diode using Schottky diode-based anode-to-NT switch structures such as those illustrated in FIG. 31A. However, as described further above with respect to FIG. 31B for example, NV NT diodes may be formed using PN diodes instead of Schottky diodes. Therefore, alternatively, a PN diode alternative fabrication method is illustrated in FIG. 34A'.

Methods 3000 described further above, and with respect to FIG. 36A, may also be used to describe the fabrication of FIG. 36A'. Support circuits and interconnections 3601' illustrated in FIG. 36A' correspond to support circuits and interconnections 3601 illustrated in FIG. 36A, except for possible small changes that may be introduced in individual circuits to accommodate differences in diode characteristics such as turn-on voltage, for example, between Schottky diodes and PN diodes.

Next, methods deposit planarized insulator 3603' on the surface of support circuits and interconnections 3601' as illustrated in FIG. 36A'. Planarized insulator 3603' corresponds to planarized insulator 3603 except for possible small changes that may be introduced in insulator 3603' to accommodate differences in diode characteristics. Memory support structure 3605' is therefore similar to support structures 3605 except for small changes that may be introduced in support circuits and interconnections 3601' and planarized insulator 3603' as described further above with respect to FIG. 36A'.

Next, methods deposit conductor layer 3610' in contact with the surface of planarized insulator 3603' as illustrated in FIG. 36A' which can be similar in thickness and materials to conductor layer 3610 described further above with respect to FIG. 36A.

Next, methods deposit N+ polysilicon layer 3620' on the surface of conductor layer 3610' as illustrated in FIG. 36A' in order to form an ohmic contact layer. N+ polysilicon layer 3620' is typically doped with arsenic or phosphorous to $10^{20}$ dopant atoms/cm$^3$, for example, and has a thickness of 20 to 400 nm, for example.

Next, methods deposit an N polysilicon layer 3625' of thickness 10 nm to 500 nm on the surface of N+ polysilicon layer 3620'. N polysilicon layer 3625' may be doped with arsenic or phosphorus in the range of $10^{14}$ to $10^{17}$ dopant atoms/cm$^3$, for example. N polysilicon layer 3625' may be used to form cathodes of Schottky diodes. In addition to doping levels, the polysilicon crystalline size (or grain structure) of N polysilicon layer 3625' may also be controlled by known industry methods of deposition. Also, known industry SOI methods of deposition may be used that result in polysilicon regions that are single crystalline (no longer polysilicon), or nearly single crystalline.

Next, methods deposit a P polysilicon layer 3627 of thickness 10 nm to 500 nm on the surface of N polysilicon layer 3625' as illustrated in FIG. 36A'. P polysilicon layer 3627 may be doped with boron in the range of $10^{14}$ to $10^{17}$ dopant atoms/cm$^3$, for example. P polysilicon layer 3627 may be used to form anodes of PN diodes. In addition to doping levels, the polysilicon crystalline size of P Polysilicon layer 3627 may also be controlled by known industry methods of deposition. Also, known industry SOI methods of deposition may be used that result in polysilicon regions that are single crystalline (no longer polysilicon), or nearly single crystalline.

Next, methods deposit contact layer 3630' on the surface of P polysilicon layer 3627 forming an ohmic contact between contact layer 3630' and P polysilicon layer 3627. Contact layer 3630' may also be used to form lower level contacts for nanotube elements as illustrated further below with respect to FIG. 36I.

At this point in the process, remaining methods may be used to fabricate NV NT diode using PN diode-based anode-to-NT switch structures such as those illustrated in FIG. 31B. However, as described further above with respect to FIG. 31C for example, NV NT diodes may be formed using both Schottky diodes and PN diodes in parallel. Therefore, alternatively, a combined parallel Schottky diode and PN diode alternative fabrication method is illustrated in FIG. 34A".

Methods 3000 described further above, and with respect to FIG. 36A, may also be used to describe the fabrication of FIG. 36A". Support circuits and interconnections 3601" illustrated in FIG. 36A" correspond to support circuits and interconnections 3601 illustrated in FIG. 36A, except for possible small changes that may be introduced in individual circuits to accommodate differences in diode characteristics such as turn-on voltage, for example, between Schottky diodes and combined parallel Schottky diode and PN diodes.

Next, methods deposit conductor layer 3610" in contact with the surface of planarized insulator 3603" as illustrated in FIG. 36A" which is similar in thickness and materials to conductor layer 3610 described further above with respect to FIG. 36A.

Next, methods deposit N+ polysilicon layer 3620" on the surface of conductor layer 3610" as illustrated in FIG. 36A" in order to form an ohmic contact layer. N+ polysilicon layer 3620" is typically doped with arsenic or phosphorous to $10^{20}$ dopant atoms/cm$^3$, for example, and has a thickness of 20 to 400 nm, for example.

Next, methods deposit an N polysilicon layer 3625" of thickness 10 nm to 500 nm on the surface of N+ polysilicon layer 3620". N polysilicon layer 3625" may be doped with arsenic or phosphorus in the range of $10^{14}$ to $10^{17}$ dopant atoms/cm$^3$, for example. N polysilicon layer 3625" may be used to form cathodes of both Schottky diodes and PN diodes in parallel. In addition to doping levels, the polysilicon crystalline size (or grain structure) of N polysilicon layer 3625" may also be controlled by known industry methods of deposition. Also, known industry SOI methods of deposition may be used that result in polysilicon regions that are single crystalline (no longer polysilicon), or nearly single crystalline.

At this point in the process, remaining methods may be used to fabricate NV NT diodes using Schottky diodes and PN diode in parallel to form anode-to-NT switch structures such as those illustrated in FIG. 31C. Schottky diodes and PN diodes in parallel may be formed as illustrated further below with respect to FIG. 36I if contact layer 3630 is omitted from the structure.

Schottky diodes and PN diodes in parallel are formed because a nanotube element such as nanotube element 3645 illustrated further below with respect to FIG. 36I, if contact layer 3630 is omitted from the structure, would be in contact with N poly layer 3625. P-type semiconductor nanotube elements, a subset of NT elements 3645, would be in physical and electrical contact with N polysilicon layer 3625, and would form PN diode-anodes and N polysilicon layer 3625 form cathodes that together form PN diodes. Metallic type nanotube elements, also a subset of NT elements 3645, would also be in physical and electrical contact with N polysilicon layer 3625, and would form Schottky diode-anodes and N polysilicon layer 3625 would form cathodes for Schottky diodes having Schottky diode junctions as part of combined PN and Schottky diode junctions in parallel.

Descriptions of methods of fabrication continue with respect to Schottky-diode based structures described with respect to FIG. 36A to form NV NT diode cell structures corresponding to cross section 3100 illustrated in FIG. 31A. However, these methods of fabrication may also be applied to the PN diode-based structures described with respect to FIG. 36A' to form NV NT diode cell structures corresponding to cross section 3100' illustrated in FIG. 31B. Also, these methods of fabrication may also be applied to structures with respect to FIG. 36A" to form NV NT diode cell structure corresponding to cross section 3100" illustrated in FIG. 31C.

Figure 36C:
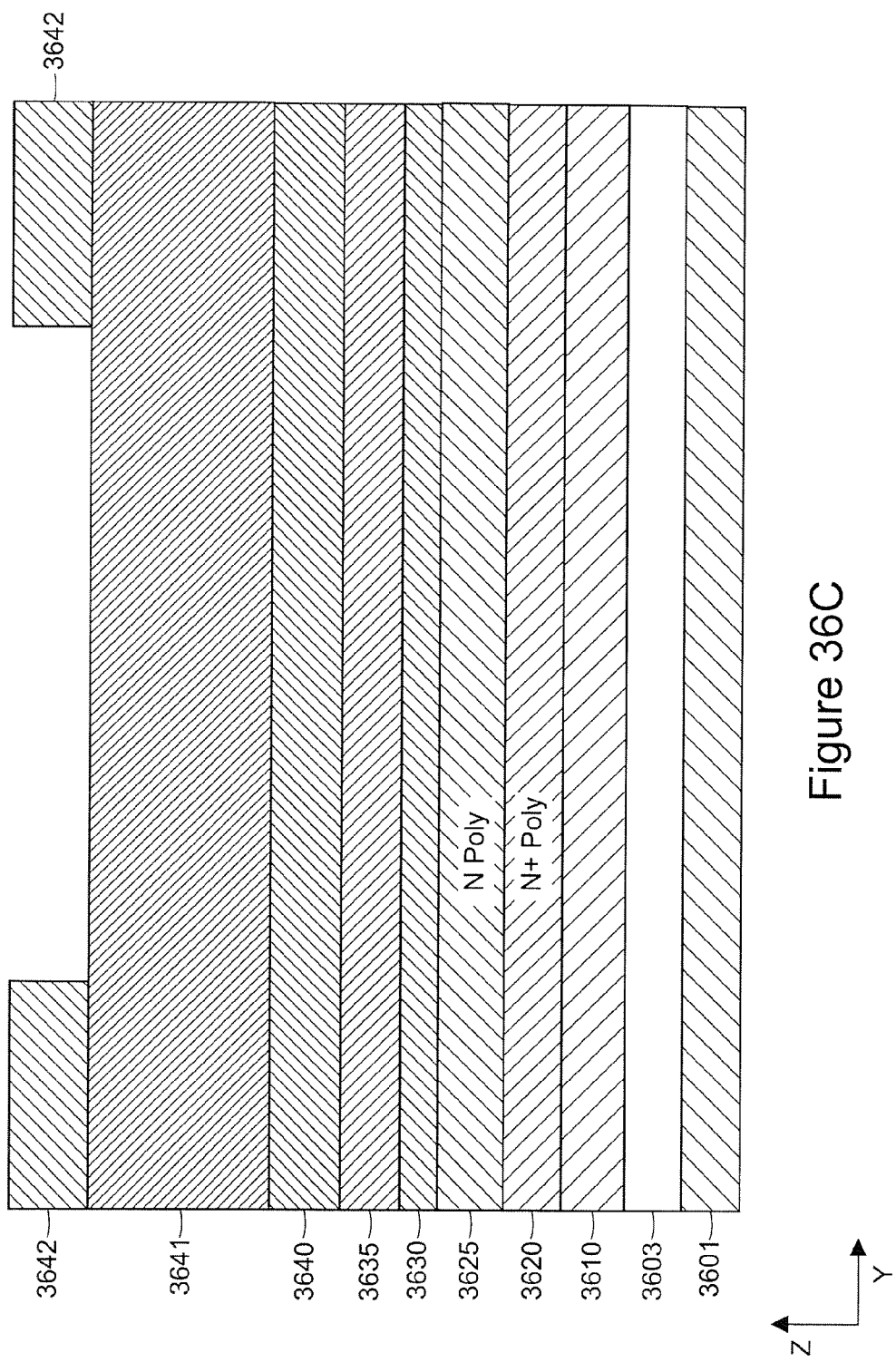
Figure 36D:
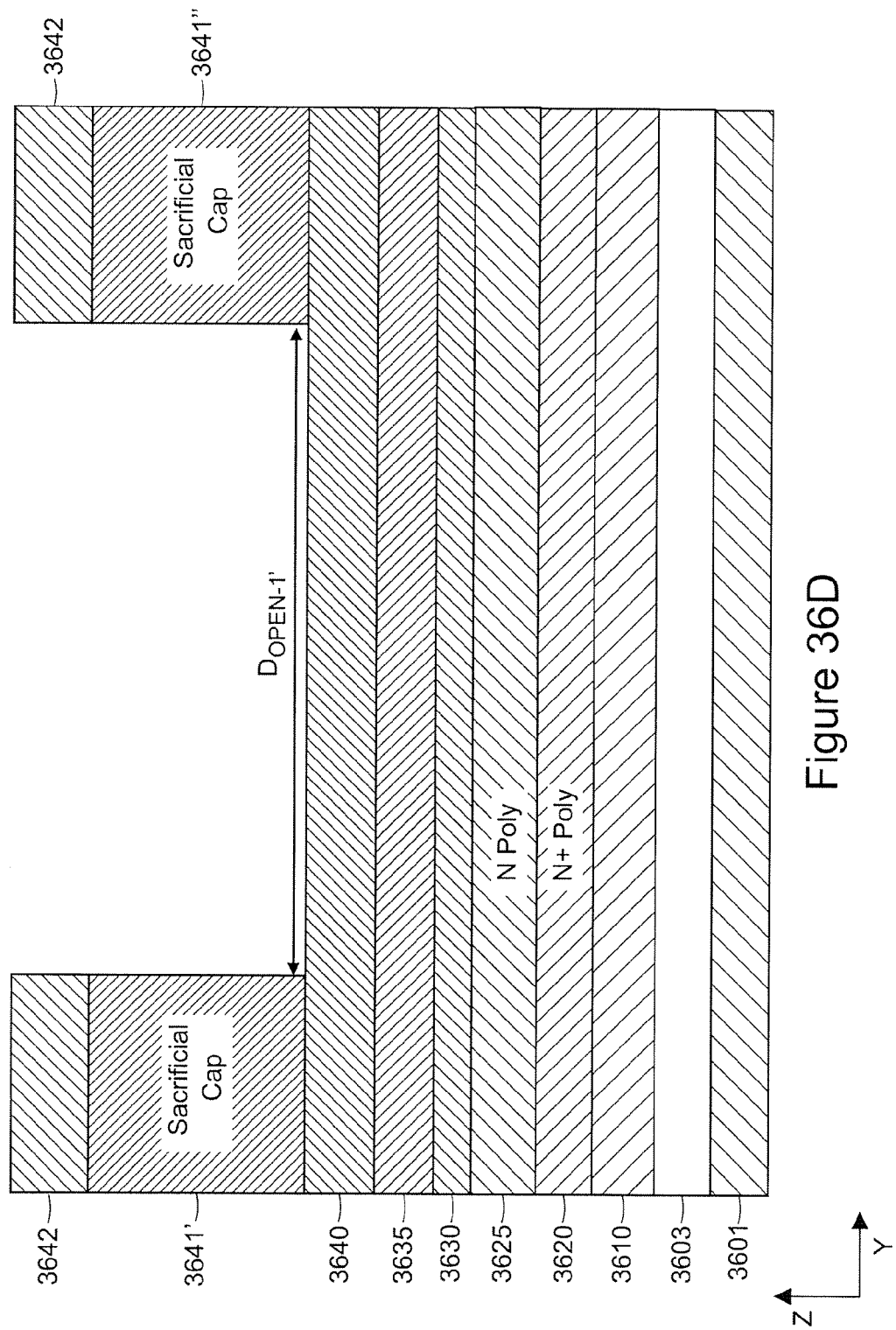
Figure 36E:
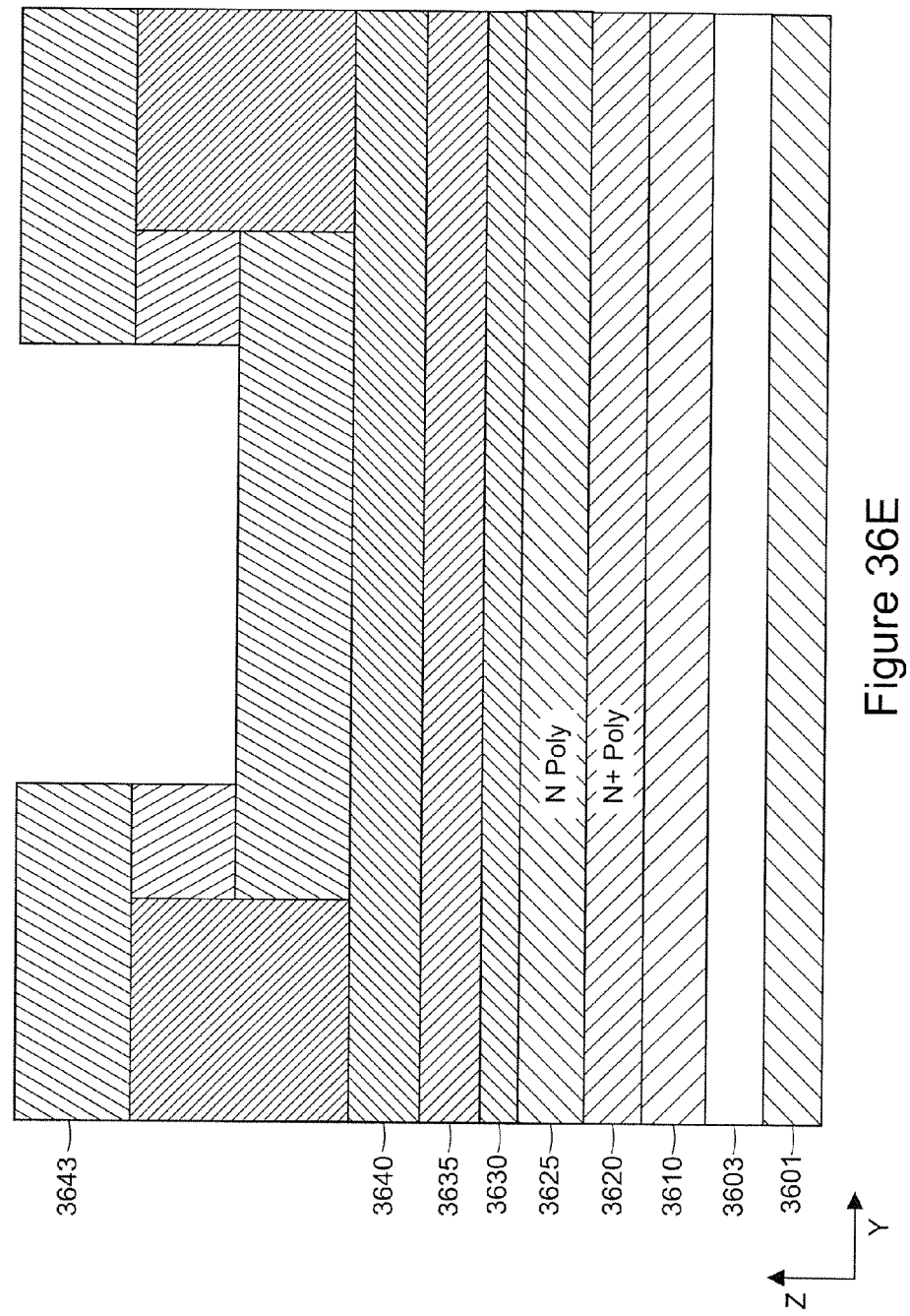
Figure 36F:
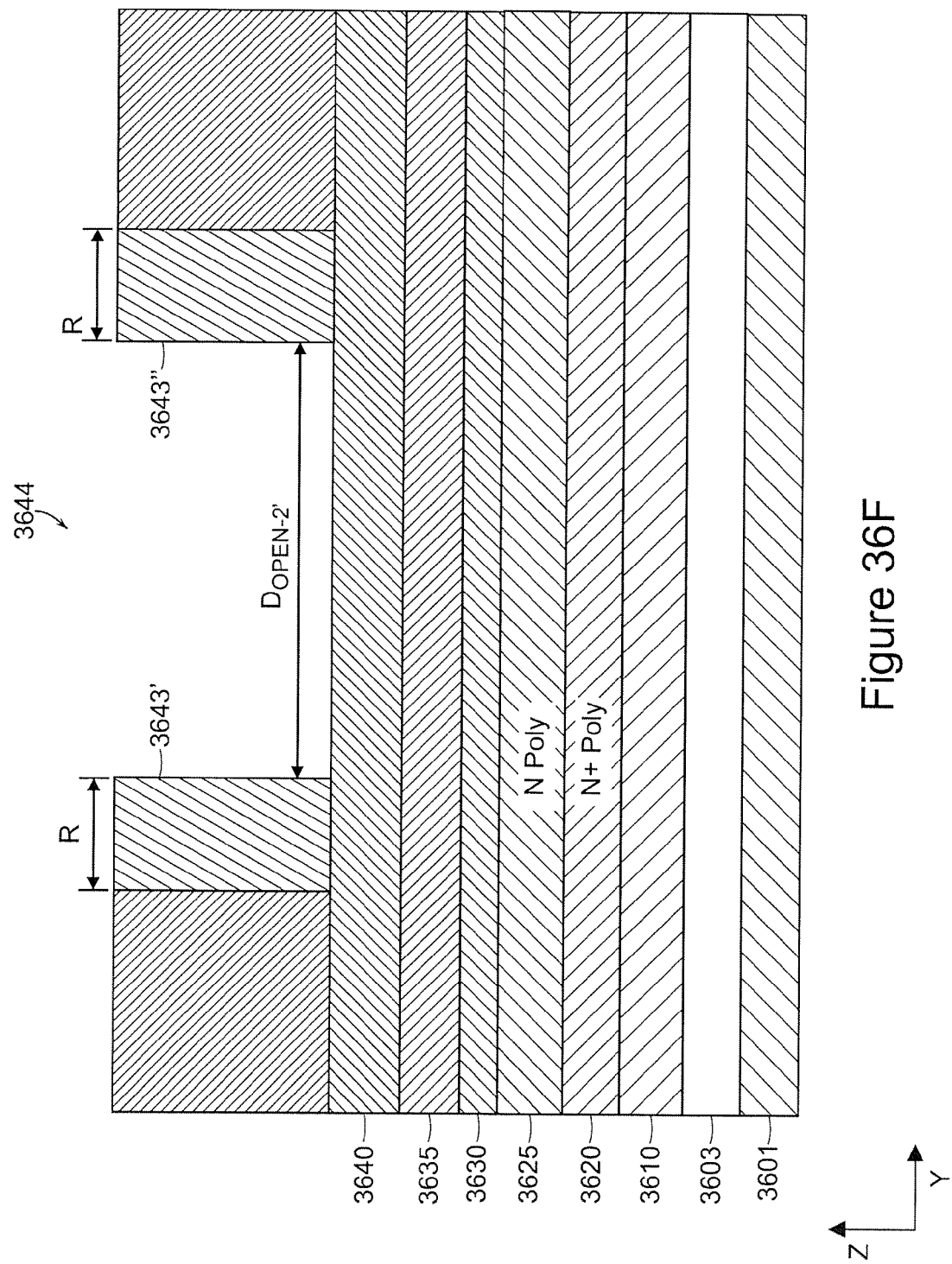
Figure 36G:
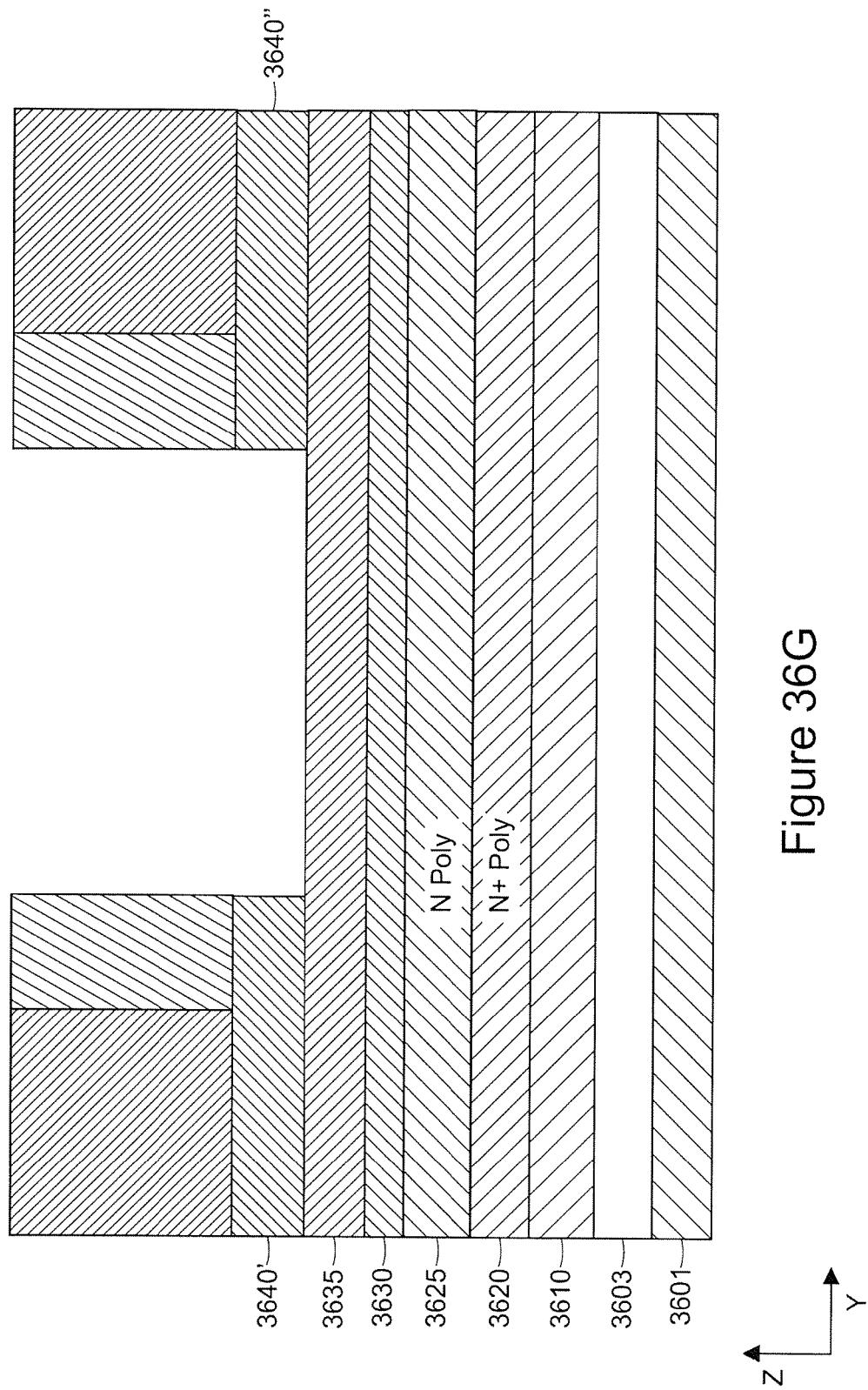
Figure 36H:
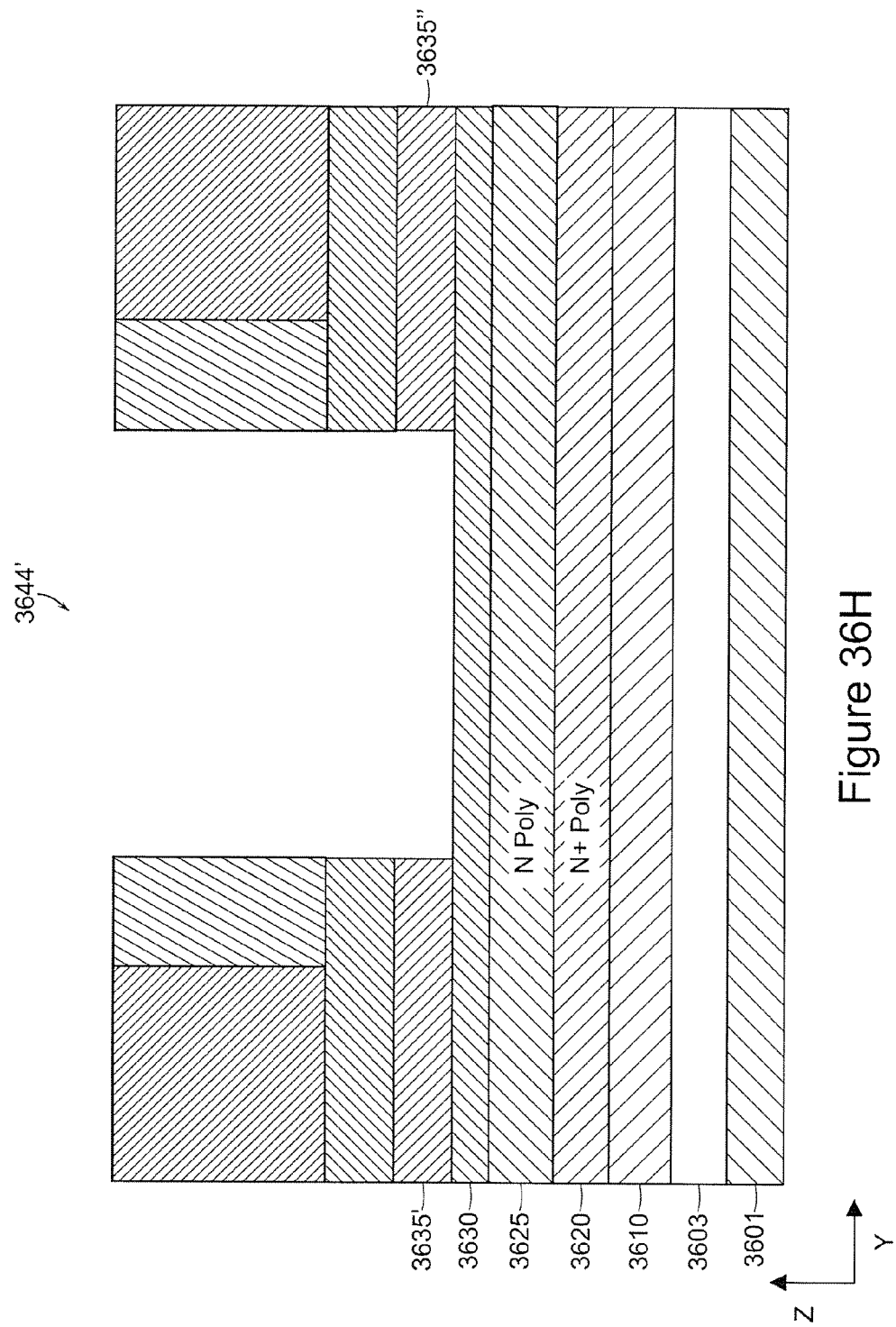
Figure 36I:
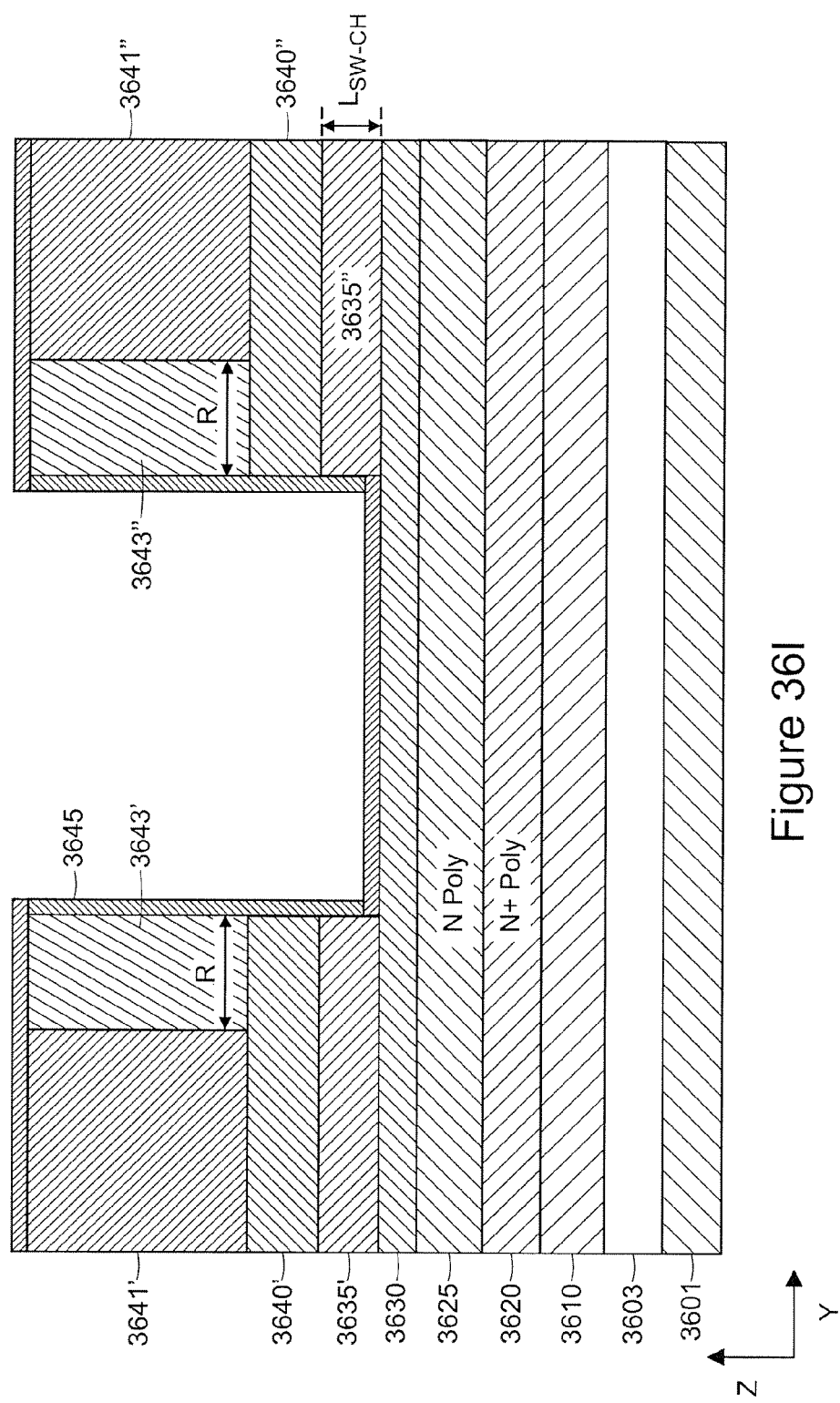
Figure 36J:
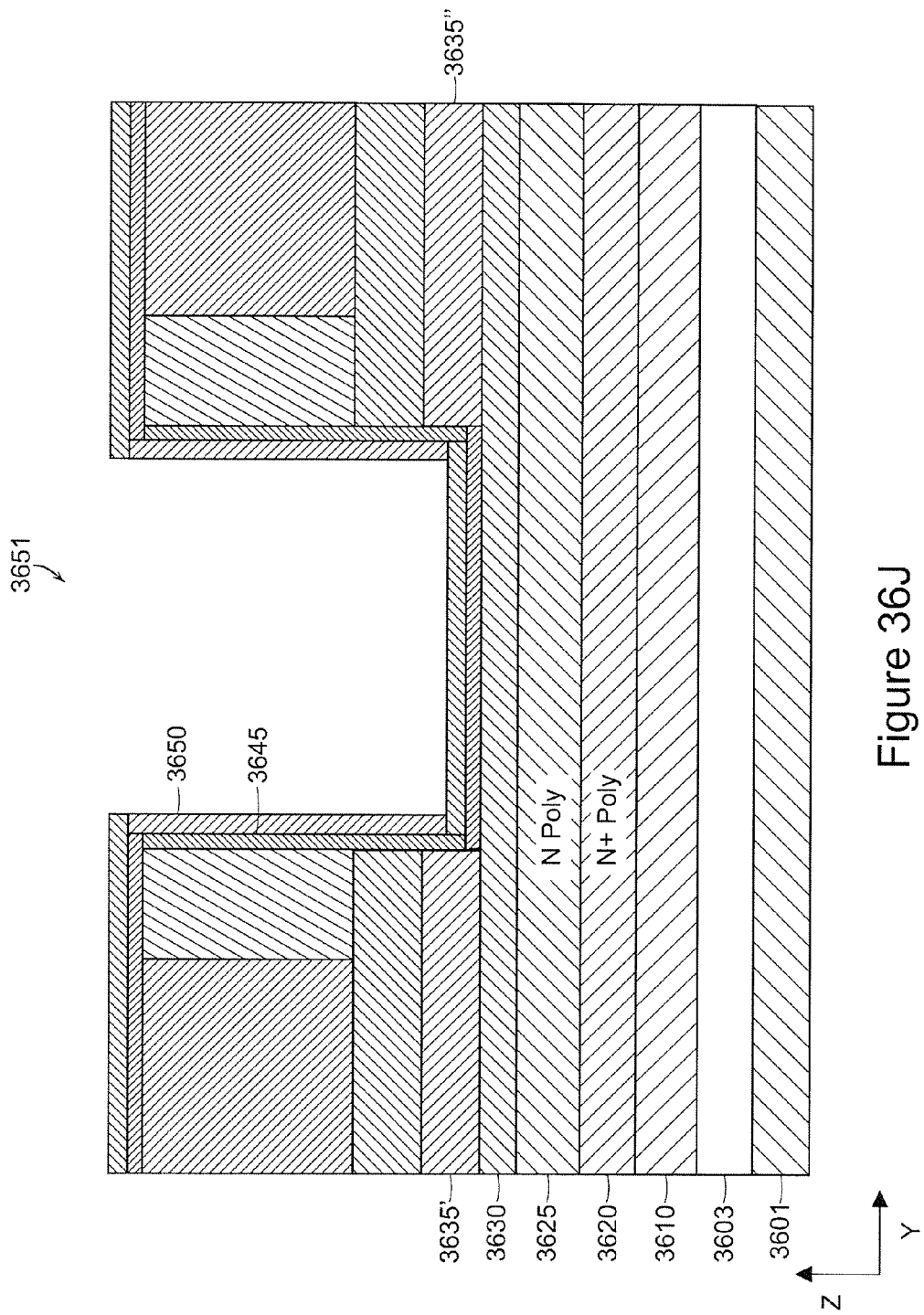
Figure 36K:
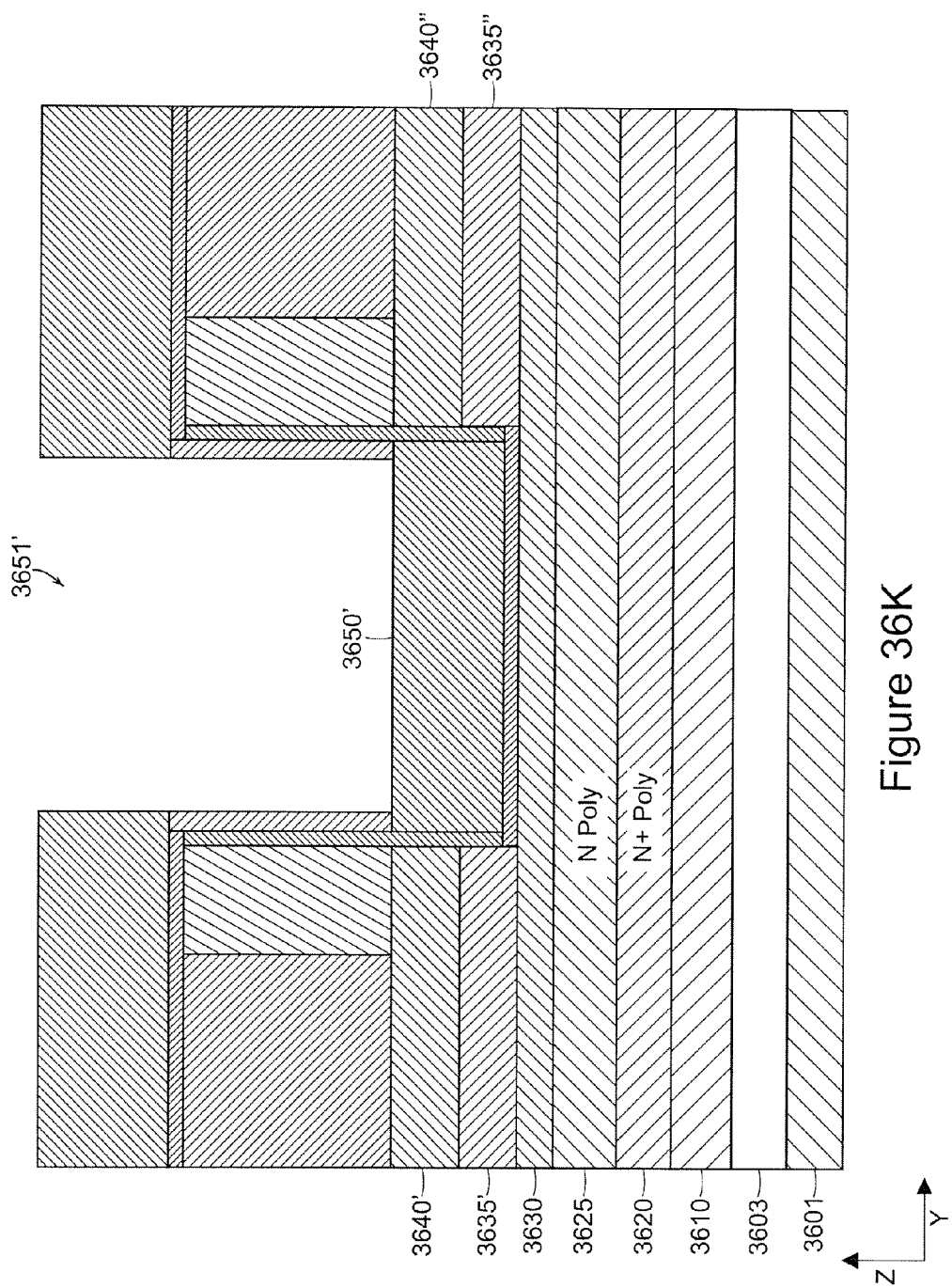
Figure 36L:
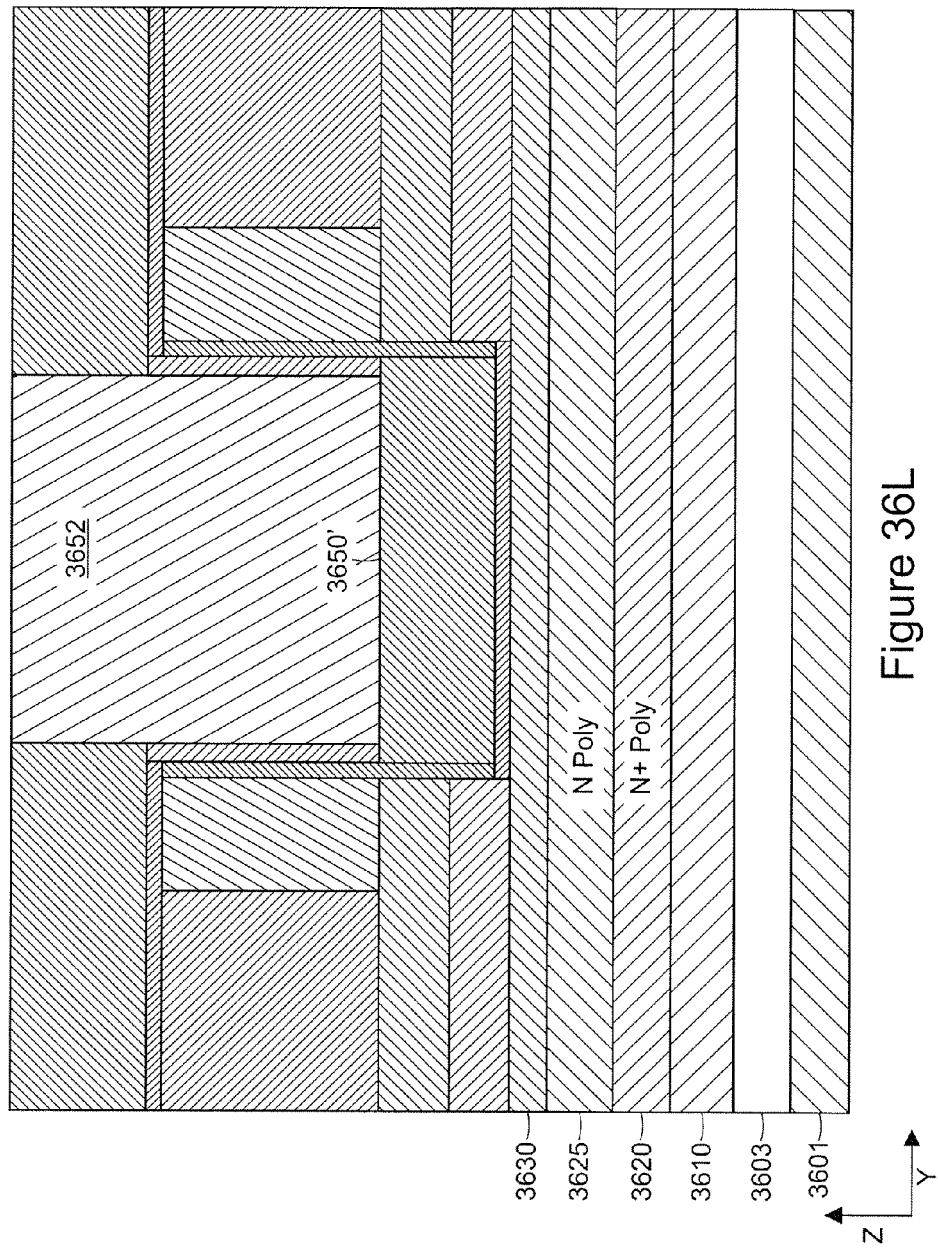
Figure 36M:
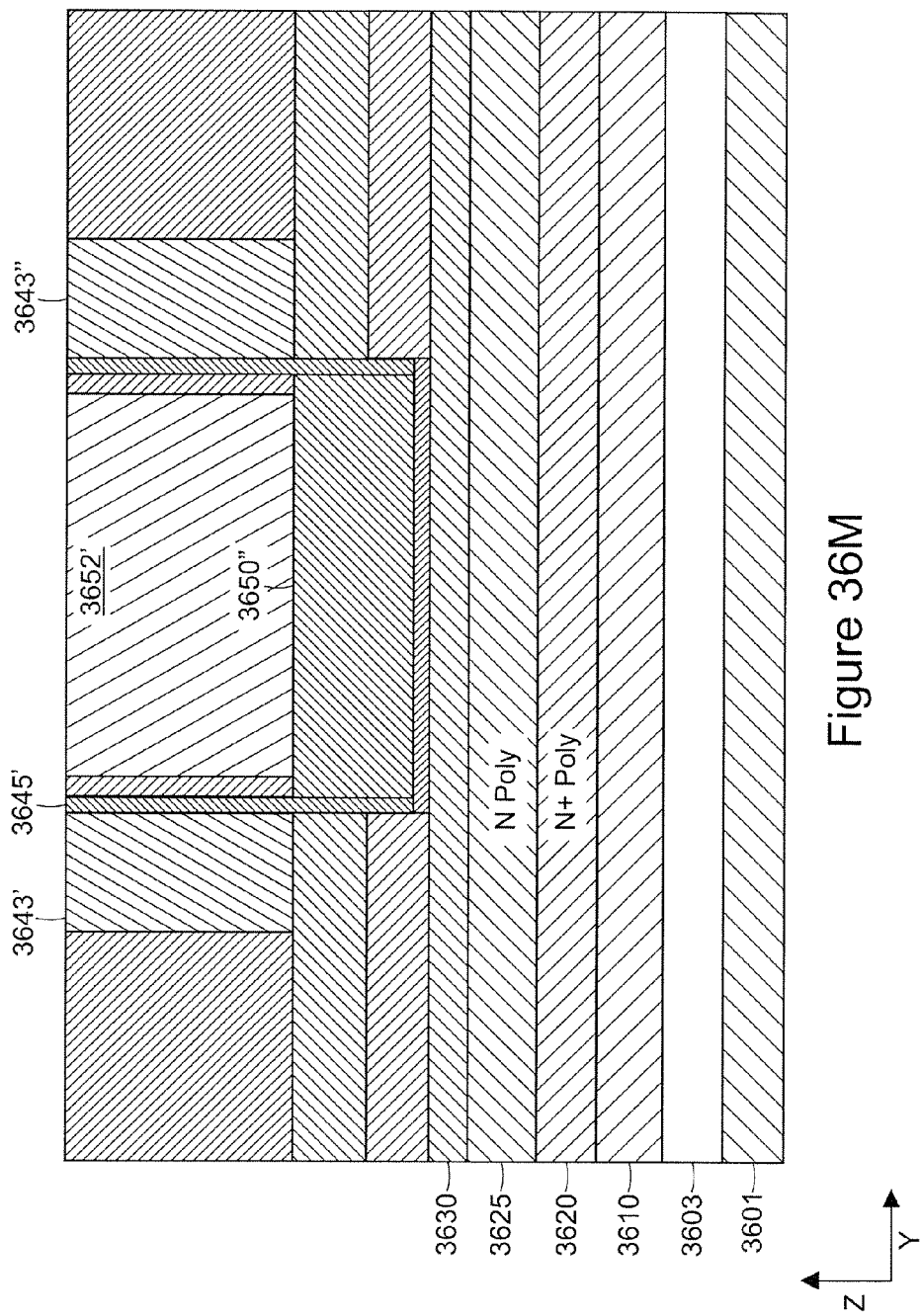
Figure 36N:
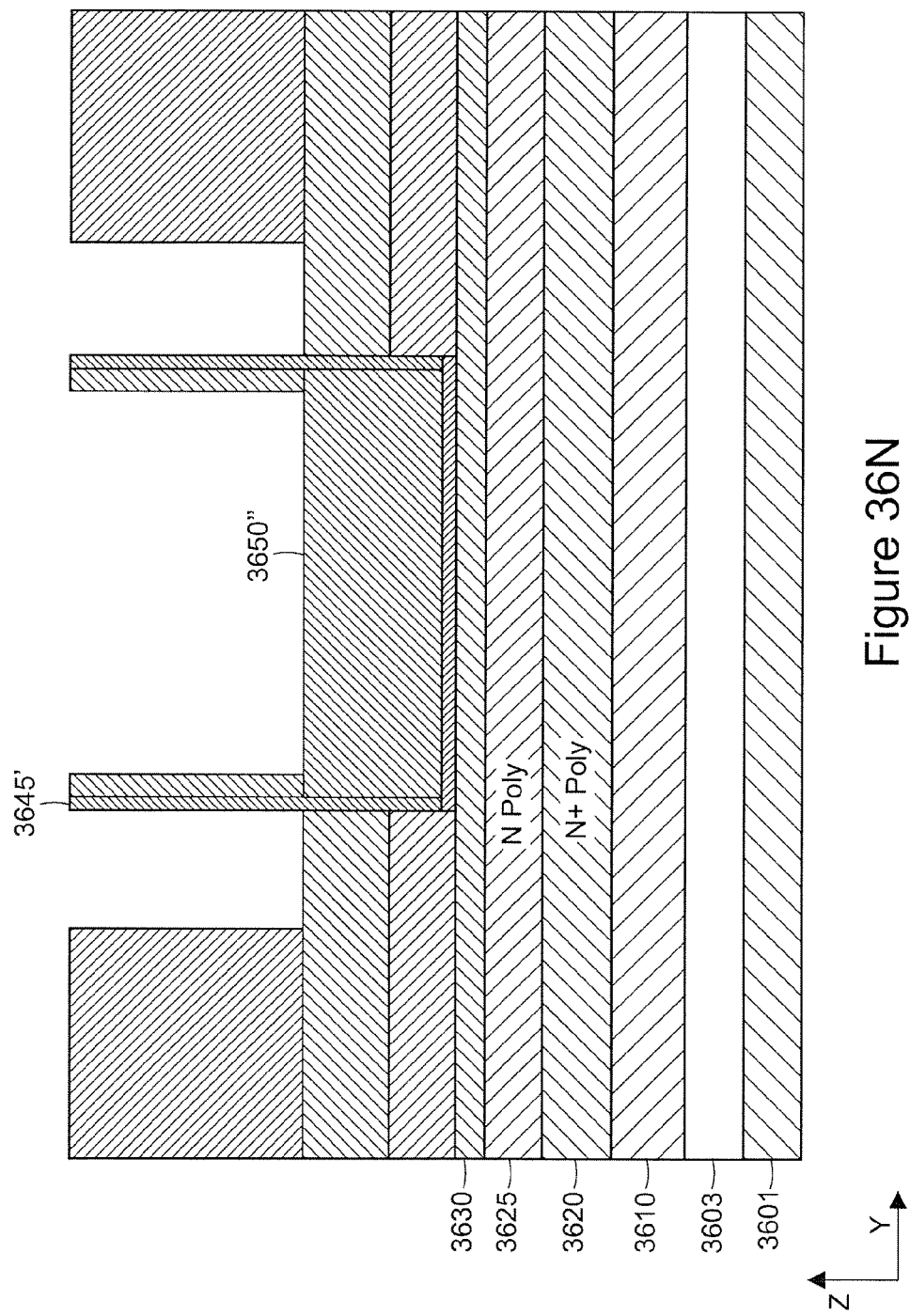
Figure 36O:
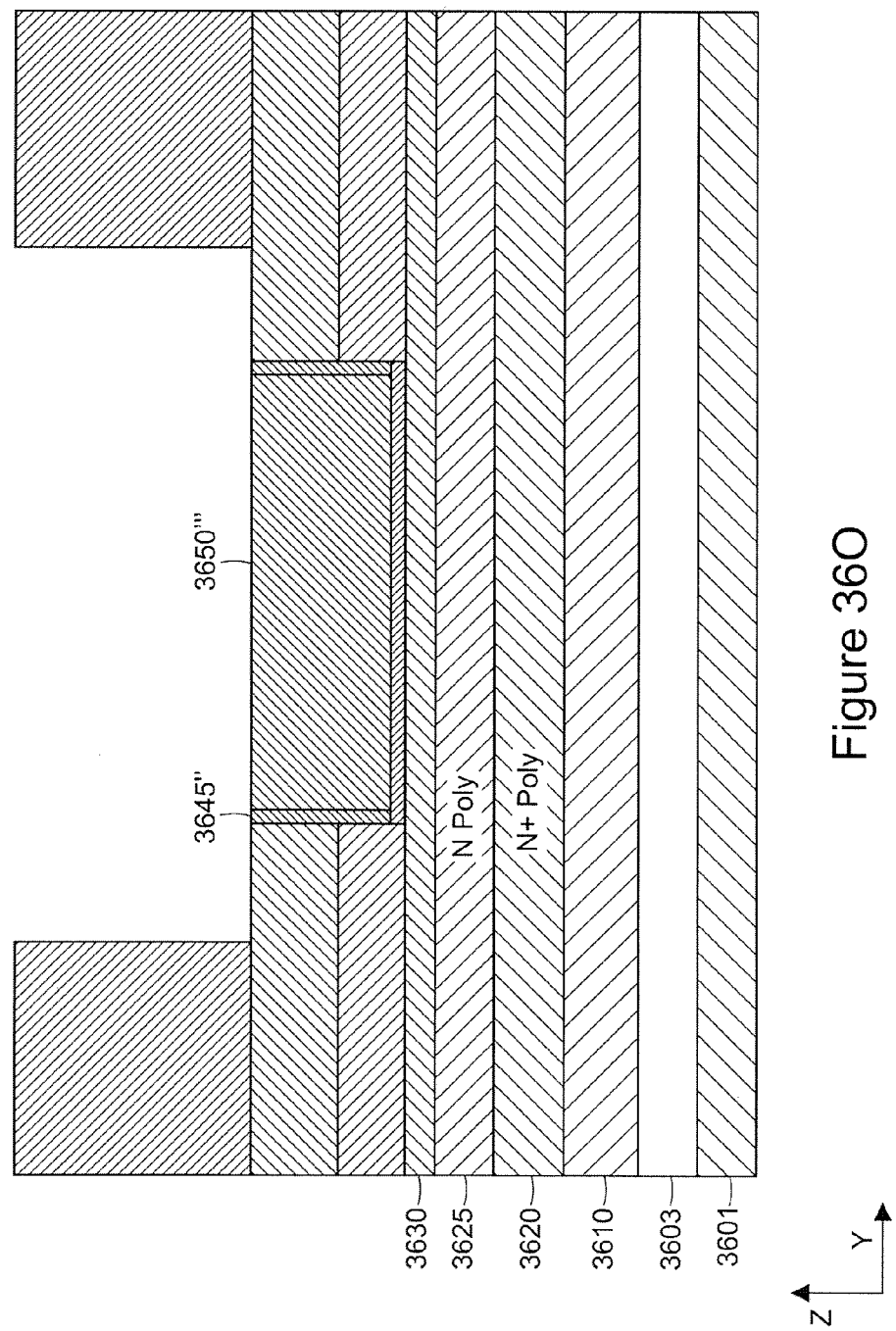
Figure 36P:
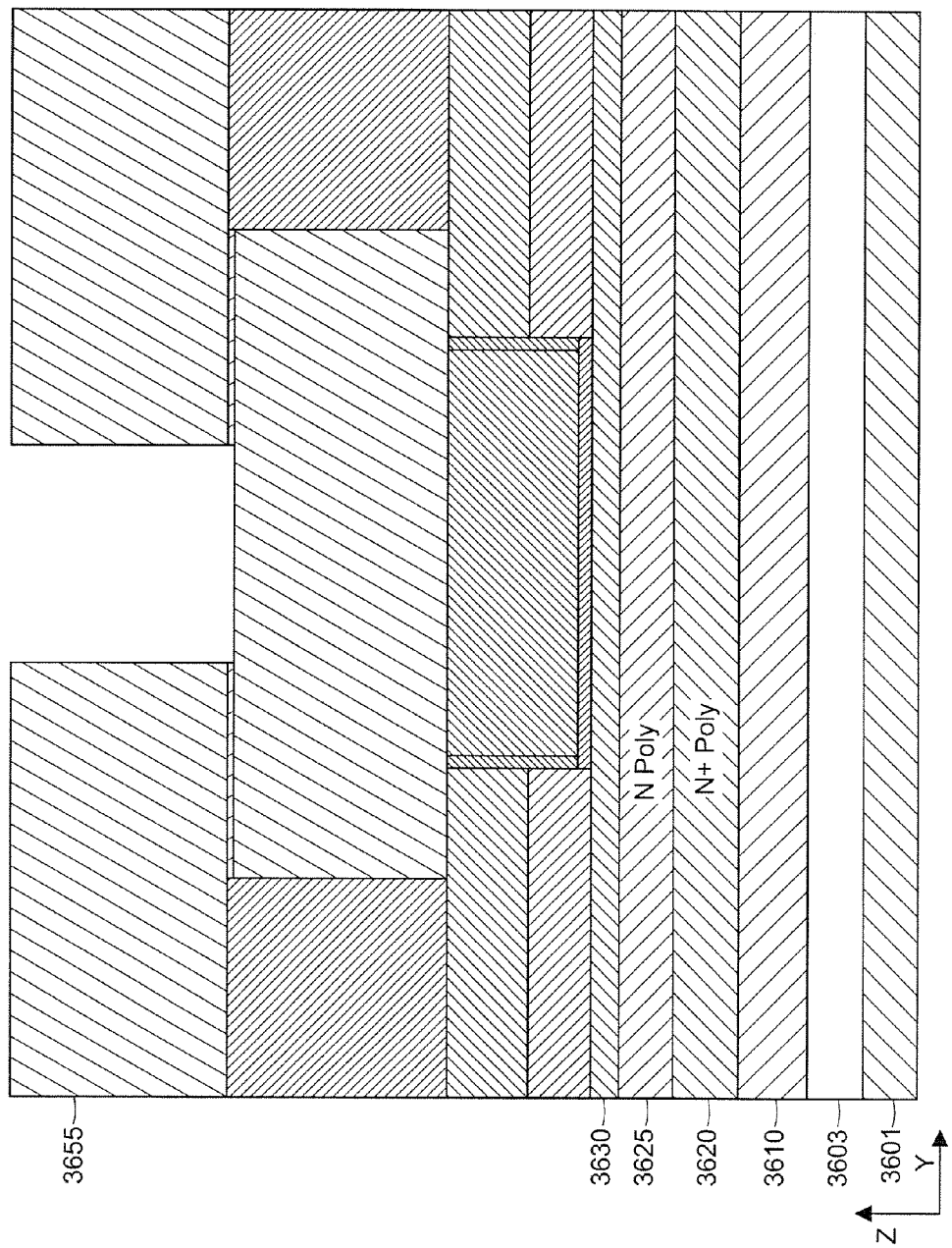
Figure 36Q:
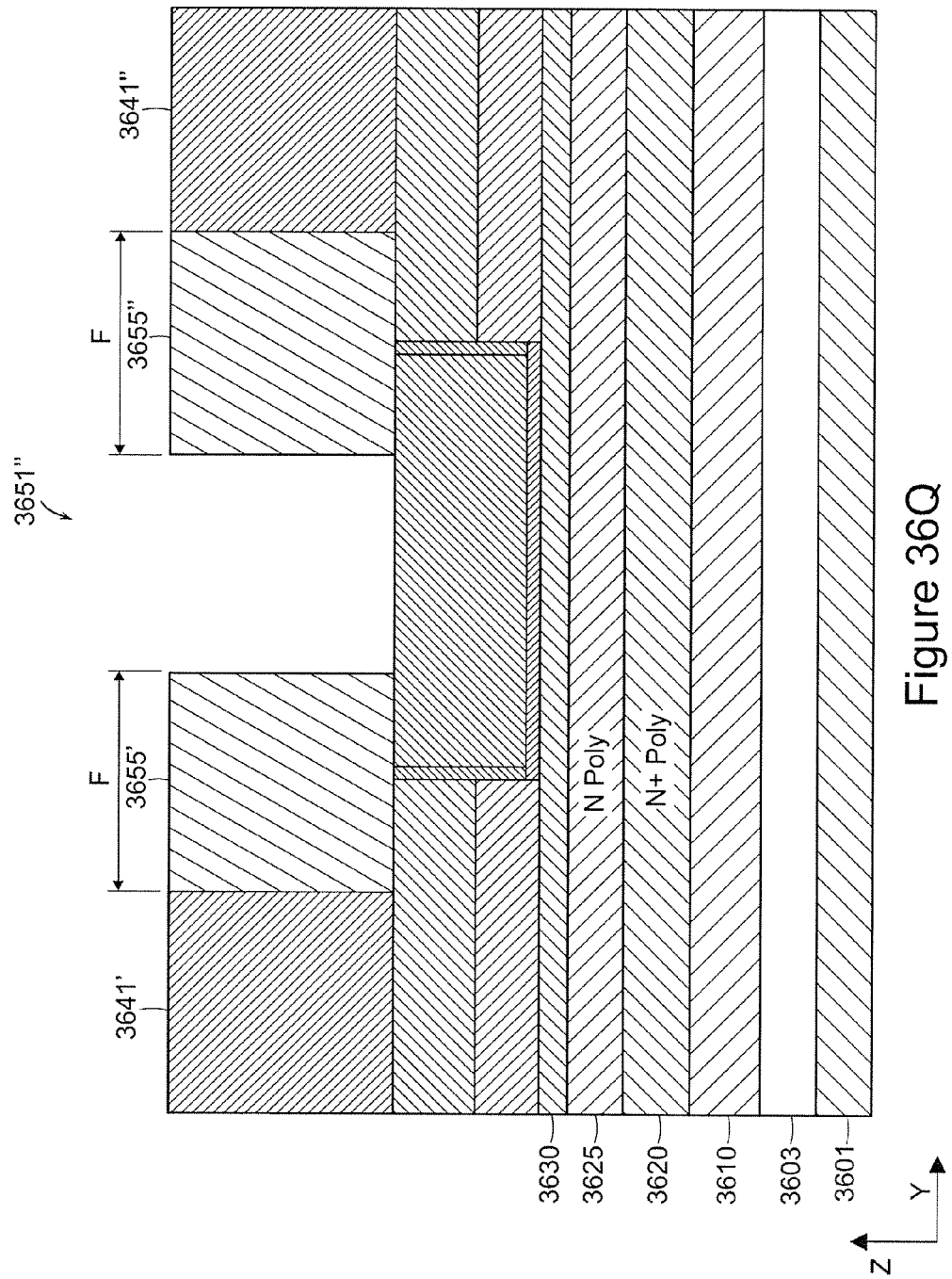
Figure 36R:
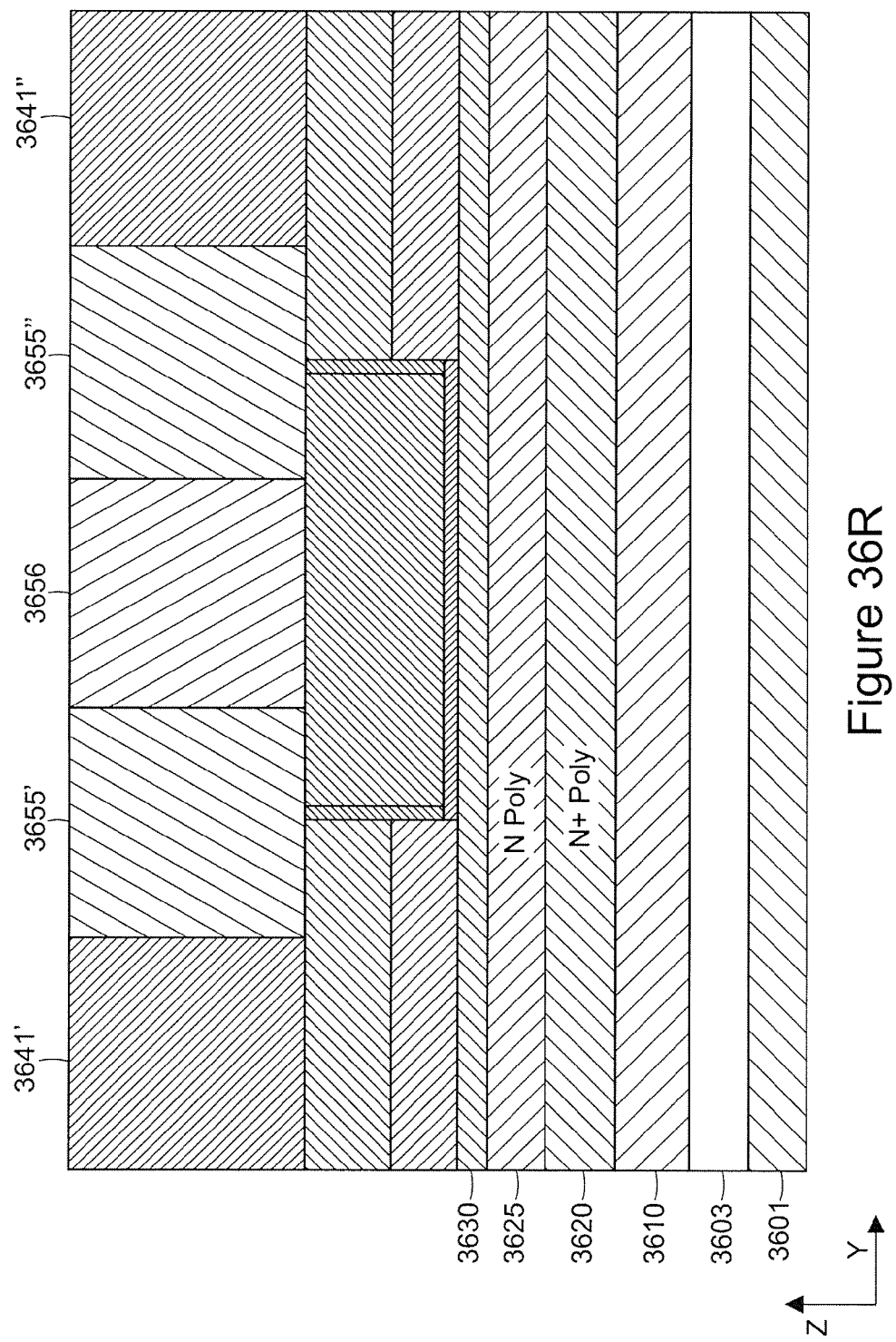
Figure 36S:
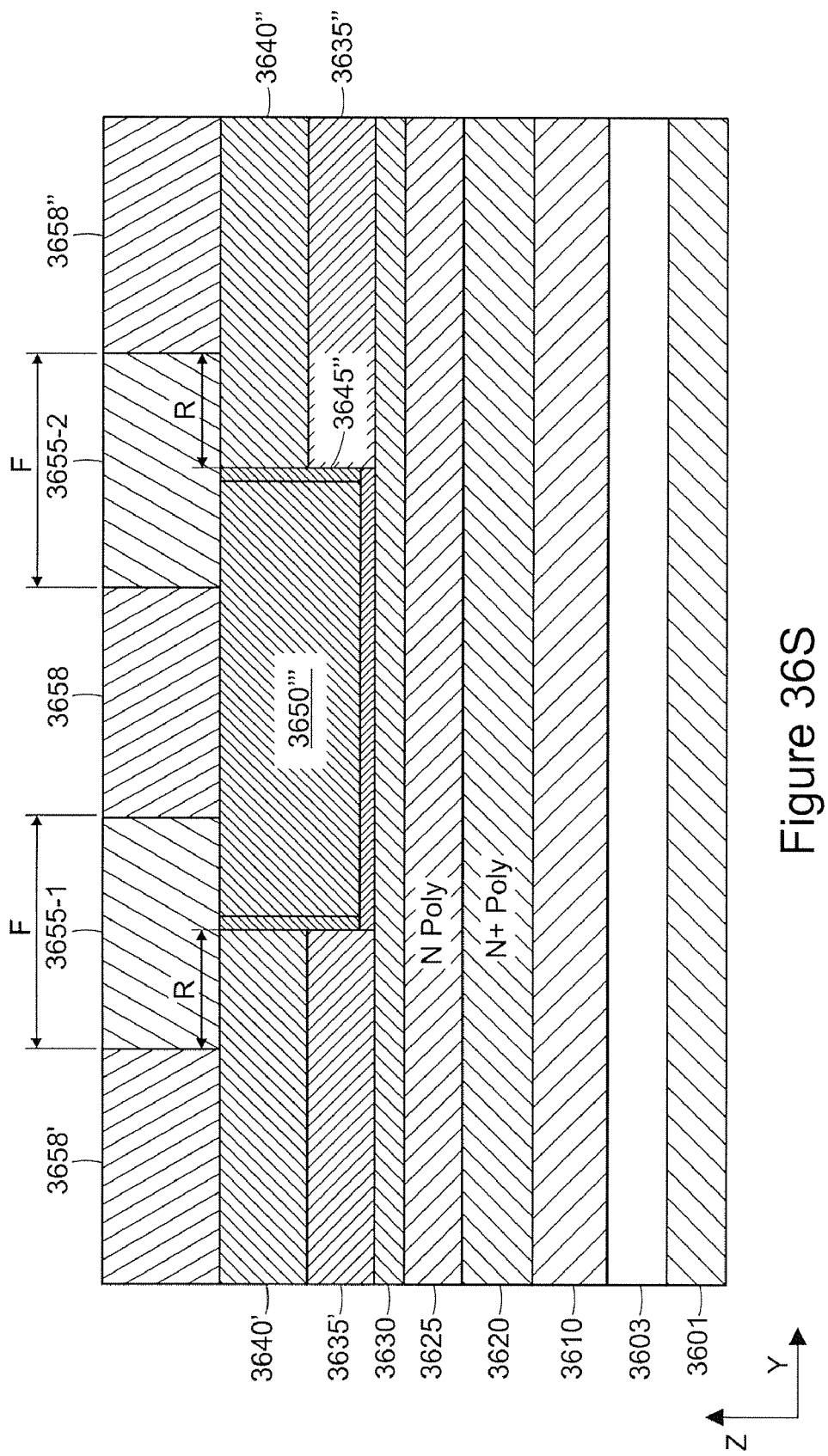
Figure 36T:
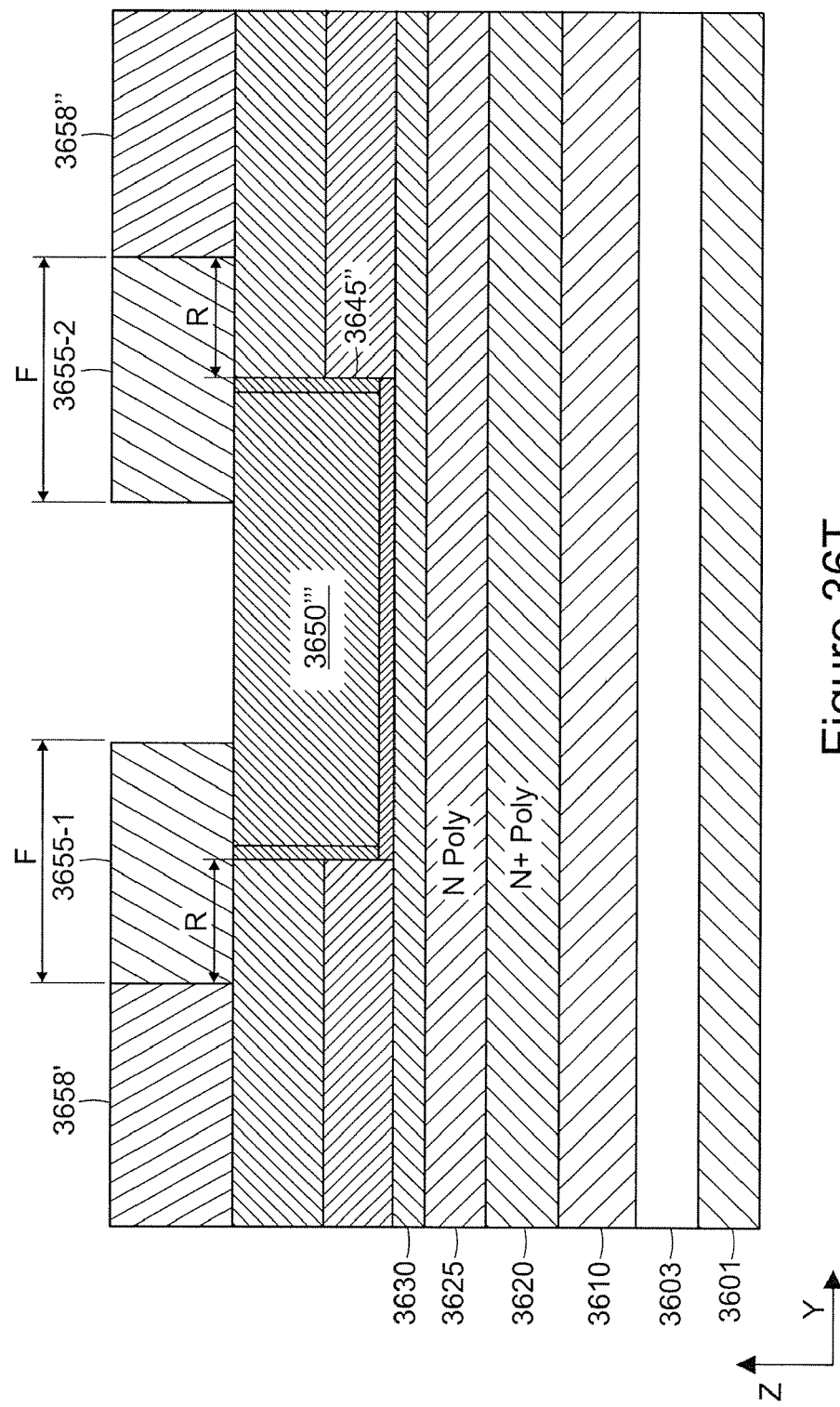
Figure 36U:
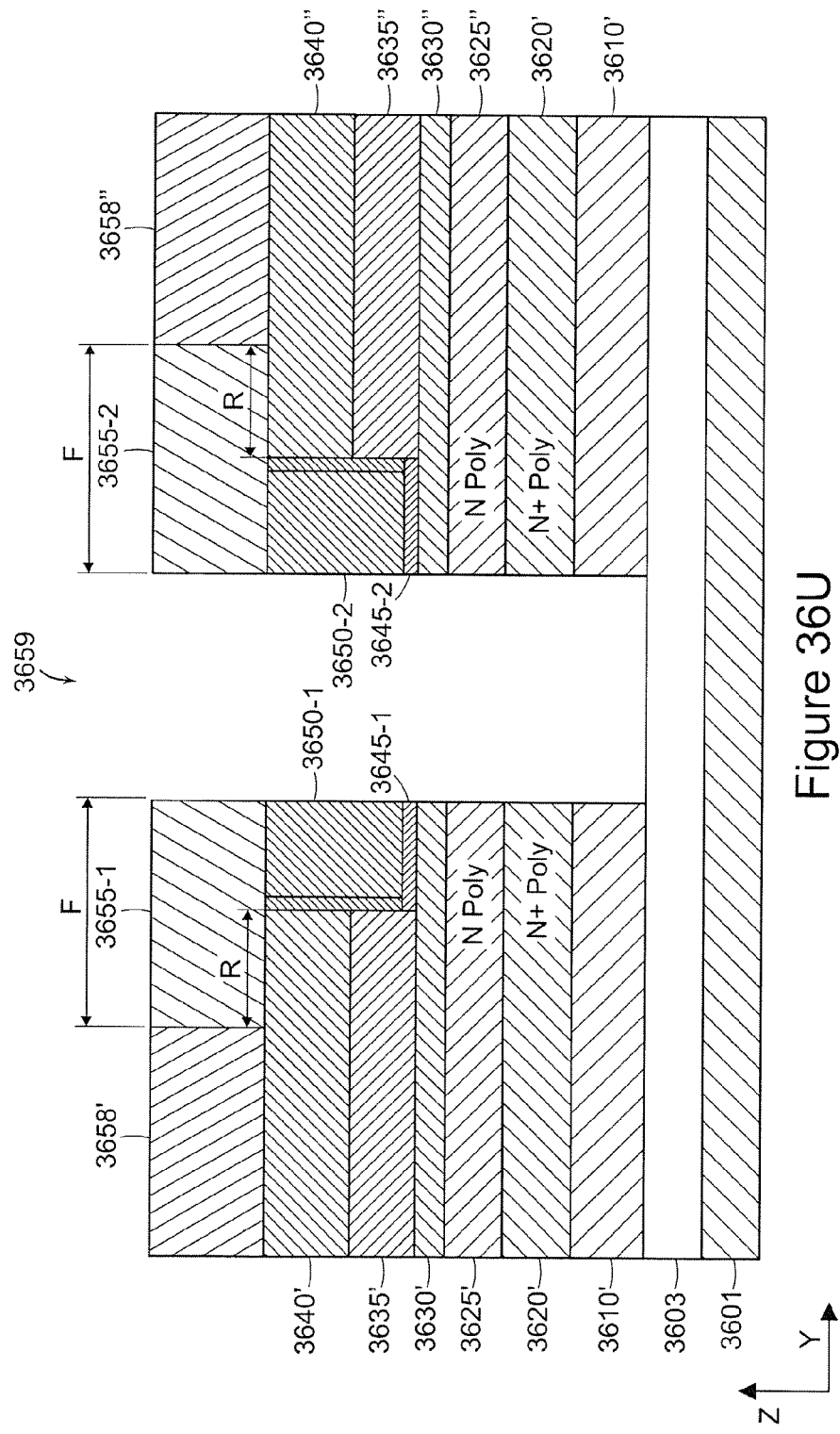
Figure 36V:
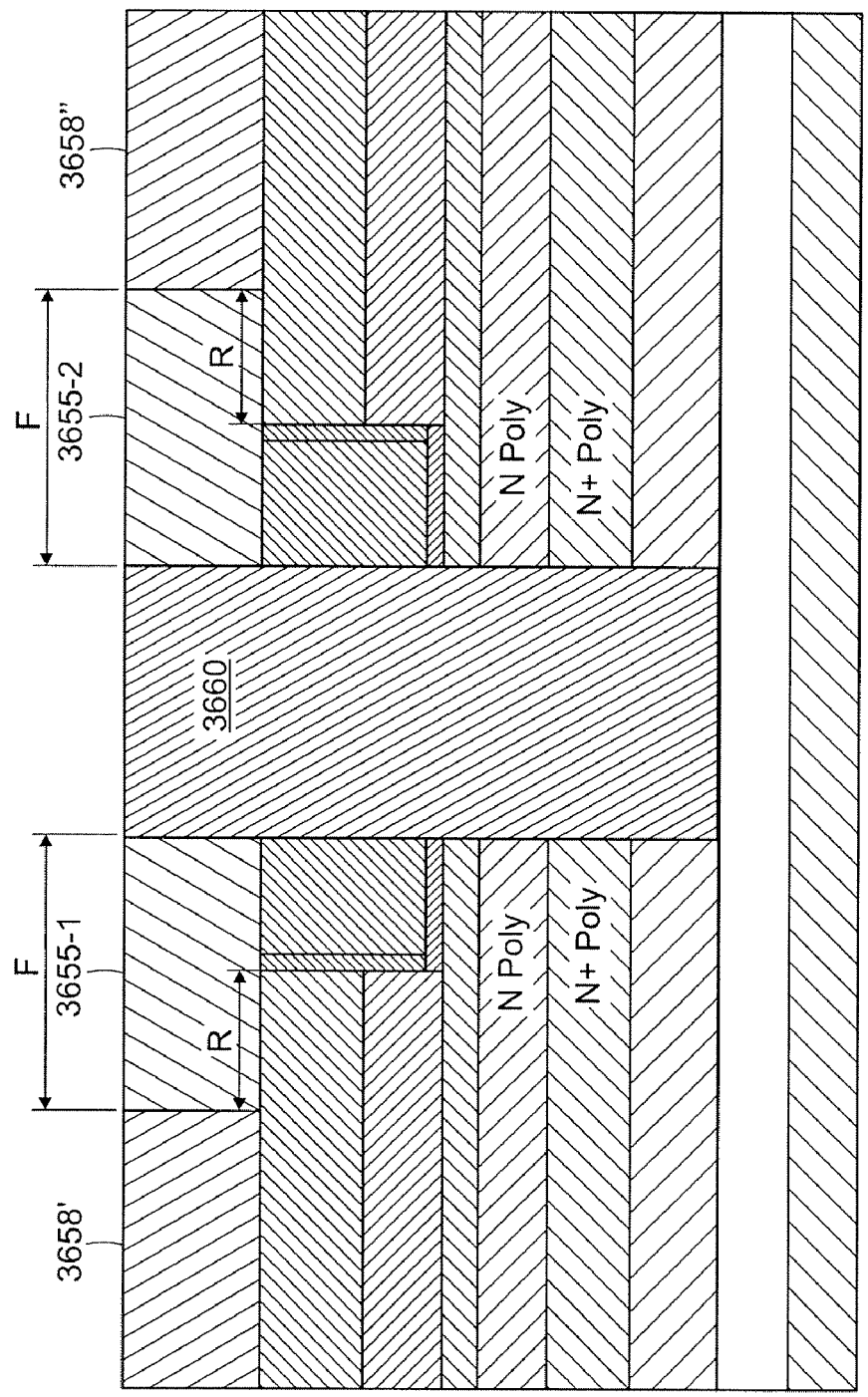
Figure 36W:
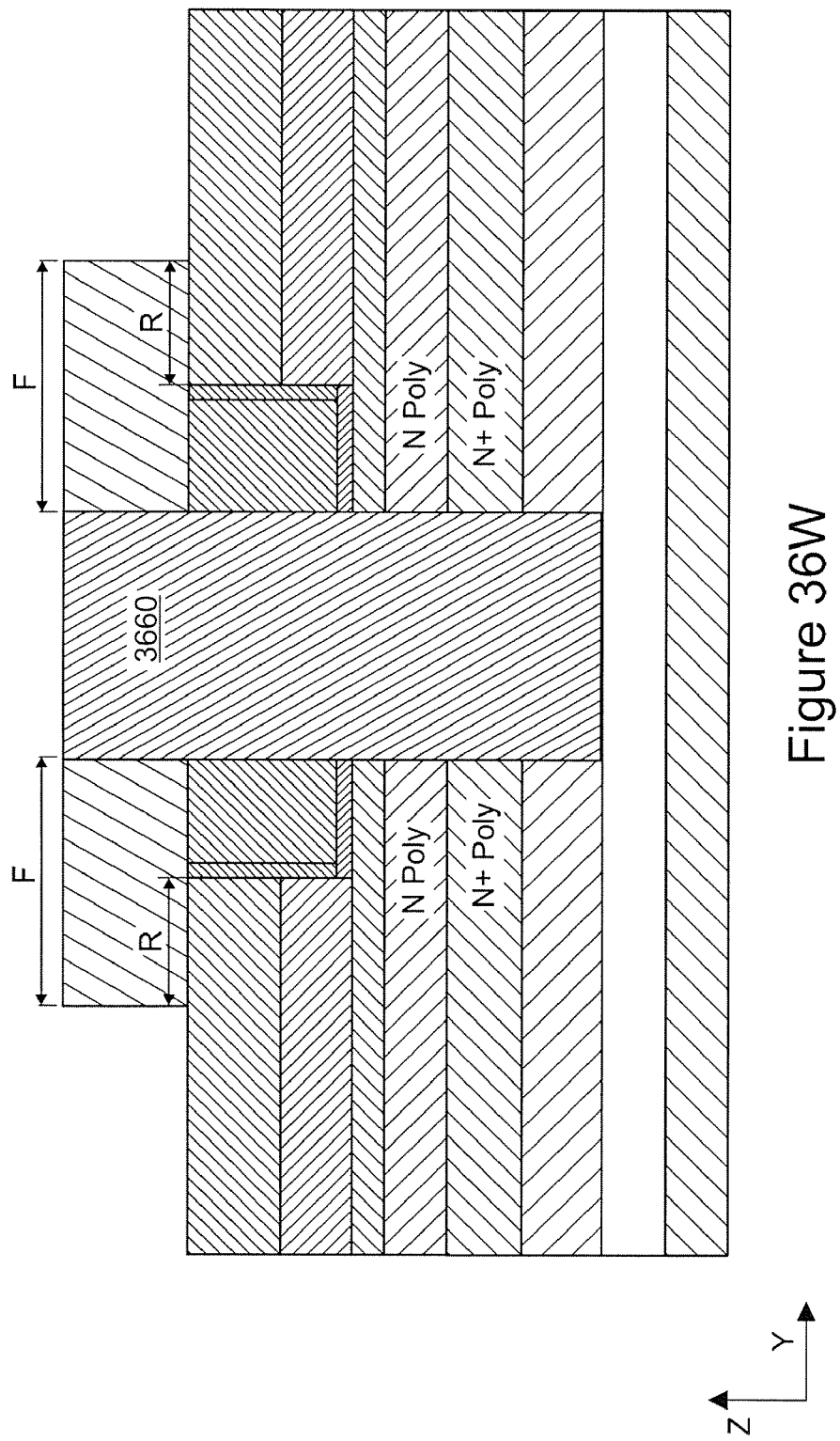
Figure 36X:
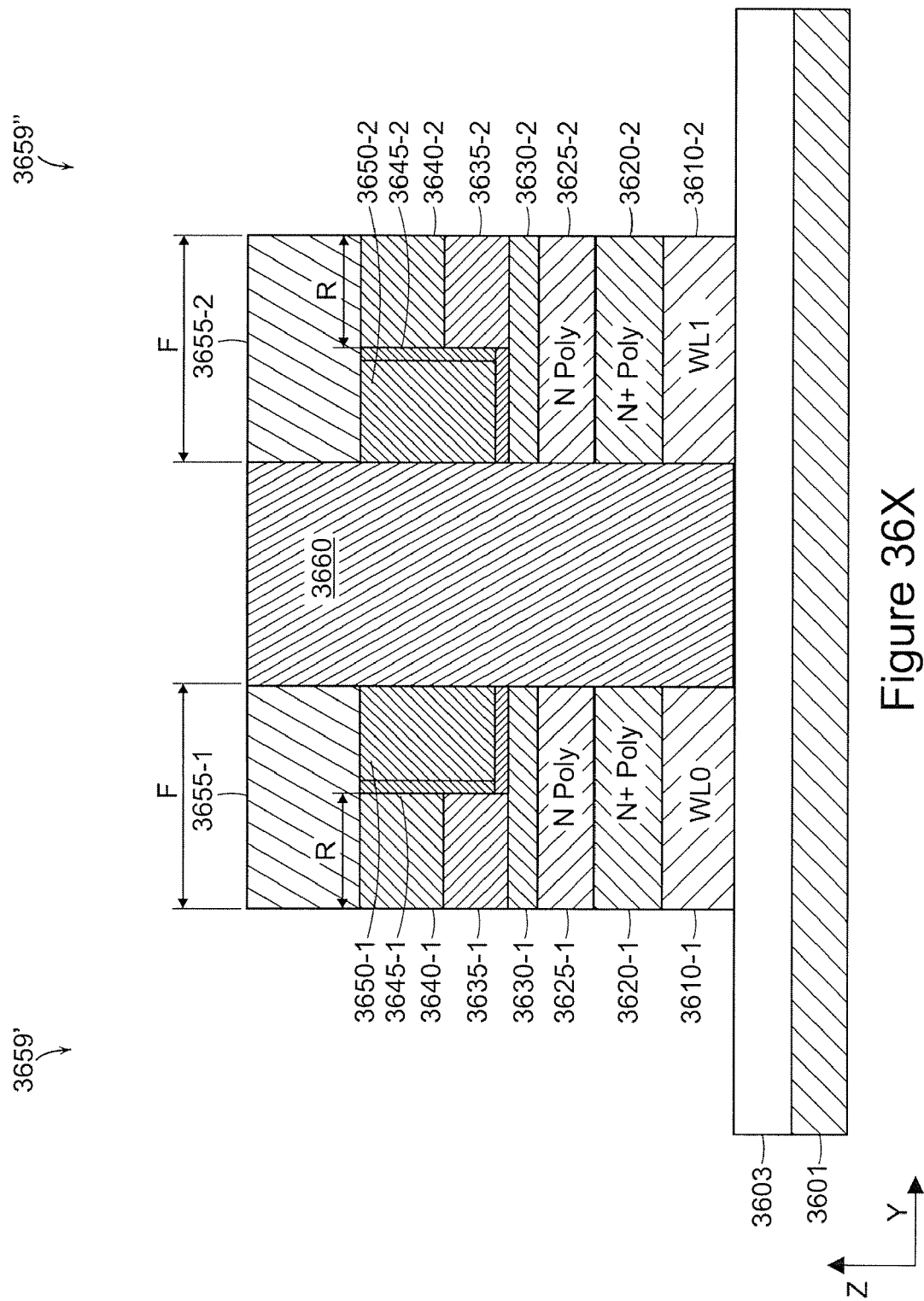
Figure 36Y:
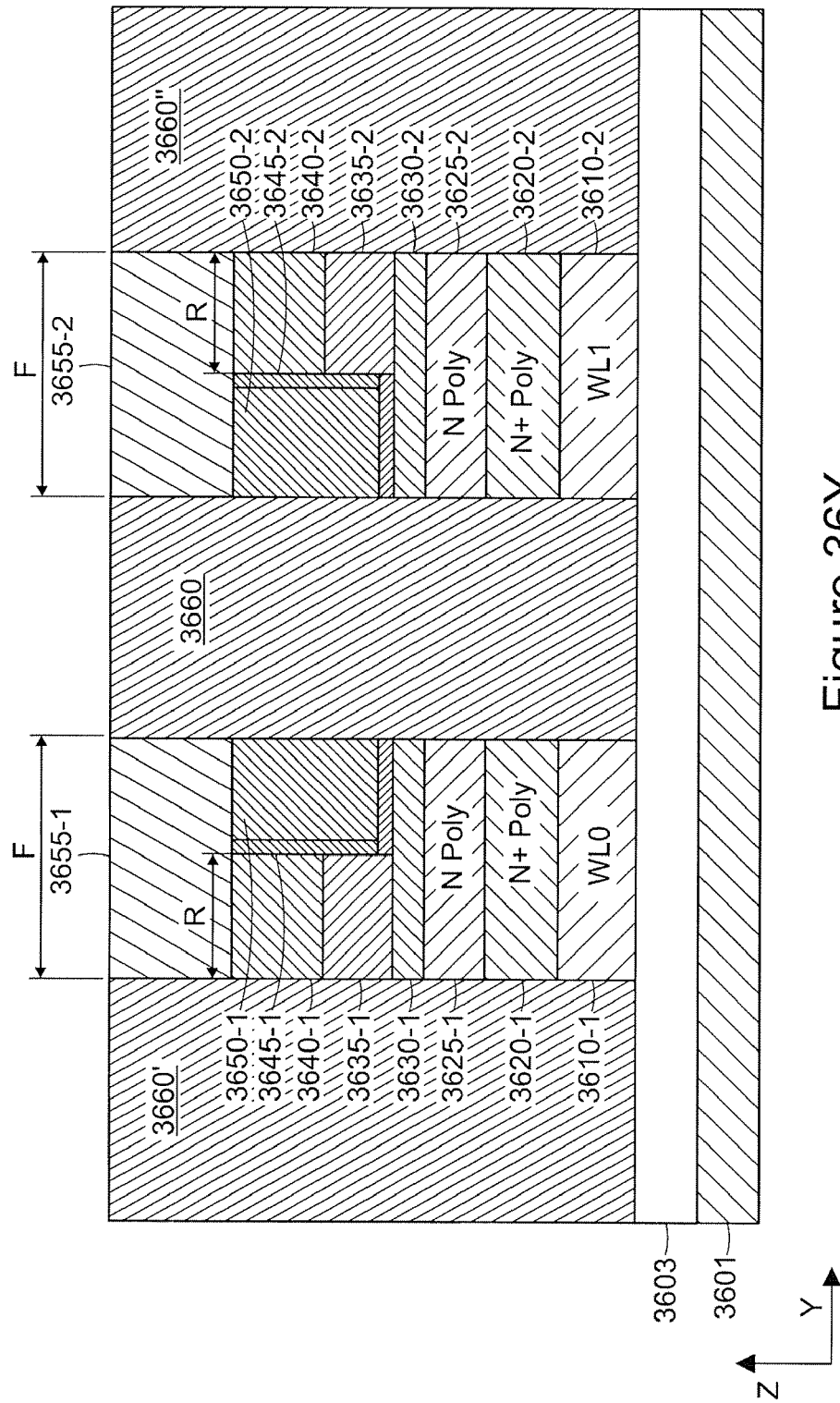
Figure 36Z:
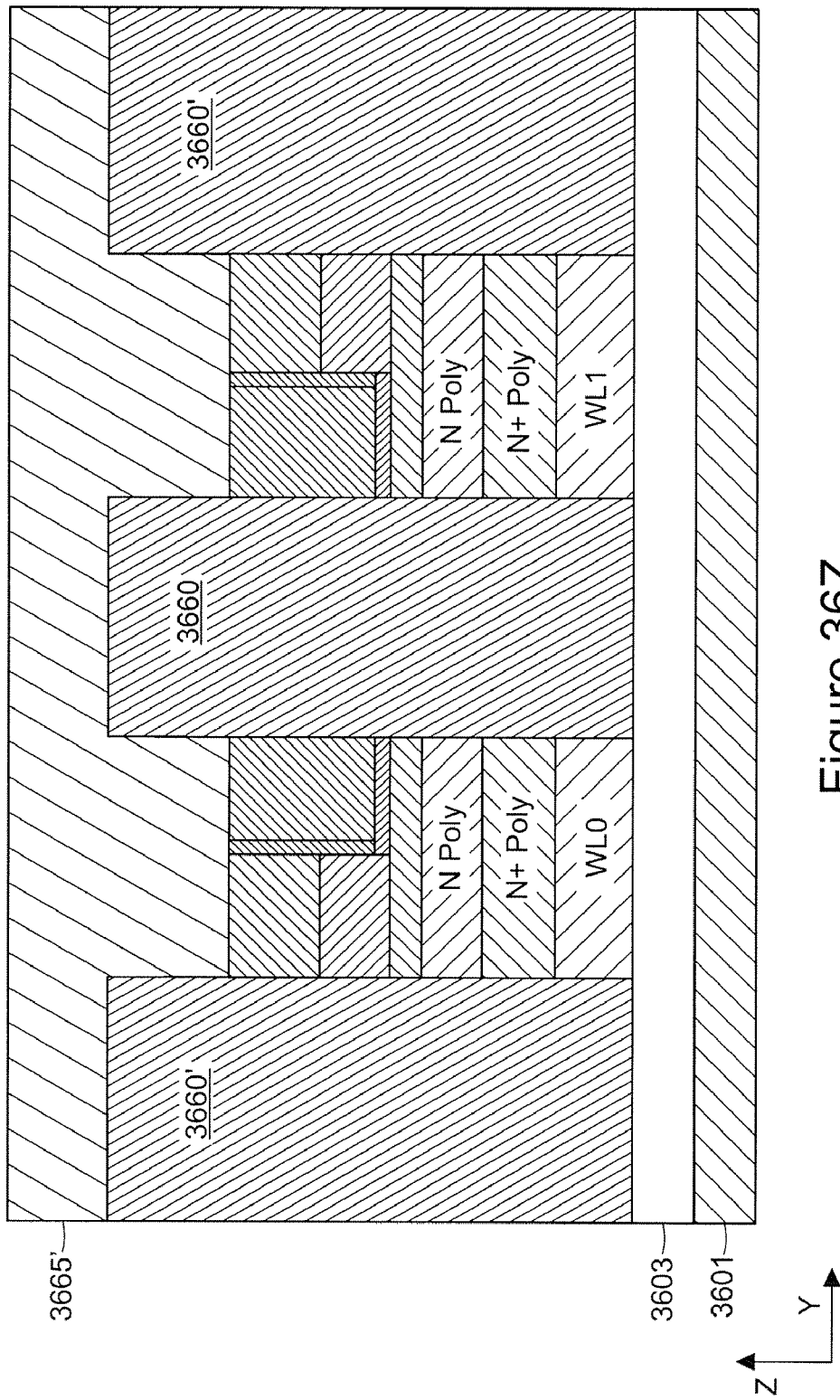
Figure 36A:
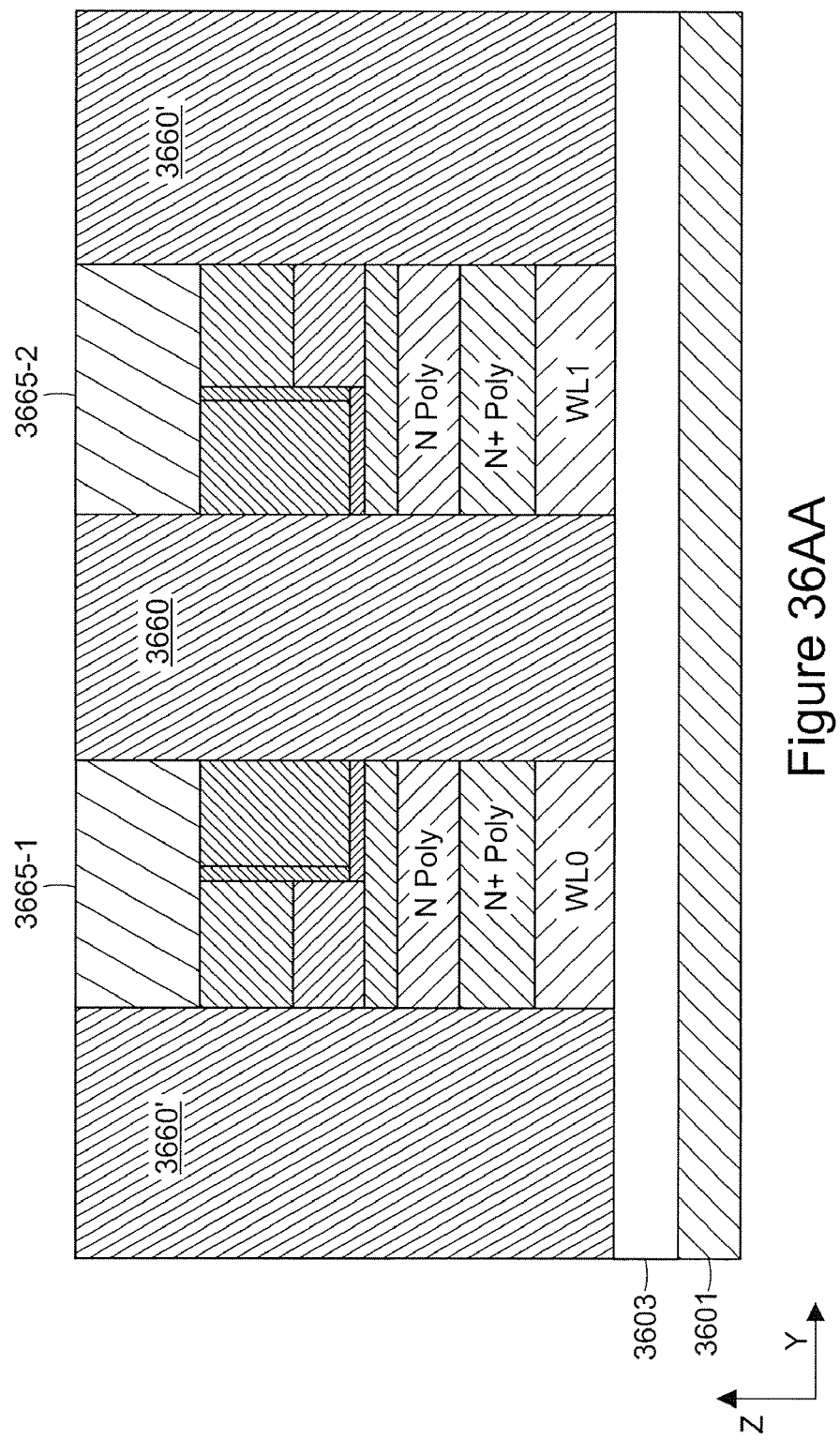
Figure 36B:
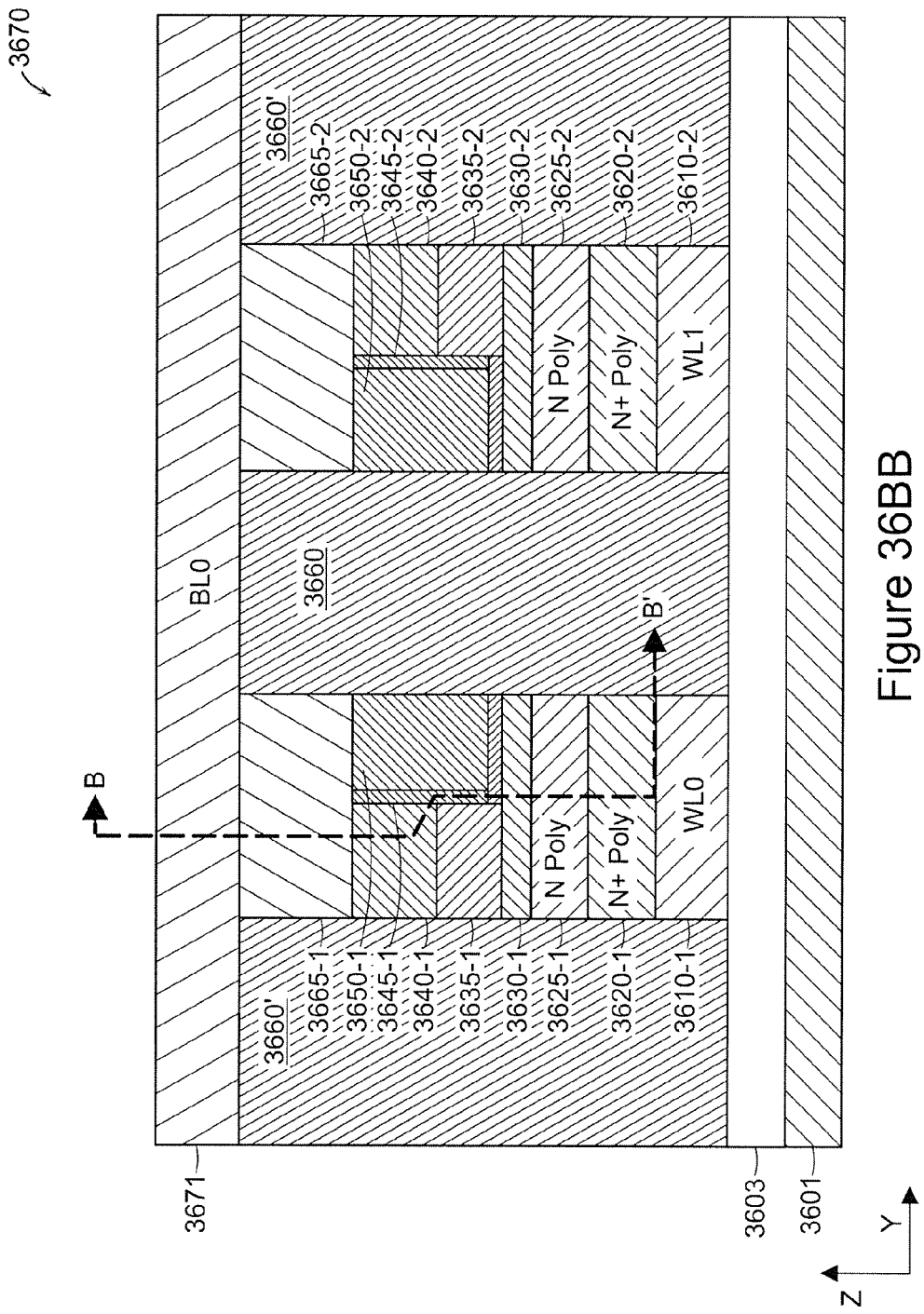
Figure 36C:
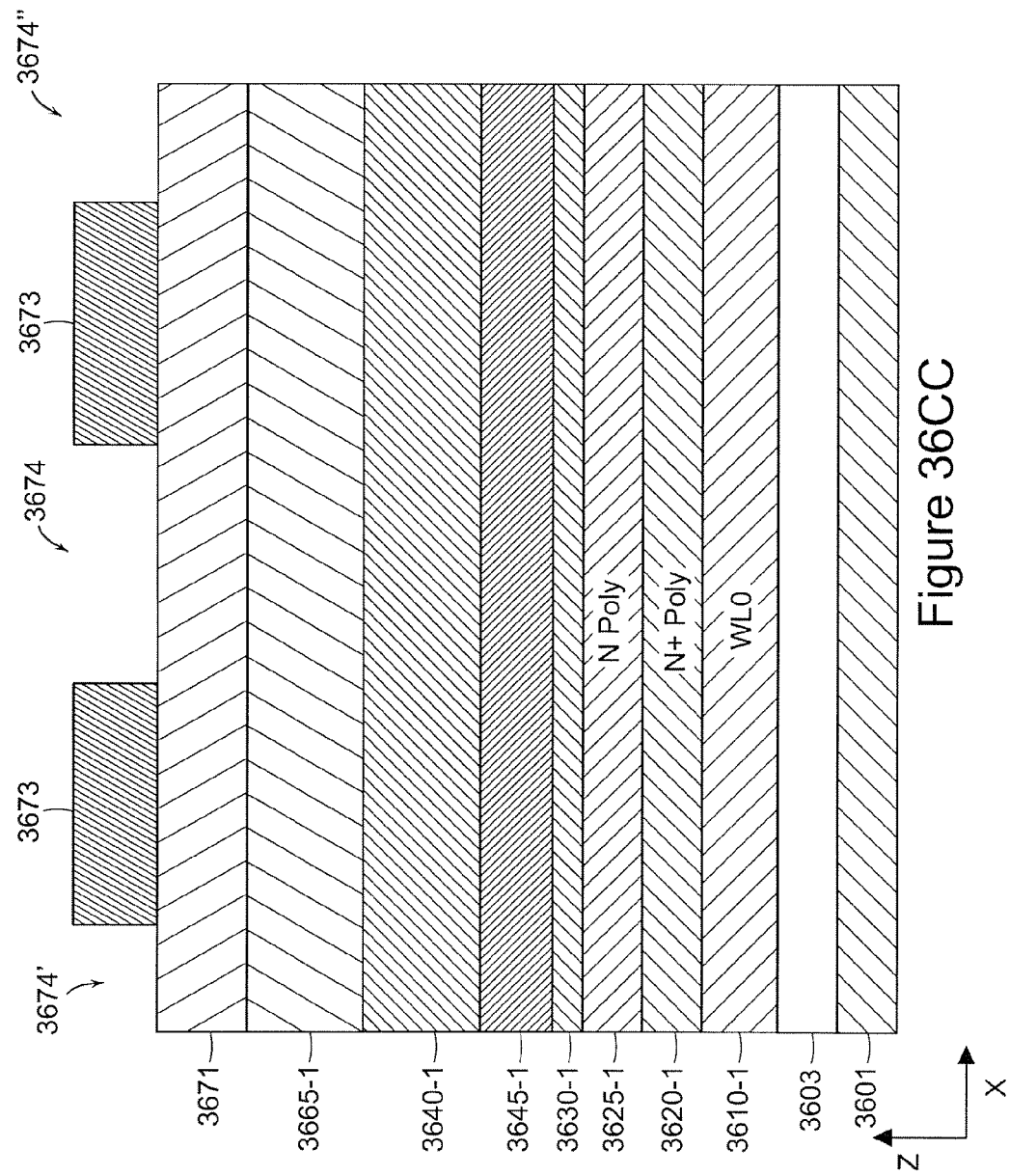
Figure 36D:
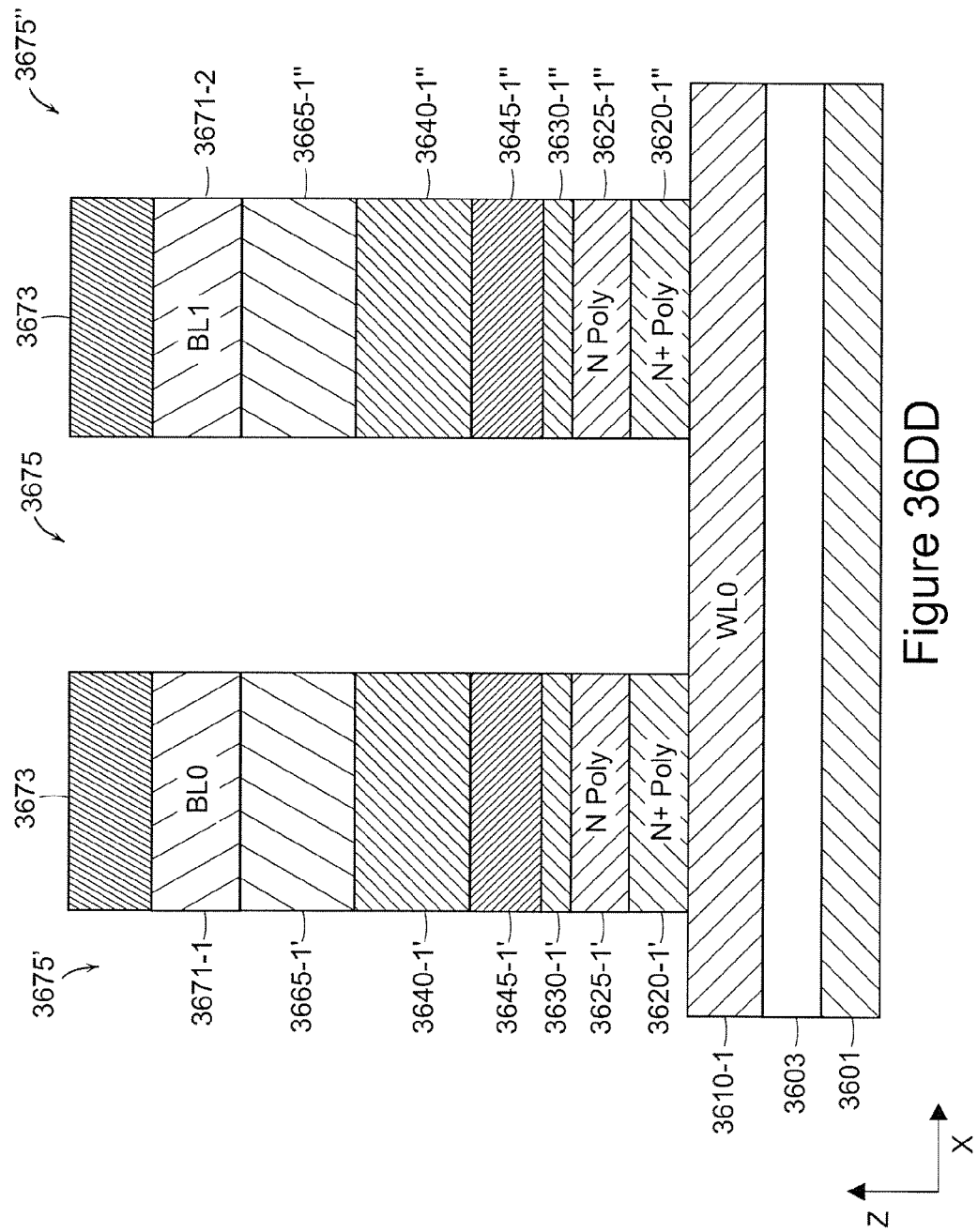
Figure 36E:
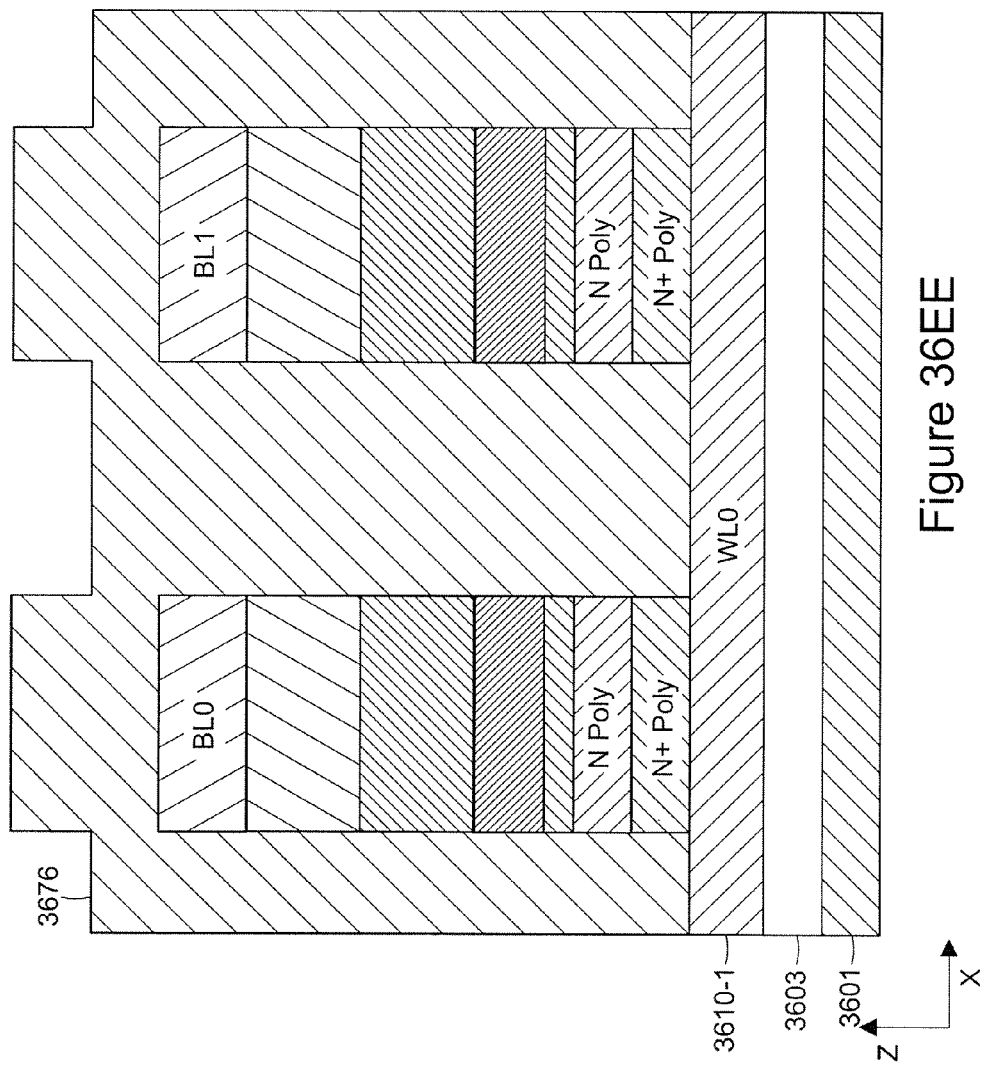
Figure 36F:
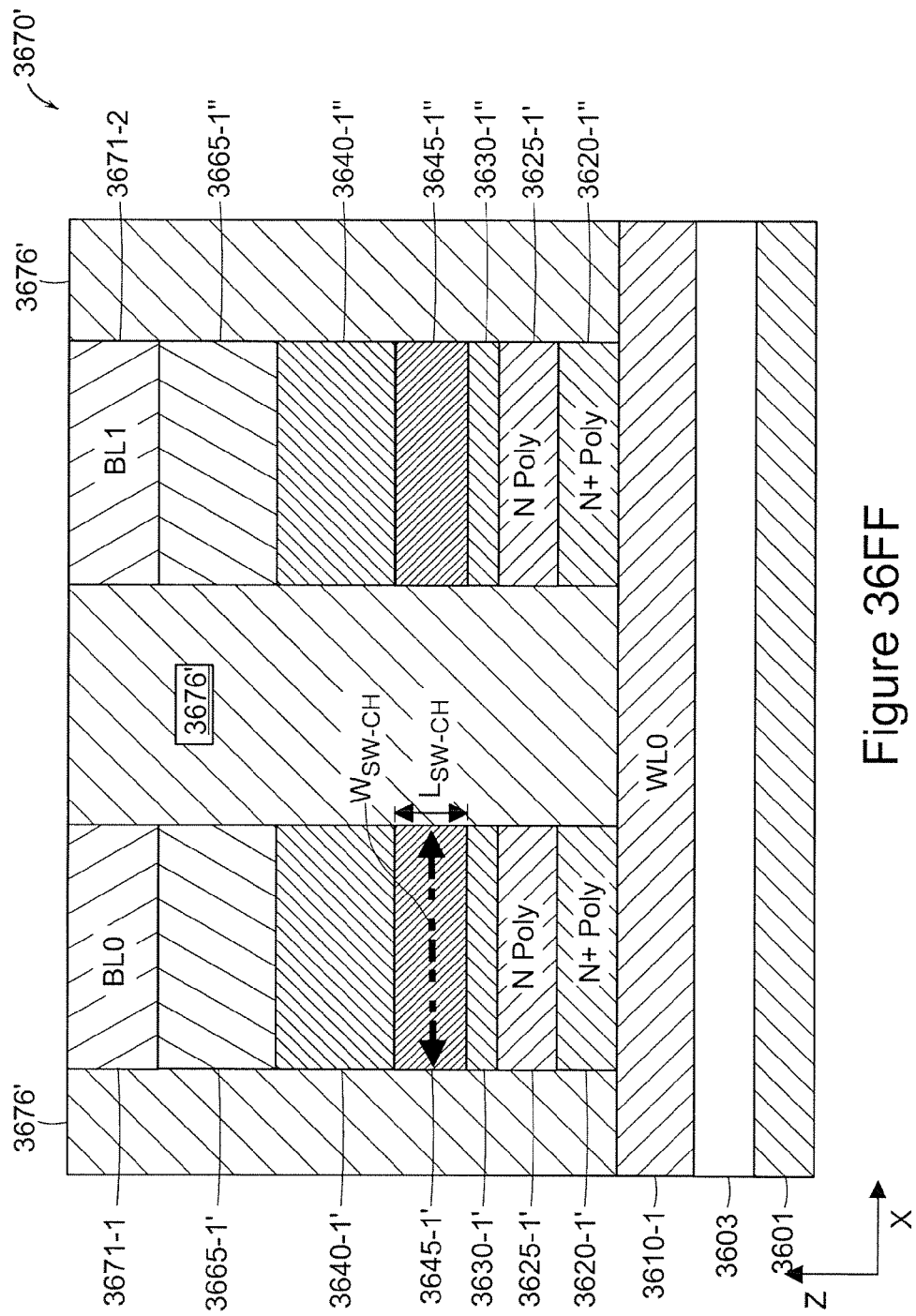

At this point in process, fabrication continues by using methods to deposit an insulator layer 3635 on contact layer 3630 as illustrated in FIG. 36B. The thickness of insulator layer 3635 may be well controlled and used to determine the channel length of vertically oriented nonvolatile nanotube switches as illustrated further below with respect to FIG. 36I. The thickness of insulator layer 3635 may vary in thickness from less than 5 nm to greater than 250 nm, for example. Insulator 3635 may be formed from any appropriate known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. U.S. patent application Ser. No. 11/280,786 includes some examples of various dielectric materials.

Next, methods deposit contact layer 3640 on insulator layer 3635 as illustrated in FIG. 36B. Contact layer 3640 may be in the range of 10 to 500 nm thick, for example, and may be formed using various conductor materials similar to materials described with respect to contact 3630 described further above.

Next methods deposit sacrificial layer 3641 on contact layer 3640 as illustrated in FIG. 36C. Sacrificial layer 3641 may be in the range of 10 to 500 nm thick and be formed using conductor, semiconductor, or insulator materials such as materials described further above with respect to contact layer 3630, semiconductor layers 3620 and 3625, and insulator layer 3635.

Next, methods deposit and pattern a masking layer such as masking layer 3642 deposited on the top surface of sacrificial layer 3641 as illustrated in FIG. 36C using known industry methods. The mask opening may be aligned to alignment marks in planar insulating layer 3603 for example; the alignment is not critical.

Then, methods directionally etch sacrificial layer 3641 to form an opening of dimension $D_{OPEN-1'}$ in the Y direction through sacrificial layer 3641 stopping at the surface of contact layer 3640 using known industry methods as illustrated in FIG. 36D. Two memory cells that include vertical nanotube channel elements self aligned and positioned with respect to vertical edges of sacrificial regions 3641' and 3641" are formed as illustrated further below. The dimension $D_{OPEN-1'}$ in the Y direction is approximately 3F, where F is a minimum photolithographic dimension. For a 65 nm technology node, $D_{OPEN-1'}$ is 195 nm, which is a non-minimum and therefore non-critical dimension at any technology node. At this point in the process, sidewall spacer techniques are used to position vertical sidewalls at a distance R from the inner surfaces of sacrificial regions 3641' and 3641" as described further below.

Next, methods deposit a conformal sacrificial layer 3643 as illustrated in FIG. 36E. The thickness of conformal sacrificial layer 3643 can be selected as R, which in this example is selected as approximately F/2. In this example, since R is approximately F/2, and since F is approximately 65 nm, then the thickness of conformal sacrificial layer 3643 is approximately 32.5 nm. Conformal sacrificial layer 3643 may be formed using conductor, semiconductor, or insulator materials similar to those materials used to form sacrificial layer 3641 described further above.

Next, methods directionally etch conformal sacrificial layer 3643 using reactive ion etch (RIE) for example, using known industry methods, forming opening 3644 of dimension $D_{OPEN-2'}$ and sacrificial regions 3643' and 3643", both having vertical sidewalls self-aligned and separated from inner vertical sidewall of sacrificial regions 3641' and 3641", respectively, by a distance R in the Y direction as illustrated in FIG. 36F. Distance R is approximately equal to F/2, or approximately 32.5 nm in this example. Dimension $D_{OPEN-2'}$ of opening 3644 is approximately 2F, or approximately 130 nm for a 65 nm technology node, a non-critical dimension.

Next, methods directionally etch an opening through contact layer 3640 to the top surface of insulator layer 3635. Directional etching using RIE, for example, forms an opening of size $D_{OPEN-2'}$ of approximately 2F (130 nm in this example) in contact layer 3640, and forms sidewall contact regions 3640' and 3640" as illustrated in FIG. 36G.

Next, methods directionally etch an opening through insulator layer 3635 to the top surface of contact layer 3630. Directional etching using RIE, for example, forms an opening 3644' of size $D_{OPEN-2'}$ of approximately 2F (130 nm in this example) in insulator layer 3635, and forms insulator regions 3635' and 3635" as illustrated in FIG. 36H.

Next, methods deposit conformal nanotube element 3645 with vertical (Z) orientation on the sidewalls of opening 3644' as illustrated in FIG. 36I. The size of opening 3644' is approximately the same as the size of opening 3644. Conformal nanotube element 3645 may be 0.5 to 20 nm thick, for example, and may be fabricated as a single layer or as multiple layers using deposition methods such as spin-on and spray-on methods. Nanotube element methods of fabrication are described in greater detail in the incorporated patent references.

Since nanotube element 3645 is in contact with contact layer 3630 and the sidewalls of sidewall contact regions 3640' and 3640", separated by the thickness of insulator region 3635' and 3635", respectively, two nonvolatile nanotube switch channel regions are partially formed (channel width is not yet defined) having channel length $L_{SW-CH}$ in the Z direction corresponding to the thickness of insulator regions 3635' and 3635" in the range of 5 nm to 250 nm as illustrated in FIG. 36I. The vertical (Z-axis) portion of nanotube element 3645 is separated from the inner vertical sidewalls of sacrificial regions 3641' and 3641" by a self-aligned distance R. These partially formed vertical nonvolatile nanotube switches are similar to vertically oriented nonvolatile nanotube elements 765 and 765' of memory storage regions 760A and 760B, respectively, illustrated in FIG. 7B. Conformal nanotube element 3645 is also in contact with sacrificial regions 3643' and 3643" and sacrificial regions 3641' and 3641" as illustrated in FIG. 36I.

Next methods deposit conformal insulator layer 3650 on nanotube element 3645 as an insulating and protective layer and reduces opening 3644' to opening 3651 as illustrated in FIG. 36J. Opening 3651 is similar to opening 3644', except for the addition of conformal insulator 3650 and conformal nanotube element 3645. Conformal insulator 3650 may be 5 to 200 nm thick, for example, and may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example. Insulator 3650 is deposited to a thickness sufficient to ensure protection of nanotube element 3645 from high density plasma (HDP) deposition.

At this point in the process, it is desirable to partially fill opening 3651 by increasing the thickness of the bottom portion of insulator 3650 in the vertical (Z direction) on horizontal surfaces with little or no thickness increase on the sidewalls (vertical surfaces) of insulator 3650 as described above. The thickness of the additional dielectric material is not critical. The additional dielectric material may be the same as that of conformal insulator 3650 or may be a different dielectric material. Dielectric material selection with respect to nanotube elements is described in greater detail in U.S. patent application Ser. No. 11/280,786.

Next, methods directionally deposit an insulator material in opening 3651 using known industry methods such as directional HDP insulator deposition and increase insulator thickness primarily on horizontal surfaces as illustrated by insulator 3650' in opening 3651 and on top surfaces in FIG. 36K, forming opening 3651'.

Next, methods deposit and planarize an insulator 3652 such as TEOS filling opening 3651' as illustrated in FIG. 36L.

Next, methods planarize the structure illustrated in FIG. 36L in order to remove the top portion of insulator 3650' and the top portion of underlying nanotube element 3645 as illustrated in FIG. 36M. The top of sacrificial regions 3641', 3641", 3643', and 3643" may be used as CMP etch stop reference layers. Insulator 3650" is the same as insulator 3650' except that the top horizontal layer has been removed. Nanotube element 3645' is the same as nanotube element 3645 except that the top horizontal layer has been removed. Insulator 3652' is the same as insulator 3652 except that insulator thickness has been reduced.

Next, methods etch (remove) sacrificial regions 3643' and 3643" and insulator 3652'. Exposed vertical sidewalls of nanotube element 3645' and conformal insulator 3650" remain as illustrated in FIG. 36N.

Next, methods etch (remove) the exposed portion of nanotube element 3645' forming nanotube element 3645" as illustrated in FIG. 36O. Methods of forming nanotube elements are described in greater detail in the incorporated patent references.

Then, methods such as isotropic etch remove exposed portions of insulator 3650' to form insulator 3650''' as illustrated in FIG. 36O.

At this point in the process, sidewall spacer methods are applied as illustrated further below to form self aligned sacrificial regions to be replaced further along in the fabrication process as illustrated further below by a conductor material to form the upper portion of nanotube element contacts and also to define self aligned trench regions to be used to define self-aligned cell dimensions along the Y direction as also illustrated further below. Using sidewall spacer methods to form self aligned structures without requiring masking and alignment can result in cell areas of reduced size.

In this example, with respect to FIGS. 36P and 36Q, a self aligned sacrificial region of X dimension F is formed using methods similar to those used in FIGS. 36E and 36F. Next, methods deposit a conformal sacrificial layer 3655 as illustrated in FIG. 36P. The thickness of conformal sacrificial layer 3655 is selected as F. In this example, since F is approximately 65 nm, then the thickness of conformal sacrificial layer 3655 is approximately 65 nm. Conformal sacrificial layer 3655 may be formed using conductor, semiconductor, or insulator materials similar to those materials used to form sacrificial layers 3641 and 3643 described further above.

Next, methods directionally etch conformal sacrificial layer 3655 using reactive ion etch (RIE) for example, using known industry methods, forming opening 3651" of dimension approximately F, which in this example is approximately 65 nm as illustrated in FIG. 36Q. The inner sidewalls of opening 3651" are self-aligned to the inner walls of sacrificial regions 3641' and 3641" and separated by a distance of approximately F. These inner walls will be used as illustrated further below to form one side of an upper portion of a nanotube contact region and define one side of a cell in the Y direction.

Next, methods deposit and planarized a sacrificial layer to form sacrificial region 3656 coplanar with sacrificial regions 3655', 3655", 3641', and 3641" as illustrated in FIG. 36R.

Next, methods apply CMP etching to reduce the thickness of sacrificial region 3656 to form sacrificial region 3658; the thickness of sacrificial regions 3655' and 3655" to form sacrificial regions 3655-1 and 3655-2, respectively; and the thickness of sacrificial regions 3641' and 3641" to form sacrificial regions 3658' and 3658", respectively as illustrated in FIG. 36S. Coplanar sacrificial regions 3658, 3658', 3658", 3655-1, and 3655-2 have thickness values in the range of 10 nm 200 nm, for example.

At this point in the process, sacrificial regions 3655-1 and 3655-2 may be used as masking layers for directional etching of trenches using methods that define outer cell dimensions along the Y direction for 3D cells using one NV NT diode with cathode-to-nanotube connection. Trench 3659 is formed first and then filled with an insulator and planarized. Then, trenches 3659', and 3659" are formed simultaneously and then filled and planarized as illustrated further below. Other corresponding trenches (not shown) are also etched when forming the memory array structure. Exemplary method steps that may be used to form trench regions 3659, 3659', and 3659" and then fill the trenches to form insulating trench regions are described further below.

Sacrificial regions 3658' and 3658" that define the location of trench regions 3659' and 3659" that are formed as described further below may be blocked with a sacrificial noncritical masking layer (not shown), while methods form trench 3659 using known directional selective etch methods such as reactive ion etch (RIE). Trench 3659 forms a first of two opposite vertical sidewalls in the Y direction defining one side of NV NT diode cells. Alternatively, sacrificial region 3658 that defines the location of trench region 3659 that is formed further below may be etched selective to sacrificial regions 3658' and 3658" without requiring a noncritical masking layer.

First, methods directionally selectively etch (remove) exposed regions (portions) of sacrificial region 3658 using known industry methods as illustrated in FIG. 36T.

Next, methods selectively etch exposed regions (portions) of conformal insulator 3650''' using known industry methods and form conformal insulators 3650-1 and 3650-2 as illustrated in FIG. 36U.

Next, methods selectively etch exposed regions of nanotube element 3645" and form nanotube elements 3645-1 and 3645-2 as illustrated in FIG. 36U. Nanotube element methods of etching are described in greater detail in the incorporated patent references.

Next, methods selectively etch exposed regions of contact layer 3630 using known industry methods forming contact layer regions 3630' and 3630".

Next, methods selectively etch exposed regions of N polysilicon layer 3625 forming regions 3625' and 3625" using known industry methods.

Next, methods selectively etch exposed regions of N+ polysilicon layer 3620 forming regions 3620' and 3620" using known industry methods.

Then, methods etch exposed regions of conductor layer 3610 using known industry methods forming conductor regions 3610' and 3610". Directional etching stops at the surface of planar insulator 3603.

Next, methods fill and planarize trench 3659 with an insulator such as TEOS for example and forming insulator 3660 using known industry methods as illustrated in FIG. 36V.

Next, methods form a noncritical mask region (not shown) over insulator 3660.

Next, sacrificial regions 3658' and 3658" are selectively etched as illustrated in FIG. 36W. With sacrificial regions 3658' and 3658" removed and with insulator 3660 protected by a mask layer (not shown), methods form trenches 3659' and 3659" using known directional selective etch techniques such as RIE as shown in FIG. 36 X. Trenches 3659' and 3659" form a second vertical (Z) sidewall in the Y direction of NV NT diode cells.

To form trenches 3659' and 3659", methods directionally selectively etch (remove) exposed portions of contact 3640' and 3640" using known industry methods and expose a portion of the top surface of insulator layers 3635' and 3635" and define contact 3640-1 and 3640-2 regions as illustrated in FIG. 36X.

Next, methods selectively etch exposed portions of insulator regions 3635' and 3635" using known industry methods and form insulator regions 3635-1 and 3635-2.

Next, methods selectively etch exposed portions of contact regions 3630' and 3630" using know industry methods and form contact regions 3630-1 and 3630-2.

Next, methods selectively etch exposed portions of N polysilicon layer 3625' and 3625" using known industry methods and form N polysilicon regions 3625-1 and 3625-2.

Next, methods selectively etch exposed portions of N+ polysilicon layer 3620' and 3620" using known industry methods and form N+ polysilicon regions 3620-1 and 3620-2 as illustrated in FIG. 36X.

Then, methods selectively etch exposed portions of conductor layer 3410' and 3410" using known industry methods and form word lines 3610-1 (WL0) and 3610-2 (WL1). Directional etching stops at the surface of planar insulator 3603 as illustrated in FIG. 36X.

Next, methods deposit and planarize an insulator such as TEOS and fill trench openings 3659' and 3659" with insulators 3660' and 3660", respectively, as illustrated in FIG. 36Y.

Next, methods etch (remove) sacrificial regions 3655-1 and 3655-2.

Next, methods deposit and planarize conductor 3665' to form upper layer contacts 3665-1 and 3665-2 as illustrated in FIGS. 36Z and 36AA.

Next, methods deposit and planarize conductive layer 3671 using known industry methods to form cross section 3670 as illustrated in FIG. 36BB. Cross section 3670 corresponds to cross section 3100 illustrated in FIG. 31A. In some embodiments, methods described further above form a cross section (not shown) corresponding to cross section 3100' illustrated in FIG. 31B if process fabrication begins with FIG. 34A' instead of FIG. 34A. Also, in some embodiments, methods described further above form a cross section (not shown) corresponding to cross section 3100" illustrated in FIG. 31C if process fabrication begins with FIG. 34A".

At this point in the process, cross section 3670 illustrated in FIG. 36BB has been fabricated, and includes NV NT diode cell dimensions of 1F (where F is a minimum feature size) defined in the Y direction as well as corresponding array bit lines. Next, cell dimensions used to define dimensions in the X direction are formed by directional trench etch processes similar to those described further above with respect to cross section 3670 illustrated in FIG. 36BB. Trenches used to define dimensions in the X direction are approximately orthogonal to trenches used to define dimensions in the Y direction. In this example, cell characteristics in the X direction do not require self alignment techniques described further above with respect to Y direction dimensions. Cross sections of structures in the X direction are illustrated with respect to cross section B-B' illustrated in FIG. 36BB.

Next, methods deposit and pattern a masking layer such as masking layer 3673 on the surface of bit line conductor layer 3671 as illustrated in FIG. 36CC. Masking layer 3673 may be non-critically aligned to alignment marks in planar insulator 3603. Openings 3674, 3674', and 3674" in mask layer 3673 determine the location of trench directional etch regions, in this case trenches are approximately orthogonal to bit lines such as word line 3410-1 (WL0).

Next, methods form trenches 3675, 3675', and 3675" corresponding to openings 3674, 3674', and 3674", respectively, in masking layer 3673. Trenches 3675, 3675', and 3675" form two sides of vertical sidewalls in the X direction defining two opposing sides of NV NT diode cells as illustrated in FIG. 36DD.

Methods directionally selectively etch (remove) exposed portions of bit line conductive layer 3671 illustrated in FIG. 36DD using known industry methods to form bit lines 3671-1 (BL0) and 3671-2 (BL1) illustrated in FIG. 36DD.

Next, methods selectively etch exposed portions of contact regions 3665-1 and 3665-2 illustrated in FIG. 36CC using known industry methods to form contacts 3665-1' and 3665-1" as illustrated in FIG. 36DD.

Next, methods selectively etch exposed portions of contact regions 3640-1 and 3640-2, nanotube elements 3645-1 and 3645-2, and conformal insulators 3650-1 and 3650-2 illustrated in FIG. 36BB using known industry methods to form contacts 3640-1' and 3640-1", conformal insulator regions (not shown in FIG. 36DD cross section B-B'), and nanotube elements 3645-1' and 3645-1" as illustrated in FIG. 36DD.

Next, methods selectively etch exposed regions of insulators 3635-1 and 3635-2 using known industry methods to form insulator regions 3635-1' and 3635-1" illustrated in FIG. 36DD.

Next, methods selectively etch exposed portions of contact regions 3630-1 and 3630-2 illustrated in FIGS. 36BB and 36CC using known industry methods and form contacts 3630-1' and 3630-1" illustrated in FIG. 36DD (cross section B-B')

Next, methods selectively etch exposed portions of N polysilicon regions 3625-1 and 3625-2 illustrated in FIG. 36BB using known industry methods and form N polysilicon regions 3625-1' and 3625-1" illustrated in FIG. 36DD (cross section B-B').

Next, methods selectively etch exposed portions of N+ polysilicon regions 3620-1 and 3620-2 illustrated in FIG. 36BB using known industry methods and form N+ polysilicon regions 3620-1' and 3620-1" illustrated in FIG. 36DD (cross section B-B'). Directional etching stops at the surface of word line 3610-1 (WL0).

Next, methods deposit insulator 3676 using known industry methods as illustrated in FIG. 36EE. Insulator 3676 may be TEOS, for example.

Then, methods planarize insulator 3676 to form insulator 3676' using known industry methods and form cross section 3670' illustrated in FIG. 36FF. Cross section 3670' illustrated in FIG. 36FF and cross section 3670 illustrated in FIG. 36BB are two cross sectional representation of the same embodiment of a passivated NV NT diode vertically oriented cell. Cross section 3670 illustrated in FIG. 36BB corresponds to cross section 3100 illustrated in FIG. 31A.

At this point in the process, cross sections 3670 and 3670' illustrated in FIGS. 36BB and 36FF, respectively, have been fabricated, nonvolatile nanotube element vertically-oriented channel length $L_{SW-CH}$ and horizontally-oriented channel width $W_{SW-CH}$ are defined, including overall NV NT diode cell dimensions of 1F in the Y direction and 1F in the X direction, as well as corresponding bit and word array lines. Cross section 3670 is a cross section of two adjacent vertically oriented anode-to-nanotube type nonvolatile nanotube diode-based cells in the Y direction and cross section 3670' is a cross section of two adjacent vertically oriented anode-to-nanotube type nonvolatile nanotube diode-based cells in the cells in the X direction. Cross sections 3670 and 3670' include corresponding word line and bit line array lines. The nonvolatile nanotube diodes form the steering and storage elements in each cell illustrated in cross sections 3670 and 3670' and each occupy a 1F by 1F area. The spacing between adjacent cells is 1F so the cell periodicity is 2F in both the X and Y directions. Therefore one bit occupies an area of $4F^2$ At the 65 nm technology node, the cell area is less than 0.02 um$^2$.

Methods of Fabricating Nonvolatile Memories Using NV NT Diode Device Stacks with Both Anode-to-NT Switch Connections and Cathode-to-NT Switch Connections Some embodiments of methods of fabricating stacked memory arrays are shown in methods 3200 illustrated in FIG. 32 and described further above. First, methods 3210 fabricate support circuits and interconnections on semiconductor substrate, then insulate and planarize as described further above with respect to FIGS. 34 and 36.

Next, cathode-on-nanotube methods of fabrication to form lower array 3310 illustrated FIG. 33B and corresponding lower array 3310' illustrated in FIG. 33B' are described further above with respect to FIG. 34.

Next, anode-on-nanotube methods of fabrication to form upper array 3320 illustrated in FIG. 33B and corresponding upper array 3320' with shared word line 3330 and corresponding word line 3330' are described further above with respect to FIG. 36. The only difference is that methods illustrated in FIG. 36 are applied on the planarized top surface of lower array 3310 and 3310' with shared word line wiring shared between both lower and upper arrays.

Nonvolatile 3D Memories using Vertically-Oriented Nonvolatile Nanotube Switches having Nanotube Elements of Varying Configurations for Enhanced Performance and Density Vertically-oriented cathode-to-NT and anode-to-NT nonvolatile nanotube diode-based 3D structures described further above illustrate a thin nanotube element, where these thin nanotube elements are typically less than 10 nm thick (1-5 nm, for example), and thin relative to horizontal dimensions of the nonvolatile nanotube diode cell boundaries. Cathode-to-nanotube nonvolatile nanotube diode examples are illustrated in cross section 2800 in FIG. 28A and cross section 3470 illustrated in FIG. 34BB. Anode-to-nanotube nonvolatile nanotube diode examples are illustrated in cross section 3100 illustrated in FIG. 31A and cross section 3670 illustrated in FIG. 36BB. Nonvolatile nanotube switches that form the data storage portion of nonvolatile nanotube diodes are the same for cathode-on-NT and anode-on-NT diodes. Therefore, cell structures described further below illustrating various nonvolatile nanotube switch configurations show the select (steering) diode portion of nonvolatile nanotube device structures in schematic form.

FIGS. 6A-6B and 7A-7B illustrate horizontally and vertically-oriented nanotube (nanofabric) layers, respectively, composed of networks of nanotubes forming nanotube (nanofabric) layers and nanotube elements when patterned. As cell dimensions are reduced, from approximately 150 to 20 nm for example, the number of nanotubes in contact with nanotube terminals (contacts) is reduced for the same nanotube density (nanotubes per unit area). In order to compensate for reduced numbers of nanotube-to-smaller terminal connections, the nanotube density (nanotubes per unit area) may be increased by optimizing individual layer deposition and by depositing multiple nanotube layers using spin-on and/or spray-on nanotube deposition techniques as described in greater detail in the incorporated patent references. The result is that nanotube (nanofabric) layers and patterned nanotube elements may increase in thickness as cell dimensions decrease. Nanotube (nanofabric) layer enhancement is described further below with respect to FIG. 38.

Structural (geometrical) details described further below illustrate various options for nonvolatile nanotube switches. Nonvolatile nanotube switches of various thicknesses may be formed within isolation trench-defined cell boundaries using nanotube elements of varying thickness in order to optimized nonvolatile nanotube switch properties as illustrated further below with respect to FIGS. 37, 39, and 40.

Nonvolatile nanotube switches of various thicknesses may also be formed within isolation trench regions, outside isolation trench-defined cell boundaries, using nanotube elements of varying thickness as illustrated further below with respect to FIGS. 42A-42H and 43A-43B.

Nonvolatile nanotube switches of various thicknesses may also be formed both within isolation trench-defined cell boundaries and within isolation trench regions as illustrated further below with respect to FIG. 44A-44B.

Twice (2×) the storage density may be achieved without stacking arrays, as described further above with respect to FIG. 33, by storing two bits per 3D cell using two nonvolatile nanotube switches that share one select (steering) diode as illustrated further below with respect to FIGS. 45 and 46.

Figure 37:
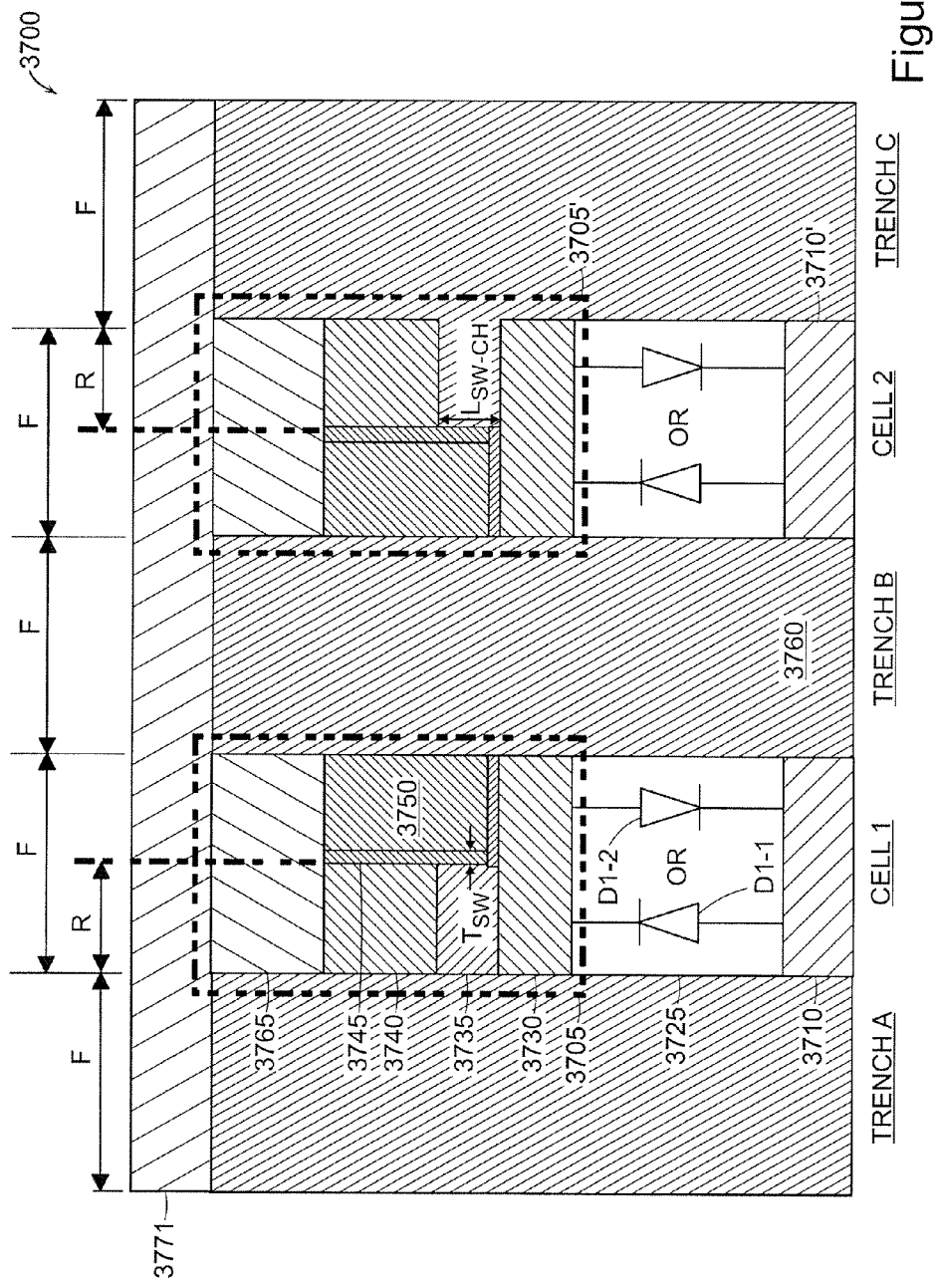
FIG. 37 illustrates a three dimensional cross section of an embodiment of a dense 3D cell structure formed with a cathode-to-nanotube or anode-to-nanotube nonvolatile nanotube diode, with the diode portion of the structure represented schematically in series with a near-cell-centered placement of a vertically oriented nonvolatile nanotube switch within vertical cell boundaries.

Non Volatile 3D Memories Using Vertically-Oriented Nonvolatile Nanotube Switches Having Nanotube Elements of Varying Thicknesses FIG. 37 illustrates cross section 3700 that includes two mirror image cells, cell 1 and cell 2 and insulating trenches A, B, and C forming the boundaries of cells 1 and 2. Cells 1 and 2 are vertically-oriented nonvolatile nanotube diodes. The select (steering) diode portion is represented schematically using schematic representation 3725 by diodes D1-1 and D1-2; the nonvolatile nanotube switch storage elements are illustrated in mirror image cross sections. Select (steering) diode D1-1 combined with nonvolatile nanotube switch 3705 forms a cathode-on-NT nonvolatile nanotube diode cell; select (steering) diode D1-2 combined with nonvolatile nanotube switch 3705 forms an anode-on-NT nanotube diode cell. Nonvolatile nanotube switch 3705' in cell 2 is a mirror image of nonvolatile nanotube switch 3705 in cell 1. Cross section 3700 will be described primarily with respect to cell 1 and nonvolatile nanotube switch 3705.

Cross section 3700 illustrated in FIG. 37 is illustrated with relatively thin nanotube element 3745 in contact with a vertical sidewall located at a distance R of approximately F/2, where F is a minimum dimension for the corresponding technology node. Cross section 3700 illustrated in FIG. 37 corresponds to cross section 2800 in FIG. 28 and cross section 3470 illustrated in FIG. 34BB if select (steering) diode D1-1 is chosen, and cross section 3700 corresponds to cross section 3100 in FIG. 31A and cross section 3670 in FIG. 36BB if select (steering) diode D1-2 is selected. In both cases nonvolatile nanotube switch 3705 is the same.

For cell 1 formed using diode D1-1, array line 3710 illustrated in cross section 3700 corresponds to array bit line 2810-1 shown in cross section 2800 illustrated in FIG. 28A; diode D1-1 illustrated schematically in FIG. 37 corresponds to a Schottky diode with junction 2818-1 and corresponding structures in FIG. 28A. However, diode D1-1 may also correspond to a PN diode with junction 2819-1 and corresponding structures illustrated in FIG. 28B. Lower level contact 3730 illustrated in FIG. 37 corresponds to lower level contact 2830-1 illustrated in FIG. 28A; insulator 3735 corresponds to insulator 2835-1 used to define nanotube element channel length $L_{SW-CH}$; sidewall contact 3740 corresponds to sidewall contact 2840-1; nanotube element 3745 corresponds to nanotube element 2845-1; upper level contact 3765 corresponds to upper level contact 2865-1; insulator 3750 corresponds to insulator 2850-1; and array line 3771 corresponds to array word line 2871.

For cell 1 formed using diode D1-2, array line 3710 illustrated in cross section 3700 corresponds to array word line 3110-1 shown in cross section 3100 illustrated in FIG. 31A; diode D1-2 illustrated schematically in FIG. 37 corresponds to a Schottky diode with junction 3133-1 and corresponding structures in FIG. 31A. However, diode D1-2 may also correspond to a PN diode with junction 3128-1 and corresponding structures illustrated in FIG. 31B. Also, diode D1-2 may also correspond to combined Schottky and PN diode with junction 3147-1 and corresponding structures illustrated in FIG. 31C. Lower level contact 3730 illustrated in FIG. 37 corresponds to lower level contact 3130-1 illustrated in FIG. 31A; insulator 3735 corresponds to insulator 3135-1 used to define nanotube element channel length $L_{SW-CH}$; sidewall contact 3740 corresponds to sidewall contact 3140-1; nanotube element 3745 corresponds to nanotube element 3145-1; upper level contact 3765 corresponds to upper level contact 3165-1; insulator 3750 corresponds to insulator 3150-1; and array line 3771 corresponds to array bit line 3171.

Figure 38:
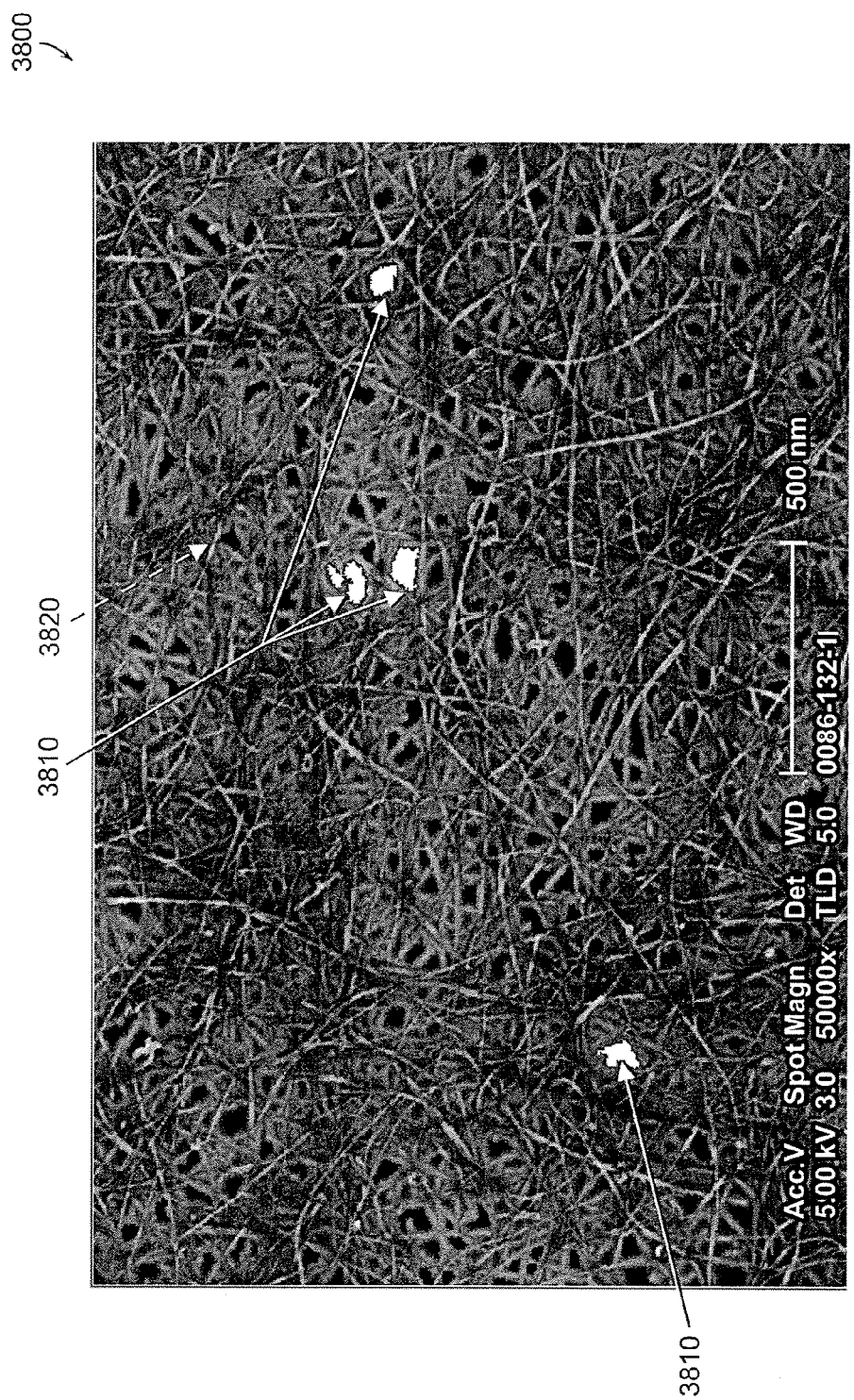
FIG. 38 illustrates an embodiment of a nanotube layer formed on a substrate by spray-on methods with relatively small void areas.

Networks of nanotubes forming relatively thin nanotube (nanofabric) layers and corresponding nanotube elements typically have a nanotube density of approximately 500 nanotubes per square micrometer ($um^2$). Nanotube layers and corresponding nanotube element typically include voids, regions between nanotubes. Void areas may be relatively large, greater than 0.0192 $um^2$ for example, or may be relatively small, less than 0.0192 $um^2$ for example. As cell dimensions are reduced, nanotube density is increased with a corresponding decrease in void area and an increase in nanotube layer and corresponding nanotube element thickness. FIGS. 6A-6B and 7A-7B illustrate relatively thin nanotube element 630 and relatively thin nanotube layer 700, respectively, applied on a substrate by spin-on methods at a nanotube density of up to 500 nanotubes per $um^2$ with relatively large void areas. FIG. 38 illustrates nanotube layer 3800 formed on a substrate by spray-on methods with relatively small void areas. For example, nanotube layer 3800 has no voids greater than 0.0192 $um^2$. Nanotube layer 3800 also has no void areas between 0.0096 and 0.0192 $um^2$; no void areas between 0.0048 and 0.0096 $um^2$; a relatively small number of void areas 3810 between 0.0024 and 0048 $um^2$; with most void areas such as void area 3820 less than 0.0024 $um^2$.

For a technology node (generation) with F approximately 45 nm and a nanotube element thickness of approximately 10 nm for example, the location R of a vertical sidewall may be at approximately F/2 or approximately 22 nm as illustrated by nanotube element 3745 of nonvolatile nanotube switch 3705 in cross section 3700 illustrated in FIG. 37. In this case, sidewall contact 3740 is approximately 22 nm and insulator 3750 is approximately 13 nm. A region of upper level contact 3765 to sidewall contact 3740 is approximately 22 nm. A region of lower level contact 3730 to nanotube element 3745 is approximately 22 nm.

Figure 39:
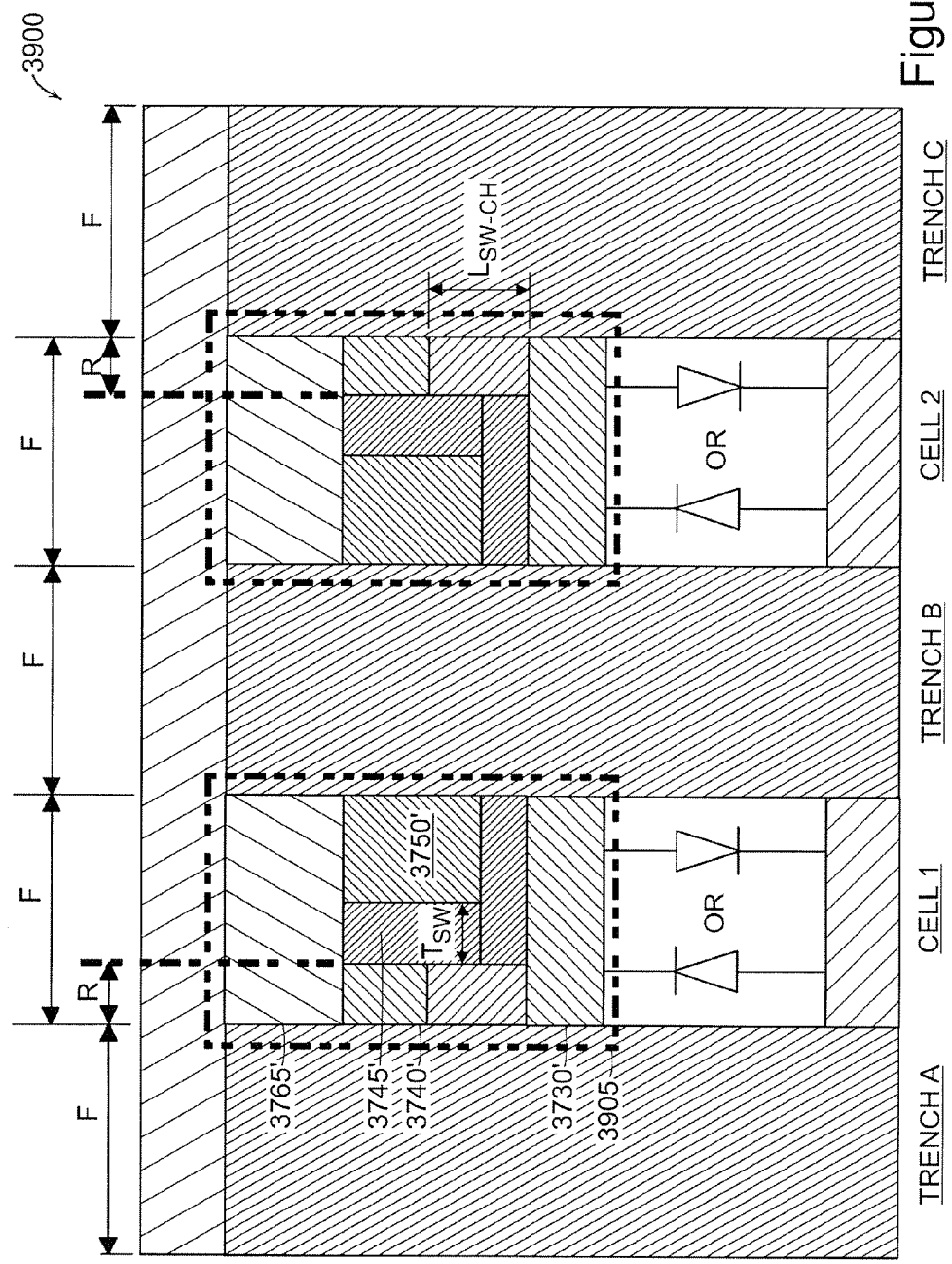
FIG. 39 illustrates an embodiment similar to that shown in FIG. 37 with a thicker nonvolatile nanotube switch including a nanotube element with off-cell-centered placement within vertical cell boundaries.

FIG. 39 illustrates cross section 3900 and includes nonvolatile nanotube switch 3905 in which the thickness of nanotube element 3745' is substantially greater than the thickness of nanotube element 3745 illustrated in FIG. 37. Nonvolatile nanotube switch structures 3705 and 3905 are fabricated using self aligned methods of fabrication as described further above with respect to FIGS. 34 and 36. For a technology node (generation) with F approximately 32 nm and a nanotube element thickness of approximately 15 nm for example, the location R of a vertical sidewall may be at approximately F/3 or approximately 10 nm as illustrated by nanotube element 3745' of nonvolatile nanotube switch 3905 in cross section 3900 illustrated in FIG. 39. In this case, sidewall contact 3740' is approximately 10 nm and insulator 3750' is approximately 7 nm. A region of upper level contact 3765' to sidewall contact 3740' is approximately 10 nm. A region of lower level contact nanotube element 3745' is approximately 22 nm.

Figure 40:
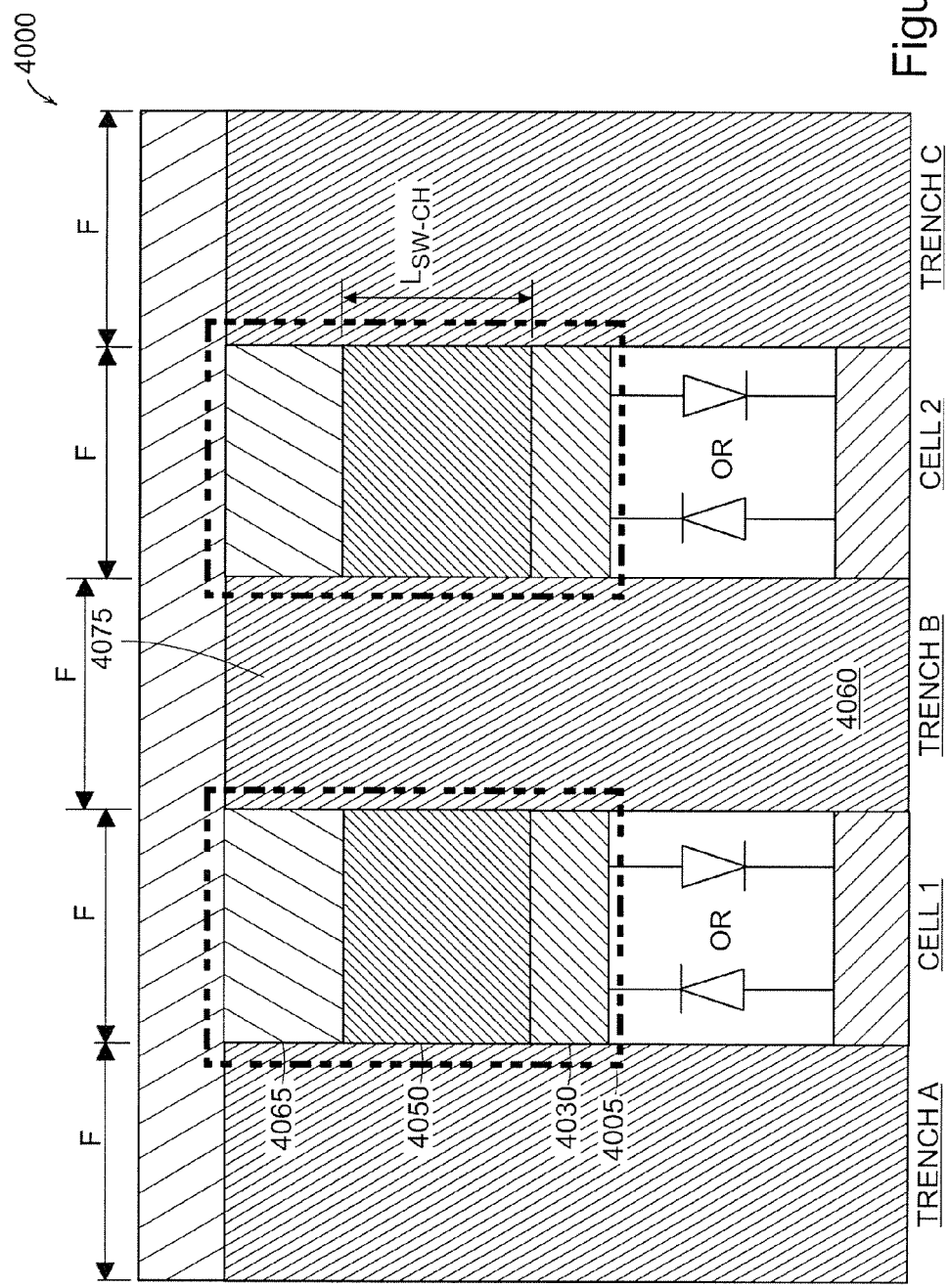
FIG. 40 illustrates a three dimensional cross section of an embodiment of a dense 3D cell structure formed with a cathode-to-nanotube or anode-to-nanotube nonvolatile nanotube diode, with the diode portion of the structure represented schematically in series with a nonvolatile nanotube switch including a nanotube element within vertical cell boundaries and filling the region within the cell boundaries.

FIG. 40 illustrates cross section 4000 and includes nanotube switch 4005 in which the thickness of nanotube element 4050 is equal to the cell dimension F. In this example, nanotube element 4050 may be deposited by spray-on methods of fabrication for example. For a technology node (generation) with F approximately 22 nm and a nanotube element thickness of approximately 22 nm for example, the nanotube region fills the available cell region. A sidewall contact is eliminated and lower level contact 4030 and upper level contact 4065 form the two terminal (contact) regions to nanotube 4050.

Nonvolatile 3D Memories Using Vertically-Oriented Nonvolatile Nanotube Switches Having Nanotube Elements within Trench Isolation Regions FIGS. 37, 39, and 40 described further above show that as technology nodes (generations) reduce minimum dimensions F, and nanotubes elements increase thickness to reduce void areas, in some embodiments nanotube elements may eventually fill the region available within the insulating trench-defined cell region and thus prevent further increase in nanotube element thickness. It is possible to continue to increase nanotube element overall thickness by also forming nanotube elements within the insulating trench region as illustrated further below. Alternatively, nanotube elements may be placed wholly outside the insulating trench region and not within the cell boundaries as illustrated further below.

Figure 41A:
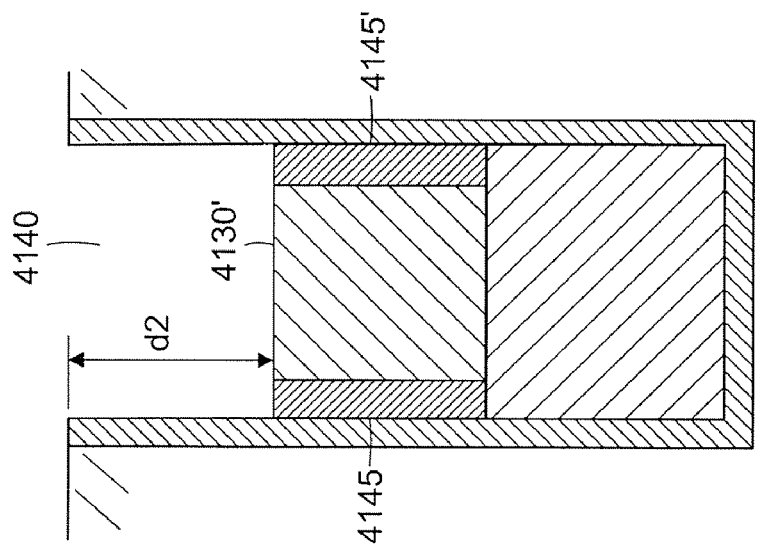
FIGS. 41A-41B illustrate a representation of a method of forming controlled shapes within and on vertical sidewalls of concave (trench) structures, according to some embodiments.
Figure 41B:
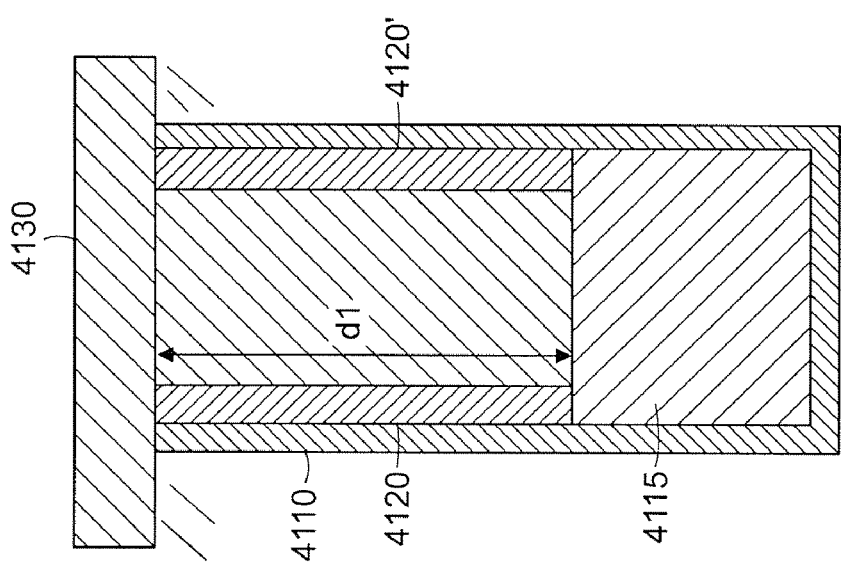

FIGS. 41A-41B are representations of a process for selectively forming vertical sidewall elements of controlled dimensions within and on a vertical sidewall of a concave (trench) structure as described in U.S. Pat. No. 5,096,849, the entire contents of which are incorporated herein by reference, to co-inventor Bertin. The process described in U.S. Pat. No. 5,096,849 includes filling a trench with resist material to be removed, or alternatively, filling a trench with an insulator, for example, that remains in the trench region. Next, RIE is used to precisely remove the resist or insulator to a controlled depth d1 as measured from a top surface reference. Then, a conformal layer of a material of controlled thickness is deposited. Next, RIE is use to remove the conformal layer on horizontal surfaces leaving the conformal layer on the vertical sidewall of the trench. Next, a second resist or insulator fills the remaining trench opening. Next, RIE is used to precisely remove the sidewall film and resist or insulator to a controlled depth of d2. At this point in the process vertical sidewall elements of vertical dimension d1-d2 and controlled thickness have been formed. If the trench is filled with resist, the resist may be removed. If the trench is filled with an insulator material, the insulator material may remain in the trench. Then, the trench is filled with an insulator and planarized.

FIG. 41A illustrates a representation of a trench with outer walls 4110. A lower portion of the trench is filled with an insulator 4115, SiO₂ for example, whose top surface is at a controlled depth d1 from the trench surface. A conformal layer is deposited and RIE removes conformal layer material on horizontal surfaces leaving partially completed vertical elements 4120 and 4120'. A resist or insulator 4130 fills the trench region above the top surface of resist or insulator 4115.

FIG. 41B illustrates a representation of FIG. 41A after using RIE to remove resist or insulator material 4130 and then vertical sidewall elements 4120 and 4120' to a controlled depth d2 and forming filled region 4130' and vertical sidewall elements 4145 and 4145'. Vertical sidewall elements 4145 and 4145' are of vertical dimensions d1-d2 and controlled known thickness defined by the thickness of the conformal layer material. Resist or insulator 4130' may be removed or may be left in place. Then, trench opening may be filled with insulating material and planarized.

FIGS. 42A-42H illustrates methods of fabrication used to adapt the elements of U.S. Pat. No. 5,096,849 illustrated in FIG. 41 to form nanotube elements within isolation trenches described further above with respect to FIGS. 28A-28C, 31A-31C, 33A-33D, 34A-34FF, 36A-36FF, 37, 39, and 40.

Figure 42B:
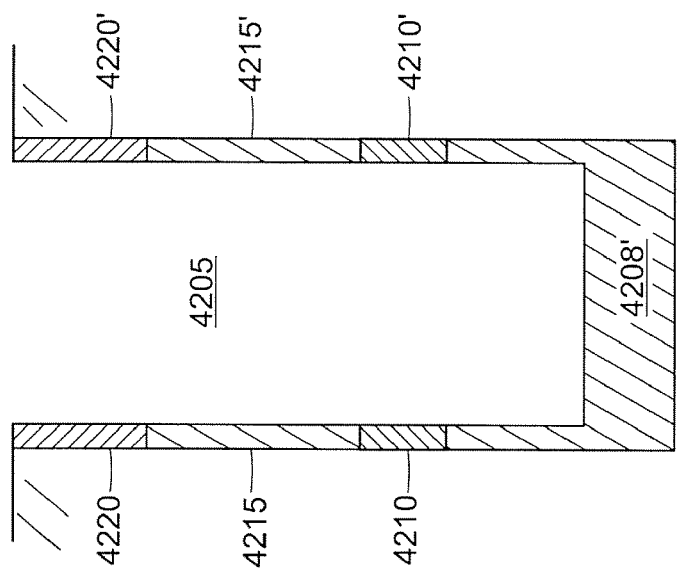
Figure 42A:
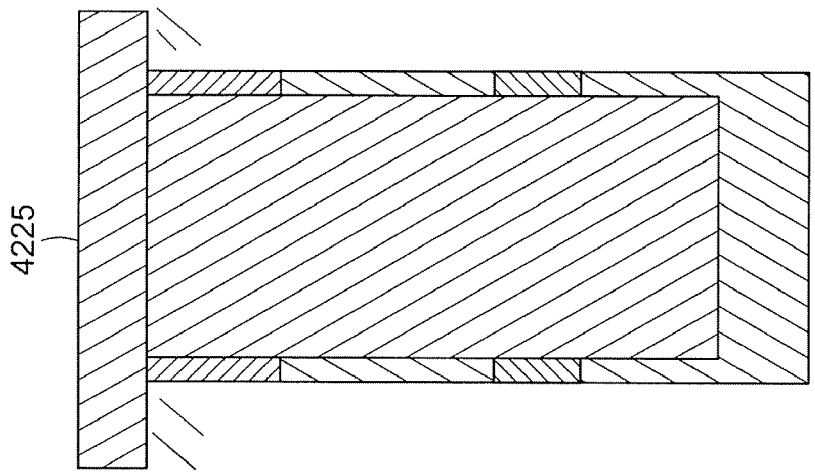

FIG. 42A illustrates an opening 4205 formed in an insulation trench using methods such as a selective controlled etch using RIE, for example, with sidewall regions defining vertical surfaces of lower level contacts 4210 and 4210', upper level contacts 4220 and 4220', and insulator 4215 and 4215' between respective upper and lower level contacts, where the thickness of insulator 4215 and 4215' define the channel length $L_{SW-CH}$ of nanotube elements as shown further below in FIG. 42D.

First, methods fill trench opening 4205 with an insulator 4225, TEOS for example as illustrated in FIG. 42B.

Next, methods selectively etch insulator 4225 using a selective and controlled RIE etch to a depth D1 from a surface reference as illustrated in FIG. 42C.

Next, methods deposit conformal nanotube layer 4235 using methods described in greater detail in the incorporated patent references. At this point in the process, channel length $L_{SW-CH}$ is defined as illustrated in FIG. 42D.

Then, methods deposit a protective conformal insulator layer 4240 as illustrated in FIG. 42D. Conformal insulator 4240 may be 5 to 50 nm thick, for example, and may be formed from any appropriate known insulator material in the CMOS industry, or packaging industry, for example such as SiO₂, SiN, Al₂O₃, BeO, polyimide, PSG (phosphosilicate glass), photoresist, PVDF (polyvinylidene fluoride), sputtered glass, epoxy glass, and other dielectric materials and combinations of dielectric materials such as PVDF capped with an Al₂O₃ layer, for example, such as described in U.S. patent application Ser. No. 11/280,786. Insulator 4240 is deposited to a thickness sufficient to ensure protection of nanotube element 4235 from RIE etching.

Figure 42F:
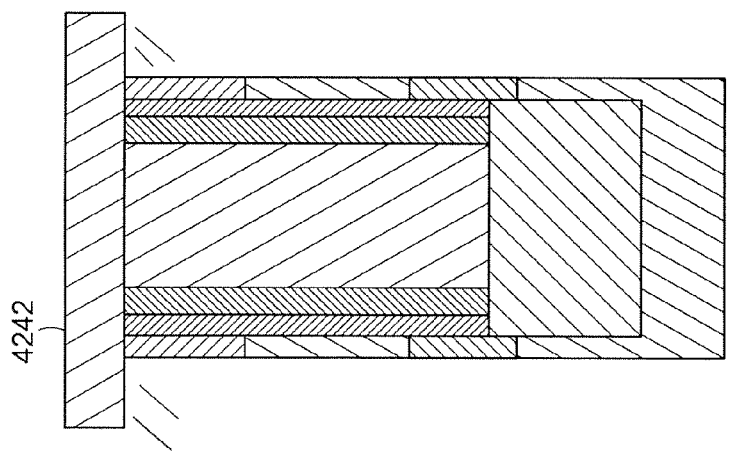
Figure 42E:
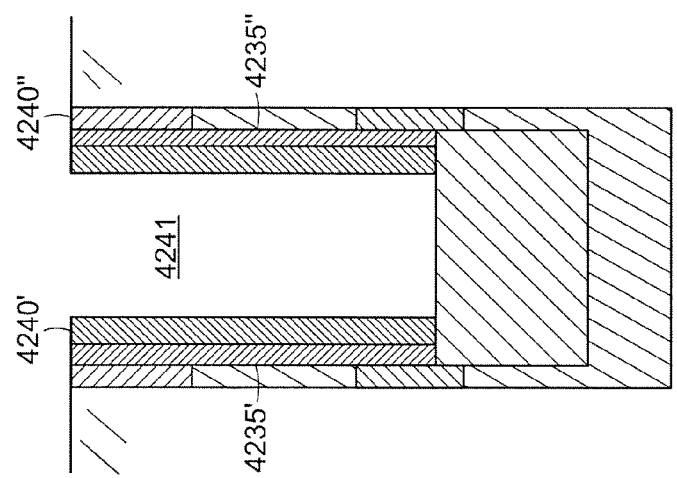

Next, methods directly etch conformal insulator 4240 and nanotube layer 4235 using RIE and remove conformal layer material on top horizontal surfaces and bottom horizontal surfaces at the bottom of trench opening 4241, leaving partially completed vertical elements 4240', 4240'', 4235', and 4235'' as illustrated in FIG. 42E.

Next methods fill trench opening 4241 with insulator 4242 such as TEOS for example as illustrated in FIG. 42F.

Figure 42H:
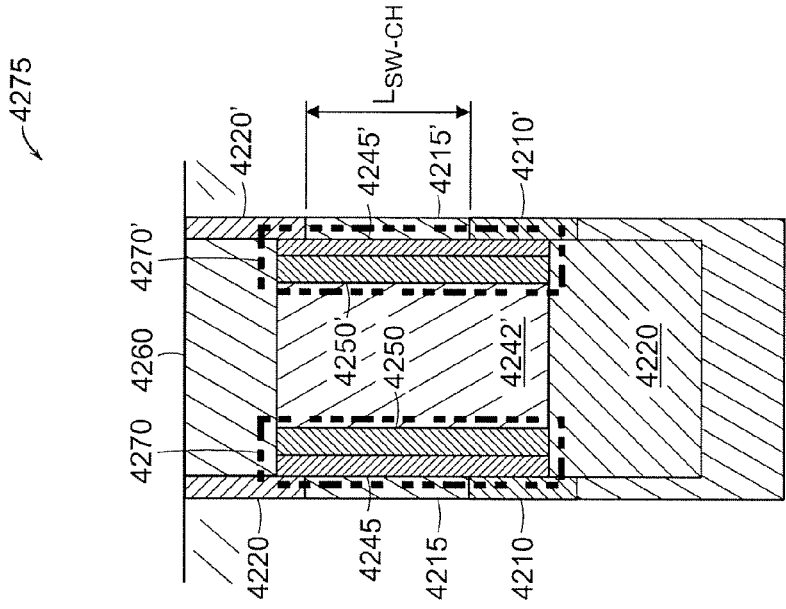
Figure 42G:
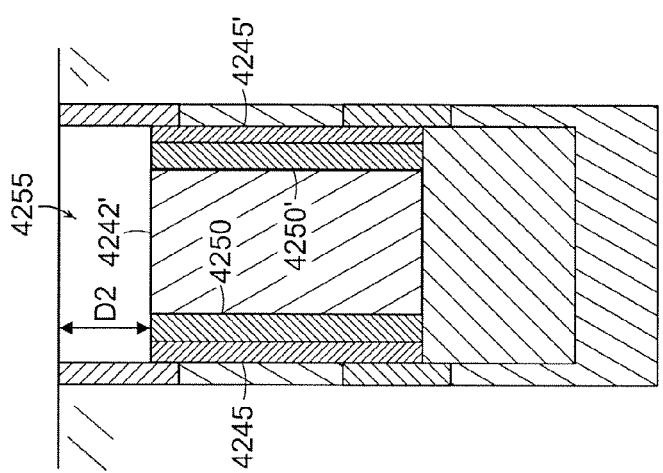

Next, methods selectively etch insulator 4242, conformal insulators 4240' and 4240'', and nanotube elements 4235' and 4235'' using a selective and controlled RIE etch to a depth D2 from a surface reference as illustrated in FIG. 42G. At this point in the process, insulator 4242' is formed; nanotube elements 4245 and 4245' are formed; conformal insulator 4250 and 4250' are formed, and trench opening 4255 remains.

Then, methods fill trench opening 4255 with an insulator such as TEOS and methods planarize to form insulator 4260. At this point in the process cross section 4275 is formed, including nanotube channel elements 4270 and 4270'. Nanotube channel element 4270 includes nanotube element 4245 and conformal insulator 4250, and nanotube channel element 4270' includes nanotube element 4245' and conformal insulator 4250'. Nanotube channel elements 4270 and 4270' are in contact with a portion of vertical sidewalls of an upper level contact and a lower level contact, and are also in contact with an insulating layer that defines $L_{SW-CH}$. For example, nanotube channel element 4270 is in contact with upper level contact 4220, lower level contact 4210, and insulator 4215, and nanotube channel element 4270' is in contact with upper level contact 4220', lower contact 4210', and insulator 4215'.

Figure 43A:
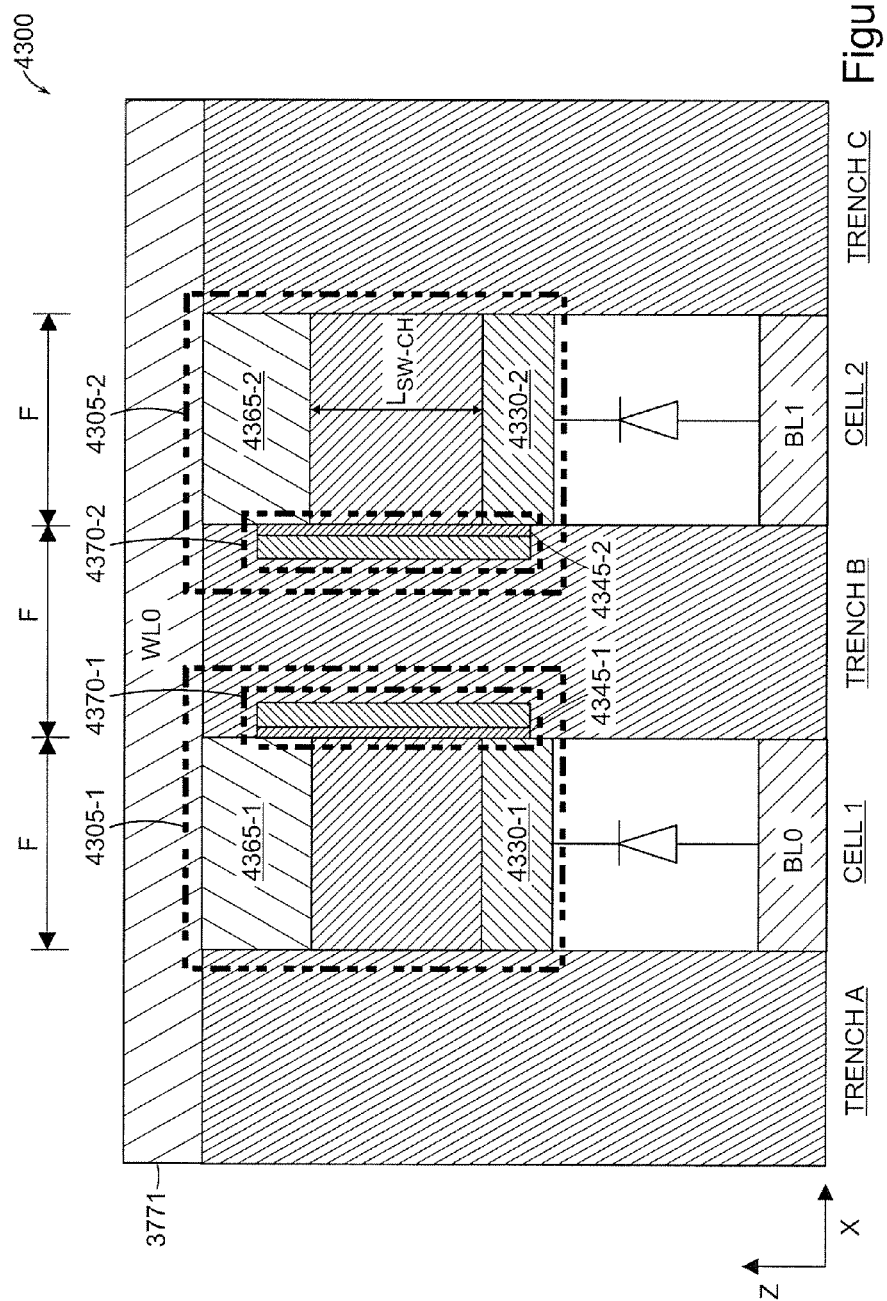
FIGS. 43A-43C illustrate embodiments of nonvolatile nanotube switches having nanotube elements of varying thickness outside cell boundary regions and within and on vertical sidewalls of trench structures.
Figure 43B:
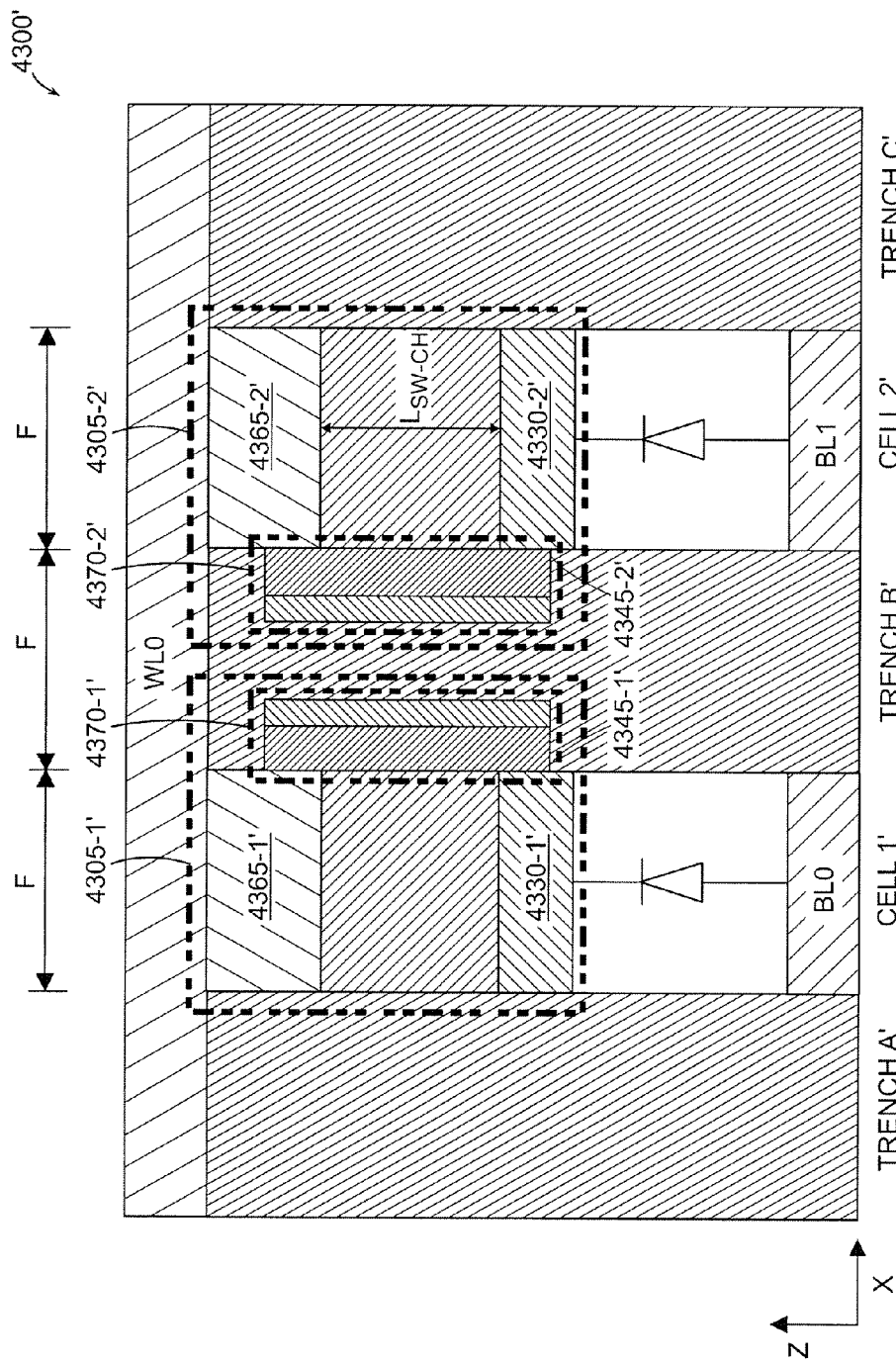
Figure 43C:
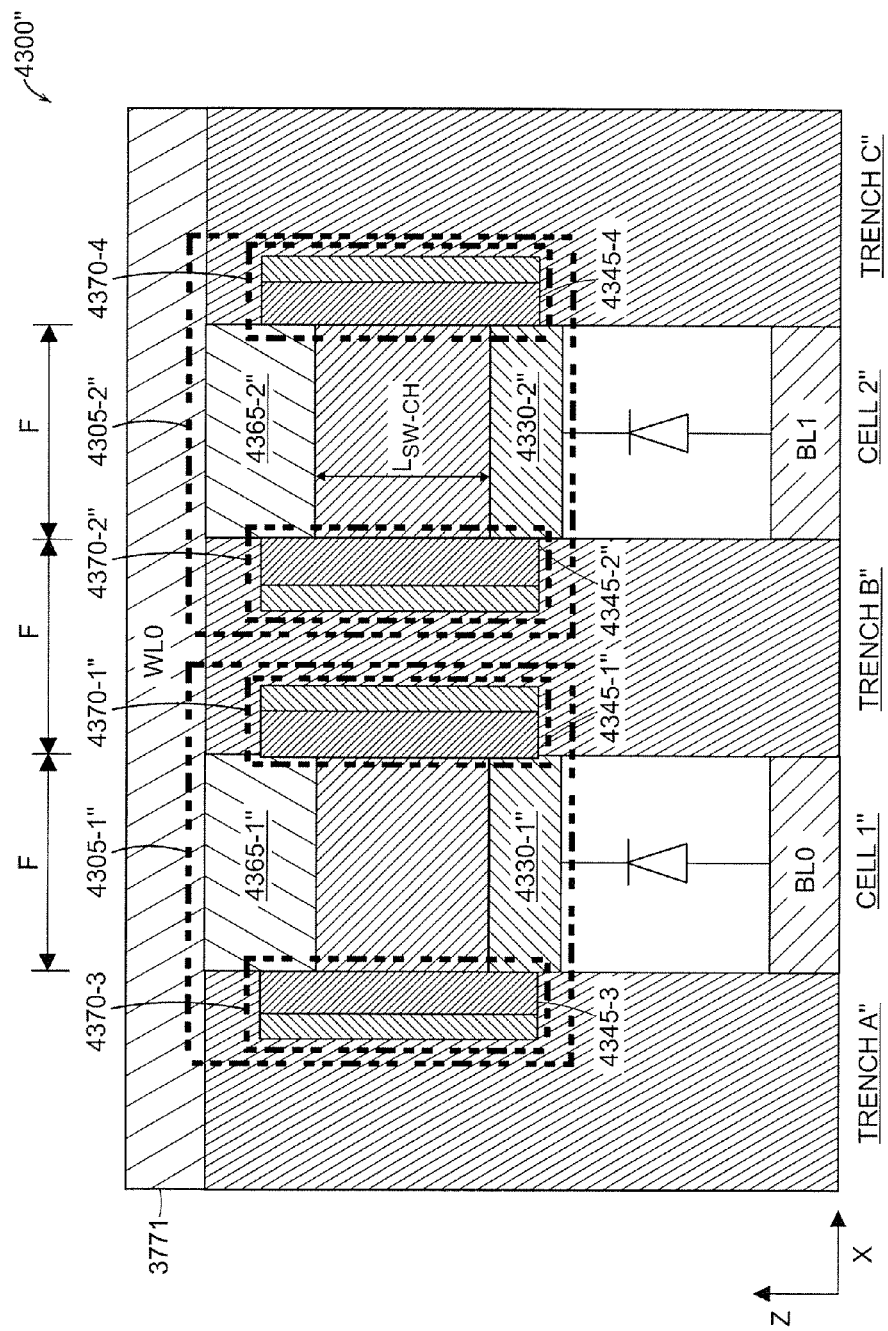

Nanotube channel elements 4270 and 4270' may be used instead of nanotube element 3745 illustrated in FIG. 37 and nanotube element 3745' illustrated in FIG. 39 to form new nonvolatile nanotube switch structures as illustrated in FIGS. 43A, 43B, and 43C. New cell structures may be cathode-on-NT or anode-on-NT type cells. FIGS. 43A, 43B, and 43C are shown for cathode-on-NT type cells for ease of comparison with FIG. 28A and FIGS. 34A-34FF described further above.

FIG. 43A illustrates cross section 4300 in which nonvolatile nanotube channel element storage devices are positioned within isolating trench B as illustrated by nonvolatile channel element 4370-1 positioned on the sidewall of a region of cell 1 and 4370-2 positioned on a region of cell 2, which correspond to nonvolatile channel element 4270 and 4270', respectively, illustrated by cross section 4275 in FIG. 42H. Cross section 4300 illustrated in FIG. 43A shows relatively thin nanotube elements 4345-1 and 4345-2 that may be, e.g., less than 10 nm thick. Nanotube element 4345-1 of nanotube channel element 4370-1 includes sidewall contacts to lower level contact 4330-1 and upper level contact 4365-1 of cell 1. Nonvolatile nanotube switch 4305-1 is formed by lower level contact 4330-1 and upper level contact 4365-1, both in contact with nanotube element 4345-1 of nanotube channel element 4370-1. Nanotube element 4345-2 of nanotube channel element 4370-2 includes sidewall contacts to lower level contact 4330-2 and upper level contact 4365-2 of cell 2. Nonvolatile nanotube switch 4305-2 is formed by lower level contact 4330-2 and upper level contact 4365-2, both in contact with nanotube element 4345-2 of nanotube channel element 4370-2. Cell 1 and cell 2 are greater than minimum dimension F in the X direction, however, overall cell periodicity remains 2F and array density remains unchanged.

FIG. 43B illustrates cross section 4300' in which nonvolatile nanotube channel element storage devices are positioned within isolating trench B' as illustrated by nonvolatile channel element 4370-1' positioned on the sidewall of a region of cell 1' and 4370-2' positioned on a region of cell 2', which correspond to nonvolatile channel element 4270 and 4270', respectively, illustrated by cross section 4275 in FIG. 42H. Cross section 4300' illustrated in FIG. 43B shows relatively thick nanotube elements 4345-1' and 4345-2' that may be, e.g., 15 nm thick. Nanotube element 4345-1' of nanotube channel element 4370-1' includes sidewall contacts to lower level contact 4330-1' and upper level contact 4365-1' of cell 1'. Nonvolatile nanotube switch 4305-1' is formed by lower level contact 4330-1' and upper level contact 4365-1', both in contact with nanotube element 4345-1' of nanotube channel element 4370-1'. Nanotube element 4345-2' of nanotube channel element 4370-2' includes sidewall contacts to lower level contact 4330-2' and upper level contact 4365-2' of cell 2'.

Nonvolatile nanotube switch 4305-2' is formed by lower level contact 4330-2' and upper level contact 4365-2', both in contact with nanotube element 4345-2' of nanotube channel element 4370-2'. Cell 1' and cell 2' are greater than minimum dimension F in the X direction, however, overall cell periodicity remains 2F and array density remains unchanged.

FIG. 43C illustrates cross section 4300" in which nonvolatile nanotube channel element storage devices are positioned within isolating trench A", trench B", and trench C" as illustrated by nonvolatile channel elements 4370-1" and 4370-3 positioned on sidewalls of regions of cell 1" and nonvolatile channel elements 4370-2" and 4370-4 positioned on sidewalls of regions of cell 2". Cross section 4300" illustrated in FIG. 43C shows relatively thick channel elements 4345-1", 4345-2", 4345-3, and 4345-4 that may be, e.g., 15 nm thick. Nanotube elements of nanotube channel element 4370-1" and 4370-3 include sidewall contacts to lower level contact 4330-1" and upper level contact 4365-1" of cell 1". Nonvolatile nanotube switch 4305-1" is formed by lower level contact 4330-1" and upper level contact 4365-1", both in contact with nanotube elements 4345-1" and 4345-3 of nanotube channel elements 4370-1" and 4370-3, respectively, for an effective channel element thickness of 30 nm, for example. Nanotube elements of nanotube channel element 4370-2" and 4370-4 include sidewall contacts to lower level contact 4330-2" and upper level contact 4365-2" of cell 2". Nonvolatile nanotube switch 4305-2" is formed by lower level contact 4330-2" and upper level contact 4365-2", both in contact with nanotube elements 4345-2" and 4345-4 of nanotube channel elements 4370-2" and 4370-4, respectively, for an effective channel element thickness of 30 nm, for example. Cell 1" and cell 2" are greater than minimum dimension F in the X direction, however, overall cell periodicity remains 2F and array density remains unchanged. As cells become much smaller, e.g., 22 nm and even less, then the number of nanotube elements between contacts decreases and the resistance goes up. There are limits to the nanotube density per layer that can be achieved. Therefore, it can be useful to find ways to add layers of nanotubes to try to keep the number of nanotubes nearly the same (if possible) by putting more nanotube layers in parallel. In other words, the nanotube elements can be scaled to keep up with semiconductor scaling.

Non Volatile 3D Memories Using Vertically-Oriented Nonvolatile Nanotube Switches Having Nanotube Elements Stacked Above Steering (Select) Diodes and within Trench Isolation Regions Nanotube elements included in nonvolatile nanotube switches may be incorporated within cell boundaries defined by isolation trenches as described further above with respect to FIGS. 37 and 39, and also with respect to structures illustrated in FIGS. 28A-28C and 31A-31C and with respect to methods of fabrication described with respect to FIGS. 34A-34FF and 36A-36FF. Also, nanotube elements included in nonvolatile nanotube switches may also be incorporated within isolation trench regions and outside cell boundaries as described further above with respect to FIGS. 43A-43C and methods of fabrication described with respect to FIGS. 42A-42H. However, it is possible to combine nanotube elements within cell boundaries and other nanotube elements in isolation trenches outside cell boundaries to form nonvolatile nanotube switches that include both types of nanotube configurations. As cells become much smaller, e.g., 22 nm and even less, then the number of nanotube elements between contacts decreases and the resistance goes up. There are limits to the nanotube density per layer that can be achieved. Therefore, it can be useful to find ways to add layers of nanotubes to try to keep the number of nanotubes nearly the same (if possible) by putting more nanotube layers in parallel. In other words, the nanotube elements can be scaled to keep up with semiconductor scaling.

Figure 44A:
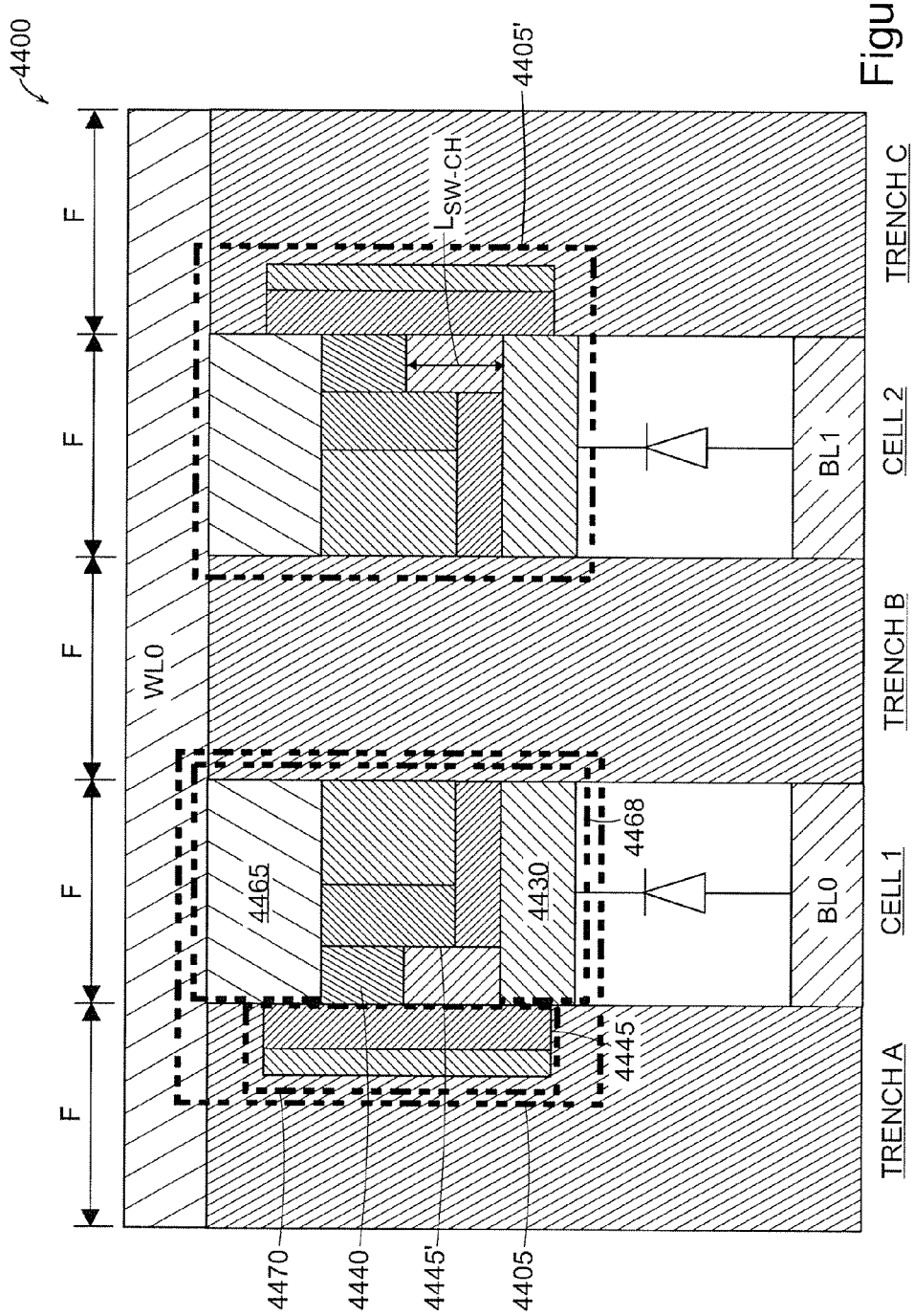
FIGS. 44A-44B illustrate embodiments of nonvolatile nanotube switches having nanotube elements of varying thickness both within cell boundary cell regions and outside cell boundary cell regions, but within and on vertical sidewalls of trench structures.

FIG. 44A illustrates cell 1 and mirror image cell 2 with nonvolatile nanotube switches 4405 and 4405'. Since cell 2 is a mirror image of cell 1, only cell 1 will be described in detail. Nonvolatile nanotube switch 4405 is formed by combining nonvolatile nanotube switch 4468 corresponding to nonvolatile nanotube switch 3905 illustrated in FIG. 39 and nanotube channel element 4470 corresponding to nanotube channel element 4370-3 illustrated in FIG. 43C. Nonvolatile nanotube switch 4405 may be formed by first forming nonvolatile nanotube switch 4468 using methods of fabrication described further above with respect to FIGS. 34A-34FF. Next, nanotube channel element 4470 is formed using methods of fabrication described with respect to FIGS. 42A-42H. Nanotube element 4445 of nanotube channel element 4470 shares lower level contact 4430 with nanotube element 4445', and shares sidewall contact 4440 and upper level contact 4465 with nanotube element 4445'. Both nanotube element 4445 and 4445' have approximately the same channel length $L_{SW-CH}$, in the range of less than 5 nm to greater than 250 nm for example. Thickness values of nanotube element 4445 and 4445' may be different values. In this example, minimum dimension F is assumed to be 32 nm and the thickness of each nanotube element may be 15 nm for an effective thickness of 30 nm for combined nanotube elements 4445 and 4445'. The effective thickness 30 nm of combined nanotube elements 4445 and 4445' is approximately equal to the cell dimension F of 32 nm because nanotube elements are used both inside the cell boundaries, and outside the cell boundaries, within isolation trench regions. While this example illustrates cathode-on-NT type cells, anode-on-NT cells may also be formed.

Nanotube elements included in nonvolatile nanotube switches may be incorporated within cell boundaries defined by isolation trenches as described further above with respect to FIG. 40. Also, nanotube elements included in nonvolatile nanotube switches may also be incorporated within isolation trench regions and outside cell boundaries as described further above with respect to FIGS. 43A-43C and methods of fabrication described with respect to FIGS. 42A-42H. However, it is possible to combine nanotube elements within cell boundaries and other nanotube elements in isolation trenches outside cell boundaries to form nonvolatile nanotube switches that include both types of nanotube configurations.

Figure 44B:
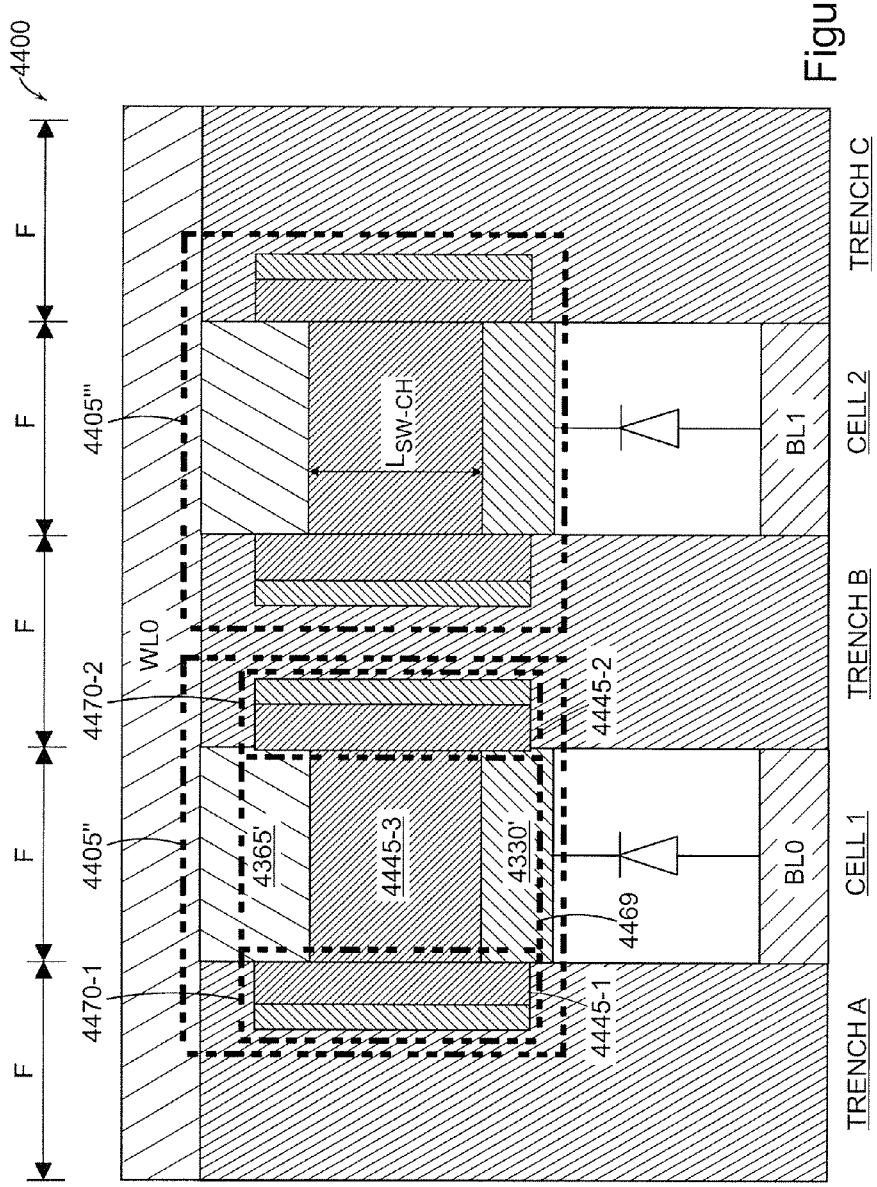

FIG. 44B illustrates cell 1 and cell 2 with nonvolatile nanotube switches 4405" and 4405'". Since cell 2 is of the same as cell 1, only cell 1 will be described in detail. Nonvolatile nanotube switch 4405" is formed by combining nonvolatile nanotube switch 4469 corresponding to nonvolatile nanotube switch 4050 illustrated in FIG. 40 and nanotube channel elements 4470-1 and 4470-2 corresponding to nanotube channel element 4370-3 and 4370-1", respectively, illustrated in FIG. 43C. Nonvolatile nanotube switch 4405" may be formed by first forming nonvolatile nanotube switch 4469 using methods of fabrication similar to those of FIG. 40. Next, nanotube channel elements 4470-1 and 4470-2 are formed using methods of fabrication described with respect to FIG. 42. Nanotube elements 4445-1 of nanotube channel element 4470-1 and nanotube element 4445-2 of nanotube channel element 4470-2 share lower level contact 4430 with nanotube element 4445-3, and share upper level contact 4465 with nanotube element 4445-3. Nanotube elements 4445-1, 4445-2 and 4445-3 have approximately the same channel length $L_{SW-CH}$, in the range of less than 5 nm to greater than 150 nm for example. Thickness values of nanotube elements 4445-1, 4445-2, and 4445-3 may be different values. In this example, minimum dimension F is assumed to be 22 nm and the thickness of nanotube elements 4445-1 and 4445-2 may be 6 nm each and nanotube element 4445-3 may be 22 nm for a combined effective thickness of 34 nm for combined nanotube elements 4445-1, 4445-2, and 4445-3. The effective thickness 34 nm of combined nanotube elements 4445-1, 4445-2, and 4445-3 is approximately 50% greater than cell dimension F of 22 nm because nanotube elements are used both inside the cell boundaries, and outside the cell boundaries, within isolation trench regions. While this example illustrates cathode-on-NT type cells, anode-on-NT cells may also be formed. As cells become much smaller, e.g., 22 nm and even less, then the number of nanotube elements between contacts decreases and the resistance goes up. There are limits to the nanotube density per layer that can be achieved. Therefore, it can be useful to find ways to add layers of nanotubes to try to keep the number of nanotubes nearly the same (if possible) by putting more nanotube layers in parallel. In other words, the nanotube elements can be scaled to keep up with semiconductor scaling.

Nonvolatile 3D Memories Storing Two Bits Per Cell Using Two Vertically-Oriented Nonvolatile Nanotube Switches Sharing a Single Steering (Select) Diode FIGS. 33A-33D illustrate two stacked memory arrays, one cathode-on-NT type array and the other an anode-on-NT type array to double bit density. Each cell in the stack has one select (steering) diode and one nonvolatile nanotube switch. Cells described above with respect to FIGS. 43C and 44A-44B use two nanotube elements per cell connected in parallel to increase effective nanotube element thickness. However, with two nanotube elements per cell, it is possible double bit density by storing two data states (bits) in the same cell in two nanotube elements that share one select (steering) diode without necessarily stacking two arrays as described further above with respect to FIGS. 33A-33D.

Figure 45:
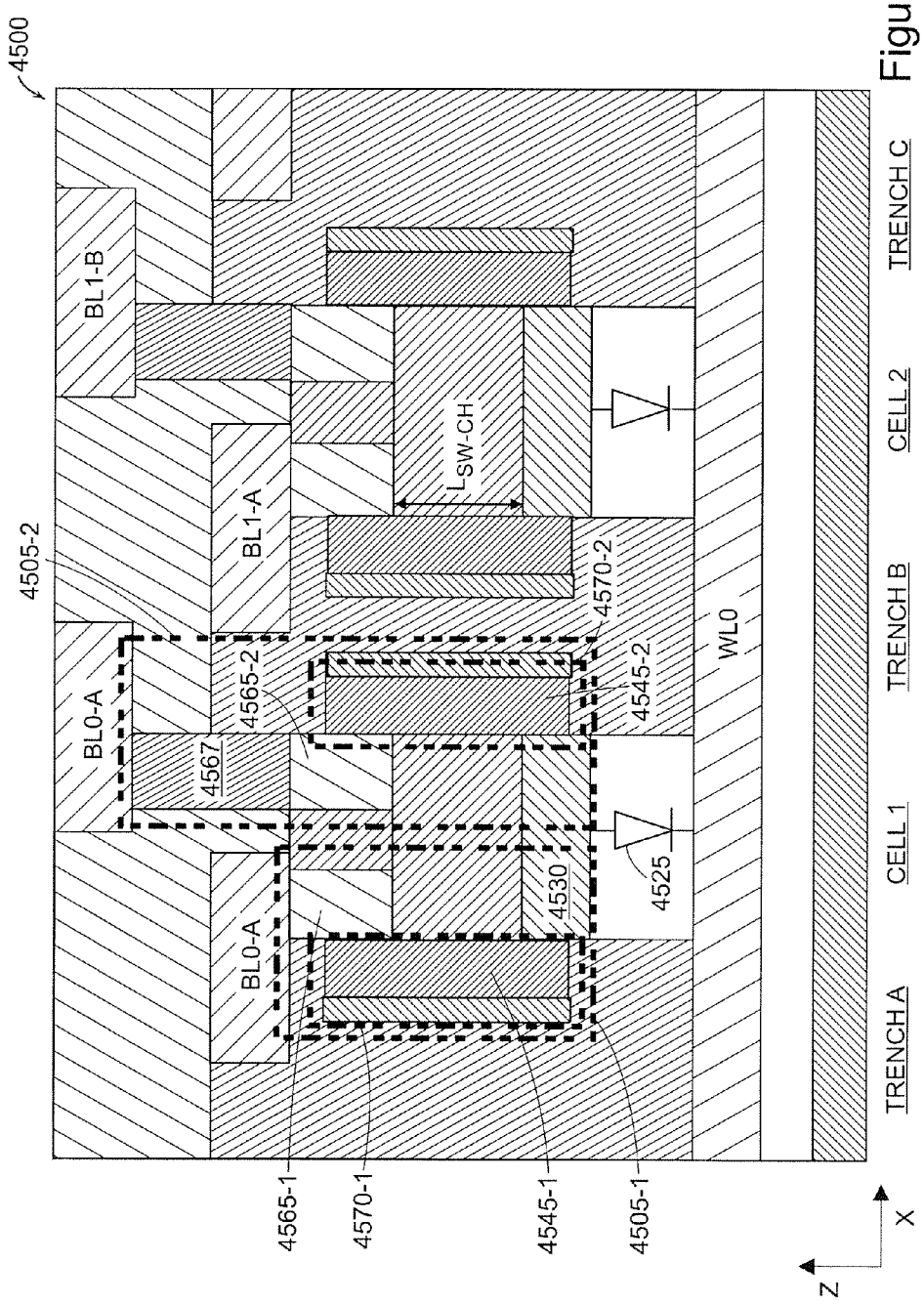
FIG. 45 illustrates a variation of the embodiments of FIGS. 43A-43C in which two nonvolatile nanotube switches share a single select (steering) diode to form a double dense 3D memory array without stacking two arrays as illustrated in FIGS. 33B, 33B', and 33C.

Memory array cross section 4500 illustrated in FIG. 45 shows cell 1 and cell 2 with identical nonvolatile nanotube switches. Since cell 1 and cell 2 are the same, only cell 1 will be described in detail. FIG. 45 illustrates cell 1 which stores two bits. One select (steering) diode 4525 connects word line WL0 and lower level contact 4530. Cell 1 includes the two nonvolatile nanotube switches 4505-1 and 4505-2 both sharing select (steering) diode 4525.

Nanotube channel element 4570-1 is formed within trench A and is similar to nanotube channel element 4370-3 illustrated in FIG. 43C. Nanotube element 4545-1 is in contact with shared lower level contact 4530 and upper level contact 4565-1. Upper level contact 4565-1 is in contact with bit line BL0-A. Nanotube element 4545-1 may store information via its resistance state.

Nanotube channel element 4570-2 is formed within trench B. Nanotube element 4545-2 is in contact with shared lower level contact 4530 and upper level contact 4565-2. Upper level contact 4565-2 is in contact with via 4567 which is in contact with bit line BL0-B. Nanotube element 4545-2 may also store information via its resistance state.

Cell 1 includes nonvolatile nanotube switch 4505-1 storing one bit, for example, and nonvolatile nanotube switch 4505-2 also storing one bit, for example such that cell 1 stores two bits, for example. Cross section 4500 illustrated in FIG. 45 illustrates a 3D memory array that stores two bits per cell, one bit in nonvolatile nanotube switch 4505-1 and the other bit in nonvolatile nanotube switch 4505-2. Memory array cross section 4500 illustrated in FIG. 45 has the same density as stacked arrays shown in FIGS. 33A-33C without requiring the stacking of two separate arrays. While this example illustrates anode-on-NT type cells, cathode-on-NT cells may also be used instead.

FIG. 45 illustrates a modified version of FIG. 43C in which sub-minimum upper level contacts 4565-1 and 4565-2 and contact via 4567 are formed using methods of fabrication corresponding to self aligned spacer techniques, sacrificial shapes, and fill and planarization techniques to form sub-minimum insulator and conductor regions as described further above with respect to FIGS. 36A-36FF. More specifically, self aligned spacer techniques are described further above with respect to FIGS. 36E and 36F; formation of sub-minimum sacrificial layers is described with respect to FIGS. 36P through 36S; and formation of minimum and sub-minimum contact regions is described with respect to FIGS. 36Y, 36Z, and 36AA.

FIGS. 33A-33C illustrate two stacked arrays, one cathode-on-NT type array and the other an anode-on-NT type array to double bit density. Each cell in the stack has one select (steering) diode and one nonvolatile nanotube switch. Cells described above with respect to FIGS. 43C and 44A-B use two nanotube elements per cell connected in parallel to increase effective nanotube element thickness. However, with two nanotube elements per cell, it is possible double bit density by storing two data states (bits) in the same cell in two nanotube elements that share one select (steering) diode without having to stack two arrays as described further above with respect to FIGS. 33A-33C.

Figure 46:
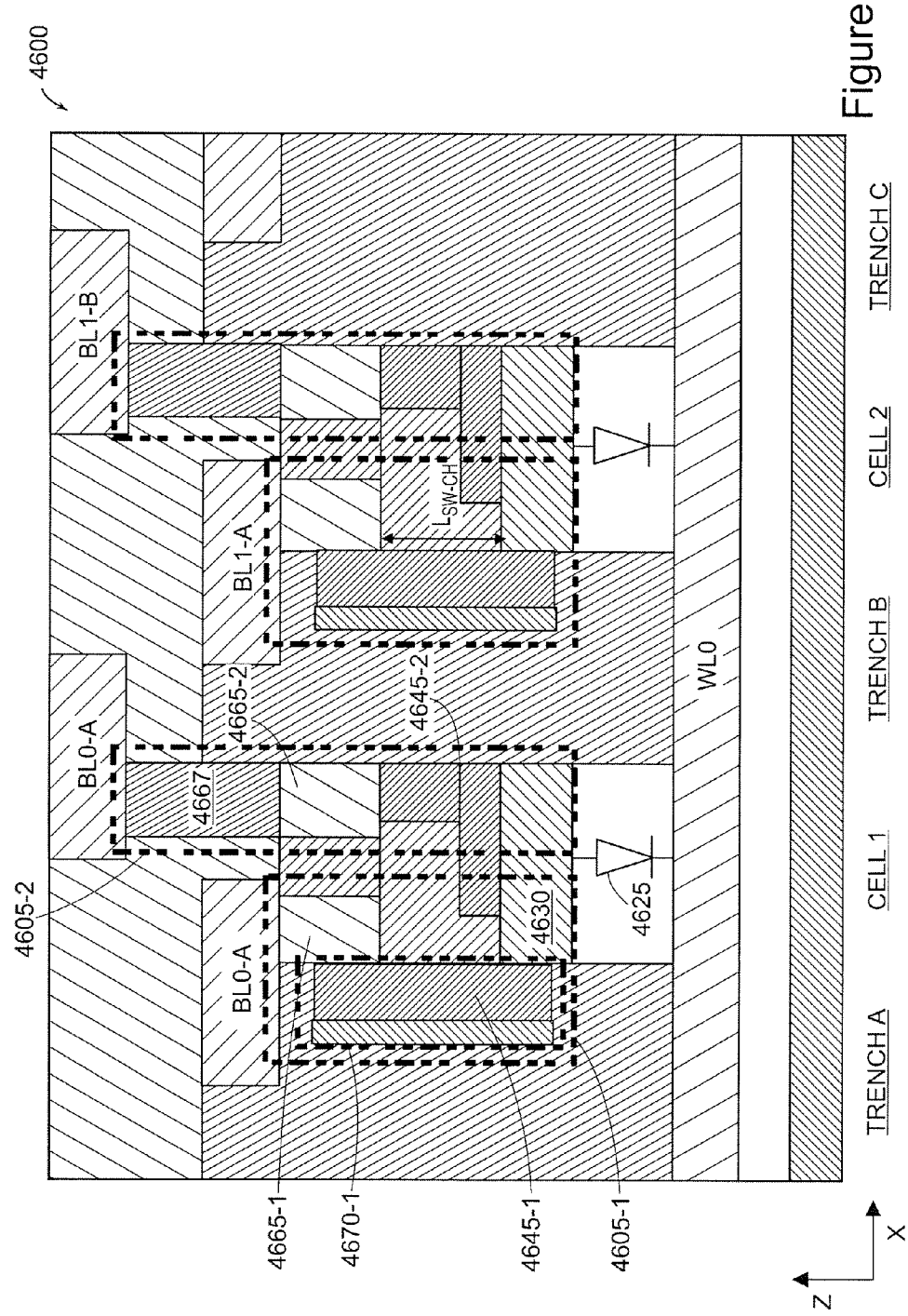
FIG. 46 illustrates a variation the embodiments of FIGS. 44A-44B in which two nonvolatile nanotube switches share a single select (steering) diode to form a double dense 3D memory array without stacking two arrays as illustrated in FIGS. 33B, 33B', and 33C.

Memory array cross section 4600 illustrated in FIG. 46 shows cell 1 and cell 2 with identical nonvolatile nanotube switch configurations. Since cell 1 and cell 2 are the same, only cell 1 will be described in detail. FIG. 46 illustrates cell 1 which stores two bits, for example. One select (steering) diode 4625 connects word line WL0 and lower level contact 4630. Cell 1 includes the two nonvolatile nanotube switches 4605-1 and 4605-2 both sharing select (steering) diode 4625.

Nanotube channel element 4670-1 is formed within trench A and is similar to nanotube channel element 4470 illustrated in FIG. 44A. Nanotube element 4645-1 is in contact with shared lower level contact 4630 and upper level contact 4665-1. Upper level contact 4665-1 is in contact with bit line BL0-A. Nanotube element 4645-1 may store information via its resistance state.

Nanotube element 4645-2 is part of nonvolatile nanotube switch 4605-2 which is formed inside cell 1 boundaries as described further above with respect to nonvolatile nanotube 4468 illustrated in FIG. 44A, except for modified upper level contact structures described further below. Nanotube element 4645-2 is in contact with shared lower level contact 4630 and upper level contact 4665-2. Upper level contact 4665-2 is in contact with via 4667 which is in contact with bit line BL0-B. Nanotube element 4645-2 may also store information via its resistance state.

Cell 1 includes nonvolatile nanotube switch 4605-1 storing one bit, for example, and nonvolatile nanotube switch 4605-2 also storing one bit, for example, such that cell 1 stores two bits, for example. Cross section 4600 illustrated in FIG. 46 illustrates a 3D memory array that can store two bits per cell, one bit in nonvolatile nanotube switch 4605-1 and the other bit in nonvolatile nanotube switch 4605-2, for example. Memory array cross section 4600 illustrated in FIG. 46 has the same density as stacked arrays shown in FIGS. 33A-33C without requiring the stacking of two separate arrays. While this example illustrates anode-on-NT type cells, cathode-on-NT cells may also be used instead.

FIG. 46 illustrates a modified version of FIGS. 44A-44B in which sub-minimum upper level contacts 4665-1 and 4665-2 and contact via 4667 are formed using methods of fabrication corresponding to self aligned spacer techniques, sacrificial shapes, and fill and planarization techniques to form sub-minimum insulator and conductor regions as described further above with respect to FIGS. 36A-36FF. More specifically, self aligned spacer techniques are described further above with respect to FIGS. 36E and 36F; formation of sub-minimum sacrificial layers is described with respect to FIGS. 36P through 36S; and formation of minimum and sub-minimum contact regions is described with respect to FIGS. 36Y, 36Z, and 36AA.

Nonvolatile 3D Memory Using Horizontally-Oriented Self-Aligned End-Contacted Nanotube Elements Stacked Above Steering (Select) Diodes FIG. 40 illustrates cross section 4000 and includes nanotube switch 4005 in which the thickness of nanotube element 4050 may be equal to the cell dimension F. In general, there is no need for the thickness of the nanotube element to be related in any particular way to the lateral dimensions of the cell. In this example, nanotube element 4050 may be deposited by spray-on methods of fabrication for example. For a technology node (generation) with F approximately 22 nm and a nanotube element thickness of approximately 22 nm for example, the nanotube region fills the available cell region. A sidewall contact is eliminated and Lower level contact 4030 and upper level contact 4065 form the two terminal (contact) regions to nanotube 4050. Vertical channel length $L_{SW-CH}$ is determined by the separation between upper layer contact 4065 and lower layer contact 4030. While cross section 4000 achieves high levels of 3D cell density, scaling of channel length $L_{SW-CH}$ is limited because nanotube element 4050 is porous. In some embodiments, $L_{SW-CH}$ must maintain a separation of hundreds of nanometers to ensure no shorting occurs between upper level contact 4065 and lower level contact 4030 through the nanotube element. However, various methods and configurations can be used in order to reduce the thickness of the nanotube element, and thus $L_{SW-CH}$, while still preventing shorting between the upper and lower level contacts. Some of exemplary methods and configurations for achieving this are described in greater detail below.

Figure 47:
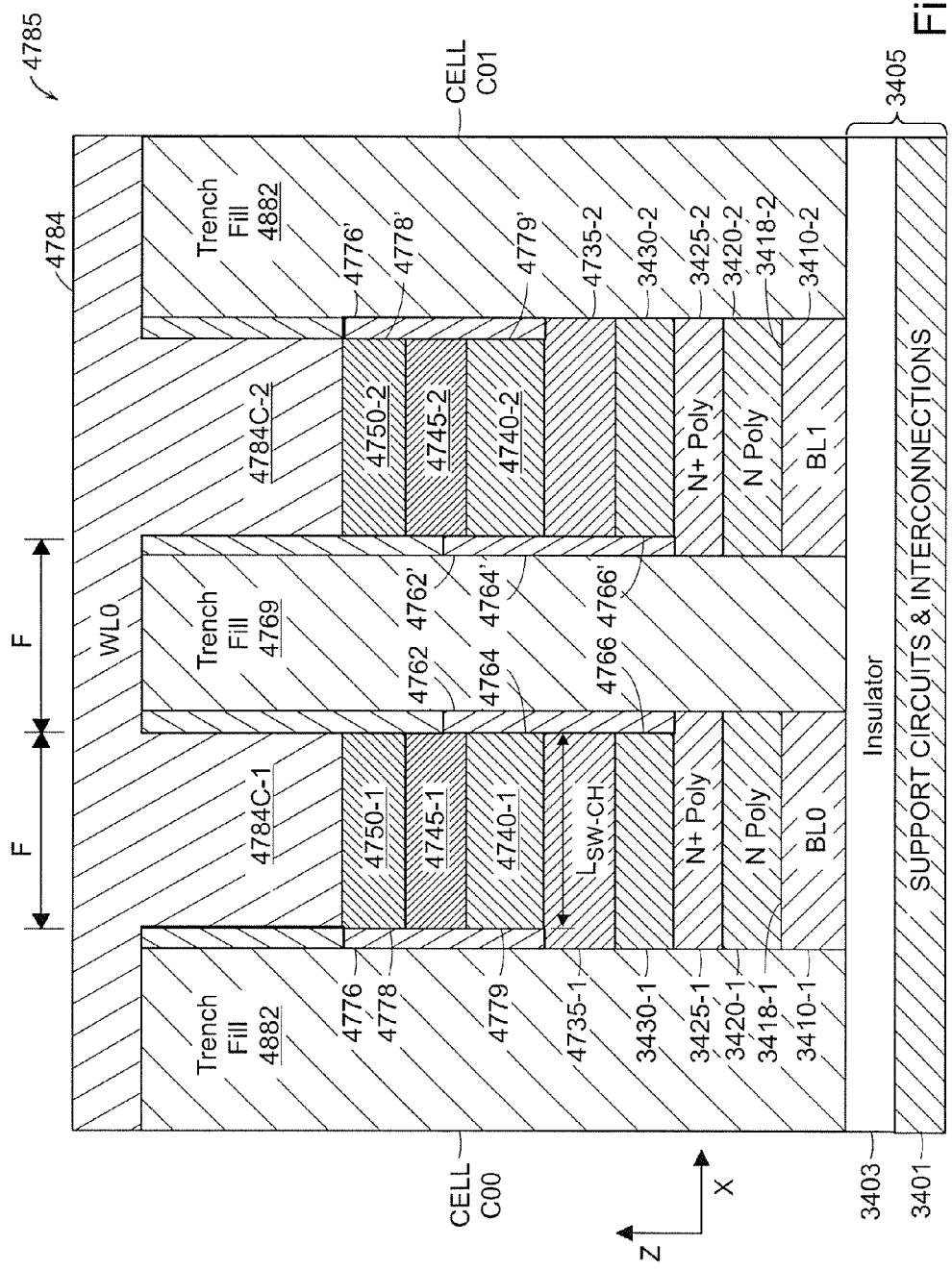
FIG. 47 illustrates a three dimensional cross section of an embodiment of a dense 3D cell structure formed with a cathode-to-NT nonvolatile nanotube diode with a Schottky diode in series with a horizontally-oriented self-aligned end-contacted nanotube switch connected to contact regions using trench sidewall wiring.

Cross section 4785 illustrated in FIG. 47 shows horizontally-oriented nonvolatile nanotube elements separated from upper level contacts and lower level contacts by insulating regions. Nanotube element end-contacts are used to connect nanotube elements with corresponding upper level contacts on one end and corresponding lower level contacts on the other end using trench sidewall wiring. This structure enables cell scaling in nanotube element channel length ($L_{SW-CH}$), channel width ($W_{SW-CH}$), and height (thickness). Methods of fabrication of cathode-on-NT 3D memory arrays are described in FIGS. 48A-48BB.

Figure 49:
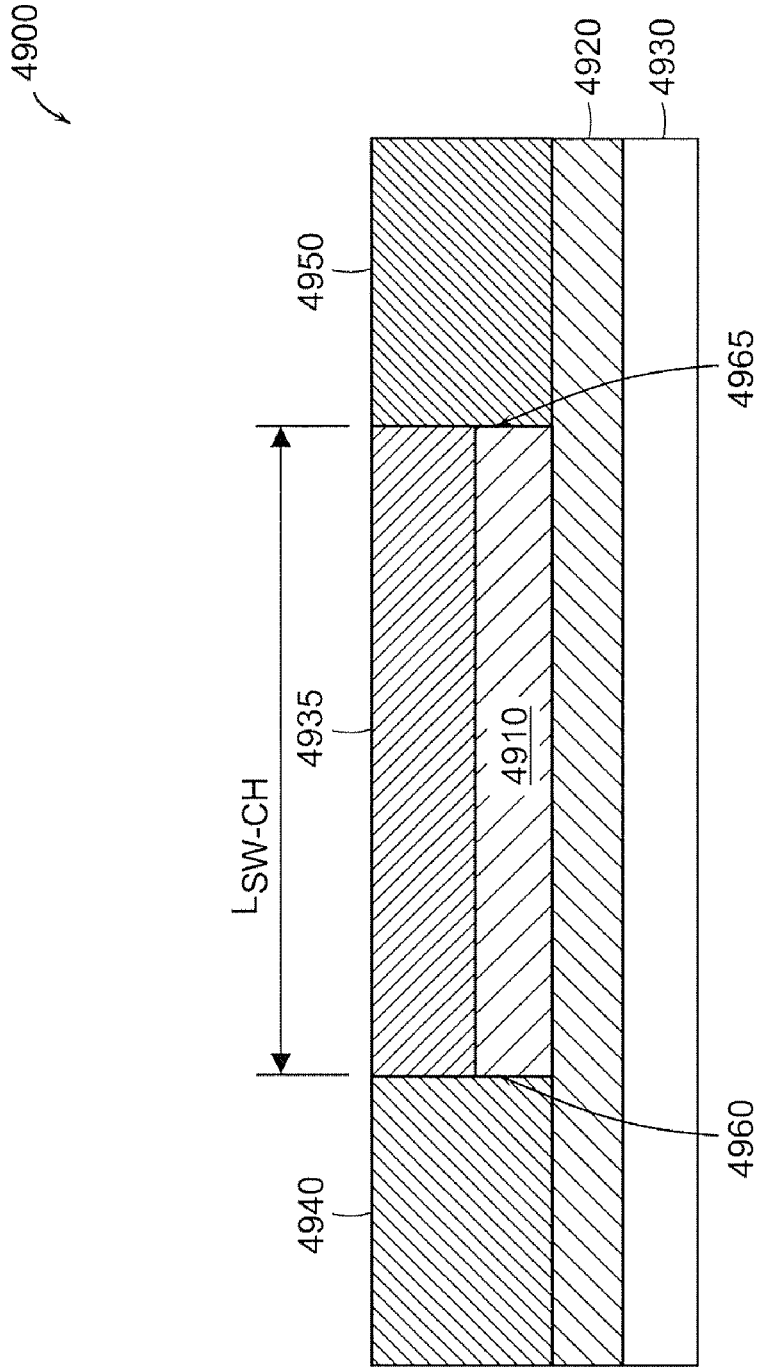
FIG. 49 illustrates an embodiment of a nonvolatile nanotube switch in an essentially horizontal orientation in which two terminals are provided at opposite ends of a patterned nanotube channel element, and only contacting said nanotube element end regions.
Figure 50:
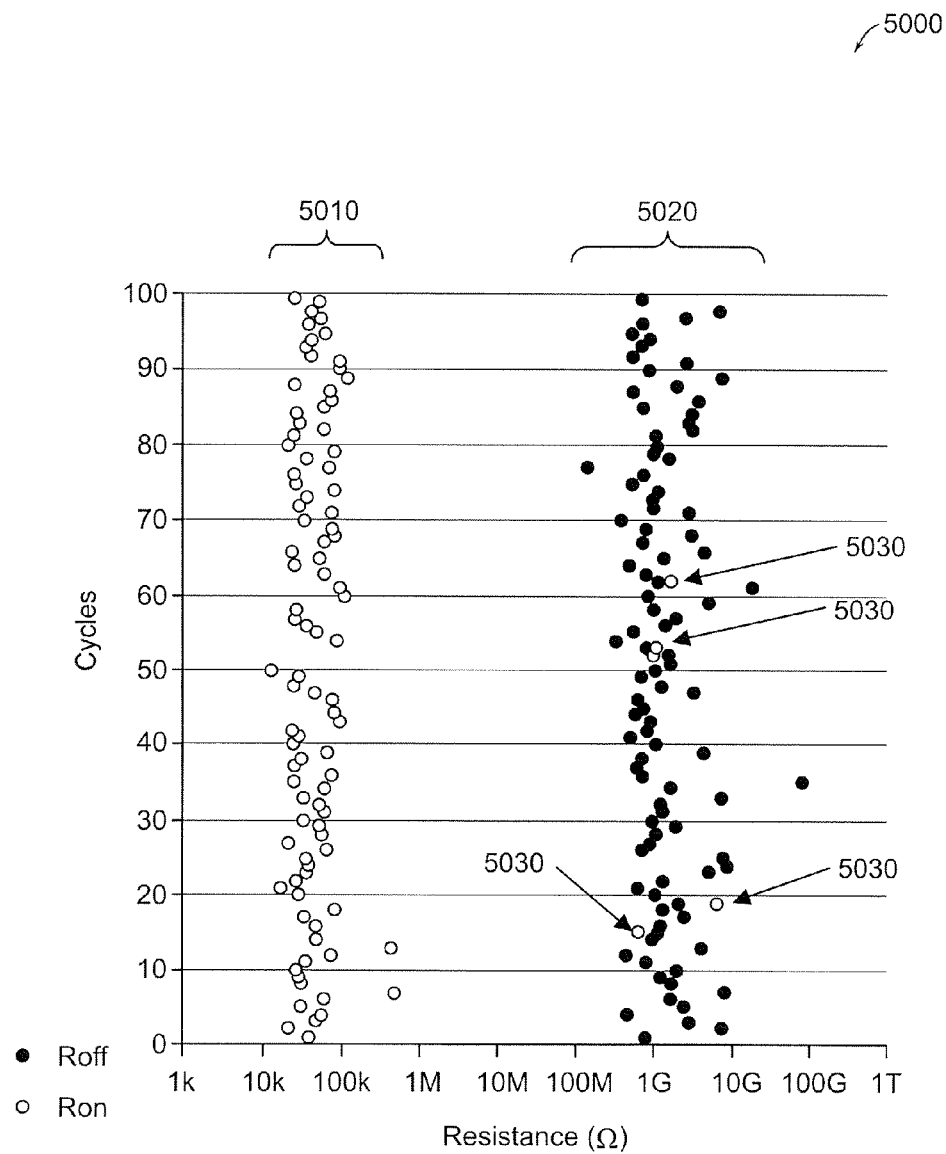
FIG. 50 illustrates the operation of the switch of FIG. 49, according to some embodiments.

FIG. 49 depicts a nonvolatile nanotube switch using end-contacts. FIG. 50 illustrates the operation of the end-contacted nonvolatile nanotube switch depicted in FIG. 49.

Figure 51:
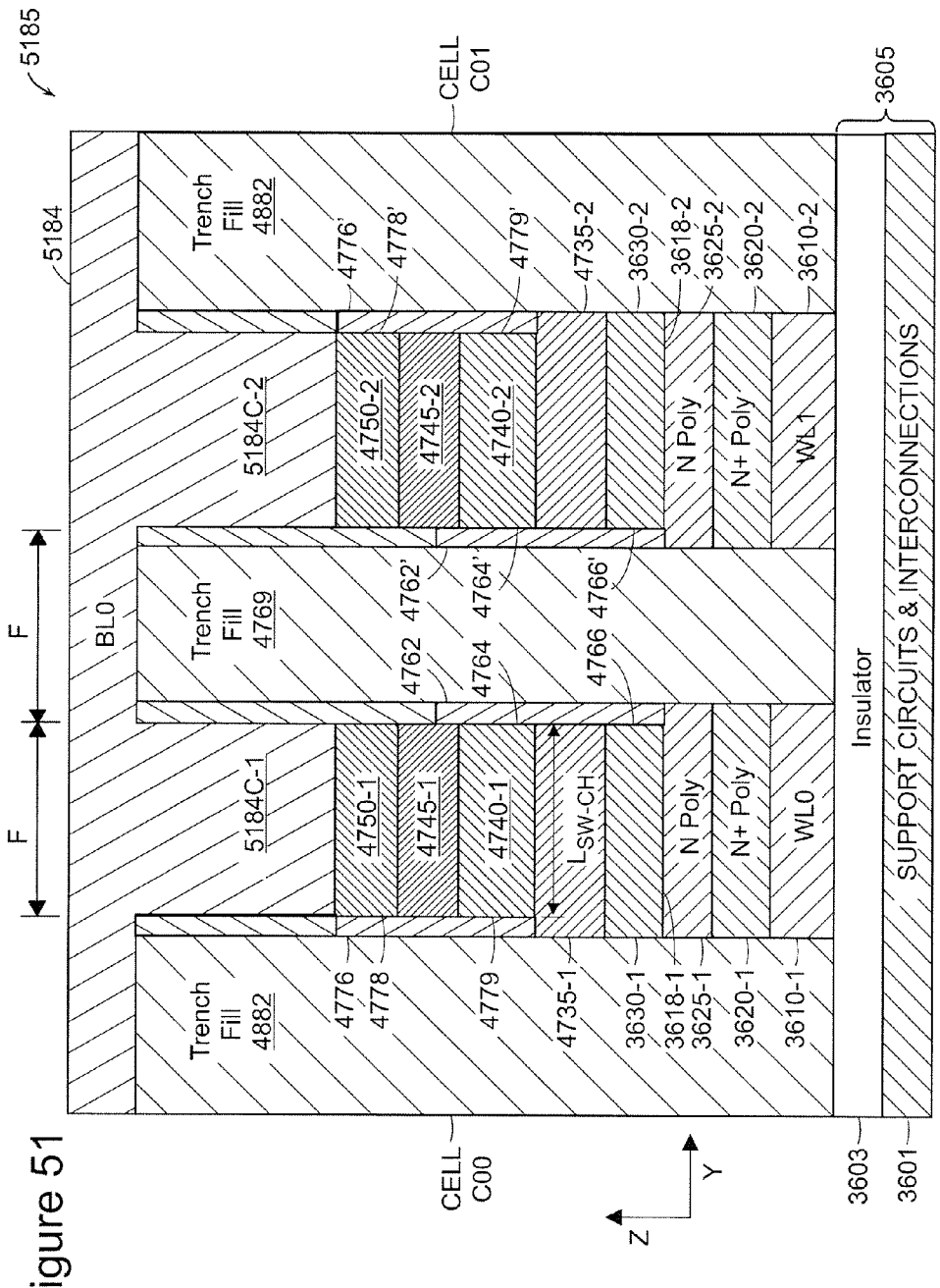
FIGS. 51 and 52 illustrate corresponding three dimensional cross sections of embodiments of dense 3D cell structures formed with an anode-to-NT nonvolatile nanotube diode with a Schottky diode in series with a horizontally-oriented self-aligned end-contacted nanotube switch connected to contact regions using trench sidewall wiring.
Figure 52:

FIGS. 51 and 52 show cross sections of nanotube element end-contacted switches used in anode-on-NT 3D memory arrays.

Figure 48A:
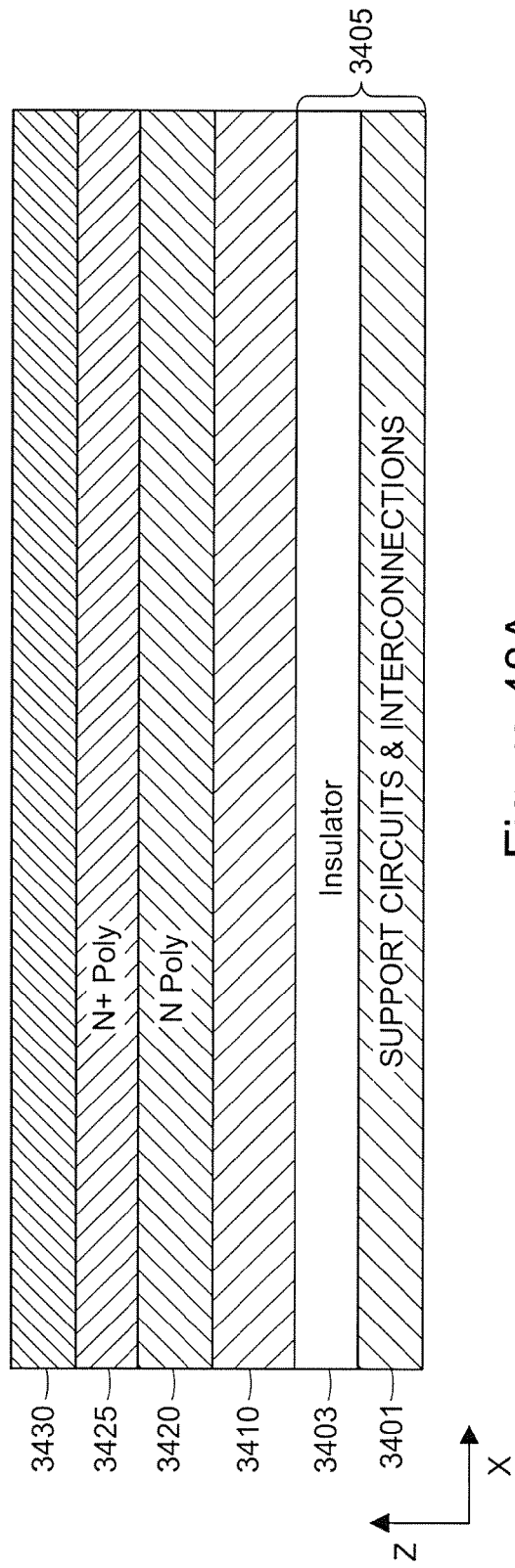
FIGS. 48A-48BB illustrate a method of fabrication of the structure in FIG. 47 using a trench fill conductor approach to generating trench sidewall wiring, according to some embodiments.
Figure 48B:
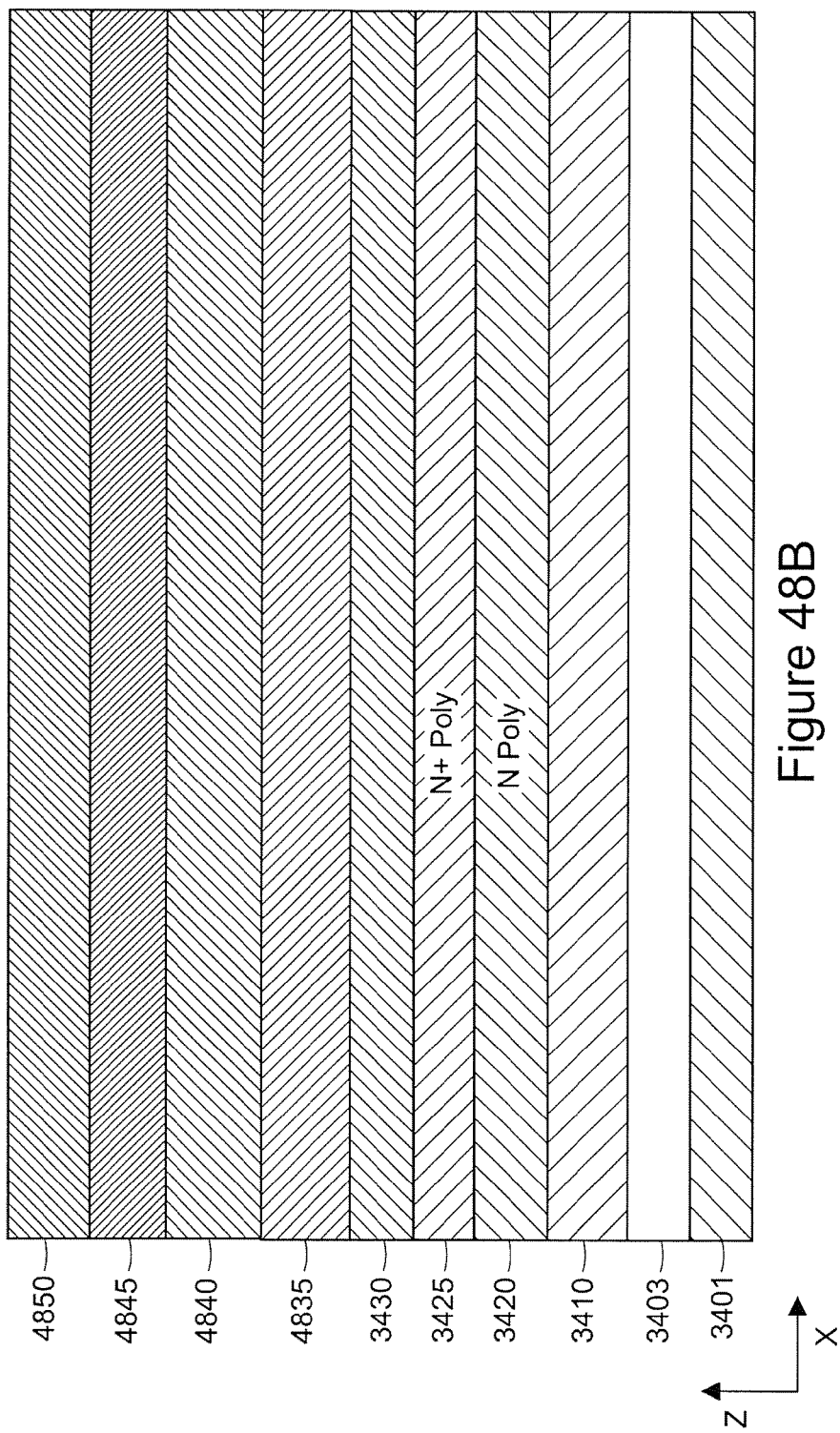
Figure 53:
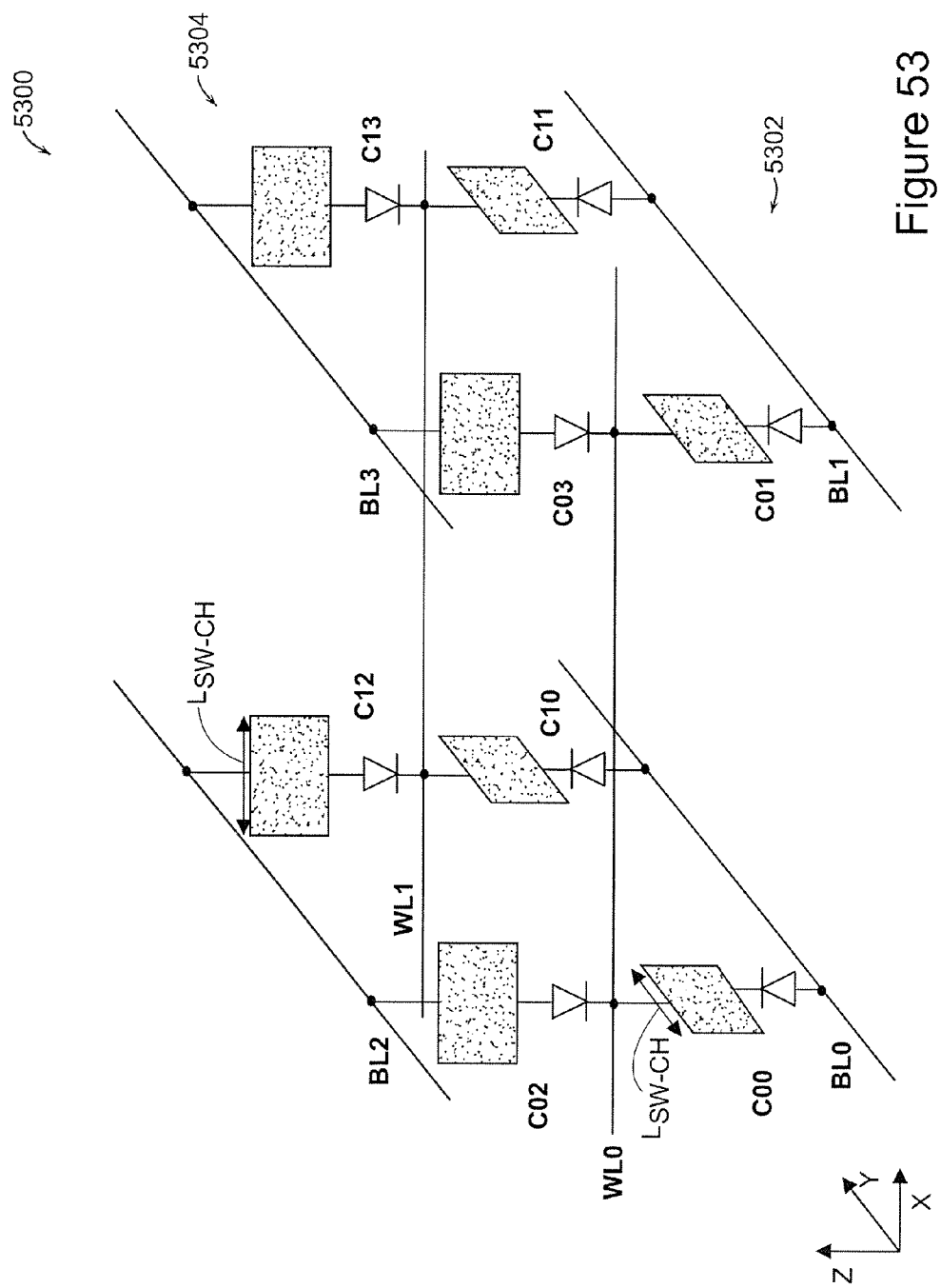
FIG. 53 illustrates a perspective view of an embodiment of stacked two-high memory array using cathode-on-NT and anode-on-NT stacked arrays.
Figure 54A:
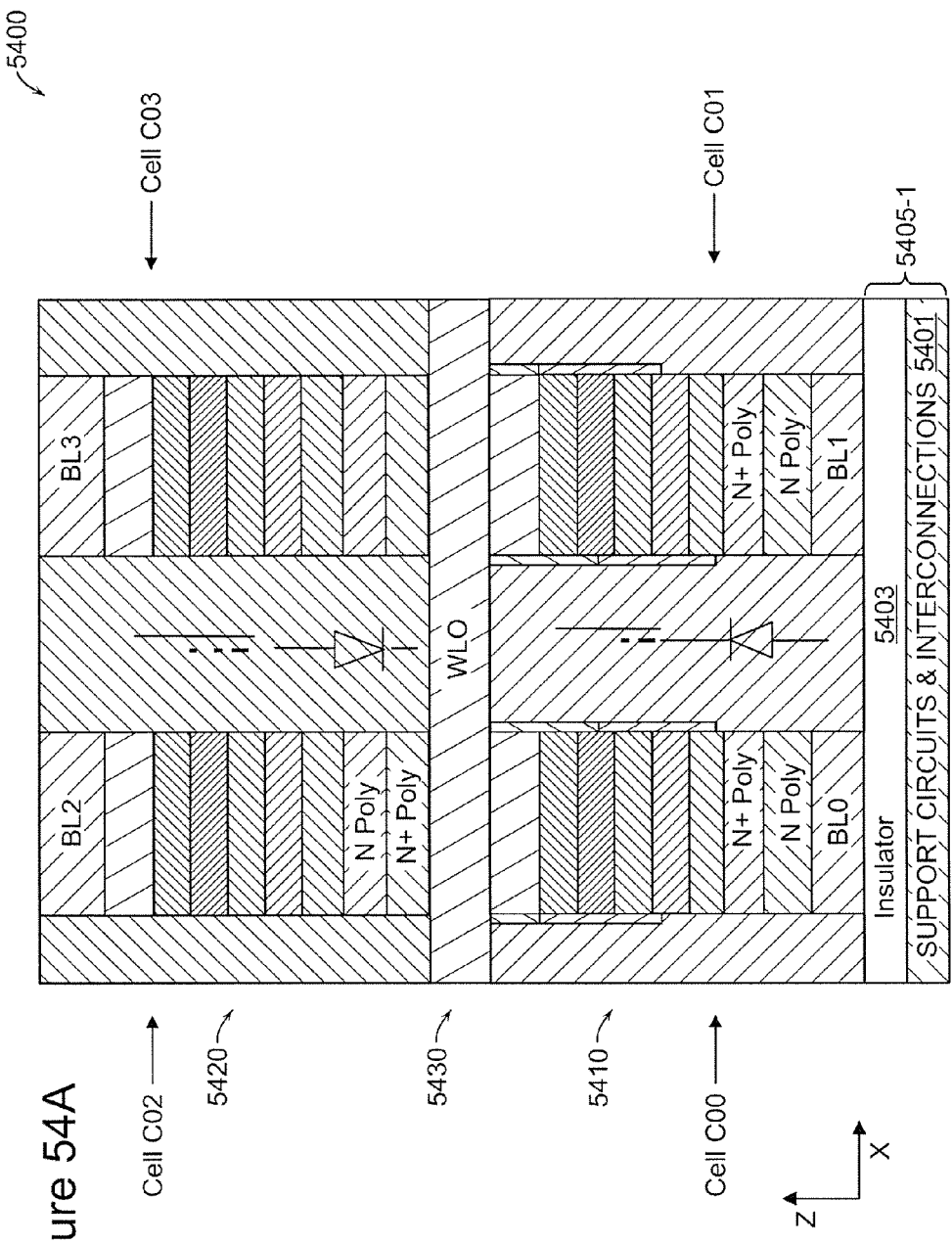
FIGS. 54A-54B illustrate cross sections of embodiments of two high memory arrays using the 3D memory structures of FIGS. 47, 48, 51, and 52.
Figure 54B:
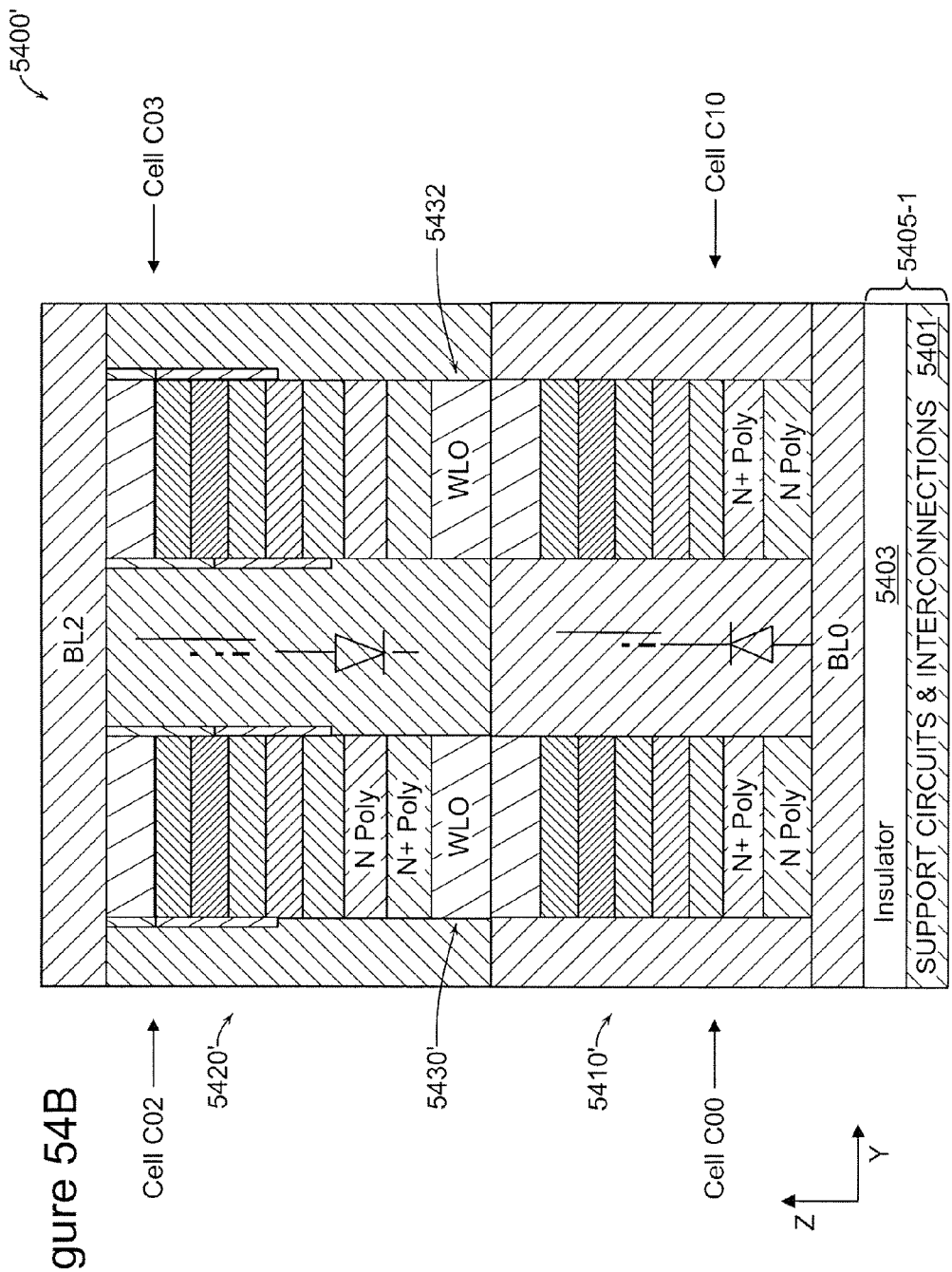

FIGS. 53 and 54A and 54B illustrated a two-high memory stack using combinations of cathode-on-NT and anode-on-nanotube 3D memory arrays based on new 3D cells described in FIGS. 47, 48A-48BB, 51, and 52.

FIGS. 55A-55F illustrate structures and corresponding methods of fabrication for trench sidewall wiring formed using conformal conductors in the trench region. Methods of fabrication used with FIGS. 48A-48BB use a conductor trench fill approach when forming trench sidewall wiring.

3-Dimensional Cell Structure of Nonvolatile Cells Using NV NT Devices Having Vertically Oriented Diodes and Horizontally Oriented Self Aligned NT Switches Using Conductor Trench-Fill for Cathode-on-NT Switch Connections FIG. 47 illustrates cross section 4785 including cells C00 and C01 in a 3-D memory embodiment. Nanotube layers are deposited horizontally on a planar insulator surface above previously defined diode-forming layers as illustrated in FIGS. 34A and 34B shown further above. Self-alignment methods, similar to self-alignment methods described further above with respect to FIGS. 34A-34FF and 36A-36FF, determine the dimensions and locations of trenches used to define cell boundaries. Self-aligned trench sidewall wiring connects horizontally-oriented nanotube elements with vertically-oriented diodes and also with array wiring.

Methods 2710 described further above with respect to FIG. 27A are used to define support circuits and interconnections 3401.

Next, methods 2730 illustrated in FIG. 27B deposit and planarize insulator 3403. Interconnect means through planar insulator 3403 (not shown in cross section 4785 but shown above with respect to cross section 2800" in FIG. 28C) may be used to connect metal array lines in 3-D arrays to corresponding support circuits and interconnections 3401. By way of example, bit line drivers in BL driver and sense circuits 2640 may be connected to bit lines BL0 and BL1 in array 2610 of memory 2600 illustrated in FIG. 26A described further above, and in cross section 4785 illustrated in FIG. 47. At this point in the fabrication process, methods 2740 may be used to form a memory array on the surface of insulator 3403, interconnected with memory array support structure 3405-1 illustrated in FIG. 47.

Methods 2740 illustrated in FIG. 27B deposit and planarize metal, polysilicon, insulator, and nanotube elements to form nonvolatile nanotube diodes which, in this example, include multiple vertically oriented diode and horizontally-oriented nonvolatile nanotube switch series pairs. Individual cell boundaries are formed in a single etch step, each cell having a single NV NT Diode defined by a single trench etch step after layers, except the WL0 layer, have been deposited and planarized, in order to eliminate accumulation of individual layer alignment tolerances that would substantially increase cell area. Individual cell dimensions in the X direction are F (1 minimum feature) as illustrated in FIG. 47, and also F in the Y direction (not shown) which is orthogonal to the X direction, with a periodicity in X and Y directions of 2F. Hence, each cell occupies an area of approximately $4F^2$.

Vertically-oriented (Z direction) trench sidewall cell wiring on a first cell sidewall connects a vertically-oriented diode and one end of a horizontally-oriented nanotube element; and vertically-oriented trench sidewall cell wiring on a second cell sidewall connects the other end of the horizontally-oriented nanotube element with array wiring. Exemplary methods of forming vertically-oriented trench sidewall cell wiring may be adapted from methods of patterning shapes on trench sidewalls such as methods disclosed in U.S. Pat. No. 5,096,849, the entire contents of which are incorporated herein by reference. Horizontally-oriented NV NT switch element (nanotube element) dimensions in the X and Y direction are defined by trench etching. There are no alignment requirements for the nanotube elements in the X or Y direction. Nanotube element thickness (Z direction) is typically in the 5 to 40 nm range. However, nanotube element thickness may be any desired thickness, less than 5 nm or greater than 40 nm for example.

Horizontally-oriented nanotube elements may be formed using a single nanotube layer, or may be formed using multiple layers. Such nanotube element layers may be deposited e.g., using spin-on coating techniques or spray-on coating techniques, as described in greater detail in the incorporated patent references. FIG. 47 illustrates 3-D memory array cross section 4785 in the X direction and corresponds to methods of fabrication illustrated with respect to FIG. 48. Nanotube element length dimension $L_{SW-CH}$ and width dimension $W_{SW-CH}$ are determined by etched trench wall spacing. If trench wall spacing is substantially equal to minimum technology node dimension F in both X and Y direction, then for technology nodes 90 nm, 65 nm, 45 nm, and 22 nm for example, $L_{SW-CH}$ and $W_{SW-CH}$ will be approximately 90 nm, 65 nm, 45 nm, and 22 nm for example.

Methods fill trenches with an insulator; and then methods planarize the surface. Then, methods deposit and pattern word lines on the planarized surface.

The fabrication of vertically-oriented 3D cells illustrated in FIG. 47 proceeds as follows. Methods deposit a bit line wiring layer on the surface of insulator 3403 having a thickness of 50 to 500 nm, for example, as described further below with respect to FIG. 48. Fabrication of the vertically-oriented diode portion of structure 4785 is the same as in FIGS. 34A and 34B described further above and are incorporated in methods of fabrication described with respect to FIG. 48. Methods etch the bit line wiring layer and define individual bit lines such as bit line conductors 3410-1 (BL0) and 3410-2 (BL1). Bit lines such as BL0 and BL1 are used as array wiring conductors and may also be used as anode terminals of Schottky diodes. Alternatively, Schottky diode junctions 3418-1 and 3418-2 may be formed using metal or silicide contacts (not shown) in contact with N polysilicon regions 3420-1 and 3420-2, while also forming ohmic contacts with bit line conductors 3410-1 and 3410-2, N polysilicon regions 3420-1 and 3420-2 may be doped with arsenic or phosphorus in the range of $10^{14}$ to $10^{17}$ dopant atoms/cm$^3$ for example, and may have a thickness range of 20 nm to 400 nm, for example.

FIG. 47 illustrates a cathode-to-NT type NV NT diode formed with Schottky diodes. However, PN or PIN diodes may be used instead of Schottky diodes as described further below with respect to FIG. 48A.

The electrical characteristics of Schottky (and PN, PIN) diodes may be improved (low leakage, for example) by controlling the material properties of polysilicon, for example polysilicon deposited and patterned to form polysilicon regions 3420-1 and 3420-2. Polysilicon regions may have relatively large or relatively small grain boundary sizes that are determined by methods used in the semiconductor regions. For example, SOI deposition methods used in the semiconductor industry may be used that result in polysilicon regions that are single crystalline (no longer polysilicon), or nearly single crystalline, for further electrical property enhancement such as low diode leakage currents.

Examples of contact and conductors materials include elemental metals such as Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, CoSi$_x$ and TiSi$_x$. Insulators may be SiO$_2$, SiN$_x$, Al$_2$O$_3$, BeO, polyimide, Mylar or other suitable insulating material.

In some cases conductors such as Al, Au, W, Cu, Mo, Ti, and others may be used as both contact and conductors materials as well as anodes for Schottky Diodes. However, in other cases, optimizing anode material for lower forward voltage drop and lower diode leakage is advantageous. Schottky diode anode materials may be added (not shown) between conductors 3410-1 and 3410-2 and polysilicon regions 3420-1 and 3420-2, respectively. Such anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as CoSi$_2$, MoSi$_2$, Pd$_2$Si, PtSi, RbSi$_2$, TiSi$_2$, WSi$_2$, and ZrSi$_2$ may be used. Schottky diodes formed using such metals and suicides are illustrated in the reference by N G, K. K. "Complete Guide to Semiconductor Devices", Second Edition, John Wiley & Sons, 2002m pp. 31-41, the entire contents of which are incorporated herein by reference.

Next, having completed Schottky diode select devices, methods form N+ polysilicon regions 3425-1 and 3425-2 to contact N polysilicon regions 3420-1 and 3420-2, respectively, and also to form contact regions for ohmic contacts to contacts 3430-1 and 3430-2. N+ polysilicon is typically doped with arsenic or phosphorous to $10^{20}$ dopant atoms/cm$^3$, for example, and has a thickness of 20 to 400 nm, for example. N and N+ polysilicon region dimensions are defined by trench etching near the end of the process flow.

Next, methods form planar insulating regions 4735-1 and 4735-2 on the surface of lower level contact (contact) 3430-1 and 3430-2, respectively, typically SiO$_2$ for example, with a thickness of 20 to 500 nm for example and X and Y dimensions defined by trench etching near the end of the process flow.

Next, methods form horizontally-oriented nanotube elements 4740-1 and 4740-2 on the surface of insulator regions 4735-1 and 4735-2, respectively, having nanotube element length and width defined by trench etching near the end of the process flow and insulated from direct contact with lower level contacts 3430-1 and 3430-2, respectively. In order to improve the density of cells C00 and C01, nanotube elements 4740-1 and 4740-2 illustrated in FIG. 47 are horizontally-oriented with trench-defined end-contacts 4764 and 4779 in contact with nanotube element 4740-1, and end-contacts 4764' and 4779' in contact with nanotube element 4740-2 as described further below. Horizontally-oriented nanotube elements and methods of making same are described in greater detail in the incorporated patent references.

Then, methods form protective insulators 4745-1 and 4745-2 on the surface of conformal nanotube elements 4740-1 and 4740-2, respectively, with X and Y dimensions defined by trench etching near the end of the process flow. Exemplary methods of forming protective insulator 4745-1 and 4745-2 are described further below with respect to FIG. 48B.

Next, methods form upper level contacts 4750-1 and 4750-2 on the surface of protective insulators 4745-1 and 4745-2, respectively, with X and Y dimensions defined by trench etching near the end of the process flow.

Next, methods form (etch) trench openings of width F form inner sidewalls of cells C00 and C01 and corresponding upper and lower level contacts, nanotube elements, and insulators described further above.

Next, methods form sidewall vertical wiring 4762 and 4762'. Vertical sidewall wiring 4762 forms and connects end-contact 4764 of nanotube element 4740-1 with end-contact 4766 of lower level contact 3430-1; vertical sidewall wiring 4762' forms and connects end-contact 4764' of nanotube element 4740-2 with end-contact 4766' of lower level contact 3430-2.

Next, methods complete trench formation (etching) to the surface of insulator 3403.

Next, methods fill trench opening with an insulator such as TEOS and planarize the surface to complete trench fill 4769.

Next, methods form (etch) trench openings of width F that form outer sidewalls of cells C00 and C01 and corresponding upper and lower level contacts, nanotube elements, and insulators described further above.

Next, methods form sidewall vertical wiring 4776 and 4776'. Vertical sidewall wiring 4776 forms and connects end-contact 4778 of nanotube element 4740-1 with the end-contact region of upper level contact 4750-1; vertical sidewall wiring 4776' forms and connects end-contact 4778' of nanotube element 4740-2 with the end-contact region of upper level contact 4850-2.

Next, methods complete trench formation (etching) to the surface of insulator 3403.

Next, methods fill trench openings with an insulator such as TEOS and planarize the surface to complete trench fill 4882 and 4882'.

Next, methods directionally etch and form word line contacts 4784C-1 and 4784C-2 on the surface of upper level contacts 4750-1 and 4750-2, respectively, by depositing and planarizing a word line layer.

Next, methods pattern word line 4784.

Nonvolatile nanotube diodes forming cells C00 and C01 correspond to nonvolatile nanotube diode 1200 in FIG. 12, one in each of cells C00 and C01. Cells C00 and C01 illustrated in cross section 4785 in FIG. 47 correspond to corresponding cells C00 and C01 shown schematically in memory array 2610 in FIG. 26A, and bit lines BL0 and BL1 and word line WL0 correspond to array lines illustrated schematically in memory array 2610.

Methods 2700 illustrated in FIGS. 27A and 27B may be used to fabricate memories using NV NT diode devices with cathode-to-NT switch connections for horizontally-oriented self-aligned NV NT switches such as those shown in cross section 4785 illustrated in FIG. 47 as described further below with respect to FIG. 48. Structures such as cross section 4785 may be used to fabricate memory 2600 illustrated schematically in FIG. 26A.

Methods of Fabricating 3-Dimensional Cell Structure of Nonvolatile Cells Using NV NT Devices Having Vertically Oriented Diodes and Horizontally-Oriented Self Aligned NT Switches Using Conductive Trench-Fill for Cathode-to-NT Switch Connection Methods 2710 illustrated in FIG. 27A are used to define support circuits and interconnects similar to those described with respect to memory 2600 illustrated in FIG. 26A as described further above. Methods 2710 apply known semiconductor industry techniques design and fabrication techniques to fabricated support circuits and interconnections 3401 in and on a semiconductor substrate as illustrated in FIG. 48A. Support circuits and interconnections 3401 include FET devices in a semiconductor substrate and interconnections such as vias and wiring above a semiconductor substrate. FIG. 48A corresponds to FIG. 34A illustrating a Schottky diode structure, except that an optional conductive Schottky anode contact layer 3415 shown in FIG. 34A is not shown in FIG. 48A. Note that FIG. 34A' may be used instead of FIG. 34A as a starting point if a PN diode structure is desired. If N polysilicon layer 3417 in FIG. 34A' were replaced with an intrinsically doped polysilicon layer instead (not shown), then a PIN diode would be formed instead of a PN diode. Therefore, while the structure illustrated in FIG. 48A illustrates a Schottky diode structure, the structure may also be fabricated using either a PN diode or a PIN diode.

Methods of fabrication for elements and structures for support circuits & interconnections 3401, insulator 3403, memory array support structure 3405, conductor layer 3410, N polysilicon layer 3420, N+ polysilicon layer 3425, and lower level contact layer 3430 illustrated in FIG. 48 are described further above with respect to FIGS. 34A and 34B.

Next, methods of fabrication deposit insulator layer 4835 as illustrated in FIG. 48B on the surface of lower level contact layer 3430. Insulator layer 4835 is typically $SiO_2$ with a thickness range of 20 to 500 nm for example.

Next, methods deposit a horizontally-oriented nanotube layer 4840 on the planar surface of insulator layer 4835 as illustrated in FIG. 48B. Horizontally-oriented nanotube layer 4840 may be formed using a single nanotube layer, or may be formed using multiple nanotube layers. Such nanotube layers may be deposited e.g., using spin-on coating techniques or spray-on coating techniques, as described in greater detail in the incorporated patent references.

Next, methods form protective insulator layer 4845 on the surface on nanotube layer 4840 as illustrated in FIG. 48B. Protective insulator layer 4845 may be formed using appropriate material known in the CMOS industry, including, but not limited to: PVDF (Polyvinylidene Fluoride), Polyimide, PSG (Phosphosilicate glass) oxide, Orion oxide, LTO (planarizing low temperature oxide), sputtered oxide or nitride, flowfill oxide, ALD (atomic layer deposition) oxides. CVD (chemical vapor deposition) nitride may also be used, and these materials may be used in conjunction with each other, e.g., a PVDF layer or mixture of PVDF and other copolymers may be placed on top of nanotube layer 4840 and this complex may be capped with ALD $Al_2O_3$ layer, however any non-oxygen containing high temperature polymers could be used as passivation layers. In some embodiments passivation materials such as PVDF may be mixed or formulated with other organic or dielectric materials such as PC7 to generate specific passivation properties such as to impart extended lifetime and reliability. Various materials and methods are described in U.S. patent application Ser. No. 11/280,786.

At this point in the fabrication process, methods deposit upper level contact layer 4850 on the surface of insulator layer 4845 as illustrated in FIG. 48B. Upper level contact layer 4850 may be 10 to 500 nm in thickness, for example. Upper level contact layer 4850 may be formed using Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$, for example.

Figure 48C:
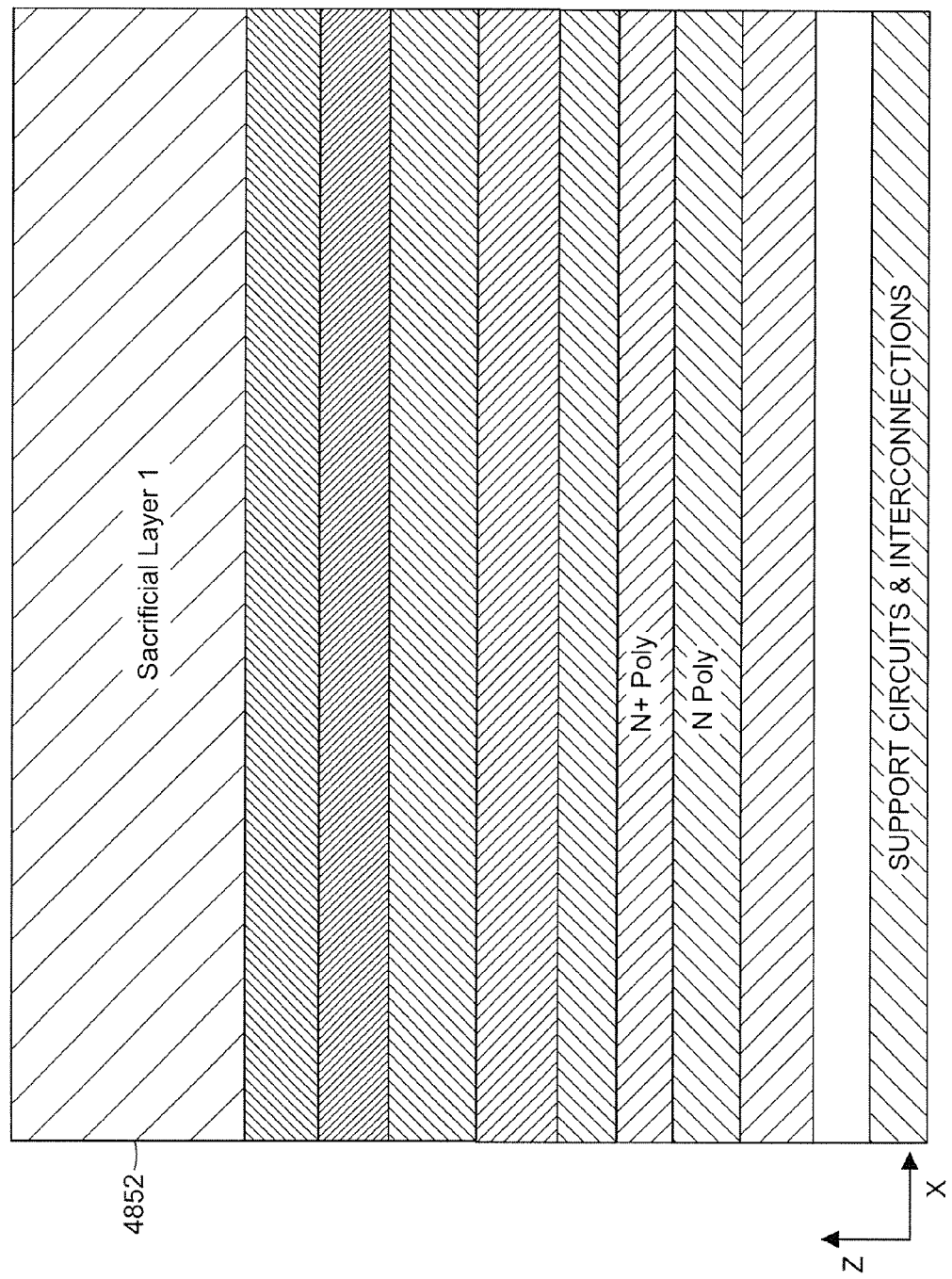

Next methods deposit sacrificial layer 4852 (sacrificial layer 1) on upper level contact layer 4850 as illustrated in FIG. 48C. Sacrificial layer 4852 may be in the range of 10 to 500 nm thick and be formed using conductor, semiconductor, or insulator materials such as materials described further above with respect to lower level contact layer 3430, semiconductor layers 3420 and 3425, and insulator layers 4835 and 4845.

Next, methods deposit and pattern a masking layer (not shown) deposited on the top surface of sacrificial layer 4852 using known industry methods. The mask opening may be aligned to alignment marks in planar insulating layer 3403 for example; the alignment is not critical.

Figure 48D:
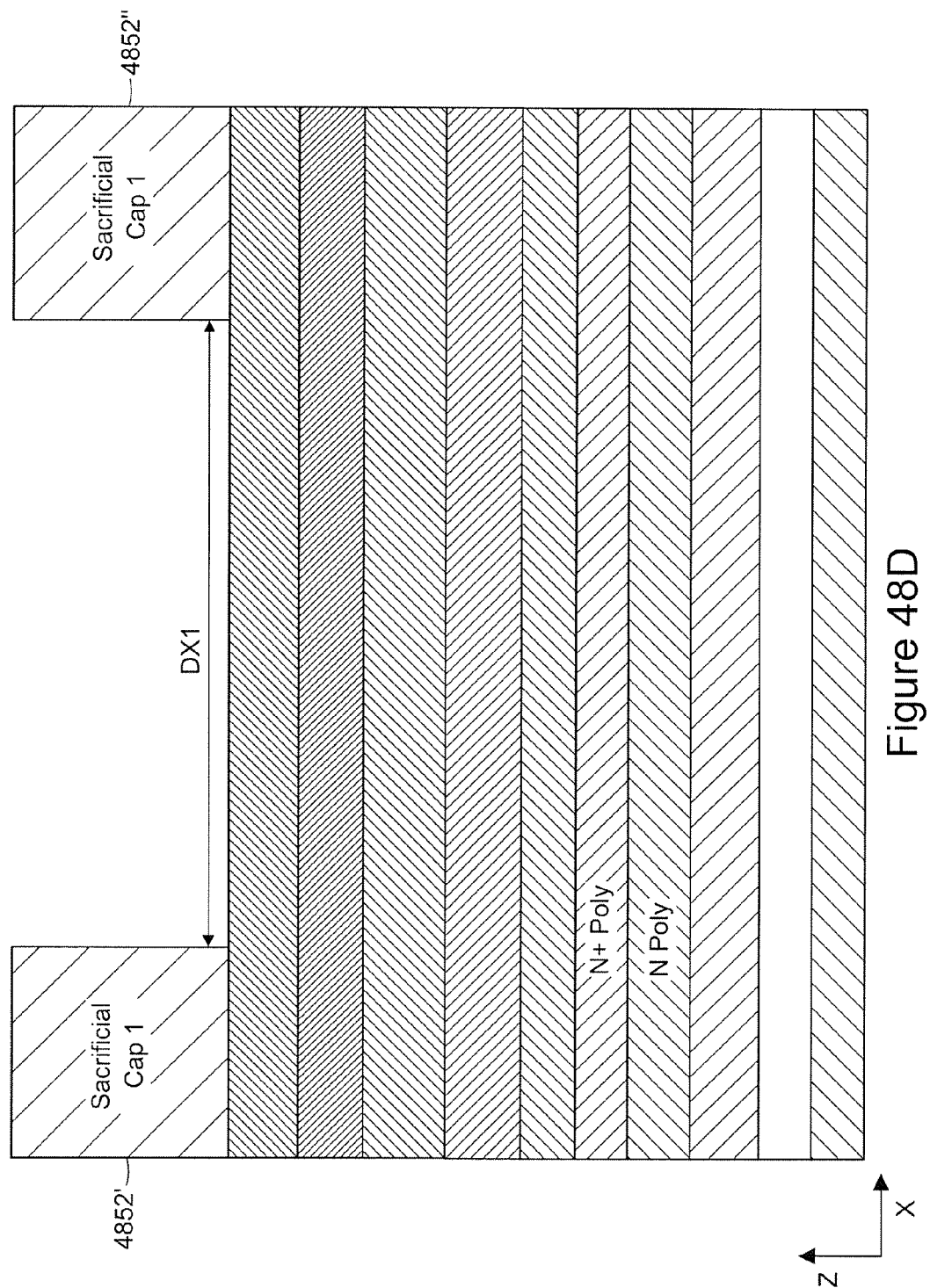

Then, methods directionally etch sacrificial layer 4852 to form an opening of dimension DX1 through sacrificial layer 4852 stopping at the surface of upper level contact layer 4850 using known industry methods as illustrated in FIG. 48D. Two memory cells that include horizontal nanotube channel elements self aligned and positioned with respect to vertical edges of sacrificial cap 1 region 4852' and sacrificial cap 1 region 4852" are formed as illustrated further below. The dimension DX1 is approximately 3F, where F is a minimum photolithographic dimension. For a 65 nm technology node, DX1 is approximately 195 nm; for a 45 nm technology node, DX1 is approximately 135 nm; and for a 22 nm technology node, DX1 is approximately 66 nm. These DX1 dimensions are much larger than the technology minimum dimension F and are therefore non-critical dimensions at any technology node.

Figure 48E:
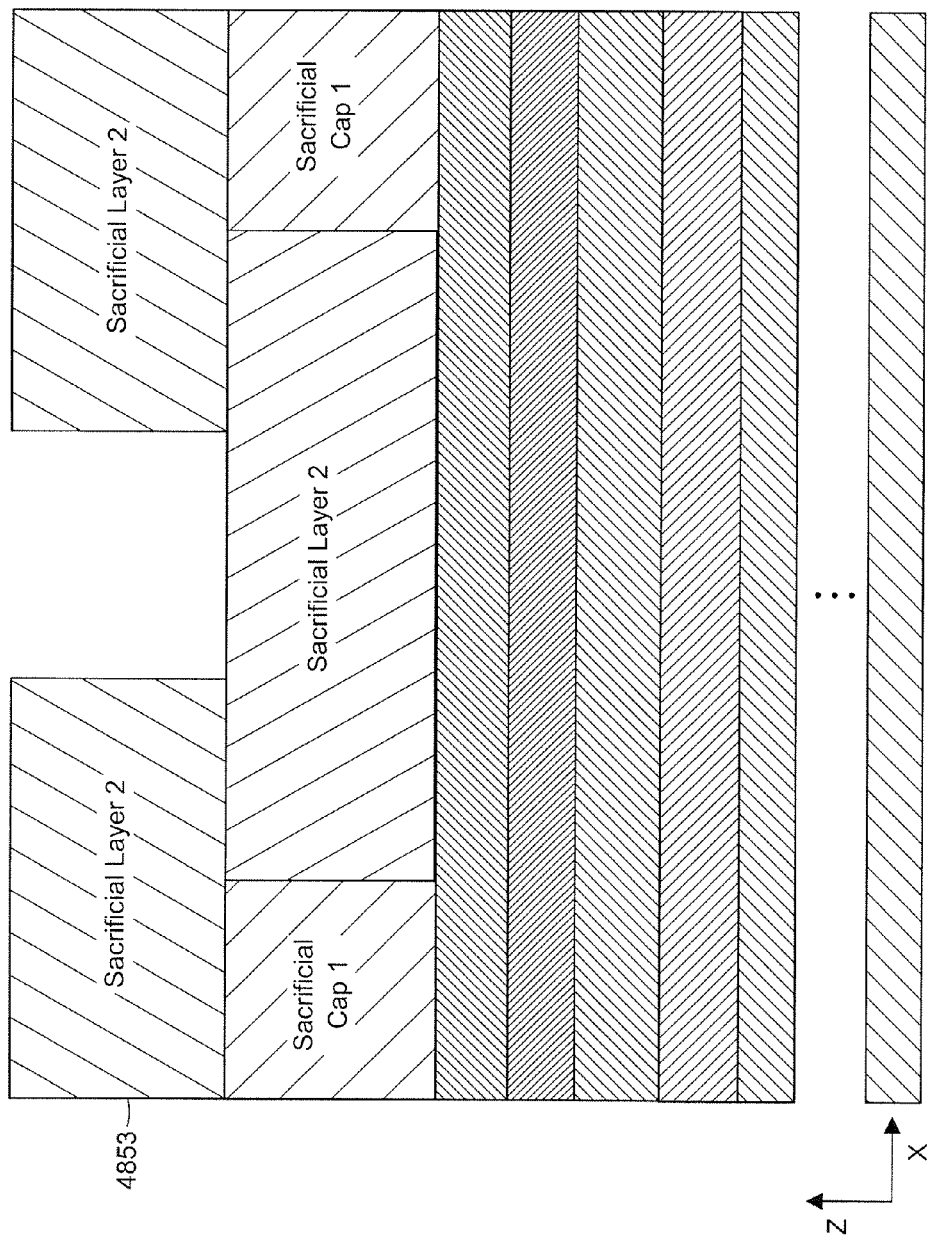

Next, methods deposit a second conformal sacrificial layer 4853 (sacrificial layer 2) as illustrated in FIG. 48E. The thickness of conformal sacrificial layer 4853 is selected as F. In this example, if F is 45 nm, then the thickness of conformal sacrificial layer 4853 is approximately 45 nm; if F is 22 nm, then the thickness of conformal sacrificial layer 4853 is approximately 22 nm. Conformal sacrificial layer 4853 may be formed using conductor, semiconductor, or insulator materials similar to those materials used to form sacrificial layer 4852 described further above.

Figure 48F:
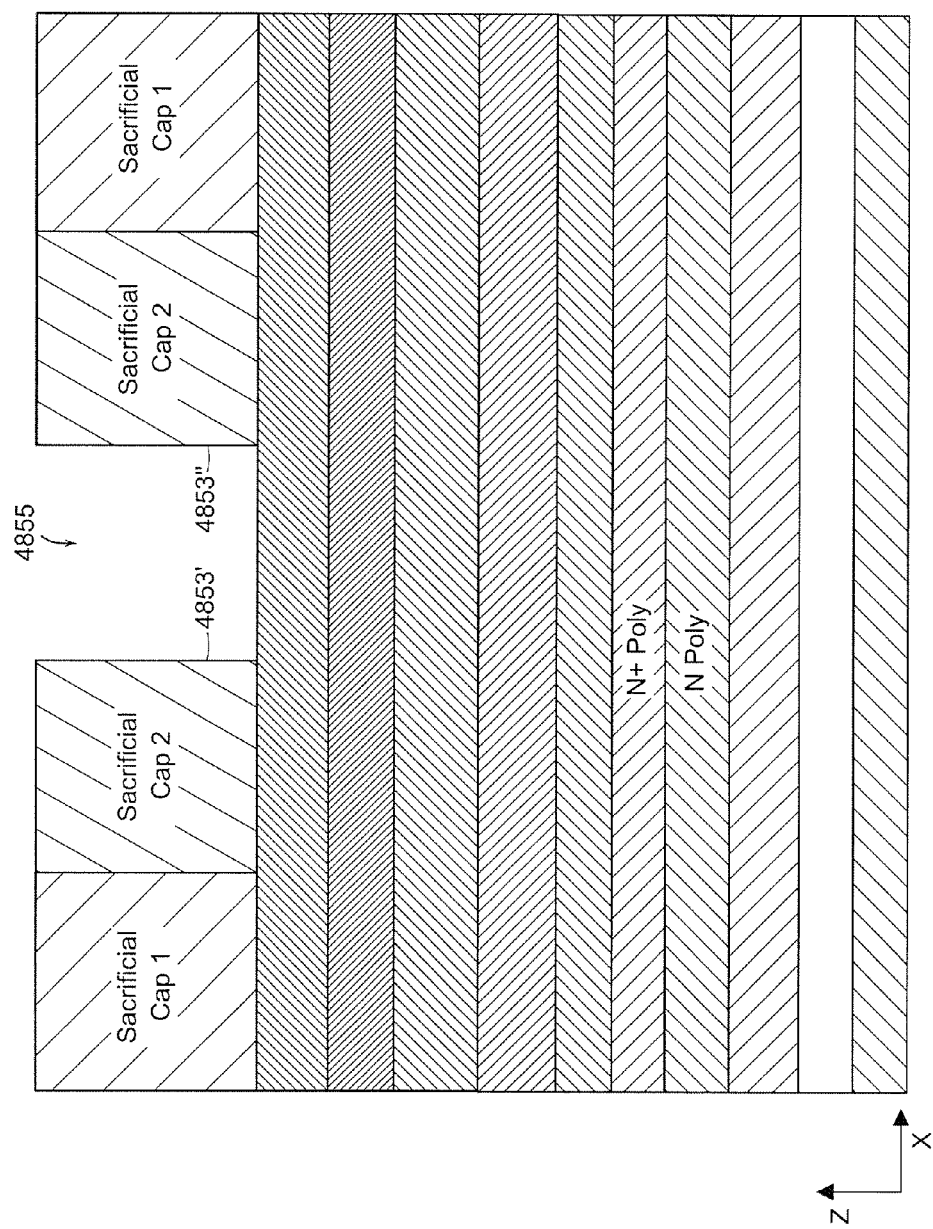

Next, methods directionally etch conformal sacrificial layer 4853 using reactive ion etch (RIE) for example, using known industry methods, forming opening 4855 of dimension approximately F, which in this example may be in a range of 22 to 45 nm as illustrated in FIG. 48F. The inner sidewalls of second sacrificial cap 2 region 4853' and second sacrificial cap 2 region 4953" in opening 4855 are self-aligned to the inner walls of sacrificial regions 4852' and 4852" and separated by a distance of approximately F.

Figure 48G:
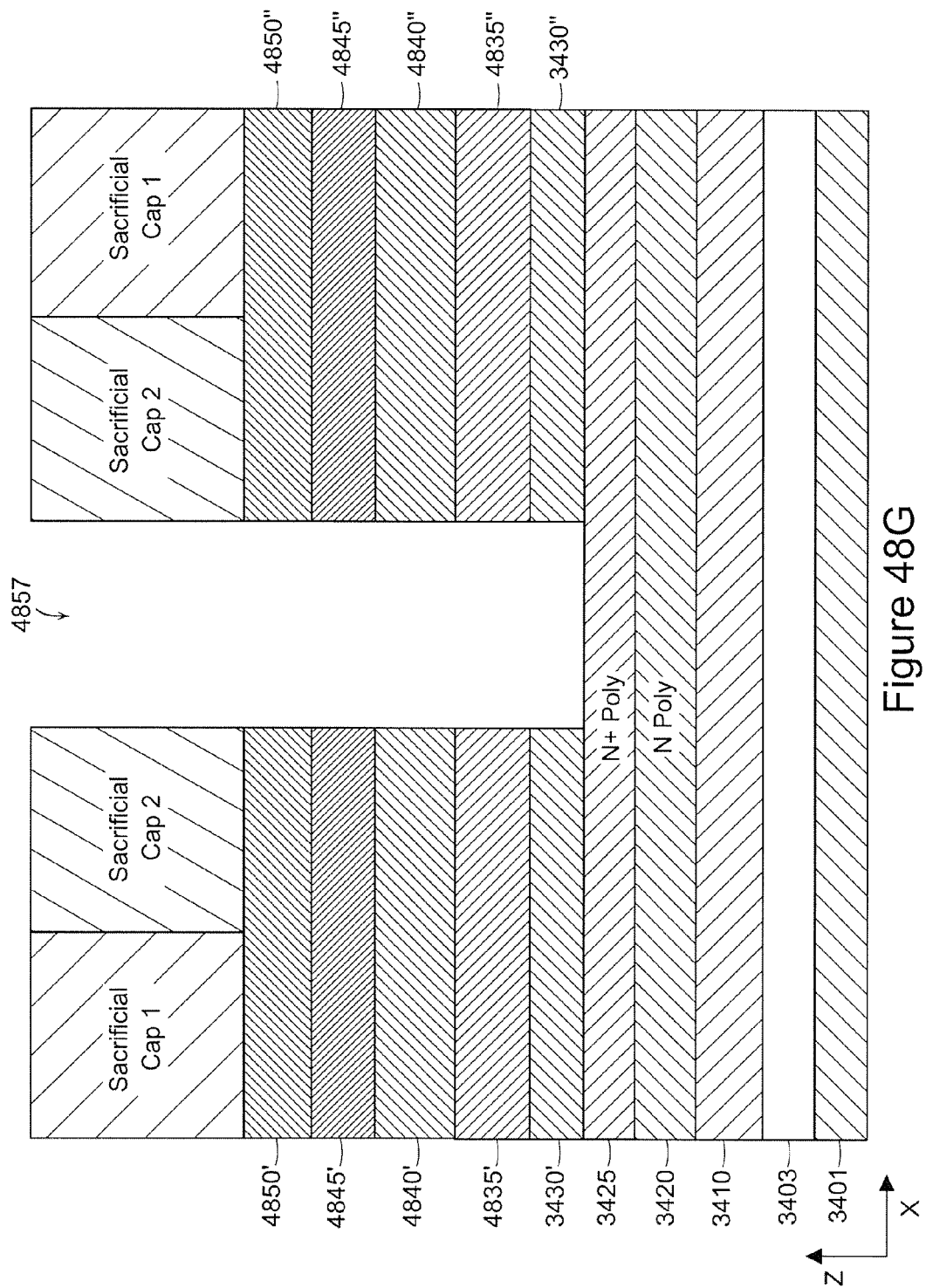

At this point in the process, sacrificial regions 4853' and 4853" may be used as masking layers for directional etching of trenches using methods that define a cell boundary along the X direction for 3D cells using one NV NT diode with an internal cathode-to-nanotube connection per cell. U.S. Pat. No. 5,670,803, the entire contents of which are incorporated herein by reference, to co-inventor Bertin, discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may cut through multiple conductor, semiconductor, and oxide layers as described further above with respect to trench formation in FIGS. 34A-34FF and 36A-36FF. In this example, selective directional trench etch (RIE) removes exposed areas of upper level contact layer 4850 to form upper level contact regions 4850' and 4850"; removes exposed areas of protective insulator layer 4845 to form protective insulator regions 4845' and 4845"; removes exposed areas of nanotube layer 4840 to form nanotube regions 4840' and 4840"; removes exposed areas of insulating layer 4835 to form insulating regions 4835' and 4835"; removes exposed areas of lower level contact layer 3430 to form lower level contact regions 3430' and 3430"; and selective directional etch stops on the top surface of N+ polysilicon layer 3425, forming trench opening 4857 as illustrated in FIG. 48G.

Figure 48H:
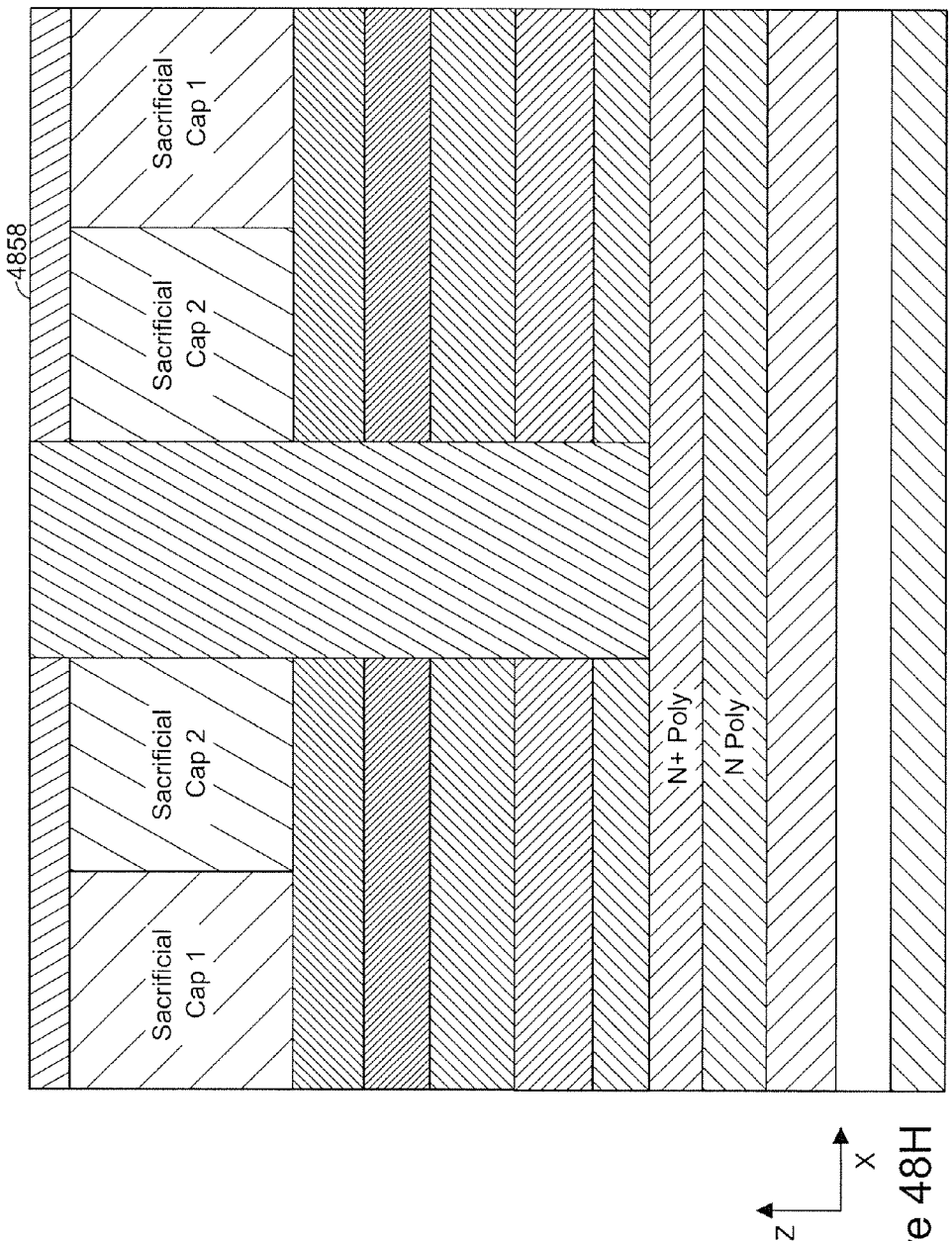

Next, methods such as evaporation or sputtering fill trench 4857 with conductor material 4858 as illustrated in FIG. 48H. Examples of conductor layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Conductor material is formed into sidewall wiring regions as illustrated further below. Because wiring distances are short, the sheet resistance of resulting trench sidewall wiring is not a concern. Nanotube contact resistance values between trench sidewall wiring and the ends of nanotube regions 4840' and 4840", nanotube contact resistance variations, and nanotube contact resistance reliability are useful criteria in selecting conductor type. Nanotube regions of larger cross sectional areas typically result in lower overall contact resistance because of multiple parallel nanotubes. Trench sidewall contacts to both nanotube end regions and lower level metal sidewall regions are used to form a cell cathode-to-NT connection. A nonvolatile nanotube switch with end-only contacts is described further below with respect to FIGS. 49 and 50.

Figure 48I:
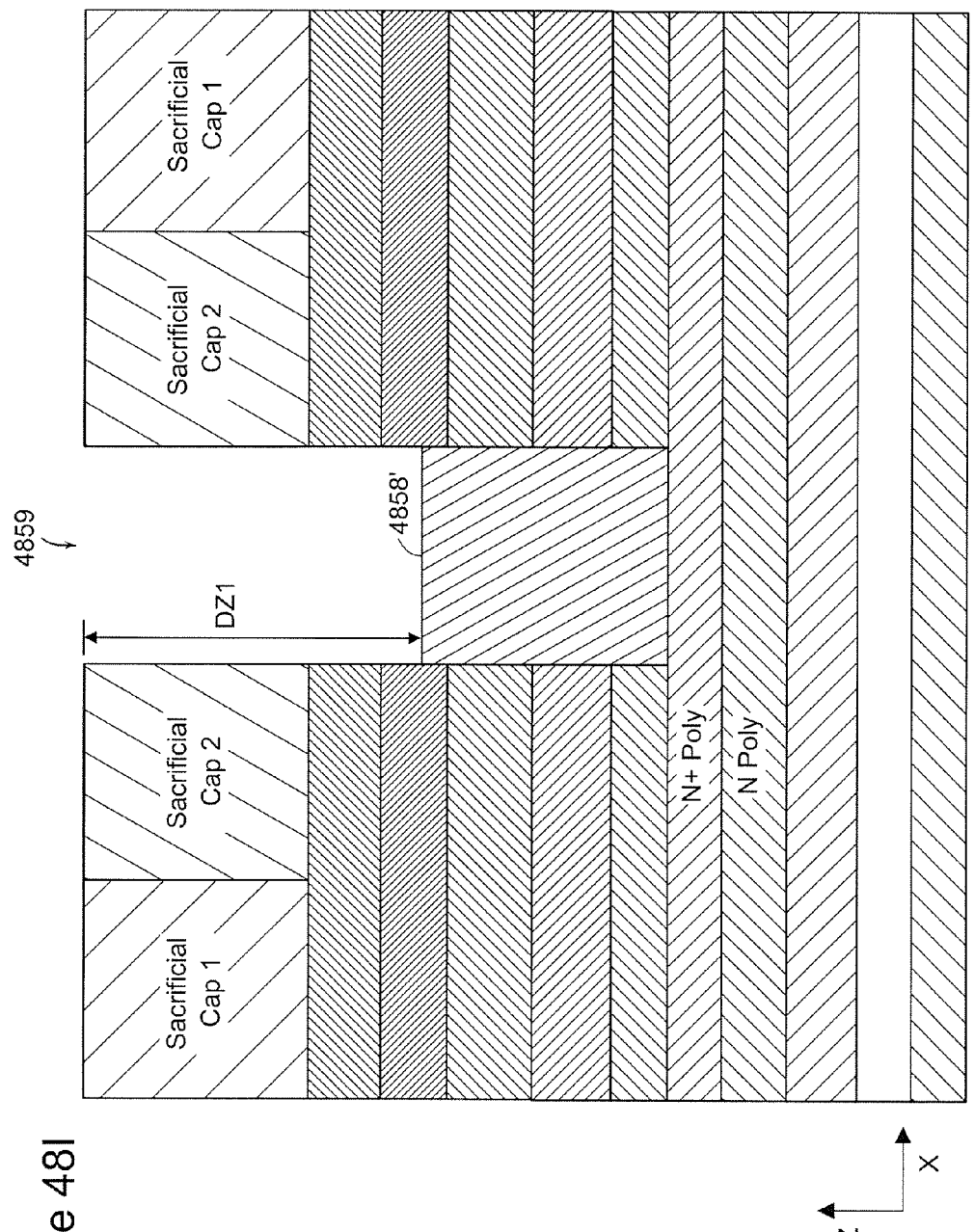

Next, methods selectively directionally etch conductor 4858 to a depth DZ1 below the top surface of sacrificial cap 2 regions 4853' and 4853" as illustrated in FIG. 48I. DZ1 is selected to ensure full contact of nanotube end regions while not contacting upper level contact regions. At this point in the process, the sidewalls of conductor 4858' are in electrical contact with one end of nanotube region 4840' and one end of lower level conductor 3430', and also in electrical contact with one end of nanotube region 4840" and one end of lower level conductor 3430". Two separate sidewall wiring regions can be formed as illustrated further below.

Figure 48J:
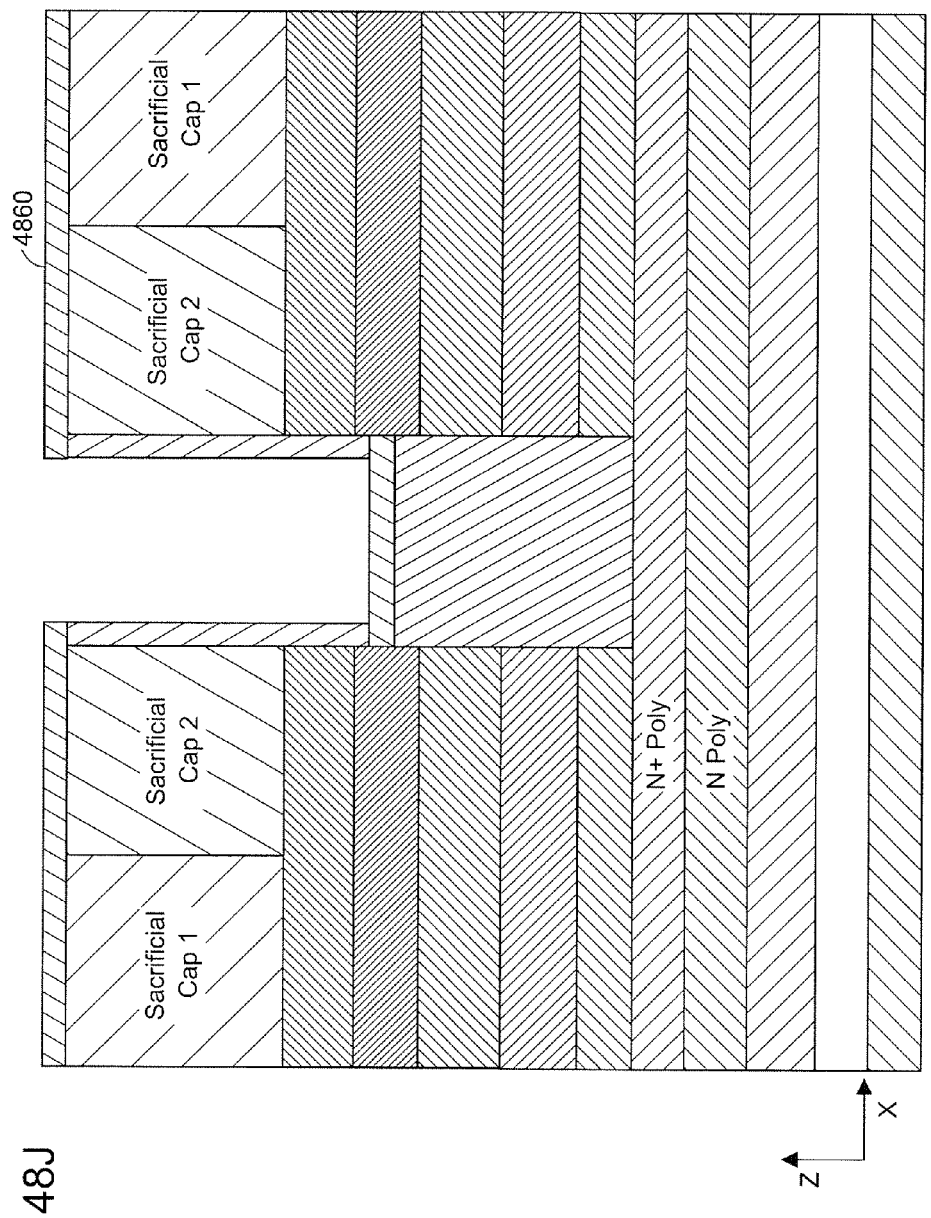

Next, methods deposit a conformal insulator layer 4860 as illustrated in FIG. 48J. Conformal insulator 4860 may be 5 to 50 nm thick, for example, and may be formed from any appropriate known insulator material in the CMOS industry, or packaging industry, for example such as $SiO_2$, $SiN$, $Al_2O_3$, BeO, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example, such as described in U.S. patent application Ser. No. 11/280,786. Insulator 4860 is deposited to a film thickness that determines the thickness of trench sidewall wiring as described further below.

Figure 48K:
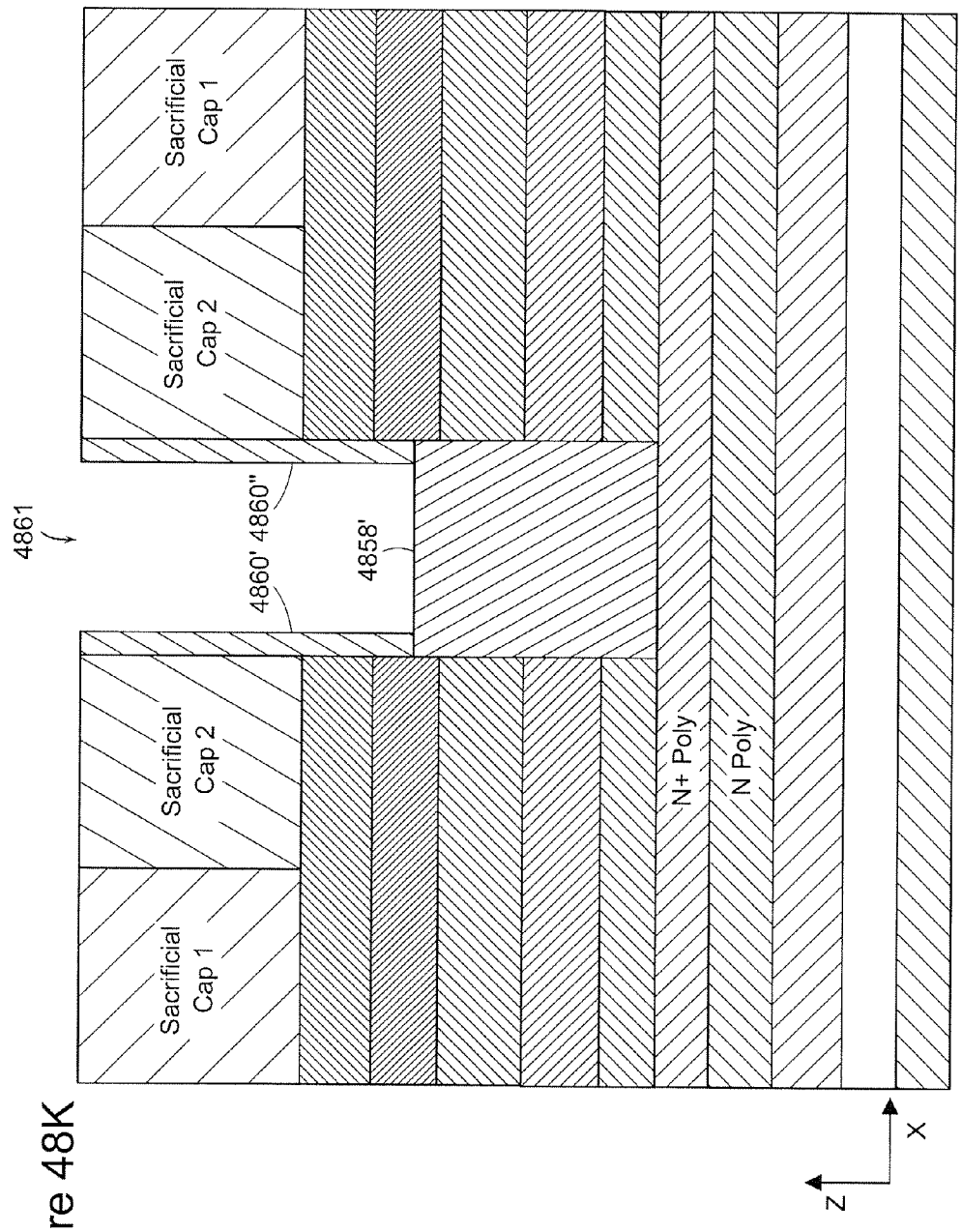

Next, methods directly etch conformal insulator 4860 using RIE and remove conformal layer material on top horizontal surfaces and bottom horizontal surfaces at the bottom of trench opening to form trench opening 4861 with sidewall insulators 4860' and 4860" and conductor 4858' as illustrated in FIG. 48K.

Figure 48L:
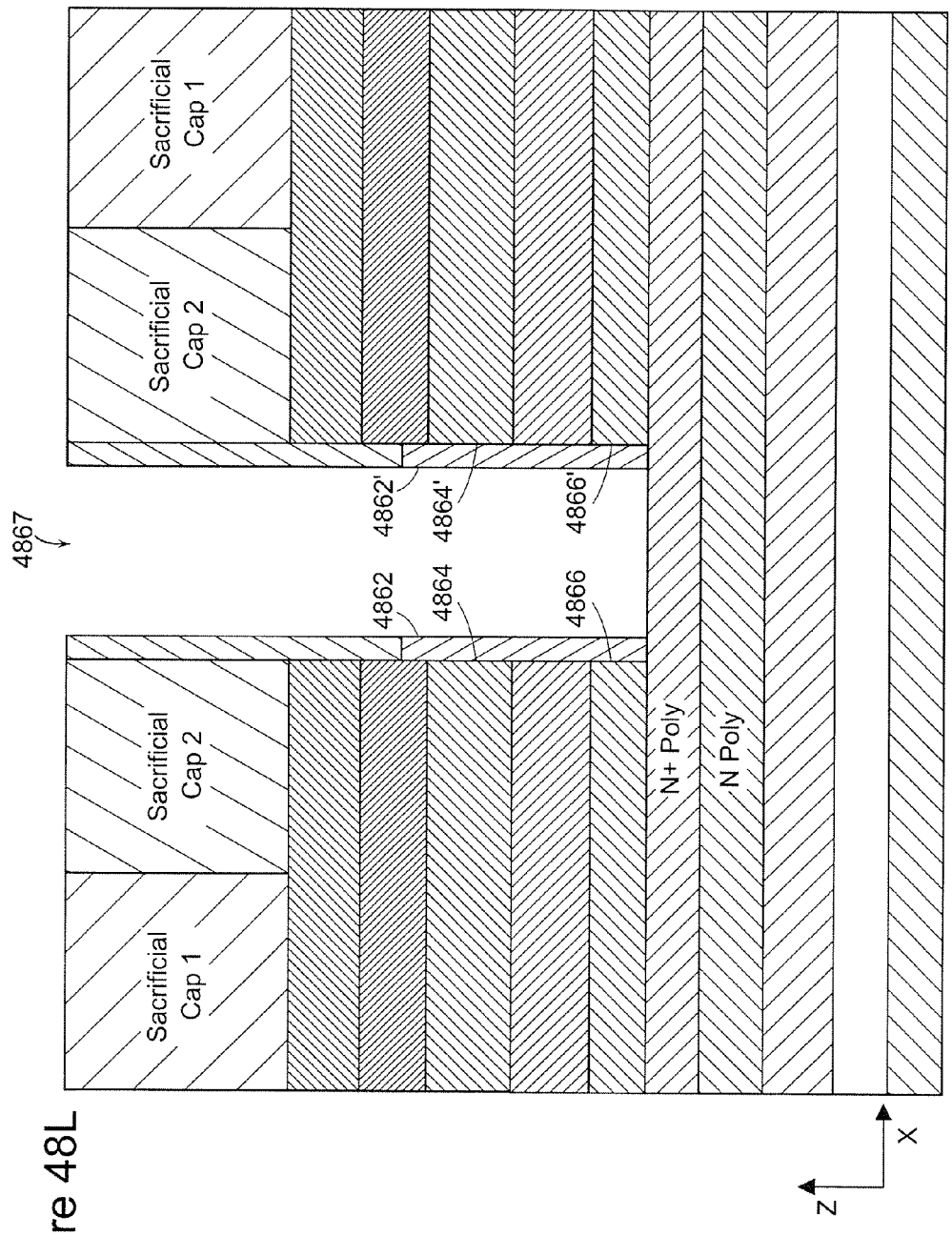

Next, methods directionally etch conductor 4858' using sidewall insulators 4860' and 4860" as masking regions and stop at the top surface of N+ polysilicon layer 3425 as illustrated in FIG. 48L. The thickness of sidewall insulators 4860' and 4860" determine the thickness of trench sidewall wiring regions as illustrated below. Trench sidewall wiring 4862 is formed, which forms contact 4864 between trench sidewall wiring 4862 and one end of nanotube region 4840'. Trench sidewall wiring 4862 also forms contact 4866 with one sidewall (end) of lower level contact 3430'. Trench sidewall wiring 4862' is formed, which forms contact 4864' between trench sidewall wiring 4862' and one end of nanotube region 4840". Trench sidewall wiring 4862' also forms contact 4866' with one sidewall (end) of lower level contact 3430".

Figure 48M:
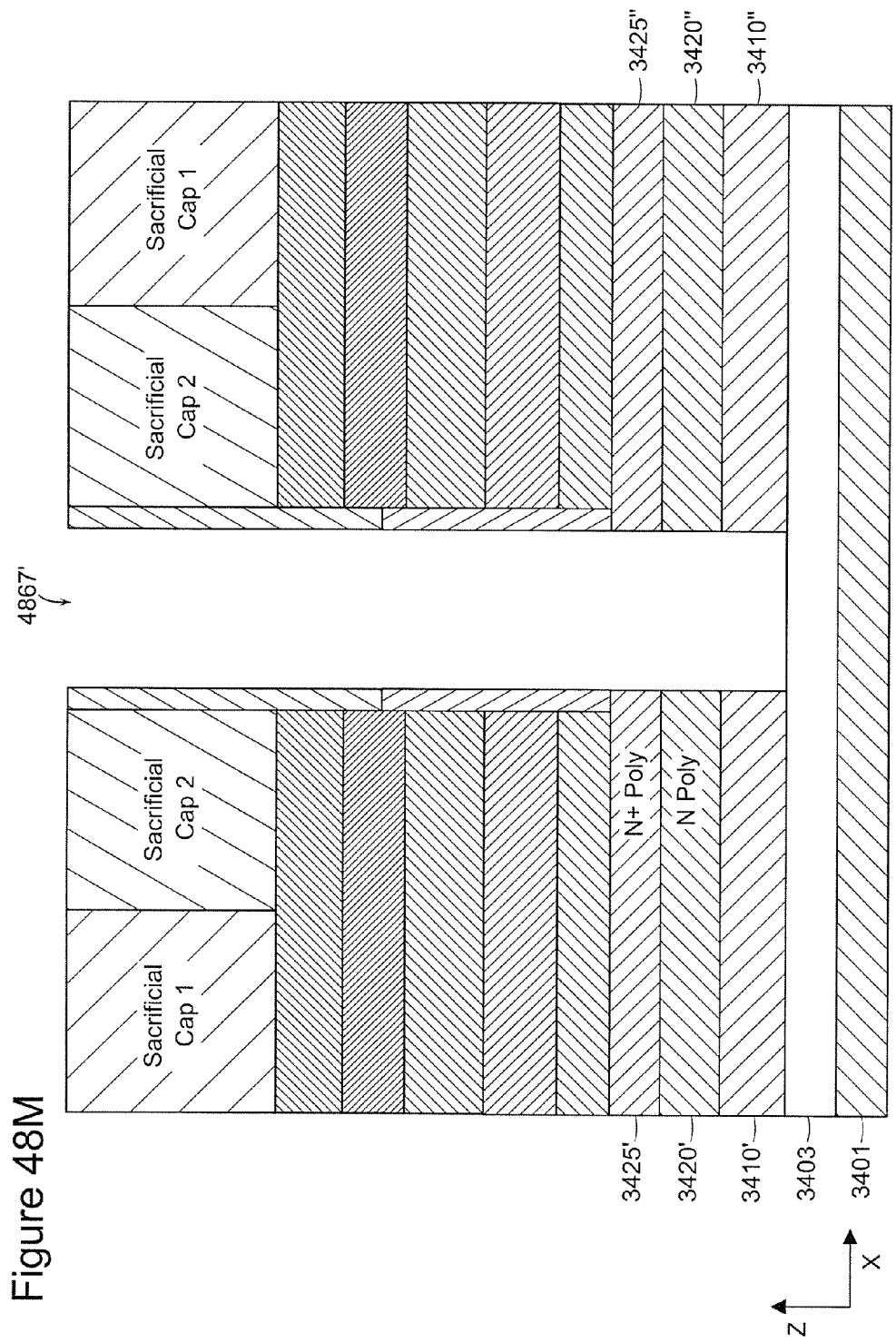

Next, methods directionally etch exposed areas of N+ polysilicon layer 3425 to form N+ polysilicon regions 3425' and 3425"; exposed areas of polysilicon layer 3420 to form N polysilicon regions 3420' and 3420"; and exposed areas of conductor layer 3410 to form conductor regions 3410' and 3410", stopping at the surface of insulator 3403. Sidewall insulators 4860' and 4860" and trench sidewall conductors 4862 and 4862' are used for masking. Directional etching stops at the top surface of insulator 3403 forming trench opening 4867' as illustrated in FIG. 48M.

Figure 48N:
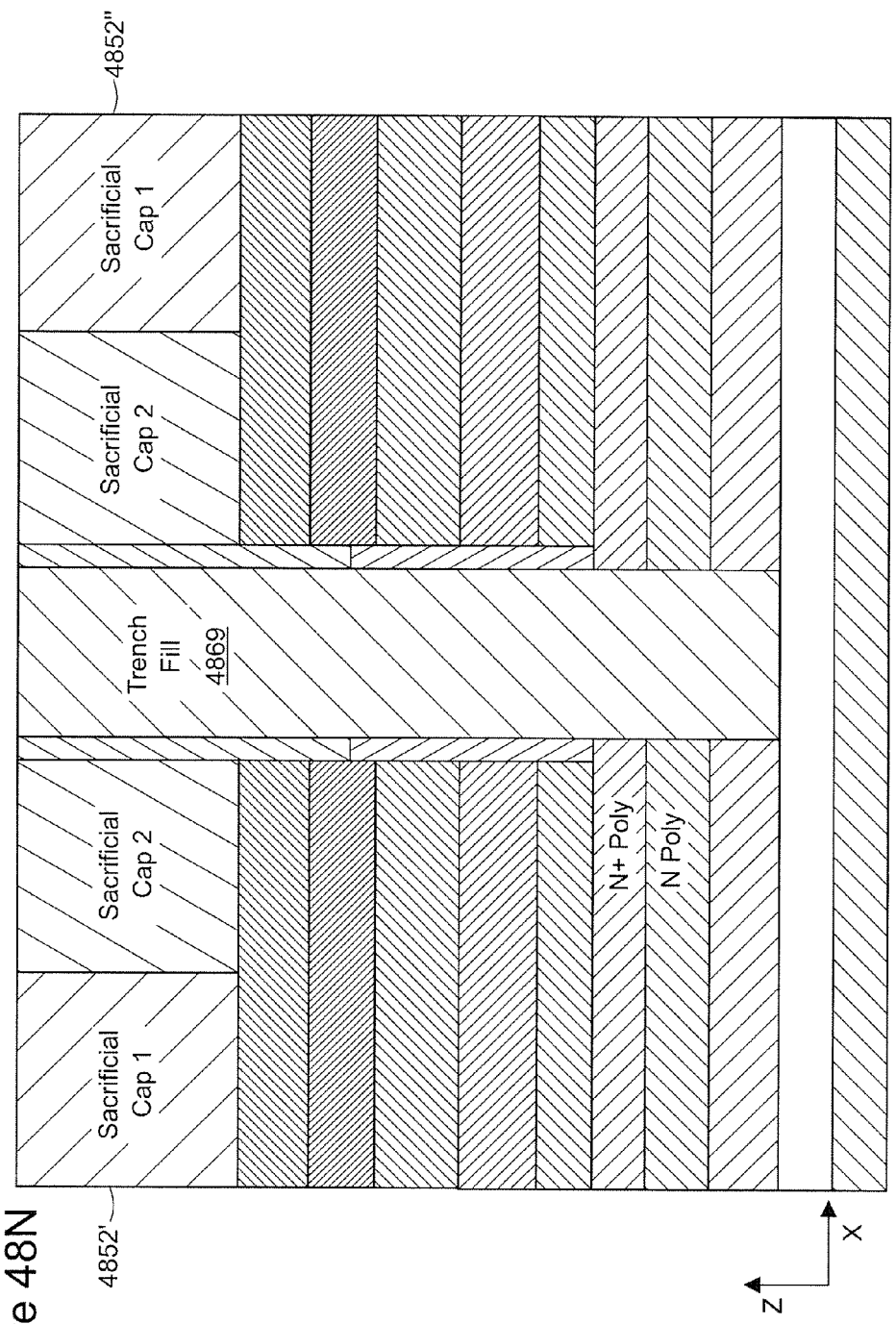

Next methods fill trench opening 4867' with insulator 4869 such as TEOS for example and planarize as illustrated in FIG. 48N.

Figure 48O:
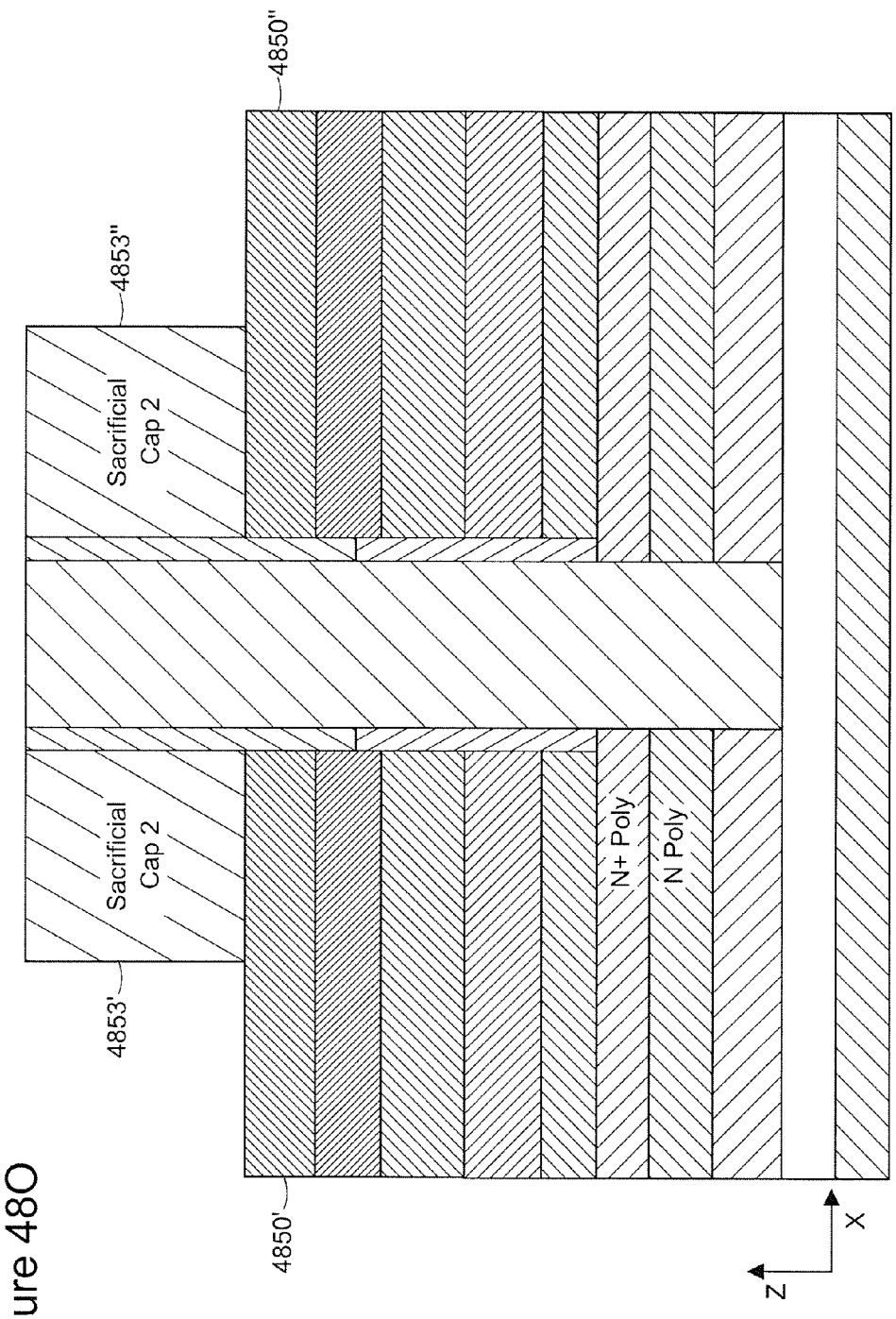

At this point in the process, a second cell boundary is formed along the X direction for 3D memory cells. Methods remove (etch) sacrificial cap layer 1 regions 4852' and 4852"

exposing a portion of the surfaces of upper level contact region 4850' and 4850" as illustrated in FIG. 48O.

Figure 48P:
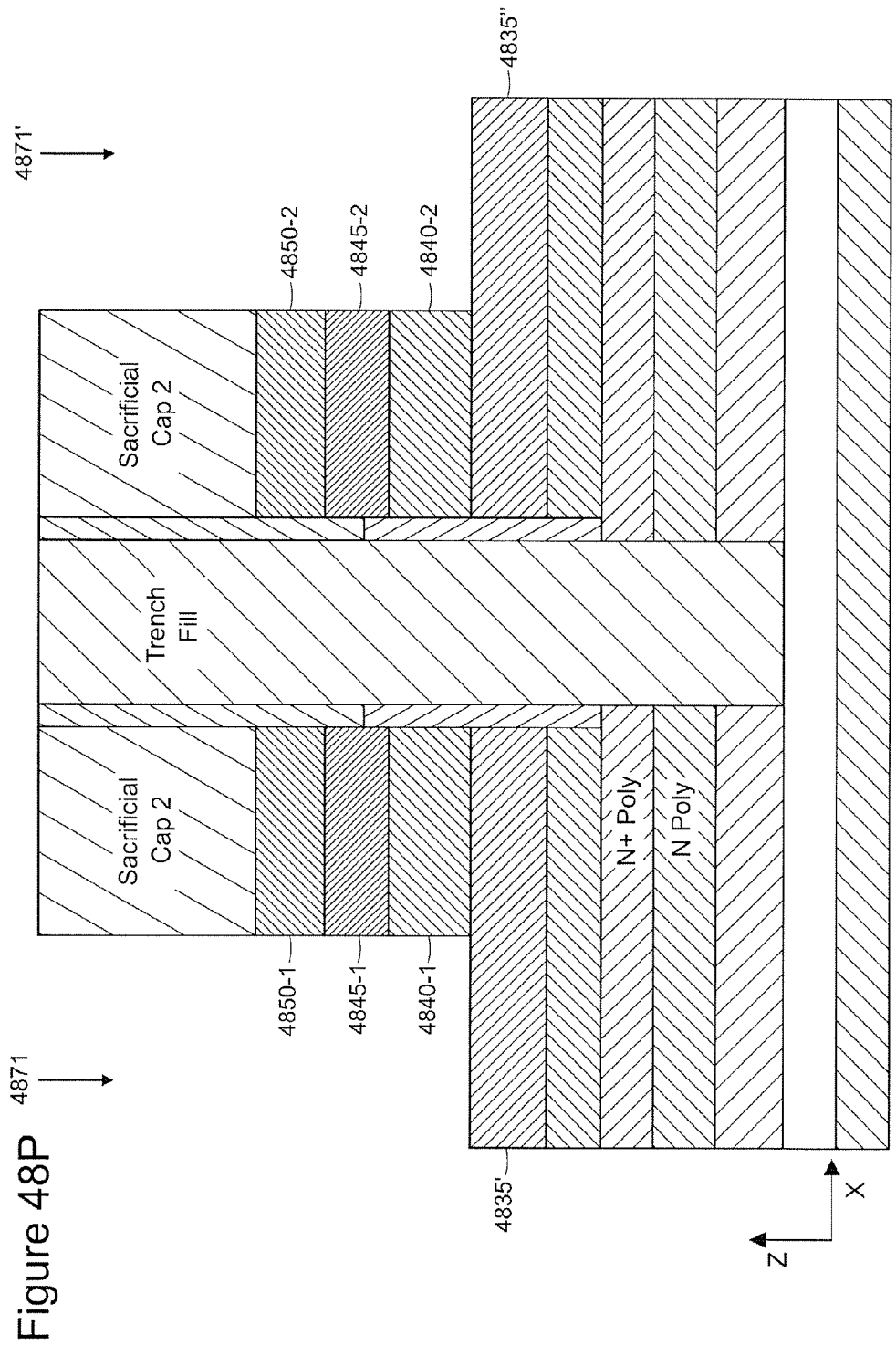

At this point in the process, sacrificial regions 4853' and 4853" may be used as masking layers for directional etching of trenches using methods that define another cell boundary along the X direction for 3D cells using one NV NT diode with an internal cathode-to-nanotube connection per cell as described further above with respect to FIG. 48F. This structure includes vertical sidewalls simultaneously defined by trenches cutting through multiple layers of doped silicon and insulated regions in order avoid multiple alignment steps. Such trench directional selective etch methods may cut through multiple conductor, semiconductor, and oxide layers as described further above with respect to trench formation in FIG. 48F and also in FIGS. 34A-34FF and 36A-36FF. In this example, selective directional trench etch (RIE) removes exposed areas of upper level contact regions 4550' and 4850" to form upper level contacts 4850-1 and 4850-2, respectively; removes exposed areas of protective insulator regions 4845' and 4845" to form protective insulators 4845-1 and 4845-2, respectively; removes exposed areas of nanotube regions 4840' and 4840" to form nanotube elements 4840-1 and 4840-2, respectively; and selective directional etch stops on the top surface of insulator regions 4835' and 4835", forming trench openings 4871 and 4871' as illustrated in FIG. 48P.

Figure 48Q:
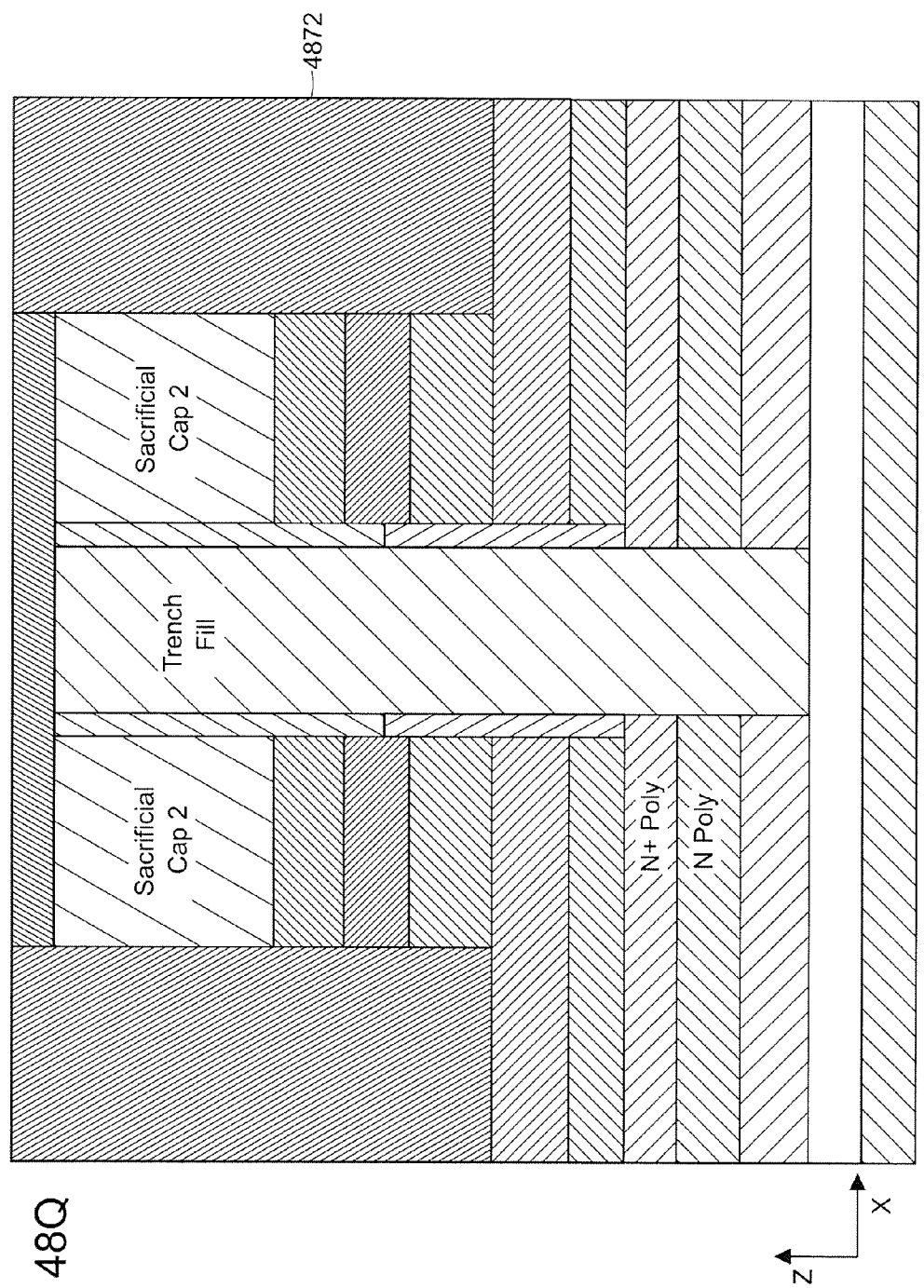

Next, methods such as evaporation or sputtering fill trenches 4871 and 4871' with conductor material 4872 as illustrated in FIG. 48Q, and also described further above with respect to FIG. 48H.

Figure 48R:
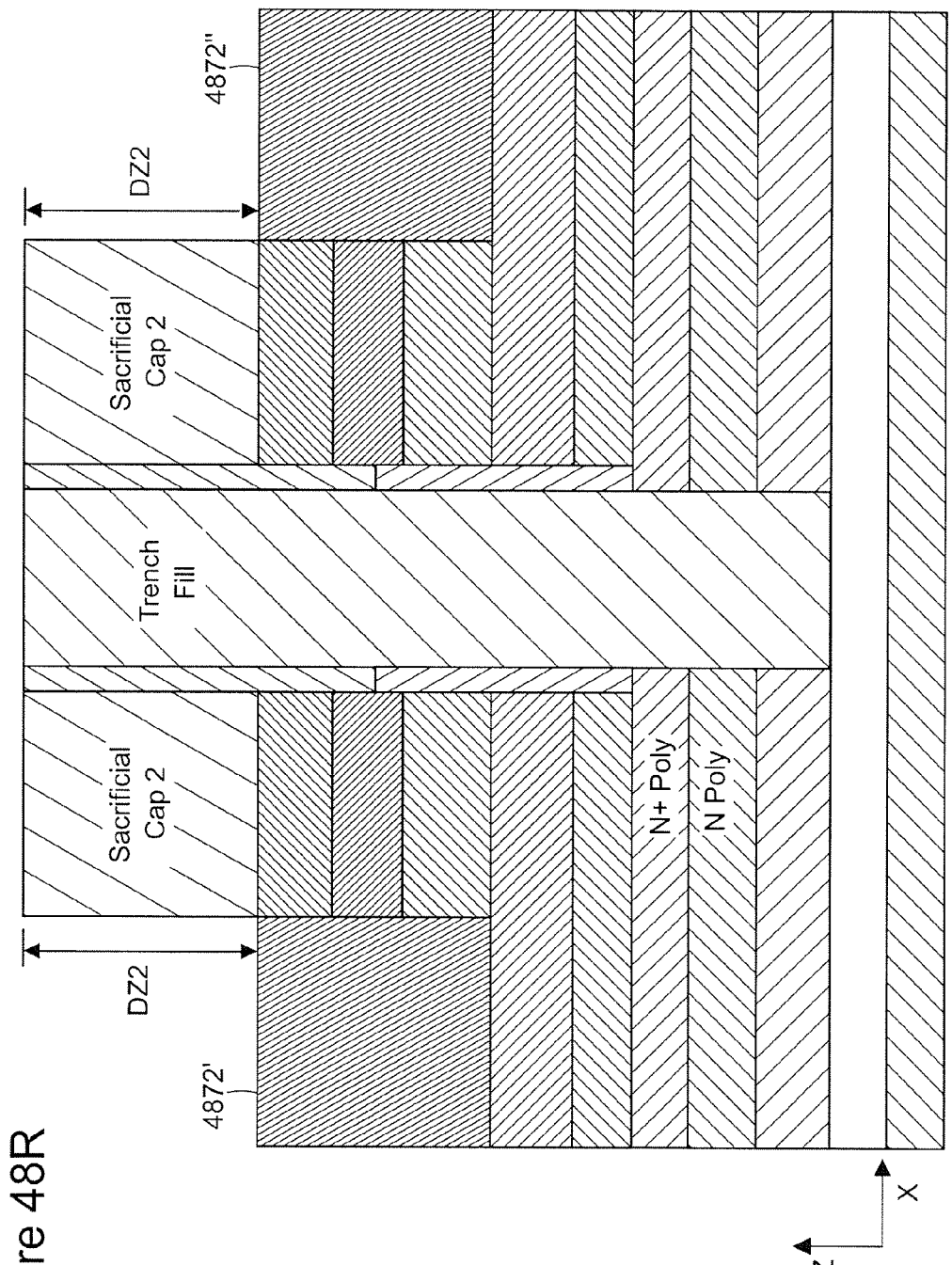

Next, methods selectively directionally etch conductor 4872 to a depth DZ2 below the top surface of sacrificial cap 2 regions 4853' and 4853" as illustrated in FIG. 48R. DZ2 is adjusted to ensure full contact of nanotube end regions while also contacting upper level contacts. At this point in the process, the sidewalls of conductors 4872' and 4872" are in electrical contact with one end of each of nanotube elements 4840-1 and 4840-2, respectively, and one end of upper level conductors 4850-1 and 4850-2, respectively. Sidewall wiring regions can be formed, as illustrated further below.

Figure 48S:
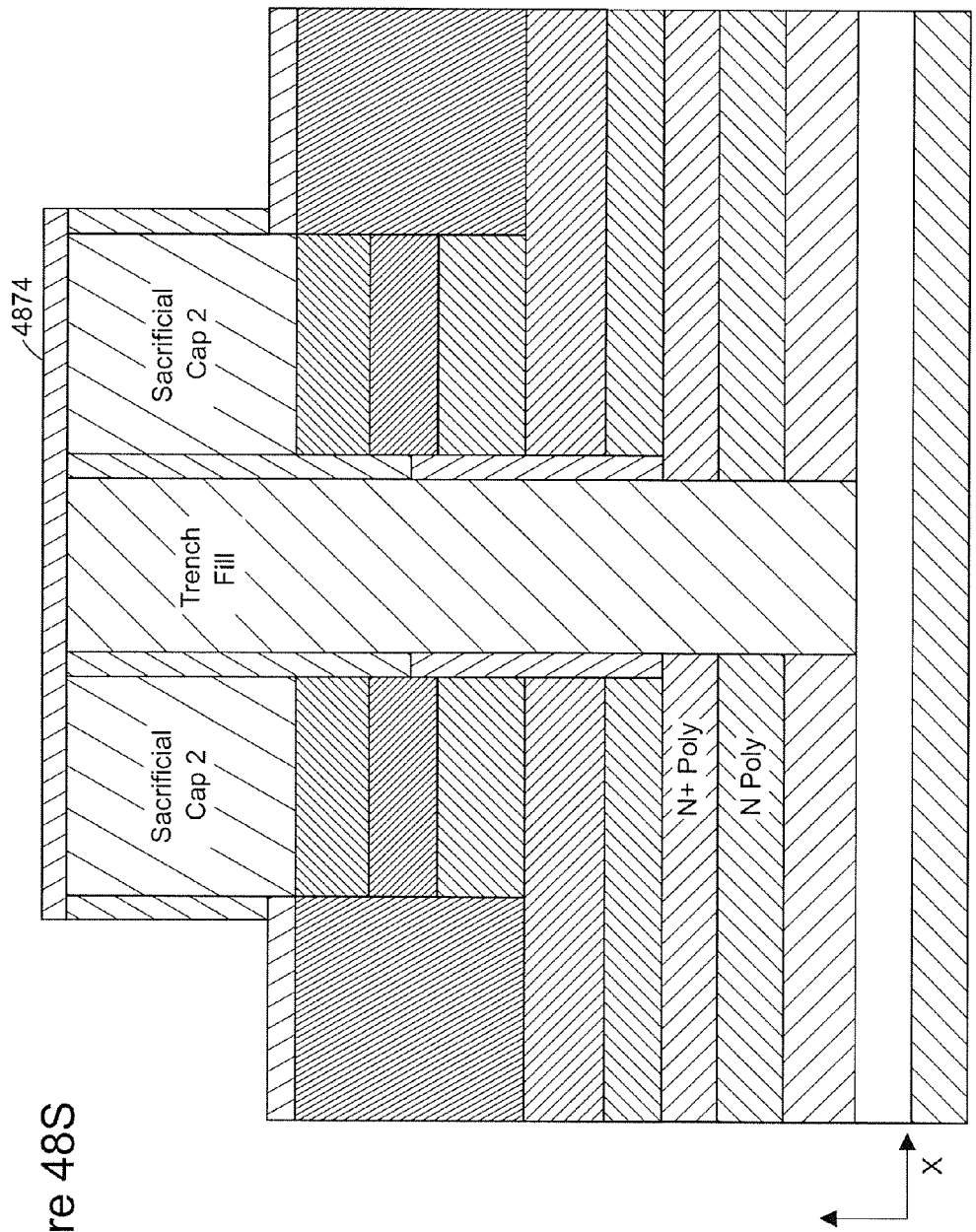

Next, methods deposit a conformal insulator layer 4874 as illustrated in FIG. 48S. Conformal insulator 4874 may be 5 to 50 nm thick, for example, and may be formed from any known insulator material in the CMOS industry, or packaging industry, for example such as $SiO_2$, $SiN$, $Al_2O_3$, $BeO$, polyimide, PSG (phosphosilicate glass), photoresist, PVDF (polyvinylidene fluoride), sputtered glass, epoxy glass, and other dielectric materials and combinations of dielectric materials such as PVDF capped with an $Al_2O_3$ layer, for example, such as described in U.S. patent application Ser. No. 11/280,786. Insulator 4874 is deposited to a film thickness that determines the thickness of trench sidewall wiring as described further below.

Figure 48T:
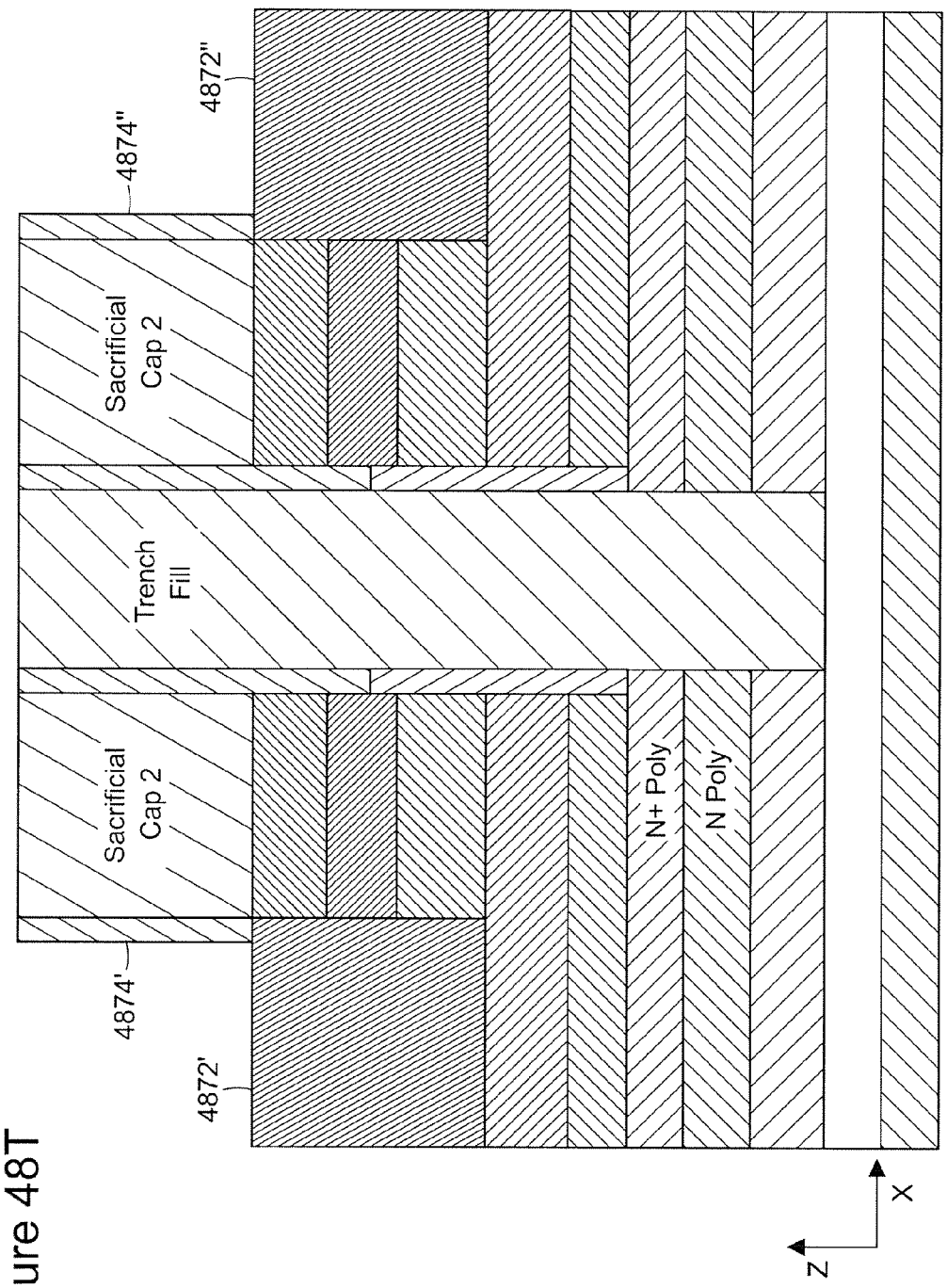

Next, methods directly etch conformal insulator 4874 using RIE and remove conformal layer material on top horizontal surfaces and bottom horizontal surfaces at the bottom of trench opening to form trench openings with sidewall insulators 4874' and 4874" and conductors 4872' and 4872"as illustrated in FIG. 48T.

Figure 48U:
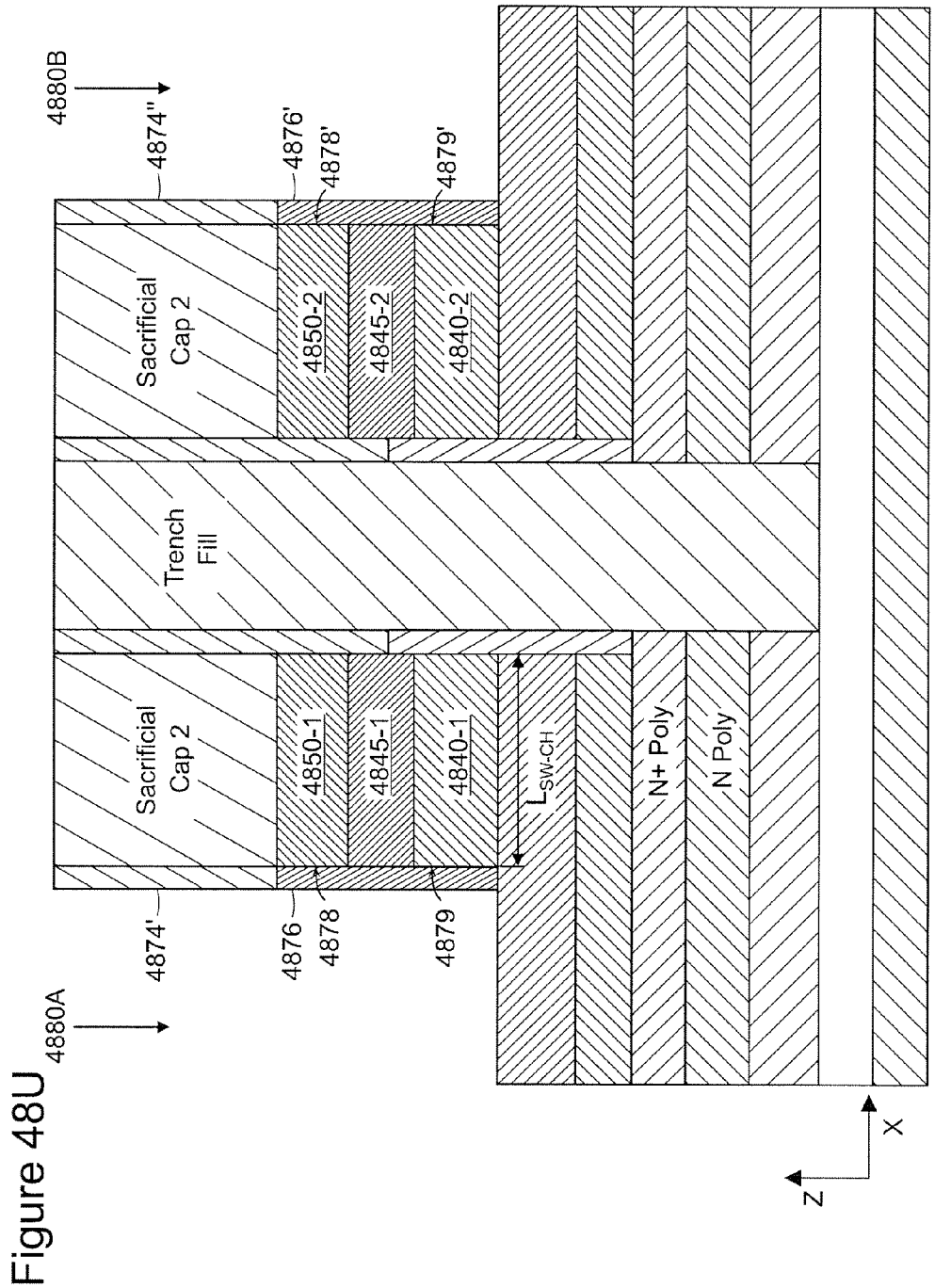

Next, methods directionally etch conductors 4872' and 4872" using sidewall insulators 4874' and 4874", respectively, and corresponding insulators on other sides of trenches 4880A and 4880B, respectively, (not shown) as masking regions and stop at the top surface of insulator regions 4835' and 4835", respectively, as illustrated in FIG. 48U. The thickness of sidewall insulators 4874' and 4874" determine the thickness of trench sidewall wiring regions as illustrated below. Trench sidewall wiring 4876 is formed, which in turn forms contact 4879 between trench sidewall wiring 4876 and one end of nanotube element 4840-1. Trench sidewall wiring 4876 also forms contact 4878 with one sidewall (end) of upper level contact 4850-1. Trench sidewall wiring 4876' is formed, which in turn forms contact 4879' between trench sidewall wiring 4876' and one end of nanotube element 4840-2. Trench sidewall wiring 4876' also forms contact 4878' with one sidewall (end) of upper level contact 4850-2.

Figure 48V:
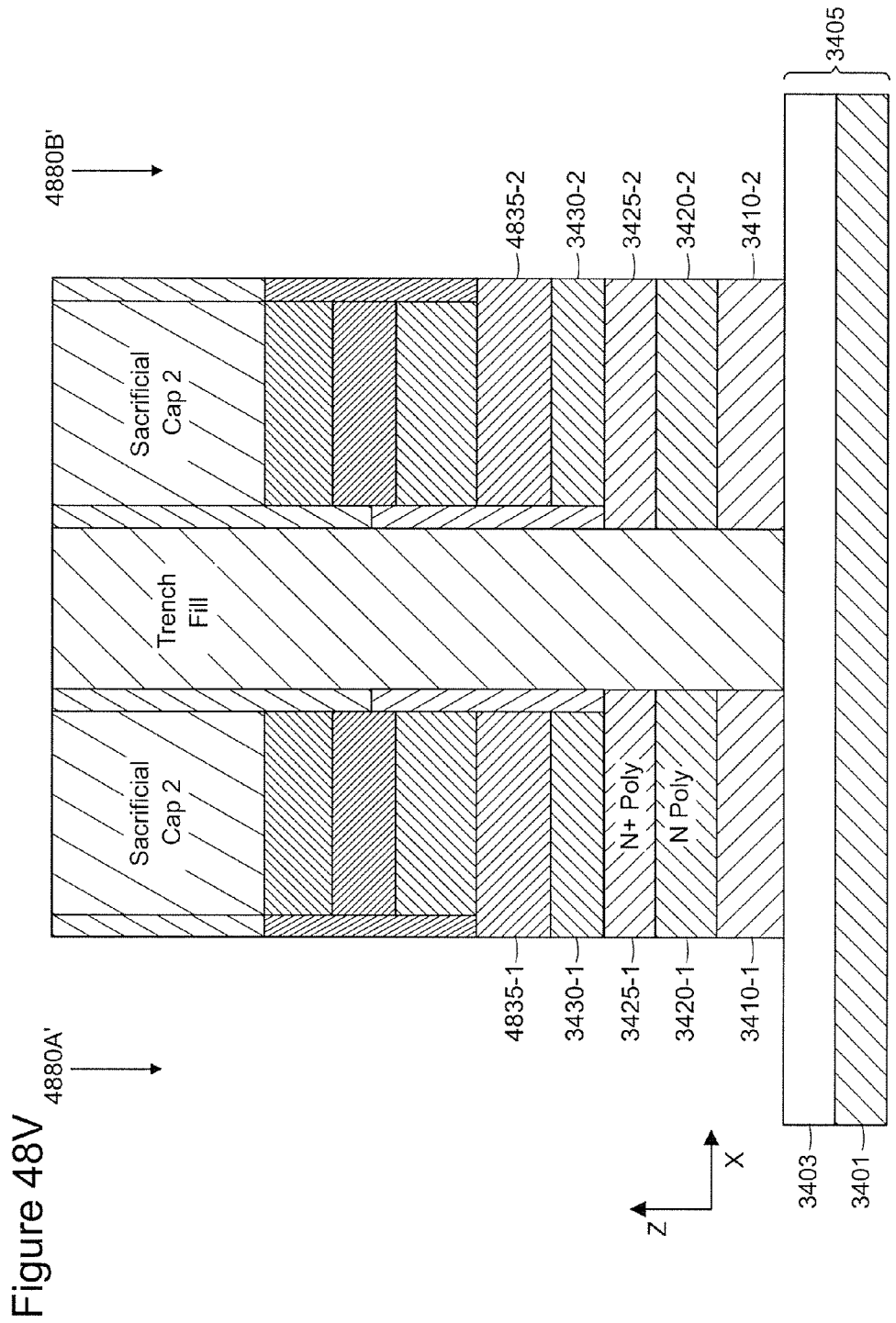

Next, methods directionally etch exposed areas of insulator regions 4835' and 4835" to form insulators 4835-1 and 4835-2, respectively; lower level contact regions 3430' and 3430" to form lower level contacts 3430-1 and 3430-2, respectively; N+ polysilicon regions 3425' and 3425" to form N+ polysilicon regions 3425-1 and 3425-2, respectively; exposed areas of polysilicon regions 3420' and 3420" to form N polysilicon regions 3420-1 and 3420-2; and exposed areas of conductor regions 3410' and 3410" to form conductors 3410-1 and 3410-2, respectively, stopping at the surface of insulator 3403. Sidewall insulators 4874' and 4874" and trench sidewall conductors 4876 and 4876' are used for masking. Directional etching stops at the top surface of insulator 3403 forming trench openings 4880A' and 4880B' as illustrated in FIG. 48V.

Figure 48W:
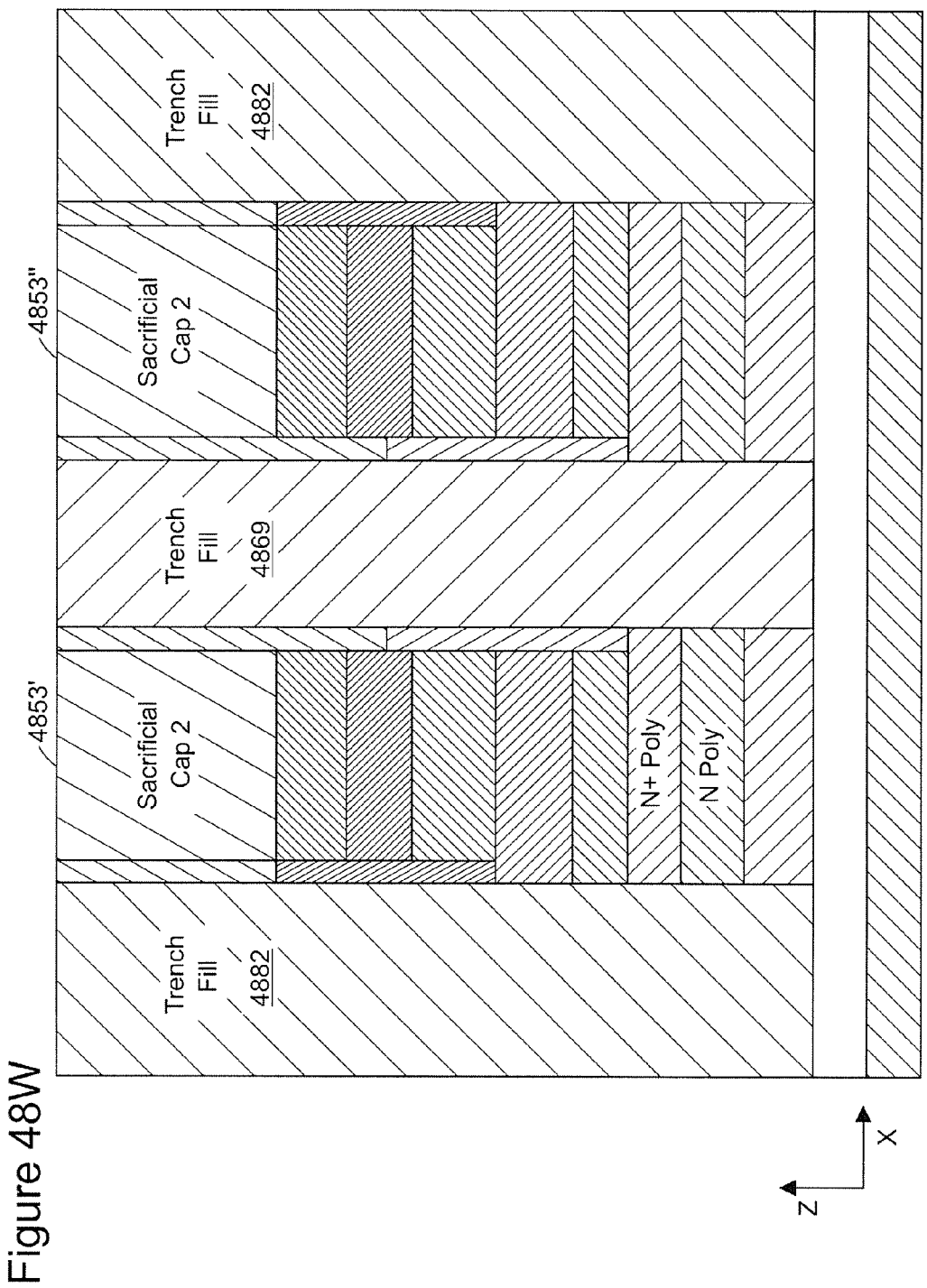

Next methods fill trench openings 4880A' and 4880B' with insulator 4882 such as TEOS for example and planarize as illustrated in FIG. 48W.

Figure 48X:
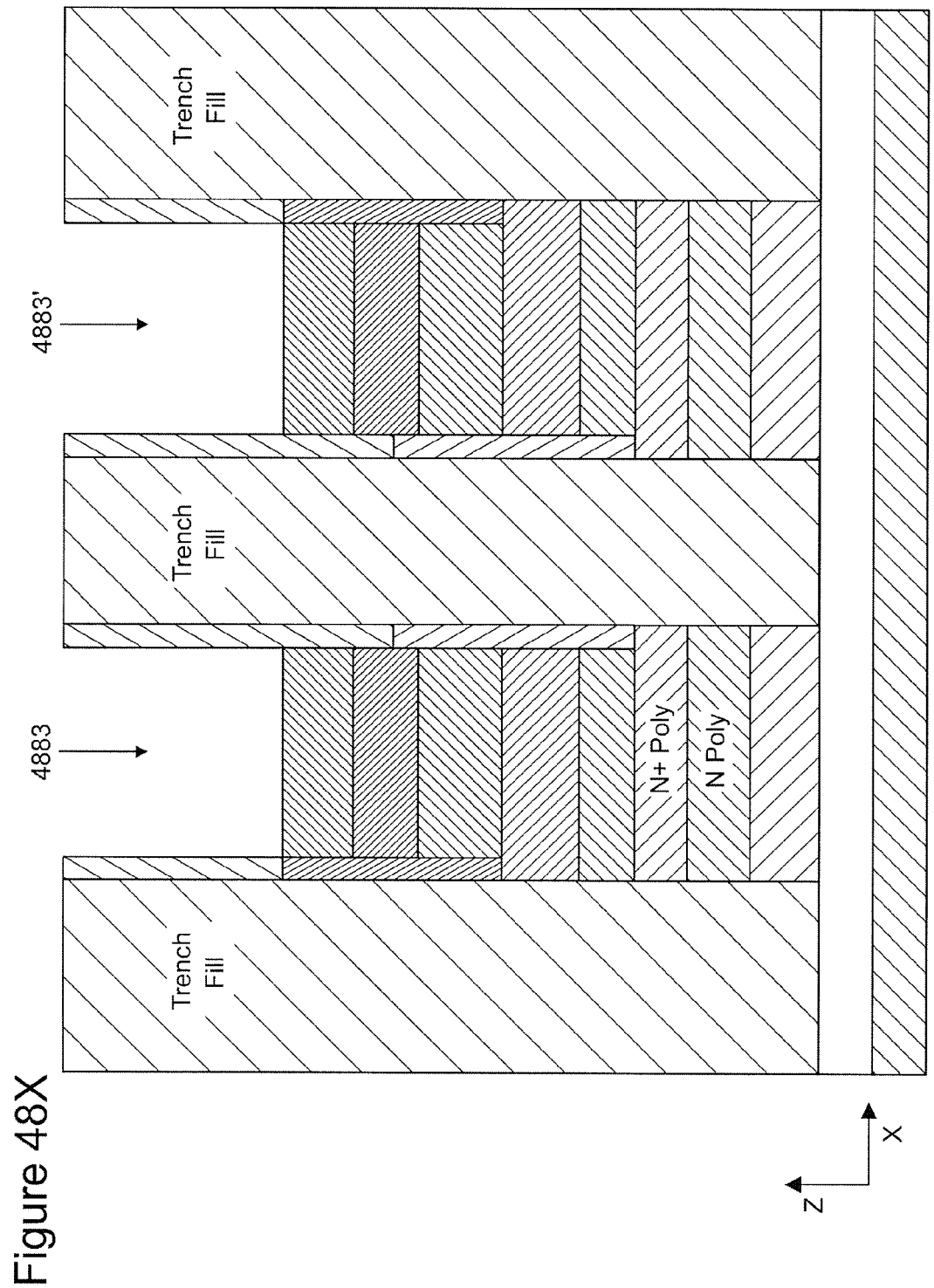

Next, methods remove (etch) sacrificial cap 2 regions 4853' and 4853" to form openings 4883 and 4883', respectively, exposing the top surfaces of upper level contacts 5850-1 and 5850-2, respectively, as illustrated in FIG. 48X.

Figure 48Y:
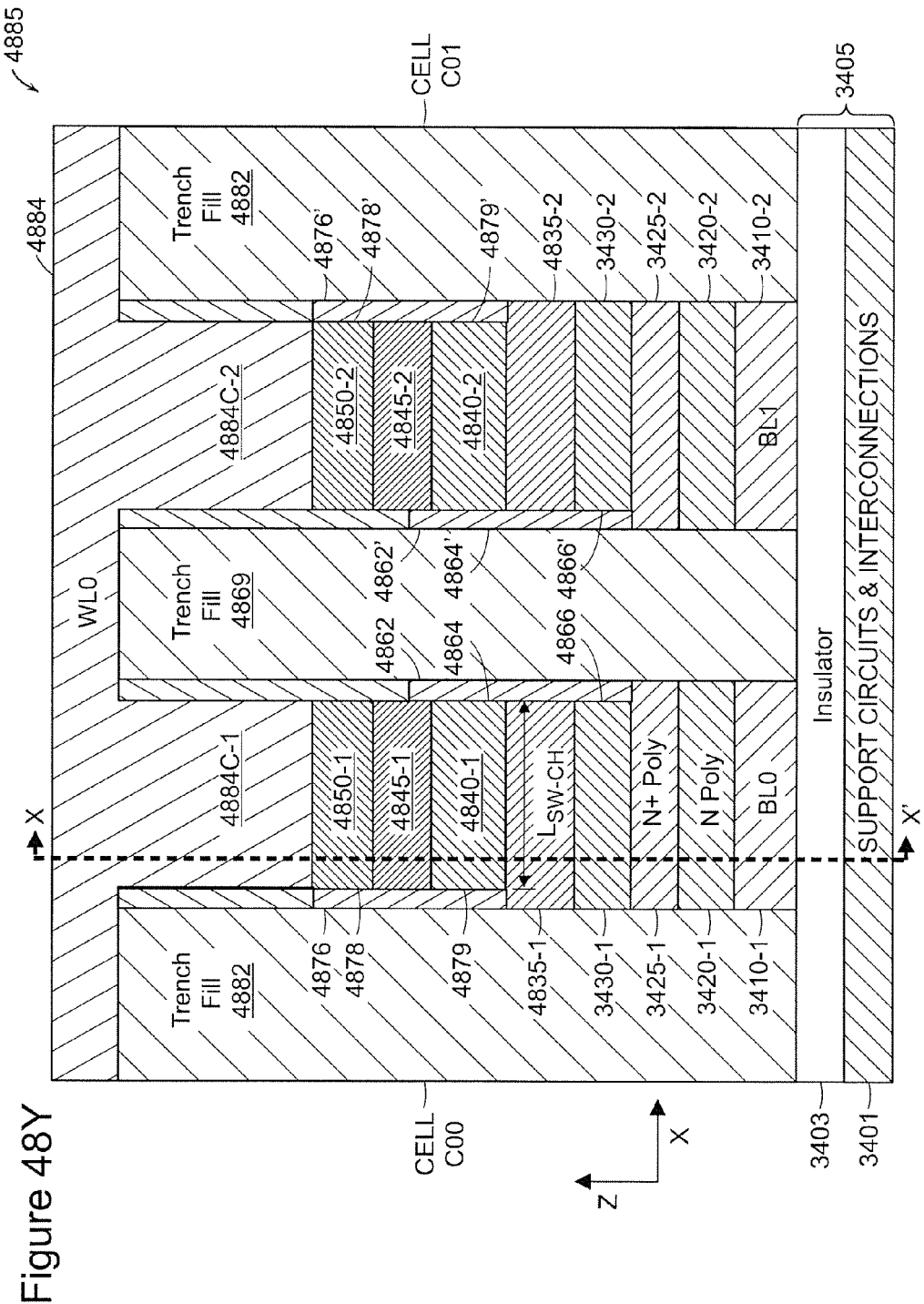

Next, methods deposit and planarize a conductor layer 4884 that also forms contacts 4884C-1 and 4884C-2 that contact upper level contacts 4850-1 and 4850-2, respectively, as illustrated in FIG. 48Y.

Next, conductor layer 4884 is patterned to form word lines orthogonal to conductors (bit lines) 3410-1 and 3410-2 as illustrated further below.

At this point in the process, cross section 4885 illustrated in FIG. 48Y has been fabricated, and includes NV NT diode cell dimensions of F (where F is a minimum feature size) and cell periodicity 2F defined in the X direction as well as corresponding array bit lines. Next, cell dimensions used to define dimensions in the Y direction are formed by directional trench etch processes similar to those described further above with respect to cross section 4885 illustrated in FIG. 48Y. Trenches used to define dimensions in the Y direction are approximately orthogonal to trenches used to define dimensions in the X direction. In this example, cell characteristics in the Y direction do not require self alignment techniques described further above with respect to X direction dimensions. Cross sections of structures in the Y (bit line) direction are illustrated with respect to cross section X-X' illustrated in FIG. 48Y.

Figure 48Z:
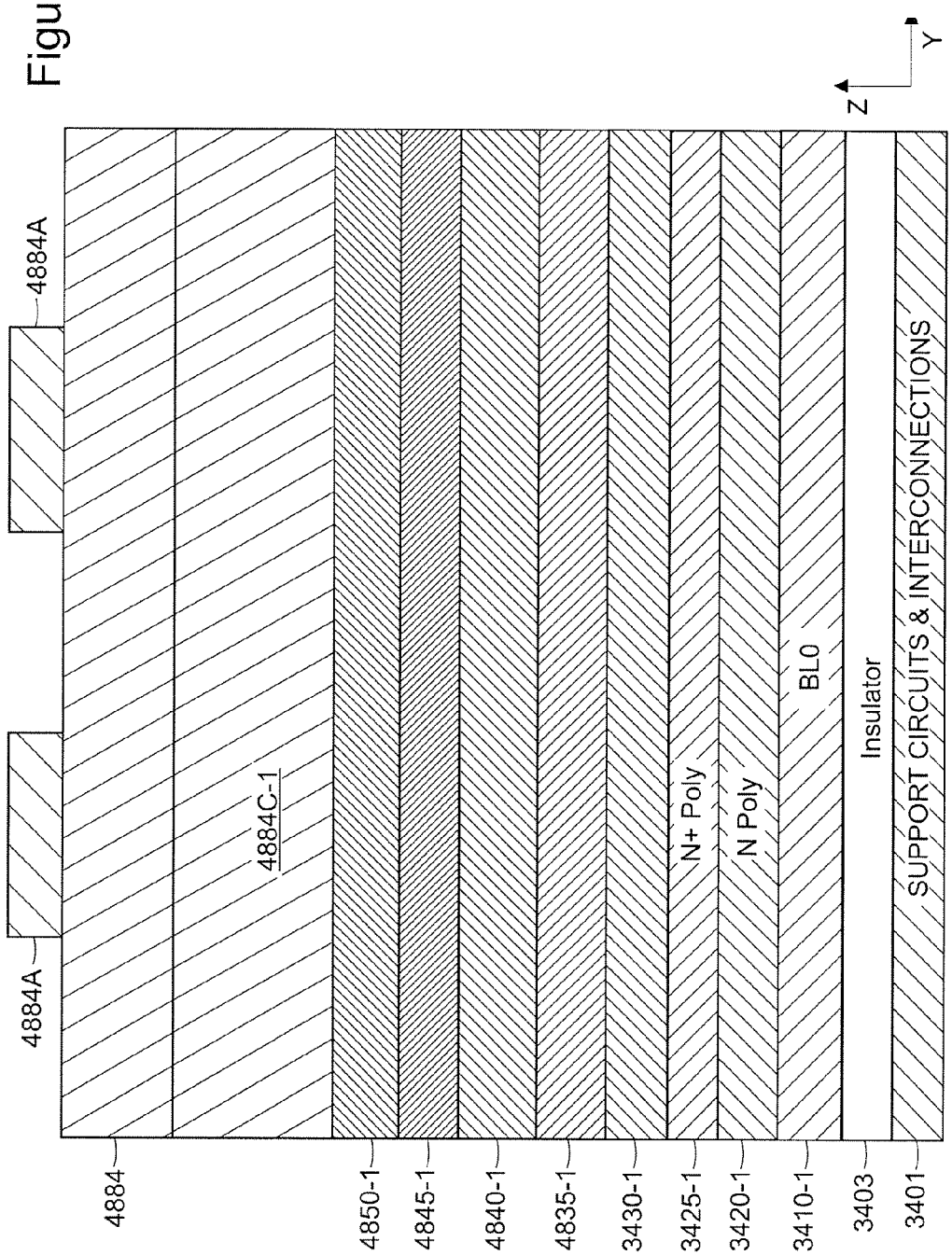
Figure 48A:
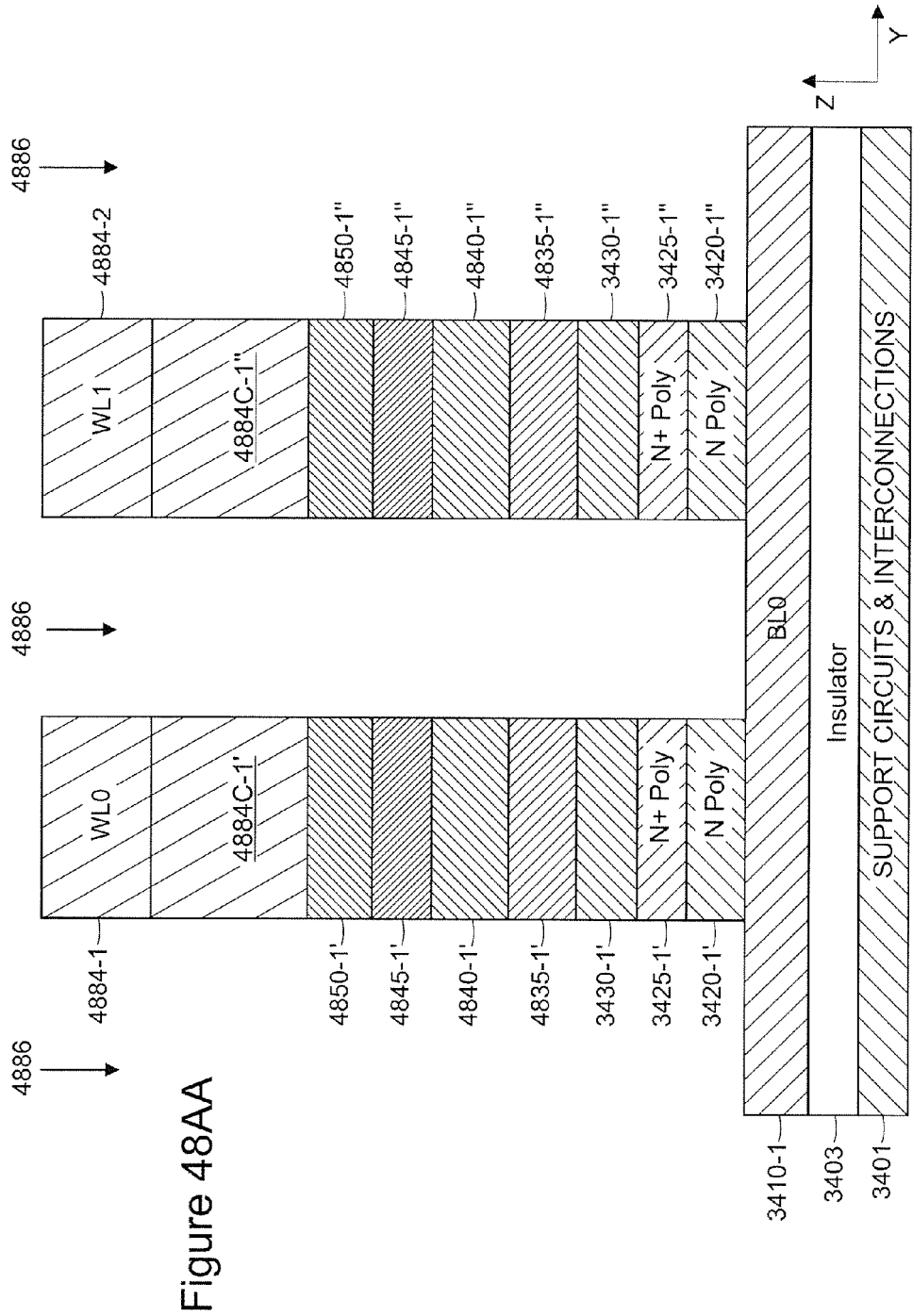
Figure 48B:
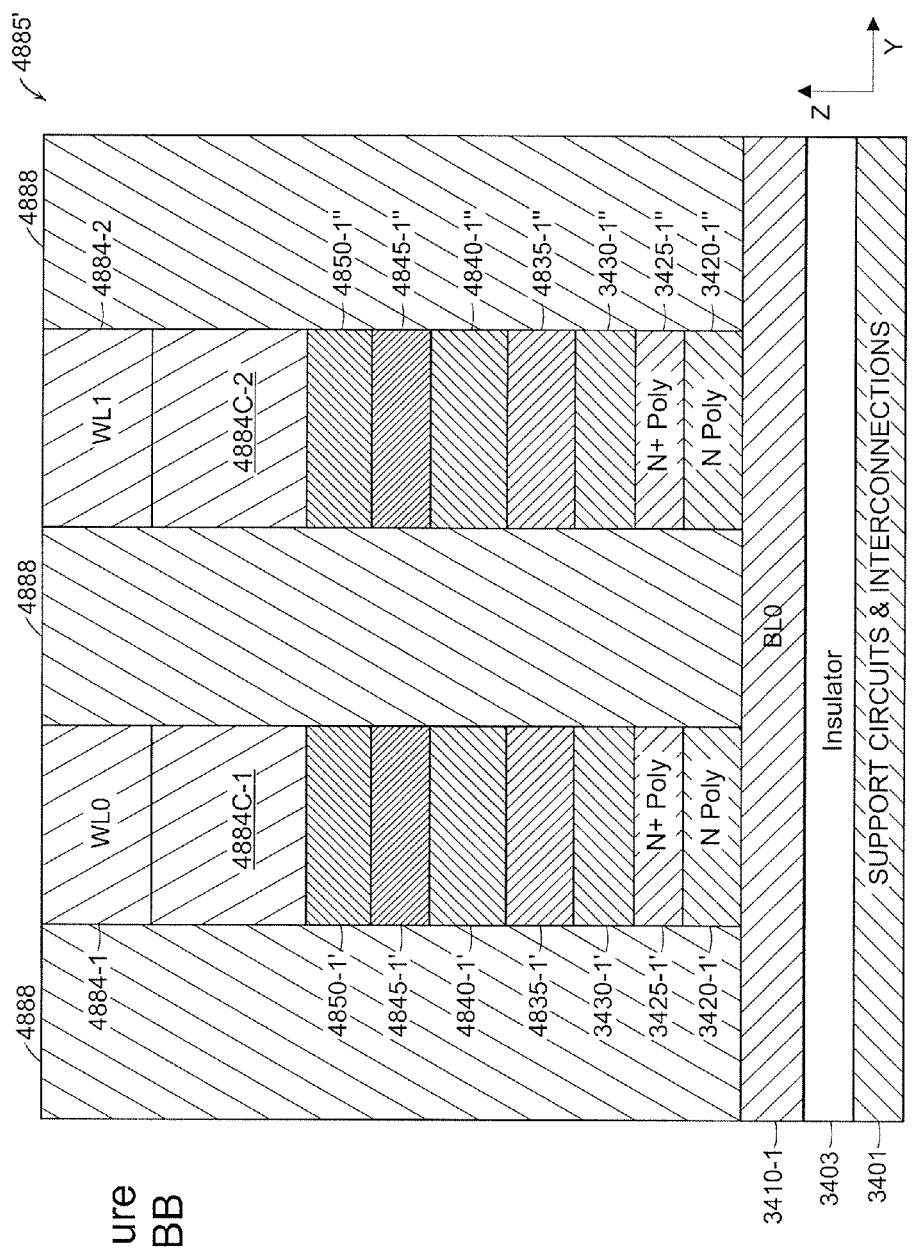

Next, methods deposit and pattern a masking layer such as masking layer 4884A on the surface of word line layer 4884 as illustrated in FIG. 48Z. Masking layer 4884A may be non-critically aligned to alignment marks in planar insulator 3403. Openings in mask layer 4884A determine the location of trench directional etch regions, in this case trenches are approximately orthogonal to bit lines such as conductor 3410-1 (BL0).

At this point in the process, openings in masking layer 4884A may be used for directional etching of trenches using methods that define new cell boundaries along the Y direction for 3D cells using one NV NT diode with an internal cathode-to-nanotube connection per cell. All trenches and corresponding cell boundaries may be formed simultaneously. This structure includes vertical sidewalls simultaneously defined by trenches. Such trench directional selective etch methods may cut through multiple conductor, semiconductor, and oxide layers as described further below and also described further above with respect to trench formation in FIGS. 48F to 48M and also in FIGS. 34A-34FF and 36A-36FF. In this example, selective directional trench etch (RIE) removes exposed areas of conductor layer 4884 to form word line conductors 4884-1 (WL0) and 4884-2 (WL1); exposed areas of contact region 4884C-1 to form contacts 4884C-1' and 4884C-1"; exposed areas of upper level contact regions 4850-1 and 4850-2 to form upper level contacts 4850-1' and 4850-1", removes exposed areas of protective insulator regions 4845-1 and 4845-2 to form protective insulators 4845-1' and 4845-1"; removes exposed areas of nanotube regions 4840-1 and 4840-2 to form nanotube elements 4840-1' and 4840-1"; removes exposed areas of insulator regions 4835-1 and 4835-2 to form insulators 4835-1' and 4835-1"; removes exposed areas of lower level contact regions 3430-1 and 3430-2 to form lower level contacts 3430-1' and 3430-1"; removes exposed areas of N+ polysilicon regions 3425-1 and 3425-2 to form N+ polysilicon regions 3425-1' and 3425-1"; and removes exposed areas of polysilicon regions 3420-1 and 3420-2 to form N polysilicon regions 3420-1' and 3420-1". Directional etching stops at the top surface of conductor 3410-1 forming trench openings 4886 as illustrated in FIG. 48AA.

Then methods fill trenches 4886 with an insulator 4888 such as TEOS, for example, and planarize the surface as illustrated by cross section 4885' in FIG. 48BB. Cross section 4885' illustrated in FIG. 48BB and cross section 4885 illustrated in FIG. 48Y are two cross sectional representations of the same 3D nonvolatile memory array with cells formed with NV NT diode having vertically oriented steering (select) diodes and horizontally-oriented nanotube elements contacted on each end by trench sidewall wiring. Cross section 4885 illustrated in FIG. 48Y corresponds to cross section 4785 illustrated in FIG. 47.

At this point in the process, cross sections 4885 and 4885' illustrated in FIGS. 48Y and 48BB, respectively, have been fabricated, nonvolatile nanotube element horizontally-oriented channel length $L_{SW-CH}$ are defined, including overall NV NT diode cell dimensions of 1F in the X direction and 1F in the Y direction, as well as corresponding bit and word array lines. Cross section 4885 is a cross section of two adjacent cathode-to-nanotube type nonvolatile nanotube diode-based cells in the X direction and cross section 4885' is a cross section of two adjacent cathode-to-nanotube type nonvolatile nanotube diode-based cells in the Y direction. Cross sections 4885 and 4885' include corresponding word line and bit line array lines. The nonvolatile nanotube diodes form the steering and storage elements in each cell illustrated in cross sections 4885 and 4885', and each cell having 1F by 1F dimensions. The spacing between adjacent cells is 1F so the cell periodicity is 2F in both the X and Y directions. Therefore one bit occupies an area of $4F^2$. At the 45 nm technology node, the cell area is less than 0.01 um$^2$.

Nonvolatile Nanotube Switch with Channel-Region End-Contacted Nanotube Elements

FIG. 49 illustrates NV NT Switch 4900 including a patterned nanotube element 4910 on insulator 4920 which is supported by substrate 4930. Patterned protective insulator 4935 is in contact with the top surface of nanotube element 4910. Examples of nanotube element 4910 and protective insulator 4935 are described further above with respect to FIGS. 48A-48BB. Terminals (conductor elements) 4940 and 4950 are deposited adjacent to end-regions of nanotube element 4910 and form terminal-to-nanotube end-region contacts 4960 and 4965, respectively. Examples of end-region contact to nanotube elements are described further above with respect to FIGS. 48L and 48U. The nonvolatile nanotube switch channel length $L_{SW-CH}$ is the separation between nanotube element end-region contacts 4960 and 4965. Substrate 4930 may be an insulator such as ceramic or glass, a semiconductor, or an organic rigid or flexible substrate. Insulator 4920 may be $SiO_2$, $SiN$, $Al_2O_3$, or another insulator material. Terminals (conductor elements) 4940 and 4950 may be formed using a variety of contact and interconnect elemental metals such as Ru, Ti, Cr, Al, Al(Cu), Au, Pd, Ni, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$.

Laboratory testing results of individual nonvolatile nanotube switch 4900 with nanotube element 4910 channel length of approximately 250 nm and terminals (conductive elements) 4940 and 4950 formed of TiPd are illustrated by graph 5000 in FIG. 50. Nonvolatile nanotube switch 4900 switching results for 100 ON/OFF cycles shows that most ON resistance values are in range of 10 kOhms to 100 kOhms with a few ON resistance values of 800 kOhms as illustrated by resistance values 5010, and OFF resistance values are in the range of 500 MOhms to 100 GOhms as illustrated by resistance values 5020. In a few cases 5030, ON resistance values were greater than 100 MOhms.

If a 3D memory array is used in a nonvolatile Flash memory application, Flash architecture could be used to detect cases 5030 of ON resistance values that are greater than OFF resistance values 5010 and apply one or several additional cycles as needed to ensure ON resistance values of less than 1 MOhm as illustrated by graph 5000.

Nonvolatile nanotube switch 4900 ON/OFF resistance values demonstrate a lowering of the spread of ON resistance values and a tighter ON resistance value distribution after several tens (or hundreds) of cycles. Graphs 5010 and 5020 in the 80 to 100 ON/OFF cycle range show ON resistance values between 10 kOhms and less than 1 MOhms, for example, and OFF resistance values greater than 80 MOhms. Such nonvolatile nanotube switches may be used in any memory architecture. Applying tens or hundreds of cycles to as-fabricated nonvolatile nanotube switches 4900 may be used as part of a memory array burn-in operation. Examples of applied voltages and currents resulting in cycling between ON and OFF resistance values is described further above with respect to FIGS. 11A and 11B.

3-Dimensional Cell Structure of Nonvolatile Cells Using NV NT Devices Having Vertically Oriented Diodes and Horizontally Oriented Self Aligned NT Switches Using Conductor Trench-Fill for Anode-on-NT Switch Connections FIG. 51 illustrates cross section 5185 including cells C00 and C10 in a 3-D memory embodiment. Nanotube layers are deposited horizontally on a planar insulator surface above previously defined diode-forming layers as illustrated in FIGS. 36A and 36B shown further above. Self-alignment methods, similar to self-alignment methods described further above with respect to FIGS. 34A-34FF, 36A-36FF, and 48A-48BB determine the dimensions and locations of trenches used to define cell boundaries. Self-aligned trench sidewall wiring connects horizontally-oriented nanotube elements with vertically-oriented diodes and also with array wiring.

Methods 3010 described further above with respect to FIG. 30A are used to define support circuits and interconnections 3601.

Next, methods 3030 illustrated in FIG. 30B deposit and planarize insulator 3603. Interconnect means through planar insulator 3603 (not shown in cross section 5185 but shown above with respect to cross section 2800" in FIG. 28C) may be used to connect metal array lines in 3-D arrays to corresponding support circuits and interconnections 3601. By way of example, word line drivers in WL driver and sense circuits 2930 may be connected to word lines WL0 and WL1 in array 2910 of memory 2900 illustrated in FIG. 29A described further above, and in cross section 5185 illustrated in FIG. 51. At this point in the fabrication process, methods 3040 may be used to form a memory array on the surface of insulator 3603, interconnected with memory array support structure 3605-1 illustrated in FIG. 51.

Exemplary methods 3040 illustrated in FIG. 30B deposit and planarize metal, polysilicon, insulator, and nanotube elements to form nonvolatile nanotube diodes which, in this example, include multiple vertically oriented diode and horizontally-oriented nonvolatile nanotube switch series pairs. Individual cell boundaries are formed in a single etch step, each cell having a single NV NT Diode defined by a single trench etch step after layers, except the BL0 layer, have been deposited and planarized, in order to eliminate accumulation of individual layer alignment tolerances that would substantially increase cell area. Individual cell dimensions in the Y direction are F (1 minimum feature) as illustrated in FIG. 51, and also F in the X direction (not shown) which is orthogonal to the Y direction, with a periodicity in X and Y directions of 2F. Hence, each cell occupies an area of approximately $4F^2$.

Vertically-oriented (Z direction) trench sidewall cell wiring on a first cell sidewall connects a vertically-oriented diode and one end of a horizontally-oriented nanotube element; and vertically-oriented trench sidewall cell wiring on a second cell sidewall connects the other end of the horizontally-oriented nanotube element with array wiring. Exemplary methods of forming vertically-oriented trench sidewall cell wiring may be adapted from methods of patterning shapes on trench sidewalls such as methods disclosed in U.S. Pat. No. 5,096,849. Horizontally-oriented NV NT switch element (nanotube element) dimensions in the X and Y direction are defined by trench etching. There are no alignment requirements for the nanotube elements in the X or Y direction. Nanotube element thickness (Z direction) is typically in the 5 to 40 nm range. However, nanotube element thickness may be any desired thickness, less than 5 nm or greater than 40 nm for example.

Horizontally-oriented nanotube elements may be formed using a single nanotube layer, or may be formed using multiple layers. Such nanotube element layers may be deposited e.g., using spin-on coating techniques or spray-on coating techniques, as described in greater detail in the incorporated patent references. FIG. 51 illustrates 3-D memory array cross section 5185 in the Y direction and corresponds to methods of fabrication illustrated with respect to FIGS. 48A-48BB, but with a small modification in that FIGS. 36A and 36B replace FIGS. 34A and 34B in order to form an anode-on-NT 3D memory cell (instead of a cathode-on-NT memory cell). NV NT switches are formed using the same methods of fabrication as the methods of fabrication as described further above with respect to FIGS. 48A-48BB. Nanotube element length dimension $L_{SW-CH}$ and width dimension $W_{SW-CH}$ are determined by etched trench wall spacing. If trench wall spacing is equal to minimum technology node dimension F in both X and Y direction, then for technology nodes 90 nm, 65 nm, 45 nm, and 22 nm for example, $L_{SW-CH}$ and $W_{SW-CH}$ will be approximately 90 nm, 65 nm, 45 nm, and 22 nm for example.

Methods fill trenches with an insulator; and then methods planarize the surface. Then, methods deposit and pattern bit lines on the planarized surface.

The fabrication of vertically-oriented 3D cells illustrated in FIG. 51 proceeds as follows. Methods deposit a word line wiring layer on the surface of insulator 3603 having a thickness of 50 to 500 nm, for example, as described further above with respect to FIGS. 48A-48BB (the word line wiring layer in FIG. 51 corresponds to the bit line wiring layer in FIGS. 48A-48BB). Fabrication of the vertically-oriented diode portion of structure 5185 is the same as in FIGS. 36A and 36B described further above and are incorporated in methods of fabrication described with respect to FIG. 51. Methods etch the word line wiring layer and define individual word lines such as word line conductors 3610-1 (WL0) and 3610-2 (WL1). Word lines such as WL0 and WL1 are used as array wiring conductors and may also be used as contacts to N+ regions 3620-1 and 3620-2, which are in contact with N regions 3625-1 and 3625-2 forming Schottky diode cathodes. N+ polysilicon regions 3620-1 and 3620-2 may be doped with arsenic or phosphorous of $10^{20}$ or greater, and N polysilicon regions 3625-1 and 3625-2 may be doped with arsenic or phosphorus in the range of $10^{14}$ to $10^{17}$ dopant atoms/cm³ for example, and may have a thickness range of 20 nm to 400 nm, for example.

FIG. 51 illustrates an anode-to-NT type NV NT diode formed with Schottky diodes. However, PN or PIN diodes may be used instead of Schottky diodes.

The electrical characteristics of Schottky (and PN, PIN) diodes may be improved (low leakage, for example) by controlling the material properties of polysilicon, for example polysilicon deposited and patterned to form polysilicon regions 3625-1 and 3625-2. Polysilicon regions may have relatively large or relatively small grain boundary sizes that are determined by methods used in the semiconductor regions. For example, SOI deposition methods used in the semiconductor industry may be used that result in polysilicon regions that are single crystalline (no longer polysilicon), or nearly single crystalline, for further electrical property enhancement such as low diode leakage currents.

Methods form lower level contacts 3630-1 and 3630-2. Examples of contact conductor materials include elemental metals such as Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators may be $SiO_2$, $SiN_x$, $Al_2O_3$, BeO, polyimide, Mylar or other suitable insulating material.

Lower level contacts 3630-1 and 3630-2 also form anodes of Schottky diodes having Schottky diode junctions 3618-1 and 3618-2. In some cases conductors such as Al, Au, W, Cu, Mo, Ti, and others may be used as both contact conductor materials as well as anodes for Schottky Diodes. However, in other cases, optimizing anode material for lower forward voltage drop and lower diode leakage is advantageous. Schottky diode anode materials may be added (not shown) between lower level contacts (and Schottky diode anodes) 3630-1 and 3630-2 and polysilicon regions 3625-1 and 3625-2, respectively. Such anode materials may include Al, Ag, Au, Ca, Co, Cr, Cu, Fe, Ir, Mg, Mo, Na, Ni, Os, Pb, Pd, Pt, Rb, Ru, Ti, W, Zn and other elemental metals. Also, silicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by N G, K. K. "Complete Guide to Semiconductor Devices", Second Edition, John Wiley & Sons, 2002m pp. 31-41, the entire contents of which are incorporated herein by reference.

Next, methods form planar insulating regions 4735-1 and 4735-2 on the surface of lower level contact (contact) 3630-1 and 3630-2, respectively, typically $SiO_2$ for example, with a thickness of 20 to 500 nm for example and X and Y dimensions defined by trench etching near the end of the process flow.

Next, methods form horizontally-oriented nanotube elements 4740-1 and 4740-2 on the surface of insulator regions 4735-1 and 4735-2, respectively, having nanotube element length and width defined by trench etching near the end of the process flow and insulated from direct contact with lower level contacts 3430-1 and 3430-2, respectively. In order to maximize the density of cells C00 and C10, nanotube elements 4740-1 and 4740-2 illustrated in FIG. 51 are horizontally-oriented with trench-defined end-contacts 4764 and 4779 contacting nanotube element 4740-1, and end-contacts 4764' and 4779' contacting nanotube element 4740-2 as described further below Horizontally-oriented nanotube elements are described in greater detail in the incorporated patent references.

Then, methods form protective insulators 4745-1 and 4745-2 on the surface of conformal nanotube elements 4740-1 and 4740-2, respectively, with X and Y dimensions defined by trench etching near the end of the process flow. Exemplary methods of forming protective insulator 4745-1 and 4745-2 are described further above with respect to FIG. 48B.

Next, methods form upper level contacts 4750-1 and 4750-2 on the surface of protective insulators 4745-1 and 4745-2, respectively, with X and Y dimensions defined by trench etching near the end of the process flow.

Next, methods form (etch) trench openings of width F form inner sidewalls of cells C00 and C10 and corresponding upper and lower level contacts, nanotube elements, and insulators described further above.

Next, methods form sidewall vertical wiring 4762 and 4762'. Vertical sidewall wiring 4762 forms and connects end-contact 4764 of nanotube element 4740-1 with end-contact 4766 of lower level contact 3630-1; vertical sidewall wiring 4762' forms and connects end-contact 4764' of nanotube element 4740-2 with end-contact 4766' of lower level contact 3630-2.

Next, methods complete trench formation (etching) to the surface of insulator 3403.

Next, methods fill trench opening with an insulator such as TEOS and planarize the surface to complete trench fill 4769.

Next, methods form (etch) trench openings of width F that form outer sidewalls of cells C00 and C10 and corresponding upper and lower level contacts, nanotube elements, and insulators described further above.

Next, methods form sidewall vertical wiring 4776 and 4776'. Vertical sidewall wiring 4776 forms and connects end-contact 4779 of nanotube element 4740-1 with the end-contact region 4778 of upper level contact 4750-1; vertical sidewall wiring 4776' forms and connects end-contact 4779' of nanotube element 4740-2 with the end-contact region 4778' of upper level contact 4850-2.

Next, methods complete trench formation (etching) to the surface of insulator 3403.

Next, methods fill trench openings with an insulator such as TEOS and planarize the surface to complete trench fill 4882 and 4882'.

Next, methods directionally etch and form bit line contacts 5184C-1 and 5184C-2 on the surface of upper level contacts 4750-1 and 4750-2, respectively, by depositing and planarizing a bit line layer.

Next, methods pattern bit line 5184.

Nonvolatile nanotube diodes forming cells C00 and C10 correspond to nonvolatile nanotube diode 1300 in FIG. 13, one in each of cells C00 and C10. Cells C00 and C10 illustrated in cross section 5185 in FIG. 51 correspond to corresponding cells C00 and C10 shown schematically in memory array 2910 in FIG. 29A, and word lines WL0 and WL1 and bit line BL0 correspond to array lines illustrated schematically in memory array 2910.

After the fabrication of cross section 5185 illustrated in FIG. 51, 3D memory cell boundaries in the X direction are formed by simultaneously trench etching, trench filling with an insulator and planarizing. Bit lines and bit line contacts to upper level contacts are then formed to complete cross section 5185' in FIG. 52 that corresponds to cross section 5185 in FIG. 51.

Cross section 5185' illustrated in FIG. 52 illustrates support circuits and interconnections 3601 and insulator 3603 as described further above with respect to FIG. 51. Cross section 5185' is in the X direction along word line WL0.

N+ polysilicon regions 3620-1' and 3620-1" form contacts between word line 3610-1 (WL0) and N polysilicon 3625-1' and 3625-1", respectively, that form diode cathode regions. Lower level contacts 3430-1' and 3430-1" act as anodes to form Schottky diode junctions 3618-1' and 3618-1" as well as contacts to nanotube elements 4840-1' and 4840-1", respectively. Contacts between nanotube elements and lower level contacts are illustrated in corresponding cross section 5185 in FIG. 51.

Insulator 4835-1' and 4835-1" is used to separate nanotube elements 4840-1' and 4840-1" from electrical contact with lower level contacts 3630-1' and 3630-1", respectively.

Protective insulators 4845-1' and 4845-1" provide a protecting region above the nanotube elements, and also electrically separate nanotubes elements 4840-1' and 4840-1" from electrical contact with upper level contacts 4850-1' and 4850-1", respectively. Contacts between nanotube elements and upper level contacts are illustrated in corresponding cross sections 5185.

Bit line contacts 5184-1' and 5184-1" connect upper level contacts 4850-1' and 4850-1", respectively, to bit lines 5184-1 (BL0) and 5184-2 (BL1), respectively.

Corresponding cross sections 5185 and 5185' illustrated in FIGS. 51 and 52, respectively, show an anode-to-NT 3D memory array with horizontally-oriented nanotube elements. Nanotube channel length and channel width ($W_{SW-CH}$) correspond to NV NT diode cell dimensions of 1F in the X direction and 1F in the Y direction, as well as corresponding bit and word array lines. Cross section 5185 is a cross section of two adjacent anode-to-nanotube type nonvolatile nanotube diode-based cells in the Y direction and cross section 5185' is a cross section of two adjacent anode-to-nanotube type nonvolatile nanotube diode-based cells in the X direction. Cross sections 5185 and 5185' include corresponding word line and bit line array lines. The nonvolatile nanotube diodes form the steering and storage elements in each cell illustrated in cross sections 5185 and 5185', and each cell has 1F by 1F dimensions. The spacing between adjacent cells is 1F so the cell periodicity is 2F in both the X and Y directions. Therefore one bit occupies an area of $4F^2$ At the 45 nm technology node, the cell area is less than 0.01 $um^2$.

Corresponding cross sections 5185 and 5185' illustrated in FIGS. 51 and 52 methods of fabrication correspond to the methods of fabrication described with respect to FIGS. 48A-48BB, except that the vertical position of N polysilicon and N+ silicon layers are interchanged. NV NT switch fabrication methods of fabrication are the same. The only difference is that the N polysilicon layer is etched before N+ polysilicon layer when forming trenches in cross sections 5185 and 5185'.

Nonvolatile Memories Using NV NT Diode Device Stacks with Both Anode-to-NT Switch Connections and Cathode-to-NT Switch Connections and Horizontally-Oriented Self Aligned End-Contacted NV NT Switches FIG. 32 illustrates a method 3200 of fabricating embodiments having two memory arrays stacked one above the other and on an insulating layer above support circuits formed below the insulating layer and stacked arrays, and with communications means through the insulating layer. While method 3200 is described further below with respect to nonvolatile nanotube diodes 1200 and 1300, method 3200 is sufficient to cover the fabrication of many of the nonvolatile nanotube diode embodiments described further above. Note also that although methods 3200 are described in terms of 3D memory embodiments, methods 3200 may also be used to form 3D logic embodiments based on NV NT diodes arranged as logic arrays such as NAND and NOR arrays with logic support circuits (instead of memory support circuits) as used in PLAs, FPGAs, and PLDs, for example.

FIG. 53 illustrates a 3D perspective drawing 5300 that includes a two-high stack of three dimensional arrays, a lower array 5302 and an upper array 5304. Lower array 5302 includes nonvolatile nanotube diode cells C00, C01, C10, and C11. Upper array 5304 includes nonvolatile nanotube diode cells C02, C12, C03, and C13. Word lines WL0 and WL1 are oriented along the X direction and bit lines BL0, BL1, BL2, and BL3 are oriented along the Y direction and are approximately orthogonal to word lines WL1 and WL2. Nanotube element channel length $L_{SW-CH}$ is oriented horizontally as shown in 3D perspective drawing 5300. Cross sections of cells C00, C01, C02 and C03 are illustrated further below in FIG. 54A and cells C00, C02, C12, and C10 are illustrated further below in FIG. 54B.

In general, methods 3210 fabricate support circuits and interconnections in and on a semiconductor substrate. This includes NFET and PFET devices having drain, source, and gate that are interconnected to form memory (or logic) support circuits. Such structures and circuits may be formed using known techniques that are not described in this application. Some embodiments of methods 3210 are used to form a support circuits and interconnections 5401 layer as part of cross sections 5400 and 5400' illustrated in FIGS. 54A and 54B using known methods of fabrication in and on which nonvolatile nanotube diode control and circuits are fabricated. Support circuits and interconnections 5401 are similar to support circuits and interconnections 3401 illustrated in FIGS. 47 and 3601 illustrated in FIG. 51, for example, but are modified to accommodate two stacked memory arrays. Note that while two-high stacked memory arrays are illustrated in FIG. 54, more than two-high 3D array stacks may be formed (fabricated), including but not limited to 4-high and 8 high stacks for example.

Next, methods 3210 are also used to fabricate an intermediate structure including a planarized insulator with interconnect means and nonvolatile nanotube array structures on the planarized insulator surface such as insulator 5403 illustrated in cross sections 5400 and 5400' in FIGS. 54A and 54B, respectively, and are similar to insulator 3403 illustrated in FIG. 47 and insulator 3601 illustrated in FIG. 51, but are modified to accommodate two stacked memory arrays. Interconnect means include vertically-oriented filled contacts, or studs, for interconnecting memory support circuits in and on a semiconductor substrate below the planarized insulator with nonvolatile nanotube diode arrays above and on the planarized insulator surface. Planarized insulator 5403 is formed using methods similar to methods 2730 illustrated in FIG. 27B. Interconnect means through planar insulator 5403 (not shown in cross section 5400) are similar to contact 2807 illustrated in FIG. 28C and may be used to connect array lines in first memory array 5410 and second memory array 5420 to corresponding support circuits and interconnections 5401. Support circuits and interconnections 5401 and insulator 5403 form memory array support structure 5405-1.

Next, methods 3220, similar to methods 2740, are used to fabricate a first memory array 5410 using diode cathode-to-nanotube switches based on a nonvolatile nanotube diode array similar to a nonvolatile nanotube diode array cross section 4785 illustrated in FIG. 47 and corresponding methods of fabrication.

Next, methods 3230 similar to methods 3040 illustrated in FIG. 30B, fabricate a second memory array 5420 on the planar surface of first memory array 5410, but using diode anode-to-nanotube switches based on a nonvolatile nanotube diode array similar to a nonvolatile nanotube diode array cross section 5185 illustrated in FIG. 51 and corresponding methods of fabrication FIG. 54A illustrates cross section 5400 including first memory array 5410 and second memory array 5420, with both arrays sharing word line 5430 in common. Word lines such as 5430 are defined (etched) during a methods trench etch that defines memory array (cells) when forming array 5420. Cross section 5400 illustrates combined first memory array 5410 and second memory array 5420 in the word line, or X direction, with shared word line 5430 (WL0), four bit lines BL0, BL1, BL2, and BL3, and corresponding cells C00, C01, C02, and C03. The array periodicity in the X direction is 2F, where F is a minimum dimension for a technology node (generation).

FIG. 54B illustrates cross section 5400' including first memory array 5410' and second memory array 5420' with both arrays sharing word lines 5430' and 5432 in common. Word line 5430' is a cross sectional view of word line 5430. Word lines such as 5430' and 5432 are defined (etched) during a trench etch that defines memory array (cells) when forming array 5420'. Cross section 5400' illustrates combined first memory array 5410' and second memory array 5420' in the bit line, or Y direction, with shared word lines 5430' (WL0) and 5432 (WL1), two bit lines BL0 and BL2, and corresponding cells C00, C10, C02, and C12. The array periodicity in the Y direction is 2F, where F is a minimum dimension for a technology node (generation).

The memory array cell area of 1 bit for array 5410 is $4F^2$ because of the 2F periodicity in the X and Y directions. The memory array cell area of 1 bit for array 5420 is $4F^2$ because of the 2F periodicity in the X and Y directions. Because memory arrays 5420 and 5410 are stacked, the memory array cell area per bit is $2F^2$. If four memory arrays (not shown) are stacked, then the memory array cell area per bit is $1F^2$.

In some embodiments, methods 3240 using industry standard fabrication techniques complete fabrication of the semiconductor chip by adding additional wiring layers as needed, and passivating the chip and adding package interconnect means.

In operation, memory cross section 5400 illustrated in FIG. 54A and corresponding memory cross section 5400' illustrated in FIG. 54B correspond to the operation of memory cross section 3305 illustrated in FIG. 33B and corresponding memory cross section 3305' illustrated in FIG. 33B'. Memory cross section 5400 and corresponding memory cross section 5400' operation is the same as described with respect to waveforms 3375 illustrated in FIG. 33D.

Method of Forming Trench Sidewall Wiring Using Conformal Conductor Deposition as an Alternative to Trench Fill FIG. 48G illustrates a trench opening 4857 that is then filled with conductor 4858 as illustrated in FIG. 48H. Trench sidewall wiring is then formed as further illustrated in methods of fabrication described in FIG. 48A-48BB.

Conformal conductor deposition may be used instead of a trench fill conductor to create trench sidewall wiring as illustrated in FIGS. 55A-55F. Exemplary methods of fabrication illustrated in FIGS. 55A-55F are based on an adaptation of U.S. Pat. No. 5,096,849 illustrated in FIGS. 41A-41B.

Figure 55A:
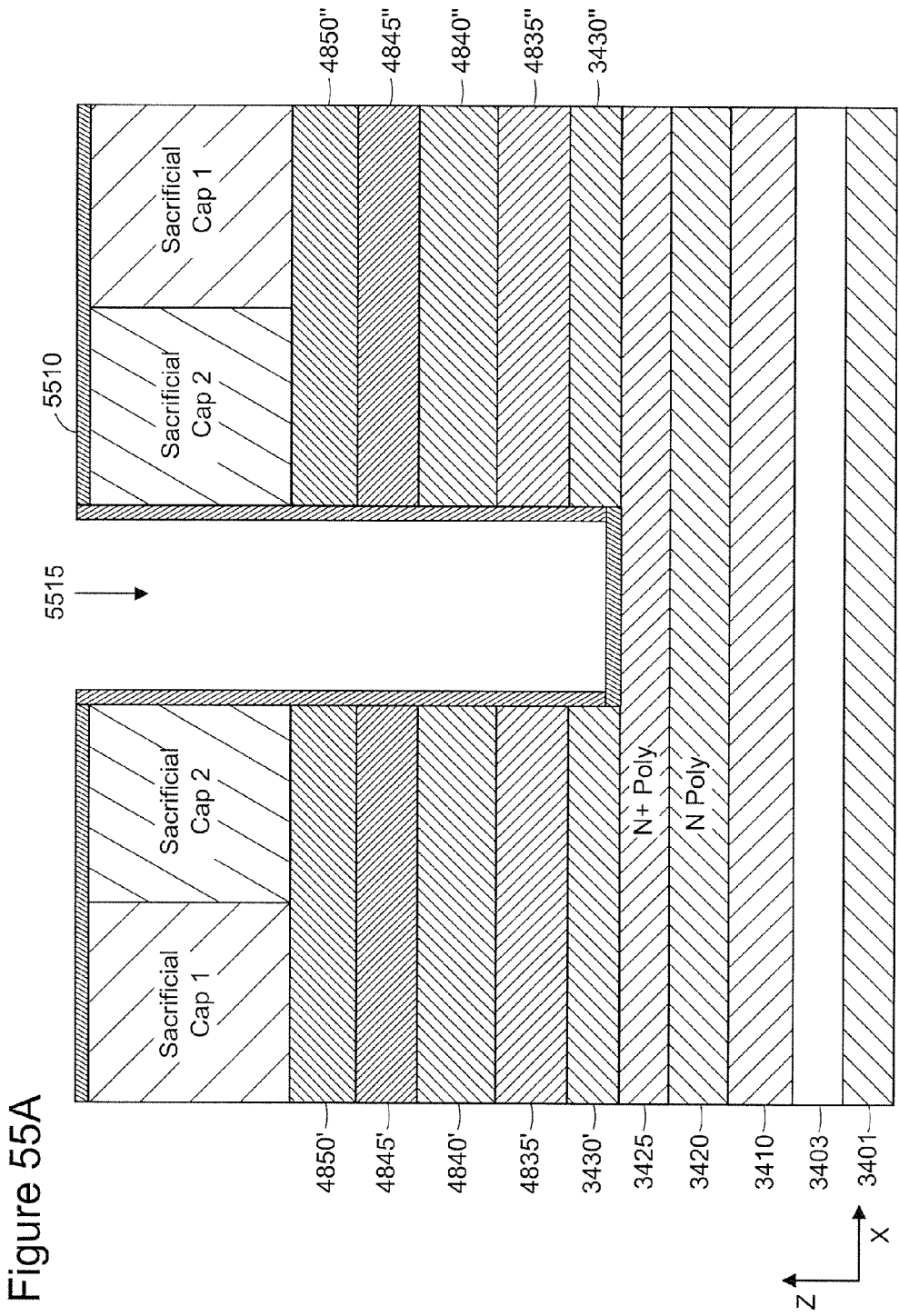
FIGS. 55A-55F illustrate cross sections of 3D memory cells using sidewall wiring formed using conformal conductor deposition inside trench openings instead of trench fill methods used in FIGS. 47, 48A-48BB, 51, and 52, according to some embodiments.

Some methods deposit a conformal conductor layer 5510 in opening 4857 (FIG. 48G) as illustrated in FIG. 55A and forms trench opening 5515. Examples of conductors layer materials are elemental metals such as, Al, Au, W, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Conductor material is formed into sidewall wiring regions as illustrated further below. Because wiring distances are short, the sheet resistance of resulting trench sidewall wiring is not a concern.

Figure 55B:
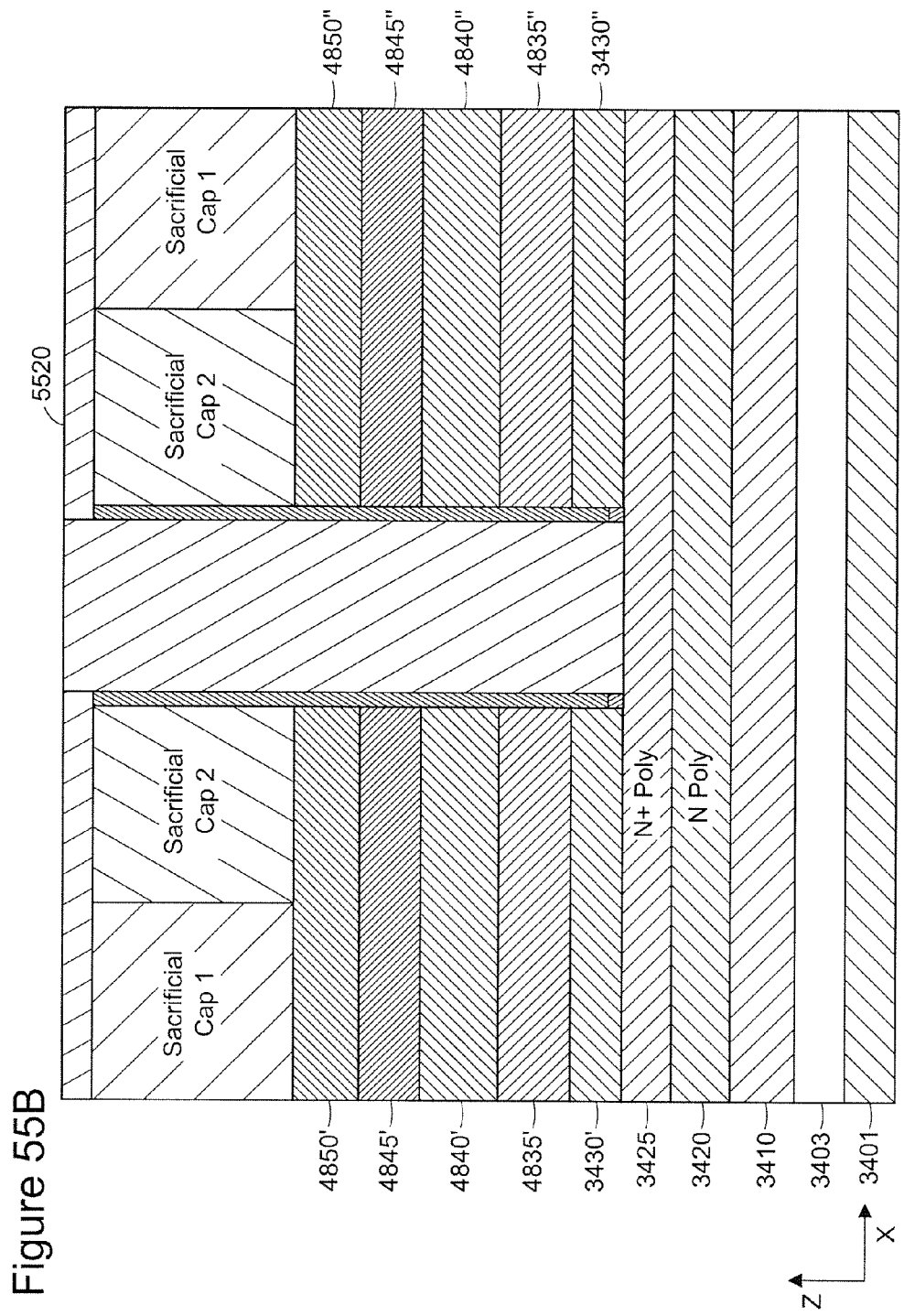

Next, methods fill trench opening 5515 with sacrificial material 5520 as illustrated in FIG. 55B. Sacrificial material 5520 may be a conductor, semiconductor, or an insulator. If an insulator is selected, sacrificial material 5520 may be formed from any known insulator material in the CMOS industry, or packaging industry, for example such as $SiO_2$, SiN, $Al_2O_3$, BeO, polyimide, PSG (phosphosilicate glass), photoresist, PVDF (polyvinylidene fluoride), sputtered glass, epoxy glass, and other dielectric materials.

Figure 55C:
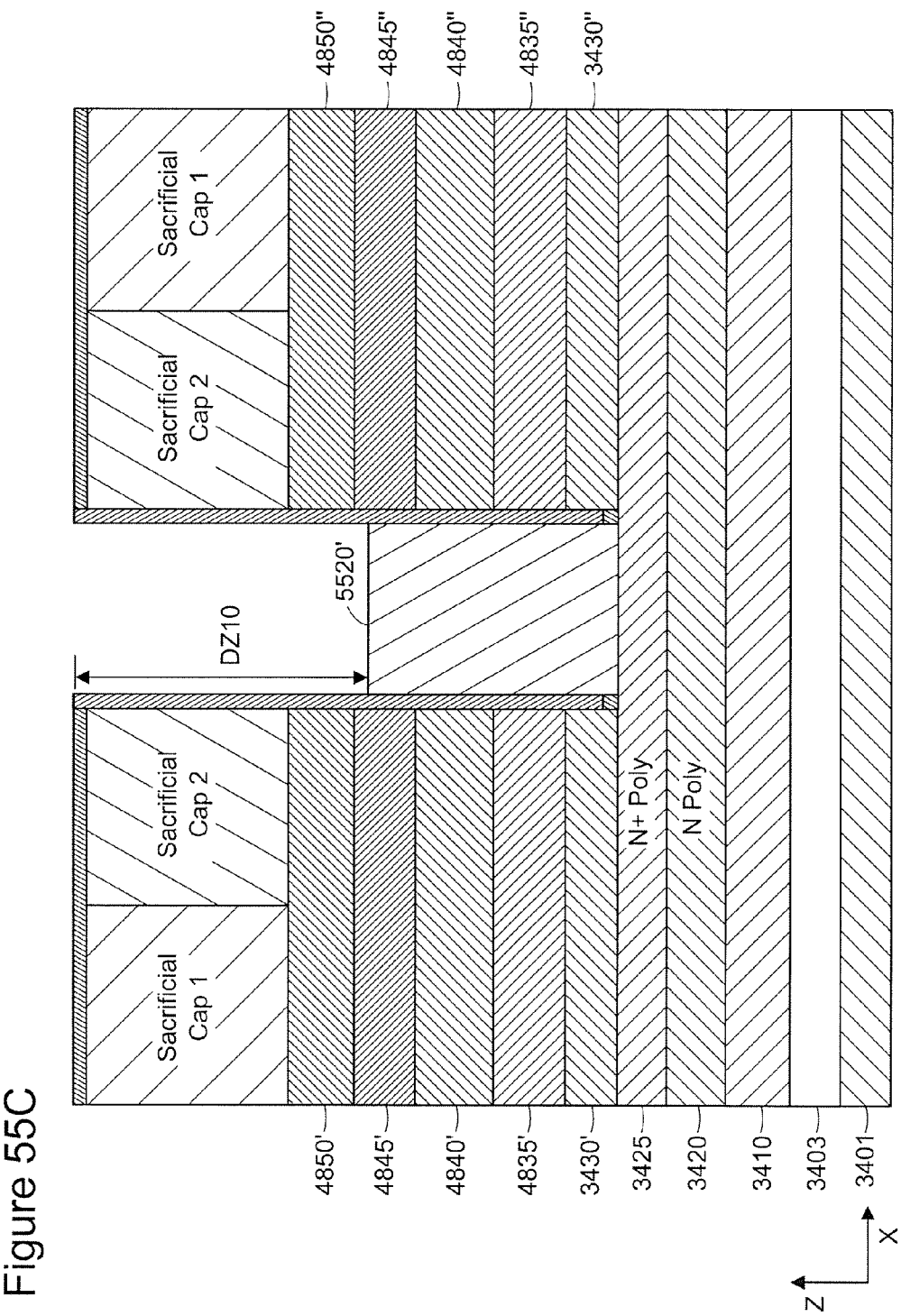

Next, methods etch (RIE) sacrificial material 5520 to a depth DZ10 below the bottom of upper level contacts 4850' and 4850" as illustrated in FIG. 55C leaving sacrificial material 5520'.

Figure 55D:
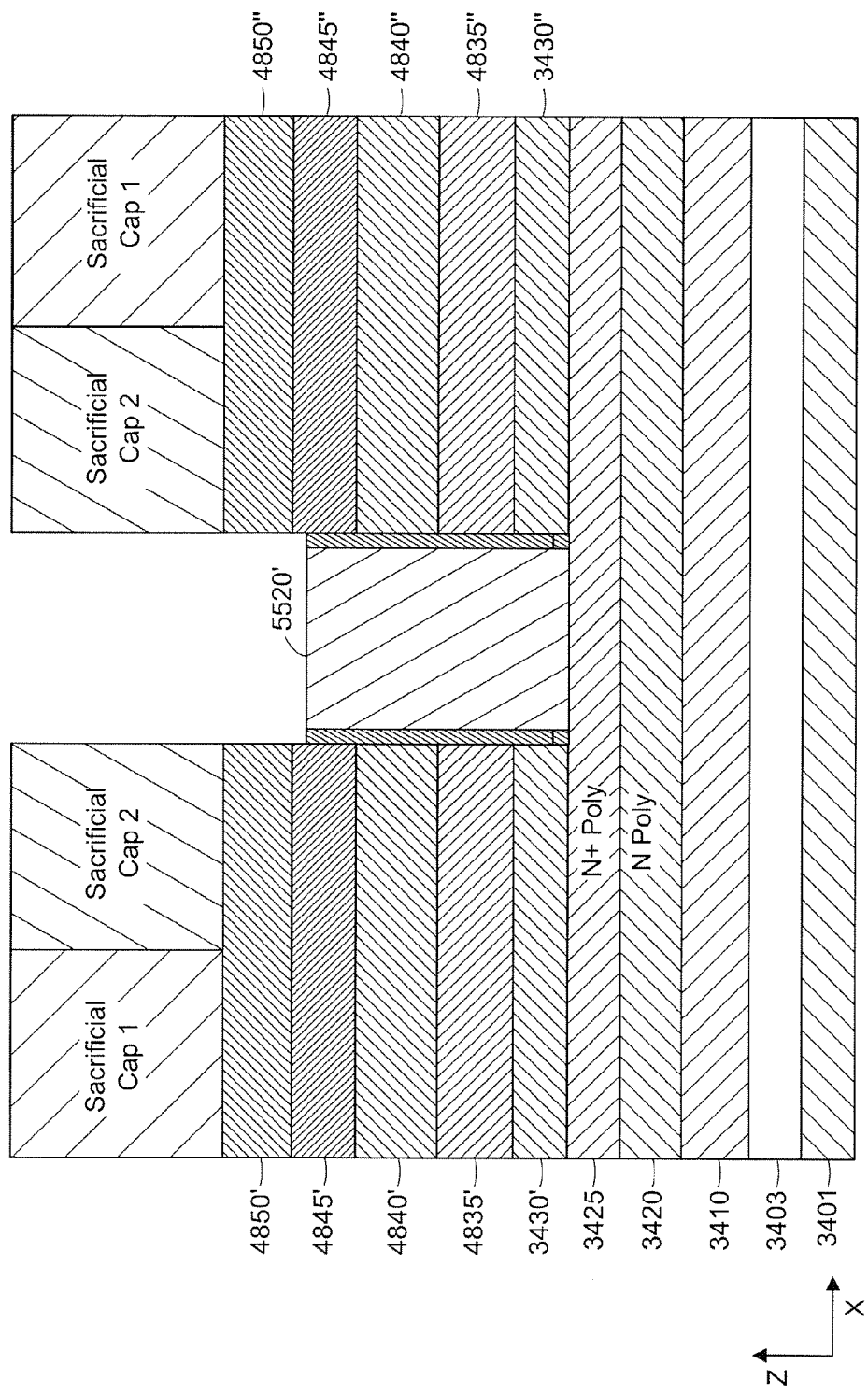

Next, methods remove (etch) exposed regions of the conformal trench sidewall conductor using known industry methods as illustrated in FIG. 55D and leaving sacrificial material 5520'.

Figure 55E:
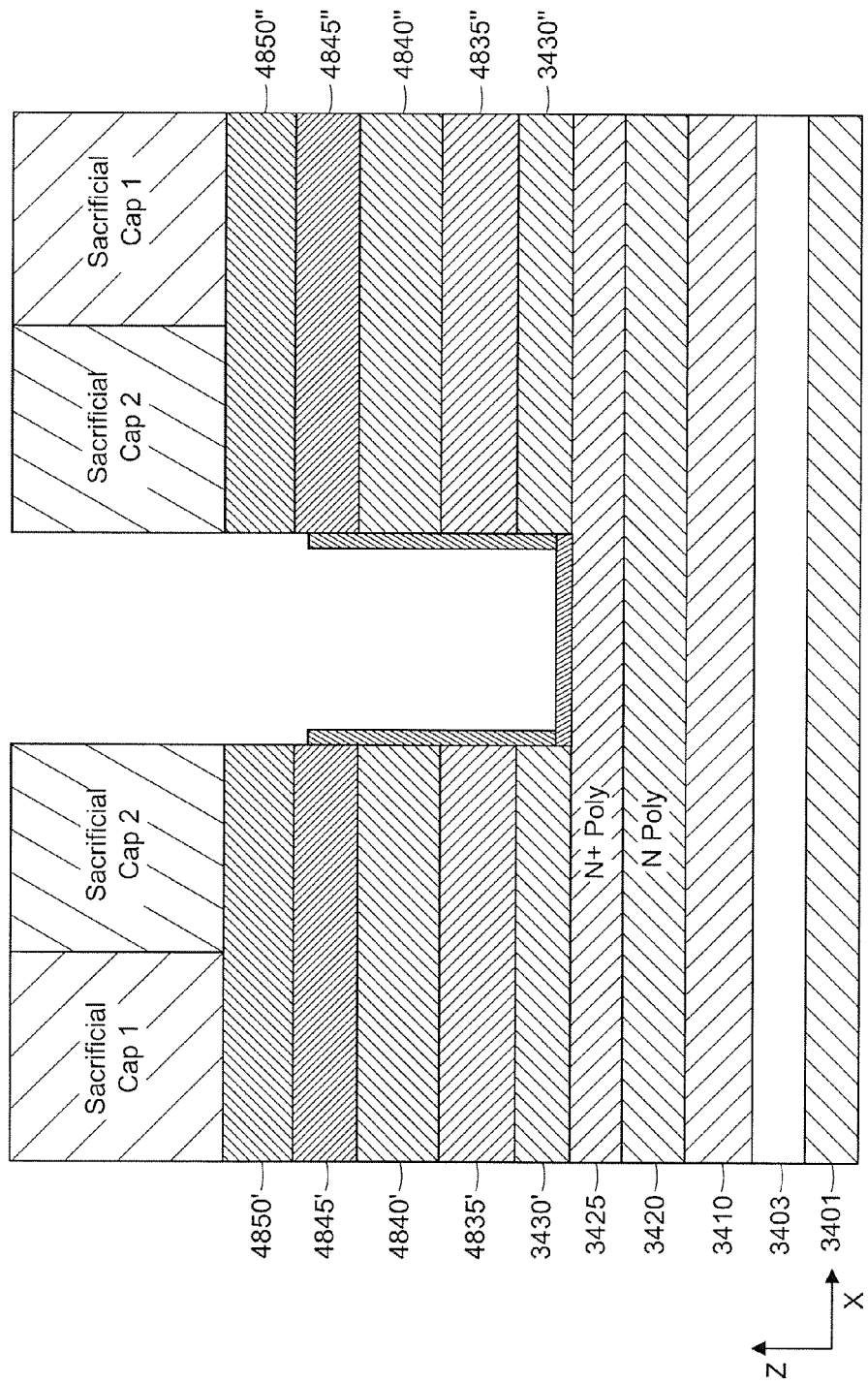
Figure 55F:
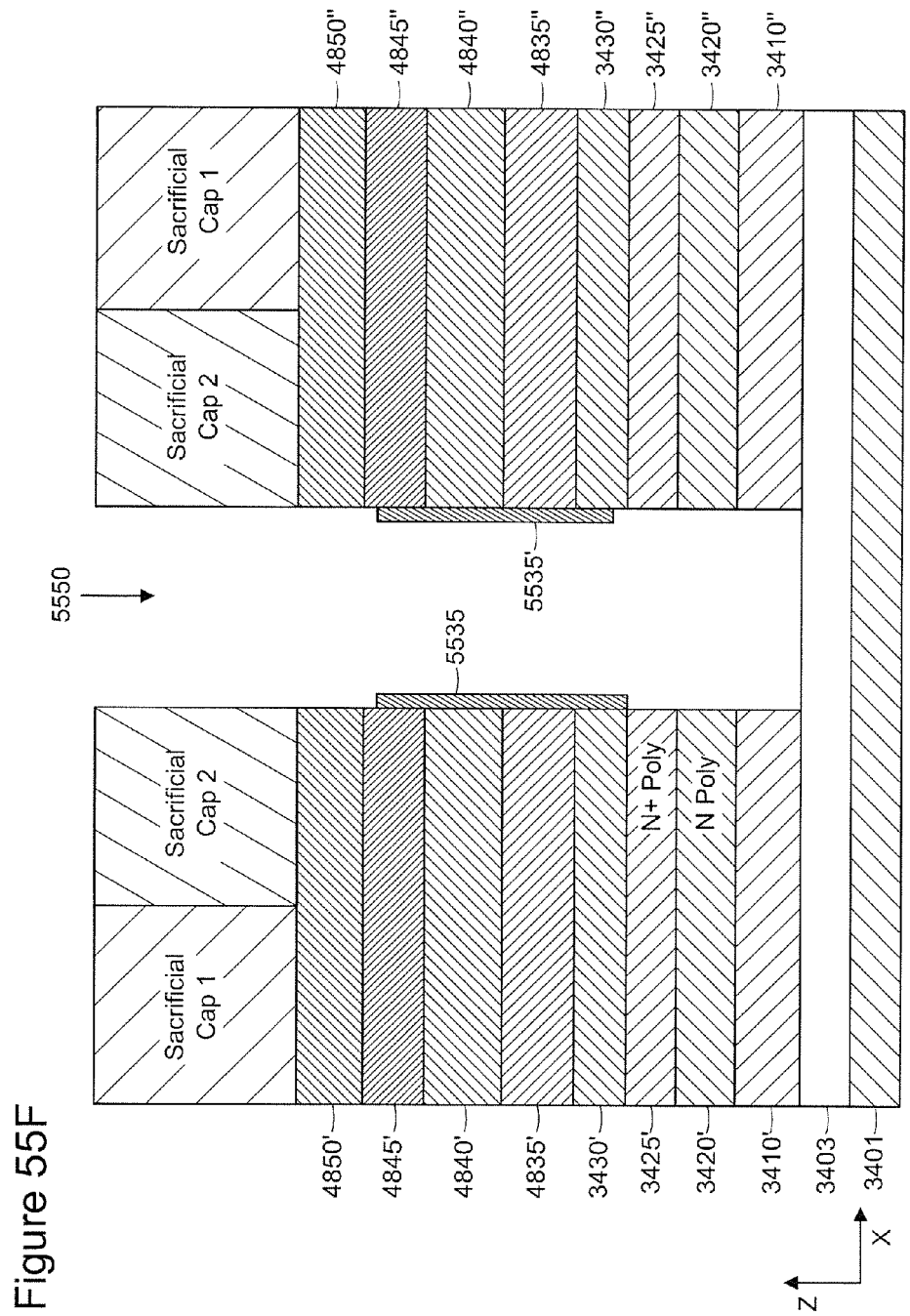

Next, methods remove (etch) remaining sacrificial material 5520' using known industry methods as illustrated in FIG. 55E.

Next, methods RIE remaining conformal conductor forming trench sidewall wiring 5535 and 5535'. Then, methods directionally etch remaining semiconductor and metal layers to form trench sidewall wiring 5535 and 5535' corresponding to sidewall wiring 4862 and 4862' in FIG. 48L, and forming trench 5550.

Methods of fabrication using conformal conductor deposition instead of conductor trench fill as described with respect to FIGS. 55A-55F may be applied to methods of fabrication described with respect to FIGS. 48A-48BB to form 3D memory cross section 4885 illustrated in FIGS. 48Y and 3D memory cross section 4885' illustrated in FIG. 48BB.

Methods of fabrication using conformal conductor deposition as described with respect to FIGS. 55A-55F may also be used to form 3D memory cross section 5185 illustrated in FIG. 51 and 3D memory cross section 5185' illustrated in FIG. 52.

Nonvolatile Nanotube Blocks

Nonvolatile nanotube switches (NV NT Switches) are described in detail in U.S. patent application Ser. No. 11/280,786, and switch examples and operation are summarized briefly in this application as illustrated in FIGS. 3-11B illustrated above. FIGS. 3-6B illustrate horizontally-oriented NV NT switches 300, 400, 500, and 600, and FIG. 7B illustrate vertically-oriented NV NT switch 750. These switches are formed by nanotube elements of thickness in the range of 0.5 to 10 nm, for example, that are contacted by metallic terminals in contact with surface regions at opposite ends of the patterned nanotube elements.

FIGS. 26A and 29A illustrate nonvolatile nanotube diode-based memory arrays and circuits using cathode-on-NT and anode-on-NT type nonvolatile nanotube diodes, respectively, as described further above with respect to FIGS. 12 and 13. It is desirable to fabricate the densest possible memory arrays at each technology node F, where F is the minimum technology node lithographic dimension. If each cell is F×F and separated by a dimension F from adjacent cells, then the cell-to-cell periodicity is 2F and the minimum cell area for a technology node F is $4F^2$. If individual cells can hold more than one bit, or if arrays can be stacked one above the other, then the effective memory cell may be $2F^2$ or $1F^2$, for example.

FIG. 28C illustrates cross section 2800" in which the NV NT diode cell includes a vertically-oriented diode steering (select) device in contact with a horizontally-oriented nanotube which is larger than a minimum feature size F in the X direction because horizontally-placed nanotube element contacts at opposite ends of nanotube element 2850 extend beyond minimum feature F. FIGS. 28A and 28B, as well as 31A, 31B, and 31C show vertically-oriented nanotubes with bottom and side/top contacts that are compatible with minimum feature size F.

However, even with vertically-oriented nanotubes, scaling to small dimensions such as technology node F=22 nm (or smaller) may in some embodiments be limited by the nanotube fabric density of the nanotube element, that is the number of individual nanotubes available in the width direction of the device. Another way to express nanotube fabric density is to measure the size of void regions as illustrated in FIG. 38. FIG. 39 illustrates nanotube elements of increased thickness in order to increase the number of nanotubes available for a device of minimum feature width F, which may be 45 nm, 35 nm, or 22 nm for example. FIG. 40 illustrates a dense memory cell in which a nanotube element 4050 has a cross section F×F. The nanotube thickness determines the channel length $L_{SW-CH}$, which is defined by the separation between upper level contact 4065 and lower level contact 4030 of nanotube switch 4005. Upper level contacts may also be referred to as top contacts and lower level contacts may also be referred to as bottom contacts. Thicker nanotube elements such as nanotube element 4050 may be referred to as a nonvolatile nanotube blocks. NV NT diode arrays fabricated using NV nanotube blocks such as nanotube element 4050 with upper level and lower level contacts as illustrated further above in FIG. 40, and illustrated further below with respect to FIGS. 57, 67 and 68, result in a relatively simple self aligned three-dimensional NV memory array structures.

Nonvolatile nanotube blocks ("NV NT blocks") can be thought of as nanotube elements that include 3-D volumes of nanotube fabric. The term NV NT blocks is used to distinguish relatively thick nanotube elements from relatively thin nanotube elements, e.g., those illustrated in FIGS. 3-7B. For example, NV NT blocks may have thicknesses ranging, e.g., from about 10 nm to 200 nm (or more), e.g., from about 10 to 50 nm. Thus, the thickness of the block is generally substantially larger than the diameters of individual nanotubes in the block, e.g., at least about ten times larger than the individual nanotube diameters, forming a 3-D volume of nanotubes. In contrast, some other kinds of nanotube elements are relatively thin, for example having about the same thickness as the nanotube diameters themselves (e.g., approximately 1 nm), forming a monolayer. In many cases, relatively thin elements can be considered to be "2-D" in nature (although at the nanoscopic level 3-D features can of course be seen). In general, both relatively thin nanotube fabrics, and relatively thick NV NT blocks (e.g., over a broad range of thicknesses, such as from less than about 1 nm to 200 nm or more) include a network of nanotubes.

In many embodiments, NV NT blocks are shaped, sized, and/or are sufficiently dense such that terminals may contact the blocks on any surface(s), including the bottom, top, side, and end, or in any combination of surfaces. The size and/or density of the fabric that forms the block substantially prevents the terminals from contacting each other through the fabric and shorting. In other words, the size and/or density of the fabric physically separates the terminals from one another. As discussed above relative to FIG. 38, one way of ensuring that the fabric forming the NV NT block is sufficiently dense is to control the distribution of the size of voids within the fabric. As discussed in greater detail below, the density of the fabric of the NV NT block can be controlled by selecting appropriate deposition parameters. For example, the nanotubes forming the fabric can be densely deposited using spray coating techniques, or by using spin-coating to coat multiple layers on top of each other. Or, as described in greater detail below, thinner layers may be formed by incorporating a sacrificial material into the nanotube fabric, for example either during or after the deposition of the nanotube fabric. This sacrificial material substantially prevents the terminals from coming into contact when the terminals are formed, i.e., physically separates the terminals. The sacrificial material can later be substantially removed, leaving behind the nanotube fabric. The nanotube fabric need not be as dense or thick as in other embodiments, because the terminals are already formed with a given physical separation from each other.

In many embodiments, many of the nanotubes within the nanotube fabric forming the NV NT block lie substantially parallel to the surface on which they are disposed. In some embodiments, for example if the nanotubes are spin-coated onto a surface, at least some of the nanotubes may also generally extend laterally in a given direction, although their orientation is not constrained to that direction. If another layer of nanotubes is spin-coated on top of that layer, the nanotubes may generally extend in the same direction as the previous layer, or in a different direction. Additionally, while many of the nanotubes of the additional layer will also be generally parallel to the surface, some of the nanotubes may curve downwards to fill voids in the previous nanotube layer. In other embodiments, for example if the nanotubes are spray-coated onto a surface, the nanotubes will still lie generally parallel to the surface on which they are disposed, although they may have generally random orientations relative to each other in the lateral direction. In other embodiments, the nanotubes may extend randomly in all directions.

In many embodiments, NV NT blocks have a thickness or height that is on the order of one or more of its lateral dimensions. For example, as described in greater detail below, one or more dimensions of the NV NT block can be defined lithographically, and one dimension defined by the as-deposited thickness of the nanotube fabric forming the NV NT block. The lithographically defined dimension(s) scale with the technology node (F), enabling the fabrication of devices with minimum lateral dimensions of approximately F. e.g., of about 65 nm for F=65 nm, of about 45 nm for F=45 nm, of about 32 nm for F=32 nm, of about 22 nm for F=22 nm, or below. For example, for F=22 nm, an NV NT block could have dimensions of about 22 nm×22 nm×35 nm, assuming that the nanotube fabric forming the NV NT block is about 35 nm thick. Other dimensions and thicknesses are possible.

Depending on the arrangement of the terminals, and the thickness and as-deposited characteristics of the nanotube fabric forming the NV NT block, the distance between the terminals (i.e., the switch channel length) may be defined either by a lithographically defined dimension of the NV NT block. Alternately, the distance between the terminals may be defined by the thickness of the fabric forming the NV NT block, which in some circumstances may be sub-lithographic. Alternately, the switch channel length may be defined by providing the terminals in an arrangement that is not directly related to a dimension of the NV NT block itself, but rather by patterning the terminals to have features that are separated from each other by a particular distance. In general, as illustrated in greater detail below, NV NT blocks enable the fabrication of switching elements with areas at least down to about $1F^2$.

Note that a "NV NT block" need not be cube-shaped, e.g., a volume having all dimensions approximately equal, or even have parallel sides, although some embodiments will have those features. For example, in certain embodiments, shapes defined in masking layers at minimum dimensions may have rounded corners such that square shapes as-drawn may be approximately circular as-fabricated, or may be generally square but with rounded features. An approximately circular masking layer results in an approximately cylindrical non-volatile nanotube element that is also referred to as a NV NT block in this invention. Therefore, nanotube element 4050 illustrated by cross section 4000 in FIG. 40 may have an as-fabricated square cross section F×F if the masking layer used to define trench boundaries is an F×F square as illustrated further below in FIG. 57A. Alternatively, nanotube element 4050 illustrated in cross section 4000 may have an as-fabricated approximately circular cross section of diameter approximately F as part of a cylindrical NV NT block element as illustrated further below in FIG. 57A'.

Individual NT-to-NT overlap regions are estimated to be between 0.5×0.5 nm to 10×10 nm in size, which is below available SEM resolution limitations. FIG. 3 illustrates a NV NT switch 300 that corresponds to NV NT switch 600/600' illustrated in FIGS. 6A and 6B. With respect to FIG. 6A, NV NT Switch 600 is in an ON state such that voltage applied to terminal 620 is transmitted to terminal 610 by patterned nanotube element 630 with a NV NT network in an electrically continuous ON state as illustrated by SEM voltage contrast imaging. FIG. 6B illustrates NV NT Switch 600', which corresponds to NV NT Switch 600, but is in an OFF state. In an OFF state, patterned nanotube element 630 forms a NV NT network in an electrically discontinuous state, and does not electrically connect terminals 610 and 620. SEM voltage contrast imaging of NV NT Switch 600' in FIG. 6B illustrates patterned nanotube element 630 in which patterned nanotube element region 630' is electrically connected to terminal 620 (light region) and patterned nanotube element region 630" is electrically connected to terminal 610' (dark region), but where patterned nanotube element regions 630' and 630" are not electrically connected to each other. Terminal 610' is dark since voltage applied to terminal 620 does not reach terminal 610' because of the electrical discontinuity in the NV NT network between patterned nanotube element regions 630' and 630". Note that terminal 610' is the same as terminal 610, except that it is not electrically connected to terminal 620 in NV NT Switch 600'. While the electrical NV NT network discontinuity is visible in terms of the light portion of region 630' and the dark portion of region 630', individual nanoscale NV NT switches forming the NV NT network are not visible due to SEM resolution limitations.

In operation, as illustrated further above in FIGS. 9A-9B and with test voltages and timings illustrated in FIGS. 11A-11B, switch 300 switches between ON and OFF states. In the ON state, the resistance measured during the read operation is near-ohmic. NV NT elements fabricated with a variety of thicknesses and terminal (contact) configurations illustrated further above with respect to FIGS. 49 and 50, and further below with respect to FIGS. 56A-65, exhibit electrical switching characteristics similar to those in FIGS. 9A-9B when test conditions similar to those illustrated in FIGS. 11A-11B are applied. Nanotube element switching appears relatively insensitive to geometrical variations, with the possible exception of lower voltage operation at shorter switch channel lengths $L_{SW-CH}$ as illustrated in FIG. 10.

FIGS. 56A-56F and 57A-57C further below illustrate various relatively thin NV nanotube elements and relatively thick NV nanotube elements (NV NT blocks) with various terminal contact location configurations in 3-dimensional perspective.

FIGS. 58A-65 illustrate nonvolatile switches fabricated using various nonvolatile nanotube elements and corresponding measured electrical switching characteristics. These nonvolatile nanotube elements and terminal contact configurations correspond to those illustrated in FIGS. 56A-56F and 57A-57C.

Figure 65:
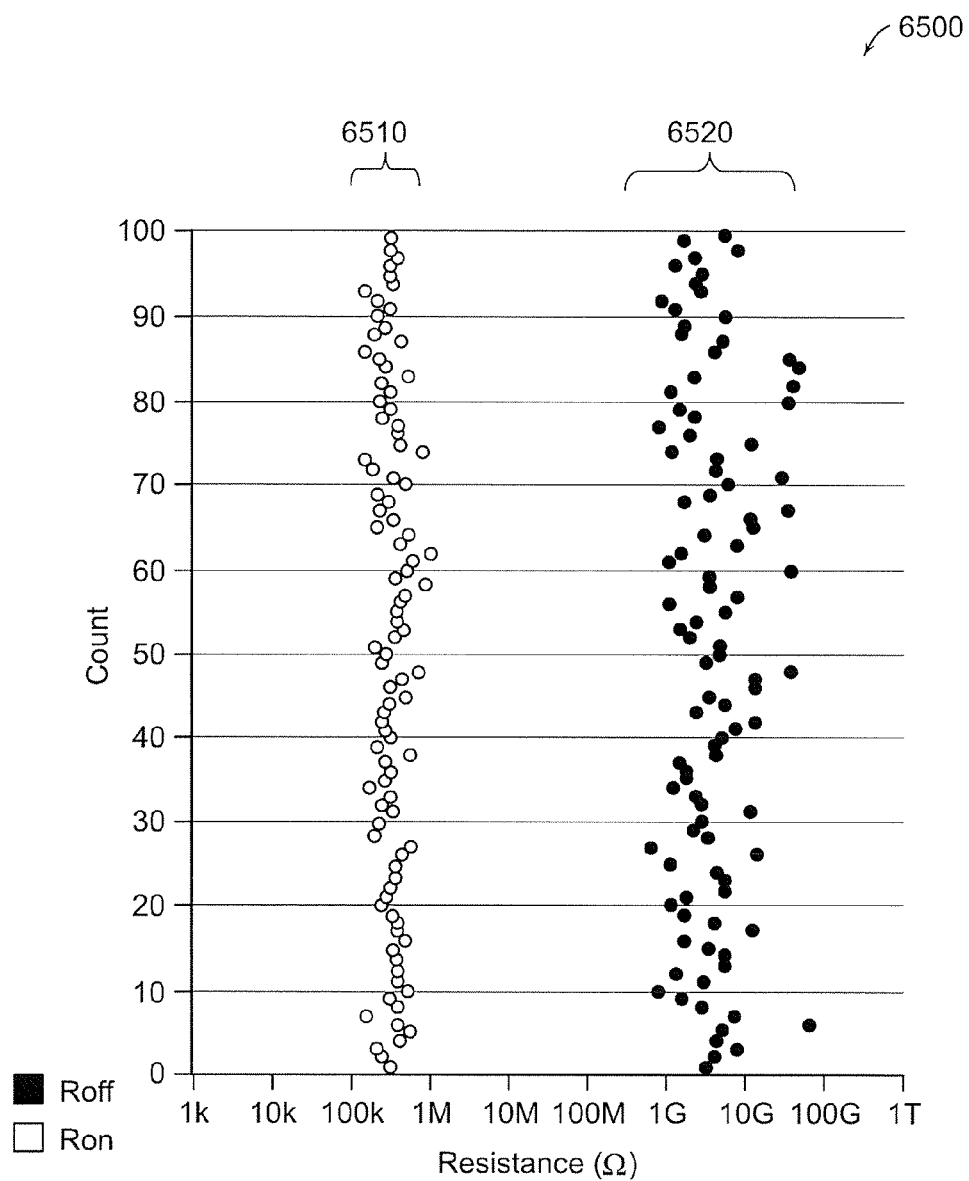
FIG. 65 illustrates electrical ON/OFF switching characteristics of the nonvolatile nanotube block-based switch embodiment illustrated in FIGS. 64A-64C.
Figure 66A:
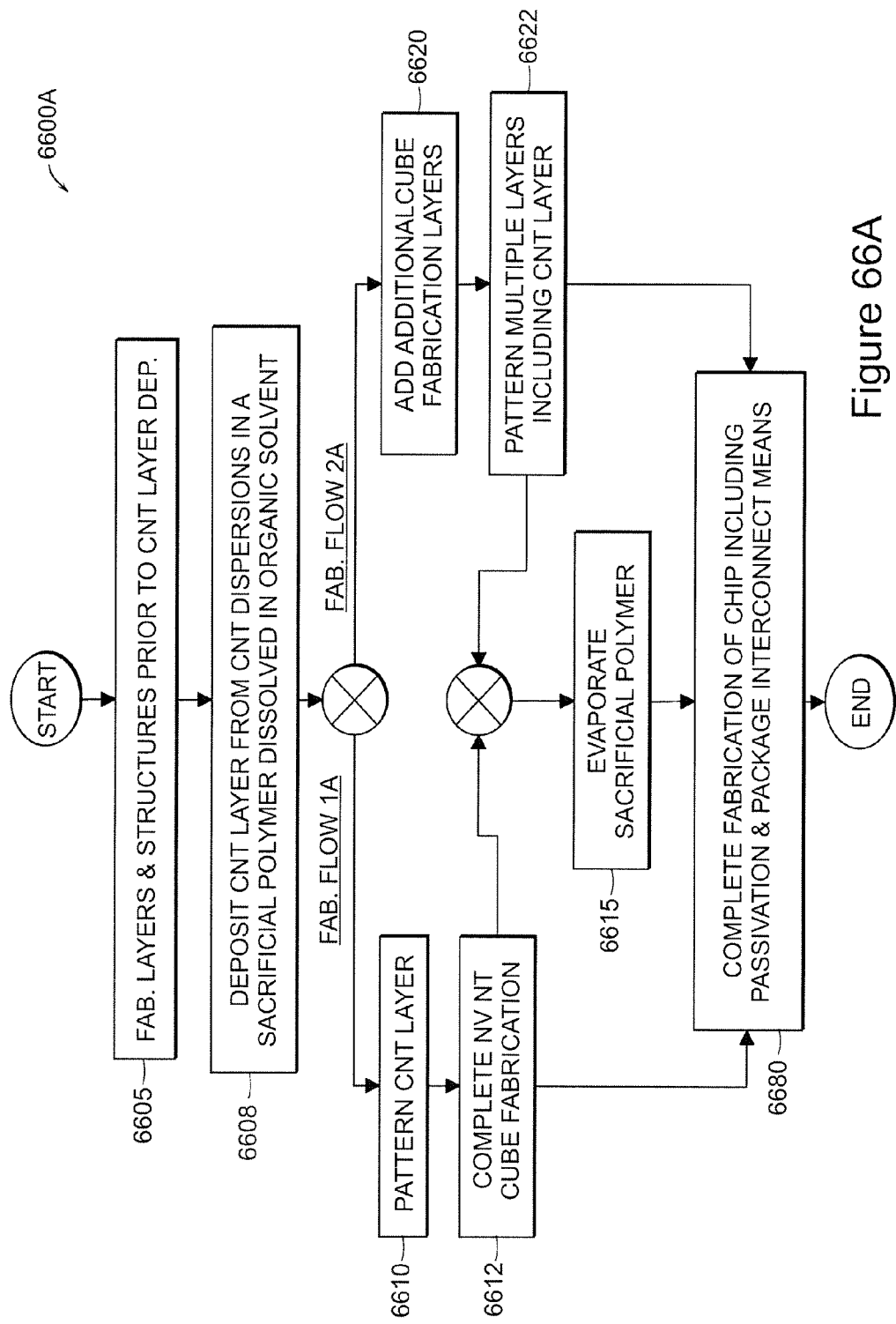
FIGS. 66A-66C illustrate methods of fabrication of nonvolatile nanotube blocks using various nanotube solution types and insulators, according to some embodiments.
Figure 66B:
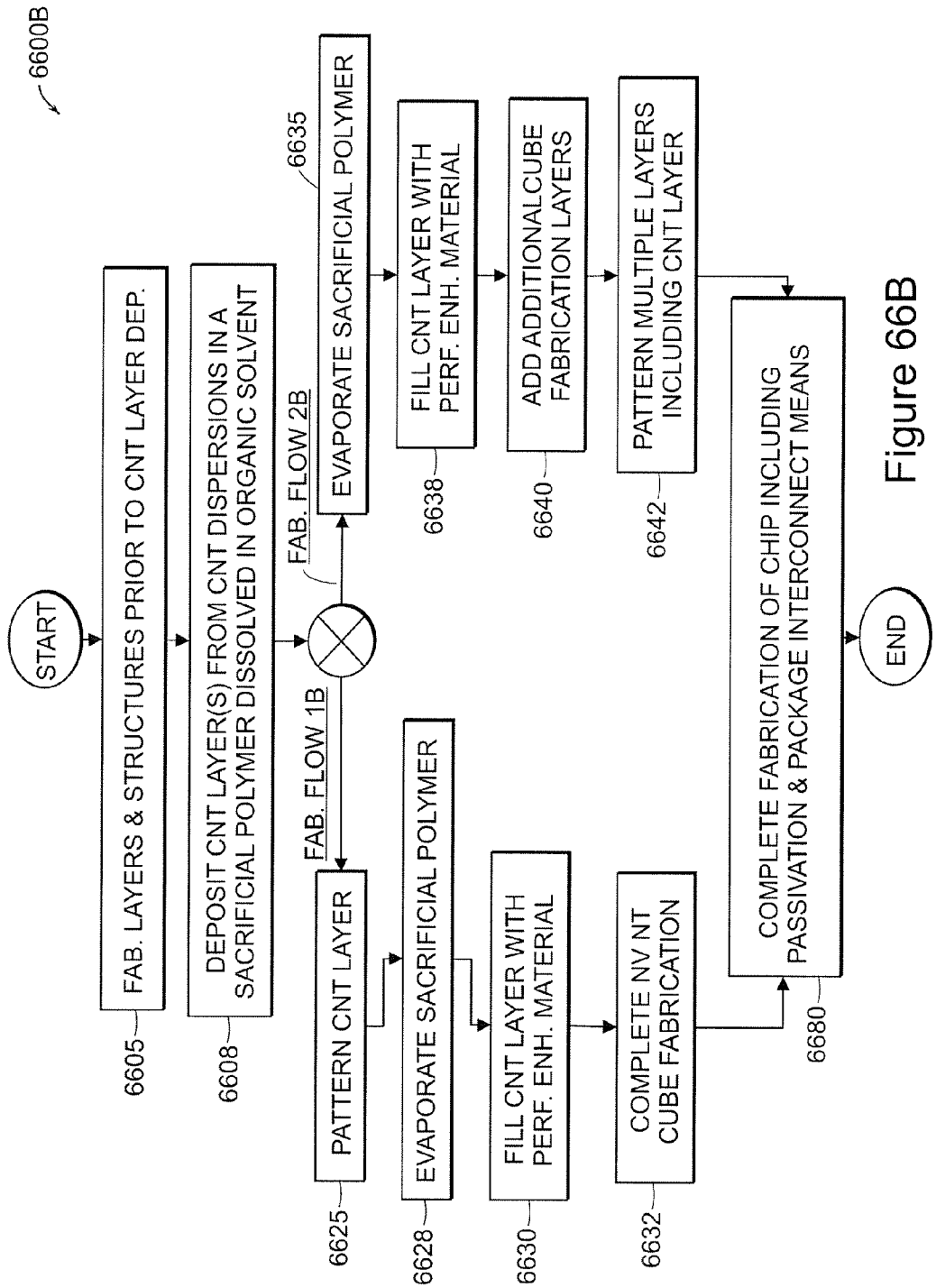
Figure 66C:
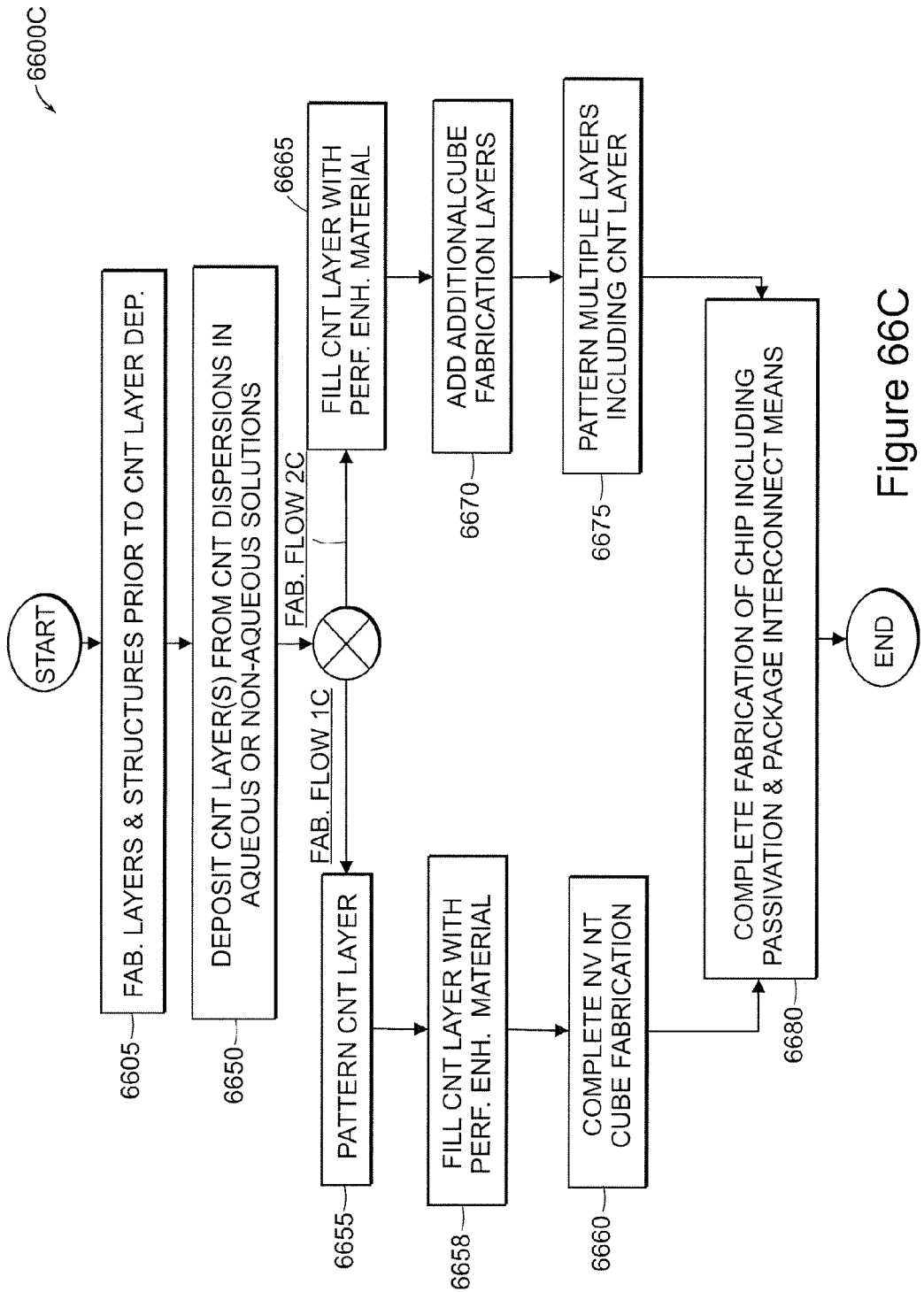

FIGS. 66A-66C illustrate various methods of fabrication of a variety of nonvolatile nanotube blocks, such as those illustrated in FIGS. 40, 47, 49, 56A-56F, 57A-57C, and 58A-65.

Figure 67:
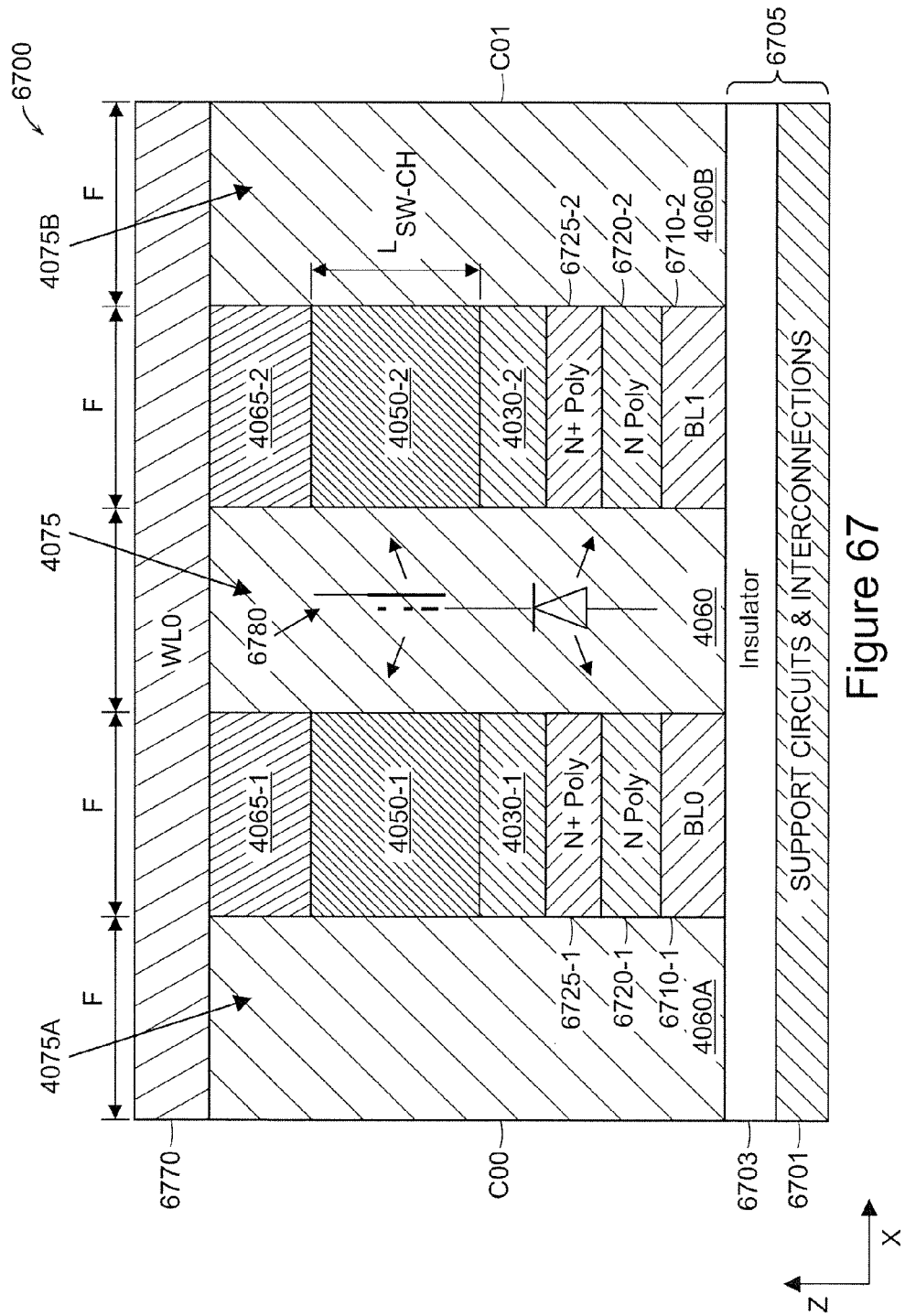
FIG. 67 illustrates a three dimensional cross section along the word line x-direction) of an embodiment of a dense 3D cell structure formed with cathode-to-NT nonvolatile nanotube diodes, with the diode portion of the structure in series with a nonvolatile nanotube block-based switch including a nonvolatile nanotube block within vertical cell boundaries and filling the region within the cell boundaries.
Figure 68A:
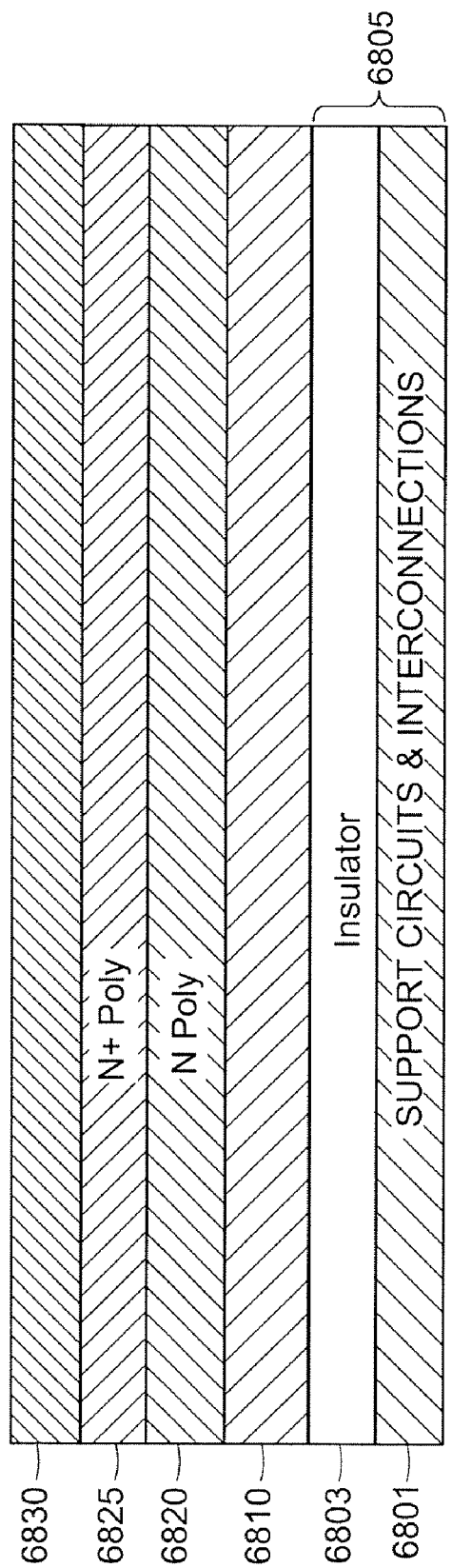
Figure 69:
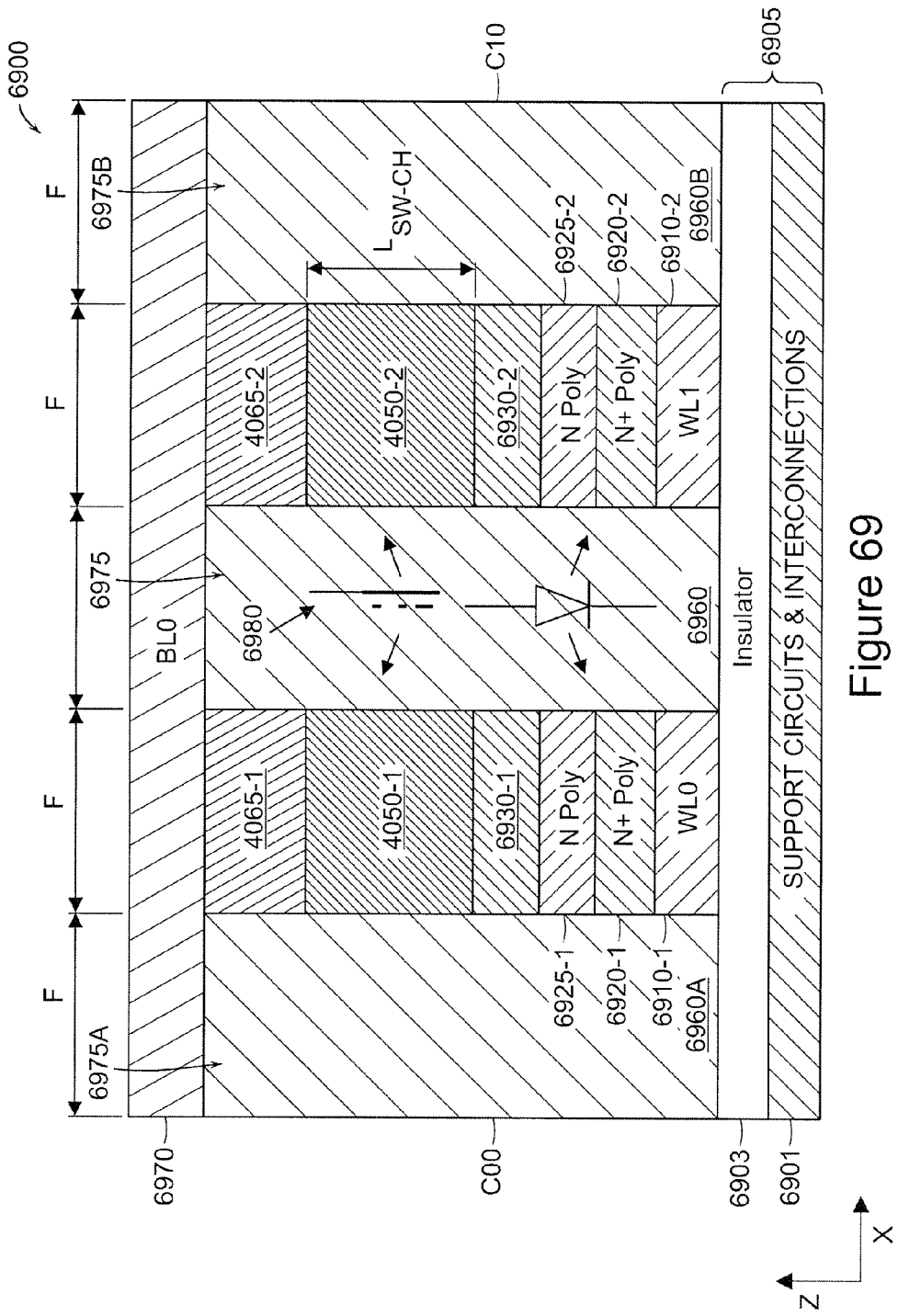
FIG. 69 illustrates a three dimensional cross sectional view along the bit line (Y-direction) of an embodiment of a dense 3-D cell structure formed with anode-to NT nonvolatile nanotube diodes, with the diode portion of the structure in series with a nonvolatile nanotube block-based switch including a nonvolatile nanotube block within vertical cell boundaries and filling the region within the cell boundaries.
Figure 70:
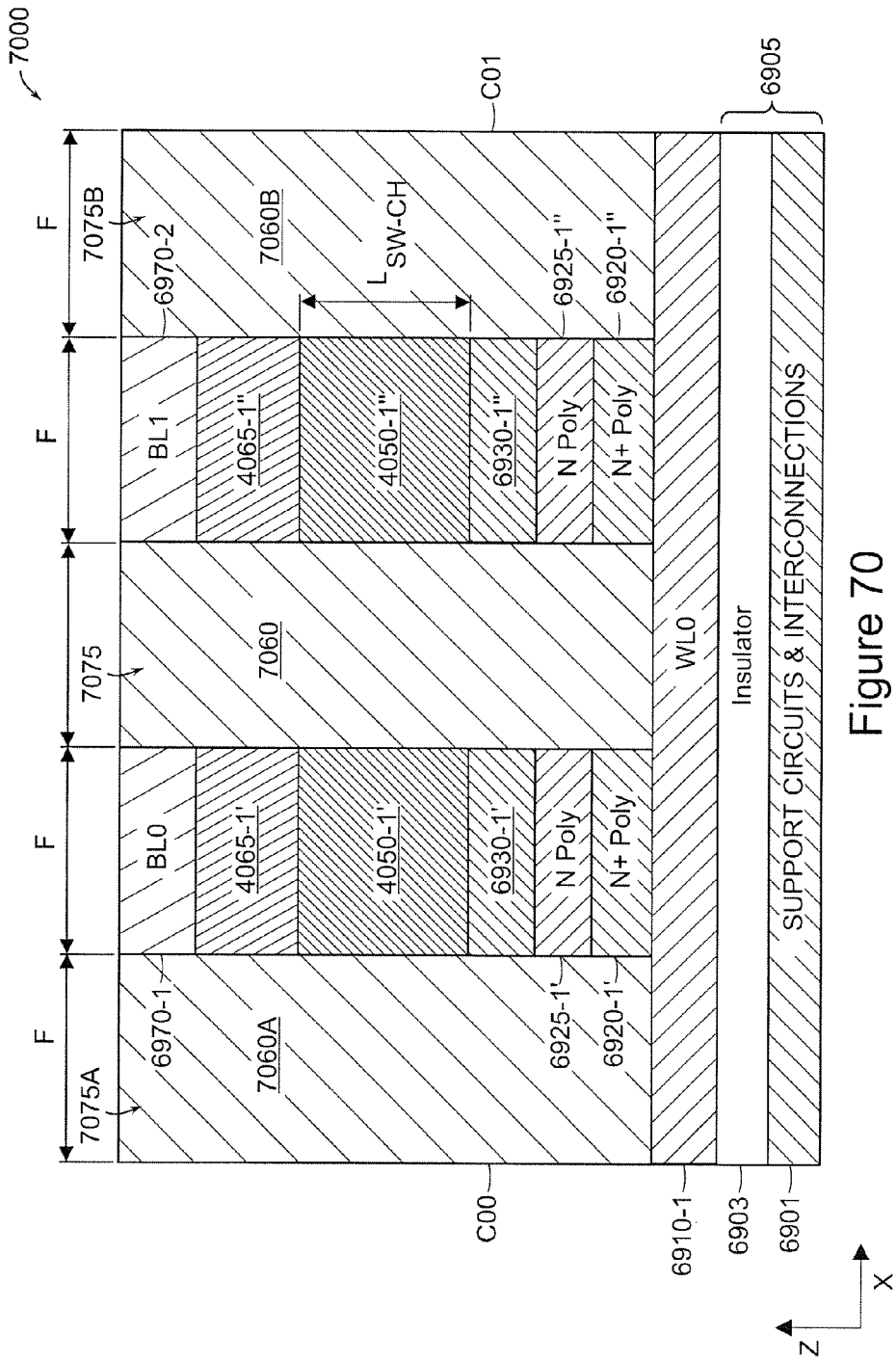
FIG. 70 illustrates a three dimensional cross sectional view along the word line (X-direction) of an embodiment of a dense 3-D cell structure formed with anode-to NT nonvolatile nanotube diodes with the diode portion of the structure in series with a nonvolatile nanotube block-based switch including a nonvolatile nanotube block within vertical cell boundaries and filling the region within the cell boundaries.

FIGS. 67 and 68A-68I illustrate structures and methods of fabricating the memory cell described further above with respect to cross section 4000 illustrated in FIG. 40. FIGS. 67 and 68A-68I are described with respect to cathode-on-NT NV NT diode configurations. FIGS. 69 and 70 illustrate structures of memory cells based on anode-to-NT NV NT diode configurations.

Figure 71:
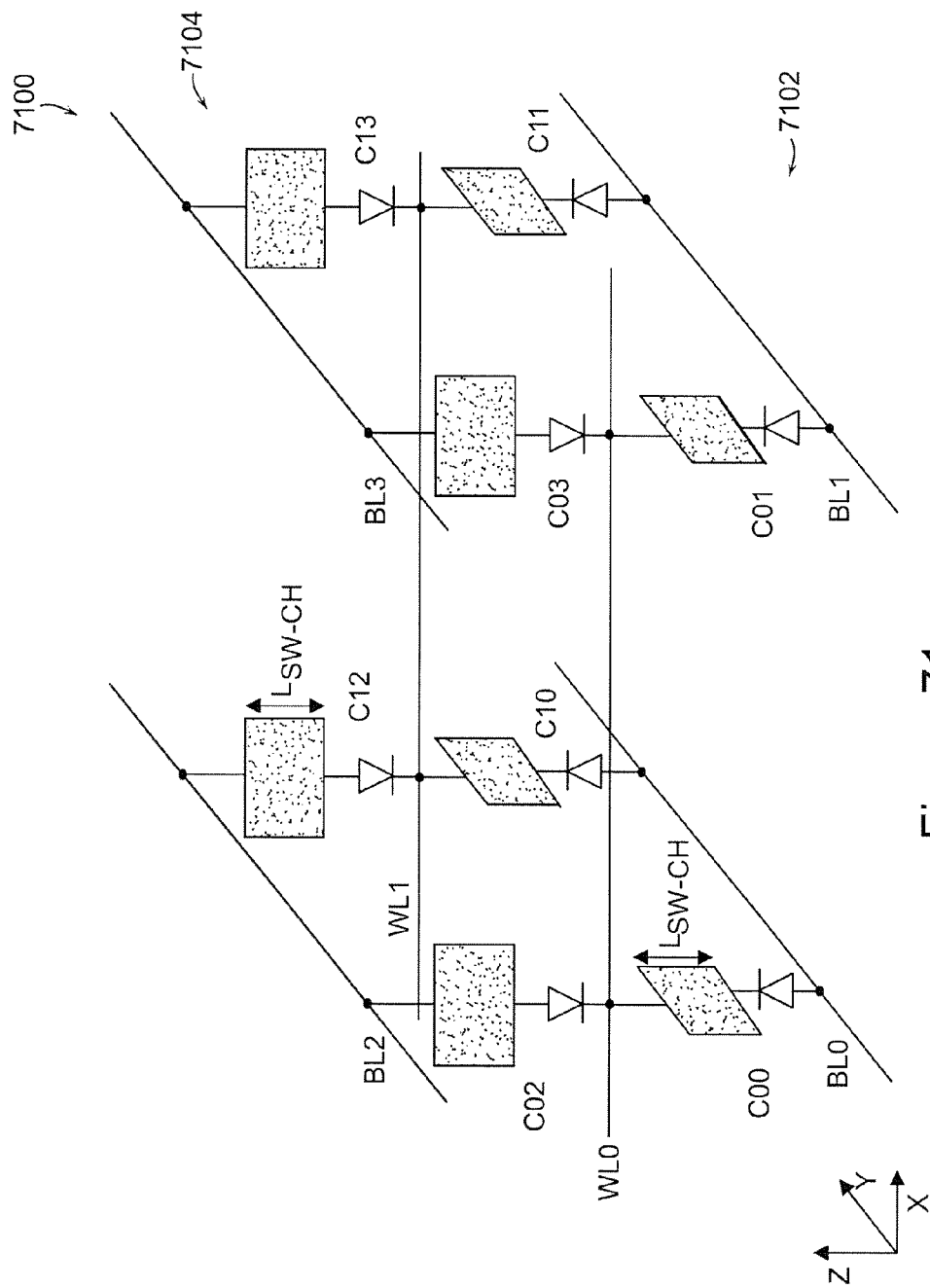
FIG. 71 illustrates a 3D perspective drawing of an embodiment of a two-high stack of three dimensional nonvolatile nanotube block-based switches with top and bottom contacts, and word lines shared between upper and lower arrays.
Figure 72A:
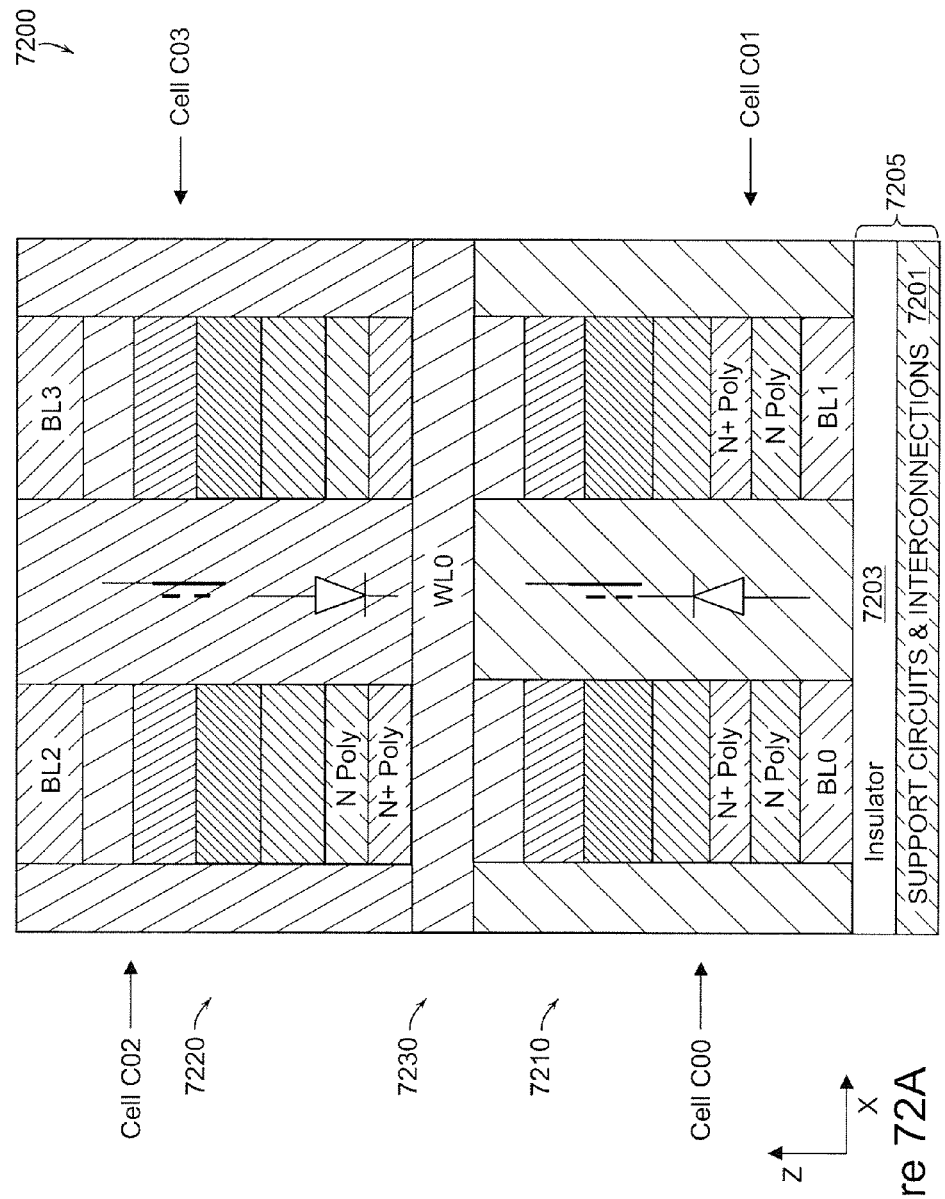
FIG. 72A illustrates a three dimensional cross sectional view along word lines (X-direction) of an embodiment of a two-high stack of three dimensional nonvolatile nanotube block-based switches with top and bottom contacts, and word lines shared between upper and lower arrays.
Figure 72B:
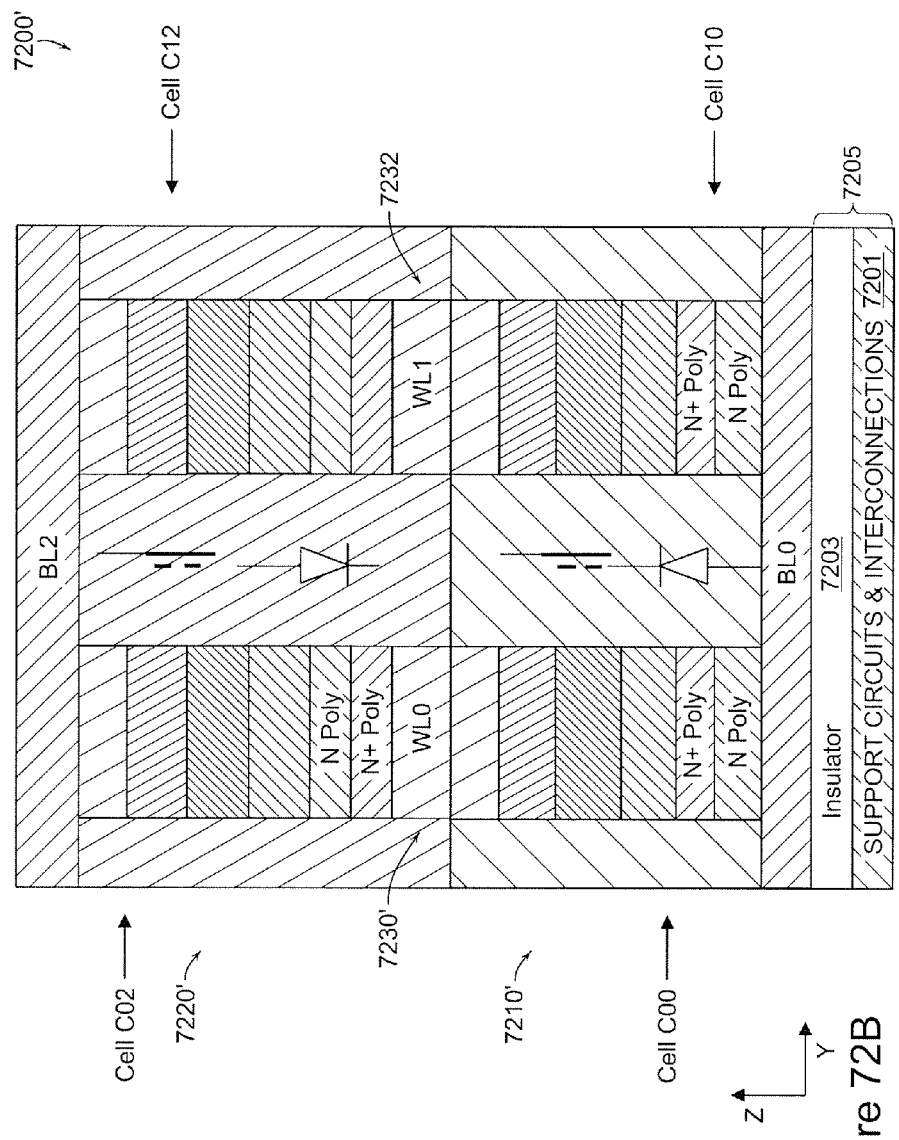
FIG. 72B illustrates a three dimensional cross sectional view along bit lines (Y-direction) of an embodiment of a two-high stack of three dimensional nonvolatile nanotube block-based switches with top and bottom contacts and word lines shared between upper and lower arrays.
Figure 73:
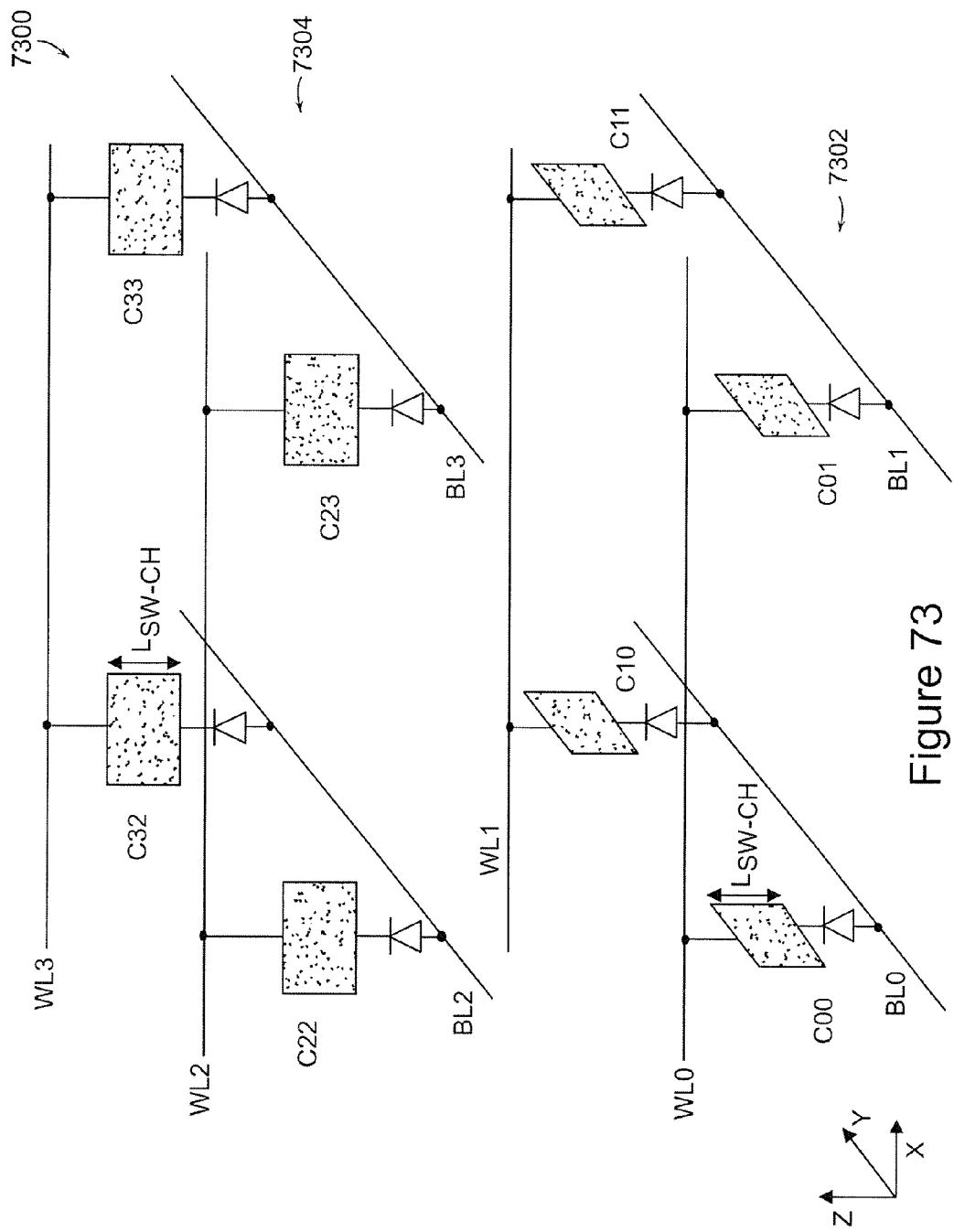
FIG. 73 illustrates a 3D perspective drawing of an embodiment of a two-high stack of three dimensional nonvolatile nanotube block-based switches with top and bottom contacts, with no array lines, such as word lines, shared between upper and lower arrays.
Figure 74:
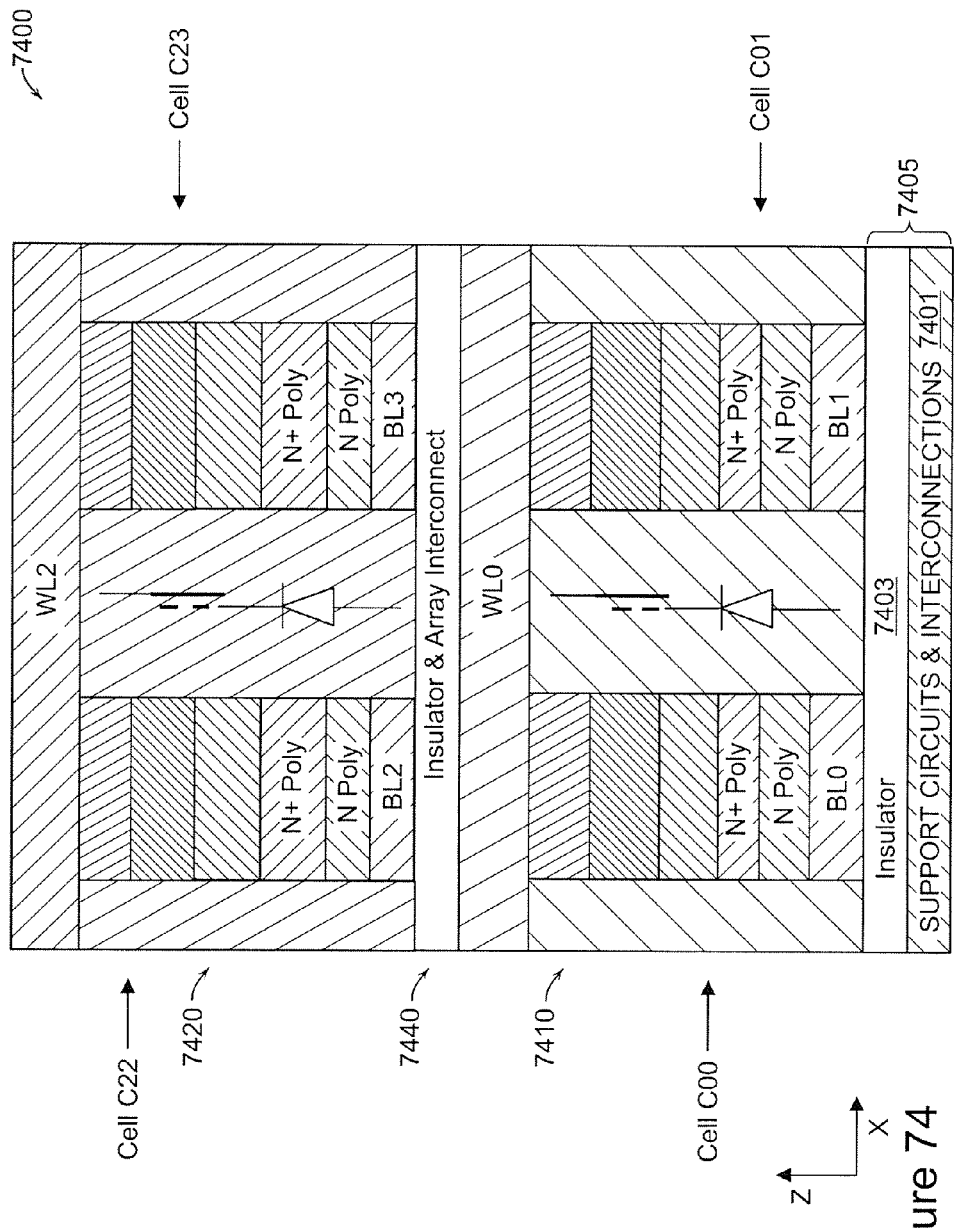
FIG. 74 illustrates a three dimensional cross sectional view along word lines (X-direction) of an embodiment of a two-high stack of three dimensional nonvolatile nanotube block-based switches with top and bottom contacts, and no array lines, such as word lines, shared between upper and lower arrays.

FIGS. 71 and 72A-72B illustrate 2-high stacked arrays of 3-D NV NT diode-based cells that include shared array lines such as shared word lines. FIGS. 73 and 74 illustrate 2-high stacked arrays of 3-D NV NT diode-based cells that do not share array lines such as shared word lines.

FIGS. 75 and 76A-76D illustrate 3-D NV NT diode-based structures and corresponding simplified methods of fabrication. Simplified methods of fabrication enable multi-level arrays of 4, 8, 16 and higher number of levels as illustrated in a perspective drawing illustrated in FIG. 77.

NV NT Switches Fabricated with Nonvolatile Nanotube Blocks, Various Terminal Locations, and Switching Characteristics Thereof NV NT switch 5600A illustrated in 3-D perspective drawing in FIG. 56A shows a NV NT switch with relatively thin (e.g., about 0.5 to less than 10 nm) nonvolatile nanotube element 5602A and top contact locations 5605A and 5607A. Contact locations illustrate where terminals (not shown) contact the surface of nanotube element 5602A. NV NT switch 5600A corresponds to NV NT switch 300 illustrated in FIG. 3, where nanotube element 5602A corresponds to nanotube element 330, contact location 5605A corresponds to the location of terminal 310, and contact location 5607A corresponds to the location of terminal 320.

NV NT switch 5600B illustrated in 3-D perspective drawing in FIG. 56B shows a NV NT switch with thin nonvolatile nanotube element 5602B and bottom contact locations 5605B and 5607B. Contact locations illustrate where terminals (not shown) contact the surface of nanotube element 5602B. NV NT switch 5600B corresponds to NV NT switch 500 illustrated in FIG. 5, where nanotube element 5602B corresponds to nanotube element 530, contact location 5605B corresponds the location of terminal 510, and contact location 5607B corresponds to the location of terminal 520.

NV NT switch 5600C illustrated in 3-D perspective drawing in FIG. 56C shows a NV NT switch with thin nonvolatile nanotube element 5602C and top contact location 5605C and bottom contact location 5607C. Contact locations illustrate where terminals (not shown) contact the surface of nanotube element 5602B. NV NT switch 5600C combines top and bottom contacts to the same nanotube element.

NV NT switch 5600D illustrated in 3-D perspective drawing in FIG. 56D shows a NV NT switch with NV NT block (thick NV NT element) 5610 and contact locations 5612 and 5614. NV NT switch 5600D corresponds to NV NT switch 5800/5800'/5870 having structure and electrical switching results described further below with respect to FIGS. 58A-58D and 59, respectively. In the illustrated embodiment, corresponding switch 5800 is scaled to the technology node used to lithographically define its lateral dimensions. For example, a technology node F=22 nm can provide a switch channel length of approximately 22 nm, and a width of approximately 22 nm for this embodiment. As discussed above, in many embodiments it is desirable to fabricate the switch channel length to be as small as possible, e.g., as small as the technology node allows, although in other embodiments larger channel lengths may be desirable. The thickness of the NV NT block defines the height of the switch 5600D, which in certain embodiments is approximately 10 nm, although other thicknesses are possible as discussed elsewhere. Contact location 5612 in FIG. 56D includes side contact locations 5612-1 and 5612-2, a top contact location 5612-3, and an end contact location (not visible), and corresponds to contacts 5830-1 and 5830-2 in FIGS. 58A-58D. Contact location 5614 includes side contact location 5614-1, a second side contact location (not visible), top contact location 5614-2, and end contact 5614-3, and corresponds to contacts 5840-1 and 5840-2.

NV NT switch 5600E illustrated in 3-D perspective drawing in FIG. 56E shows a NV NT switch with NV NT block 5620 and end-contact locations 5622 and 5625. NV NT block 5620 corresponds to nanotube element 4910, end-contact location 5622 corresponds to end-region contact 4965, and end-contact location 5625 corresponds to end-region contact 4960 illustrated further above with respect to NV NT switch 4900 illustrated in FIG. 49. Switch operation is illustrated in FIG. 50. Also as described further below with respect to NV NT switch 6000/6000'/6050 illustrated in FIGS. 60A-60C, NV NT block 5620 corresponds to nanotube element 6010, end-contact location 5622 corresponds to end-region contact 6040, and end-contact location 5625 corresponds to end-region contact 6030. Electrical switching characteristics are described with respect to FIG. 61.

NV NT switch 5600F illustrated in 3-D perspective drawing in FIG. 56F shows a NV NT switch with NV NT block 5630, bottom contact location 5632, and combined end-contact location 5634 including combined end-contact location 5634-1 and top contact location 5634-2. NV NT switch 5600F corresponds to NV NT switch 6200/6200' described further below with respect to FIGS. 62A-62B. NV NT block 5630 corresponds to NV NT block 6210, bottom contact location 5632 corresponds to bottom contact 6230, and combined end contact location 5634-1 and top contact location 5634-2 correspond to combined end contacts 6240-1 and 6240-2, respectively. Electrical switching characteristics are described with respect to FIG. 63A-63B.

Figure 57A:
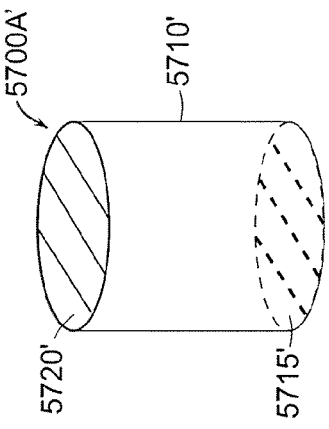
FIGS. 57A-57C illustrate perspective drawings of embodiments of nonvolatile nanotube block-based switches with top and bottom contact locations and various insulator options.

NV NT switch 5700A illustrated in 3-D perspective drawing in FIG. 57A shows a NV NT switch with NV NT block 5710 and bottom contact location 5715 and top contact location 5720. NV NT switch 5700A corresponds to NV NT switch 6400/6400'/6450 having structure and electrical switching results described further below with respect to FIGS. 64A-64C and 65, respectively. NV NT block 5710 corresponds to NV NT block 6410, bottom contact location 5715 corresponds to bottom contact 6427, and top contact location 5720 corresponds to top contact 6437 illustrated in FIG. 64B. Switching results for switch 6400 illustrate no top contact-to-bottom contact shorting though NV NT block at a given thickness, e.g., 35 nm.

NV NT switch 5700A also corresponds to nanotube element 4050 illustrated in FIG. 40 if an F×F masking layer is used in the fabrication. NV NT switch 5700A' illustrated in a 3-D perspective drawing in FIG. 57A' is formed with an approximately round masking layer of diameter F caused by corner-rounding of the drawn image in the masking layer as described further above. NV NT block 5710' is approximately cylindrical in shape with a circular cross section of approximate diameter F, bottom contact location 5715' and top contact location 5720'. The corresponding diode region in cross section 4000 is formed at the same time as nanotube element 4050 and may have a square cross section F×F or a circular cross section of approximately F in diameter. In other words, the 3-D NV NT diode forming the storage cell in cross section 4000 forms a stack with a NV NT block switch on top of a steering (select) diode, with the stack approximately square or approximately circular in cross section shape.

Void regions sufficiently small in size and number as described further above with respect to nanotube layer 3800 illustrated in FIG. 38 can be used in the fabrication of NV NT block 6410 illustrated in FIGS. 64A-64C further below without shorts between bottom contact 5425 and top contact 6435 separated by a given distance, e.g., approximately 35 nm. NV NT block 6410 corresponds to NV NT block 5710 in the 3-D perspective illustration in FIG. 57A.

Figure 57B:
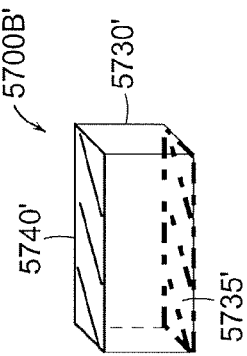

FIG. 57B illustrated in a 3-D perspective drawing shows NV NT switch 5700B in which block 5730 has smaller separation of bottom contact location 5735 and top contact location 5740 than the corresponding separation between corresponding contact locations illustrated in FIG. 57A. The block volume is also shaded indicating that it is fabricated differently than block 5710. Fabrication differences will be described further below with respect to FIGS. 66A-66C. However, a brief summary of significant differences is given. NV NT blocks described with respect to FIGS. 56A-56F, FIG. 57A and FIG. 57A', and corresponding figures described further above, can be fabricated using carbon nanotubes deposited from CMOS compatible, trace metal free standard dispersions in aqueous or non-aqueous solvents as described in greater detail in the incorporated patent references. Such nanotube element layers may be deposited using spin-on coating techniques or spray-on coating techniques. Block 5730 illustrated in FIG. 57B may be fabricated with a sacrificial polymer, for example polypropylene carbonate, dissolved in an organic solvent such as NMP or cyclohexanone described further below with respect to FIGS. 66A-66C. Top terminals are formed in contact with top contact region 5740. The presence of the sacrificial polymer in the NV NT block 5730 structure enables top and bottom contacts to be fabricated in relatively close proximity, e.g., less than about 35 nm, for example about 22 nm or less, e.g., about 10 nm (e.g., about 10-22 nm). After patterning and insulation, the sacrificial polymer (polypropylene carbonate, for example), is evaporated, through an insulating layer, or prior to insulating, leaving substantially no residue, at evaporation temperatures in the range of 200 to 400 deg. C. for example. NV NT switch 5700B' illustrated in FIG. 57B' shows block 5730' after sacrificial polymer material removal (e.g., after evaporation), and with bottom contact region 5735' and top contact region 5740'. NV NT block 5730B' is similar to NV NT block 5700A, except that top and bottom contact regions may be more closely spaced.

Figure 57C:
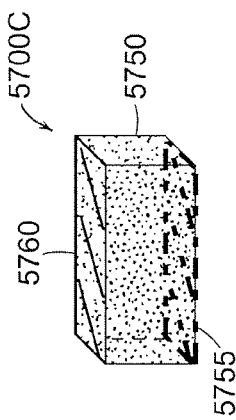
Figure 57A:
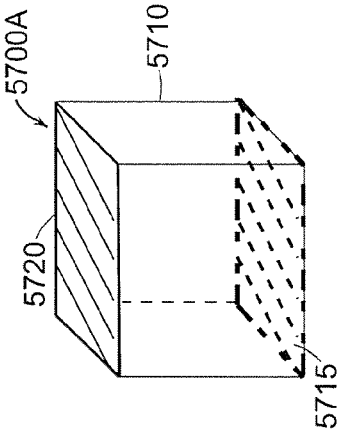
Figure 57B:
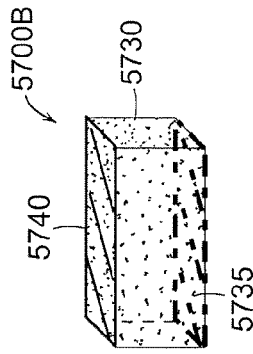

FIG. 57C illustrated in a 3-D perspective drawing shows NV NT switch 5700C in which NV NT block 5750 includes a shaded region indicating that NV NT block 5750 includes additional material between individual nanotubes as described further below with respect to FIGS. 66A-66C. Bottom contact region 5755 formed prior to NV NT block 5750 deposition, and top contact region 5760 is formed after NV NT block 5750 deposition. This additional material may enhance performance characteristics of NV NT block 5750. Such additional material may be a polymer such as polypropylene carbonate that is not evaporated and remains as part NV NT block 5750 structure. Alternatively, polypropylene carbonate may have been evaporated as illustrated in FIG. 57B' and the NV NT block 5730' then filled with a porous dielectric material prior to top contact formation to enhance the switching properties of NV NT switch 5700C.

NV NT Switches Fabricated with Nonvolatile Nanotube Block Dimensions Scaled to the Technology Node FIG. 58A illustrates a top view of NV NT Switch 5800 and FIG. 58B illustrates cross section 5800' corresponding to cross section Z1-Z1' shown in FIG. 58A. In certain embodiments, nonvolatile nanotube block 5810 on substrate 5820 has an overall length of approximately 800 nm, a width of approximately 24 nm, and a thickness of approximately 10 nm. As discussed above, cross section dimensions are typically determined by the technology node, however, thickness dimensions orthogonal to the cross section may not correspond to the technology node. Terminal 5825 contacts NV NT block 5810 at end-contact (end-region contact) 5830-1 and top contact 5830-2. Side contacts (not shown) are also used as illustrated in a corresponding 3-D illustration in FIG. 56D. Terminal 5835 contacts NV NT block 5810 at end-contact 5840-1 and top contact 5840-2. Side contacts (not shown) are also used as illustrated in a corresponding 3-D illustration in FIG. 56D. NV NT switch 5800/5800' channel length $L_{SW\text{-}CH}$ is determined by the separation of terminals 5825 and 5835, which is approximately 22 nm for example. Switch channel width $W_{SW\text{-}CH}$ is approximately 24 nm for example, and is determined by etching. Film thickness $H_{SW\text{-}CH}$ is approximately 10 nm as deposited, for example. The electrical performance of block 5810 is determined in part by a NV NT network contained in a volume of approximately 22 nm ($L_{SW\text{-}CH}$)×24 nm ($W_{SW\text{-}CH}$)×10 nm ($H_{SW\text{-}CH}$), in some embodiments, and corresponds to a NV NT switch formed with a NV NT block scaled to a technology node F of 22 nm. In this example, terminals 5825 and 5835 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Substrate 5820 may be an insulator such as ceramic or glass, a semiconductor with an insulated surface, a metal with an insulated surface, or an organic rigid or flexible substrate.

Figure 58D:
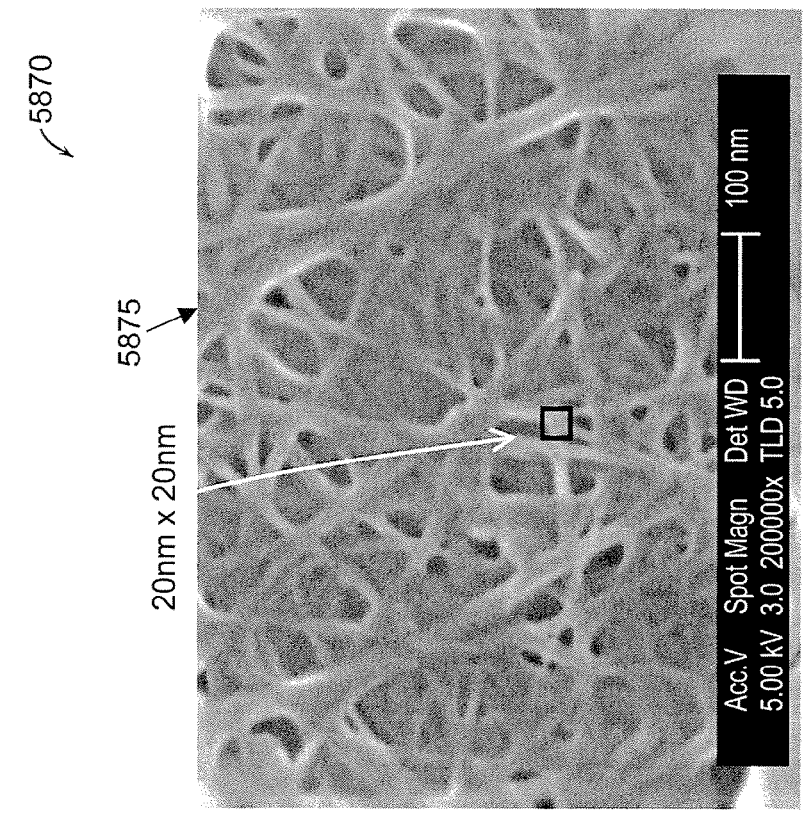
Figure 58C:
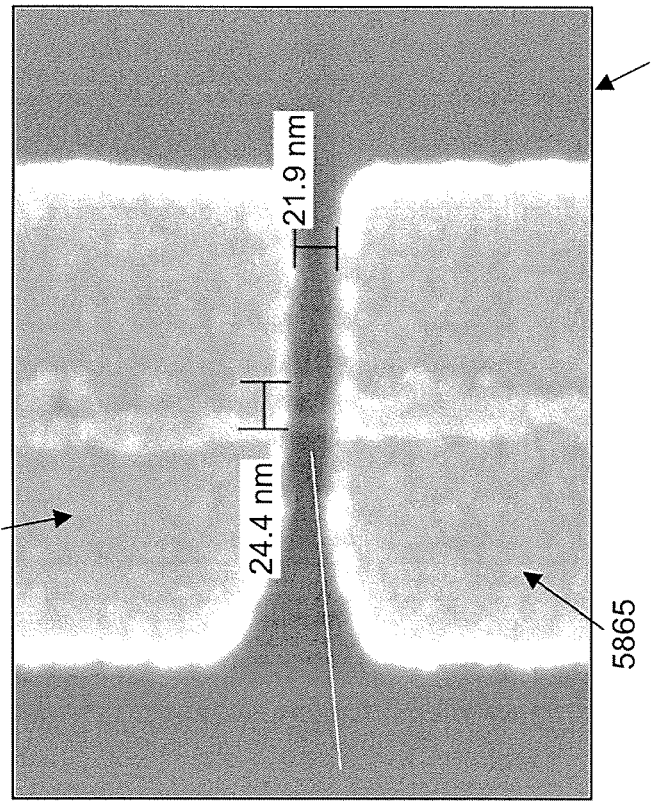

FIG. 58C illustrates a SEM image of an exemplary nonvolatile nanotube switch 5850 prior to passivation and corresponds to nonvolatile nanotube switches 5800/5800' illustrated in FIGS. 58A and 58B. Nonvolatile nanotube switch 5850 includes NV NT block 5855 corresponding to NV NT block 5810, terminal 5860 corresponding to terminal 5825, terminal 5865 corresponding to terminal 5835, and substrate 5868 corresponding to substrate 5820. Nonvolatile nanotube switch 5850 has been fabricated with terminal-to-terminal channel length $L_{SW-CH}$ of 21.9 nm, channel width $W_{SW-CH}$ of 24.4 nm as illustrated in FIG. 58C, and thickness of approximately 10 nm (not shown in FIG. 58C). FIG. 58D illustrates an SEM image of nanotube layer 5875 used to form NV NT block 5855. Nanotube layer 5875 was deposited using 18 spin-on depositions of nanotubes in an aqueous solvent and had a four point probe resistance measured value of 150 ohms. The SEM of nanotube layer 5875 cannot resolve individual nanotubes, which typically have diameters in the range of about 0.5 nm to about 10 nm depending on nanotube type such as SWNTs, DWNTs, and MWNTs, or a mix thereof. Nanotubes in the SEM image appear much larger than their actual diameters. Nanotube layer 5875 was formed using both semiconducting and metallic-type nanotubes.

Figure 59:
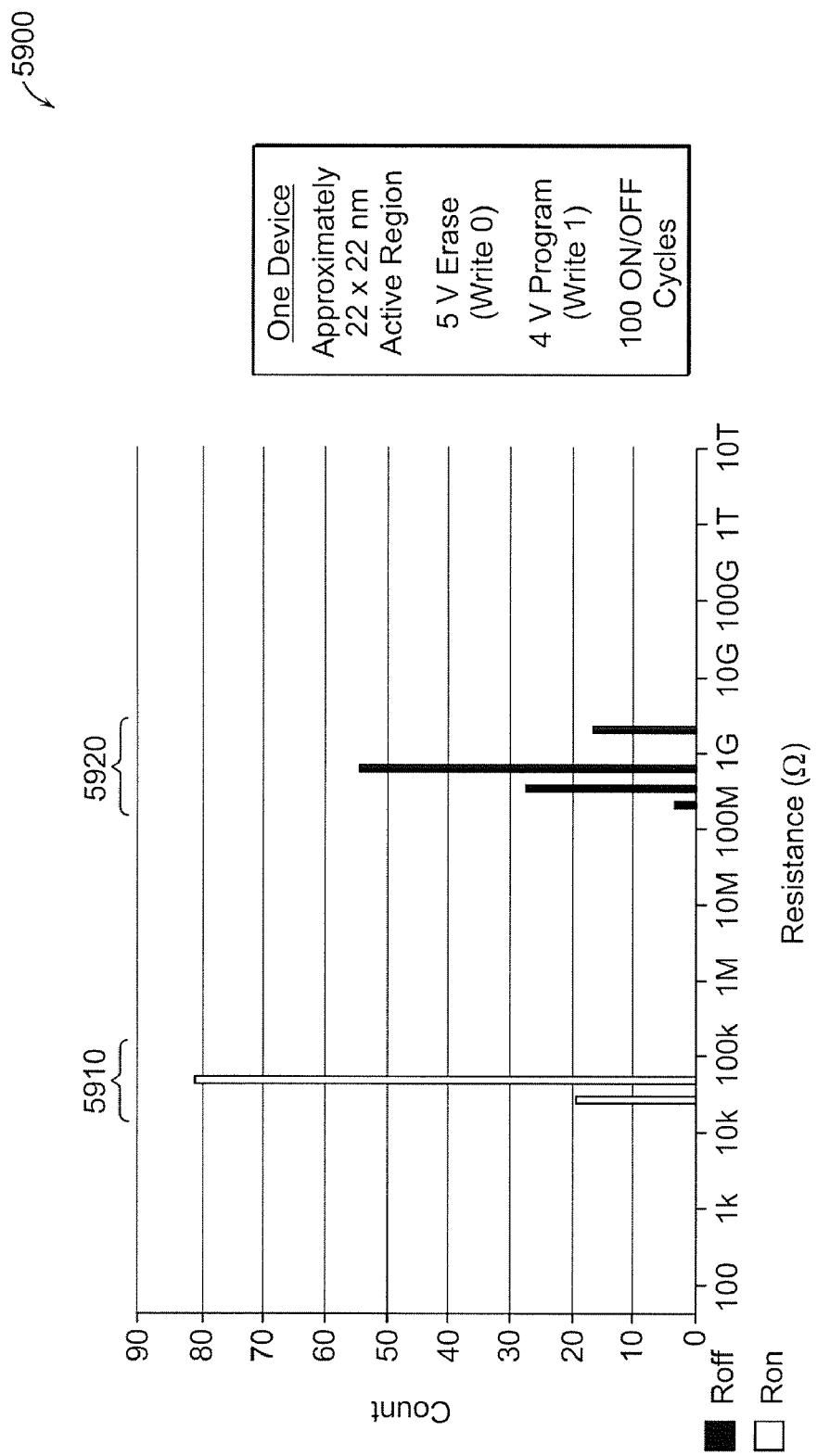
FIG. 59 illustrates electrical ON/OFF switching characteristics for the nonvolatile nanotube block-based switch embodiment illustrated in FIGS. 58A-58D.

Laboratory testing results of nonvolatile nanotube switch 5850 is illustrated by graph 5900 illustrated in FIG. 59. Nonvolatile nanotube switch 5850 switching results for 100 ON/OFF cycles shows that most ON resistance values 5910 are in a range of 50 kOhms to 75 kOhms, and OFF resistance values 5920 are greater than 500 MOhms. Laboratory testing was similar to testing described further above with respect to FIGS. 11A-11B.

NV NT Switches Fabricated with Nonvolatile Nanotube Blocks with End Contacts

FIG. 60A illustrates a top view of NV NT Switch 6000 and FIG. 60B illustrates cross section 6000' corresponding to cross section Z2-Z2' shown in FIG. 60A that includes NV NT block 6010 with only end contacts. Nonvolatile nanotube block 6010 on substrate 6020 also includes a protective insulator 6015. In an illustrative embodiment, protective insulator 6015 is an $SiO_2$ oxide of thickness 100 nm and 250 nm by 250 nm in size, although in general other dimensions and insulating materials may be used. Protective insulator 6015 can be used as a masking layer to pattern NV NT block 6010 to desired dimensions, e.g., 250×250 nm lateral dimension in the illustrated embodiment. NV NT 6010 has a given thickness, e.g., approximately 50 nm. Terminal 6025 contacts NV NT block 6010 at end-contact (end-region contact) 6030. Terminal 6035 contacts NV NT block 6010 at end-contact 6040. In the embodiments illustrated in FIGS. 60A and 60B, NV NT switch channel length $L_{SW-CH}$ and $W_{SW-CH}$ are directly related to the lateral dimensions of NV NT block 6010, e.g., both are approximately 250 nm using the example block dimensions provided above. Terminals 6025 and 6035 overlap protective insulator 6015 as fabricated, however, the overlap region has substantially no effect on electrical operation. NV NT switch 5600E is a 3-D representation in FIG. 56E corresponding to NV NT switch 6000/6000' in FIGS. 60A and 60B, with NV NT switch 5620 corresponding to NV NT block 6010. The electrical performance of block 6010 is determined by a NV NT network contained in the volume of the block, e.g., approximately 250 nm ($L_{SW-CH}$)×250 nm ($W_{SW-CH}$)×50 nm ($H_{SW-CH}$), using the example dimensions provided above. In this example, terminals 6025 and 6035 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Substrate 6020 may be an insulator such as ceramic or glass, a semiconductor with an insulated surface, a metal with an insulated surface, or an organic rigid or flexible substrate.

Figure 60C:
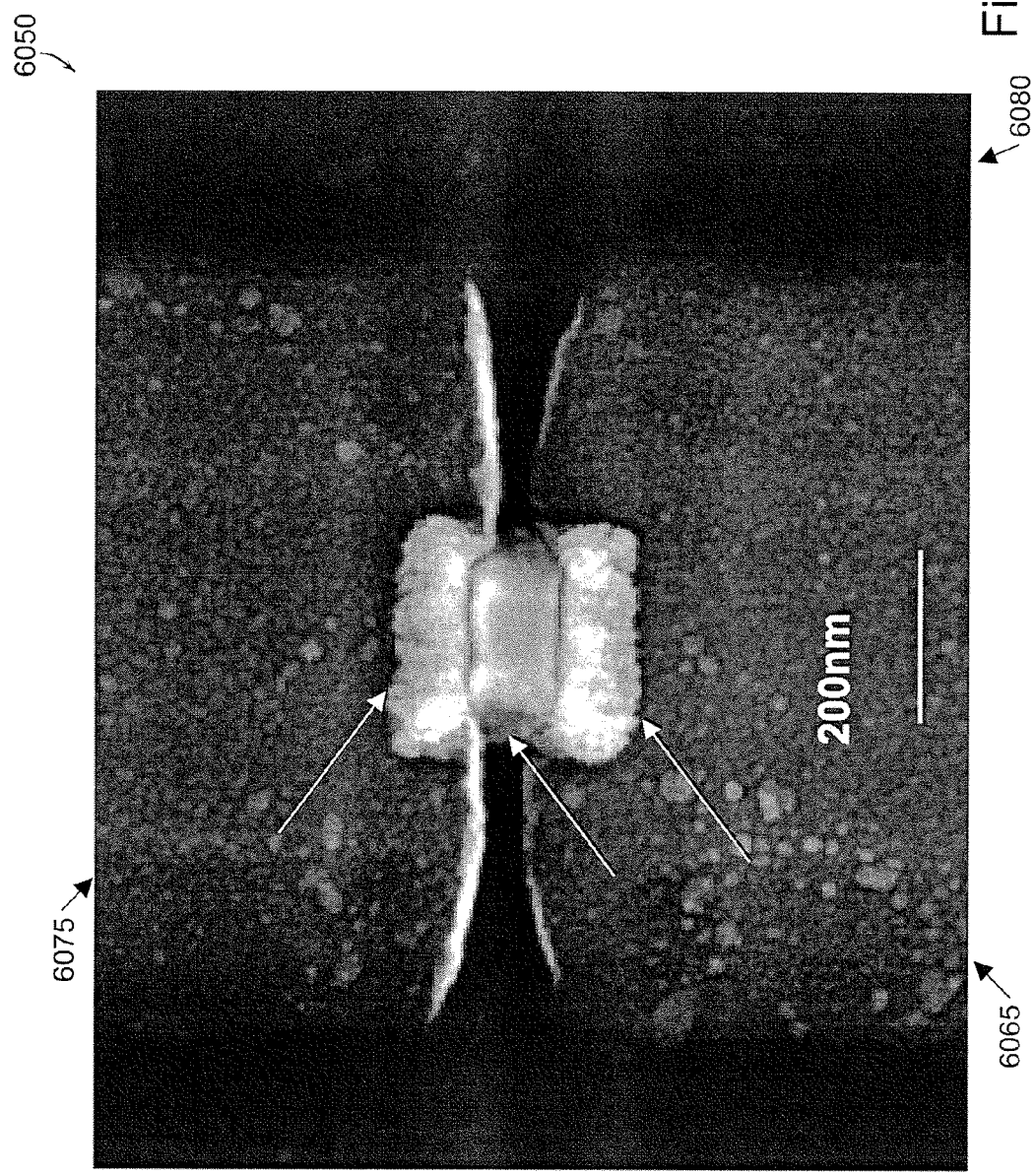

FIG. 60C illustrates a SEM image of nonvolatile nanotube switch 6050 prior to passivation and corresponds to nonvolatile nanotube switch 6000/6000' illustrated in FIGS. 60A and 60B. Nonvolatile nanotube switch 6050 includes NV NT block 6010 (not visible in this top view), exposed portion of protective insulator 6055 corresponding to protective insulator 6015, terminal 6065 and overhang region 6060 corresponding to terminal 6025, terminal 6075 and overhang region 6070 corresponding to terminal 6035, and substrate 6080 corresponding to substrate 6020. Nonvolatile nanotube switch 6050 has been fabricated with terminal-to-terminal channel length $L_{SW-CH}$ of approximately 250 nm, channel width $W_{SW-CH}$ of approximately 250 nm, and a thickness of approximately 50 nm (not shown in FIG. 60C).

NV NT switch 6000/6000' corresponds to NV NT switch 4900 described further above with respect to FIG. 49 but providing more details on the NV NT switch structure, including an SEM image. NV NT block 6010 corresponds to nanotube element 4910, protective insulator 6015 corresponds to protective insulator 4935, terminals 6025 and 6035 correspond to terminals 4940 and 4950, respectively, except that terminals 6025 and 6035 also include regions that overlap protective insulator 6015. End contacts (end-region contacts) 6030 and 6040 correspond to end-region contacts 4960 and 4965, respectively, and substrate 6020 corresponds to a combination of insulator 4920 and substrate 4930.

Figure 61:
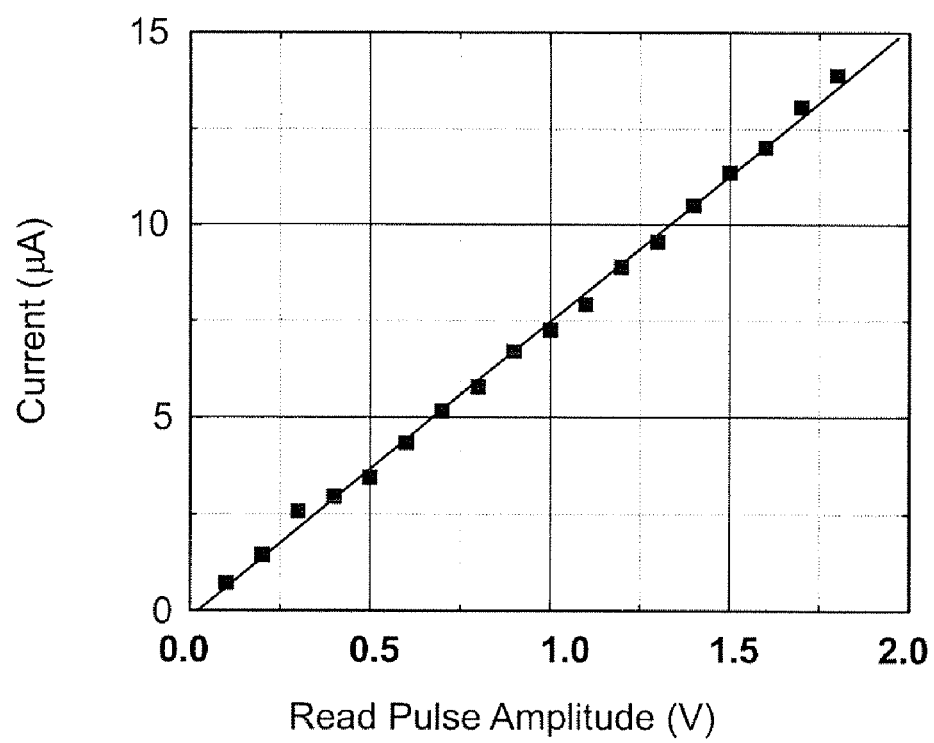
FIG. 61 illustrates the near-ohmic electrical resistance of the nonvolatile nanotube block-based switch embodiment illustrated in FIGS. 60A-60C in the ON state.

Laboratory ON/OFF switching test results of nanotube switch 6050 with only end-region contacts corresponds to the electrical characteristics of NV NT switch 4900 described further above with respect to graph 5000 illustrated in FIG. 50. Nonvolatile nanotube switch 4900 switching results for 100 ON/OFF cycles shows that most ON resistance values are in range of 10 kOhms to 100 kOhms with a few ON resistance values of 800 kOhms as illustrated by resistance values 5010, and OFF resistance values are in the range of 500 MOhms to 100 GOhms as illustrated by resistance values 5020. In a few cases 5030, ON resistance values were greater that 100 MOhms. I-V characteristics of NV NT switch 6050 in the ON state are illustrated by graph 6100 in FIG. 61 showing a near-ohmic ON resistance behavior.

Figure 62A:
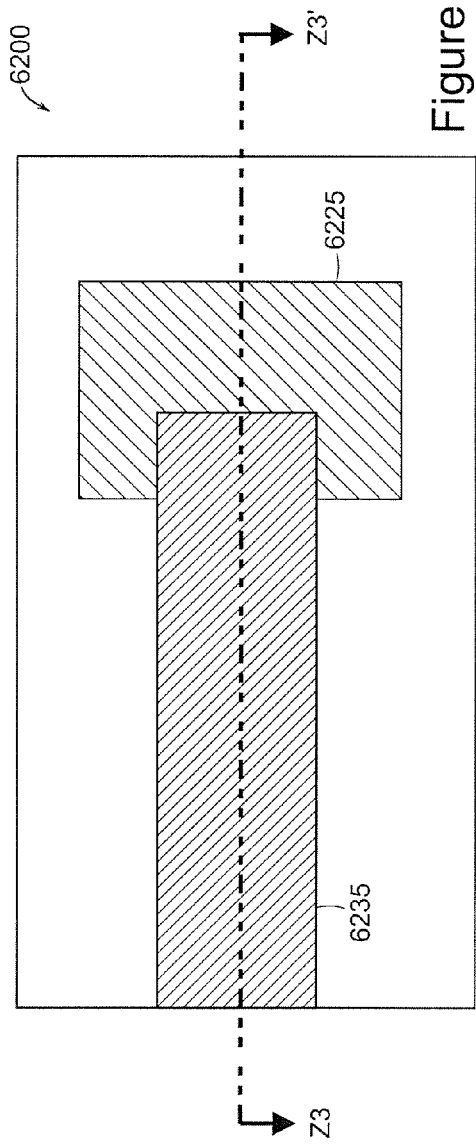
FIGS. 62A-62B illustrate a cross sectional drawing of an embodiment of a nonvolatile nanotube block-based switch with a bottom contact and a combined top and end contact.
Figure 62B:
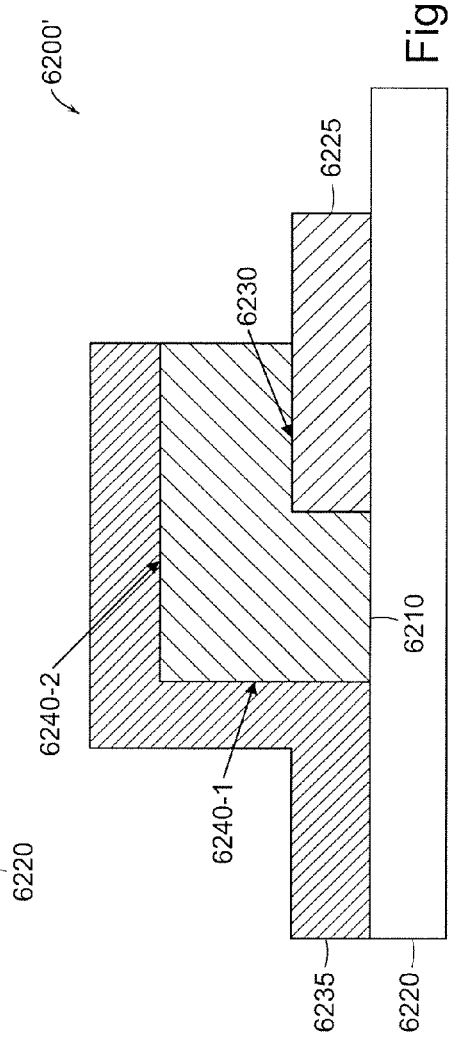

NV NT Switches Fabricated with Nonvolatile Nanotube Blocks with Bottom and End/Top Contacts FIG. 62A illustrates a top view of NV NT Switch 6200 and FIG. 62B illustrates cross section 6200' corresponding to cross section Z3-Z3' shown in FIG. 62A. In one embodiment, nonvolatile nanotube block 6210 on substrate 6220 has dimensions of approximately 100×80 nm in cross section and 50 nm high, although other dimensions are possible. Bottom terminal 6225 forms bottom contact 6230 and terminal 6235 forms combined end contact 6240-1 and top contact 6240-2. Bottom contact 6230 and top contact 6240-2 overlap by approximately 150 nm. NV NT switch 6200 channel length $L_{SW-CH}$ is not well defined in this configuration because of the placement of terminals 6225 and 6235 contacts to NV NT block 6210. Switch 6200 is illustrated in a corresponding 3-D perspective drawing in FIG. 56F, where NV NT block 5630 corresponds to NV NT block 6210, bottom contact location 5632 corresponds to bottom contact 6225, end contact location 5634-1 corresponds to end contact 6240-1, and top contact location 5634-2 corresponds to top contact 6240-2. In this example, terminals 6225 and 6235 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Substrate 6220 may be an insulator such as ceramic or glass, a semiconductor with an insulated surface, a metal with an insulated surface, or an organic rigid or flexible substrate.

Figure 63A:
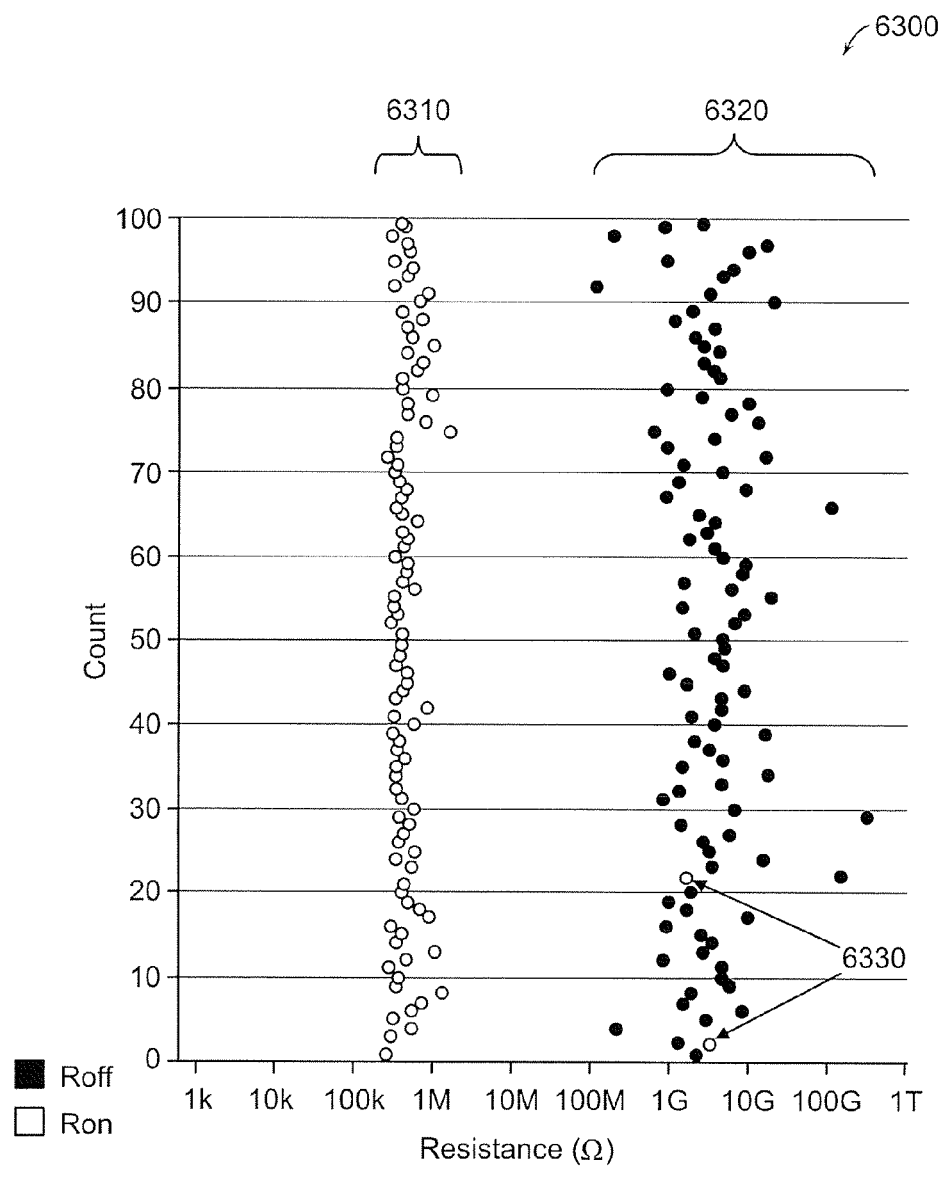
FIGS. 63A-63B illustrate electrical ON/OFF switching characteristics of the nonvolatile nanotube block-based switch embodiment illustrated in FIGS. 62A-62B.
Figure 63B:
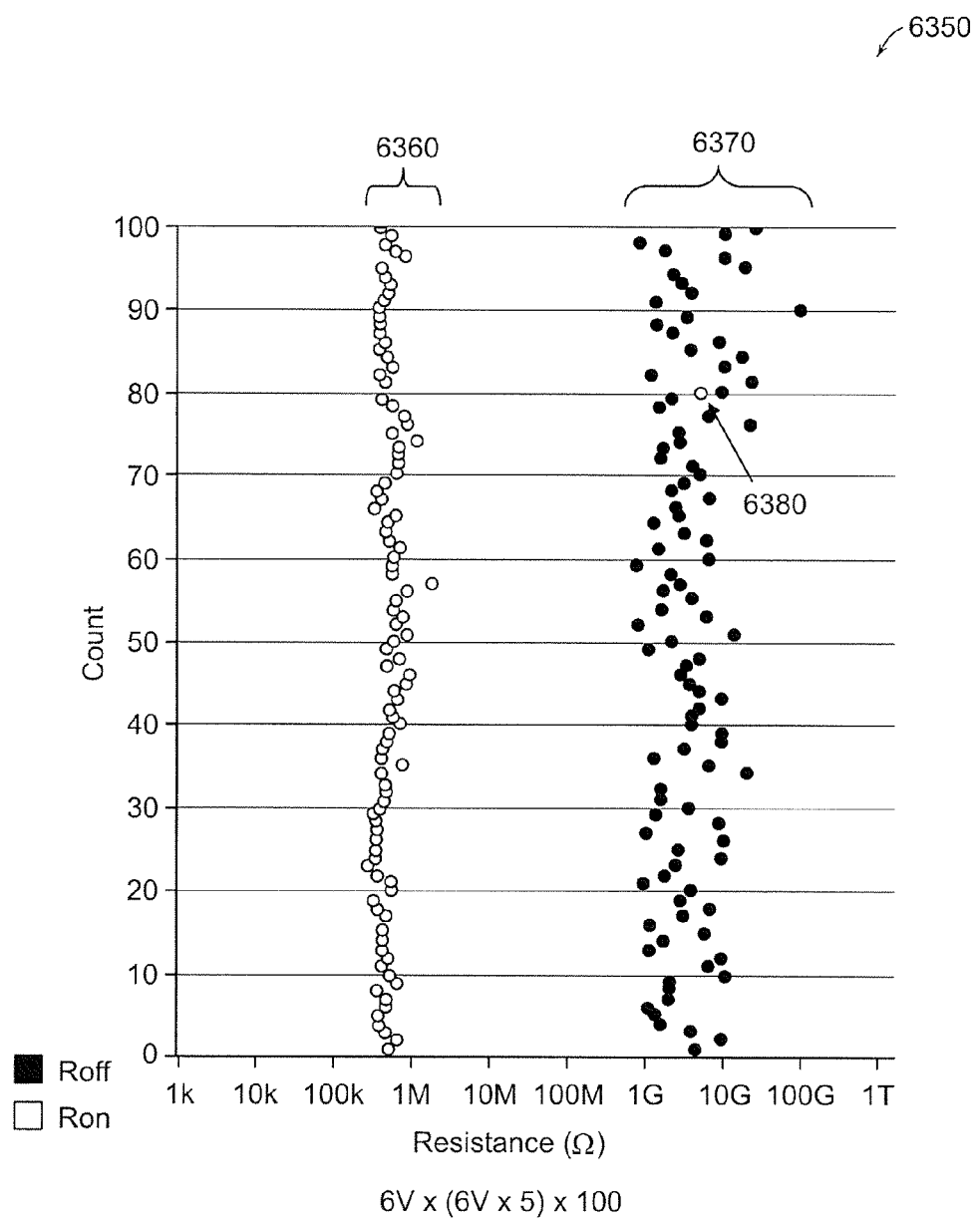

Laboratory ON/OFF switching test results of nanotube switch 6200/6200' are described with respect to graph 6300 illustrated in FIG. 63A and graph 6350 illustrated in FIG. 63B. Test conditions are similar to those described further above with respect to FIGS. 11A-11B; write 0 corresponds to erase, and write 1 corresponds to program. Graph 6300 tests apply one write 0 voltage pulse of 6 volts, one write 1 voltage pulse of 6 V, and measure ON resistance at each ON/OFF cycle for 100 cycles. ON resistance values 6310 are in the 120 kOhm to 1 MOhm range and OFF resistance values 6320 are above 100 MOhms. In two cases, ON resistance values 6330 exceeded 1 GOhm indicating failure to switch to the ON state. Graph 6350 tests apply one write 0 voltage pulse of 6 volts, five write 1 voltage pulses of 6 V, and measure ON resistance at each ON/OFF cycle for 100 cycles. ON resistance values 6360 are in the 130 kOhm to 1 MOhm range and OFF resistance values 6370 are above 800 MOhms. In one case, ON resistance values 6380 exceeded 1 GOhm indicating failure to switch to the ON state.

Figure 64A:
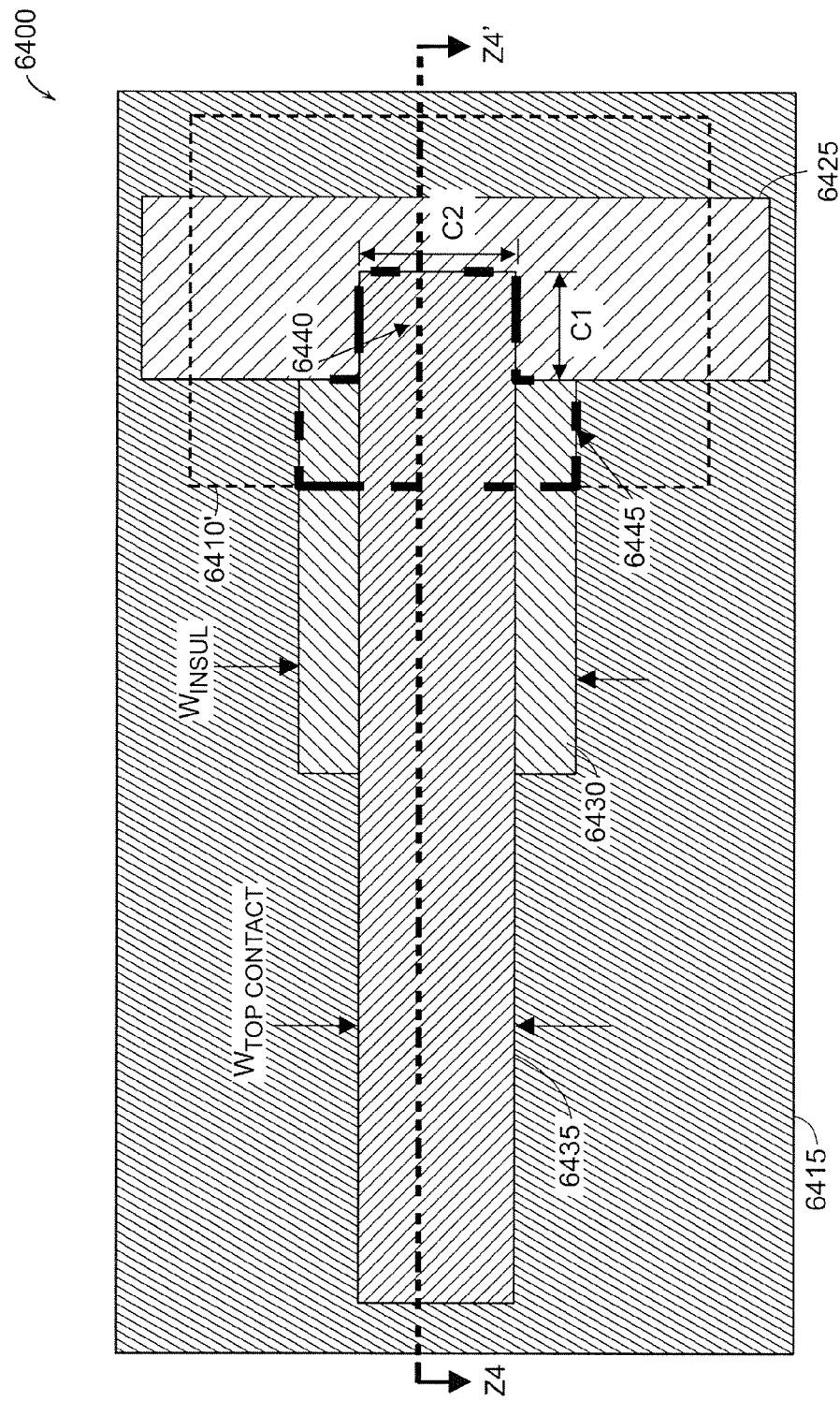
FIGS. 64A-64C illustrate a plan view drawing, a cross sectional drawing, and an SEM image of an embodiment of a nonvolatile nanotube block-based switch with top and bottom contacts.
Figure 64B:
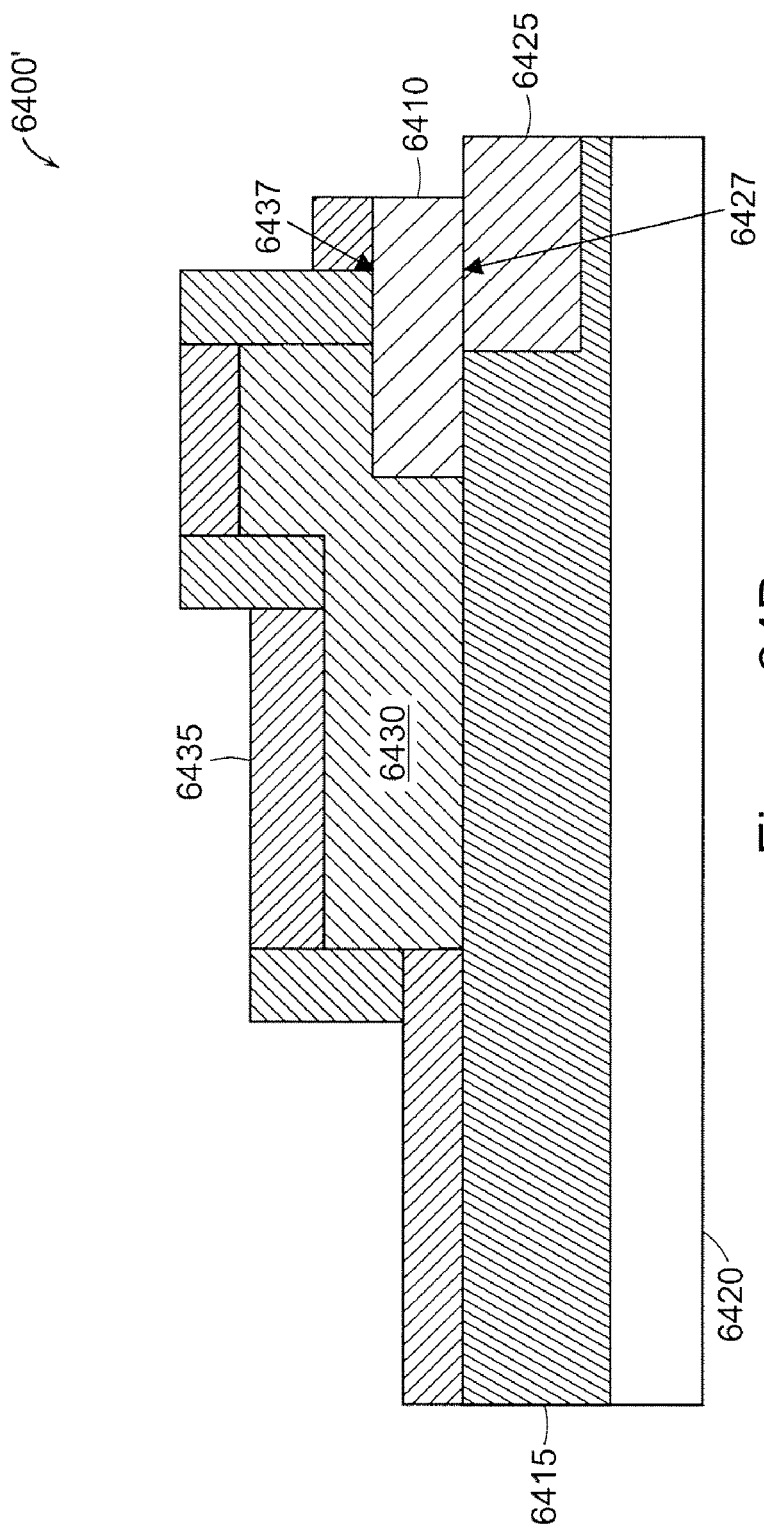

NV NT Switches Fabricated with Nonvolatile Nanotube Blocks with Top and Bottom Contacts FIG. 64A illustrates a top view of NV NT Switch 6400 and FIG. 64B illustrates cross section 6400' corresponding to cross section Z4-Z4' shown in FIG. 64A of a NV NT block 6410 with top and bottom contacts. Nonvolatile nanotube block 6410 is formed on the surface of insulator 6415, which is on substrate 6420, and overlaps bottom terminal 6425 embedded in insulator 6415 to form bottom contact 6427. Bottom terminal 6425 is formed with Ti/Pd of thickness 25 nm. Horizontal dimensions of terminal 6425 are not critical. NV NT block 6410 can be etched from a larger nanotube structure 6410'. In one embodiment, insulator 6430 is an $SiO_2$ oxide approximately 50 nm thick of approximate width $W_{INSUL}$ of 200 nm and overlaps a portion of nanotube structure 6410'. Other embodiments may have other suitable insulators, of other suitable dimensions. Top terminal 6435 of approximate width $W_{TOP}$ CONTACT of, for example, 100 nm, overlaps a portion of insulator 6430 and extends beyond insulator 6430 to overlap a portion of nanotube structure 6410' beyond the edge of insulator 6430 to form a top contact region 6440 having dimensions C1 and C2 and forming top contact 6437. Exposed regions of nanotube structure 6410' outside the boundaries 6445 defined by top terminal 6435, insulator 6430, and nanotube structure 6410' are etched using nanotube etching techniques described in incorporated patent references to form NV NT block 6410. ON/OFF switching of NV NT block 6410 occurs mostly in a region defined by dimensions C1 and C2 in top contact region that forms top contact 6437 above bottom contact 6427. Top contact 6437 and bottom contact 6427 are separated by the thickness of the NV NT block 6410, which in one example is approximately 35 nm, although other thicknesses are possible. In one embodiment, C1 is approximately in the range of 40 to 80 nm and C2 is approximately 100 nm. The portion of NV NT network that switches between ON and OFF states is mostly between top and bottom contacts 6437 and 6427, respectively, within approximate dimensions, for example of about 100×40×35 nm volume of NV NT block 6410 (some dimensions not visible in FIGS. 64A-64C) using the illustrative dimensions provided above. The channel length $L_{SW-CH}$ is the distance between top and bottom contacts of approximately 35 nm, in one embodiment. NV NT switch 5700A illustrated in FIG. 57A is a 3-D representation corresponding to NV NT switch 6400/6400' in FIGS. 64A and 64B, with NV NT block 5710 corresponding to NV NT block 6410. Bottom contact location 5715 corresponds to bottom contact 6427 and top contact location 6720 corresponds to top contact 6437. The electrical performance of block 6410 is determined by a NV NT network mostly contained in a volume of approximately 100 nm×40 nm×35 nm as described further above, using the illustrative dimensions. In this example, terminals 6425 and 6435 are formed using Ti/Pd, however, terminals may be formed using a variety of contact and interconnect elemental metals such as Ru, Ti, Cr, Al, Al(Cu), Au, Pd, Pt, Ni, Ta, W, Cu, Mo, Ag, In, Ir, Pb, Sn, as well as metal alloys such as TiAu, TiCu, TiPd, PbIn, and TiW, other suitable conductors, or conductive nitrides, oxides, or silicides such as RuN, RuO, TiN, TaN, $CoSi_x$ and $TiSi_x$. Insulators 6415 6430 may be $SiO_2$, $AL_2O_3$, SiN, polyimide, and other compatible insulator materials. Substrate 6420 may be an insulator such as ceramic or glass, a semiconductor with an insulated surface, a metal with an insulated surface, or an organic rigid or flexible substrate.

Figure 64C:
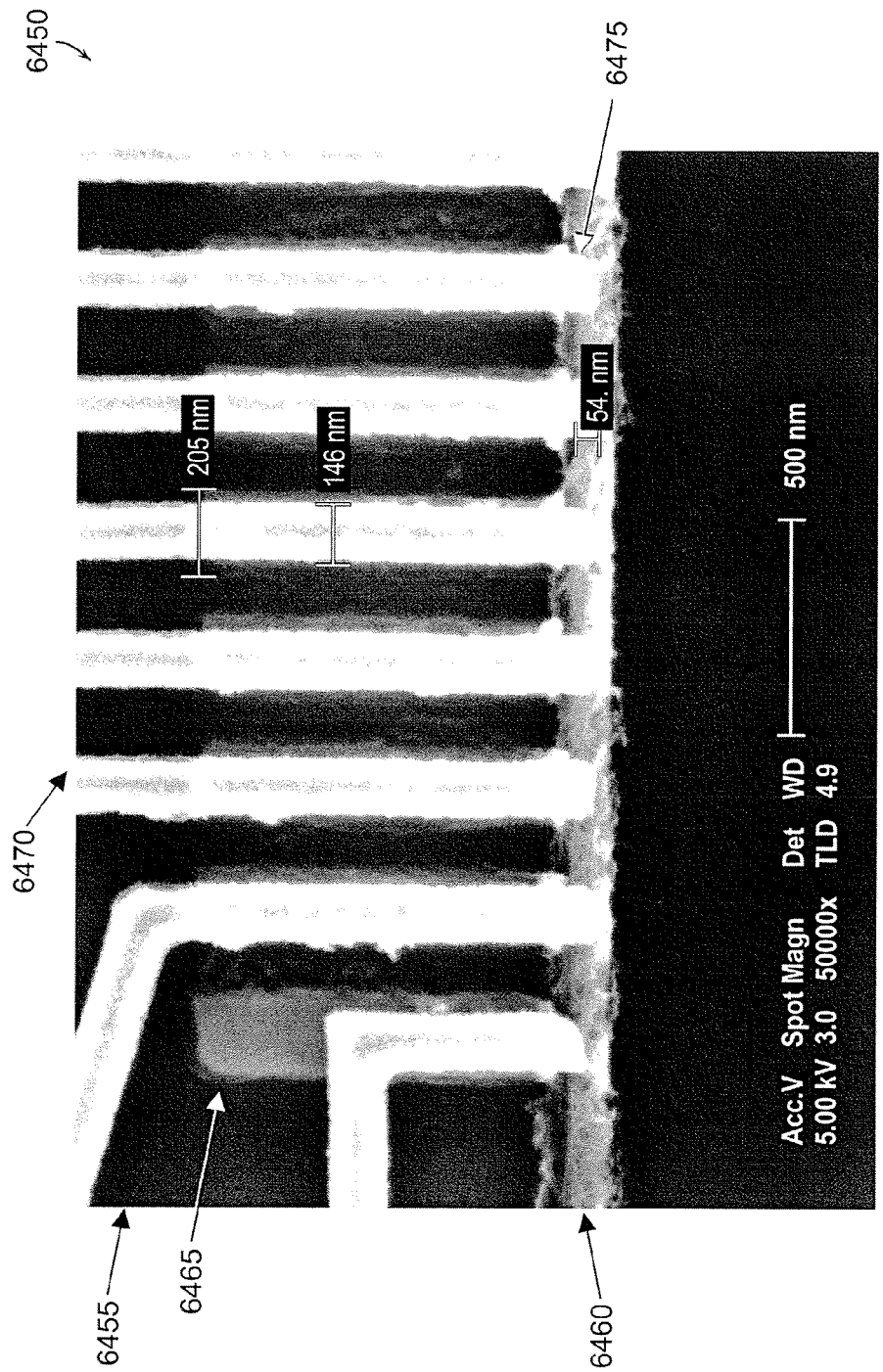

FIG. 64C illustrates a SEM image of nonvolatile nanotube switch 6450 just prior to final etch and passivation and corresponds to nonvolatile nanotube switch 6400/6400' illustrated in FIGS. 64A and 64B. Final etch defines the block 6410 dimensions. Nonvolatile nanotube switch 6450 is shown just prior to NV NT block 6410 formation, exposed portion of insulator 6455 corresponding to insulator 6415, nanotube structure 6460 prior to final etch corresponding to nanotube structure 6410', insulator 6465 corresponding to insulator 6430, top terminal 6470 corresponding to top terminal 6435, and top contact region 6475 corresponding to top contact region 6440. Nonvolatile nanotube switch 6450 has been fabricated with a channel length $L_{SW-CH}$ of approximately 35 nm corresponding to the thickness of the NV NT block between top and bottom contacts.

A graph 6500 of nonvolatile nanotube switch 6450 switching results for 100 ON/OFF cycles is illustrated in FIG. 65. ON resistance values 6510 show that most ON resistance values are in range of 100 kOhms to 1 MOhm, and OFF resistance values 6520 are approximately 1 GOhm or higher. The test conditions are similar to those described further above with respect to FIG. 11; write 0 corresponds to erase and write 1 corresponds to program. Graph 6500 illustrated in FIG. 65 used one 7 volts write 0 pulse, five 6 volts write 1 pulses, and switched the NV NT switch between ON and OFF states for 100 cycles. No shorting between overlapping top and bottom contacts was observed.

NV NT switches using NV NT blocks as switching elements demonstrate ON/OFF switching for fabricated devices over a wide range of horizontal dimensions, e.g., from 22 nm to 300 nm and contacting schemes involving bottom, top, end, and side contacts in various combinations. NV NT blocks may be used in various integration schemes to form a large variety of three-dimensional nonvolatile nanotube diode-based memory arrays. For example, cross section 4000 illustrated in FIG. 40 shows a NV NT block, referred to as nanotube element 4050, with a top contact referred to as upper level contact 4065 and a bottom contact referred to as lower level contact 4030, forming nonvolatile nanotube switch 4005. Cross section 4785 illustrated in FIG. 47 shows NV NT blocks with end contacts, referred to as nanotube elements 4740-1, with end contacts 4779 and 4764, and nanotube elements 4740-2 with end contacts 4779' and 4764'.

The flexibility of NV NT blocks enables integration in a variety of structures and product applications. For example, NV NT switches formed using NV NT blocks may be used as scalable nonvolatile nanotube switches in structures and circuits, such as the structures and circuits described in U.S.

Provisional Patent Application No. 60/836,343. Also, NV NT switches formed using NV NT blocks may be used in memory arrays, such as the memory arrays described in U.S. patent application Ser. Nos. 11/280,786 and 11/274,967. Also, NV NT switches formed using NV NT blocks may be used in non-volatile shadow latches to form register files used in logic circuits, such as the register files described in U.S. patent application Ser. No. 11/280,599. These scalable NV NT Switches formed using NV NT blocks may be used instead of stacked capacitors in DRAM cells to create a less complex scalable nonvolatile storage structure.

Methods Off Fabrication of NV NT Switches Using Nonvolatile Nanotube Blocks

Some embodiments of methods of depositing and patterning a CNT layer, or layers, of carbon nanotubes (CNTs) from CNT dispersion in aqueous or non-aqueous solutions that may be used to fabricate nonvolatile nanotube blocks are described in incorporated patent references. Examples of such NV NT blocks are illustrated in 3-D representations in FIGS. 56D, 56E, 56F, 57A and 57A'. Such methods may be used to fabricate nonvolatile nanotube switches using NV NT blocks as described further above with respect to FIGS. 58A-65. Such methods may also be used to fabricate 3-D memory cells using NV NT blocks such as illustrated by cross section 4000 in FIG. 40, where nanotube element 4050 is a NV NT block with top and bottom contacts, and by cross section 4785 illustrated in FIG. 47 where nanotube elements 4740-1 and 4740-2 are NV NT blocks with end contacts.

Some embodiments of methods of NV NT block fabrication may be extended to include deposition of a CNT layer, or layers, from CNT dispersions in a sacrificial polymer dissolved in an organic solvent as described with respect to methods 6600A of fabrication illustrated in FIG. 66A. Such methods may, in some embodiments, be used to enhance electrical performance such as cyclability (number of ON/OFF cycles) and/or facilitate NV NT block fabrication to enable, for example, NV NT blocks with more closely spaced top and bottom contact locations as illustrated by comparing NV NT block 5730 shown in a 3-D representation in FIG. 57B with NV NT block 5710 shown in a 3-D representation in FIG. 57A. Shorter NV NT switch channel length $L_{SW-CH}$, corresponding to top-to-bottom contact separation may reduce NV NT switch operating voltage as described further above with respect to FIG. 10. The sacrificial polymer may remain in the NV NT structure 5730 shown in a 3-D representation in FIG. 57B, or may be removed from the NV NT block by evaporation, typically at temperatures in the range of 200 deg C. to 400 deg C., as illustrated by NV NT block 5730' shown in a 3-D representation in FIG. 57B'.

Some embodiments of methods of NV NT block fabrication may also be extended to include the addition of performance enhancing material such as a porous dielectric, for example, as described with respect to methods 6600B of fabrication illustrated in FIG. 66B and methods 6600C of fabrication illustrated in FIG. 66C. Block 5750 shown in a 3-D representation in FIG. 57C illustrates a NV NT block that incorporates performance enhancing material such as a porous dielectric.

Methods of Fabrication of Nonvolatile Nanotube Blocks Using a Sacrificial Polymer FIG. 66A illustrates certain methods 6600A of fabrication of enhanced NV NT blocks. In general, methods 6605 fabricate support circuits and interconnections in and out of a semiconductor substrate separately, e.g., with methods 2710 described further above with respect to FIGS. 27A-27B. Exemplary methods 6605 deposit and pattern semiconducting, metallic, and insulating layers and form structures prior to CNT layer deposition.

Next, methods 6608 deposit a CNT layer, or layers, from CNT dispersions in a sacrificial polymer dissolved in an organic solvent. For example, sacrificial polymer polypropylene carbonate (PPC) dissolved in one or more organic solvents such as NMP or cyclohexanone available in the industry. A description of the properties of polypropylene carbonate may be found, for example, in referenced technical data available from the company Empower Materials, Inc. While sacrificial polymer PPC is used in this example, other sacrificial polymers such as Unity sacrificial polymer and polyethylene carbonate sacrificial polymer may also be used. At this point in the process, the CNT layer may be patterned continuing with fab. flow 1A illustrated in FIG. 66A. Alternatively, additional layers may be added to be followed by patterning of multiple layers including the CNT layer continuing with fab. flow 2A illustrated in FIG. 66A. Exemplary methods will be described first with respect to CNT layer patterning (fab. flow 1A), and then followed by methods of patterning multiple layers including the CNT layer (fab. flow 2A).

Continuing methods 6600A of fabrication description using fab. flow 1A, next, methods 6610 then pattern (etch) the CNT layer using nanotube etching techniques described in incorporated patent references. In certain embodiments, the methods include substantially removing (e.g., etching) the sacrificial polymer such as polypropylene carbonate (PPC) in exposed regions. This removal may be performed, e.g., using anisotropic physical etch, etch as Ar ion milling; or reactive ion etching (RIE) involving $O_2$ plasma; or a combination of both.

Next, methods 6612 complete NV NT block fabrication. Such methods include deposition and patterning a conductor layer to form terminals in contact with the NV NT block at a top, side, or end region, or combinations of contacts thereof as illustrated in FIGS. 58A-58D, for example. Alternatively, such methods may include depositing and patterning an insulating layer and then a conductor layer as illustrated in FIG. 60A-60C.

At this point in the process, NV NT switches incorporating NV NT blocks have been formed, and methods 6680 complete the fabrication of chips including passivation and package interconnect means using known industry methods of fabrication. The encapsulated NV NT blocks include a sacrificial polymer as illustrated with respect to block 5730 shown in a 3-D representation in FIG. 57B.

Alternatively, methods 6615 may substantially remove, (e.g., evaporate) the sacrificial polymer such as polypropylene carbonate for example, by heating the wafer to a temperature in the range of 200 deg. C. to 400 deg. C. In this example, NV NT block 5730 becomes like NV NT block 5730' shown in a 3-D representation in FIG. 57B' with NV NT blocks having substantially only CNT fabric formed of individual nanotubes.

Then, methods 6680 complete the fabrication of chips including passivation and package interconnect means using known industry methods of fabrication. The encapsulated NV NT blocks substantially do not include a sacrificial polymer as illustrated with respect to block 5730' shown in a 3-D representation in FIG. 57B'. At this point in the process, method 6600A of fabrication using fab. flow 1A ends.

In an alternative fabrication sequence, methods 6600A of fabrication that include fab. flow 2A use methods 6620 to deposit additional fabrication layers added to the CNT layer, or layers, deposited in a previous step using methods 6608 of fabrication.

Next, methods 6622 pattern multiple layers including the CNT layer. Known industry methods remove (etch) exposed regions of metal, insulator, and semiconductor layers. Exemplary methods of CNT layer etch are described in incorporated patent references. Some methods remove (etch) sacrificial polymer such as polypropylene carbonate (PPC) in exposed regions. Exemplary methods may include anisotropic physical etch, etch as Ar ion milling; or reactive ion etching (RIE) involving $O_2$ plasma; or a combination of both.

By way of example, NV NT switch 6400/6400' illustrated in FIGS. 64A-64C shows the formation of NV NT block 6410 using a top contact (and terminal) conductor and an insulating layer as a mask to remove (etch) the underlying CNT layer. Cross section 4000 illustrated in FIG. 40 also shows the formation of the NV NT block referred to as nanotube element 4050 by patterning additional layers above the NV NT block surface. However, substantial removal of exposed regions of a sacrificial polymer is not illustrated in these two examples.

At this point in the process, NV NT switches incorporating NV NT blocks have been formed, and methods 6680 complete the fabrication of chips including passivation and package interconnect means using known industry methods of fabrication. The encapsulated NV NT blocks include a sacrificial polymer as illustrated with respect to block 5730 shown in a 3-D representation in FIG. 57B.

Alternatively, methods 6615 substantially remove, (e.g., evaporate) the sacrificial polymer such as polypropylene carbonate for example, by heating the wafer to a temperature in the range of 200 deg. C. to 400 deg. C. In this example, NV NT block 5730 becomes like NV NT block 5730' shown in a 3-D representation in FIG. 57B' with NV NT blocks having substantially only CNT fabric formed of individual nanotubes.

Then, methods 6680 complete the fabrication of chips including passivation and package interconnect means using known industry methods of fabrication. The encapsulated NV NT blocks substantially do not include a sacrificial polymer as illustrated with respect to block 5730' shown in a 3-D representation in FIG. 57B'. At this point in the process, method 6600A of fabrication using fab. flow 2A ends.

A First Method of Fabrication of Nonvolatile Nanotube Blocks Having a Porous Dielectric FIG. 66B illustrates methods 6600B of fabrication of enhanced NV NT blocks. In general, methods 6605 fabricate support circuits and interconnections in and out of a semiconductor substrate, e.g., using methods 2710 described further above with respect to FIG. 27. Methods 6605 deposit and pattern semiconducting, metallic, and insulating layers and form structures prior to CNT layer deposition.

Next, methods 6608 deposit a CNT layer, or layers, from CNT dispersions in a sacrificial polymer dissolved in an organic solvent. For example, sacrificial polymer polypropylene carbonate (PPC) dissolved in an organic solvent such as NMP or cyclohexanone available in the industry. At this point in the process, methods 6600B of fabrication process flow may proceed with fab. flow 1B. Alternatively, methods 6600B of fabrication process flow may proceed with fab. flow 2B. Exemplary methods 6600B of fabrication will be described first with respect to fab. flow 1B, and then followed by methods 6600B of fabrication with respect to fab. flow 2A.

Continuing methods 6600B of fabrication description using fab. flow 1B, next, methods 6625 then pattern (etch) the CNT layer using nanotube etching techniques described in incorporated patent references. In some embodiments, methods substantially remove (e.g., etch) the sacrificial polymer such as polypropylene carbonate (PPC) in exposed regions. Exemplary methods include anisotropic physical etch, etch as Ar ion milling; or reactive ion etching (RIE) involving $O_2$ plasma; or a combination of both.

Next, methods 6628 substantially remove (e.g., evaporate) the sacrificial polymer such as polypropylene carbonate for example, by heating the wafer to a temperature in the range of 200 deg. C. to 400 deg. C. In this example, NV NT block 5730 becomes like NV NT block 5730' shown in a 3-D representation in FIG. 57B' with NV NT blocks having substantially only CNT fabric formed of individual nanotubes.

Next, methods 6630 form a performance enhancing material such as a porous dielectric. Porous dielectric may be formed using spin-on glass (SOG) and spin-on low-κ organic dielectrics as described in a paper by S. Thanawala et al., "Reduction in the Efffective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently to generate a modified surface as described in USPTO Patent Pub. No. 2006/0193093 which includes common inventor Bertin and is hereby incorporated by reference in its entirety. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6632 complete NV NT block fabrication. Such methods include deposition and patterning a conductor layer to form terminals in contact with the NV NT block at a top, side, or end region, or combinations of contacts thereof. In this example, encapsulated NV NT blocks with top and bottom contacts include a performance enhancing material such as a porous dielectric as illustrated with respect to block 5750 shown in a 3-D representation in FIG. 57C.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

In an alternative fabrication sequence, methods 6600B of fabrication that include fab. flow 2B use methods 6635 to substantially remove (e.g., evaporate) the sacrificial polymer such as polypropylene carbonate from the CNT layer for example, by heating the wafer to a temperature in the range of 200 deg. C. to 400 deg. C.

Next, methods 6638 form a performance enhancing material such as a porous dielectric. Porous dielectric may be formed using spin-on glass (SOG) and spin-on low-K organic dielectrics as described in a paper by S. Thanawala et al., "Reduction in the Efffective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently to generate a modified surface as described in USPTO Patent Pub. No. 2006/0193093. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6640 of fabrication deposit additional fabrication layers added to the CNT layer, or layers, such as conductor, insulating, or semiconducting layers deposited using industry methods of fabrication.

Next, methods 6642 pattern multiple layers including the CNT layer. Known industry methods remove (etch) exposed regions of metal, insulator, and semiconductor layers. Exemplary methods of CNT layer etch are described in incorporated patent references. Exemplary methods remove (etch) exposed portions of the performance enhancing material such as a porous dielectric using known industry methods for etching dielectric material.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

A Second Method of Fabrication of Nonvolatile Nanotube Blocks Having a Porous Dielectric FIG. 66C illustrates methods 6600C of fabrication of enhanced NV NT blocks. In general, methods 6605 fabricate support circuits and interconnections in and out of a semiconductor substrate, e.g., using methods 2710 described further above with respect to FIG. 27. In some embodiments, methods 6605 deposit and pattern semiconducting, metallic, and insulating layers and form structures prior to CNT layer deposition.

Next, methods 6650 deposit a CNT layer, or layers, from CNT dispersion in aqueous or non-aqueous solutions are used to fabricate nonvolatile nanotube blocks as described in incorporated patent references. At this point in the process, methods 6600C of fabrication process flow may proceed with fab. flow 1C. Alternatively, methods 6600C of fabrication process flow may proceed with fab. flow 2C. Exemplary methods 6600C of fabrication will be described first with respect to fab. flow 1C, and then followed by methods 6600C of fabrication with respect to fab. flow 2C.

Continuing methods 6600C of fabrication description using fab. flow 1C, next, methods 6655 then pattern (etch) the CNT layer using nanotube etching techniques described in incorporated patent references.

Next, methods 6658 form a performance enhancing material such as a porous dielectric. Porous dielectric may be formed using spin-on glass (SOG) and spin-on low-K organic dielectrics as described in a paper by S. Thanawala et al., "Reduction in the Efffective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently to generate a modified surface as described in USPTO Patent Pub. No. 2006/0193093. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6660 complete NV NT block fabrication. Such methods include deposition and patterning a conductor layer to form terminals in contact with the NV NT block at a top, side, or end region, or combinations of contacts thereof. In this example, encapsulated NV NT blocks with top and bottom contacts include a performance enhancing material such as a porous dielectric as illustrated with respect to block 5750 shown in a 3-D representation in FIG. 57C.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

In an alternative fabrication sequence, methods 6600C of fabrication that include fab. flow 2C uses methods 6665 to form a performance enhancing material such as a porous dielectric. Porous dielectric may be formed using spin-on glass (SOG) and spin-on low-K organic dielectrics as described in a paper by S. Thanawala et al., "Reduction in the Efffective Dielectric Constant of Integrated Interconnect Structures Through an All-Spin-On Strategy", available from Honeywell Electronic Materials, Honeywell International Inc., Sunnyvale, Calif. 94089. Alternatively, individual nanotubes forming nonvolatile nanotube block structures may be derivitized covalently or non-covalently or mixed with pristine nanotubes to generate a modified surface as described in USPTO Patent Pub. No. 2006/0193093. Derivitized individual nanotubes may include oxygen, fluorine, chlorine, bromine, iodine (or other) atoms, for example, thereby forming nonvolatile nanotube blocks that include a porous dielectric for performance enhancement purposes.

Next, methods 6670 of fabrication deposit additional fabrication layers added to the CNT layer, or layers, such as conductor, insulating, or semiconducting layers deposited using methods industry methods of fabrication.

Next, methods 6675 pattern multiple layers including the CNT layer. Known industry methods substantially remove (etch) exposed regions of metal, insulator, and semiconductor layers. Exemplary methods of CNT layer etch are described in incorporated patent references. In some embodiments, methods remove (etch) exposed portions of the performance enhancing material such as a porous dielectric by using known industry methods for etching dielectric material, especially oxygen plasma and reactive ion etching with gasses that are capable of removing carbon nanotubes which are unprotected by photoresist or other processing materials. Such etches may be isotropic or anisotropic depending upon the orientation required.

At this point in the process, NV NT switches incorporating NV NT blocks have been formed, and methods 6680 complete the fabrication of chips including passivation and package interconnect means using known industry methods of fabrication. The encapsulated NV NT blocks include a performance enhancing material such as a porous dielectric as illustrated with respect to block 5750 shown in a 3-D representation in FIG. 57C.

3-Dimensional Cell Structure of Nonvolatile Cells Using NV NT Devices Having Vertically Oriented Diodes and Nonvolatile Nanotube Blocks as Nonvolatile NT Switches Using Top and Bottom Contacts to Form Cathode-on-NT Switches FIG. 67 illustrates cross section 6700 including cells C00 and C01 in a 3-D memory embodiment. Nanotube layers are deposited by coating, spraying, or other means on a planar contact surface on previously defined diode-forming layers as illustrated in FIG. 40 shown further above. Cross section 6700 illustrated in FIG. 67 corresponds to structure 4000 illustrated in FIG. 40, with some additional detail associated with an cathode-on-NT implementation and element numbers to facilitate description of methods of fabrication. Trench etching after the deposition of insulator, semiconductor, conductor, and nanotube layers form sidewall boundaries that define nonvolatile nanotube block-based nonvolatile nanotube diode 3-D memory cells and define nonvolatile nanotube block dimensions, diode dimensions, and the dimensions of all other structures in the three dimensional nonvolatile storage cells. The horizontal 3-D cell dimensions (X and Y approximately orthogonal directions) of all cell structures are formed by trench etching and are therefore self-aligned as fabricated. The vertical dimension (Z) is determined by the thickness and number of vertical layers used to form the 3-D cell. FIG. 67 illustrates cross section 6700 along a word line (X) direction. Stacked series-connected vertically-oriented steering diodes and nonvolatile nanotube block switches are symmetrical and have approximately the same cross sectional dimensions in both X and Y directions. Cross section 6700 illustrates array cells in which the steering diode is connected to the bottom (lower level) contact of the nonvolatile nanotube block in a cathode-on-NT configuration. Word lines are oriented along the X axis and bit lines along the Y axis as illustrated in perspective in FIG. 33A.

Some embodiments of methods 2710 described further above with respect to FIG. 27A are used to define support circuits and interconnections 6701.

Next, methods 2730 illustrated in FIG. 27B deposit and planarize insulator 6703. Interconnect means through planar insulator 6703 (not shown in cross section 6700 but shown above with respect to cross section 2800" in FIG. 28C) may be used to connect metal array lines in 3-D arrays to corresponding support circuits and interconnections 6701. By way of example, bit line drivers in BL driver and sense circuits 2640 may be connected to bit lines BL0 and BL1 in array 2610 of memory 2600 illustrated in FIG. 26A described further above, and in cross section 6700 illustrated in FIG. 67. At this point in the fabrication process, methods 2740 may be used to form a memory array on the surface of insulator 6703, interconnected with memory array support structure 6705 illustrated in FIG. 67. Memory array support structure 6705 corresponds to memory array support structure 3405 illustrated in FIG. 47, and support circuits & interconnections 6701 correspond to support circuits & interconnections 3401, and insulator 6703 corresponds to insulator 3403 except for some changes to accommodate a new memory array structure for 3-D memory cells that include nonvolatile nanotube blocks with top (upper level) and bottom (lower level) contacts.

Exemplary methods 2740 illustrated in FIG. 27B deposit and planarize metal, polysilicon, insulator, and nanotube element layers to form nonvolatile nanotube diodes which, in this example, include multiple vertically oriented diode and nonvolatile nanotube block (NV NT block) switch cathode-on-NT series pairs. Individual cell boundaries are formed in a single etch step for the X direction (and a separate single etch for the Y direction), each cell having a single NV NT Diode defined by a single trench etch step after layers, except the WL0 layer, have been deposited and planarized, in order to eliminate accumulation of individual layer alignment tolerances that would substantially increase cell area. Individual cell dimensions in the X direction are F (1 minimum feature) as illustrated in FIG. 40 and corresponding FIG. 67, and also F in the Y direction (not shown) which is approximately orthogonal to the X direction, with a periodicity in X and Y directions of 2F. Hence, each cell occupies an area of approximately $4F^2$.

NV NT blocks with top (upper level) and bottom (lower level) contacts, illustrated further above in FIG. 40 and corresponding FIG. 67 by nanotube elements 4050-1 and 4050-2, are further illustrated in perspective drawings in FIGS. 57A-57C further above. NV NT block device structures and electrical ON/OFF switching results are described with respect to FIGS. 64A-64C and 65 further above. Methods of fabrication of NV NT blocks with top and bottom contacts are described with respect to methods 6600A, 6600B, and 6600C illustrated in FIGS. 66A, 66B, and 66C, respectively. NV NT blocks with top and bottom contacts have channel lengths $L_{SW-CH}$ approximately equal to the separation between top and bottom contacts, 35 nm for example. A NV NT block switch cross section X by Y may be formed with X=Y=F, where F is a minimum technology node dimension. For a 35 nm technology node, a NV NT block may have dimensions of 35×35×35 nm; for a 22 nm technology node, a NV NT block may have dimensions of 22×22×35 nm, for example.

Methods fill trenches with an insulator; and then methods planarize the surface. Then, methods deposit and pattern word lines on the planarized surface.

The fabrication of vertically-oriented 3D cells illustrated in FIG. 67 proceeds as follows. In some embodiments, methods deposit a bit line wiring layer on the surface of insulator 6703 having a thickness of 50 to 500 nm, for example, as described further below with respect to FIGS. 68A-68I. Fabrication of the vertically-oriented diode portion of structure 6700 may be the same as in FIGS. 34A and 34B described further above and are incorporated in methods of fabrication described with respect to FIGS. 68A-68I. Methods etch the bit line wiring layer and define individual bit lines such as bit line conductors 6710-1 (BL0) and 6710-2 (BL1). Bit lines such as BL0 and BL1 are used as array wiring conductors and may also be used as anode terminals of Schottky diodes. Alternatively, more optimum Schottky diode junctions may be formed using metal or silicide contacts (not shown) in contact with N polysilicon regions 6720-1 and 6720-2, while also forming ohmic contacts with bit line conductors 6710-1 and 6710-2. N polysilicon regions 6720-1 and 6720-2 may be doped with arsenic or phosphorus in the range of $10^{14}$ to $10^{17}$ dopant atoms/cm$^3$ for example, and may have a thickness range of 20 nm to 400 nm, for example.

FIG. 67 illustrates a cathode-to-NT type NV NT diodes formed with Schottky diodes. However, PN or PIN diodes may be used instead of Schottky diodes as described further below with respect to FIG. 68A.

The electrical characteristics of Schottky (and PN, PIN) diodes may be improved (low leakage, for example) by controlling the material properties of polysilicon, for example polysilicon deposited and patterned to form polysilicon regions 6820-1 and 6820-2. Polysilicon regions may have relatively large or relatively small grain boundary sizes that are determined by methods of fabrication such as anneal times and temperatures for example. In some embodiments, SOI deposition methods in the semiconductor industry may be used that result in polysilicon regions that are single crystalline (no longer polysilicon), or nearly single crystalline, for further electrical property enhancement such as low diode leakage currents.

Examples of contact and conductors materials include elemental metals such as Al, Au, Pt, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$. In some cases conductors such as Al, Au, W, Cu, Mo, Ti, and others may be used as both contact and conductors materials as well as anodes for Schottky diodes. However, in other cases, optimizing anode material for lower forward voltage drop and lower diode leakage is advantageous. Schottky diode anode materials may be added (not shown) between conductors 6710-1 and 6710-2 and polysilicon regions 6720-1 and 6720-2, respectively. Such anode materials may include Al, Ag, Au, Ca, Co, Cr, Cu, Fe, Ir, Mg, Mo, Na, Ni, Os, Pb, Pd, Pt, Rb, Ru, Ti, W, Ta, Zn and other elemental metals. Also, suicides such as $CoSi_2$, $MoSi_2$, $Pd_2Si$, PtSi, $RbSi_2$, $TiSi_2$, $WSi_2$, and $ZrSi_2$ may be used. Schottky diodes formed using such metals and silicides are illustrated in the reference by N G, K. K. "Complete Guide to Semiconductor Devices", Second Edition, John Wiley & Sons, 2002, pp. 31-41, the entire contents of which are incorporated herein by reference.

Next, having completed Schottky diode select devices, methods form N+ polysilicon regions 6725-1 and 6725-2 to contact N polysilicon regions 6720-1 and 6720-2, respectively. N+ polysilicon is typically doped with arsenic or phosphorous to $10^{20}$ dopant atoms/cm$^3$, for example, and has a thickness of 20 to 400 nm, for example. N and N+ polysilicon region dimensions are defined by trench etching near the end of the process flow.

Next, methods form bottom (lower level) contact regions 4030-1 and 4030-2 with ohmic or near ohmic contacts to polysilicon regions 6725-1 and 6725-2, respectively. Examples of contact and conductors materials include elemental metals such as Al, Au, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$.

Next, methods form NV NT block 4050-1 and 4050-2 on the surface of contact regions 4030-1 and 4030-2, respectively, having the nanotube element length of the NV NT blocks defined by the nanotube thickness in the vertical Z direction and X-Y cross section defined by trench etching near the end of the process flow. Note that NV NT block 4050-1 in FIG. 67 corresponds to nanotube element 4050 in FIG. 40. In order to enhance the density of cells C00 and C01, NV NT blocks 4050-1 and 4050-2 illustrated in FIG. 67 include simple top and bottom contacts within trench-defined cell boundaries.

Next, methods form top (upper level) contacts 4065-1 and 4065-2 on the top surfaces of NV NT blocks 4050-1 and 4050-2, respectively, with X and Y dimensions defined by trench etching near the end of the process flow.

Next, methods form (etch) trench openings 4075, 4075A, and 4075B, each of width F, thereby forming inner and outer sidewalls of cells C00 and C01 and corresponding top (upper level) and bottom (lower level) contacts, nanotube elements, and insulators. Bottom (lower level) contacts 4030-1 and 4030-2 form an electrical connection between NV NT blocks 4050-1 and 4050-2, respectively, and corresponding underlying steering diode cathode terminals, and form bit lines 6710-1 and 6710-2. Trench formation (etching) stops at the surface of insulator 6703.

Next, methods fill trench openings 4075, 4075A, and 4075B with an insulator 4060, 4060A, and 4060B, respectively, such as TEOS and planarize the surface. All trenches can be formed simultaneously.

Next, methods deposit and planarize a word line layer.

Next, methods pattern word line 6770.

Next, methods 2750 illustrated in FIG. 27A complete fabrication of semiconductor chips with nonvolatile memory arrays using nonvolatile nanotube diode cell structures including passivation and package interconnect means using known industry methods.

Nonvolatile nanotube diodes forming cells C00 and C01 correspond to nonvolatile nanotube diode 1200 schematic in FIG. 12, also illustrated schematically by NV NT diode 6780 in FIG. 67, one in each of cells C00 and C01. Cells C00 and C01 illustrated in cross section 6700 in FIG. 67 correspond to corresponding cells C00 and C01 shown schematically in memory array 2610 in FIG. 26A, and bit lines BL0 and BL1 and word line WL0 correspond to array lines illustrated schematically in memory array 2610.

Embodiments of methods 2700 illustrated in FIGS. 27A and 27B may be used to fabricate nonvolatile memories using NV NT diode devices with cathode-to-NT switch connections to NV NT block switches such as those shown in cross section 6700 illustrated in FIG. 67 and as described further below with respect to FIGS. 68A-68I. Structures such as cross section 6700 may be used to fabricate memory 2600 illustrated schematically in FIG. 26A.

Methods of Fabricating 3-Dimensional Cell Structure of Nonvolatile Cells Using NV NT Devices Having Vertically Oriented Diodes and Nonvolatile Nanotube Blocks as Nonvolatile NT Switches Using Top and Bottom Contacts to Form Cathode-on-NT Switches Embodiments of methods 2710 illustrated in FIG. 27A may be used to define support circuits and interconnects similar to those described with respect to memory 2600 illustrated in FIG. 26A as described further above. Methods 2710 apply known semiconductor industry techniques design and fabrication techniques to fabricated support circuits and interconnections 6801 in and on a semiconductor substrate as illustrated in FIG. 68A. Support circuits and interconnections 6801 include FET devices in a semiconductor substrate and interconnections such as vias and wiring above a semiconductor substrate. FIG. 68A corresponds to FIG. 34A illustrating a Schottky diode structure, except that an optional conductive Schottky anode contact layer 3415 shown in FIG. 34A is not shown in FIG. 68A. Note that FIG. 34A' may be used instead of FIG. 34A' as a starting point if a PN diode structure is desired. If N polysilicon layer 3417 in FIG. 34A' were replaced with an intrinsically doped polysilicon layer instead (not shown), then a PIN diode would be formed instead of a PN diode. Therefore, while the structure illustrated in FIG. 68A illustrates a Schottky diode structure, the structure may also be fabricated using either a PN diode or a PIN diode.

Methods of fabrication for elements and structures for support circuits & interconnections 6801, insulator 6803, memory array support structure 6805, conductor layer 6810, N polysilicon layer 6820, N+ polysilicon layer 6825, and bottom (lower level) contact layer 6830 illustrated in FIG. 68A are described further above with respect to FIGS. 34A and 34B, where support circuits & interconnections 6801 correspond to support circuits & interconnections 3401; insulator 6803 corresponds to insulator 3403; memory array support structure 6805 corresponds to memory array support structure 3405; conductor layer 6810 corresponds to conductor layer 3410; N polysilicon layer 6820 corresponds to N polysilicon layer 3420; N+ polysilicon layer 6825 corresponds to N+ polysilicon layer 3425; and bottom (lower level) contact layer 6830 corresponds to bottom (lower level) contact layer 3430.

Figure 68B:
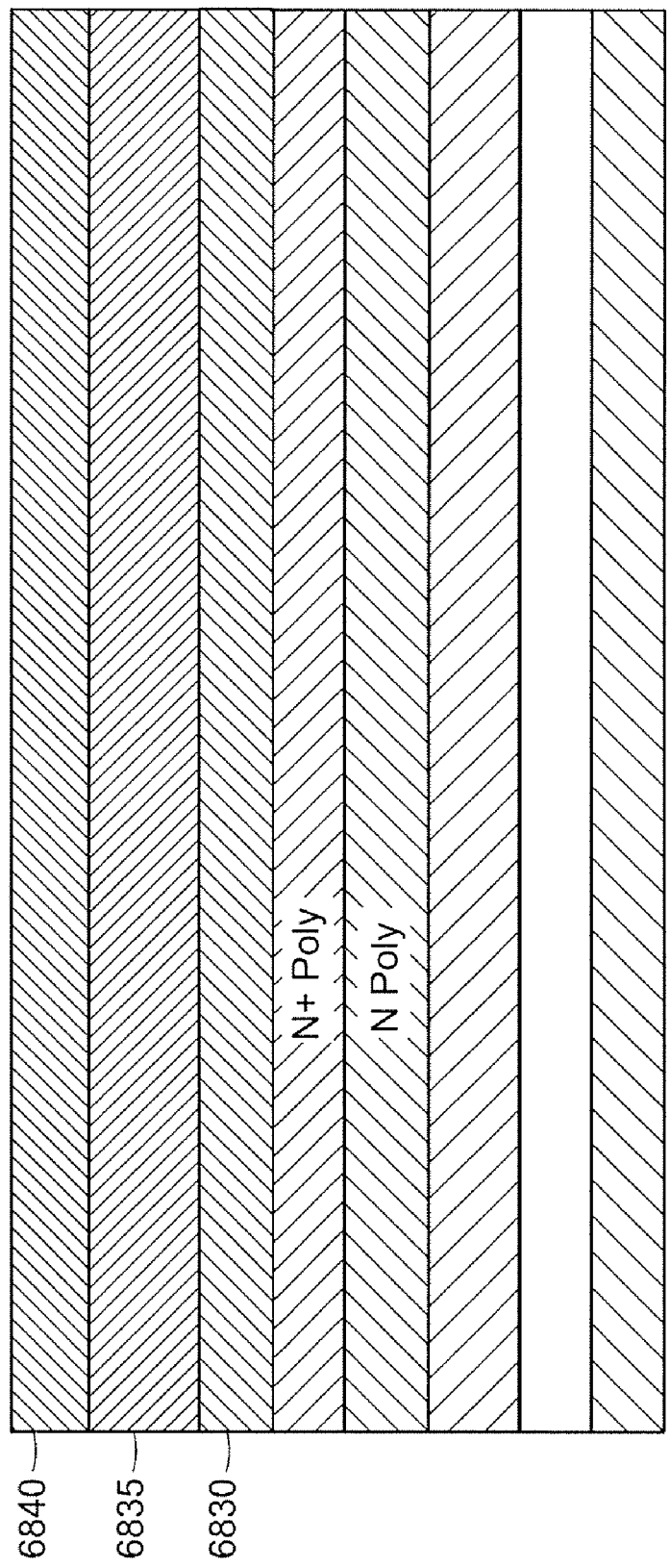

Next, methods deposit a nanotube layer 6835 on the planar surface of contact layer 6830 as illustrated in FIG. 68B using spin-on of multiple layers, spray-on, or other means. Nanotube layer 6835 may be in the range of 10-200 nm for example. Exemplary devices of 35 nm thicknesses have been fabricated and switched between ON/OFF states as illustrated in FIGS. 64A-64C and 65. Methods of fabrication of NV NT blocks with top and bottom contacts are described with respect to methods 6600A, 6600B, and 6600C illustrated in FIGS. 66A, 66B, and 66C, respectively.

At this point in the fabrication process, methods deposit top (upper level) contact layer 6840 on the surface of nanotube layer 6835 as illustrated in FIG. 68B. Top (upper level) contact layer 6840 may be 10 to 500 nm in thickness, for example. Top (upper level) contact layer 6840 may be formed using Al, Au, Ta, W, Cu, Mo, Pd, Pt, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$, for example.

Figure 68C:
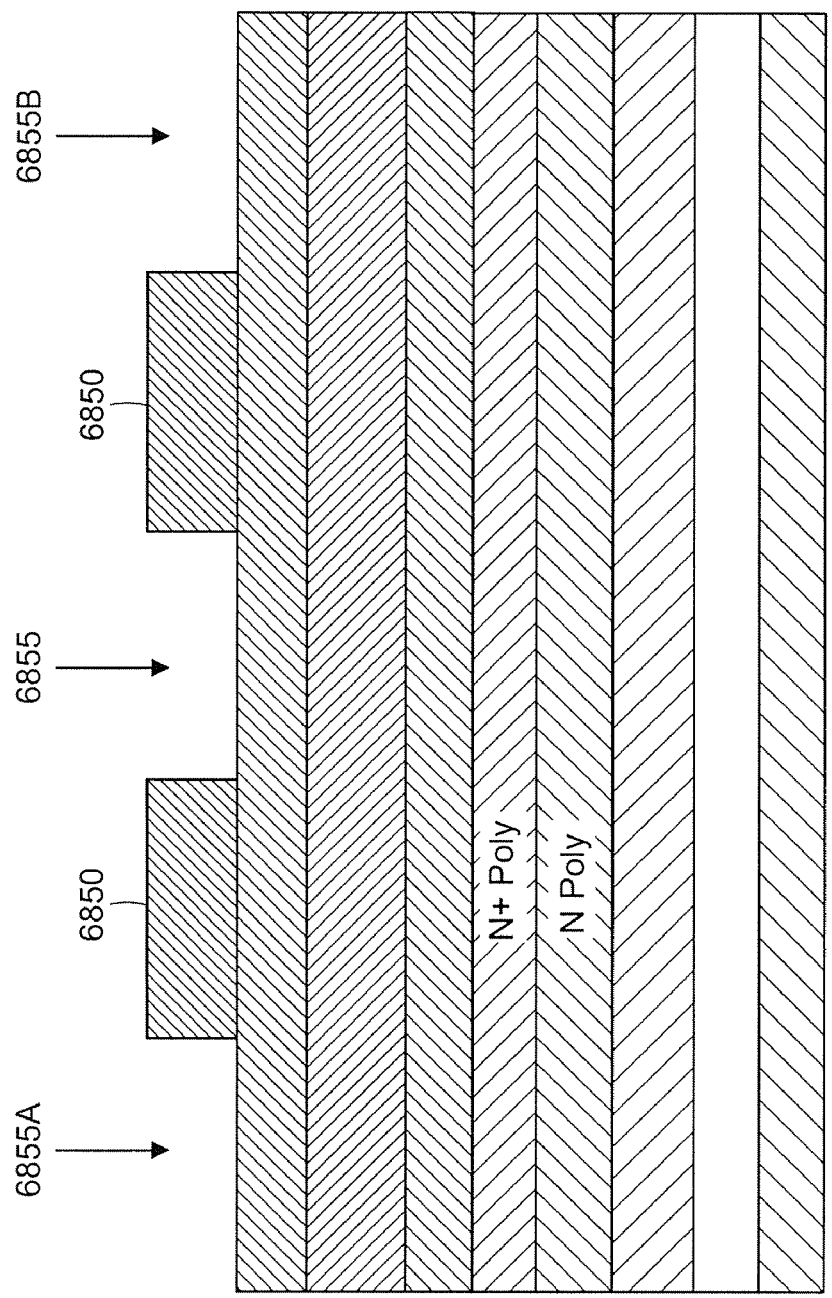

Next methods deposit and pattern a masking layer 6850 on top (upper level) contact layer 6840 as illustrated in FIG. 68C using known industry methods. Masking layer 6850 may be in the range of 10 to 500 nm thick and be formed using resist such as photoresist, e-beam resist, or conductor, semiconductor, or insulator materials. Mask layer 6850 openings 6855, 6855A and 6855B expose underlying regions for purposes of trench etching. The mask opening may be aligned to alignment marks in planar insulating layer 6803 for example; the alignment is not critical. In order to achieve minimum cell dimensions, mask layer 6850 openings 6855, 6855A, and 6855B are approximately equal to the minimum allowed technology dimension F. F may be 90 nm, 65 nm, 45 nm, 35 nm, 25 nm, 12 nm, or sub-10 nm, for example.

Figure 68D:
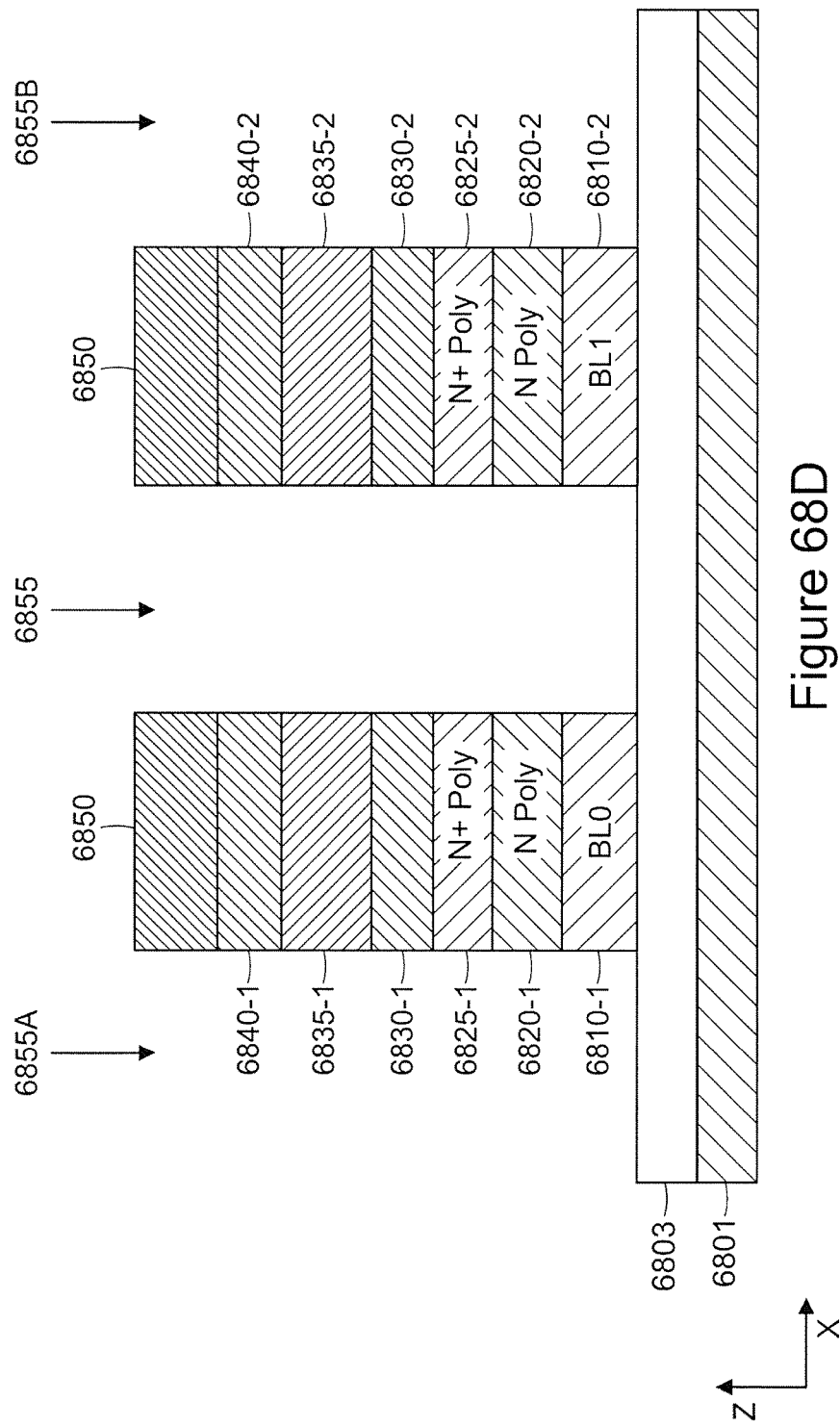

At this point in the process, mask layer 6850 openings 6855, 6855A, and 6855B may be used for directional etching of trenches using methods that define a cell boundary along the X direction for 3D cells using one NV NT diode with an internal cathode-to-nanotube connection per cell. U.S. Pat. No. 5,670,803, the entire contents of which are incorporated herein by reference, to co-inventor Bertin, discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may cut through multiple conductor, semiconductor, oxide, and nanotube layers as described further above with respect to trench formation in FIGS. 34A-34FF and 36A-36FF. In this example, selective directional trench etch (RIE) removes exposed areas of top (upper level) contact layer 6840 to form upper level contact regions 6840-1 and 6840-2; removes exposed areas of nanotube layer 6835 to form nanotube regions 6835-1 and 6835-2; removes exposed areas of bottom (lower level) contact layer 6830 to form bottom (lower level) contact regions 6830-1 and 6830-2; directional etch removes exposed areas of N+ polysilicon layer 6825 to form N+ polysilicon regions 6825-1 and 6825-2; removes exposed areas of polysilicon layer 6820 to form N polysilicon regions 6820-1 and 6820-2; and removes exposed areas of conductor layer 6810 to form conductor regions 6810-1 and 6810-2, stopping at the surface of insulator 6803 and simultaneously forming trench openings 6860, 6860A, and 6860B as illustrated in FIG. 68D.

Figure 68E:
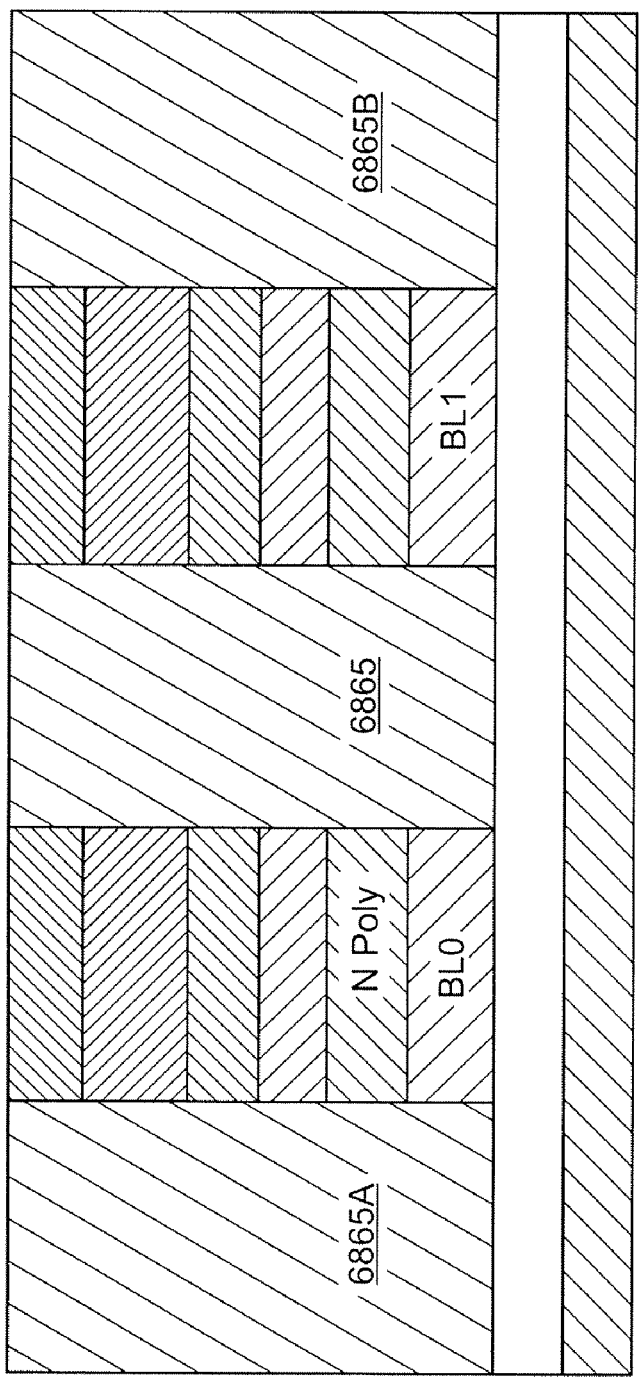

Next methods fill trench openings 6860, 6860A, and 6860B with insulators 6865, 6865A, and 6865B, respectively, such as TEOS for example and planarize as illustrated in FIG. 68E.

Figure 68F:
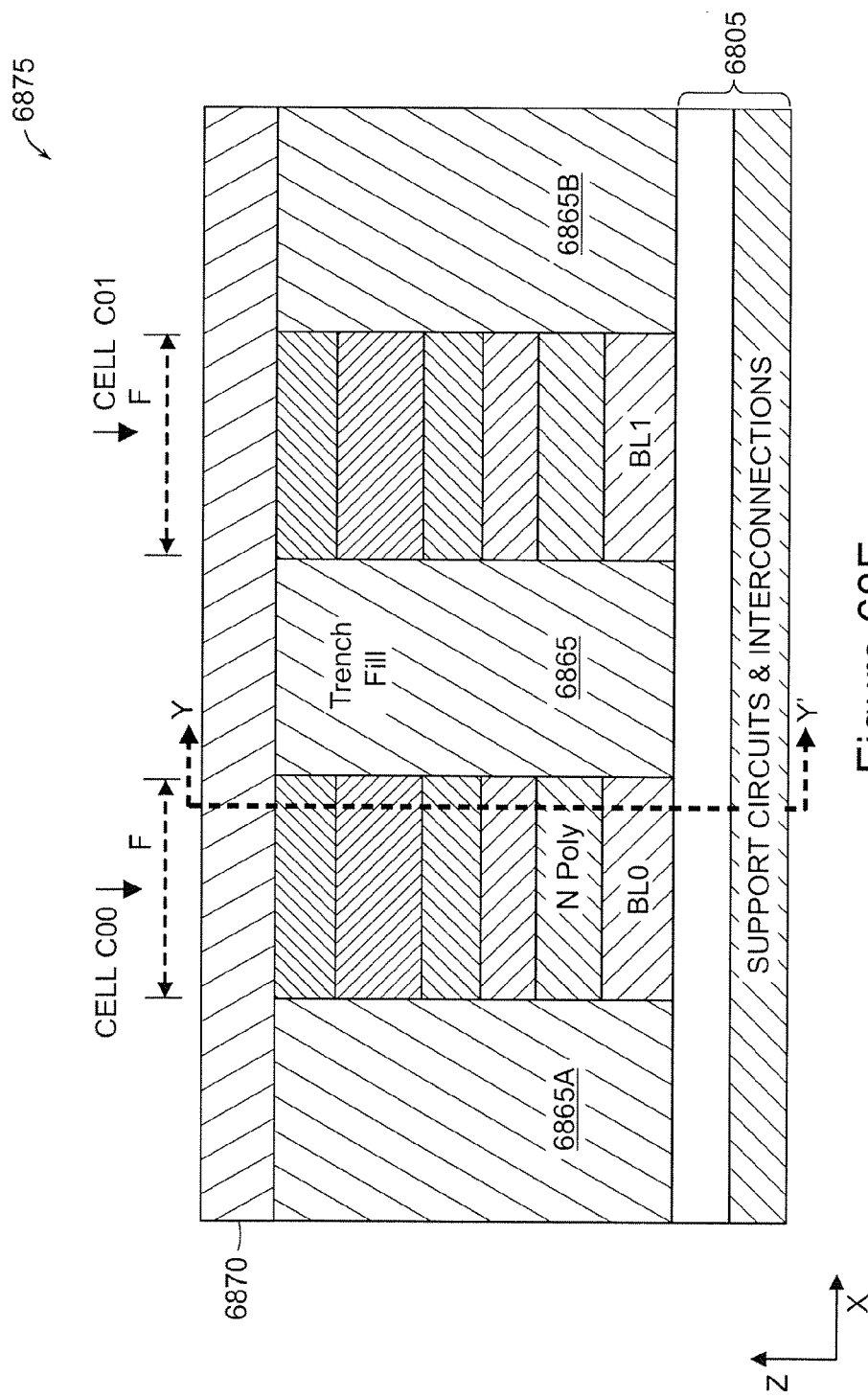

Next, methods deposit and planarize a conductor layer 6870 that contacts top (upper level) contacts 6840-1 and 6840-2 as illustrated in FIG. 68F.

Next, conductor layer 6870 is patterned to form word lines approximately orthogonal to conductors (bit lines) 6810-1 and 6810-2 as illustrated further below.

At this point in the process, cross section 6875 illustrated in FIG. 68F has been fabricated, and includes NV NT diode cell dimensions of F (where F is a minimum feature size) and cell periodicity 2F defined in the X direction as well as corresponding array bit lines. Next, cell dimensions used to define dimensions in the Y direction are formed by directional trench etch processes similar to those described further above with respect to cross section 6875 illustrated in FIG. 68F. Trenches used to define dimensions in the Y direction are approximately orthogonal to trenches used to define dimensions in the X direction. Cross sections of structures in the Y (bit line) direction are illustrated with respect to cross section Y-Y' illustrated in FIG. 68F.

Figure 68G:
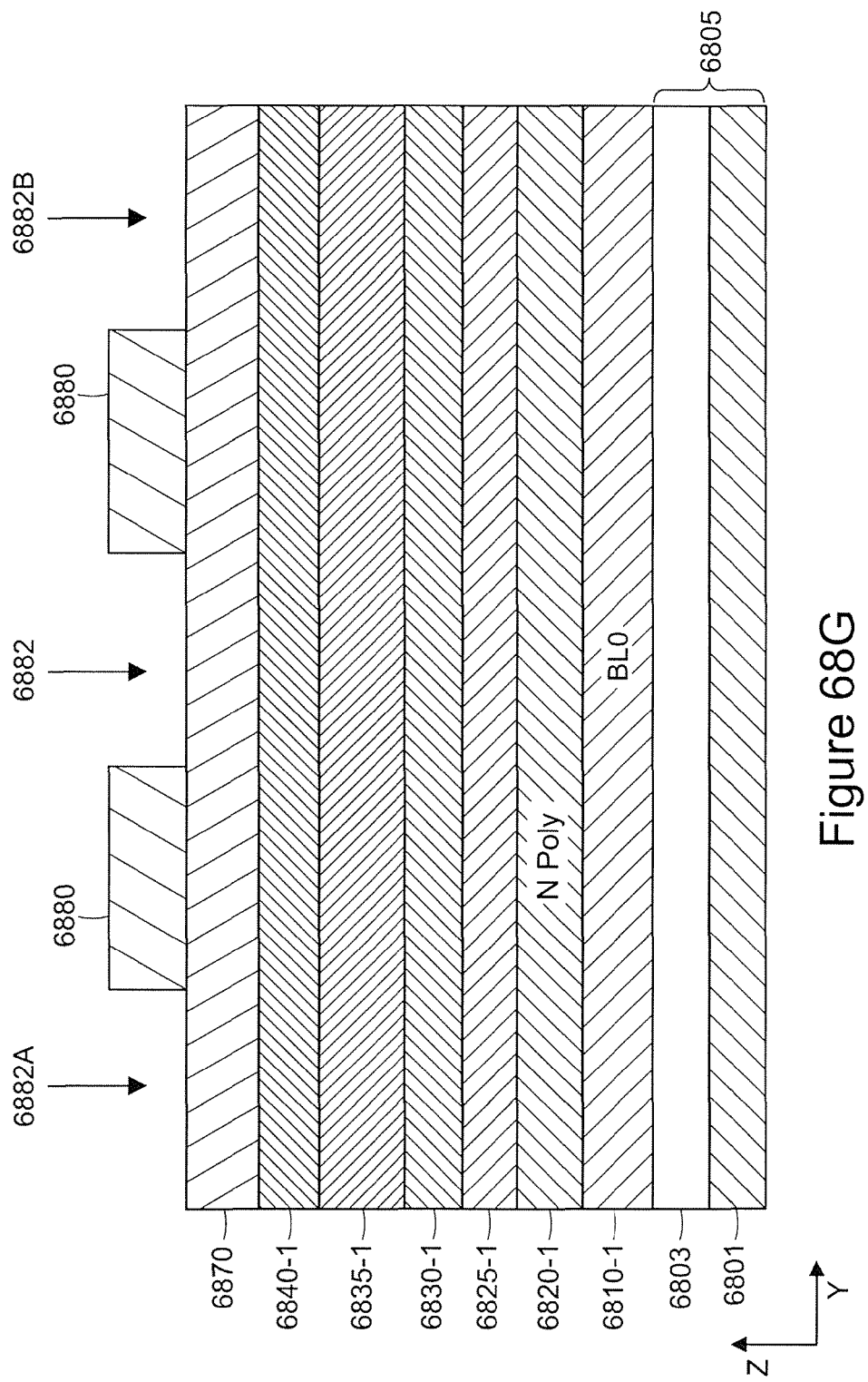

Next, methods deposit and pattern a masking layer such as masking layer 6880 with openings 6882, 6882A, and 6882B on the surface of word line layer 6870 as illustrated in FIG. 68G. Masking layer 6880 openings may be non-critically aligned to alignment marks in planar insulator 6803. Openings 6882, 6882A, and 6882B in mask layer 6880 determine the location of trench directional etch regions, in this case trenches are approximately orthogonal to bit lines such as bit line 6810-1 (BL0).

At this point in the process, openings 6882, 6882A, and 6882B in masking layer 6880 may be used for directional etching of trenches using methods that define new cell boundaries along the Y direction for 3D cells using one NV NT diode with an internal cathode-to-nanotube connection per cell. All trenches and corresponding cell boundaries may be formed simultaneously (e.g., using one etch step) using the methods of fabrication as used to form X-direction trenches as described with respect to FIG. 68D. This structure includes vertical sidewalls simultaneously defined by trenches; X and Y direction dimensions and materials are the same. In this example, methods of selective directional trench etch (RIE) removes exposed areas of conductor layer 6870 to form word lines 6870-1 (WL0) and 6870-2 (WL1) approximately orthogonal to bit lines 6810-1 (BL0) and 6810-2 (BL1); top (upper level) contact layer 6840-1 to form upper level contact regions 6840-1' and 6840-1"; removes exposed areas of nanotube layer 6835-1 to form nanotube regions 6835-1' and 6835-1"; removes exposed areas of bottom (lower level) contact layer 6830-1 to form bottom (lower level) contact regions 6830-1' and 6830-1"; selective directional etch removes exposed areas of N+ polysilicon layer 6825-1 to form N+ polysilicon regions 6825-1' and 6825-1"; removes exposed areas of polysilicon layer 6820-1 to form N polysilicon regions 6820-1' and 6820-1"; and stops etching at the surface of exposed areas of conductor layer 6810-1 as illustrated in FIG. 68H.

Figure 68I:
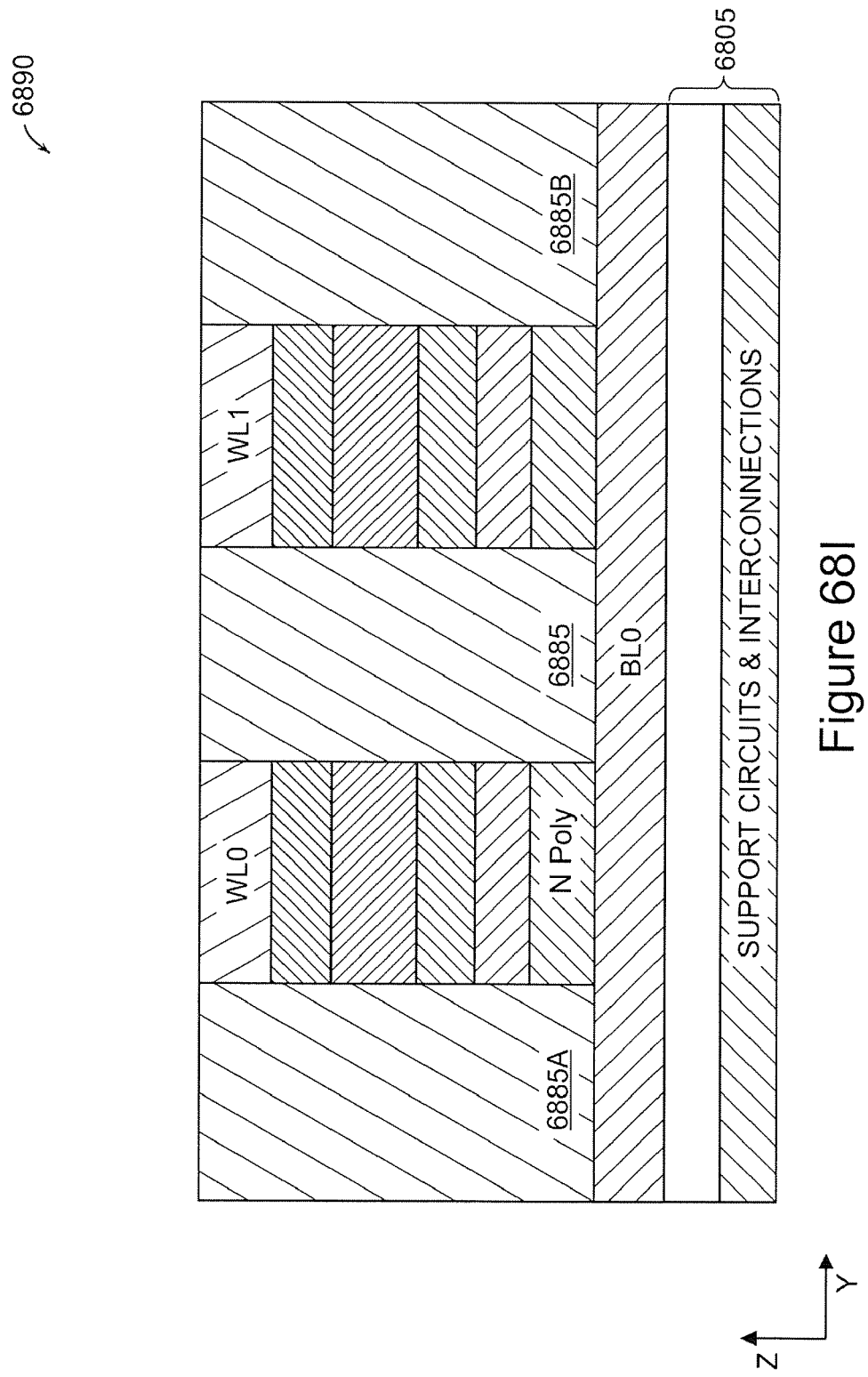

Next methods fill trench openings 6884, 6884A, and 6884B with insulators 6885, 6885A, and 6885B such as TEOS for example and planarize as illustrated by cross section 6890 in FIG. 68I. At this point in the process, nonvolatile nanotube diode-based cells are completely formed and interconnected with bit lines and approximately orthogonal word lines. Cross section 6875 illustrated in FIG. 68F and cross section 6890 illustrated in FIG. 68I are two cross sectional representation of the same 3D nonvolatile memory array with cells formed with NV NT diode having vertically oriented steering (select) diodes and nonvolatile nanotube blocks. The cathode terminal of the diode contacts the lower face of the block within the cell boundaries The anode side of the diode is in contact with a bit line such as bit line 6810-1 (BL0) and the top face of the block is in contact with an approximately orthogonal word line such as word line 6870-1 (WL0) as shown by cross section 6890 in FIG. 68I.

At this point in the process, cross sections 6875 and 6890 illustrated in FIGS. 68F and 68I, respectively, correspond to cross section 6700 illustrated in FIG. 67 and have been fabricated with cells having a vertically-oriented steering diodes and corresponding nonvolatile nanotube block switches in series, vertically-oriented (Z direction) channel lengths $L_{SW-CH}$ are defined, including overall NV NT diode cell dimensions of 1F in the X direction and 1F in the Y direction, as well as corresponding bit and word array lines. Cross section 6875 is a cross section of two adjacent cathode-to-nanotube type nonvolatile nanotube diode-based cells in the X direction and cross section 6890 is a cross section of two adjacent cathode-to-nanotube type nonvolatile nanotube diode-based cells in the Y direction. Cross sections 6875 and 6890 include corresponding word line and bit line array lines. The nonvolatile nanotube diodes form the steering and storage elements in each cell illustrated in cross sections 6875 and 6890, and with each cell having 1F by 1F dimensions. The spacing between adjacent cells is 1F so the cell periodicity is 2F in both the X and Y directions. Therefore one bit occupies an area of $4F^2$. At the 45 nm technology node, the cell area is less than 0.01 $um^2$, or approximately 0.002 $um^2$ in this example.

3-Dimensional Cell Structure of Nonvolatile Cells Using NV NT Devices Having Vertically Oriented Diodes and Nonvolatile Nanotube Blocks as Nonvolatile NT Switches Using Top and Bottom Contacts to Form Anode-on-NT Switches FIG. 69 illustrates cross section 6900 including cells C00 and C10 in a 3-D memory embodiment. Nanotube layers are deposited by coating, spraying, or other means on a planar contact surface above previously defined diode-forming layers as illustrated in FIG. 40 shown further above. Cross section 6900 illustrated in FIG. 69 correspond to structure 4000 illustrated in FIG. 40, with some additional detail associated with an anode-on-NT implementation and element numbers to facilitate description of methods of fabrication. Trench etching after the deposition of insulator, semiconductor, conductor, and nanotube layers form sidewall boundaries that define nonvolatile nanotube block-based nonvolatile nanotube diode 3-D memory cells and define nonvolatile nanotube block dimensions, diode dimensions, and the dimensions of all other structures in the three dimensional nonvolatile storage cells. The horizontal 3-D cell dimensions (X and Y approximately orthogonal directions) of all cell structures are formed by trench etching and are therefore self-aligned as fabricated. The vertical dimension (Z) is determined by the thickness and number of vertical layers used to form the 3-D cell. FIG. 69 illustrates cross section 6900 along a bit line (Y) direction. Stacked series-connected vertically-oriented steering diodes and nonvolatile nanotube block switches are symmetrical and have approximately the same cross sections in both X and Y directions. Cross section 6900 illustrates array cells in which the steering diode is connected to the bottom (lower level) contact of the nonvolatile nanotube block in an anode-on-NT configuration. Word lines are oriented along the X axis and bit lines along the Y axis as illustrated in perspective in FIG. 33A.

In some embodiments, methods 3010 described further above with respect to FIG. 30A are used to define support circuits and interconnections 6901.

Next, methods 3030 illustrated in FIG. 30B deposit and planarize insulator 6903. Interconnect means through planar insulator 6903 (not shown in cross section 6900 but shown above with respect to cross section 2800" in FIG. 28C) may be used to connect metal array lines in 3-D arrays to corresponding support circuits and interconnections 6901. By way of example, word line drivers in word line driver 2930 may be connected to word lines WL0 and WL1 in array 2910 of memory 2900 illustrated in FIG. 29A described further above, and in cross section 6900 illustrated in FIG. 69. At this point in the fabrication process, methods 3040 may be used to form a memory array on the surface of insulator 6903, interconnected with memory array support structure 6905 illustrated in FIG. 69. Memory array support structure 6905 corresponds to memory array support structure 3605 illustrated in FIG. 51, and support circuits & interconnections 6901 correspond to support circuits & interconnections 3601, and insulator 6903 corresponds to insulator 3603 except for some changes to accommodate a new memory array structure for 3-D memory cells that include nonvolatile nanotube blocks with top (upper level) and bottom (lower level) contacts.

In some embodiments, methods 3040 illustrated in FIG. 30B deposit and planarize metal, polysilicon, insulator, and nanotube element layers to form nonvolatile nanotube diodes which, in this example, include multiple vertically oriented diode and nonvolatile nanotube block (NV NT block) switch anode-on-NT series pairs. Individual cell boundaries are formed in a single etch step, each cell having a single NV NT Diode defined by a single trench etch step after layers, except the BL0 layer, have been deposited and planarized, in order to eliminate accumulation of individual layer alignment tolerances that would substantially increase cell area. Individual cell dimensions in the X direction are F (1 minimum feature) as illustrated in FIG. 40 and corresponding FIG. 67, and also F in the Y direction as illustrated in FIG. 69 which is approximately orthogonal to the X direction, with a periodicity in X and Y directions of 2F. Hence, each cell occupies an area of approximately $4F^2$.

NV NT blocks with top (upper level) and bottom (lower level) contacts, illustrated further above in FIG. 69 by nanotube elements 4050-1 and 4050-2, are further illustrated in perspective drawings in FIG. 57 further above. NV NT block device structures and electrical ON/OFF switching results are described with respect to FIGS. 64 and 65 further above. Methods of fabrication of NV NT blocks with top and bottom contacts are described with respect to methods 6600A, 6600B, and 6600C illustrated in FIGS. 66A, 66B, and 66C, respectively. NV NT blocks with top and bottom contacts have channel lengths $L_{SW-CH}$ approximately equal to the separation between top and bottom contacts, 35 nm for example as described further above with respect to FIGS. 64A-64C. A NV NT block switch cross section X by Y may be formed with X=Y=F, where F is a minimum technology node dimension. For a 35 nm technology node, a NV NT block may have dimensions of 35×35×35 nm; for a 22 nm technology node, a NV NT block may have dimensions of 22×22×35 nm, for example. The thickness of the nanotube element need not be related in any particular way to F.

Methods fill trenches with an insulator; and then methods planarize the surface. Then, methods deposit and pattern bit lines on the planarized surface.

The fabrication of vertically-oriented 3D cells illustrated in FIG. 69 proceeds as follows. In some embodiments, methods deposit a word line wiring layer on the surface of insulator 6903 having a thickness of 50 to 500 nm, for example. Fabrication of the vertically-oriented diode portion of structure 6900 is the same as in FIG. 36A described further above. In some embodiments, methods etch the word line wiring layer and define individual word lines such as word line conductors 6910-1 (WL0) and 6910-2 (WL1). Word lines such as WL0 and WL1 are used as array wiring conductors and may also be used as near-ohmic contacts to N+ poly cathode terminals of Schottky diodes.

Examples of contact and conductors materials include elemental metals such as Al, Au, W, Ta, Cu, Mo, Pd, Pt, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, CoSi$_x$ and TiSi$_x$. Insulators may be SiO$_2$, SiN$_x$, Al$_2$O$_3$, BeO, polyimide, Mylar or other suitable insulating material.

Next, methods form N+ polysilicon regions 6920-1 and 6920-2 to contact word line regions 6910-1 and 6920-2, respectively. N+ polysilicon is typically doped with arsenic or phosphorous to $10^{20}$ dopant atoms/cm$^3$, for example, and has a thickness of 20 to 400 nm, for example.

Next, N polysilicon regions 6925-1 and 6925-2 are formed to contact N+ polysilicon regions 6920-1 and 6920-2, respectively, and may be doped with arsenic or phosphorus in the range of $10^{14}$ to $10^{17}$ dopant atoms/cm$^3$ for example, and may have a thickness range of 20 nm to 400 nm, for example. N polysilicon regions 6925-1 and 6925-2 form the cathode regions of corresponding Schottky diodes. N and N+ polysilicon region dimensions are defined by trench etching near the end of the process flow.

Next, methods form contact regions 6930-1 and 6930-2 on N polysilicon regions 6925-1 and 6925-2, respectively. Contact regions 6930-1 and 6930-2 form anode regions that complete the formation of vertically oriented steering diode structures. Contact regions 6930-1 and 6930-2 also form bottom (lower level) contacts for NV NT blocks 4050-1 and 4050-2, respectively. Fabrication of the vertically-oriented diode portion of structure 6900 is similar to methods of fabrication described with respect to FIG. 36A further above. While FIG. 69 illustrates an anode-on-NT type NV NT diode formed with Schottky diodes, PN or PIN diodes may be sued instead of Schottky diodes as described further above with respect to FIG. 36A'

In some cases conductors such as Al, Au, W, Cu, Mo, Ti, and others may be used as both NV NT block contacts and anodes for Schottky diodes. However, in other cases, optimizing anode material for lower forward voltage drop and lower diode leakage is advantageous. In such an example (not shown) a sandwich may be formed with Schottky diode anode material in contact with N polysilicon regions and NV NT block contact material forming bottom (lower regions) contacts. Such anode materials may include Al, Ag, Au, Ca, Co, Cr, Cu, Fe, Ir, Mg, Mo, Na, Ni, Os, Pb, Pd, Pt, Rb, Ru, Ta, Ti, W, Zn and other elemental metals. Also, silicides such as CoSi$_2$, MoSi$_2$, Pd$_2$Si, PtSi, RbSi$_2$, TiSi$_2$, WSi$_2$, and ZrSi$_2$ may be used. Schottky diodes formed using such metals and silicides are illustrated in the reference by N G, K. K. "Complete Guide to Semiconductor Devices", Second Edition, John Wiley & Sons, 2002, pp. 31-41, the entire contents of which are incorporated herein by reference. Examples of NV NT block contact and materials, also in contact with anode materials, include elemental metals such as Al, Au, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, CoSi$_x$ and TiSi$_x$.

Next, methods form NV NT block 4050-1 and 4050-2 on the surface of contact regions 6930-1 and 6930-2, respectively, having the nanotube element length $L_{SW-CH}$ of the NV NT blocks defined by the nanotube thickness in the vertical Z direction and X-Y cross section defined by trench etching near the end of the process flow. Note that NV NT block 4050-1 in FIG. 69 corresponds to nanotube element 4050 in FIG. 40. In order to maximize the density of cells C00 and C10, NV NT blocks 4050-1 and 4050-2 illustrated in FIG. 69 include simple top and bottom contacts within trench-defined cell boundaries.

Next, methods form top (upper level) contacts 4065-1 and 4065-2 on the top surfaces of NV NT blocks 4050-1 and 4050-2, respectively, with X and Y dimensions defined by trench etching near the end of the process flow.

Next, methods form (etch) trench openings 6975, 6975A, and 6975B of width F thereby forming inner and outer sidewalls of cells C00 and C10 and corresponding top (upper level) and bottom (lower level) contacts, nanotube elements, and insulators. Bottom (lower level) contacts 6930-1 and 6930-2 form an electrical connection between NV NT blocks 4050-1 and 4050-2, respectively, and also form underlying steering diode anode terminals, and form word lines 6910-1 and 6910-2. Trench formation (etching) stops at the surface of insulator 6903.

Next, methods fill trench openings 6975, 6975A, and 6975B with an insulator 6960, 6960A, and 6960B such as TEOS and planarize the surface. All trenches can be formed simultaneously.

Next, methods deposit and planarize a bit line layer.

Next, methods pattern bit line 6970.

Nonvolatile nanotube diodes forming cells C00 and C10 correspond to nonvolatile nanotube diode 1300 schematic in FIG. 13, also illustrated schematically by NV NT diode 6980 in FIG. 69, one in each of cells C00 and C10. Cells C00 and C10 illustrated in cross section 6900 in FIG. 69 correspond to corresponding cells C00 and C10 shown schematically in memory array 2910 in FIG. 29A, and word lines WL0 and WL1 and bit line BL0 correspond to array lines illustrated schematically in memory array 2910.

At this point in the process, corresponding structures in the X direction are formed to complete NV NT diode-based cell structures. FIG. 70 illustrates cross section 7000 along word line WL0 along word line (X axis) direction. Stacked series-connected vertically-oriented steering diodes and nonvolatile nanotube block switches are symmetrical and have approximately the same cross sections in both X and Y directions. Cross section 7000 illustrates array cells in which the steering diode is connected to the bottom (lower level) contact of the nonvolatile nanotube block in an anode-on-NT configuration. Word lines are oriented along the X axis and bit lines along the Y axis as illustrated in perspective in FIG. 33A.

Cross section 7000 illustrated in FIG. 70 illustrates support circuits and interconnections 6901 and insulator 6903 as described further above with respect to FIG. 69. Cross section 7000 is in the X direction along word line 6910-1 (WL0).

N+ polysilicon regions 6920-1' and 6920-1" form contacts between word line 6910-1 (WL0) and N polysilicon regions 6925-1' and 6925-1", respectively, that form diode cathode regions. Bottom (lower level) contacts 6930-1' and 6930-1" act as anodes to form Schottky diodes with N polysilicon regions 6925-1' and 6925-1", respectively, as well as contacts to nonvolatile nanotube blocks 4050-1' and 4050-1", respectively, as illustrated in cross section 7000 illustrated in FIG. 70.

NV NT block 4050-1' and 4050-1" on the surface of contact regions 6930-1' and 6930-1", respectively, have nanotube element length $L_{SW-CH}$ of the NV NT blocks defined by the nanotube thickness in the vertical Z direction and X-Y cross section defined by trench etching near the end of the fabrication process. Note that NV NT block 4050-1' in FIG. 70 corresponds to NV NT block 4050-1 illustrated in FIG. 69. In order to maximize the density of cells C00 and C01 illustrated in FIG. 70, NV NT blocks 4050-1' and 4050-1" include simple top and bottom contacts within trench-defined cell boundaries Contacts to the top surfaces of NV NT tubes are illustrated in FIG. 70 by top (upper level) contacts 4065-1' and 4065-1" on the top surfaces of NV NT blocks 4050-1' and 4050-1", respectively.

Bit lines 6970-1 (BL0) and 6970-2 are in direct contact with top (upper level) contacts 4065-1' and 4065-1", respectively, as illustrated in FIG. 70.

Next, methods 3050 illustrated in FIG. 30A complete fabrication of semiconductor chips with nonvolatile memory arrays using nonvolatile nanotube diode cell structures including passivation and package interconnect means using known industry methods.

Corresponding cross sections 6900 and 7000 illustrated in FIGS. 69 and 70, respectively, show an anode-to-NT 3D memory array with nonvolatile nanotube block-based switches. Nanotube channel length $L_{SW-CH}$ corresponds to NV NT diode cell dimensions in the Z direction, with X-Y cross sections with X=Y=F, as well as corresponding bit and word array lines. Cross section 6900 is a cross section of two adjacent anode-to-nanotube type nonvolatile nanotube diode-based cells in the Y direction that includes a NV NT block-based switch, and cross section 7000 is a cross section of two adjacent anode-to-nanotube type nonvolatile nanotube diode-based cells in the X direction that includes a NV NT block-based switch. Cross sections 6900 and 7000 include corresponding word line and bit line array lines. The nonvolatile nanotube diodes form the steering and storage elements in each cell illustrated in cross sections 6900 and 7000, and each cell has 1F by 1F dimensions. The spacing between adjacent cells is 1F so the cell periodicity is 2F in both the X and Y directions. Therefore one bit occupies an area of $4F^2$. At the 45 nm technology node, the cell area is less than about 0.01 $um^2$, or approximately 0.002 $um^2$ in this example.

Corresponding cross sections 6900 and 7000 illustrated in FIGS. 69 and 70, respectively, methods of fabrication correspond to the methods of fabrication described with respect to FIG. 68, except that the vertical position of N polysilicon and N+ silicon layers are interchanged. NV NT block switch fabrication methods of fabrication are the same. The only difference is that the N polysilicon layer is etched before N+ polysilicon layer when forming trenches in cross sections 6900 and 7000.

Nonvolatile Memories Using NV NT Diode Device Stacks with Both Shared Array Line and Non-Shared Array Line Stacks and Cathode-to-NT Switch Connections and Nonvolatile Nanotube Block with Top and Bottom Contacts Forming 3-D NV NT Switches FIG. 32 illustrates a method 3200 of fabricating embodiments of the invention having two memory arrays stacked one above the other and on an insulating layer above support circuits formed below the insulating layer and stacked arrays, and with communications means through the insulating layer. While method 3200 is described further herein with respect to nonvolatile nanotube diodes 1200 and 1300, method 3200 is sufficient to cover the fabrication of many of the embodiments of nonvolatile nanotube diodes described further above. Note also that although methods 3200 are described in terms of 3D memory embodiments, methods 3200 may also be used to form 3D logic embodiments based on NV NT diodes arranged as logic arrays such as NAND and NOR arrays with logic support circuits (instead of memory support circuits) as used in PLAs, FPGAs, and PLDs, for example.

FIG. 71 illustrates a 3D perspective drawing 7100 that includes a two-high stack of three dimensional arrays, a lower array 7102 and an upper array 7104. Lower array 7102 includes nonvolatile nanotube diode cells C00, C01, C10, and C11. Upper array 7104 includes nonvolatile nanotube diode cells C02, C12, C03, and C13. Word lines WL0 and WL1, shared between upper and lower arrays, are oriented along the X direction and bit lines BL0, BL1, BL2, and BL3 are oriented along the Y direction and are approximately orthogonal to word lines WL1 and WL2. Nanotube element channel length $L_{SW-CH}$ is oriented vertically as shown in 3D perspective drawing 7100. Cross section 7200 corresponding to cells C00, C01, C02 and C03 is illustrated further below in FIG. 72A and cross section 7200' corresponding to cells C00, C02, C12, and C10 are illustrated further below in FIG. 72B.

In general, methods 3210 fabricate support circuits and interconnections in and on a semiconductor substrate. This includes NFET and PFET devices having drain, source, and gate that are interconnected to form memory (or logic) support circuits. Such structures and circuits may be formed using known techniques that are not described in this application. In some embodiments, methods 3210 are used to form a support circuits and interconnections 7201 layer as part of cross sections 7200 and 7200' illustrated in FIGS. 72A and 72B using known methods of fabrication in and on which nonvolatile nanotube diode control and circuits are fabricated. Support circuits and interconnections 7201 are similar to support circuits and interconnections 6701 illustrated in FIGS. 67 and 6901 illustrated in FIG. 69, for example, but are modified to accommodate two stacked memory arrays. Note that while two-high stacked memory arrays are illustrated in FIGS. 72A-72B, more than two-high 3D array stacks may be formed (fabricated), including but not limited to 4-high and 8 high stacks for example.

Next, methods 3210 are also used to fabricate an intermediate structure including a planarized insulator with interconnect means and nonvolatile nanotube array structures on the planarized insulator surface such as insulator 7203 illustrated in cross sections 7200 and 7200' in FIGS. 72A and 72B, respectively, and are similar to insulator 6703 illustrated in FIG. 67 and insulator 6901 illustrated in FIG. 69, but are modified to accommodate two stacked memory arrays. Interconnect means include vertically-oriented filled contacts, or studs, for interconnecting memory support circuits in and on a semiconductor substrate below the planarized insulator with nonvolatile nanotube diode arrays above and on the planarized insulator surface. Planarized insulator 7203 is formed using methods similar to methods 2730 illustrated in FIG. 27B. Interconnect means through planar insulator 7203 (not shown in cross section 7200) are similar to contact 2807 illustrated in FIG. 28C and may be used to connect array lines in first memory array 7210 and second memory array 7220 to corresponding support circuits and interconnections 7201. Support circuits and interconnections 7201 and insulator 7203 form memory array support structure 7205.

Next, methods 3220, similar to methods 2740, are used to fabricate a first memory array 7210 using diode cathode-to-nanotube switches based on a nonvolatile nanotube diode array similar to a nonvolatile nanotube diode array cross section 6700 illustrated in FIG. 67 and corresponding methods of fabrication.

Next, methods 3230 similar to methods 3040 illustrated in FIG. 30B, fabricate a second memory array 7220 on the planar surface of first memory array 7210, but using diode anode-to-nanotube switches based on a nonvolatile nanotube diode array similar to a nonvolatile nanotube diode array cross section 6900 illustrated in FIG. 69 and corresponding methods of fabrication FIG. 72A illustrates cross section 7200 including first memory array 7210 and second memory array 7220, with both arrays sharing word line 7230 in common. Word lines such as 7230 are defined (etched) during a methods trench etch that defines memory array (cells) when forming array 7220. Cross section 7200 illustrates combined first memory array 7210 and second memory array 7220 in the word line, or X direction, with shared word line 7230 (WL0), four bit lines BL0, BL1, BL2, and BL3, and corresponding cells C00, C01, C02, and C03. The array periodicity in the X direction is 2F, where F is a minimum dimension for a technology node (generation).

FIG. 72B illustrates cross section 7200' including first memory array 7210' and second memory array 7220' with both arrays sharing word lines 7230' and 7232 in common. Word line 7230' is a cross sectional view of word line 7230. Word lines such as 7230' and 7232 are defined (etched) during a methods trench etch that defines memory array (cells) when forming array 7220'. Cross section 7200' illustrates combined first memory array 7210' and second memory array 7220' in the bit line, or Y direction, with shared word lines 7230' (WL0) and 7232 (WL1), two bit lines BL0 and BL2, and corresponding cells C00, C10, C02, and C12. The array periodicity in the Y direction is 2F, where F is a minimum dimension for a technology node (generation).

The memory array cell area of 1 bit for array 7210 is $4F^2$ because of the 2F periodicity in the X and Y directions. The memory array cell area of 1 bit for array 7220 is $4F^2$ because of the 2F periodicity in the X and Y directions. Because memory arrays 7220 and 7210 are stacked, the memory array cell area per bit is $2F^2$. If four memory arrays (not shown) are stacked, then the memory array cell area per bit is $1F^2$.

Exemplary methods 3240 using industry standard fabrication techniques complete fabrication of the semiconductor chip by adding additional wiring layers as needed, and passivating the chip and adding package interconnect means.

Figure 33D:
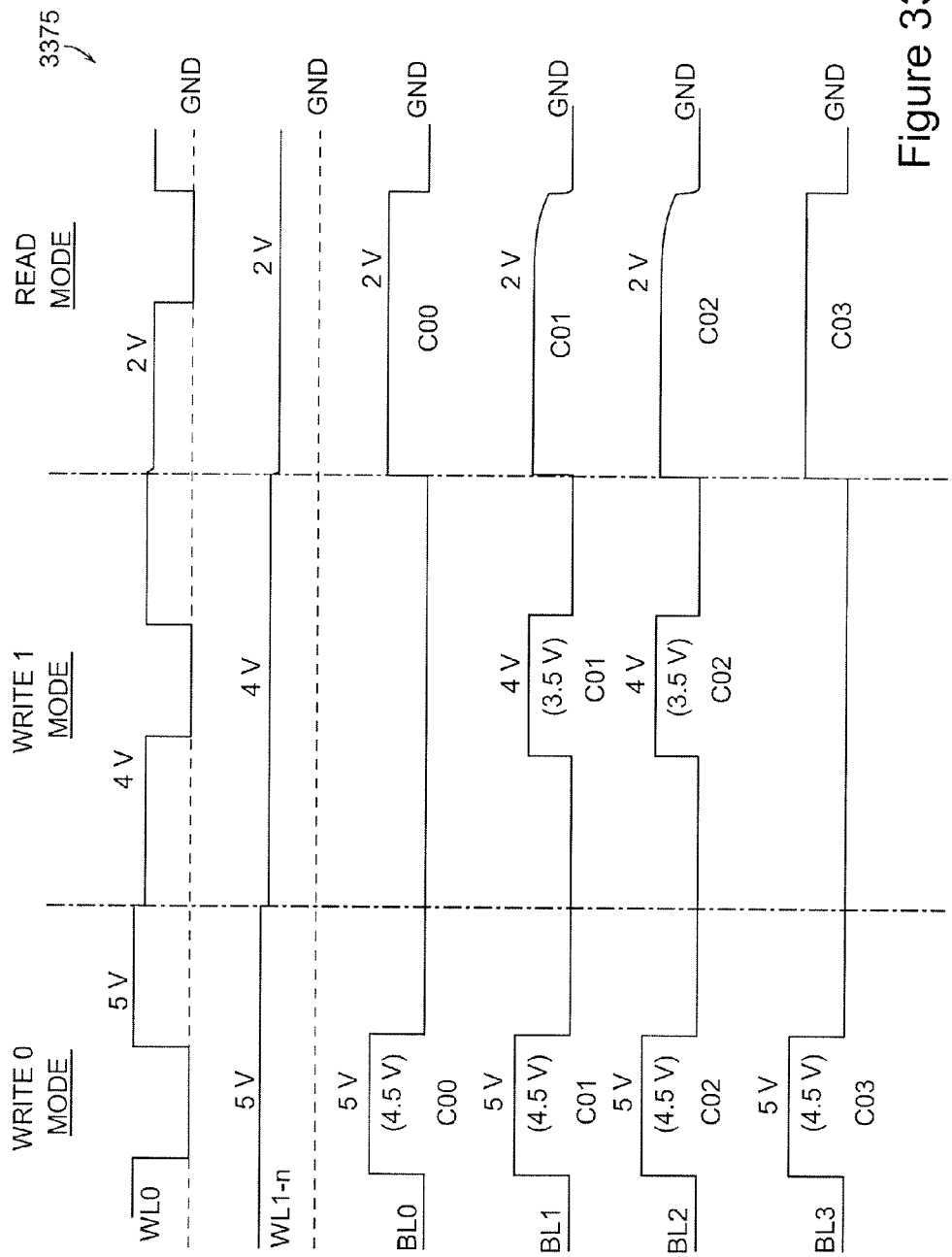
FIG. 33D illustrates operational waveforms for the memory structures illustrated in FIGS. 33A, 33B, and 33B', according to some embodiments.

In operation, memory cross section 7200 illustrated in FIG. 72A and corresponding memory cross section 7200' illustrated in FIG. 72B correspond to the operation of memory cross section 3305 illustrated in FIG. 33B and corresponding memory cross section 3305' illustrated in FIG. 33B'. Memory cross section 7200 and corresponding memory cross section 7200' operation is the same as described with respect to waveforms 3375 illustrated in FIG. 33D FIG. 71 shows a 3D perspective drawing 7100 of a 2-high stacked array with shared word lines WL0 and WL1. FIG. 72A illustrates a corresponding 2-high cross section 7200 in the X direction and FIG. 72B illustrates a corresponding 2-high cross section 7200' in the Y direction. Cells C00 and C01 in the lower array are formed using cathode-to-NT NV NT diode and cells C02 and C03 in the upper array are formed using anode-to-NT NV NT diodes. An alternative stacked array structure that does not share array wiring, such as word lines for example, is illustrated in FIGS. 73 and 74. Stacked arrays that do not share word line may use the same NV NT diode types. For example, FIGS. 73 and 74 use cathode-on-NT NV NT diodes for both upper and lower arrays. However, anode-on-NT NV NT diode cells may be used instead. If desired, stacks may continue to use a mixture of cathode-on NT and anode-on-NT NV NT diode cells. By not sharing array lines between upper and lower arrays, greater fabrication flexibility and interconnect flexibility are possible as illustrated further below with respect to FIGS. 75, 76A-76D, and 77.

FIG. 73 illustrates a 3D perspective drawing 7300 that includes a two-high stack of three dimensional arrays, a lower array 7302 and an upper array 7304, with no shared (common) array lines between upper array 7204 and lower array 7302. Word lines WL0 and WL1 oriented in the X direction and bit lines BL0 and BL1 oriented in the Y direction interconnect cells C00, C01, C10, and C11 to form array interconnections for lower array 7302. Lower array 7302 cells C00, C01, C10, and C11 are formed by cathode-on-NT NV NT diodes, however, anode-on-NT NV NT diodes may be used instead. Word lines WL2 and WL3 oriented in the X direction and bit lines BL2 and BL3 oriented in the Y direction interconnect cells C22, C32, C23, and C33 to form array interconnections for upper array 7304. Upper array 7304 cells C22, C32, C23, and C33 are formed by cathode-on-NT NV NT diodes, however, anode-on-NT NV NT diodes may be used instead. Bit lines are approximately parallel, word lines are approximately parallel, and bit lines and word lines are approximately orthogonal. Nanotube element channel length $L_{SW-CH}$ is oriented vertically as shown in 3D perspective drawing 7300. Cross section 7400 illustrated in FIG. 74 corresponding to cells C00, C01, C22, and C23 are illustrated further below in FIG. 74.

FIG. 74 illustrates cross section 7400 including first memory array 7410 that includes cells C00 and C01, bit lines BL0 and BL1, and word line WL0, and second memory array 7420 that includes cells C22 and C23, bit lines BL2 and BL3, and word line WL2. Lower array 7410 and upper array 7420 are separated by insulator and interconnect region 7440 and do not share word lines. Cross section 7400 illustrates stacked first memory array 7210 and second memory array 7220 in the word line, or X direction, with word lines WL0 and WL2, four bit lines BL0, BL1, BL2, and BL3, and corresponding cells C00, C01, C22, and C23. The array periodicity in the X direction is 2F, where F is a minimum dimension for a technology node (generation). A cross section in the Y direction corresponding to X direction cross section 7400 is not shown. However, the NV NT diode cells are symmetrical in both X and Y direction, hence the NV NT diode cells look the same. Only the orientation of bit lines and word lines change due to a rotation by 90 degrees.

The memory array cell area of 1 bit for array 7410 is $4F^2$ because of the 2F periodicity in the X and Y directions. The memory array cell area of 1 bit for array 7420 is $4F^2$ because of the 2F periodicity in the X and Y directions. Because memory arrays 7420 and 7410 are stacked, the memory array cell area per bit is $2F^2$. If four memory arrays (not shown) are stacked, then the memory array cell area per bit is $1F^2$.

Figure 75:
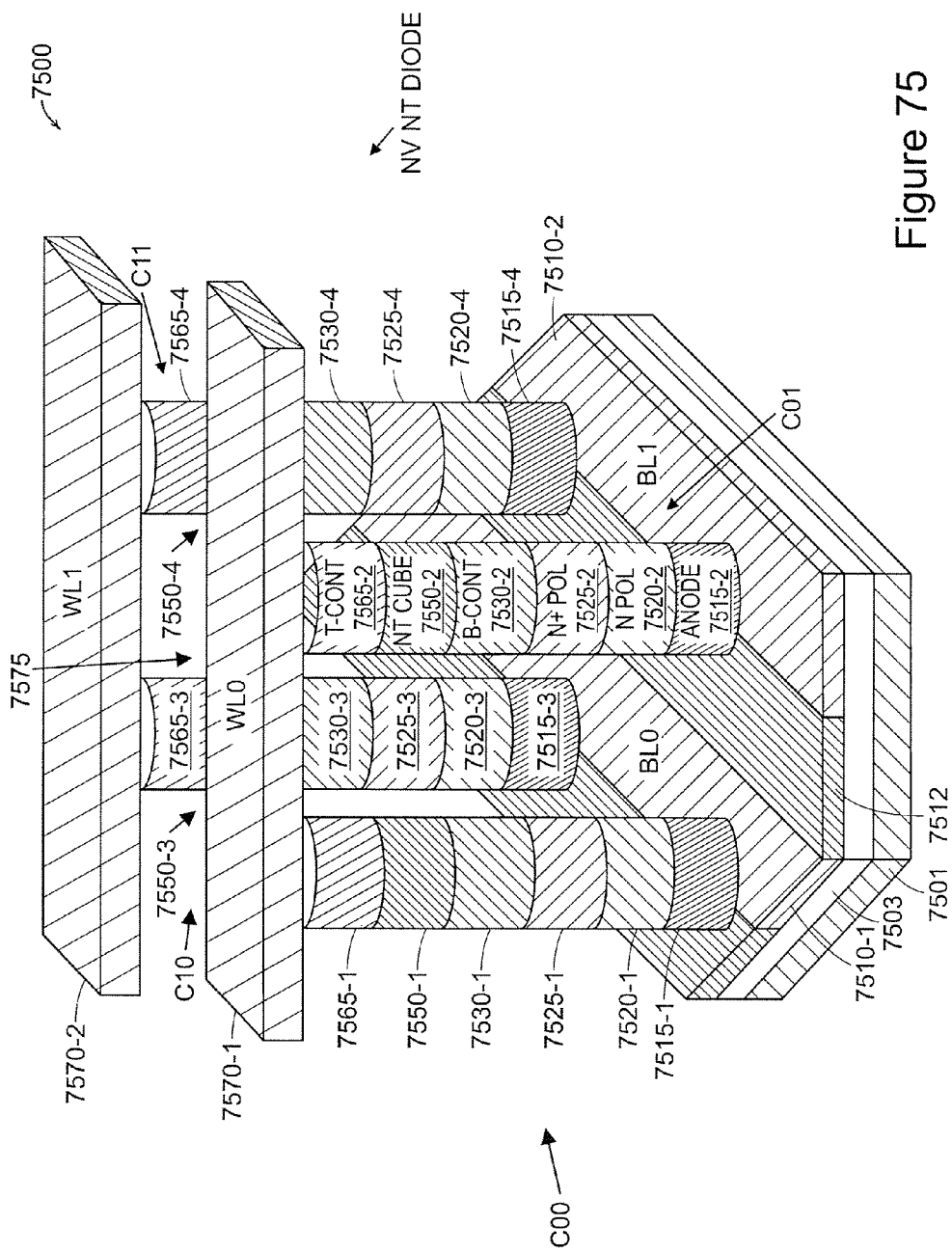
FIG. 75 illustrates a 3-D perspective of an embodiment of a nonvolatile memory array including four 3-D nonvolatile memory cells, with each cell including a 3-D nonvolatile nanotube diode including a nonvolatile nanotube block-based switch, and cell interconnections formed by bit lines and word lines.

An Alternative Simplified 3-Dimensional Cell Structure of Nonvolatile Cells Using NV NT Devices Having Vertically Oriented Diodes and Nonvolatile Nanotube Blocks as Nonvolatile NT Switches Using Top and Bottom Contacts to Form Cathode-on-NT Switches FIG. 75 illustrates a 3-D perspective of nonvolatile memory array 7500 including four 3-D nonvolatile memory cells C00, C01, C10, and C11, with each cell including a 3-D nonvolatile nanotube diode, and cell interconnections formed by bit lines BL0 and BL1 and word lines WL0 and WL1. Nonvolatile memory array 7500 illustrated in FIG. 75 corresponds to cross section 4000 illustrated in FIG. 40, cross section 6700 illustrated in FIG. 67, and cross sections 6875 and 6890 illustrated in FIG. 68F and FIG. 68I, respectively, shown further above. The 3-D NV NT diode dimensions used to form cells in cross sections 6700, 6875, and 6890 are defined in two masking steps. First methods of masking define trench boundaries used to form cell boundaries using directional methods of trench etching. In some embodiments, methods of fabrication described further above with respect to FIGS. 68A-68I form cell boundaries in the X direction, fill trenches with insulation, and planarize the surface. Then, second methods of masking define trenches and then methods of fabrication described further above with respect to FIG. 68A-68I form cell boundaries in the Y direction, fill trenches with insulation, and planarize the surface. Cell boundaries in the X and Y directions are approximately orthogonal.

A memory block structure with top (upper level) and bottom (lower level) contacts illustrated in FIGS. 40, 67, and 68A-68I is symmetrical in the X and Y directions. 3-D memory arrays formed with NV NT blocks with top (upper level) and bottom (lower level) contacts enable 3-D symmetric cells, which may be leveraged to enable simplified methods of fabrication to pattern and simultaneously fabricate memory arrays of 3-D NV NT diodes. X and Y direction dimensions may be defined simultaneously, selective directional etching may be used to simultaneously define 3-D NV NT diode cells, then fill the opening with insulation and planarize the surface. So, for example, methods of fabrication that correspond to methods of fabrication described with respect to structures illustrated in FIG. 68D also simultaneously form the structures illustrated in FIG. 68H. Such simplified methods of fabrication facilitate multi-level array stacking because each level is fabricated with less processing steps. In this example, X=Y=F, where F is a minimum technology dimension for a chosen technology node. For example, for F=45 nm technology nodes, X=Y=45 nm. The array mask design illustrated further below with respect to 76C illustrates a plan view of F×F shapes as drawn, with each F×F shape stepped in X and Y direction by a distance F. During the process of exposing a mask layer image on the surface of the chip, rounding of corners typically takes place at minimum technology node dimensions F, and the masking layer images approximate circles of diameter F as illustrated in a plan view illustrated further below in FIG. 76D. Because of the rounding effects, 3-D NV NT diodes forming the cells of memory array 7500 will be approximately cylindrical in shape as illustrated in FIG. 75. Memory array 7500 illustrated in FIG. 75 uses cathode-on-NT type of 3-D NV NT diodes. However, anode-on-NT type of 3-D NV NT diodes such as those illustrated in FIGS. 69 and 70 may be formed instead.

Figure 76A:
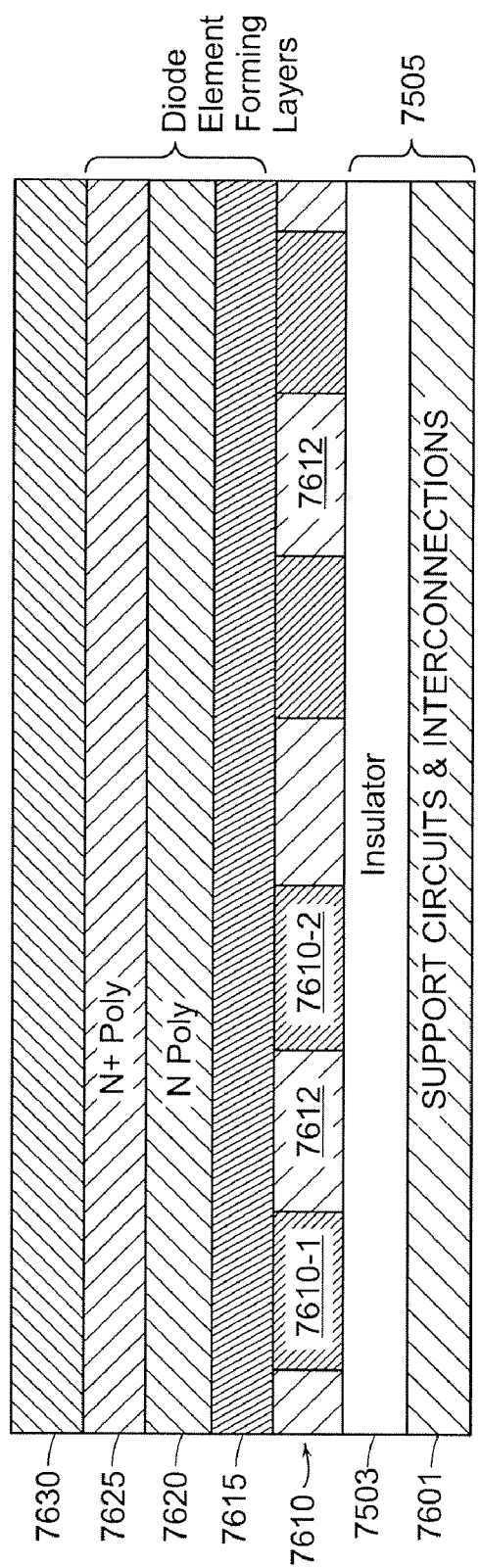
FIGS. 76A-76D illustrate methods of fabrication of a cathode-on-nanotube memory cross sectional structure with nonvolatile nanotube diodes that include nonvolatile nanotube block-based switches within vertical cell boundaries, such as those illustrated in FIG. 75, according to some embodiments.

Nonvolatile memory array methods of fabrication correspond to methods of fabrication described further above with respect to FIGS. 68A-68I. However, bit line dimensions are defined prior to 3-D NV NT diode cell formation since bit lines are no longer defined by an etch step process at the same time as the definition of cell boundaries, and FIG. 68A is modified as illustrated in FIG. 76A. Also, mask 6850 dimensions illustrated in FIG. 68C had only the X direction equal to F. However, the Y direction was as long as the memory array or memory sub-array used to form the memory array. Simplified methods of fabrication illustrated further below with respect to FIGS. 76C and 76D illustrate a mask having the same in X and Y directions. In some embodiments, methods of fabrication corresponding to methods of fabrication described with respect to FIGS. 68D, 68E, and 68F may be used to complete fabrication of the memory array 7500 structure.

Defining bit lines BL0 and BL1 prior to 3-D NV NT diode formation requires that masks be aligned to pre-defined bit lines BL0 and BL1. Using semiconductor industry methods, alignment may be achieved within a range of approximately +−F/3. So, for example, for F=45 nm node, the alignment will be within +−15 nm and bit lines BL0 and BL1 are therefore in contact with most of the anode area of 3-D NV NT diodes memory cells as illustrated further below with respect to FIG. 76B.

Support circuits & interconnections 7501 illustrated in nonvolatile memory array 7500 illustrated in FIG. 75 corresponds to support circuits and interconnections 6701 shown in cross section 6700 illustrated in FIG. 67.

Planarized insulator 7503 illustrated in FIG. 75 corresponds to planarized insulator 6703 illustrated in FIG. 67. Interconnect means through planar insulator 7503 (not shown in cross section 7500 but shown above with respect to cross section 2800" in FIG. 28C) may be used to connect metal array lines in 3-D arrays to corresponding support circuits and interconnections 7501. By way of example, bit line drivers in BL driver and sense circuits 2640 may be connected to bit lines BL0 and BL1 in array 2610 of memory 2600 illustrated in FIG. 26A described further above, and in nonvolatile memory array 7500 illustrated in FIG. 75.

Bit lines 7510-1 (BL0) and 7510-2 (BL1) are patterned as described further below with respect to FIG. 76A. Cells C00, C01, C10, and C11 are formed by corresponding 3-D NV NT diodes that include NV NT blocks with top (upper level) and bottom (lower level) contacts as described further below with respect to FIGS. 76A-76D.

Cell C00 includes a corresponding 3-D NV NT diode formed by a steering diode with a cathode-to-NT series connection to a bottom (lower level) contact of a NV NT block. Anode 7515-1 is in contact with bit line 7510-1 (BL0), and the top (upper level) contact 7565-1 of NV NT block 7550-1 is in contact with word line 7570-1 (WL0). The NV NT diode corresponding to cell C00 includes anode 7515-1 in contact with bit line 7510-1 (BL0), and also in contact with N polysilicon region 7520-1. N polysilicon region 7520-1 is in contact with N+ polysilicon region 7525-1. Anode 7515-1, N polysilicon region 7520-1, and N+ polysilicon region 7525-1 form a Schottky-type of steering diode. Note that PN or PIN diodes (not shown) may be used instead. N+ polysilicon region 7525-1 is in contact with bottom (lower level) contact 7530-1, which also forms the bottom (lower level) contact of NV NT block 7550-1. NV NT block 7550-1 is also in contact with top (upper level) contact 7565-1, which is in turn in contact with word line 7570-1 (WL0). NV NT block 7550-1 channel length $L_{SW\text{-}CH}$ is vertically oriented and is approximately equal to the distance between top (upper level) contact 7565-1 and bottom (lower level) contact 7530-1, which may be defined by the thickness of the NV NT block.

Cell C01 includes a corresponding 3-D NV NT diode formed by a steering diode with a cathode-to-NT series connection to a bottom (lower level) contact of a NV NT block. Anode 7515-2 is in contact with bit line 7510-2 (BL1), and the top (upper level) contact 7565-2 of NV NT block 7550-2 is in contact with word line 7570-1 (WL0). The NV NT diode corresponding to cell C01 includes anode 7515-2 in contact with bit line 7510-2 (BL1), and also in contact with N polysilicon region 7520-2. N polysilicon region 7520-2 is in contact with N+ polysilicon region 7525-2. Anode 7515-2, N polysilicon region 7520-2, and N+ polysilicon region 7525-2 form a Schottky-type of steering diode. Note that PN or PIN diodes (not shown) may be used instead. N+ polysilicon region 7525-2 is in contact with bottom (lower level) contact 7530-2, which also forms the bottom (lower level) contact of NV NT block 7550-2. NV NT block 7550-2 is also in contact with top (upper level) contact 7565-2, which is in turn in contact with word line 7570-1 (WL0). NV NT block 7550-2 channel length $L_{SW\text{-}CH}$ is vertically oriented and is approximately equal to the distance between top (upper level) contact 7565-2 and bottom (lower level) contact 7530-2, and may be defined by the thickness of the NV NT block.

Cell C10 includes a corresponding 3-D NV NT diode formed by a steering diode with a cathode-to-NT series connection to a bottom (lower level) contact of a NV NT block. Anode 7515-3 is in contact with bit line 7510-1 (BL0), and the top (upper level) contact 7565-3 of NV NT block 7550-3 (not visible behind word line 7570-1) is in contact with word line 7570-2 (WL1). The NV NT diode corresponding to cell C10 includes anode 7515-3 in contact with bit line 7510-1 (BL0), and also in contact with N polysilicon region 7520-3. N polysilicon region 7520-3 is in contact with N+ polysilicon region 7525-3. Anode 7515-3, N polysilicon region 7520-3, and N+ polysilicon region 7525-3 form a Schottky-type of steering diode. Note that PN or PIN diodes (not shown) may be used instead. N+ polysilicon region 7525-3 is in contact with bottom (lower level) contact 7530-3, which also forms the bottom (lower level) contact of NV NT block 7550-3. NV NT block 7550-3 is also in contact with top (upper level) contact 7565-3, which is in turn in contact with word line 7570-2 (WL1). NV NT block 7550-3 channel length $L_{SW-CH}$ is vertically oriented and is approximately equal to the distance between top (upper level) contact 7565-3 and bottom (lower level) contact 7530-3, and may be defined by the thickness of NV NT block.

Cell C11 includes a corresponding 3-D NV NT diode formed by a steering diode with a cathode-to-NT series connection to a bottom (lower level) contact of a NV NT block. Anode 7515-4 is in contact with bit line 7510-2 (BL1), and the top (upper level) contact 7565-4 of NV NT block 7550-4 (not visible behind word line 7570-1) is in contact with word line 7570-2 (WL1). The NV NT diode corresponding to cell C11 includes anode 7515-4 in contact with bit line 7510-2 (BL1), and also in contact with N polysilicon region 7520-4. N polysilicon region 7520-4 is in contact with N+ polysilicon region 7525-4. Anode 7515-4, N polysilicon region 7520-4, and N+ polysilicon region 7525-4 form a Schottky-type of steering diode. Note that PN or PIN diodes (not shown) may be used instead. N+ polysilicon region 7525-4 is in contact with bottom (lower level) contact 7530-4, which also forms the bottom (lower level) contact of NV NT block 7550-4. NV NT block 7550-4 is also in contact with top (upper level) contact 7565-4, which is in turn in contact with word line 7570-2 (WL1). NV NT block 7550-4 channel length $L_{SW-CH}$ is vertically oriented and is approximately equal to the distance between top (upper level) contact 7565-4 and bottom (lower level) contact 7530-4, and may be defined by the thickness of the NV NT block. The opening 7575 between 3-D NV NT diode-based cells C00, C01, C10, and C11 is filled with in an insulator such as TEOS (not shown).

Nonvolatile nanotube diodes forming cells C00, C01, C10, and C11 correspond to nonvolatile nanotube diode 1200 schematic in FIG. 12. Cells C00, C01, C10, and C11 illustrated in nonvolatile memory array 7500 in FIG. 75 correspond to corresponding cells C00, C01, C10, and C11 shown schematically in memory array 2610 in FIG. 26A, and bit lines BL0 and BL1 and word lines WL0 and WL1 correspond to array lines illustrated schematically in memory array 2610.

An Alternative Simplified Methods of Fabricating 3-Dimensional Cell Structure of Nonvolatile Cells Using NV NT Devices Having Vertically Oriented Diodes and Nonvolatile Nanotube Blocks as Nonvolatile NT Switches Using Top and Bottom Contacts to Form Cathode-on-NT Switches In some embodiments, methods 2710 illustrated in FIG. 27A are used to define support circuits and interconnects similar to those described with respect to memory 2600 illustrated in FIG. 26A as described further above. Exemplary methods 2710 apply known semiconductor industry techniques design and fabrication techniques to fabricated support circuits and interconnections 7601 in and on a semiconductor substrate as illustrated in FIG. 76A. Support circuits and interconnections 7601 include FET devices in a semiconductor substrate and interconnections such as vias and wiring above a semiconductor substrate. FIG. 76A corresponds to FIG. 34A illustrating a Schottky diode structure, including an optional conductive Schottky anode contact layer 3415 shown in FIG. 34A and shown in FIG. 76A as anode contact layer 7615. Note that FIG. 34A' may be used instead of FIG. 34A' as a starting point if a PN diode structure is desired. If N polysilicon layer 3417 in FIG. 34A' were replaced with an intrinsically doped polysilicon layer instead (not shown), then a PIN diode would be formed instead of a PN diode. Therefore, while the structure illustrated in FIG. 76A illustrates a Schottky diode structure, the structure may also be fabricated using either a PN diode or a PIN diode.

Methods of fabrication for elements and structures for support circuits & interconnections 7601 and insulator 7603 forming memory array support structure 7605 correspond to methods of fabrication described further above with respect to FIGS. 34A and 34B, where support circuits & interconnections 7601 correspond to support circuits & interconnections 3401; insulator 7603 corresponds to insulator 3403. Methods of fabrication for elements and structures for support circuits & interconnections 7601 and insulator 7603 forming memory array support structure 7605 also corresponds to support circuits & interconnections 6801 and insulator 7603 corresponds to insulator 6803 as illustrated in FIG. 68A, and also correspond to support circuits & interconnections 7501 and insulator 7503, respectively, in FIG. 75.

At this point in the process, methods of fabrication pattern conductor layer 7610 to form bit lines 7610-1 and bit lines 7610-2 and other bit lines separated by insulating regions 7612, as illustrated in FIG. 76A. Bit lines 7610-1 and 7610-2 correspond to bit lines 7510-1 (BL0) and 7510-2 (BL1), respectively, illustrated in FIG. 75. Insulating regions 7612 correspond to insulating regions 7512 illustrated in FIG. 75. In some embodiments, methods form a masking layer (not shown) using masking methods known in the semiconductor industry. Next, methods such as directional etch define bit lines 7610-1 and 7610-2 using methods known in the semiconductor industry. Then, methods deposit and planarize an insulating region such as TEOS forming insulating regions 7612 using methods known in the semiconductor industry.

Examples of conductor (and contact) materials include elemental metals such as Al, Au, Pt, W, Ta, Cu, Mo, Pd, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$.

In some cases materials such as those used in conductor layer 7610 may also be used as anodes for Schottky diodes, in which case a separate layer such as contact (anode) layer 7615 may not be required. In other cases, a separate contact (anode) layer 7615 may be used for enhanced diode characteristics. For example, contact layer 3415 illustrated in FIG. 34A, corresponding to contact (anode) layer 7615 in FIG. 76A, is used to form anodes of Schottky diodes In some embodiments, methods may deposit Schottky diode anode materials to form contact (anode) layer 7615 on conductor layer 7610 as in FIG. 76A having a thickness range of 10 to 500 nm, for example. Such anode materials may include Al, Ag, Au, Ca, Co, Cr, Cu, Fe, Ir, Mg, Mo, Na, Ni, Os, Pb, Pd, Pt, Rb, Ru, Ti, W, Ta, Zn and other elemental metals. Also, silicides such as $CoSi_2$, $MoSi_2$, $Pd_2Si$, $PtSi$, $RbSi_2$, $TiSi_2$, $WSi_2$, and $ZrSi_2$ may be used. Schottky diodes formed using such metals and silicides are illustrated in the reference by N G, K. K. "Complete Guide to Semiconductor Devices", Second Edition, John Wiley & Sons, 2002, pp. 31-41, the entire contents of which are incorporated herein by reference.

At this point in the process, methods deposit N polysilicon layer 7620 on contact (anode) layer 7615; N+ polysilicon layer 7625 deposited on N polysilicon layer 7620; and bottom (lower level) contact layer 7630 deposited on N+ polysilicon layer 7625 as illustrated in FIG. 76A.

Exemplary methods of fabrication for N polysilicon layer 7620 illustrated in FIG. 76A are described further above with respect to corresponding N polysilicon layer 6820 illustrated in FIG. 68A and corresponding N polysilicon layer 3420 illustrated in FIG. 34A; N+ polysilicon layer 7625 corresponds to N+ polysilicon layer 6825 illustrated in FIG. 68A and N+ polysilicon layer 3425 illustrated in FIG. 34A; bottom (lower level) contact layer 7630 corresponds to bottom (lower level) contact layer 6830 illustrated in FIG. 68A and bottom (lower level) contact layer 3430 illustrated in FIG. 34B.

Figure 76B:
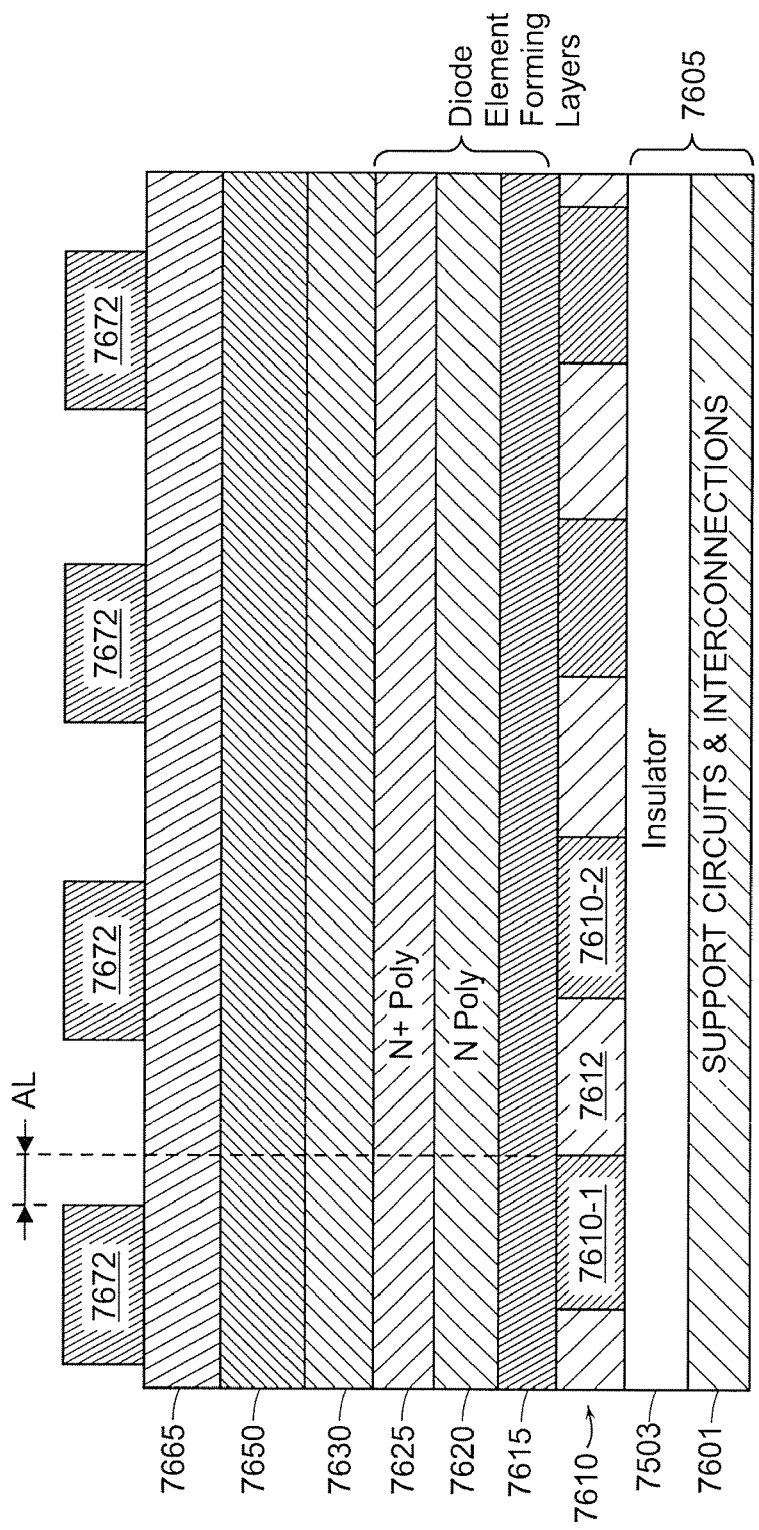
Figure 76C:
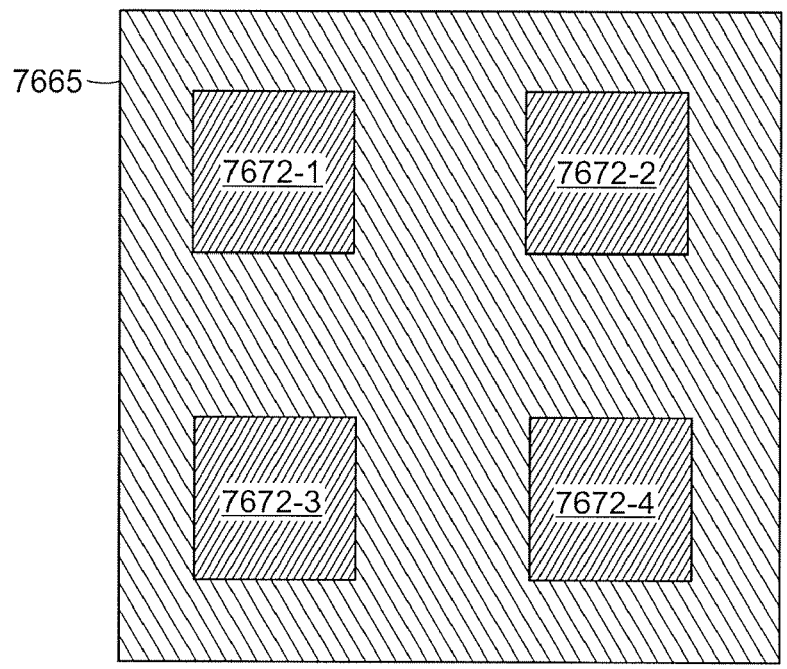
Figure 76D:
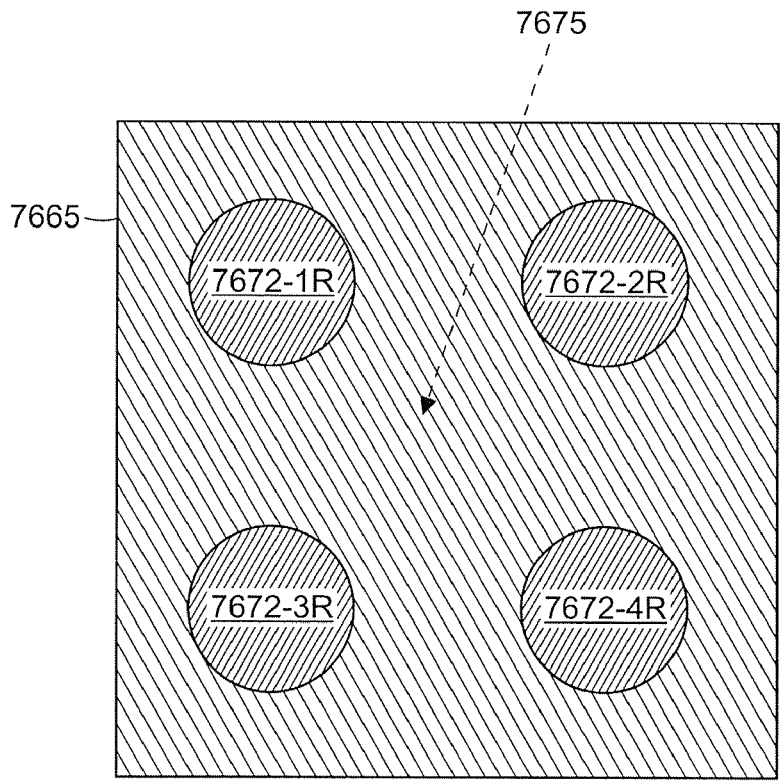

Next, methods deposit a nanotube layer 7650 on the planar surface of contact (anode) layer 7630 as illustrated in FIG. 76B using spin-on of multiple layers, spray-on, or other means. Nanotube layer 7650 may be in the range of 10-200 nm for example. Nanotube layer 7650 corresponds to nanotube layer 6835 illustrated in FIG. 68B. Exemplary devices of 35 nm thicknesses have been fabricated and switched between ON/OFF states as illustrated in FIGS. 64 and 65. Methods of fabrication of NV NT blocks with top and bottom contacts are described with respect to methods 6600A, 6600B, and 6600C illustrated FIGS. 66A, 66B, and 66C, respectively.

At this point in the fabrication process, methods deposit top (upper level) contact layer 7665 on the surface of nanotube layer 7650 as illustrated in FIG. 76B. Top (upper level) contact layer 7665 may be 10 to 500 nm in thickness, for example. Top (upper contact) layer 7665 may be formed using Al, Au, Ta, W, Cu, Mo, Pd, Pt, Ni, Ru, Ti, Cr, Ag, In, Ir, Pb, Sn, as well as metal alloys such as TiAu, TiCu, TiPd, PbIn, and TiW, other suitable conductors, or conductive nitrides such as TiN, oxides, or silicides such as RuN, RuO, TiN, TaN, $CoSi_x$ and $TiSi_x$, for example. Top (upper level) contact layer 7665 corresponds to top (upper level) contact layer 6840 illustrated in FIG. 68B.

Next methods deposit and pattern a masking layer 7672 on top (upper level) contact layer 7650 as illustrated in FIG. 76B using known industry methods. Masking layer 7672 may be in the range of 10 to 500 nm thick and be formed using resist such as photoresist, e-beam resist, or conductor, semiconductor, or insulator materials. Mask layer 7672 openings expose underlying regions for purposes of trench etching. The mask openings may be aligned to alignment marks in conductor layer 7610, methods align mask openings to an alignment accuracy AL of + or –F/3 or better using known semiconductor methods. For an F=45 nm technology node, alignment AL is equal to or better than + or –15 nm with respect to a bit line edge, such as the edge of bit line 7610-1 illustrated in FIG. 76B for example. In order to achieve reduced cell dimensions, mask layer 7672 openings can be arranged to be approximately equal to the minimum allowed technology dimension F. F may be 90 nm, 65 nm, 45 nm, 35 nm, 25 nm, 12 nm, or sub-10 nm for example.

FIG. 76C illustrates a plan view of masking layer 7672 with as-drawn shapes on top (upper level) contact layer 7665. Each mask pattern 7672-1, 7672-2, 7672-3, and 7672-4 shape is approximately F×F as-drawn, and all shapes are separated from each other by a distance F.

FIG. 76D illustrates the effects of corner rounding when methods pattern masking regions on the surface of top (upper level) contact layer 7665 at technology node minimum dimensions F using known semiconductor industry methods. As-drawn shape 7672-1 becomes as-patterned approximately circular shape 7672-1R of diameter approximately F; as-drawn shape 7672-2 becomes as-patterned approximately circular shape 7672-2R of diameter approximately F; as-drawn shape 7672-3 becomes as-patterned approximately circular shape 7672-3R of diameter approximately F; and as-drawn shape 7672-4 becomes as-patterned approximately circular shape 7672-4R of diameter approximately F.

At this point in the process, methods selectively directionally etch exposed regions between mask shapes 7672-1R, 7672-2R, 7672-3R, and 7672-4R, beginning with top (upper level) contact layer 7665 ending on surface of conductor layer 7610, at the top surface of bit lines such as bit lines 7610-1 and 7610-2 thus forming opening 7675 (not shown) and simultaneously forming all surfaces (boundaries) of 3-D NV NT diodes that form cells C00, C01, C10, and C11 in FIG. 75. In some embodiments, methods fill opening 7675 (not shown) with an insulator such as TEOS and planarize the surface. Opening 7675 corresponds to opening 7575 in FIG. 75. If a rectangular (e.g., square) cross-section is desired, mask shapes 7672-1, 7672-2, 7672-3, and 7672-4 can be used instead of 7672-1R, 7672-2R, 7672-3R, and 7672-4R.

U.S. Pat. No. 5,670,803, the entire contents of which are incorporated herein by reference, to co-inventor Bertin, discloses a 3-D array (in this example, 3D-SRAM) structure with simultaneously trench-defined sidewall dimensions. This structure includes vertical sidewalls simultaneously defined by trenches cutting through multiple layers of doped silicon and insulated regions in order avoid multiple alignment steps. Such trench directional selective etch methods may be adapted for use to cut through multiple conductor, semiconductor, oxide, and nanotube layers as described further above with respect to trench formation in FIGS. 34A-34FF, 36A-36FF, and 68A-68I for example. In this example, selective directional trench etch (RIE) removes exposed areas of top (upper level) contact layer 7665 to form top (upper level) contacts 7565-1, 7565-2, 7565-3, and 7565-4 illustrated in FIG. 75; removes exposed areas of nanotube layer 7650 to form NV NT blocks 7550-1, 7550-2, 7550-3, and 7550-4 illustrated in FIG. 75; removes exposed areas of bottom (lower level) contact layer 7630 to form bottom (lower level) contacts 7530-1, 7530-2, 7530-3, and 7530-4 illustrated in FIG. 75; directionally etch removes exposed areas of N+ polysilicon layer 7625 to form N+ polysilicon regions 7525-1, 7525-2, 7525-3, and 7525-4 as illustrated in FIG. 75; removes exposed areas of polysilicon layer 7620 to form N polysilicon regions 7520-1, 7520-2, 7520-3, and 7520-4 as illustrated in FIG. 75. Exemplary methods of selective directional etching stops at the top surface of conductor layer 7610 and top surfaces of bit lines 7610-1 and 7610-2 as illustrated in FIGS. 76B and 75.

Exemplary methods of selectively directionally etching exposed regions between mask shapes 7672-1R, 7672-2R, 7672-3R, and 7672-4R correspond to methods of directionally etching corresponding to forming trench regions in FIG. 68D, except that etching stops at the surface of bit lines BL0 and BL1 since bit lines BL0 and BL1 have been patterned in an earlier step as illustrated in FIG. 76B.

Next methods fill trench openings 7675 and planarize with an insulator such as TEOS for example filling region 7575 (fill not shown) illustrated in FIG. 75. Exemplary methods of filling and planarizing trench openings 7675 corresponds to methods of filling as and planarizing trench openings 6860, 6860A, and 6860B as described with respect to FIG. 68E.

Next, methods deposit, planarize, and pattern (form) conductors such as word lines 7570-1 (WL0) and 7570-2 (WL1) illustrated in FIG. 75. Exemplary methods of forming word lines 7570-1 and 7570-2 correspond to methods of forming word lines WL0 and WL1 as described with respect to FIG. 68I further above.

Nonvolatile Memories Using Stacks of Alternative Simplified 3-Dimensional Cell Structures with Non-Shared Array Lines Simplified 3-dimensional nonvolatile memory array 7500 enables stacking multi-levels of sub-arrays based on memory array 7500 to achieve high density bit storage per unit area. Nonvolatile memory array 7500 has a cell area $4F^2$ and a bit density of 4F²/bit. However, a 2-high stack holds two bits in the same 4F² area and achieves a bit density of 2F²/bit. Likewise, a 4-high stack achieves a bit density of 1F²/bit, an 8-high stack achieves a 0.5F²/bit density, and a 16-high stack achieves a 0.25F²/bit density.

Figure 77:
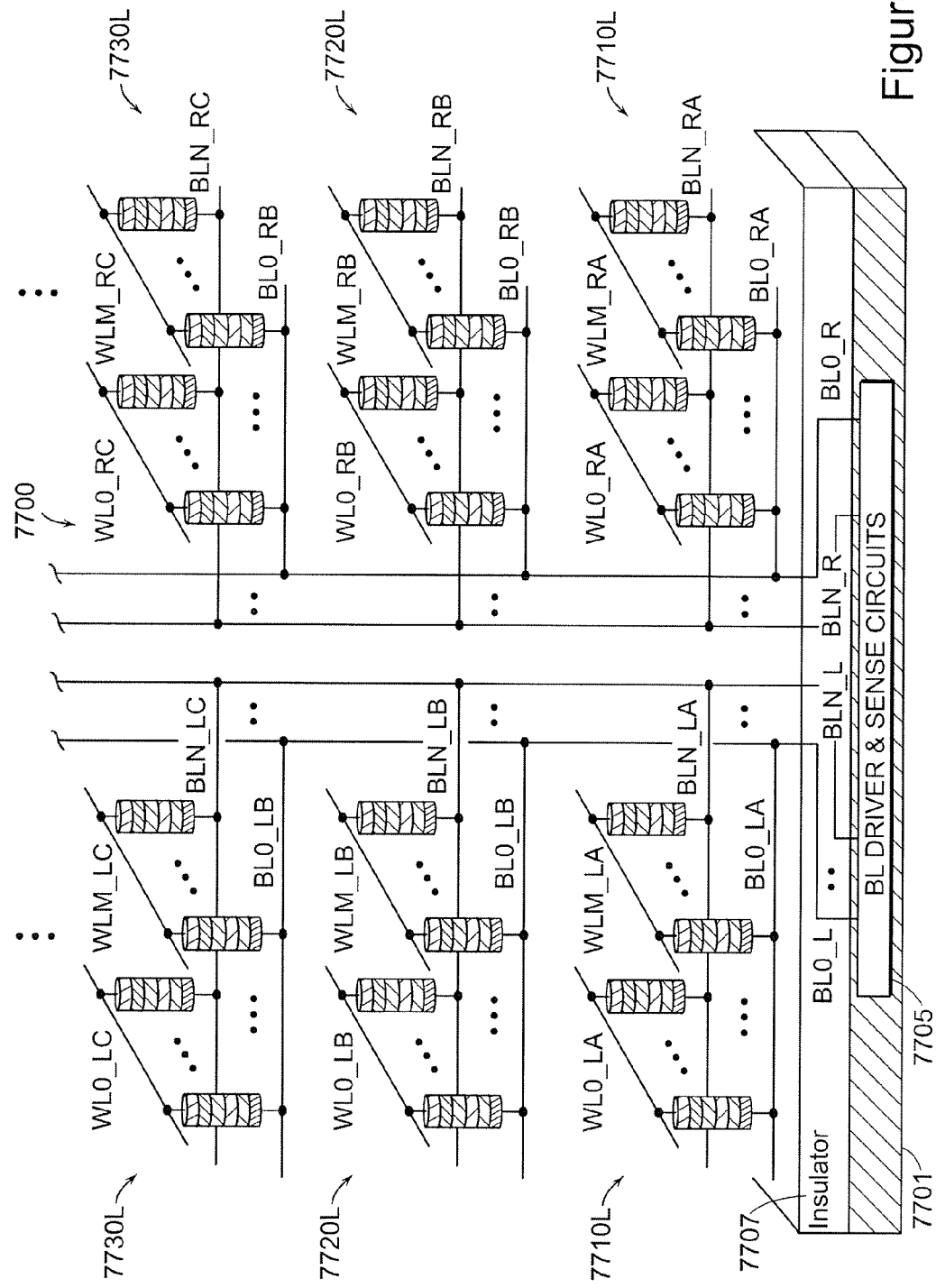
FIG. 77 illustrates a 3D perspective drawing of an embodiment of a multi-level high stack of three dimensional nonvolatile nanotube block-based switches with top and bottom contacts, with no array lines, such as word lines, shared between upper and lower arrays.

FIG. 77 illustrates a schematic of stacked nonvolatile memory array 7700 based on nonvolatile memory array 7500 illustrated in FIG. 75. Support circuits & interconnections 7701 illustrated in stacked nonvolatile memory array 7700 illustrated in FIG. 77 corresponds to support circuits and interconnections 7501 shown in cross section 7500 illustrated in FIG. 75, except for circuit modifications to accommodate stacked arrays. BL driver and sense circuits 7705, a subset of support circuits and interconnections 7701, are used to interface to bit lines in stacked nonvolatile memory array 7700.

Planarized insulator 7707 illustrated in FIG. 77 corresponds to planarize insulator 7503 illustrated in FIG. 75. Interconnect means through planar insulator 7707 (not shown in stacked nonvolatile memory array 7700 but shown above with respect to cross section 2800" in FIG. 28C) may be used to connect metal array lines in 3-D arrays, bit lines in this example, to corresponding BL driver and sense circuits 7705 and other circuits (not shown). By way of example, bit line drivers in BL driver and sense circuits 2640 may be connected to bit lines BL0 and BL1 in array 2610 of memory 2600 illustrated in FIG. 26A described further above, and in stacked nonvolatile memory array 7700 illustrated in FIG. 77.

Three stacking levels with left and right-side 3-D sub-arrays corresponding to nonvolatile memory array 7500 in FIG. 75 are illustrated, with additional memory stacks (not shown) above. Memories of 8, 16, 32, and 64 and more nonvolatile memory stacks may be formed. In this example, a first stacked memory level is formed that includes nonvolatile memory array 7710L including mxn NV NT diode cells interconnected by m word lines WL0_LA to WLM_LA and n bit lines BL0_LA to BLN_LA, and nonvolatile memory array 7710R including mxn NV NT diode cells interconnected by m word lines WL0_RA to WLM_RA and n bit lines BL0_RA to BLN_RA. Next, a second stacked memory level is formed that includes nonvolatile memory array 7720L including mxn NV NT diode cells interconnected by m word lines WL0_LB to WLM_LB and n bit lines BL0_LB to BLN_LB, and nonvolatile memory array 7720R including mxn NV NT diode cells interconnected by m word lines WL0_RB to WLM_RB and n bit lines BL0_RB to BLN_RB. Next, a third stacked memory level is formed that includes nonvolatile memory array 7730L including mxn NV NT diode cells interconnected by m word lines WL0_LC to WLM_LC and n bit lines BL0_LC to BLN_LC, and nonvolatile memory array 7730R including mxn NV NT diode cells interconnected by m word lines WL0_RC to WLM_RC and n bit lines BL0_RC to BLN_RC. Additional stacks of nonvolatile memory arrays are included (but not shown in FIG. 77).

Sub-array bit line segments are interconnected by vertical interconnections and then fanned out to BL driver and sense circuits 7705 as illustrated in stacked nonvolatile memory arrays 7700 in FIG. 77. For example, BL0_L interconnects bit line BL0_LA, BL0_LB, BL0_LC segments, and other bit line segments (not shown), and connect these bit line segments to BL driver and sense circuits 7705. Also, BLN_L interconnects bit line BLN_LA, BLN_LB, BLN_LC segments, and other bit line segments (not shown), and connect these bit line segments to BL driver and sense circuits 7705. Also, BL0_R interconnects bit line BL0_RA, BL0_RB, BL0_RC segments, and other bit line segments (not shown), and connect these bit line segments to BL driver and sense circuits 7705. Also, BLN_R interconnects bit line BLN_RA, BLN_RB, BLN_RC segments, and other bit line segments (not shown), and connect these bit line segments to BL driver and sense circuits 7705.

BL driver and sense circuits 7705 may be used to read or write to bit locations on any of the stacked levels in stacked nonvolatile memory array 7700 illustrated in FIG. 77. Word lines may also be selected by support circuits & interconnections 7701 (not shown in this example).

When forming nonvolatile memory arrays, annealing of polysilicon layers in the temperature range of 700 to 800 deg-C. for approximately one hour may be required to control grain boundary size and achieve desired electrical parameters such as forward voltage drop and breakdown voltages for steering diodes. For 3-D arrays, such annealing may be performed before or after NV NT block switch formation. When stacking memory arrays to form stacked nonvolatile memory arrays 7700, annealing in the temperature range of 700 to 800 deg-C. for one hour may be required to improve steering diode electrical properties after NV NT block switches are formed, because the diode layers may be arranged over the NV NT blocks. Bottom (lower level) and top (upper level) contact materials may need to tolerate temperatures of up to 800 deg-C0 without forming carbides (note, nanotubes are tolerant of temperatures well in excess of 800 deg-C.). Choosing a block contact material such as Pt can help to ensure that carbides do not form because Pt is insoluble in carbon. Also, choosing high melting point materials such as Mo, Cr, and Nb can also avoid carbide formation. Mo and Nb carbides form above 1000 deg-C., and Cr carbides form above 1200 deg-C. Other high-melting point metals may be used as well. By choosing contact metals that either do not form carbides, or form carbides above 800 deg-C., annealing of stacked nonvolatile memory arrays, in which diodes are arranged above and/or below the NV NT blocks and their associated contacts, can be performed without contact-to-nanotube degradation. Thus, at least some embodiments of the invention are resilient to high temperature processing without degradation. Phase diagrams for various metals and carbon may found in various references.

The invention may be embodied in other specific forms without departing from the spirit or essential characteristics thereof. The present embodiments are therefore to be considered in respects as illustrative and not restrictive. For example, the 3D examples described further above may be used to form stand alone memory arrays. Alternatively, the 3D examples described further above may be used as embedded memory in logic chips. Also, 3D examples described further above may be stacked above one or more microprocessors in a logic chip such that address, timing, and data line lengths are mostly vertically oriented and short in distance for enhanced performance at lower power. Also, for example, many of the embodiments described above are described with reference to minimum technology node F. While it can be useful to fabricate memory elements at the smallest size allowed by the minimum technology node, embodiments can be fabricated at any size allowed by the minimum technology node (e.g., larger than the minimum feature size).

INCORPORATED PATENT REFERENCES

The following commonly-owned patent references, referred to herein as "incorporated patent references," describe various techniques for creating nanotube elements (nanotube fabric articles and switches), e.g., creating and patterning nanotube fabrics, and are incorporated by reference in their entireties:

Electromechanical Memory Array Using Nanotube Ribbons and Method for Making Same (U.S. patent application Ser. No. 09/915,093, now U.S. Pat. No. 6,919,592), filed on Jul. 25, 2001;

Electromechanical Memory Having Cell Selection Circuitry Constructed With Nanotube Technology (U.S. patent application Ser. No. 09/915,173, now U.S. Pat. No. 6,643,165), filed on Jul. 25, 2001;

Hybrid Circuit Having Nanotube Electromechanical Memory (U.S. patent application Ser. No. 09/915,095, now U.S. Pat. No. 6,574,130), filed on Jul. 25, 2001;

Electromechanical Three-Trace Junction Devices (U.S. patent application Ser. No. 10/033,323, now U.S. Pat. No. 6,911,682), filed on Dec. 28, 2001;

Methods of Making Electromechanical Three-Trace Junction Devices (U.S. patent application Ser. No. 10/033,032, now U.S. Pat. No. 6,784,028), filed on Dec. 28, 2001;

Nanotube Films and Articles (U.S. patent application Ser. No. 10/128,118, now U.S. Pat. No. 6,706,402), filed on Apr. 23, 2002;

Methods of Nanotube Films and Articles (U.S. patent application Ser. No. 10/128,117, now U.S. Pat. No. 6,835,591), filed Apr. 23, 2002;

Methods of Making Carbon Nanotube Films, Layers, Fabrics, Ribbons, Elements and Articles (U.S. patent application Ser. No. 10/341,005), filed on Jan. 13, 2003;

Methods of Using Thin Metal Layers to Make Carbon Nanotube Films, Layers, Fabrics, Ribbons, Elements and Articles (U.S. patent application Ser. No. 10/341,055), filed Jan. 13, 2003;

Methods of Using Pre-formed Nanotubes to Make Carbon Nanotube Films, Layers, Fabrics, Ribbons, Elements and Articles (U.S. patent application Ser. No. 10/341,054), filed Jan. 13, 2003;

Carbon Nanotube Films, Layers, Fabrics, Ribbons, Elements and Articles (U.S. patent application Ser. No. 10/341,130), filed Jan. 13, 2003;

Non-volatile Electromechanical Field Effect Devices and Circuits using Same and Methods of Forming Same (U.S. patent application Ser. No. 10/864,186, U.S. Patent Publication No. 2005/0062035), filed Jun. 9, 2004;

Devices Having Horizontally-Disposed Nanofabric Articles and Methods of Making the Same, (U.S. patent application Ser. No. 10/776,059, U.S. Patent Publication No. 2004/0181630), filed Feb. 11, 2004;

Devices Having Vertically-Disposed Nanofabric Articles and Methods of Making the Same (U.S. patent application Ser. No. 10/776,572, now U.S. Pat. No. 6,924,538), filed Feb. 11, 2004; and Patterned Nanoscopic Articles and Methods of Making the Same (U.S. patent application Ser. No. 10/936,119, U.S. Patent Publication No. 2005/0128788).

What is claimed is:

1. A memory array comprising:
a plurality of word lines;
a plurality of bit lines;
a plurality of memory cells, each memory cell responsive to electrical stimulus on a word line and on a bit line, each memory cell including:
a two-terminal non-volatile nanotube switching device comprising a first and a second terminal, a semiconductor diode element, and a nanotube fabric article, the semiconductor diode and a nanotube article disposed between and in electrical communication with the first and second terminals,
wherein the nanotube fabric article is capable of a plurality of resistance states, and
wherein the first terminal is coupled to the word line and the second terminal is coupled to the bit line, the electrical stimulus applied to the first and second terminals capable of changing the resistance state of the nanotube fabric article; and
a memory operation circuit operably coupled to each bit line of the plurality of bit lines and each word line of the plurality of word lines,
said operation circuit capable of selecting each of the cells by activating at least one of the bit line and the word line coupled to that cell to apply a selected electrical stimulus to each of the corresponding first and second terminals,
said operation circuit further capable of detecting a resistance state of the nanotube fabric article of a selected memory cell and adjusting the electrical stimulus applied to each of the corresponding first and second terminals in response to the resistance state to controllably induce a selected resistance state in the nanotube fabric article;
wherein the selected resistance state of the nanotube fabric article of each memory cell corresponds to an informational state of said memory cell.

2. The memory array of claim 1, wherein each memory cell nonvolatily stores the corresponding information state in response to electrical stimulus applied to each of the corresponding first and second terminals.

3. The memory array of claim 1, wherein the semiconductor diode element comprises a cathode and an anode, the anode in electrical communication with the second terminal and the cathode in electrical communication with the nanotube switching element.

4. The memory array of claim 3, wherein the cathode comprises a first semiconductor material and the anode comprises a second semiconductor material.

5. The memory array of claim 1, wherein the semiconductor diode element comprises a cathode and an anode, the cathode in electrical communication with the first terminal and the anode in electrical communication with the nanotube switching element.

6. The memory array of claim 5, wherein the cathode comprises a first semiconductor material and the anode comprises a second semiconductor material.

7. The memory array of claim 5, wherein the cathode comprises a semiconductor material and the anode comprises a conductive material and forms a conductive contact to the nanotube fabric article.

8. The memory array of claim 1, further comprising a conductive contact interposed between the semiconductor diode element and the nanotube fabric article.

9. The memory array of claim 8, wherein the nanotube fabric article comprises a network of unaligned nanotubes capable of providing at least one electrically conductive pathway between the first conductive contact and one of the first and second terminals.

10. The memory array of claim 8, wherein the nanotube fabric article comprises a multilayered nanotube fabric.

11. The memory array of claim 10, wherein the multilayered nanotube article has a thickness that defines a spacing between the conductive contact and one of the first and second conductive terminals.

12. The memory array of claim 1, wherein the plurality of memory cells includes multiple pairs of stacked memory cells,
- wherein a first memory cell in each pair of stacked memory cells is disposed above and in electrical communication with a first bit line and the word line is disposed above and in electrical communication with the first memory cell, and
- wherein a second memory cell in each pair of stacked memory cells is disposed above and in electrical communication with the word line and a second bit line is disposed above and in electrical communication with the second memory cell.

13. The memory array of claim 12, wherein the resistance state of the nanotube article in the first memory cell is substantially unaffected by the resistance state of the nanotube article in the second memory cell and the resistance state of the nanotube article in the second memory cell is substantially unaffected by the resistance state of the nanotube article in the first memory cell.

14. The memory array of claim 12, wherein the resistance state of the nanotube article in the first memory cell is substantially unaffected by said operation circuit selecting the second memory cell and the resistance state of the nanotube article in the second memory cell is substantially unaffected by the resistance state by said operation circuit selecting the first memory cell.

15. The memory array of claim 12, wherein the resistance state of the nanotube article in the first memory cell is substantially unaffected by said operation circuit detecting a resistance state of the nanotube fabric article of the second memory cell and the resistance state of the nanotube article in the second memory cell is substantially unaffected by the resistance state by said operation circuit detecting a resistance state of the nanotube fabric article of the first memory cell.

16. The memory array of claim 12, wherein the resistance state of the nanotube article in the first memory cell is substantially unaffected by said operation circuit adjusting the electrical stimulus applied to each of the corresponding first and second terminals of the second memory cell and the resistance state of the nanotube article in the second memory cell is substantially unaffected by the resistance state by said operation circuit adjusting the electrical stimulus applied to each of the corresponding first and second terminals of the first memory cell.

17. The memory array of claim 1, further comprising an insulating region and a plurality of conductive interconnects wherein the insulating region is disposed over the memory operation circuit, the plurality of memory cells are disposed over the insulating region, and the plurality of conductive interconnects operably couple the memory operation circuit to the plurality of bit lines and plurality of word lines.

18. The memory array of claim 1, wherein adjusting the electrical stimulus comprises incrementally changing the voltage applied to each of the corresponding first and second terminals.

19. The memory array of claim 18, wherein incrementally changing the voltage includes applying voltage pulses.

20. The memory array of claim 19, wherein amplitudes of subsequent voltage pulses are incrementally increased by approximately 200 mV.

21. The memory array of claim 1, wherein adjusting the electrical stimulus comprises changing the current supplied to at least one of the corresponding first and second terminals.

22. The memory array of claim 1, further comprising substantially removing electrical stimulus from the corresponding bit line and word line after controllably inducing the selected resistance state in the nanotube fabric article to substantially preserve the selected resistance state of the nanotube fabric article.

23. The memory array of claim 1, wherein detecting the resistance state of the nanotube fabric article further comprises detecting a variation over time of electrical stimulus on a corresponding bit line.

24. The memory array of claim 1, wherein detecting the resistance state of the nanotube fabric article further comprises detecting a current flow though a corresponding bit line.

25. The memory array of claim 1, wherein in each two terminal nonvolatile nanotube switching device, current is capable of flowing from the second terminal to the first terminal and substantially prevented from flowing from the first terminal to the second terminal.

26. The memory array of claim 25, wherein current is capable of flowing from the second terminal to the first terminal when a threshold voltage is reached by applying electrical stimulus to each of the corresponding first and second terminals.

27. The memory array of claim 25, wherein the selected resistance state of the nanotube fabric article of each memory cell includes one of a relatively high resistance state corresponding to a first informational state of said memory cell and a relatively low resistance state corresponding to a second informational state of said memory cell.

28. The memory array of claim 27, wherein a third information state of each memory cell corresponds to a state in which current is capable of flowing from the second terminal to the first terminal and wherein a fourth information state of each memory cell corresponds to a state in which current is substantially prevented from flowing from the first terminal to the second terminal.

29. The memory array of claim 1, wherein the two-terminal non-volatile nanotube switching device is operable independently of the voltage polarity between the first and second terminals.

30. The memory array of claim 1, wherein the two-terminal non-volatile nanotube switching device is operable independently of the direction of current flow between the first and second terminals.

31. The memory array of claim 1, wherein the plurality of memory cells includes multiple pairs of stacked memory cells,
- wherein a first memory cell in each pair of stacked memory cells is disposed above and in electrical communication with a first bit line and the word line is disposed above and in electrical communication with the first memory cell;
- wherein an insulator material is disposed over the first memory cell; and
- wherein a second memory cell in each pair of stacked memory cells is disposed above and in electrical communication with a second word line, the second word line disposed over the insulator material and wherein a second bit line is disposed above and in electrical communication with the second memory cell.

32. The memory array of claim 1, wherein the plurality of memory cells includes multiple pairs of stacked memory cells,
- wherein a first memory cell in each pair of stacked memory cells is disposed above and in electrical communication with a first bit line and the word line is disposed above and in electrical communication with the first memory cell;

wherein an insulator material is disposed over the first memory cell;

wherein a second memory cell in each pair of stacked memory cells is disposed above and in electrical communication with a second bit line, the second bit line disposed over the insulator material and wherein a second word line is disposed above and in electrical communication with the second memory cell.

* * * * *